(12) United States Patent
Miyauchi et al.

(10) Patent No.: US 7,180,968 B2
(45) Date of Patent: Feb. 20, 2007

(54) SOFT-OUTPUT DECODING

(75) Inventors: Toshiyuki Miyauchi, Tokyo (JP);
Kouhei Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 1034 days.

(21) Appl. No.: 10/111,724

(22) PCT Filed: Aug. 31, 2001

(86) PCT No.: PCT/JP01/07576

§ 371 (c)(1),
(2), (4) Date: Apr. 26, 2002

(87) PCT Pub. No.: WO02/19539

PCT Pub. Date: Mar. 7, 2002

(65) Prior Publication Data

US 2003/0061003 A1   Mar. 27, 2003

(30) Foreign Application Priority Data

Aug. 31, 2000   (JP)   .............................. 2000-263120

(51) Int. Cl.
*H03D 1/00*   (2006.01)
(52) U.S. Cl. ...................... 375/341; 714/795
(58) Field of Classification Search ................ 375/341, 375/265; 714/794, 795, 796
See application file for complete search history.

(56) References Cited

U.S. PATENT DOCUMENTS 5,983,384 A   11/1999   Ross

FOREIGN PATENT DOCUMENTS

| EP | 1 128 589 | 8/2001 |
|---|---|---|
| JP | 62-243431 | 10/1987 |
| JP | 5-2842 | 1/1993 |
| JP | 2000-68862 | 3/2000 |
| JP | 2001-257601 | 9/2001 |
| JP | 2001-285084 | 10/2001 |

OTHER PUBLICATIONS

Patrick Robertson, Emmanuelle Villebrun & Peter Hoeher, "A Comparison of Optimal and Sub-Optimal MAP Decoding Algorithms Operating in the Log Domain," *IEEE Int. Conf. on Communications*, pp. 1009-1013, Jun. 1995.
L. R. Bahl, J. Cocke, F. Jelinek & J. Raviv, "Optimal Decoding of Linear Codes for Minimizing Symbol Error Rate," *IEEE Trans. Inf. Theory*, vol. IT-20, pp. 284-287, Mar. 1974.
Steven S. Pletrobon, "Implementation and Performance of a Turbo/MAP Decoder," *Small World Communications*, vol. 16, pp. 23-46, Jan.-Feb. 1998.
Communication from European Patent Office transmitting Supplementary Partial European Search Report for European Patent Application No. EP 01961290, dated Aug. 16, 2006.

*Primary Examiner*—Kevin Kim
(74) *Attorney, Agent, or Firm*—Finnegan, Henderson, Farabow, Garrett & Dunner, L.L.P.

(57) ABSTRACT

To appropriately express an erasure position of a code by a small-scale, simple-structured circuit, a soft-output decoding circuit (90) in each element decoder includes a received value and a priori probability information selection circuit (154) to select an input to-be-decoded received value TSR and extrinsic information or interleaved data TEXT, whichever is necessary for soft-output decoding. Based on inner erasure position information IERS supplied from an inner erasure information generating circuit (152), the received value and a priori probability information selection circuit (154) replaces a position where no coded output exists due to puncture or the like with a symbol whose likelihood is "0". That is, the received value and a priori probability information selection circuit (154) outputs information which assures a probability in which a bit corresponding to a position where there is no coded output is "0" or "1" to be "½".

54 Claims, 103 Drawing Sheets

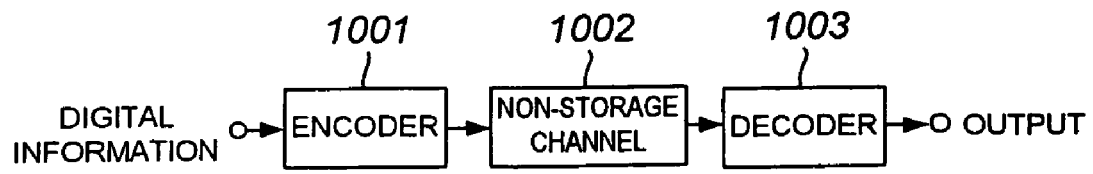
FIG. 1 - Prior Art
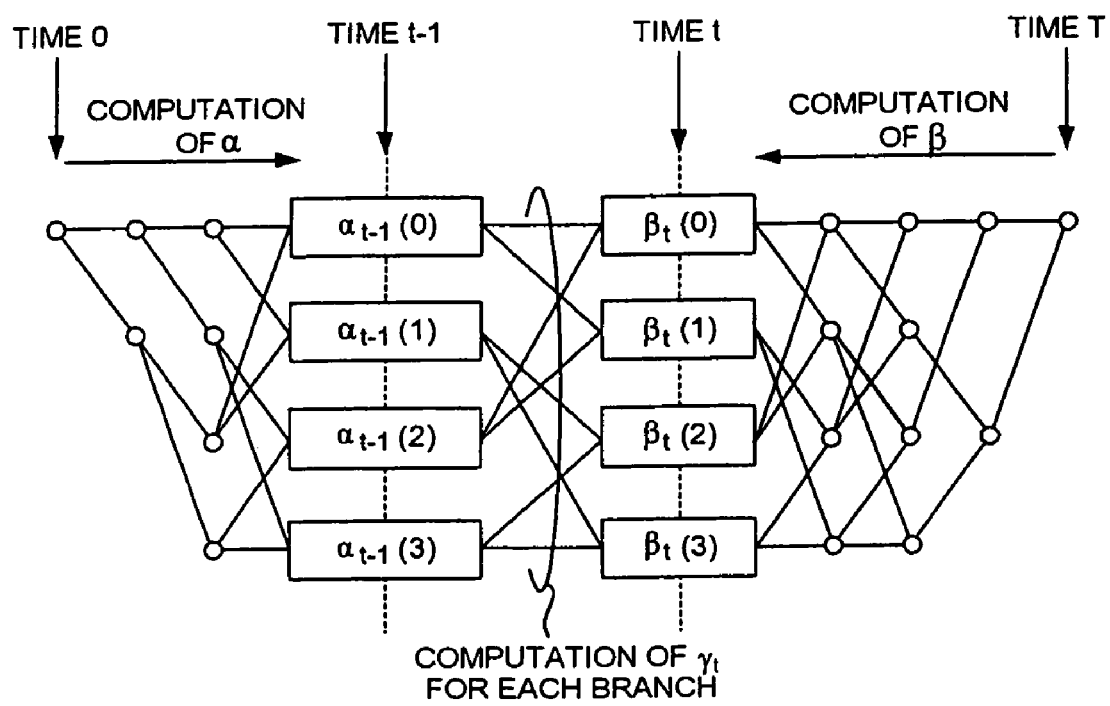
FIG. 2 - Prior Art

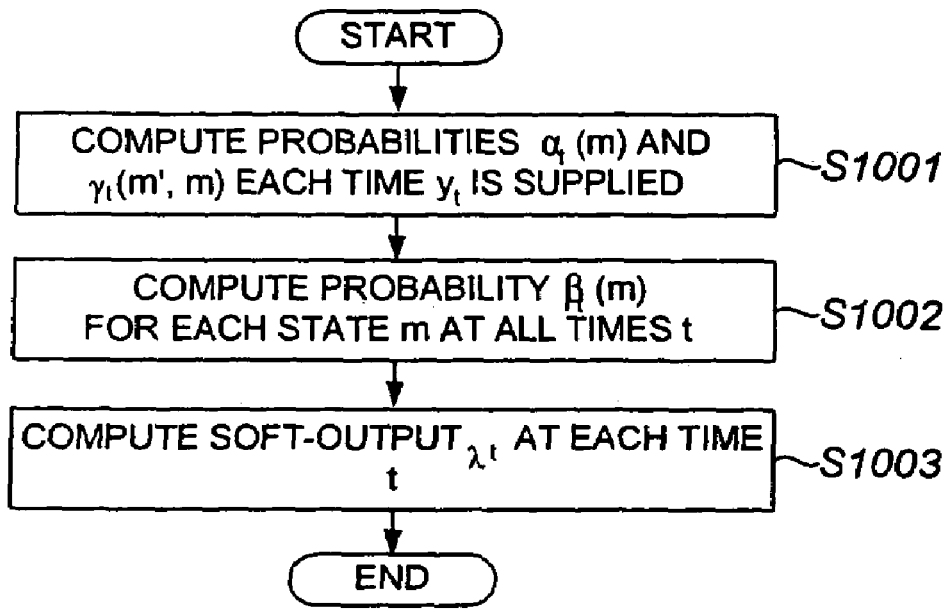
FIG. 3 - Prior Art
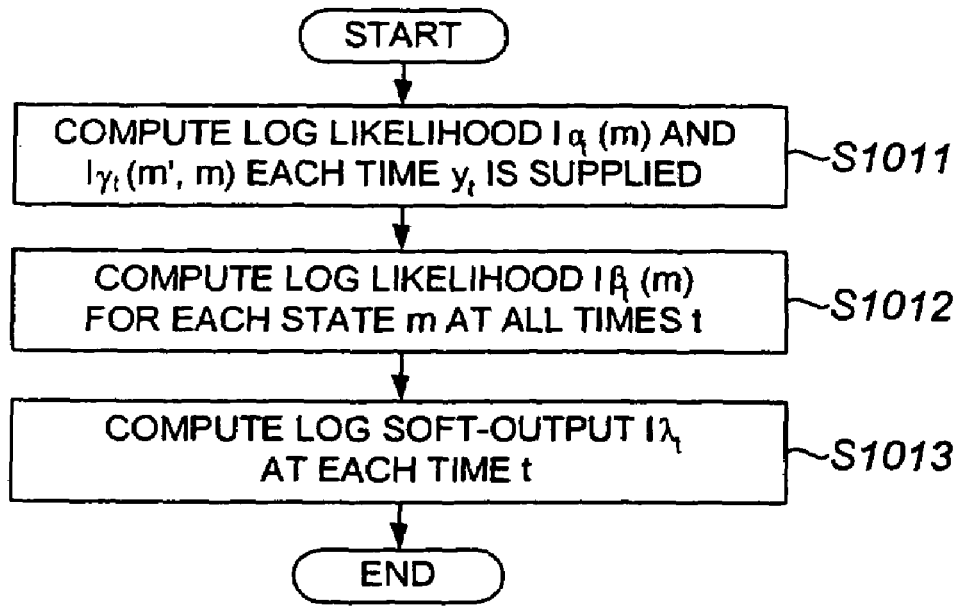
FIG. 4 - Prior Art

FIG.59A
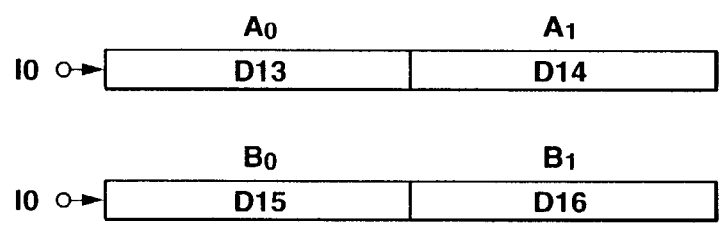
FIG.59B
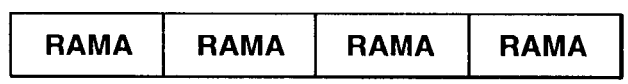
FIG.59C
RAMA | RAMA | RAMA | RAMA
FIG.59D
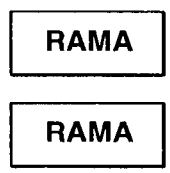

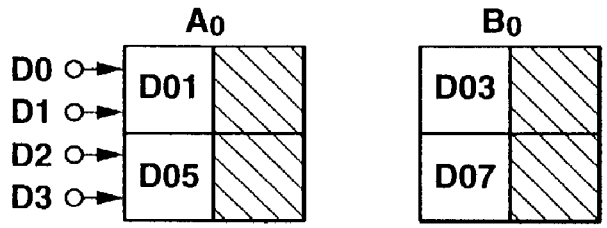
FIG.63A
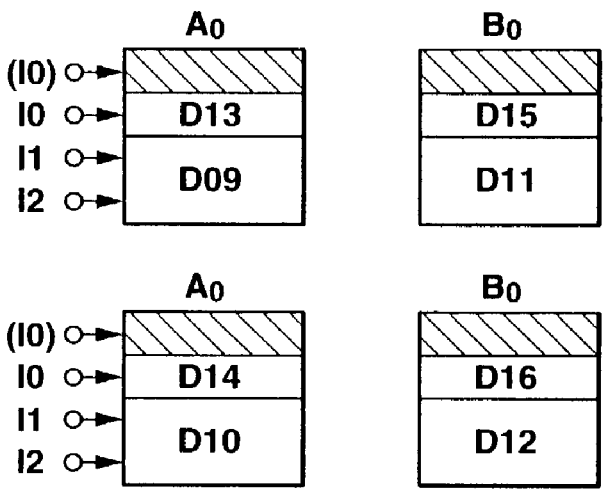
FIG.63B
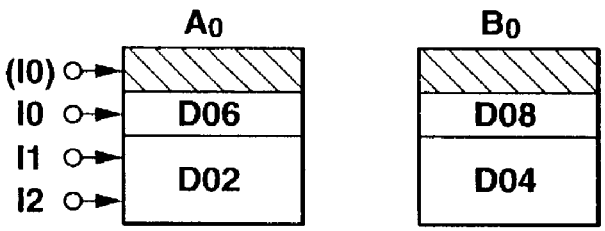
FIG.63C      FIG.63D
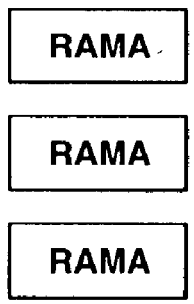
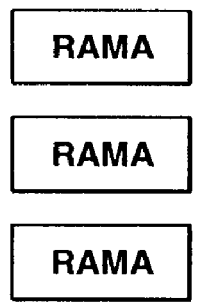

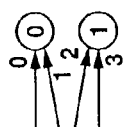
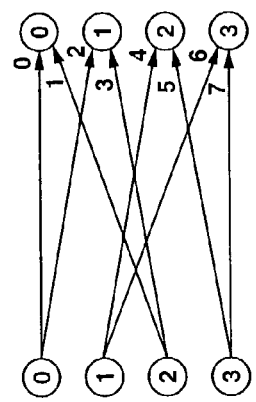
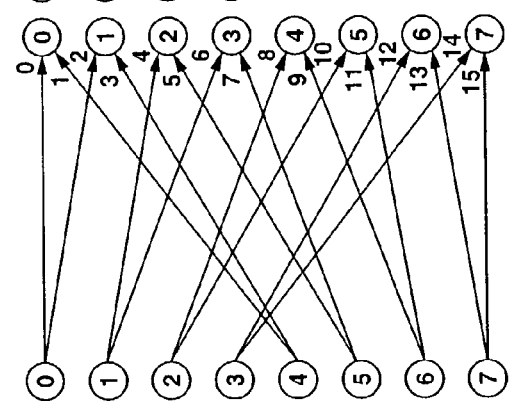
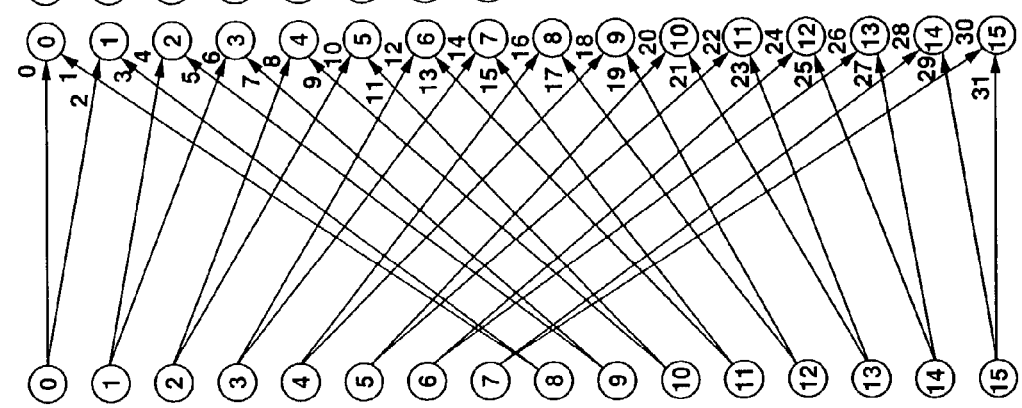

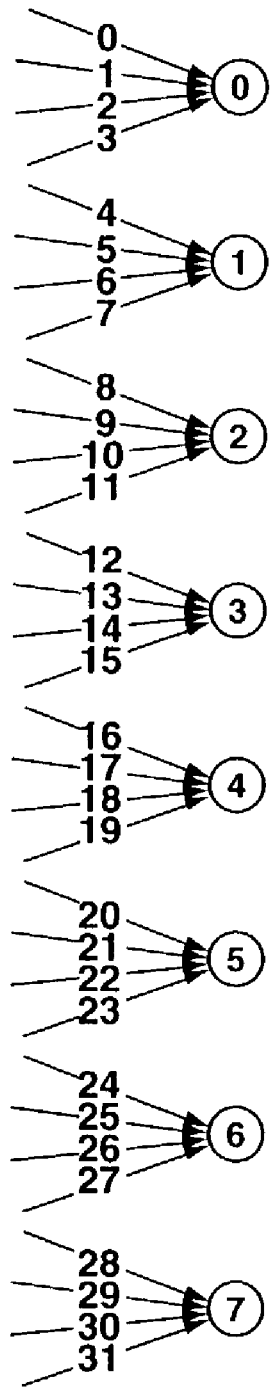
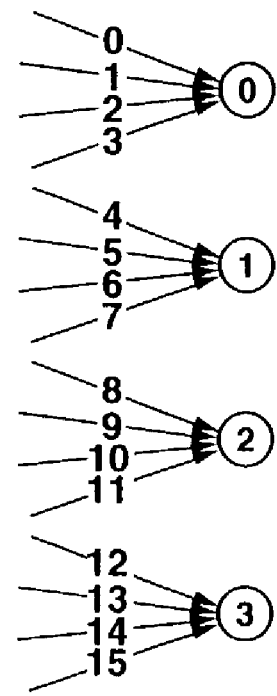
FIG.75B
FIG.75A

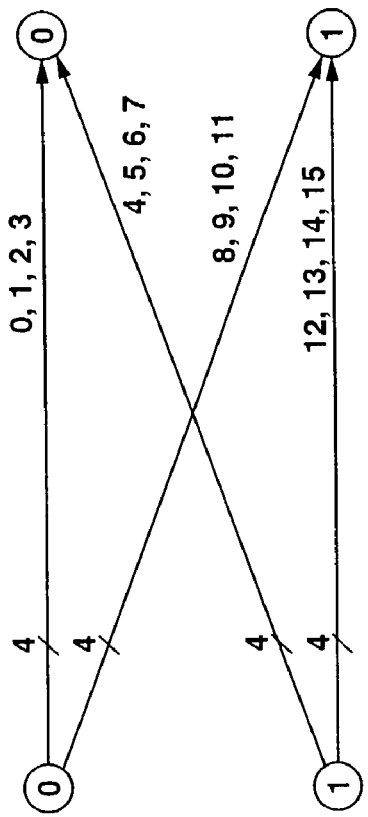
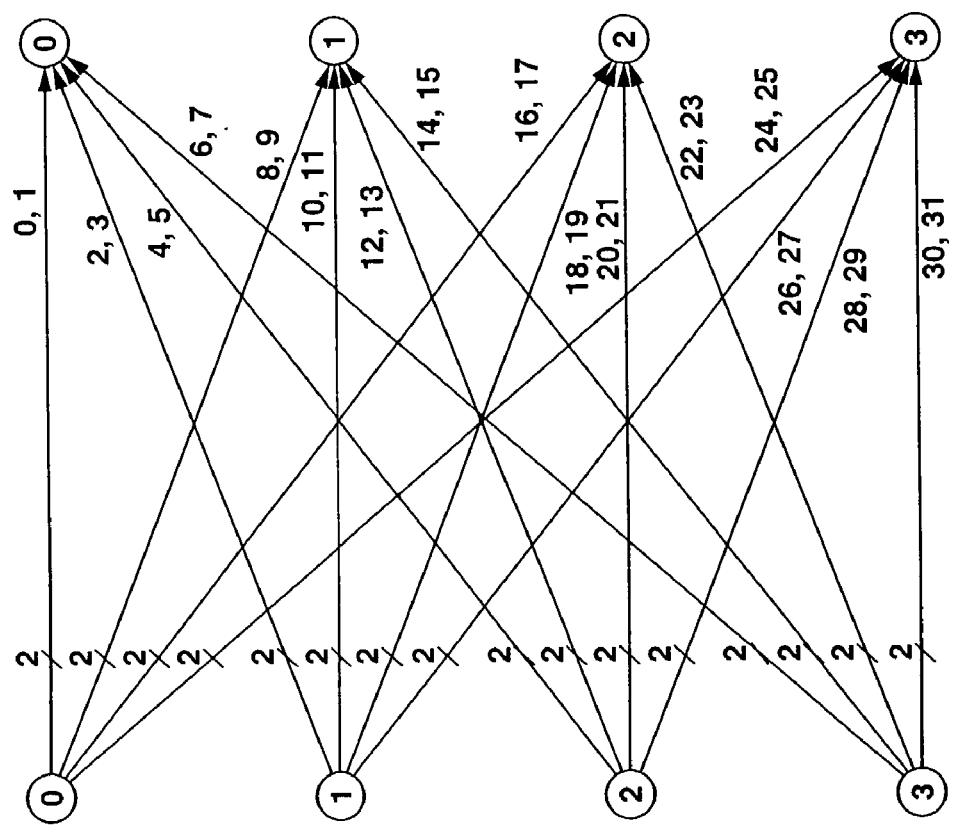
FIG.77B
FIG.77A

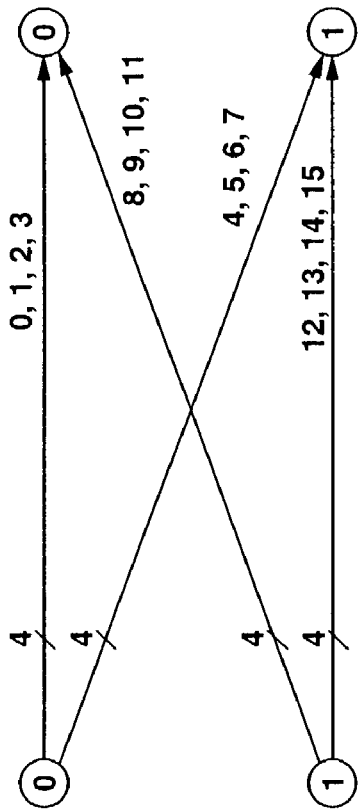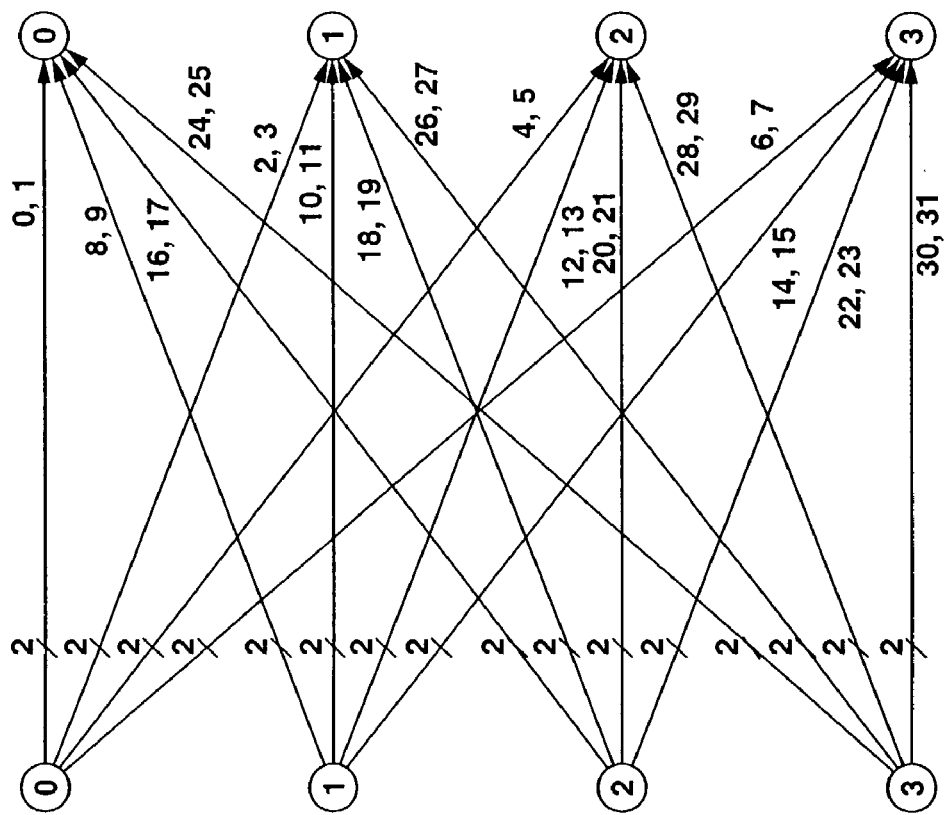
FIG.78B
FIG.78A

SOFT-OUTPUT DECODING

TECHNICAL FIELD

The present invention relates to a soft-output decoding apparatus and method, and a decoding apparatus and method, suitable for repetitive decoding.

BACKGROUND ART

These years, studies have been made to minimize the symbol error rate by making soft-output of a result of decoding of an inner code in a concatenated code and a result of each repetitive decoding based on the repetitive decoding method, and suitable decoding methods for the error rate minimization have actively been studied. As a typical example, there is already known the BCJR algorithm proposed by Bahl, Cocke, Jelinek and Raviv in their "Optimal Decoding of Linear Codes for Minimizing Symbol Error Rate" (IEEE Trans. Inf. Theory, vol. IT-20, pp. 284–287, March 1974). The BCJR algorithm does not output each symbol as a result of decoding but it outputs the likelihood of each symbol. Such an output is called "soft-output". What the BCJR algorithm is will be described below. In the following description, it will be assumed that as shown in FIG. 1, an encoder 1001 included in a transmitter (not shown) makes convolutional coding of digital information, and the output of the transmitter is supplied to a receiver (not shown) via a noisy non-storage communications channel 1002, and decoded, for observation, by a decoder 1003 included in the receiver.

First, a number M of states (transition state) representing the content of a shift register included in the encoder 1001 are denoted by m(0, 1, ..., M-1), and a state at a time t is denoted by $S_t$. On the assumption that k-bit information is supplied in one time slot, an input at the time t is denoted by $i_t = (i_{t1}, i_{t2}, \ldots, i_{tk})$ and an input sequence is denoted by $I_t^T = (i_1, i_2, \ldots, i_T)$. In case there is a transition from a state m' to a state m at this time, an information bit corresponding to the transition is denoted by $i(m', m) = (i_1(m', m), i_2(m', m), \ldots, i_k(m', m))$. Further, on the assumption that an n-bit code is outputted in one time slot, an output at the time t is denoted by $X_t = (x_{t1}, x_{t2}, \ldots, x_{tn})$ and an output sequence is denoted by $X_1^T = (x_1, x_2, \ldots, x_T)$. In case there is a transition from the state m' to the state m at this time, a code bit for the transition is denoted by $X(m', m) = (x_1(m', m), x_2(m', m), \ldots, x_n(m', m))$.

It is assumed that the convolutional coding by the encoder 1001 begins with a state $S_0 = 0$ and ends with $S_T = 0$ with outputting $X_1^T$. The probability $P_t(m|m')$ of a transition from one state to another is defined by the following expression (1):

$$P_t(m|m') = Pr\{S_t = m | S_{t-1} = m'\} \tag{1}$$

Note that in the right side of the expression (1), $Pr\{A|B\}$ is a conditional probability in which A will occur under the same conditions as those under which B has occurred. The probability of transition $P_t(m|m')$ is equal to the probability $Pr\{i_t = i\}$ in which the input $i_t$ at the time t is i when the input i transits from the state m' to state m, as will be seen from the following expression (2):

$$P_t(m|m') = Pr\{i_t = i\} \tag{2}$$

Supplied with $X_1^T$ as an input, the noisy non-storage communications channel 1002 outputs $Y_1^T$. On the assumption that an n-bit received value is outputted in one time slot, an output at the time t will be $y_t = (y_{t1}, y_{t2}, \ldots, y_{tn})$ and the output of the channel will be $Y_1^T = (y_1, y_2, \ldots, y_T)$. The transition probability of the noisy non-storage channel 1002 can be defined by a transition probability $Pr\{y_j|x_j\}$ of each symbol for all times $t(1 \leq t \leq T)$ as given by the following expression (3):

$$Pr\{Y_1^t | X_1^t\} = \prod_{j=1}^{t} Pr\{y_j | x_j\} \tag{3}$$

The likelihood of input information at a time t when $Y_1^T$ is received is denoted by $\lambda_{tj}$ as defined by the following expression (4). This is the very thing to be determined, namely, a soft-output.

$$\lambda_{tj} = \frac{Pr\{i_{tj} = 1 | Y_1^T\}}{Pr\{i_{tj} = 0 | Y_1^T\}} \tag{4}$$

In the BCJR algorithm, probabilities $\alpha_t$, $\beta_t$ and $\gamma_t$ as shown in the following expressions (5) and (7) are defined. Note that $Pr\{A; B\}$ is a probability in which both A and B will occur.

$$\alpha_t(m) = Pr\{S_t = m; Y_1^t\} \tag{5}$$

$$\beta_t(m) = Pr\{Y_{t+1}^T | S_t = m\} \tag{6}$$

$$\gamma_t(m', m) = Pr\{S_t = m; y_t | S_{t-1} = m'\} \tag{7}$$

What these probabilities $\alpha_t$, $\beta_t$ and $\gamma_t$ are will be described with reference to FIG. 2 showing a trellis which provides a diagram of state transition taking place in the encoder 1001. In FIG. 2, $\alpha_{t-1}$ corresponds to a probability of passing by each state at a time t-1 computed from a coding start state $S_0 = 0$ in time sequence on the basis of a received value; $\beta_t$ corresponds to a probability of passing by each state at a time t computed from a coding termination state $S_T = 0$ in reverse time sequence on the basis of the received value; and $\gamma_t$ corresponds to a probability of reception of an output of each branch runs from one state to another at the time t computed on the basis of a received value and input probability at the time t.

Using these probabilities $\alpha_t$, $\beta_t$ and $\gamma_t$, the soft-output $\lambda_{tj}$ can be given by the following expression (8):

$$\lambda_{tj} = \frac{\sum_{\substack{i,j \\ (m',m)=1}} \alpha_t(m')\gamma_t(m', m)\beta_t(m)}{\sum_{\substack{i,j \\ (m',m)=0}} \alpha_t(m')\gamma_t(m', m)\beta_t(m)} \tag{8}$$

The relation among the times t=1, 2, ..., T can be given by the following expression (9):

$$\alpha_t(m) = \sum_{m'=0}^{M-1} \alpha_{t-1}(m')\gamma_t(m', m) \tag{9}$$

where $\alpha_0(0) = 1$, $\alpha_0(m) = 0 (m \neq 0)$.

The above relation among the times t=1, 2, ..., T can also be given by the following expression (10):

$$\beta_t(m) = \sum_{m'=0}^{M-1} \beta_{t+1}(m')\gamma_{t+1}(m, m') \quad (10)$$

where $\beta_T(0) = 1$, $\beta_T(m) = 0 (m \neq 0)$.

Further, the probability $\gamma_t$ can be given by the following expression (11):

$$\gamma_t(m', m) = \begin{cases} P_t(m|m') \cdot Pr\{y_t|x(m', m)\} \\ \quad = Pr\{i_t = i(m', m)\} \cdot Pr\{y_t|x(m', m)\} \\ \quad : \text{Transition from } m' \text{ to } m \text{ with input } i \\ 0 \quad : \text{No transition from } m' \text{ to } m \text{ with input } i \end{cases} \quad (11)$$

Therefore, to adopt the BCJR algorithm for the soft-output decoding, the decoder 1003 determines a soft-output $\lambda_t$ based on the above-mentioned relations by running through a sequences of operational steps in a flow chart shown in FIG. 3.

First in step S1001 shown in FIG. 3, each time the decoder 1003 receives $y_t$, it computes probabilities $\alpha_t(m)$ and $\gamma_t(m', m)$ based on the above expressions (9) and (11).

Next in step S1002, after receiving all data in the sequence $Y_1^T$, the decoder 1003 computes a probability $\beta_t(m)$ of each state m at all times t on the basis of the above expression (10).

Then in step S1003, the decoder 1003 computes the soft-output $\lambda_t$ at each time t by placing, into the above expression (8), the probabilities $\alpha_t$, $\beta_t$ and $\gamma_t$ having been computed in steps S1001 and S1002.

Going through the above sequences of operational steps, the decoder 1003 can make the soft-output decoding by adopting the BCJR algorithm.

It should be reminded here that the BCJR algorithm has a problem that since the computational operations have to be done with a probability being held as it is as a value and include a product operation, so this algorithm needs large amounts of computation. To reduce the amounts of computation, there are available the Max-Log-MAP and Log-Map algorithms (will be referred to as "Max-Log-BCJR algorithm" and "Log-MCJR algorithm", respectively, hereunder) proposed by Robertson, Villebrun and Hoeher in their "A Comparison of Optimal and Sub-optimal MAP Decoding Algorithms Operating in the Domain" (IEEE Int. Conf. on Communications, pp. 1009–1013, June 1995).

First, the Max-Log-BCJR algorithm will be explained. In this algorithm, the probabilities $\alpha_t$, $\beta_t$, and $\gamma_t$ and the soft-output $\lambda_t$ are logarithmically notated by natural logarithms, respectively, the product operation for the probabilities is replaced with a logarithmic-sum operation as shown in the following expression (12), and the sum operation for the probabilities is approximated by computation of a logarithmic maximum value as shown in the following expression (13). Note that max(x, y) in the following expression (13) is a function to select "x" or "y", whichever has a larger value.

$$\log(e^x \cdot e^y) = x+y \quad (12)$$

$$\log(e^x + e^y) \approx \max(x+y) \quad (13)$$

To simplify the description, the natural logarithm is represented by I, and the natural logarithms of the probabilities $\alpha_t$, $\beta_t$ and $\gamma_t$ and soft-output $\lambda_t$ are represented by $I\alpha_t$, $I\beta_t$, $I\gamma_t$ and $I\lambda_t$, respectively, as shown in the following expression (14). Note that "sgn" in the expression (14) is a constant indicating a sign which provides a discrimination between positive and negative, that is, "+1" or "−1".

$$\begin{cases} I\alpha_t(m) = \text{sgn} \cdot \log(\alpha_t(m)) \\ I\beta_t(m) = \text{sgn} \cdot \log(\beta_t(m)) \\ I\gamma_t(m) = \text{sgn} \cdot \log(\gamma_t(m)) \\ I\lambda_t = \text{sgn} \cdot \log \lambda_t \end{cases} \quad (14)$$

The reason why such a constant sgn is given is that since each of the probabilities $\alpha_t$, $\beta_t$ and $\gamma_t$ takes a value ranging from 0 to 1, each of the computed logarithmic likelihood $I\alpha_t$, $I\beta_t$ and $I\gamma_t$ takes a negative value in principle.

For example, in case the decoder 1003 is constructed as a software, the constant sgn may be either "+1" or "−1" because the decoder 1003 can process any value, positive or negative. In case the decoder 1003 is constructed as a hardware, the positive/negative discrimination sign for a computed negative value should desirably be inverted and handled as a positive value in order to reduce the number of bits.

More particularly, in case the decoder 1003 is constructed as a system in which only negative values are handled as a log likelihood, the constant sgn takes "+1". On the other hand, in case the decoder 1003 is constructed as a system in which only positive values are handled as a log likelihood, the constant sgn takes "−1". In the following, the algorithms will be described with consideration given to the above.

In the Max-Log-BCJR algorithm, each of the log likelihood $I\alpha_t$, $I\beta_t$ and $I\gamma_t$ is approximated as shown in the following expressions (15) to (17). The term "msgn(x, y)" in the expressions (15) and (16) indicates a function max(x, y) by which x or y, whichever has a larger value, is selected when the constant sgn is "+1", while it indicates a function min(x, y) by which x or y, whichever is smaller in value, is selected when the constant sgn is "−1". It is assumed here that the function msgn(x, y) in the state m' at the right side of the expression (15) is determined within the state m' in which there exists a transition to the state m, while the function msgn(x, y) in the state m' at the right side of the expression (16) is determined within the state m' in which there exists a transition from the state m.

$$I\alpha_t(m) \simeq \underset{m'}{\text{msgn}}(I\alpha_{t-1}(m') + I\gamma_t(m'm)) \quad (15)$$

$$I\beta_t(m) \simeq \underset{m'}{\text{msgn}}(I\beta_{t+1}(m') + I\gamma_{t+1}(m, m')) \quad (16)$$

$$I\gamma_t(m',m) = \text{sgn} \cdot (\log(Pr\{i_t=i(m',m)\}) + \log(Pr\{y_t|x(m',m)\})) \quad (17)$$

With the Max-Log-BCJR algorithm, also the log soft-output $I\lambda_t$ is similarly approximated as given by the following expression (18). It is assumed here that the function msgn in the first term at the right side of the expression (18) is determined within the state m' in which there exists a transition to the state m when the decoder 1003 is supplied with an input of "1", while the function msgn in the second term is determined within the state m' in which there exists a transition to the state m when the decoder 1003 is supplied with an input of "0".

$$I\lambda_{t,j} \simeq \underset{\substack{m'm \\ i_j(m',m)=1}}{\text{msgn}} (I\alpha_{t-1}(m') + I\gamma_t(m', m) + I\beta_t(m)) - \quad (18)$$

$$\underset{\substack{m'm \\ i_j(m',m)=0}}{\text{msgn}} (I\alpha_{t-1}(m') + I\gamma_t(m', m) + I\beta_t(m))$$

Therefore, when making soft-output decoding with the Max-Log-BCJR algorithm, the decoder 1003 goes through a sequences of operational steps in a flow chart shown in FIG. 4 to determine a soft-output $\lambda_t$ on the basis of the above relations.

First in step S1011 in FIG. 4, each time the decoder 1003 receives $y_t$, it computes log likelihood $I\alpha_t(m)$ and $I\lambda_t(m'\,m)$ on the basis of the above expressions (15) and (17).

Then in step S1012, after receiving all data in the sequence $Y_1^T$, the decoder 1003 computes a log likelihood $I\beta_t(m)$ for each state m at all times t on the basis of the expression (16).

Then in step S1013, the decoder 1003 places, in the expression (18), the log likelihood $I\alpha_t$, $I\beta_t$ and $I\gamma_t$ having been computed in steps S1011 and S1012 to compute a log soft-output $I\lambda_t$ at each time t.

Going through the above sequences of operational steps, the decoder 1003 can make the soft-output decoding with the Max-Log-BCJR algorithm.

Thus, since the Max-Log-BCJR algorithm includes no product operation, it permits to determine any desired value with considerably smaller amounts of computation than the BCJR algorithm.

Next, the Log-BCJR algorithm will be described. This algorithm is a version of the Max-Log-BCJR algorithm, which permits an approximation with a higher accuracy. More particularly, with the Log-BCJR algorithm, the probability sum operation shown in the expression (13) is deformed by adding a correction term as given by the following expression (19), to determine a correct log value by the sum operation. Such a correction will be called "log-sum correction".

$$\log(e^x + e^y) = \max(x, y) + (1 + e^{-|x-y|}) \quad (19)$$

The operation at the left side of the expression (19) will be called "log-sum operation". According to the numeration system described in "Implementation and Performance of A Turbo/MAP Decoder" (S. S. Pietrobon; Int. J. Satellite Commun., vol. 16, pp. 23–46, January–February 1998), the operator for this log-sum operation will be denoted by "#" (which is "E" in the Pietrobon's paper) as in the following expression (20) for convenience' sake.

$$x \# y = \log(e^x + e^y) \quad (20)$$

Note that the expressions (19) and (20) are for the above constant sgn of "+1" but when the constant sgn is "−1", operations corresponding to the expressions (19) and (20) are as given by the following expressions (21) and (22), respectively:

$$-\log(e^{-x} + e^{-y}) = \min(x, y) - \log(1 + e^{-|x-y|}) \quad (21)$$

$$x \# y = -\log(e^{-x} + e^{-y}) \quad (22)$$

Further, the operator for the cumulative add operation in the log-sum operation will be denoted by "#Σ" (which is "E" in the paper) as given by the following expression (23).

$$\# \sum_{i=0}^{M-1} x_i = ((\,\ldots\,((x_0 \# x_1) \# x_2) \ldots\,) \# x_{M-1}) \quad (23)$$

Using the above operators, the log likelihood $I\alpha_t$ and $I\beta_t$ and log soft-output $I\lambda_t$ in the Log-BCJR algorithm may be denoted as given by the following expressions (24) to (26), respectively. Note that since the log likelihood $I\gamma_t$ is denoted as given by the above expression (17), it will not be described.

$$I\alpha_t(m) = \# \sum_{m'=0}^{M-1} (I\alpha_{t-1}(m') + I\gamma_t(m', m)) \quad (24)$$

$$I\beta_t(m) = \# \sum_{m'=0}^{M-1} (I\beta_{t+1}(m') + I\gamma_{t+1}(m, m')) \quad (25)$$

$$I\lambda_{tj} = \# \sum_{\substack{i_j\binom{m',m}{m',m}=1}} (I\alpha_{t-1}(m') + I\gamma_t(m', m) + I\beta_t(m)) - \quad (26)$$

$$\# \sum_{\substack{i_j\binom{m',m}{m',m}=0}} (I\alpha_{t-1}(m') + I\gamma_t(m', m) + I\beta_t(m))$$

Note that the operator for the cumulative add operation in the log-sum operation in the state m' at the right side of the above expression (24) will be determined in the state m' in which there exists a transition to the state m and the operator for the cumulative add operation in the log-sum operation in the state m' at the right side of the above expression (25) will be determined in the state m' in which there exists a transition from the state m. Also, the operator for the cumulative add operation in the log-sum operation in the first term at the right side of the above expression (26) will be determined in the state m' in which there exists a transition to the state m when the input is "1", while the operator for the cumulative add operation in the log-sum operation in the second term will be determined in the state m' in which there exists a transition to the state m when the input is "0".

Therefore, when making soft-output decoding with the Log-BCJR algorithm, the decoder 1003 goes through the sequences of operational steps in the flow chart shown in FIG. 4 to determine a soft-output $\lambda_t$ on the basis of the above relations.

First in step S1011 in FIG. 4, each time the decoder 1003 receives $y_t$, it computes log likelihood $I\alpha_t(m)$ and $I\gamma_t(m'\,m)$ based on the above expressions (24) and (17).

Then in step S1012, after receiving all data in the sequence $Y_1^T$, the decoder 1003 computes a log likelihood $I\beta_t(m)$ for each state m at all times t based on the expression (25).

Then in step S1013, the decoder 1003 computes a log soft-output $I\lambda_t$ at each time t by placing, in the expression (26), the log likelihood $I\alpha_t$, $I\beta_t$ and $I\gamma_t$ having been computed in steps S1011 and S1012.

Going through the above sequences of operational steps, the decoder 1003 can make the soft-output decoding with the Log-BCJR algorithm. Note that since in the above expressions (19) and (21), the correction term in the second term at the right side is represented by a one-dimensional function for a variable |x−y|, the decoder 1003 can accurately compute a probability by pre-storing the values of the corrective term as a table in a ROM (read-only memory) (not shown).

The Log-BCJR algorithm needs more operations than the Max-Log-BCJR algorithm but does not include any product operation, and its output except for a quantize error is the very log value of a BCJR algorithm soft-output.

It should be reminded that the BCJR algorithm, Max-Log-BCJR algorithm or Log-BCJR algorithm permitting to decode trellis codes such as convolutional code or the like may be used for decoding a code generated by using the trellis code as an element code and concatenating a plurality of element encoders via an interleaver. That is, the BCJR, Max-Log BCJR or Log-BCJR algorithm can be used for decoding a parallel concatenated convolutional codes (will be referred to as "PCCC" hereunder) or serially concatenated convolutional codes (will be referred to as "SCCC" hereunder), or turbo trellis-coded modulation (will be referred to as "TTCM" hereunder) or serial concatenated trellis-coded modulation (will be referred to as "SCTCM" hereunder), in which the PCCC or SCCC is combined with a multi-valued modulation and signal point mapping and error correction code decoding characteristic are collectively put in consideration.

A decoder to decode any of the above PCCC, SCCC, TTCM and SCTCM codes will make a so-called repetitive decoding by a plurality of element decoders each destined to make a maximum a posteriori probability (MAP) decoding based on the BCJR, Max-Log-BCJR or Log-BCJR algorithm.

It should be reminded that in case a code to be decoded is a punctured one or in a similar case, each of the element decoders has to be supplied with erasure position information, indicative of a position where there is not any coded output such as a puncture position or the like, as information necessary for the soft-output decoding. The erasure position information has to be held separately at least until a log likelihood $I\gamma$ is computed. To this end, each of the decoders should be provided with a memory circuit to hold the erasure position information, for example, which has been a cause of an increased circuit scale.

Decoding of a code whose parallel paths exist in a trellis will be discussed hereinbelow. In this case, though the parallel paths can be regarded as a single path because its transition origins are same in state and transition destinations are also same in state, each element decoder has to decode the parallel paths as two paths. Especially when computing log likelihood $I\alpha$ and $I\beta$, a larger number of paths have to be considered, and so the processing burden to each of the element decoders will be larger.

Also, when computing a log soft-output $I\lambda$, each element decoder has to predetermine the sum of log likelihood $I\alpha$ and $I\lambda$. Namely, to compute the log soft-output $I\lambda$, each element decoder should normally be provided with a separate circuit to compute the sum of log likelihood $I\alpha$ and $I\gamma$. Thus, in each of the element decoders, the circuit to compute the log soft-output $I\lambda$ will possibly be increased in scale.

DISCLOSURE OF THE INVENTION

To overcome the above-mentioned drawbacks of the prior art, the present invention has an object to provide a soft-output decoding apparatus and method, capable of representing a code erasure position by a small-scale, simple-structured circuit. The present invention has another object to provide a decoding apparatus and method, suitable for repetitive decoding by which a code erasure position can be expressed by a small-scale, simple-structured circuit.

The present invention has another object to provide a soft-output decoding apparatus and method, capable of soft-output decoding with less operating burden, with no degradation of processing performance and at a high operating speed. The present invention has another object to provide a decoding apparatus and method, suitable for repetitive decoding, by which a soft-output can be decoded with less processing burden, with no degradation of processing performance and at a high operating speed.

The present invention has another object to provide a soft-output decoding apparatus and method, capable of soft-output decoding by a small-scale, simple-structured circuit. The present invention has another object to provide a decoding apparatus and method, suitable for repetitive decoding by which a soft-output can be decoded by a small-scale, simple-structured circuit.

The above object can be attained by providing a soft-output decoder which determines, based on a received value taken as a soft-input, a log likelihood logarithmically notated of a probability of passing through arbitrary states and makes decoding with the log likelihood, the apparatus including a zero-symbol replacing means for replacing a position where no coded output exists with a symbol whose likelihood is "0", based on erasure position information indicative of an erasure position of the coded output, and a soft-output decoding means which is supplied with the received value and a priori probability information, and makes soft-output decoding of the data to generate a log soft-output logarithmically notated of a soft-output at each time and/or extrinsic information. Also, the above object can be attained by providing a soft-output decoding method.

Also, the above object can be attained by providing a soft-output decoder which determines, based on a received value taken as a soft-input, a log likelihood logarithmically notated of a probability of passing through arbitrary states and makes decoding with the log likelihood, the apparatus including a first probability computing means for computing, for each received value, a first log likelihood logarithmically notated of a first probability determined based on an output pattern of a code and received value, a first probability distributing means for distributing the first log likelihood so as to correspond to each branch of a trellis corresponding to the configuration of the code, and a parallel path processing means for tying together the first log likelihood corresponding to the first parallel paths when the code to be decoded includes parallel paths whose transition origins are same in state and transition destinations are same in state. Also, the above object can be attained by providing a soft-output decoding method.

Also, the above object can be attained by providing a soft-output decoder which determines, based on a received value taken as a soft-input, a log likelihood logarithmically notated of a probability of passing through arbitrary states and makes decoding with the log likelihood, the apparatus including a first probability computing means for computing, for each received value, a first log likelihood logarithmically notated of a first probability determined based on the output pattern of a code and the received value, a second probability computing means for computing, for each received value, a second log likelihood logarithmically notated of a second probability of transition from a coding start state to each state in time sequence on the basis of the first log likelihood, a third probability computing means for computing, for each received value, a third log likelihood logarithmically notated of a third probability of transition from a coding termination state to each state in reverse time sequence on the basis of the first log likelihood, and a soft-output computing means for computing a log soft-output logarithmically notated of a soft-output at each time on the basis of the first to third log likelihood, the second probability computing means supplying the soft-output computing means with the sum of the second log likelihood and the first log likelihood determined in the process of computing the second log likelihood. Also, the above object can be attained by providing a soft-output decoding method.

BRIEF DESCRIPTION OF THE DRAWINGS

FIG. 1 is a block diagram of a communication model.

FIG. 2 shows a trellis in the conventional encoder, explaining the probabilities α, β and γ.

FIG. 3 shows a flow of operations made in soft-output decoding based on the BCJR algorithm in the conventional decoder.

FIG. 4 shows a flow of operations made in soft-output decoding based on the Max-Log-BCJR algorithm in the conventional decoder.

FIGS. 59A to 59D explain together how the RAMs in the interleaver are used to make random interleaving of one-symbol input data, in which FIG. 59A shows a delay-use RAM, FIG. 59B shows an interleaving RAM, FIG. 59C shows an addressing RAM and FIG. 59D shows a RAM not used.

FIGS. 60A to 60D explain together how the RAMs in the interleaver are used to make random interleaving of two-symbol input data, in which FIG. 60A shows a delay-use RAM, FIG. 60B shows an interleaving RAM, FIG. 60C shows an addressing RAM and FIG. 60D shows a RAM not used.

FIGS. 61A to 61C explain together how the RAMs in the interleaver are used to make in-line interleaving of two-symbol input data, in which FIG. 61A shows a delay-use RAM, FIG. 61B shows an interleaving RAM and FIG. 61C shows an addressing RAM.

FIGS. 62A to 62D explain together how the RAMs in the interleaver are used to make pair-wise interleaving of two-symbol input data, in which FIG. 62A shows a relay RAM, FIG. 62B shows an interleaving RAM, FIG. 62C shows an addressing RAM and FIG. 62D shows a RAM not used.

FIGS. 63A to 63D explain together how the RAMs in the interleaver are used to make random interleaving of three-symbol input data, in which FIG. 63A shows a delay-use RAM, FIG. 63B shows an interleaving RAM, FIG. 63C shows an addressing RAM and FIG. 63D shows a RAM not used.

FIGS. 64A to 64D explain together how the RAMs in the interleaver are used to make in-line interleaving of three-symbol input data, in which FIG. 64A shows a delay-use RAM, FIG. 64B shows an interleaving RAM, FIG. 64C shows an addressing RAM and FIG. 64D shows a RAM not used.

FIGS. 65A to 65D explain together how the RAMs in the interleaver are used to make pair-wise interleaving of three-symbol input data, in which FIG. 65A shows a delay-use RAM, FIG. 65B shows an interleaving RAM, FIG. 65C shows an addressing RAM and FIG. 65D shows a RAM not used.

FIGS. 71A to 71D explain together the trellis in the convolutional encoder shown in FIG. 18 and how numbering is made from an input branch as viewed from a transition-destination state, in which FIG. 71A shows numbering made when four memories are provided, FIG. 71B shows numbering made when three memories are provided, FIG. 71C shows numbering made when two memories are provided and FIG. 71D shows numbering made when one memory is provided.

FIGS. 72A to 72D explain together the trellis in the convolutional encoder shown in FIG. 18 and how numbering is made from an output branch as viewed from a transition-origin state, in which FIG. 72A shows numbering made when four memories are provided, FIG. 72B shows numbering made when three memories are provided, FIG. 72C shows numbering made when two memories are provided and FIG. 72D shows numbering made when one memory is provided.

FIGS. 73A and 73B explain together the trellis in the convolutional encoder shown in FIG. 19 and how numbering is made from an input branch as viewed from a transition-destination state, in which FIG. 73A shows numbering made when three memories are provided and FIG. 73B shows numbering made when two memories are provided.

FIGS. 74A and 74B explain together the trellis in the convolutional encoder shown in FIG. 19 and how numbering is made from an output branch as viewed from a transition-origin state, in which FIG. 74A shows numbering made when three memories are provided and FIG. 74B shows numbering made when two memories are provided.

FIGS. 75A and 75B explain together the trellis in the convolutional encoder shown in FIG. 20 and how numbering is made from an input branch as viewed from a transition-destination state, in which FIG. 75A shows numbering made when three memories are provided and FIG. 75B shows numbering made when two memories are provided.

FIGS. 76A and 76B explain together the trellis in the convolutional encoder shown in FIG. 20 and how numbering is made from an output branch as viewed from a transition-origin state, in which FIG. 76A shows numbering made when three memories are provided and FIG. 76B shows numbering made when two memories are provided.

FIGS. 77A and 77B explain together the trellis in the convolutional encoder shown in FIG. 21 and how numbering is made from an input branch as viewed from a transition-destination state, in which FIG. 77A shows numbering made when two memories are provided and FIG. 77B shows numbering made when one memory is provided.

FIGS. 78A and 78B explain together the trellis in the convolutional encoder shown in FIG. 21 and how numbering is made from an output branch as viewed from a transition-origin state, in which FIG. 78A shows numbering made when two memories are provided and FIG. 78B shows numbering made when one memory is provided.

FIGS. 84A and 84B explain together how the log likelihood Iγ is normalized when the element decoder takes log likelihood as a negative value, in which FIG. 84A shows an example mapping of the log likelihood Iγ before normalized and FIG. 84B shows an example mapping of the log likelihood Iγ after normalized.

FIGS. 85A and 85B explain together how the log likelihood Iγ is normalized when the element decoder takes a log likelihood as a positive value, in which FIG. 85A shows an example mapping of the log likelihood Iγ before normalized and FIG. 85B shows an example mapping of the log likelihood Iγ after normalized.

FIGS. 87A to 87D explain together an example of the trellis in the convolutional encoder, in which FIG. 87A shows an example in which one memory is provided, FIG. 87B shows an example in which two memories are provided, FIG. 87C shows an example in which three memories are provided and FIG. 87D shows an example in which four memories are provided.

FIGS. 98A to 98D explain together how extrinsic information is normalized symbol by symbol, in which FIG. 98A shows an example mapping of extrinsic information before normalized, FIG. 98B shows an example mapping of extrinsic information before and after a normalization by which extrinsic information having a maximum value is set to a predetermined value, FIG. 98C shows an example mapping of extrinsic information after clipped and FIG. 98D shows an example mapping of extrinsic information after subjected to a normalization by which a value of extrinsic information for one-symbol is subtracted from a value of extrinsic information for any other symbol.

FIGS. 109A and 109B explain together the storage capacity of the RAM in the interleaver, in which FIG. 109A shows the normal storage capacity of the RAM and FIG. 109B shows the pseudo storage capacity of the RAM in case the RAM is caused to act as a partial-write RAM.

FIG. 114 is a block diagram of two neighboring simplified element decoders forming the decoder, showing a symbol reshuffle circuit provided in the interleaver.

FIG. 115 is a block diagram of two neighboring simplified element decoders forming the decoder, showing a symbol reshuffle circuit provided in the soft-output decoding circuit.

BEST MODE FOR CARRYING OUT THE INVENTION

Figure 5:
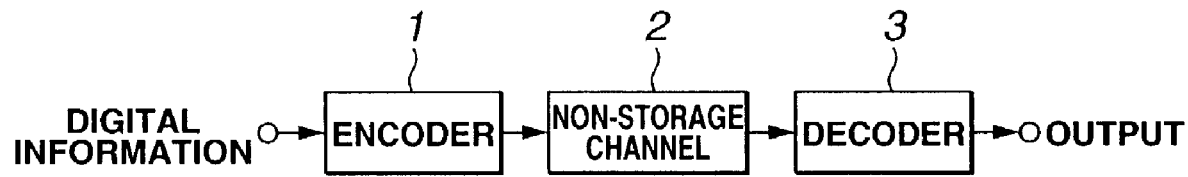
FIG. 5 is a block diagram of a communication model adopting the data transmission/reception system as one embodiment of the present invention.

Referring to the drawings, preferred embodiments of the present invention will be explained in detail.

FIG. 5 is a block diagram of a communication model adopting the data transmission/reception system as one embodiment of the present invention. As shown, digital information is coded by an encoder 1 included in a transmitter (not shown), output from the encoder 1 is supplied to a receiver (not shown) via a noisy non-storage channel 2, and the coded digital information is decoded by a decoder 3 included in the receiver.

In this data transmission/reception system, the encoder 1 is designed to code the digital information by the parallel concatenated convolutional coding (will be referred to as "PCCC" hereunder) or serially concatenated convolutional coding (will be referred to as "SCCC" hereunder), in which trellis codes such a convolutional code are used as element codes, or turbo trellis-coded modulation (will be referred to as "TTCM" hereunder) or serial concatenated trellis-coded modulation (will be referred to as "SCTCM" hereunder), in which the PCCC or SCCC is combined with a multi-valued modulation. These types of coding are known as a so-called turbo coding.

On the other hand, the decoder 3 is provided to decode a code from the encoder 1. It is formed from a plurality of concatenated element decoders to make a so-called repetitive decoding. Each of these element decoders is a module including at least an interleaver to relocate input data and a soft-output decoder which makes a maximum a posteriori probability (MAP) decoding based on the Max-Log-MAP or Log-Map algorithm (will be referred to as "Max-Log-BCJR algorithm" and "Log-MCJR algorithm", respectively, hereunder) proposed by Robertson, Villebrun and Hoeher in their "A Comparison of Optimal and Sub-optimal MAP Decoding Algorithms Operating in the Domain" (IEEE Int. Conf. on Communications, pp. 1009–1013, June 1995) to provide a log soft-output $I\lambda$ corresponding to log likelihood $I\alpha$, $I\beta$ and $I\gamma$ and so-called a posteriori probability information, logarithmically notated in the form of log likelihood by natural logarithms, respectively, of so-called probabilities $\alpha$, $\beta$ and $\gamma$ and soft-output $\lambda$.

More particularly, the decoder 3 has a function to make a choice between a received value supplied to each of the element decoders and a so-called extrinsic information, as a code likelihood, and thus can appropriately select input information for soft-output decoding and decode a desired one of PCCC, SCCC, TTCM and SCTCM codes without changing the circuit construction.

Note that in the following, each of the element decoders in the decoder 3 will be described as a one destined to make MAP decoding based on the Log-BCJR algorithm.

The present invention will further be described sequentially in the order of the following contents of the description:

Contents:
1. Overview of encoder and decoder for coding and decoding, respectively, based on PCCC, SCCC, TTCM or SCTCM
    1.1 Encoder and decoder for PCCC-based coding and decoding
    1.2 Encoder and decoder for SCCC-based coding and decoding
2. Detailed description of element decoder
    2.1 General construction of element decoder
    2.2 Detailed description of soft-output decoding circuit
    2.3 Detailed description of interleaver
3. Decoder formed from concatenated element decoders
4. Functions of all element decoders
    4.1 Switching code likelihood
    4.2 Delaying received value
    4.3 Selecting received value to be decoded
    4.4 Using decoding and delaying-use data storage circuits in common
    4.5 Delaying frame-top information
    4.6 Operation of soft-output decoding circuit or interleaver as unit
    4.7 Switching delay mode
    4.8 Generating next-stage information
    4.9 System check
5. Functions of soft-output decoding circuit
    5.1 Supplying code information
        5.1.1 Computing input/output patterns for all trellis branches
        5.1.2 Numbering between transition origins and destination states
        5.1.3 Numbering along time base, and numbering in sequence opposite to time base
        5.1.4 Numbering based on uniqueness of entire trellis
    5.2 Entering termination information
        5.2.1 Entering information for input bits for termination period
        5.2.2 Entering information indicative of termination state for one time slot
    5.3 Processing of erasure position
    5.4 Computing and distributing log likelihood $I\gamma$
        5.4.1 Computing and distributing log likelihood $I\gamma$ for all input/output patterns
        5.4.2 Computing and distributing log likelihood $I\gamma$ for at least a part of the input/output patterns
        5.4.3 Normalizing log likelihood $I\gamma$ for all input/output patterns at each time
        5.4.4 Normalizing log likelihood $I\gamma$ for at least a part of the input/output patterns 5.5 Computing log likelihood Iα and Iβ
  5.5.1 Computing sum of log likelihood Iα and Iγ
  5.5.2 Pre-processing parallel paths
  5.5.3 Sharing add/compare selection circuit for different codes
  5.5.4 Outputting log likelihood Iγ for computation of log soft-output Iγ
  5.5.5 Computing sum of log likelihood Iα and Iγ for parallel paths
  5.5.6 Selecting log likelihood corresponding to code configuration
  5.5.7 Normalizing log likelihood Iα and Iβ
  5.5.8 Computing correction term in the log-sum correction
  5.5.9 Generating selection-use control signal in log-sum operation
5.6 Computing log soft-output Iλ
  5.6.1 Cumulative add operation in log-sum operation with enable signal
  5.6.2 Cumulative add operation in log-sum operation without enable signal
5.7 Normalizing extrinsic information
5.8 Hard decision of received value
6. Functions of interleaver
  6.1 Plural kinds of interleaving functions
  6.2 Using interleaving-use and delaying-use data storage circuits in common
  6.3 Controlling operation of storage circuit with clock inhibit signal
  6.4 De-interleaving
  6.5 Generating write and read addresses
  6.6 Delaying for length of interleaving
  6.7 Utilizing address space
  6.8 Writing and reading data by partial-write function
  6.9 Providing both even-length delay and odd-length delay
  6.10 Changing input/output sequence
7. Conclusion 1. Overview of Encoder and Decoder for Coding and Decoding, Respectively, Based on PCCC, SCCC, TTCM or SCTCM Prior to starting the detailed description of the present invention, there will first be described an encoder 1' and decoder 3' for the PCCC-based coding and decoding, respectively, shown in FIGS. 6 and 7, and an encoder 1" and decoder 3" for the SCCC-based coding and decoding, respectively, shown in FIGS. 8 and 9, in order to make clear the extension of the present invention. The encoders 1' and 1" are examples of the aforementioned conventional encoder 1, and the decoders 3' and 3" are examples of the aforementioned conventional decoder 3. Each of the decoders 3' and 3" is formed from concatenated element decoders.

1.1 Encoder and Decoder for the PCCC-Based Coding and Decoding

First, there will be described the encoder 1' to decode digital information based on the PCCC algorithm and the decoder 3' to decode the code from the encoder 1'.

Figure 6:
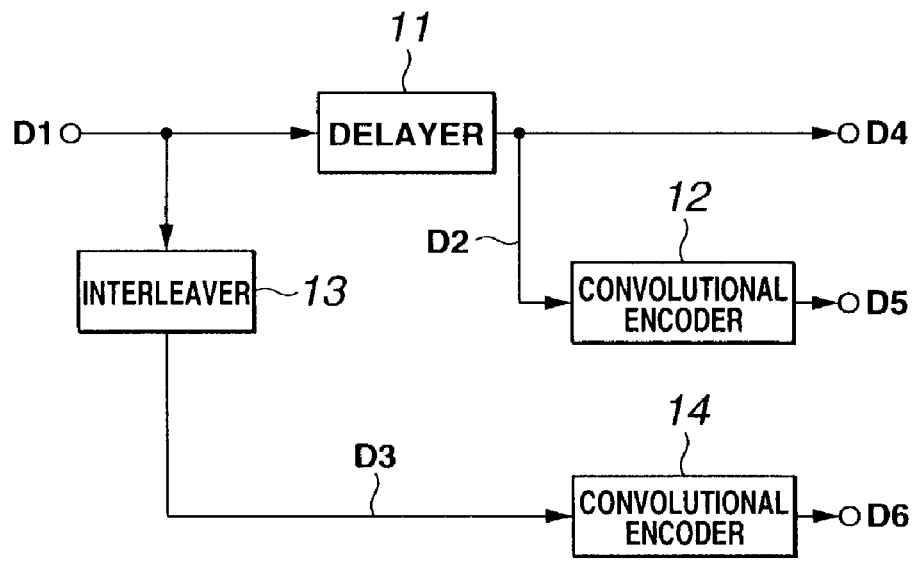
FIG. 6 is a block diagram of an example of the PCCC-based encoder used in the data transmission/reception system in FIG. 5.

Some of the encoders 1' include a delayer 11 to delay input data, two convolutional encoders 12 and 14, and an interleaver 13 to arrange the input data in a difference sequence, as shown in FIG. 6. The encoder 1' makes a "⅓" parallel concatenated convolutional coding of 1-bit input data D1 to generate 3-bit output data D4, D5 and D6 and outputs them to outside via a modulator which adopts for example the binary-phase shift keying (will be referred to as "BPSK" hereunder) or quadrature-phase shift keying (will be referred to as "QPSK" hereunder). The modulator is not illustrated.

The delayer 11 is provided to time outputting of the 3-bit output data D4, D5 and D6. Receiving the 1-bit input data D1, the delayer 11 delays the input data D1 the same time as taken by the interleaver 13 for its operation. The delayer 11 outputs delayed data D2 provided as a result of the delaying of the input data D1 as an output data D4 to outside, while supplying it to the downstream convolutional encoder 12.

Receiving the 1-bit delayed data D2 from the delayer 11, the convolutional encoder 12 makes convolution of the delayed data D2, and outputs the result of operation as an output data D5 to outside.

The interleaver 13 is supplied with the 1-bit input data D1, arranges, in a difference sequence, the bits forming together the input data D1 to generate interleaved data D3, and supplies the thus generated data D3 to a downstream convolutional encoder 14.

Receiving the 1-bit interleaved data D3 supplied from the interleaver 13, the convolutional encoder 14 makes convolution of the interleaved data D3, and outputs the result of operation as an output data D6 to outside.

Supplied with the 1-bit input data D1, the encoder 1' outputs it as an component output data D4 as it is to outside via the delayer 11, and outputs, to outside, the output data D5 provided as a result of the convolution of delayed data D2 by the convolutional encoder 12 and output data D6 provided as a result of the convolution of interleaved data D3 by the convolutional encoder 14, thereby making parallel concatenated convolutional coding at a total rate of "⅓". The data coded by the encoder 1' is subjected to signal point mapping by a modulator (not shown) in a predetermined way of modulation, and outputted to a receiver via the non-storage channel 2.

Figure 7:
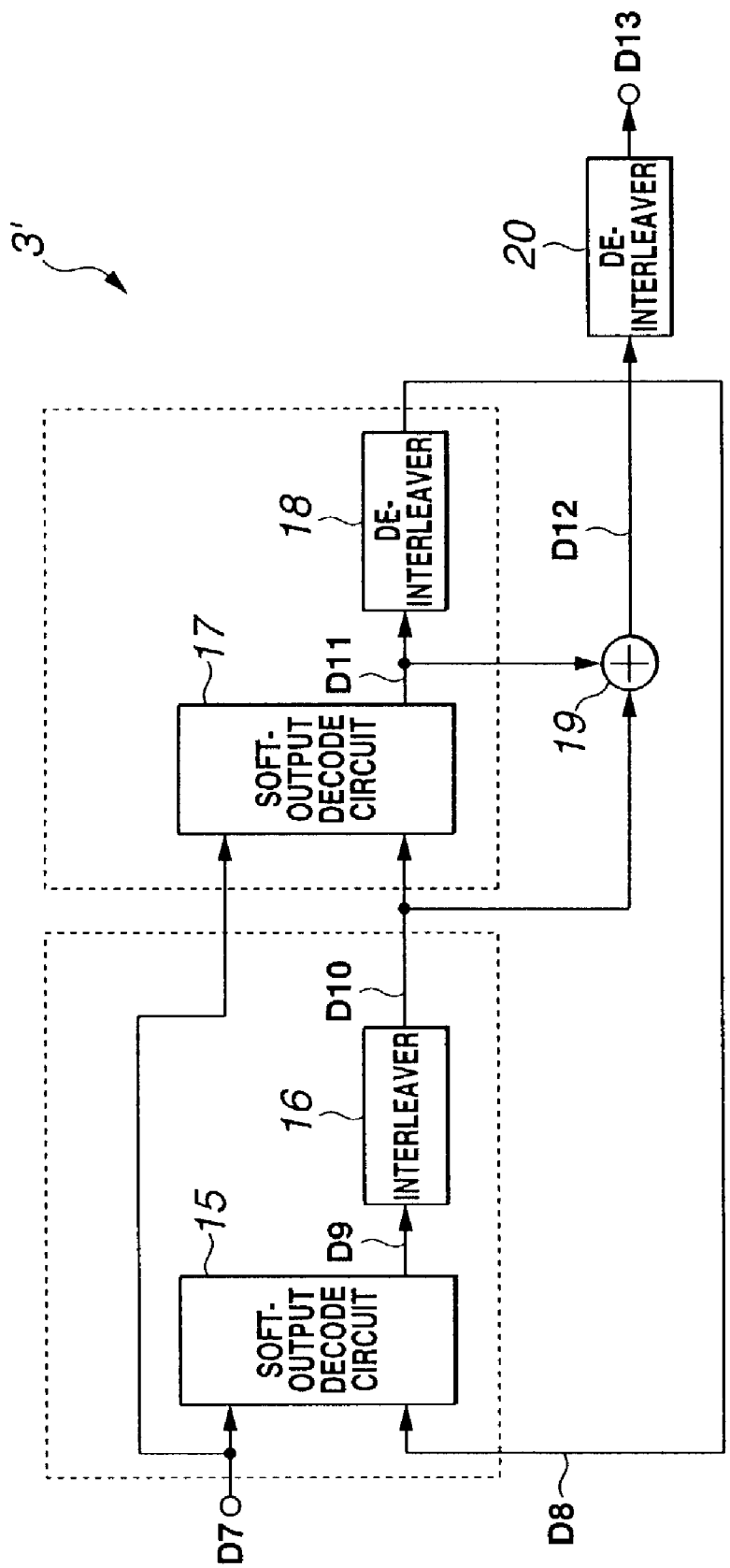
FIG. 7 is a block diagram of an example of the decoder used in the data transmission/reception system in FIG. 5 to decode a code from the encoder shown in FIG. 6.

On the other hand, some of the decoders 3' to decode the data from the encoder 1' include two soft-output decoding circuits 15 and 17, an interleaver 16 to alter the sequence of input data, two de-interleavers 18 and 20 to restore the sequence of the input data to the initial one, and two adders 19 to add two data together, as shown in FIG. 7. The decoder 3' estimates the input data D1 in the encoder 1' from received value D7 made as a soft-input under the influence of a noise developed in the non-storage channel 2, and outputs it as decoded data D13.

The soft-output decoding circuit 15 is provided correspondingly to the convolutional encoder 12 in the encoder 1' to make MAP decoding based on the Log-BCJR algorithm. The soft-output decoding circuit 15 is supplied with a received value D7 of the soft-input and a priori probability information D8 for information bits of soft-input from the de-interleaver 18, and uses the received value D7 and a priori probability information D8 for the soft-output decoding. The soft-output decoding circuit 15 thus generates extrinsic information D9 for information bits obtained under code binding conditions, and outputs the extrinsic information D9 as a soft-output to the downstream interleaver 16.

The interleaver 16 is provided to interleave the extrinsic information D9 for the information bits being the soft-output from the soft-output decoding circuit 15 based on the same replacement position information as in the interleaver 13 in the encoder 1'. The interleaves 16 outputs the data provided as the result of interleaving as a priori probability information D10 for information bits in the downstream soft-output decoding circuit 17, while outputting it to the downstream adder 19.

The soft-output decoding circuit 17 is provided correspondingly to the convolutional encoder 14 in the encoder 1' to make MAP decoding based on the Log-BCJR algorithm as in the soft-output decoding circuit 15. The soft-output decoding circuit 17 is supplied with the received value D7 of the soft-input and a priori probability information D10 for the information bits of the soft-input from the interleaver 16, and makes soft-output decoding with the received value D7 and a priori probability information D10. Thus, the soft-output decoding circuit 17 generates extrinsic information D11 for information bits obtained under code-binding conditions, and outputs it as a soft-output to the de-interleaver 18, while outputting it to the adder 19.

The de-interleaver 18 is provided to de-interleave the extrinsic information D11 of the soft-input from the soft-output decoding circuit 17 to restore the bit sequence of the interleaved data D3 interleaved by the interleaver 13 in the encoder 1' to that of the initial input data D1. The de-interleaver 18 outputs the data provided by the de-interleaving as the a priori probability information D8 for the information bits in the soft-output decoding circuit 15.

The adder 19 is provided to add together the a priori probability information D10 for the information bits of the soft-input from the interleaver 16 and extrinsic information D11 for the information bits from the soft-output decoding circuit 17. The adder 19 outputs the thus obtained data D12 as a soft-output to the downstream de-interleaver 20.

The de-interleaver 20 is provided to de-interleave the soft-output data D12 from the adder 19 to restore the bit sequence of the interleaved data D3 interleaved by the interleaver 13 in the encoder 1' to that of the initial input data D1. The de-interleaver 20 outputs the data provided by the de-interleaving as the decoded data D13 to outside.

Since the decoder 3' is provided with the soft-output decoding circuits 15 and 17 corresponding to the convolutional encoders 12 and 14, respectively, provided in the encoder 1', so a code whose decoding complexity is high can be decomposed to elements whose decoding complexity is low to sequentially improve the characteristic under the interaction between the soft-output decoding circuits 15 and 17. Receiving the received value D7, the decoder 3' makes repetitive decoding a predetermined number of times, and outputs the decoded data D13 based on the extrinsic information of the soft-output obtained as the result of the decoding.

Note that an encoder for TTCM-based coding can be implemented by providing, at the last stage of the encoder 1', a modulator for 8-phase shift keying (will be referred to as "8PSK" hereunder) modulation, for example. Also note that a decoder for TTCM-based decoding can be implemented by designing it similarly to the decoder 3' and symbols of common-phase and orthogonal components as received values will be supplied directly to the decoder.

1.2 Encoder and Decoder for the SCCC-Based Coding and Decoding

Next, there will be described the encoder 1" to make SCCC-based coding and the decoder 3" to decode the code from the encoder 1".

Figure 8:
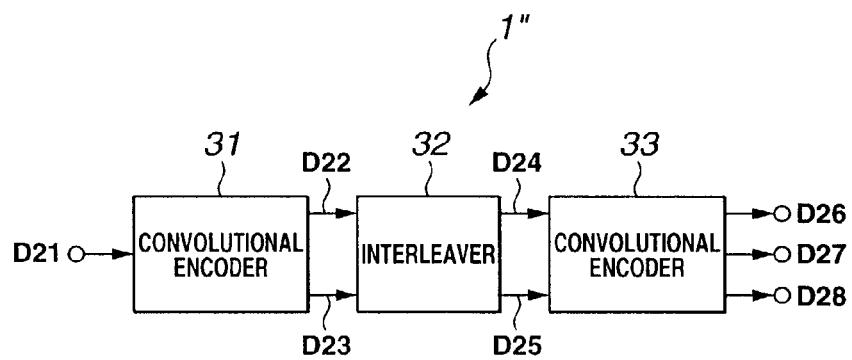
FIG. 8 is a block diagram of an example of the SCCC-based encoder used in the data transmission/reception system.

Some of the encoders 1" include a convolutional encoder 31 to code a code called "outer code", an interleaver 32 to arrange input data in a difference sequence, and a convolutional encoder 33 to encode a code called "inner code", as shown in FIG. 8. The encoder 1" makes serially concatenated convolution at a rate of "⅓" for coding of 1-bit input data D21 to generate 3-bit output data D26, D27 and D28, and outputs them to outside via a BPSK- or QPSK-based modulator (not shown), for example.

Supplied with the 1-bit input data D21, the convolutional encoder 31 makes a convolution of the input data D21, and supplies the result of convolution as 2-bit coded data D22 and D23 to the downstream interleaver 32. More particularly, the convolutional encoder 31 makes convolution at a rate of "½" for coding an outer code, and supplies the thus generated data D22 and D23 to the downstream interleaver 32.

The interleaver 32 is supplied with the coded data D22 and D23 of two bit sequences from the convolutional encoder 31, arranges, in a different sequence, bits forming together the coded data D22 and D23, and supplies interleaved data D24 and D25 of the two generated bit sequences to the downstream convolutional encoder 33.

The convolutional encoder 33 is supplied with the 2-bit interleaved data D24 and D25 from the interleaver 32, makes convolution of these interleaved data D24 and D25, and outputs the result of convolution as 3-bit output data D26, D27 and D28 to outside. More particularly, the convolutional encoder 33 makes convolution at a rate of "⅔" for coding an inner code, and outputs the output data D26, D27 and D28 to outside.

The encoder 1" makes a convolution of "½" in rate for coding an outer code by the convolutional encoder 31 and a convolution of "⅔" in rate for coding an inner code by the convolutional encoder 33, thereby making serially concatenated convolution at a total rate of "(½)×(⅔)=⅓". The data coded by the encoder 1" is subjected to signal point mapping by a modulator (not shown) in a predetermined way of modulation, and outputted to a receiver via the non-storage channel 2.

Figure 9:
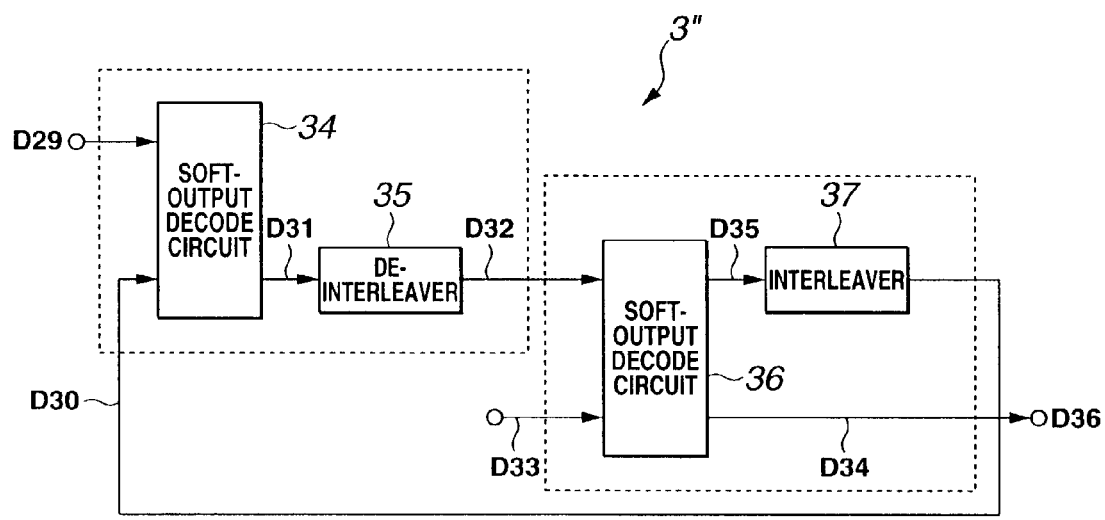
FIG. 9 is a block diagram of an example of the decoder used in the data transmission/reception system to decode a code from the encoder shown in FIG. 8.

On the other hand, some of the decoders 3" to decode data from the encoder 1" include two soft-output decoding circuits 34 and 36, a de-interleaver 35 to restore the sequence of input data to the initial one, and an interleaver 37 to rearrange the input data, as shown in FIG. 9. The decoder 3" estimates input data D21 to the encoder 1" from a received value D29 made as a soft-input under the influence of a noise developed in the non-storage channel 2, and outputs it as decoded data D36.

The soft-output decoding circuit 34 is provided correspondingly to the convolutional encoder 33 in the encoder 1" to make MAP decoding based on the Log-BCJR algorithm. The soft-output decoding circuit 34 is supplied with the soft-input received value D29 as well as with a priori probability information D30 for information bits of the soft-input from the interleaver 37, uses the received value D29 and a priori probability information D30 to make soft-output decoding of an inner code by making the MAP decoding based on the Log-BCJR algorithm. The soft-output decoding circuit 34 generates extrinsic information D31 for information bits determined under code-binding conditions, and outputs the extrinsic information D31 as soft-output to the downstream de-interleaver 35. Note that the extrinsic information D31 corresponds to the interleaved data D24 and D25 from the interleaver 32 in the encoder 1".

The de-interleaver 35 is provided to de-interleave the extrinsic information D31 of the soft-input from the soft-output decoding circuit 34 to restore the bit sequence of the interleaved data D24 and D25 from the interleaver 32 in the encoder 1" to that of the initial input data D22 and 23. The de-interleaver 35 outputs the data provided by the de-interleaving as the a priori probability information D32 for the code bits in the downstream soft-output decoding circuit 36.

The soft-output decoding circuit 36 is provided correspondingly to the convolutional encoder 31 in the encoder 1"

to make MAP decoding based on the Log-BCJR algorithm. The soft-output decoding circuit 36 is supplied with the a priori probability information D32 for code bits of the soft-input from the de-interleaver 35 as well as with the a priori probability information D33 for information bits whose value is "0", and uses these a priori probability information D32 and D33 to make the MAP decoding based on the Log-BCJR algorithm for soft-output decoding of an outer code. The soft-output decoding circuit 36 generates the extrinsic information D34 and D35 determined under the code-binding conditions and outputs the extrinsic information D34 as decoded data D36 to outside and the extrinsic information D35 as soft-output to the interleaver 37.

The interleaver 37 is provided to interleave the extrinsic information D35 for the information bits being the soft-output from the soft-output decoding circuit 36 based on the same replacement position information as in the interleaver 32 in the encoder 1". The interleaver 37 outputs the data provided as the result of interleaving as a priori probability information D30 for information bits in the soft-output decoding circuit 34.

Since the decoder 3" is provided with the soft-output decoding circuits 36 and 34 corresponding to the convolutional encoders 31 and 33, respectively, provided in the encoder 1", so a code whose decoding complexity is high can be decomposed to elements whose decoding complexity is low as in the decoder 3' to sequentially improve the characteristic under the interaction between the soft-output decoding circuits 34 and 36. Receiving the received value D29, the decoder 3" makes the repetitive decoding a predetermined number of times, and outputs the decoded data D36 based on the extrinsic information of the soft-output obtained as the result of decoding.

Note that an encoder for SCTCM-based coding can be implemented by providing a modulator for the 8PSK modulation, for example, at the last stage of the encoder 1". Also note that a decoder for SCTCM-based decoding can be implemented by designing it similarly to the decoder 3" and symbols of common-phase and orthogonal components as received values will be directly supplied to the decoder.

2. Detailed Description of the Element Decoder

In the decoder 3 as the embodiment of the present invention, a plurality of element decoders, each including a module comprised of at least a soft-output decoding circuit and an interleaver or de-interleaver, is concatenated to each other, as shown by a dash-line block in FIG. 7 or 9, to decode any of PCCC, SCCC, TTCM or SCTCM codes. Since the de-interleaver is to rearrange, according to the inverse replacement position information, data into a sequence opposite to that in the interleaver, it may be regarded as a version of the interleaver. Thus, the element decoder may be a one including a soft-output decoding circuit and interleaver. Namely, the interleaver may be used as switched for either the interleaving or de-interleaving function. In the following, the interleaver will be described as a one having also the de-interleaving function wherever no differentiation between the interleaver and de-interleaver is required.

The element decoders provided in the decoder 3 will be described in detail below. Note that a number M of states (transition state) indicating a content of the shift register provided in each element encoder in the encoder 1 will be denoted by m(0, 1, . . . , M-1), respectively, as necessary and the state at a time t will be denoted by $S_t$. On the assumption that information of k bits is inputted in one time slot, input at the time t is denoted by $i_t=(i_{t1}, i_{t2}, \ldots, i_{tk})$ and input system is by $I_1^T=(i_1, i_2, \ldots, i_T)$. In case a transition takes place from a state m' to a state m, information bit corresponding to the transition is denoted by $i(m', m)=(i_1(m', m), i_2(m', m), \ldots, i_k(m', m))$. Further, on the assumption that an n-bit code is outputted in one time slot, output at the time t is denoted by $X_t=(x_{t1}, x_{t2}, \ldots, x_{tn})$ and output system is by $X_1^T=(X_1, X_2, \ldots, X_T)$. In case a transition occurs from the state m' to m, code bit corresponding to the transition is denoted by $X(m', m)=(x_1(m', m), x_2(m', m), \ldots, x_n(m', m))$. The non-storage channel 2 is assumed to output $Y_1^T$ when having been supplied with $X_1^T$. On the assumption that n-bit received value is outputted in one time slot, output at the time t is denoted by $y_t=(y_{t1}, y_{t2}, \ldots, y_{tn})$ and $Y_1^T=(y_1, y_2, \ldots, y_T)$.

2.1 General Construction of the Element Decoder

The element decoder as a whole will be described hereinbelow with reference to FIGS. 10 to 12.

Figure 10:
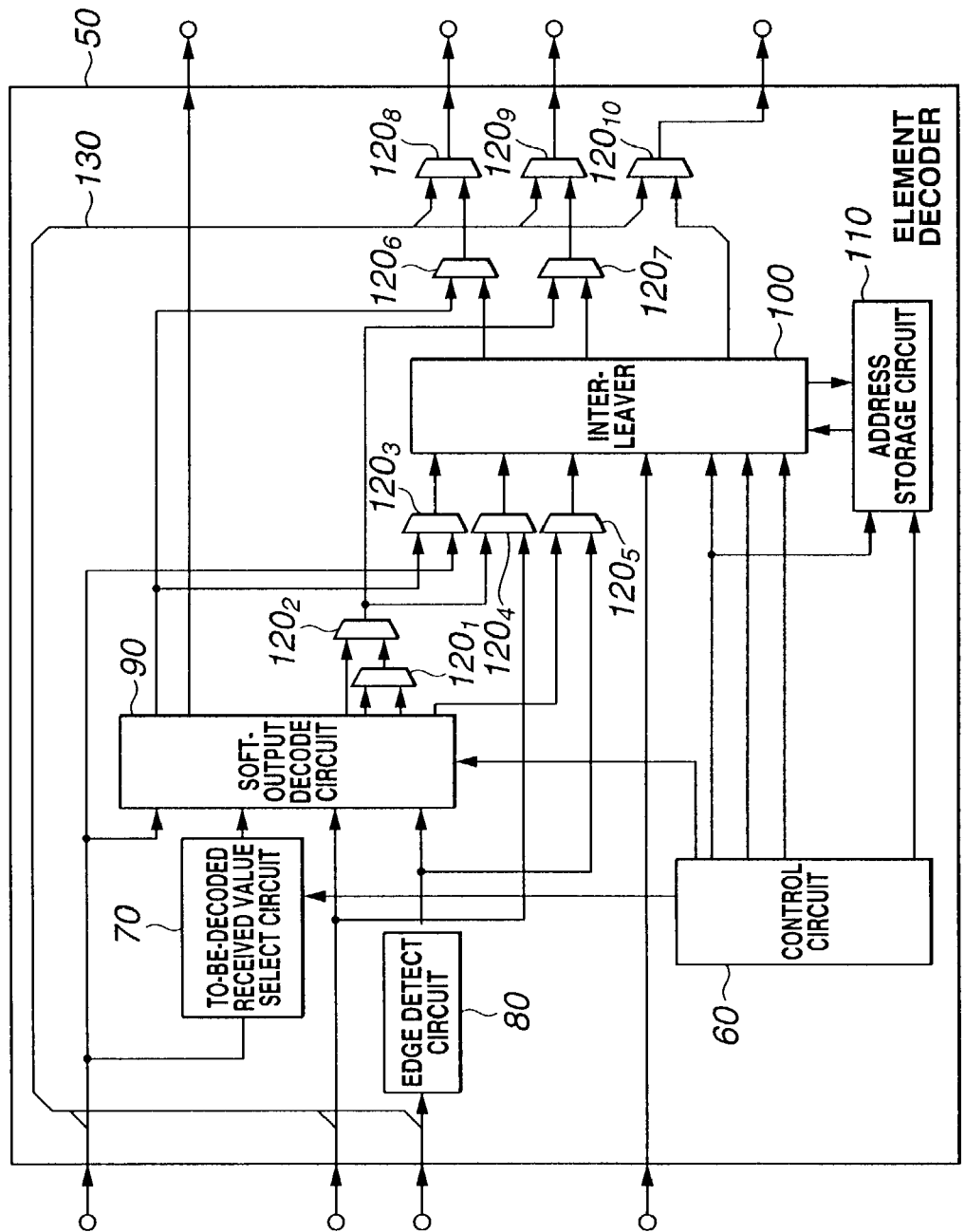
FIG. 10 is a schematic block diagram of an element decoder.

FIG. 10 schematically illustrates an element decoder indicated with a reference 50. It is built in the form of a one-chip, as a large-scale integrated circuit (will be referred to as "LSI" hereunder), having the following elements formed integrally on a single semiconductor substrate. As shown, the element decoder 50 includes a control circuit 60 to control all the other elements, a to-be-decoded received value selection circuit 70 to select a received value to be decoded, an edge detection circuit 80 to detect a frame top, a soft-output decoding circuit 90, an interleaver 100 to alter the sequence of input data, an address storage circuit 110 to hold a replacement-destination address data to which the interleaver 100 makes reference, ten selectors 120$_1$, 120$_2$, 120$_3$, 120$_4$, 120$_5$, 120$_6$, 120$_7$, 120$_8$, 120$_9$ and 120$_{10}$, and a signal line 130 used for system check.

Figure 11:
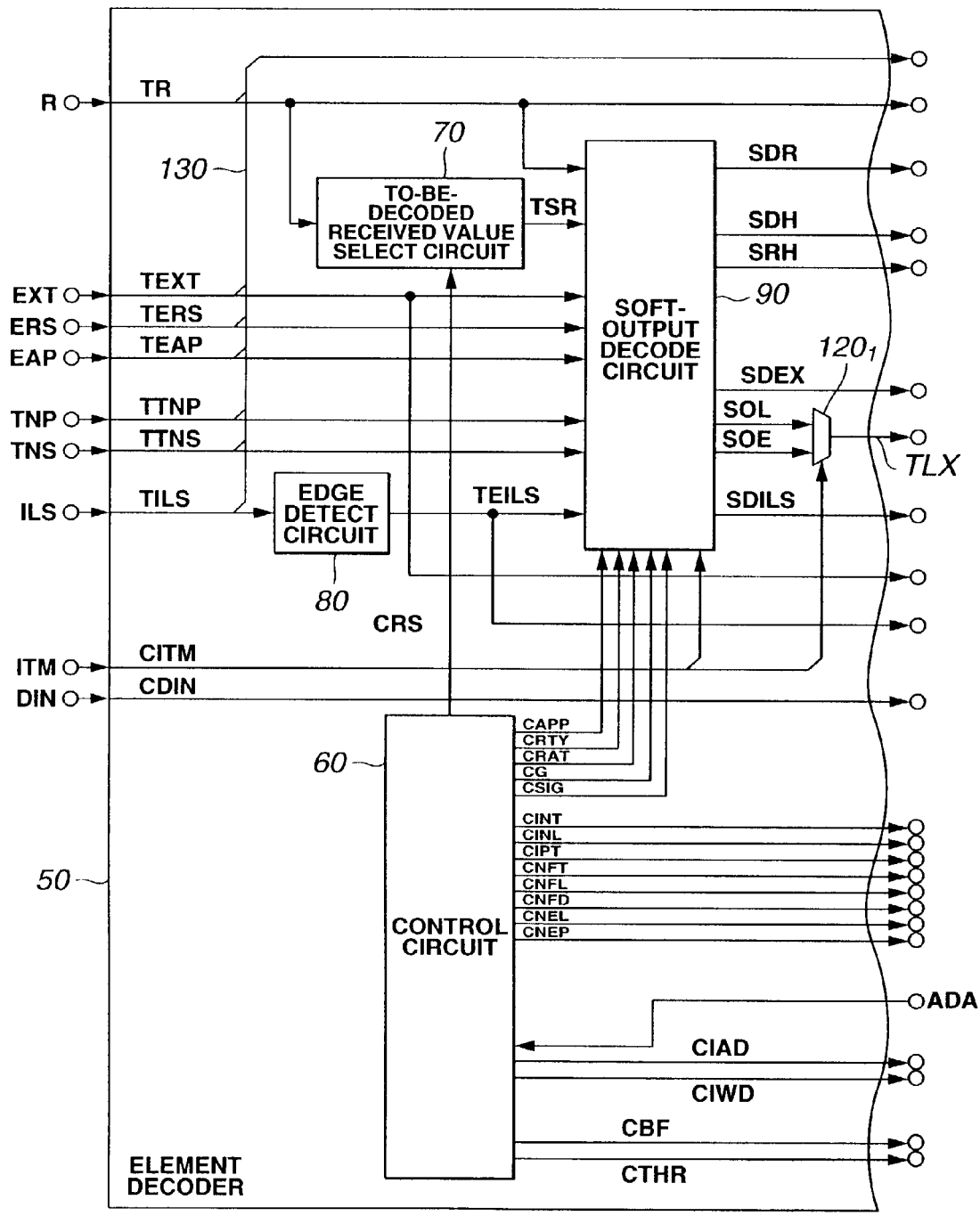
FIG. 11 is a detailed block diagram of a left half of the element decoder.
Figure 12:
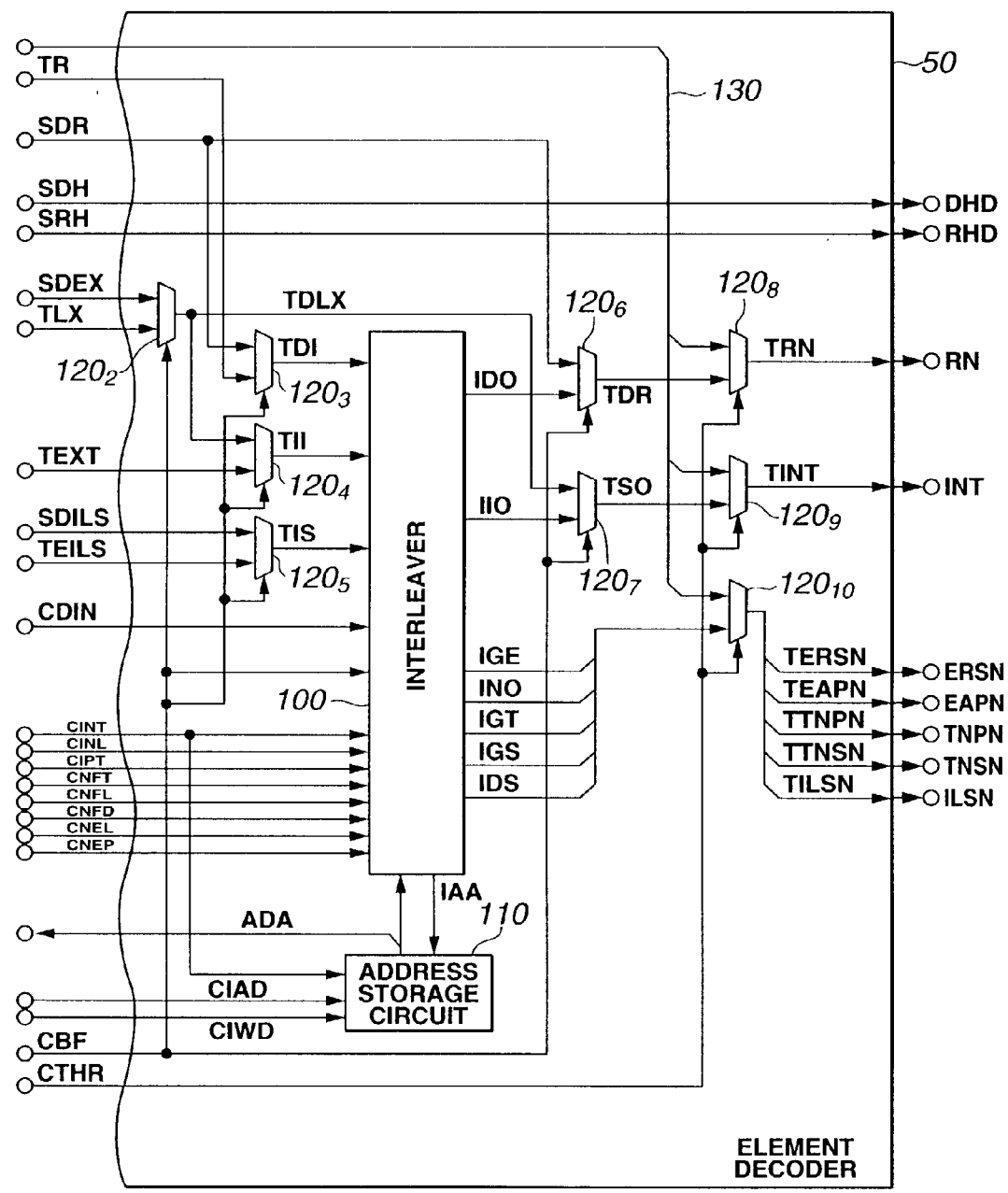
FIG. 12 is a detailed block diagram of a right half of the element decoder.

The left half of the element decoder 50 in FIG. 10 is detailed in FIG. 11, while the right half is detailed in FIG. 12.

The control circuit 60 generates and supplies various kinds of information to each of the to-be-decoded received value selection circuit 70, soft-output decoding circuit 90, interleaver 100, address storage circuit 110 and nine selectors 120$_2$, 120$_3$, 120$_4$, 120$_5$, 120$_6$, 120$_7$, 120$_8$, 120$_9$ and 120$_{10}$, and receives information from the address storage circuit 110 to control the operation of each of the elements.

More particularly, the control circuit 60 generates and supplies, to the to-be-decoded received value selection circuit 70, received value selection information CRS under which a to-be-decoded received value TSR is selected from the received value R (received value TR).

Also, the control circuit 60 generates and supplies, to the soft-output decoding circuit 90, received value format information CRTY indicating the format of the received value R which indicates whether data supplied as the received value R is actually a received value or extrinsic information or an I/Q value in case the encoder 1 is for the TTCM or SCTCM coding; a priori probability information format information CAPP indicating the format of a priori probability information which indicates whether the a priori probability information is supplied bit by bit or symbol by symbol; rate information CRAT indicating the rate of the element encoder in the encoder 1; generator matrix information CG indicating the generator matrix of the element encoder in the encoder 1; and signal point mapping information CSIG in case the encoder 1 is for the TTCM or SCTCM coding.

Also, the control circuit 60 generates and supplies, to the interleaver 100, interleaver type information CINT indicating the type of an interleaving to be done; interleaving length information CINL; interleaver input/output replacement information CIPT about the operation of the interleaver 100 such as input/output replacement information for a mutual replacement in sequence between a plurality of symbols as will be described in detail later; code termination position information CNFT; code termination period information CNFL; code termination state information CNFD; puncture period information CNEL indicating a puncture period in case a code has been punctured; and puncture pattern information CNEP. Also, the control circuit 60 generates and supplies operation mode information CBF indicating an operation mode which will be described in detail later to the interleaver 100.

Also, in case the replacement-destination address data to which the interleaver 100 makes reference is written to the address storage circuit 110, the control circuit 60 supplies the address storage circuit 110 with the interleaver type information CINT, address CIAD indicating the address of the address storage circuit 110, and a write data CIWD being the replacement-destination address data to which the interleaver 100 makes reference.

Also, the control circuit 60 supplies the operation mode information CBF to the six selectors $120_2$, $120_3$, $120_4$, $120_5$, $120_6$ and $120_7$, while supplying three selectors $120_8$, $120_9$ and $120_{10}$ with check mode information CTHR.

On the other hand, the control circuit 60 is supplied with read address data ADA being the replacement-destination address data held in the address storage circuit 110 and to which the interleaver 100 makes reference.

The control circuit 60 supplies the various kinds of information thus generated to the to-be-decoded received value selection circuit 70, soft-output decoding circuit 90, interleaver 100 and $120_2$, $120_3$, $120_4$, $120_5$, $120_6$, $120_7$, $120_8$, $120_9$ and $120_{10}$ to control the operations of these elements, and controls the write of address data to the address storage circuit 110.

The to-be-decoded received value selection circuit 70 is provided to decode an arbitrary code as will be described in detail later. Based on the received value selection information CRS supplied from the control circuit 60, the to-be-decoded received value selection circuit 70 selects a to-be-decoded received value TSR of the input received value TR. It supplies the selected to-be-decoded received value TSR to the soft-output decoding circuit 90.

Figure 13:
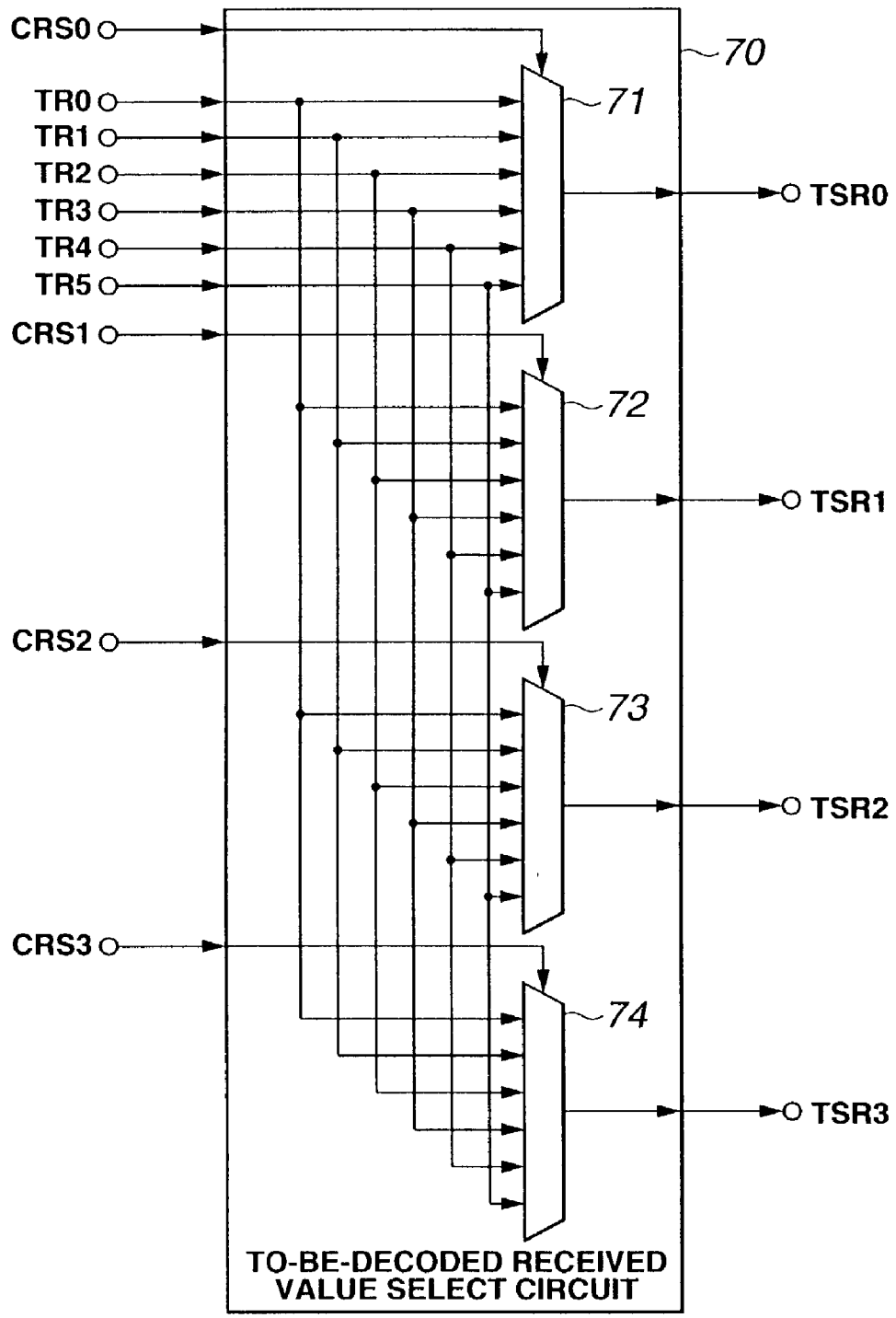
FIG. 13 is a block diagram of a to-be-decoded received value selection circuit included in the element decoder.

More particularly, on the assumption that the received value TR consists of six sequences of received values TR0, TR1, TR2, TR3, TR4 and TR5, for example, and four of the sequences are selected as to-be-decoded received values TSR0, TSR1, TSR2 and TSR3), the to-be-decoded received value selection circuit 70 can be implemented as a one having four selectors 71, 72, 73 and 74 as shown in FIG. 13 for example. At this time, the received value selection information CRS supplied from the control circuit 60 is supplied to each of the selectors 71, 72, 73 and 74, and it is composed of four sequences of received value selection information CRS0, CRS1, CRS2 and CRS3.

That is, the selector 71 selects a predetermined one of the TR0, TR1, TR2, TR3, TR4 and TR5 on the basis of the received value selection information CRS0, and supplies it as a to-be-decoded received value TSR0 to the soft-output decoding circuit 90.

Also, the selector 72 selects a predetermined one of the TR0, TR1, TR2, TR3, TR4 and TR5 on the basis of the received value selection information CRS1, and supplies it as a to-be-decoded received value TSR1 to the soft-output decoding circuit 90.

Also, the selector 73 selects a predetermined one of the TR0, TR1, TR2, TR3, TR4 and TR5 on the basis of the received value selection information CRS2, and supplies it as a to-be-decoded received value TSR2 to the soft-output decoding circuit 90.

Also, the selector 74 selects a predetermined one of the TR0, TR1, TR2, TR3, TR4 and TR5 on the basis of the received value selection information CRS3, and supplies it as a to-be-decoded received value TSR3 to the soft-output decoding circuit 90.

Thus, the to-be-decoded received value selection circuit 70 selects the to-be-decoded received value TSR on the basis of the received value selection information CRS supplied from the control circuit 60, and supplies it to the soft-output decoding circuit 90.

The edge detection circuit 80 is supplied with an external interleave start position signal ILS (interleave start position signal TILS) indicating an interleave start position, namely, a frame top, to detect the top of a frame forming an input received value TR. The edge detection circuit 80 supplies the soft-output decoding circuit 90 and selector $120_5$ with an edge signal TEILS indicating the top of the detected frame.

Figure 14:
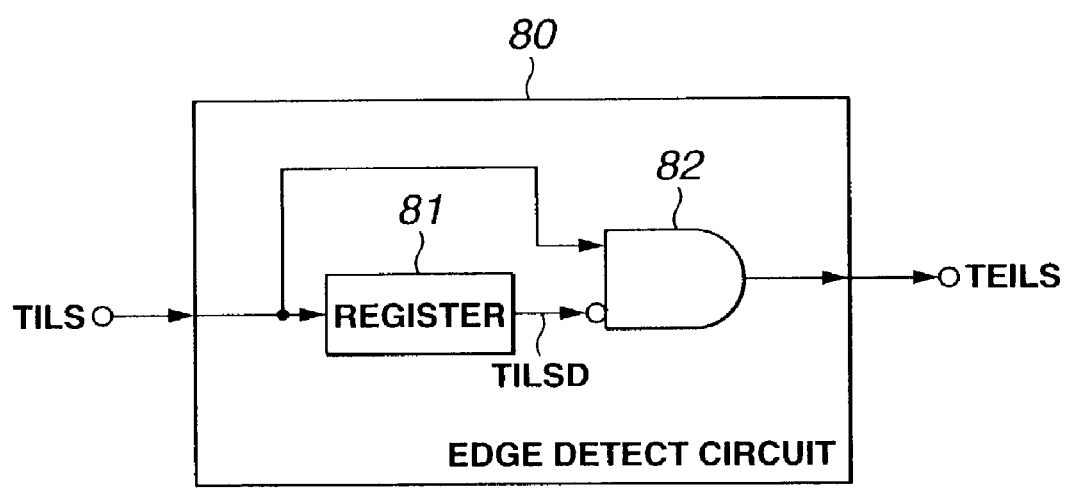
FIG. 14 is a block diagram of an edge detection circuit included in the element decoder.

More specifically, the edge detection circuit 80 can be implemented as a one having a register 81 and AND gate 82 as shown in FIG. 14 for example.

The register 81 holds a 1-bit interleave start position signal TILS for example for one clock only. The register 81 supplies the held interleave start position, that is, a delayed interleave start position signal TILSD to the AND gate 82.

The AND gate 82 carries out the logical AND between the interleave start position signal TILS and a data resulting from inversion of the delayed interleave start position signal TILSD supplied from the register 81 and which is an interleave start position signal TILS one clock before the signal TILSD. The AND gate 82 supplies the thus obtained logical product or AND as an edge signal TEILS to the soft-output decoding circuit 90 and selector $120_5$.

Namely, the edge detection circuit 80 should detect when the interleave start position signal TILS supplied from outside for example is switched from "0" to "1". By AND operation by the AND gate 82, it can detect that the top of a frame forming a received value TR has been entered.

The soft-output decoding circuit 90 uses a to-be-decoded received value TSR supplied from the to-be-decoded received value selection circuit 70 and extrinsic information supplied as a priori probability information from outside or interleaved data EXT (extrinsic information or interleaved data TEXT) to make an MAP decoding based on the Log-BCJR algorithm.

At this time, the soft-output decoding circuit 90 makes a decoding operation with a received value type information CRTY, a priori probability information type information CAPP, rate information CRAT, generator matrix information CG and signal point mapping information CSIG (if necessary) supplied from the control circuit 60, erasure information ERS (erasure information TERS) indicating a puncture pattern and a priori probability information erasure information EAP (a priori probability information erasure information TEAP) supplied from outside, termination time information TNP (termination time information TTNP) indicating a code termination time, and termination state information TNS (termination state information TTNS) indicating a termination state.

The soft-output decoding circuit 90 supplies the selector $120_1$ with a soft-output SOL and extrinsic information SOE, obtained as the result of decoding. At this time, the soft-output decoding circuit 90 selectively outputs information about information symbols or information bits and information about code symbols or code bits on the basis of an output data selection control signal ITM (output data selection control signal CITM) supplied from outside. Also, in case a hard decision has been made, the soft-output decoding circuit 90 outputs, to outside, decoded value hard decision information SDH obtained via hard decision of a soft-output being a decoded value and received value hard decision information SRH obtained via hard decision of a received value. Also in this case, the soft-output decoding circuit 90 selectively outputs information about information symbols or information bits and information about code symbols or code bits on the basis of the output data selection control signal CITM.

Also, the soft-output decoding circuit 90 can delay the received value TR, extrinsic information or interleaved data TEXT, and the edge signal TEILS supplied from the edge detection circuit 80 as will be described in detail later. In this case, the soft-output decoding circuit 90 supplies the delayed received value SDR resulted from delaying of the received value TR to the selectors $120_3$ and $120_6$, delayed extrinsic information SDEX resulted from delaying of the extrinsic information or interleaved data TEXT to the select $120_2$, and delayed edge signal SDILS resulted from delaying of the edge signal TEILS to the selector $120_5$.

Note that the soft-output decoding circuit 90 will be described in detail in Subsection 2.2.

The interleaver 100 interleaves the data TII supplied from the selector $120_4$ on the basis of the same replacement position information as that in the interleaver (not shown) in the encoder 1 or de-interleaves the data TII to restore the bit mapping of the interleaved data from the interleaver in the encoder 1 to that of the initial data. At this time, the interleaver 100 works as an interleaver or de-interleaver according to the interleave mode signal DIN (interleave mode signal CDIN) supplied from outside.

Supplied with the interleave start position signal TIS from the selector $120_5$, the interleaver 100 addresses by supplying address data IAA to the address storage circuit 110 to read an address data held in the address storage circuit 110 as reading address data ADA and make an interleaving or de-interleaving based on the reading address data ADA. At this time, the interleaver 100 uses the interleaver type information CINT, interleaving length information CTNL and interleaver input/output replacement information CIPT supplied from the control circuit 60 to make an interleaving or de-interleaving. The interleaver 100 supplies interleaver output data IIO obtained via the interleaving or de-interleaving to the selector $120_7$.

Also, the interleaver 100 can delay the data TDI about the received value TR or delayed received value SDR supplied from the selector $120_3$ as will be described in detail later. At this time, the interleaver 100 delays the data TDI on the basis of the operation mode information CBF supplied from the control circuit 60. The interleaver 100 supplies the selector $120_6$ with the interleaving length delay information IDO obtained via delaying the data TDI.

Further, in case the decoder is formed from a plurality of element decoders concatenated to each other, the interleaver 100 is supplied with the termination position information CNFT, termination period information CNFL, termination state information CNFD, puncture period information CNEL and puncture pattern information CEP supplied from the control circuit 60 to generate termination time information IGT and termination state information IGS, indicating the termination time and termination state of a code in the next-state element decoder, and erase position information IGE and interleaver no-output position information INO, indicating a punctured position of the code, on the basis of the supplied pieces of information. At the same time, the interleaver 100 delays the interleave start position information TIS supplied from the selector $120_5$ to generate delayed interleave start position signal IDS. The interleaver 100 supplies the selector $120_{10}$ with the thus generated termination time information IGT, termination state information IGS, erase position information IGE, interleaver no-output position information INO and delayed interleave start position signal IDS, as generation information for a next stage, synchronously with the frame top.

Note that the interleaver 100 will be described in detail in Subsection 2.3.

The address storage circuit 110 includes a plurality of banks of RAMs (random-access memory) and selection circuits (not shown) to hold, as address data, data replacement position information to which reference is made during interleaving or de-interleaving by the interleaver 100. The address data held in the address storage circuit 110 is read as a reading address data ADA when the address of the address storage circuit 110 is specified as address data IAA by the interleaver 100. Also, address data write to the address storage circuit 110 is effected by the control circuit 60. An address data is written as write data CIWD when the address of the address storage circuit 110 is specified as write data CIAD by the control circuit 60. In this way, an arbitrary interleaving pattern can be written to the address storage circuit 110. Note that the address storage circuit 110 may be provided in the interleaver 100. That is, the element decoder 50 makes an interleaving or de-interleaving by means of both the interleaver 100 and address storage circuit 110.

The selector $120_1$ selects, on the basis of the output data selection control signal CITM, any one of the soft-output SOL and extrinsic information SOE supplied from the soft-output decoding circuit 90, and supplies it as data TLX to the selector $120_2$. That is, the selector $120_1$ is provided to judge whether the soft-output decoding circuit 90 should output extrinsic information in the process of repetitive decoding or a soft-output as a final result.

The selector $120_2$ selects, on the basis of the operation mode information CBF, any one of the delayed extrinsic information SDEX supplied from the soft-output decoding circuit 90 and the data TLX supplied from the selector $120_1$, and supplies it as data TDLX to the selectors $120_4$ and $120_7$.

The operation modes of the element decoder 50 will be described herebelow. The element decoder 50 is designed to operate in six modes for example. In the first mode of operation of the element decoder 50, the soft-output decoding circuit 90 and interleaver 100 makes a normal soft-output decoding and interleaving, respectively. In the second mode, only the soft-output deciding circuit 90 makes the normal soft-output decoding. In the third mode, only the interleaves 100 makes the normal interleaving. In the fourth mode, the soft-output decoder 90 and interleaver 100 function as delay circuits, respectively, without making any normal soft-output decoding and interleaving. In the fifth mode, only the soft-output decoder 90 functions as a delay circuit without making any normal soft-output decoding. In the sixth mode, only the interleaver 100 functions as a delay circuit without making any normal interleaving. Any of these operation modes is selected by the control circuit 60, and supplied as the operation mode information CBF to each of the soft-output decoder 90 and interleaver 100. In the following, the first to third modes of operation will be referred to as "normal mode", while the fourth to sixth modes will be referred to as "delay mode", as necessary.

More specifically, when the operation mode information CBF indicates a delay mode for a delay for the same time as a time taken for operation by the soft-output decoding circuit 90, by the interleaver 100 or by the soft-output decoding circuit 90 and interleaves 100, the selector $120_2$ selects and outputs delayed extrinsic information SDEX. On the other hand, when the operation mode information CBF indicates a normal mode in which the soft-output decoding circuit 90 and/or interleaver 100 should operate without any delay due to the time of operation of the soft-output decoding circuit 90 and/or interleaver 100, the selector 120₂ selects and outputs data TLX. That is, the selector 120₂ is provided to judge whether the operation mode of the element decoder 50 is the delay or normal one. It selects output date correspondingly to each selected one of the modes of operation.

The selector 120₃ selects, on the basis of the operation mode information CBF, any one of the received value TR and delayed received value SDR supplied from the soft-output decoding circuit 90, and supplies it as data TDI to the interleaver 100. More particularly, when the operation mode information CBF indicates the normal mode in which only the interleaver 100 operates or the delay mode for a delay for the same time taken by the interleaver 100 for its operation, the selector 120₃ selects and outputs the received value TR. On the other hand, when the operation mode information CBF indicates any normal or delay mode other than the above, the selector 120₃ selects and outputs the delayed received value SDR. Namely, the selector 120₃ is provided to judge whether input data to the interleaver 100 is a one subjected to the soft-output decoding by the soft-output decoding circuit 90 or delayed the same time as taken by the soft-output decoding circuit 90 for its soft-output decoding operation. It selects output data correspondingly to each selected one of the modes of operation.

The selector 120₄ selects, based on the operation mode information CBF, any one of the extrinsic information or interleaved data TEXT and the data TDLX supplied from the selector 120₂, and supplies it as data TII to the interleaver 100. More particularly, when the operation mode information CBF is a one indicating a normal mode in which only the interleaver 100 operates or a delay mode for a delay for the same time as taken by the interleaver 100 for its interleaving operation, the selector 120₄ selects and outputs the extrinsic information or interleaved data TEXT. On the other hand, when the operation mode information CBF indicates any normal or delay mode other than the above, the selector 120₄ selects and outputs data TDLX. That is, the selector 120₄ is provided to judge whether input data to the interleaver 100 is a one subjected to the soft-output decoding by the soft-output decoding circuit 90 or delayed the same time as taken by the soft-output decoding circuit 90 for its soft-output decoding operation. It selects output data correspondingly to each selected one of the modes of operation.

The selector 120₅ selects, based on the operation mode information CBF, either the edge signal TEILS supplied from the edge detection circuit 80 or delayed edge signal SDILS supplied from the soft-output decoding circuit 90, and supplies it as interleave start position signal TIS to the interleaver 100. More specifically, when the operation mode information CBF indicates a normal mode in which the interleaver 100 operates or a delay mode for a delay for the same time taken by the soft-output decoding circuit 90 for its interleaving operation, the selector 120₅ selects and outputs the edge signal TEILS. On the other hand, when the operation mode information CBF indicates any normal or delay mode other than the above, the selector 120₅ selects and outputs the delay edge signal SDILS. Namely, the selector 120₅ is provided to judge whether input data to the interleaver 100 is a one subjected to the soft-output decoding by the soft-output decoding circuit 90 or delayed the same time taken for the soft-output decoding by the soft-output decoding circuit 90. It selects output data correspondingly to each selected one of the modes of operation.

The selector 120₆ selects, on the basis of the operation mode information CBF, any one of the delayed received value SDR supplied from the soft-output decoding circuit 90 and interleaving length delayed received value IDO supplied from the interleaver 100, and supplies it as delayed received value TDR to the selector 120₈. More particularly, when the operation mode information CBF indicates a normal mode in which only the soft-output decoding circuit 90 operates or a delay mode for a delay for the same time taken by the soft-output decoding circuit 90 for its operation, the selector 120₆ selects and outputs the delayed received value SDR. On the other hand, when the operation mode information CBF indicates any normal or delay mode other than the above, the selector 120₆ selects and outputs the interleaving length delayed received value IDO. That is, the selector 120₆ is provided to judge whether output data is a one subjected to the interleaving by the interleaver 100 or delayed the same time as taken by the interleaves 100 for its interleaving operation. It selects output data correspondingly to each selected one of the operation modes.

The selector 120₇ selects, on the basis of the operation mode information CBF, any one of the interleaver output data IIO supplied from the interleaver 100 and data TDLX supplied from the selector 120₂, and supplies it as soft-output TSO to the selector 120₉. More particularly, when the operation mode information CBF indicates a normal mode in which only the soft-output decoding circuit 90 operates or a delay mode for a delay for the same time as taken ration by the soft-output decoding circuit 90 for its operation, the selector 120₇ selects and outputs the data TDLX. On the other hand, when the operation mode information CBF indicates any normal or delay mode other than the above, the selector 120₇ selects and outputs the interleaver output data 110. That is, the selector 120₇ is provided to judge whether output data is a one subjected to the interleaving by the interleaver 100 or delayed the same time as taken by the interleaves 100 for its interleaving operation. It selects output data correspondingly to each selected one of the operation modes.

The selector 120₈ selects, on the basis of the check mode information CTHR, any one of the delayed received value TDR supplied from the selector 120₆ and through signal transmitted over the signal line 130, and outputs it as delayed received value TRN to outside. Note that the delayed received value TRN is outputted as delayed received value RN. That is, the selector 120₈ is provided to judge whether delayed received value to a next element decoder should be outputted or system check should be done.

The selector 120₉ selects, on the basis of the check mode information CTHR, any one of the soft-output TSO supplied from the selector 120₇ and through signal transmitted over the signal line 130, and outputs it as soft-output TINT to outside. Note that the soft-output TINT is outputted as soft-output INT. That is, the selector 120₉ is provided to judge whether soft-output to a next element decoder should be outputted or system check should be done.

The selector 120₁₀ selects, on the basis of the check mode information CTHR, either next generation stage information including the termination time information IGT and termination state information IGS supplied from the interleaver 100, erasure position information IGE and interleaver no-output position information INO, and delayed interleave start position information IDS supplied from the interleaver 100, or the through signal transmitted over the signal line 130, and outputs it as next termination time information TTNPN, next termination state information TTNSN, next erasure time information TERSN and next a priori probability information erasure information TEAPN, and next interleave start position signal TILSN to outside. Note that the next termination time information TTNPN, next termination state information TTNSN, next erasure time information TERSN and next a priori probability information erasure information TEAPN, and next interleave start position signal TILSN are outputted as next termination time information TNPN, next termination state information TNSN, next erasure position information ERSN and next a priori probability information erasure information EAPN, and next interleave start position signal ILSN, respectively. Namely, the selector $120_{10}$ is provided to judge whether next-stage information to the next element decoder should be outputted or system check should be done.

As will be described in detail later, the signal line 130 is used primarily for making system check in case a decoder 3 similar to the aforementioned decoders 3' and 3'' is formed by concatenating a plurality of element decoders 50. The signal line 130 is formed by tying together signal lines for transmission of the received value TR, extrinsic information or interleaved data TEXT, erasure information TERS, a priori probability information erasure information TEAP, termination time information TTNP, termination state information TTNS and interleave start position signal TILS, respectively, to supply these signals to the selectors $120_8$, $120_9$ and $120_{10}$.

The element decoder 50 is equivalent to a module including at least a soft-output decoding circuit and interleaver or de-interleaver as shown by a dash-line block in FIG. 7 or 9 for example. A plurality of such element decoders 50 is concatenated to each other to form the decoder 3 capable of decoding an arbitrary one of the PCCC, SCCC, TTCM and SCTCM codes. Note that various features of the element decoder 50 will further be described in Section 4.

The soft-output decoding circuit 90 and interleaver 100 will be described in detail herebelow.

2.2 Detailed Description of the Soft-Output Decoding Circuit

First, the description will start with the soft-output decoding circuit 90. As schematically illustrated in FIG. 15, the soft-output decoder 90 includes a code information generation circuit 151 to generate code information on the element encoders in the encoder 1, an inner erasure information generation circuit 152 to generate inner erasure information indicative a puncture pattern in the encoder 1, a termination information generation circuit 153 to generate termination information in the encoder 1, a received value and a priori probability information selection circuit 154 to select received data and a priori probability information to be entered for decoding and substitute a symbol whose likelihood is "0" for a position where no coded output exists, a received data and delaying-use data storage circuit 155 to store both a received data and delayed data, an Iγ computation circuit 156 to compute a log likelihood Iγ being a first log likelihood, an Iγ distribution circuit 157 to distribute the log likelihood Iγ computed correspondingly to the encoder 1, an Iα computation circuit 158 to compute a log likelihood Iβ being a second log likelihood, an Iβ computation circuit 159 to compute a log likelihood Iβ being a third log likelihood, an Iβ storage circuit 160 to store the computed a log likelihood Iβ, a soft-output computation circuit 161 to compute a log soft-output Iλ, a received value or a priori probability information separation circuit 162 to separate a received value and a priori probability information from each other, an extrinsic information computation circuit 163, an amplitude adjusting/clipping circuit 164 to adjust the amplitude of the log soft-output Iλ and clip it to a predetermined dynamic range, and a hard decision circuit 165 to make a hard decision of a soft-output and received value to be decoded.

Figure 15:
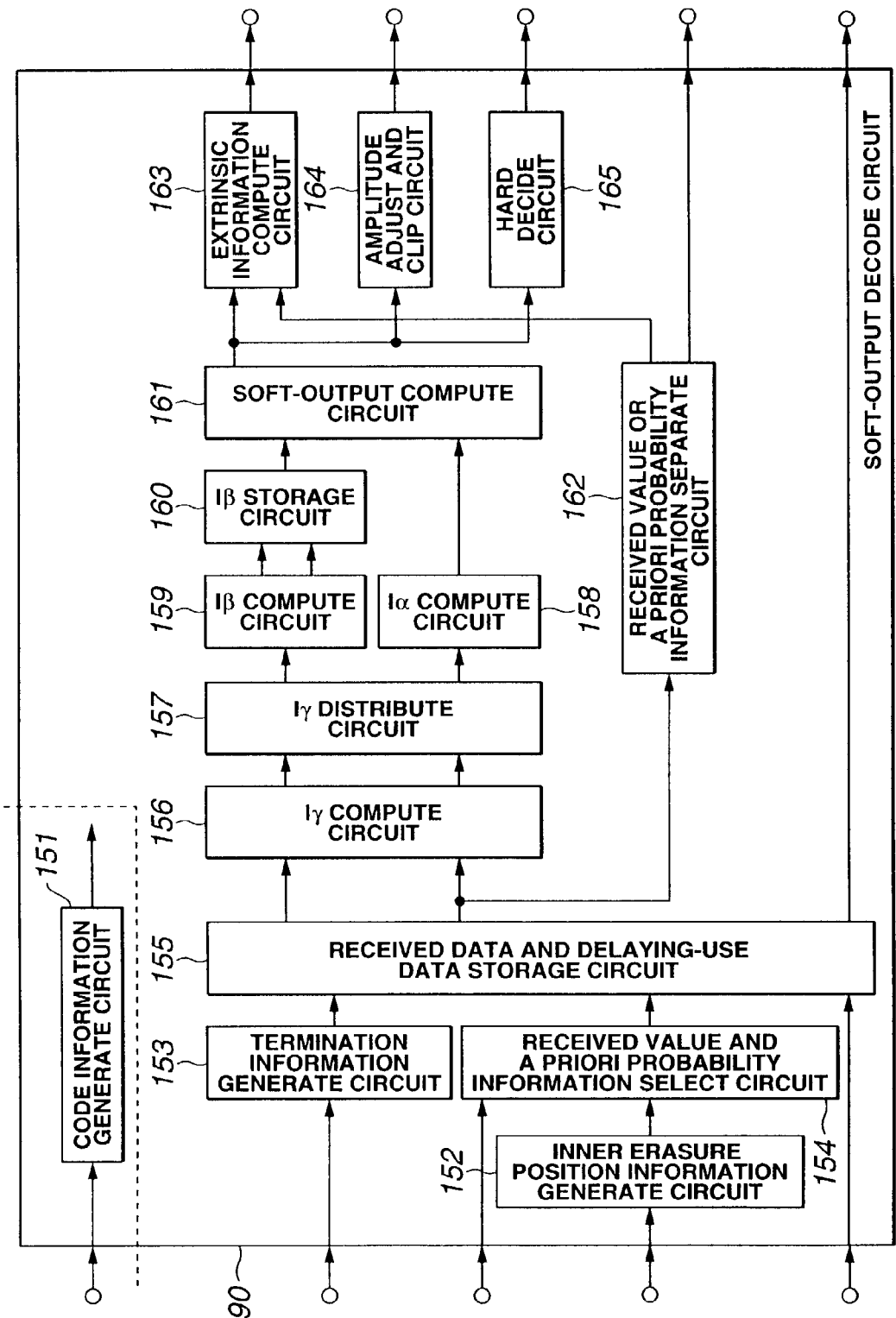
FIG. 15 is a schematic block diagram of a soft-output decoding circuit included in the element decoder.
Figure 16:
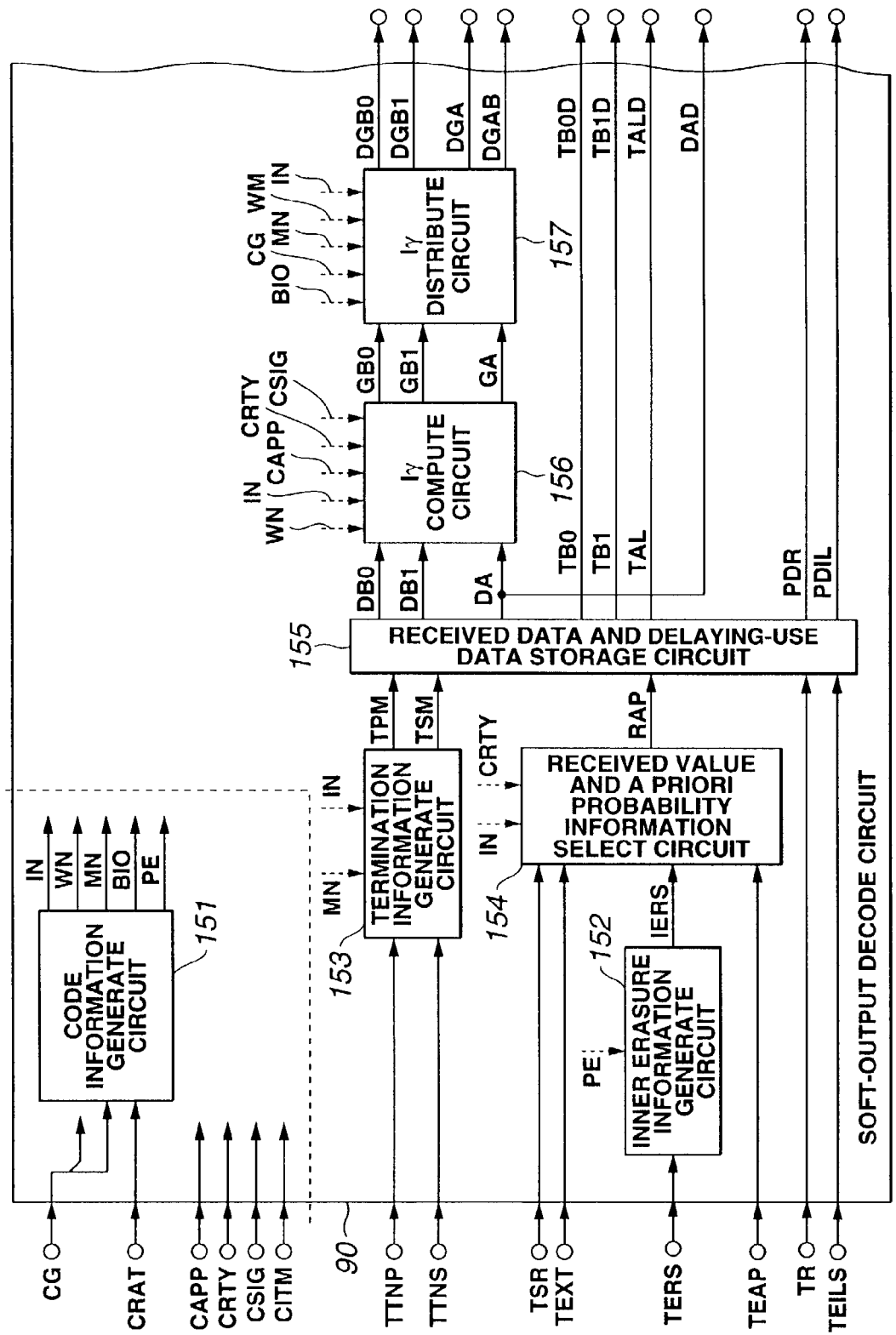
FIG. 16 is a detailed block diagram of a left half of the soft-output decoding circuit.
Figure 17:
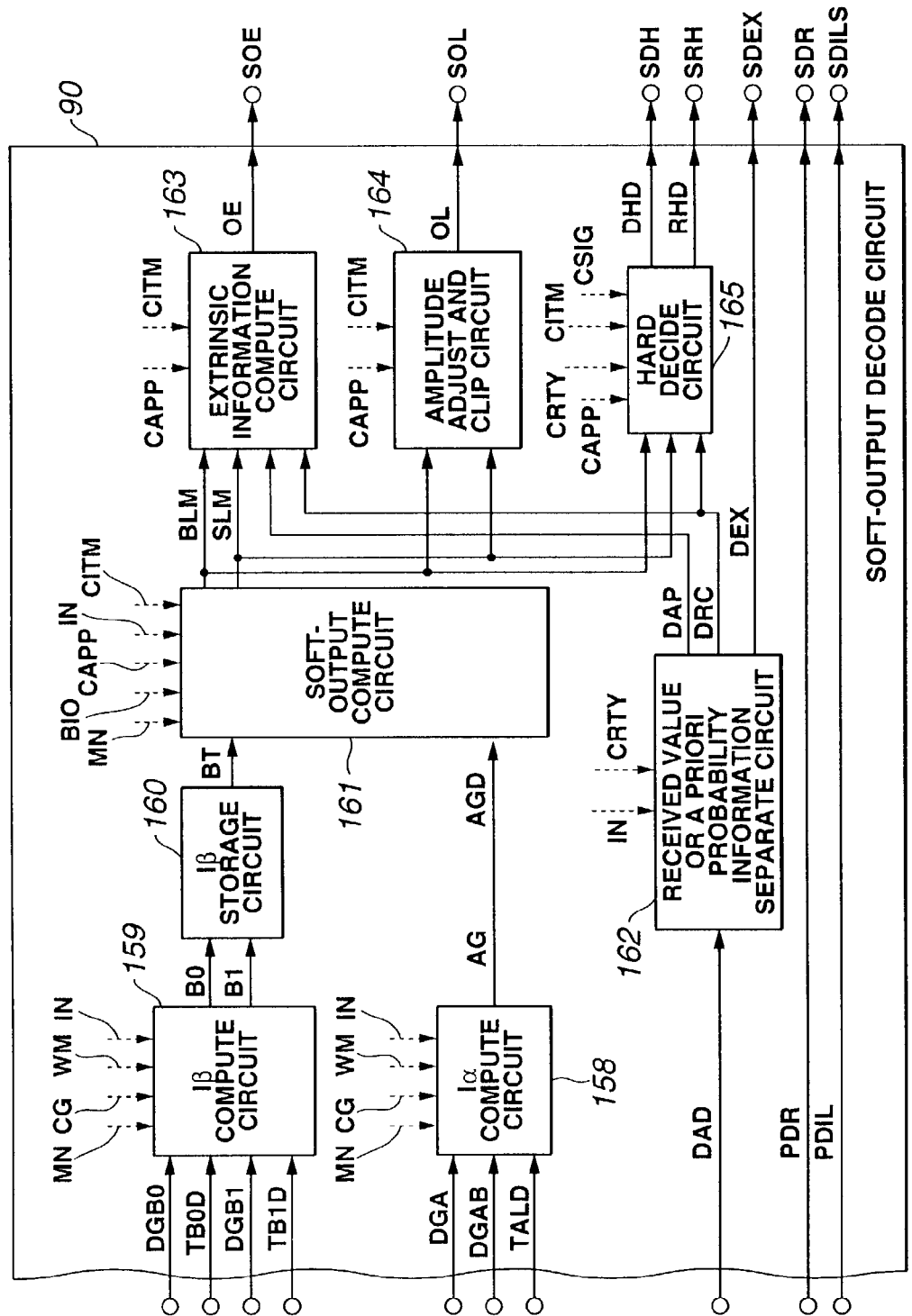
FIG. 17 is a detailed block diagram of a right half of the soft-output decoding circuit.

The left half of the soft-output decoding circuit 90 shown in FIG. 15 is shown in detail in FIG. 16, while the right half is shown in detail in FIG. 17.

The code information generation circuit 151 generates, based on the rate information CRAT and generator matrix information CG supplied from the control circuit 60, code information on the element encoder in the encoder 1. More particularly, the code information generation circuit 151 generates number-of-input-bits information IN indicating the number of input bits to the element encoder in the encoder 1, type information WM indicating of which type of the convolutional encoder is, Wozencraft or Massey, when the element encoder in the encoder 1 is the convolutional encoder, number-of-memories information MN indicating the number of shift registers in the element encoder in the encoder 1, that is, memories representing a state (transition state), branch input/output information BIO indicating input/output information extending along the time base of each of the branches in a trellis being a diagram of the state transition of the element encoder in the encoder 1, and valid output position information PE indicating the output position validity showing that there exists an output from the element encoder in the encoder 1 and there exists a received value corresponding to the output.

The convolutional encoders of the Wozencraft and Massey's will be described herebelow.

Figure 18:
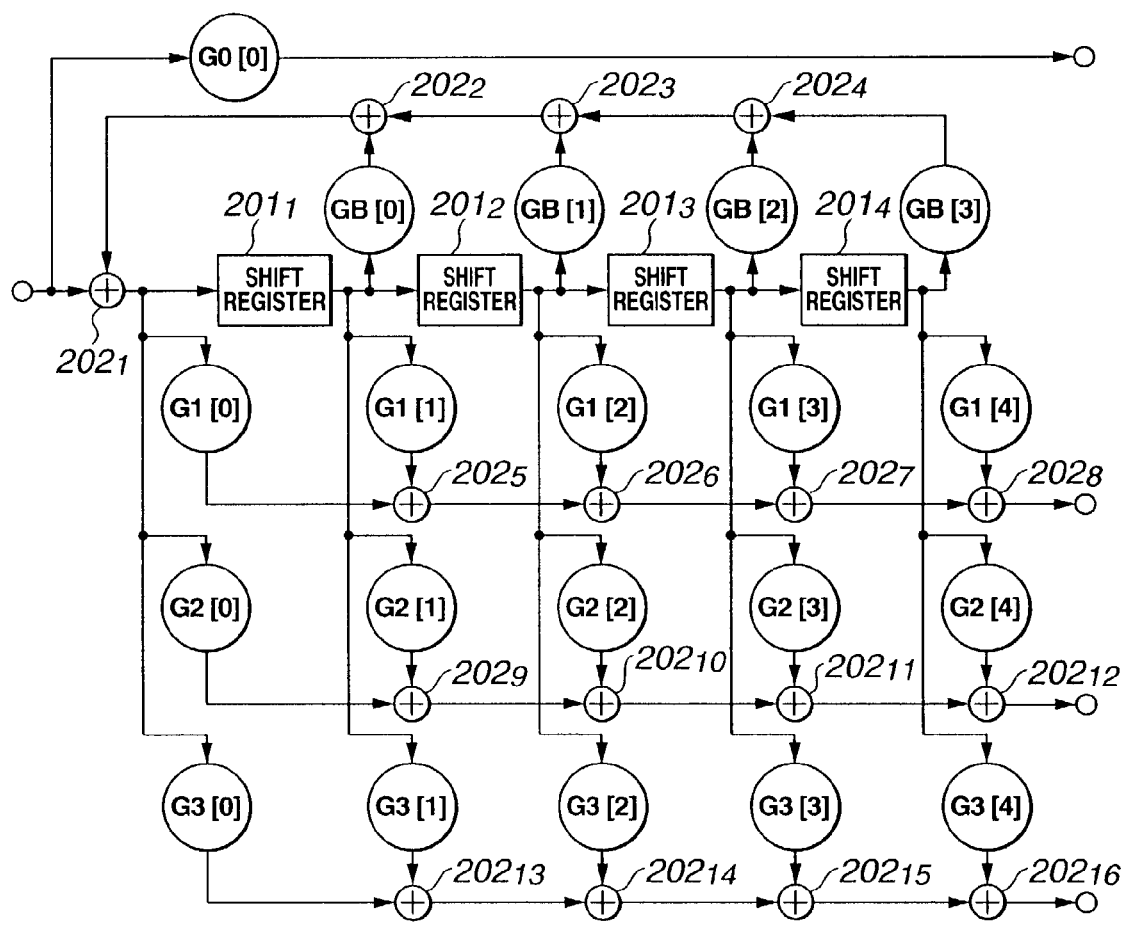
FIG. 18 is a block diagram of an example of the Wozencraft's convolutional encoder.

First, the Wozencraft's convolutional encoder consists of delay elements and a combinatorial circuit to hold data in time sequence in relation to the delay elements. An example of the Wozencraft's convolutional encoder is shown in FIG. 18 for example. As shown, the Wozencraft's convolutional encoder includes four shift registers $201_1$, $201_2$, $201_3$ and $201_4$, and a combinatorial circuit including sixteen exclusive OR circuits $202_1$, $202_2$, $202_3$, $202_4$, $202_5$, $202_6$, $202_7$, $202_8$, $202_9$, $202_{10}$, $202_{11}$, $202_{12}$, $202_{13}$, $202_{14}$, $202_{15}$ and $202_{16}$ and twenty AND gates G0[0], GB[0], GB[1], GB[2], GB[3], G1[]0, G1[1], G1[2], G1[3], G1[4], G2[0], G2[1], G2[2], G2[3], G2[4], G3[0], G3[1], G3[2], G3[3] and G3[4]. This example of Wozencraft's convolutional encoder makes a convolutional operation of "¼" in rate. Note that in this convolutional encoder, the AND gates G0[0], GB[0], GB[1], GB[2], GB[3], G1[0], G1[1], G1[2], G1[3], G1[4], G2[0], G2[1], G2[2], G2[3], G2[4], G3[0], G3[1], G3[2], G3[3] and G3[4] are used as selectively connected to each other according to the configuration of a code, and all of them are not used. That is, in the convolutional encoder, the combinatorial circuit varies depending upon these AND gates G0[0], GB[0], GB[1], GB[2], GB[3], G1[0], G1[1], G1[2], G1[3], G1[4], G2[0], G2[1], G2[2], G2[3], G2[4], G3[0], G3[1], G3[2], G3[3] and G3[4], and the configuration of the code varies correspondingly. Thus, the convolutional encoder can make a Wozencraft's convolution with a maximum number of states being "$2^4=16$". The generator matrix G of the convolutional encoder is given by the following expression (27). The terms GB(D), G1(D), G2(D) and G3(D) in the expression (27) are given by the expressions (28) to (31), respectively.

$$G = \left[ G0 \, G1(D) \, G2(D) \frac{G3(D)}{GB(D)GB(D)GB(D)} \right] \quad (27)$$

$$GB(D)=1+GB[0]D+GB[1]D^2+GB[2]D^3+GB[3]D^4 \quad (28)$$

$$G1(D)=G1[0]+G1[1]D+G1[2]D^2+G1[3]D^3+G1[4]D^4 \quad (29)$$

$$G2(D)=G2[0]+G2[1]D+G2[2]D^2+G2[3]D^3+G2[4]D^4 \quad (30)$$

$$G3(D)=G3[0]+G3[1]D+G3[2]D^2+G3[3]D^3+G3[4]D^4 \quad (31)$$

Figure 19:
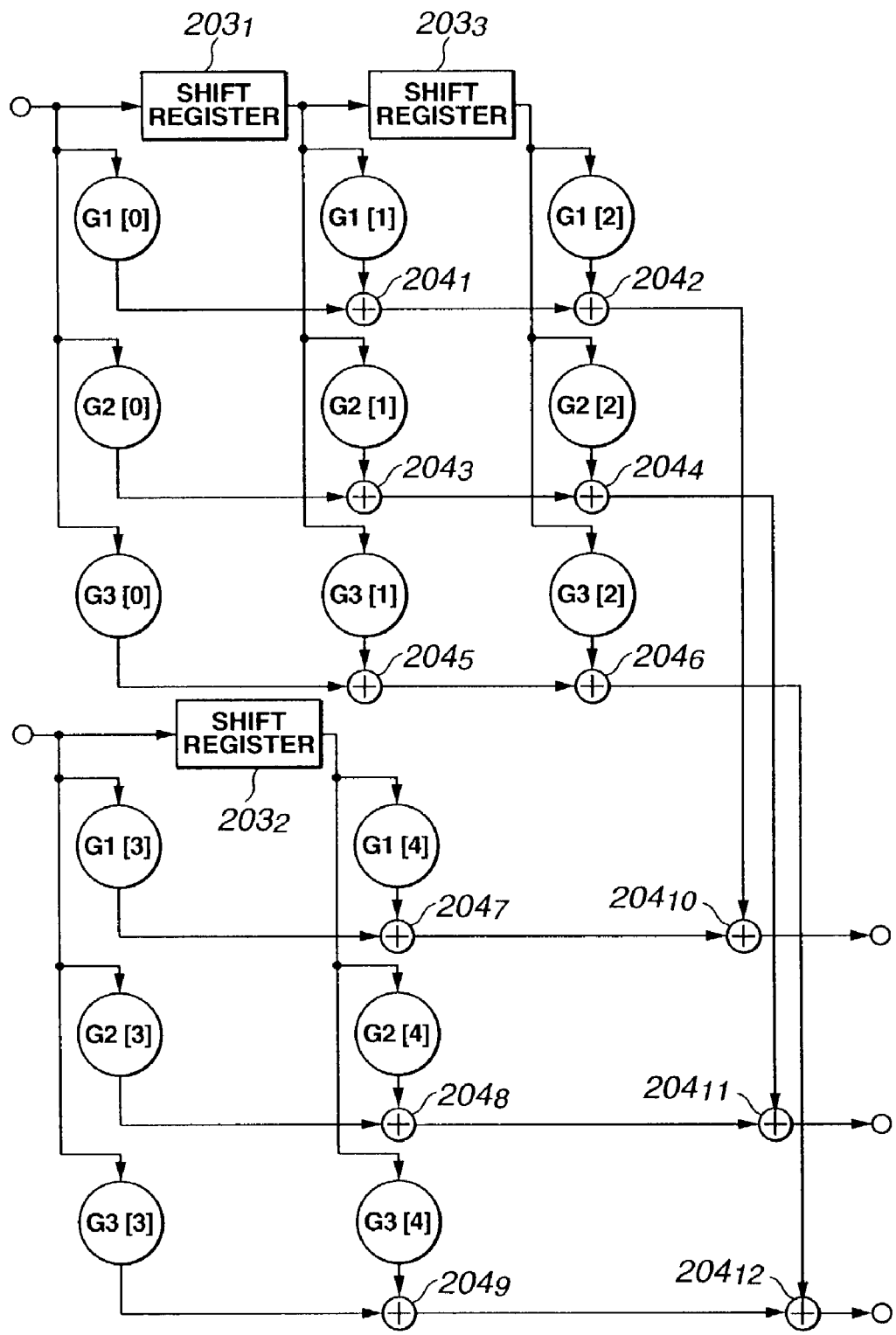
FIG. 19 is a block diagram of another example of the Wozencraft's convolutional encoder.

Another example of the Wozencraft's convolutional encoder is shown in FIG. 19 for example. As shown, it includes three shift registers $203_1$, $203_2$ and $203_3$ and a combinatorial circuit including twelve exclusive OR circuits $204_1$, $204_2$, $204_3$, $204_4$, $204_5$, $204_6$, $204_7$, $204_8$, $204_9$, $204_{10}$, $204_{11}$, and $204_{12}$ and fifteen AND gates G1[0], G1[1], G1[2], G1[3] G1[4], G2[0], G2[1], G2[2], G2[3], G2[4], G3[0], G3[1], G3[2], G3[3] and G3[4]. This example of Wozencraft's convolutional encoder makes a convolutional operation at a rate of "⅔". Note that also in this convolutional encoder, the AND gates G1[0], G1[1], G1[2], G1[3] G1[4], G2[0], G2[1], G2[2], G2[3], G2[4], G3[0], G3[1], G3[2], G3[3] and G3[4] are use d as selectively connected to each other according to the configuration of a code, and all of them are not used. That is, in the convolutional encoder, the combinatorial circuit varies depending upon these AND gates, and the configuration of the code varies correspondingly. Thus, the convolutional encoder can make a Wozencraft's convolution with a maximum number of states being "$2^3=8$". The generator matrix G of the convolutional encoder is given by the following expression (32). The terms G11(D), G21(D), G31(D), G12(D), G22(D) and G32(D) in the expression (32) are given by the expressions (33) to (38), respectively.

$$G = \begin{bmatrix} G11(D)G21(D)G31(D) \\ G12(D)G22(D)G32(D) \end{bmatrix} \quad (32)$$

$$G11(d)=G1[0]+G1[1]D+G1[2]D^2 \quad (33)$$

$$G21(d)=G2[0]+G2[1]D+G2[2]D^2 \quad (34)$$

$$G31(d)=G3[0]+G3[1]D+G3[2]D^2 \quad (35)$$

$$G12(d)=G1[3]+G1[4]D \quad (36)$$

$$G22(d)=G2[3]+G2[4]D \quad (37)$$

$$G32(d)=G3[3]+G3[4]D \quad (38)$$

Figure 20:
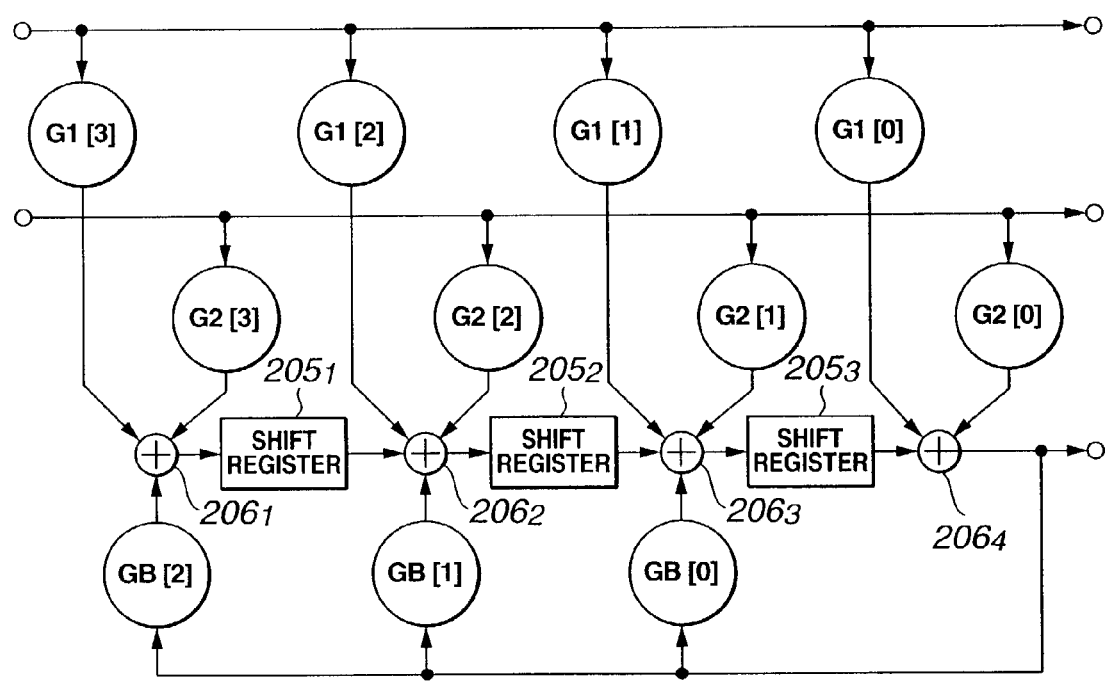
FIG. 20 is a block diagram of an example of the Massey's convolutional encoder.

On the other hand, the Massey's convolutional encoder includes delay elements and a combinatorial circuit to output any of input bits as it is as a component and not to hold data in time sequence in relation to the delay elements. An example of the Massey's convolutional encoder is shown in FIG. 20 for example. As shown, it includes three shift registers $205_1$, $205_2$ and $205_3$, four exclusive OR circuits $206_1$, $206_2$, $206_3$ and $206_4$, and eleven AND gates GB[0], GB[1], GB[2], G1[0], G1[1], G1[2], G1[3], G2[0], G2[1], G2[2] and G2[3]. This example of Massey's convolutional encoder makes a convolutional operation of "⅔" in rate. Note that also in this convolutional encoder, the AND gates GB[0], GB[1], GB[2], G1[0], G1[1], G1[2], G1[3], G2[0], G2[1], G2[2] and G2[3] are used as selectively connected to each other according to the configuration of a code, and all of them are not used. That is, in the convolutional encoder, the combinatorial circuit varies depending upon these AND gates GB[0], GB[1], GB[2], G1[0], G1[1], G1[2], G1[3], G2[0], G2[1], G2[2] and G2[3], and the configuration of the code varies correspondingly. Thus, the convolutional encoder can make a Massey's convolution with a maximum number of states being "$2^3=8$". The generator matrix G of the convolutional encoder is given by the following expression (39). The terms GB(D), G1(D) and G2(D) in the expression (39) are given by the expressions (40) to (42), respectively.

$$G = \begin{bmatrix} 1 & 0 & \frac{G1(D)}{GB(D)} \\ 0 & 1 & \frac{G2(D)}{GB(D)} \end{bmatrix} \quad (39)$$

$$GB(D)=1+GB[0]D+GB[1]D^2+GB[2]D^3 \quad (40)$$

$$G1(D)=G1[0]+G1[1]D+G1[2]D^2+G1[3]D^3 \quad (41)$$

$$G2(D)=G2[0]+G2[1]D+G2[2]D^2+G2[3]D^3 \quad (42)$$

Figure 21:
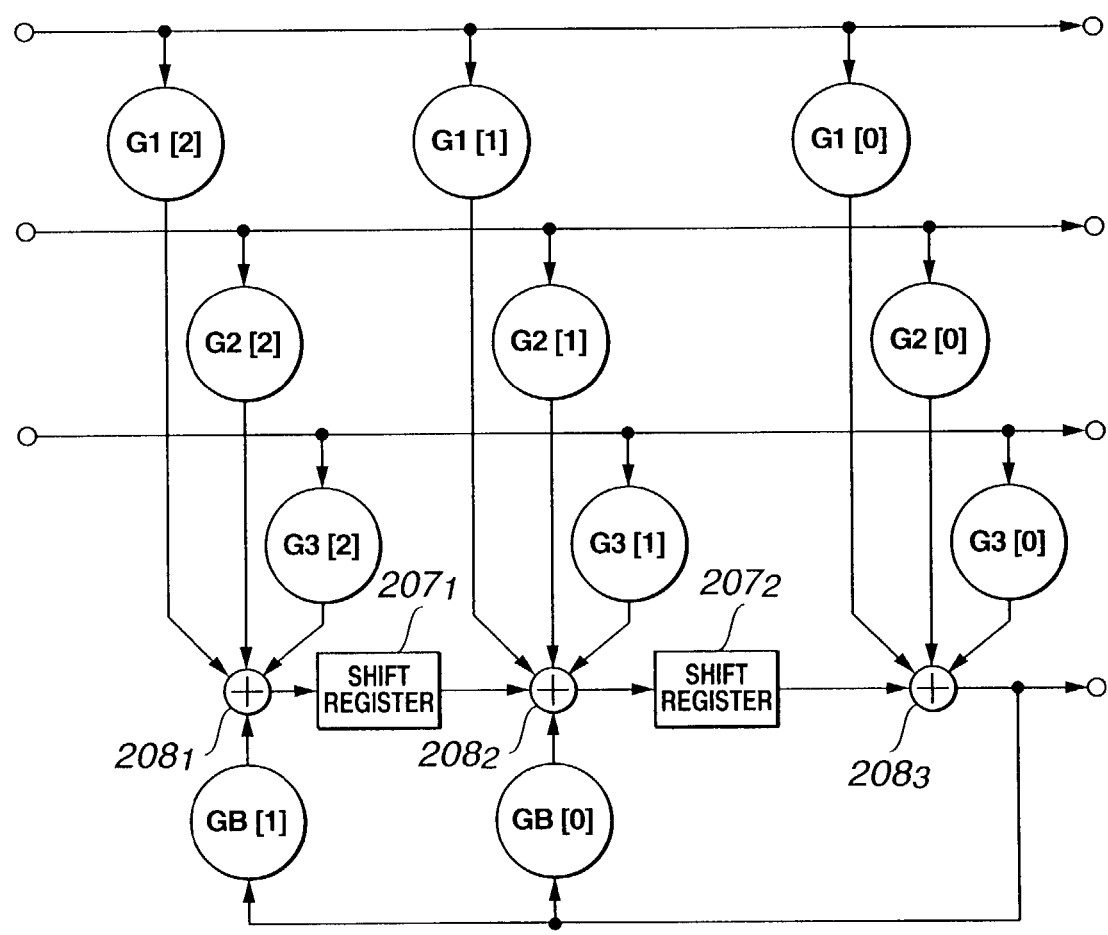
FIG. 21 is a block diagram of another example of the Massey's convolutional encoder.

An example of the Massey's convolutional encoder is shown in FIG. 21 for example. As shown, it includes two shift registers $207_1$ and $207_2$, three exclusive OR circuits $208_1$, $208_2$ and $208_3$, and eleven AND gates GB[0], GB[1], G1[0], G1[1], G1[2], G2[0], G2[1], G2[2], G3[0], G3[1] and G3[2]. This example of Massey's convolutional encoder makes a convolutional operation of "⅔" in rate. Note that also in this convolutional encoder, the AND gates GB[0], GB[1], G1[0], G1[1], G1[2], G2[0], G2[1], G2[2], G3[0], G3[1] and G3[2] are used as selectively connected to each other according to the configuration of a code, and all of them are not used. That is, in the convolutional encoder, the combinatorial circuit varies depending upon these AND gates GB[0], GB[1], G1[0], G1[1], G1[2], G2[0], G2[1], G2[2], G3[0], G3[1] and G3[2], and the configuration of the code varies correspondingly. Thus, the convolutional encoder can make a Massey's convolution with a maximum number of states being "$2^2=4$". The generator matrix G of the convolutional encoder is given by the following expression (43). The terms GB(D), G1(D), G2(D) and G3(D) in the expression (43) are given by the expressions (44) to (47), respectively.

$$G = \begin{bmatrix} 1 & 0 & \frac{G1(D)}{GB(D)} \\ 0 & 1 & \frac{G2(D)}{GB(D)} \\ 0 & 0 & \frac{G3(D)}{GB(D)} \end{bmatrix} \quad (43)$$

$$GB(D)=1+GB[0]D+GB[1]D^2 \quad (44)$$

$$G1(D)=G1[0]+G1[1]D+G1[2]D^2 \quad (45)$$

$$G2(D)=G2[0]+G2[1]D+G2[2]D^2 \quad (46)$$

$$G3(D)=G3[0]+G3[1]D+G3[2]D^2 \quad (47)$$

The information generated by the code information generation circuit 151 will be described in further detail herebelow concerning possible examples of the convolutional encoders of the above types.

First as the Wozencraft's convolutional encoder shown in FIG. 18, there is provided a one including four shift registers $201_1$, $201_2$, $201_3$ and $201_4$ and eleven exclusive OR circuits $202_1$, $202_4$, $202_5$, $202_7$, $202_8$, $202_{10}$, $202_{12}$, $202_{13}$, $202_{14}$, $202_{15}$ and $202_{16}$ by connecting fifteen AND gates G0[0], GB[2], GB[3], G1[0], G1[1], G1[3], G1[4], G2[0], G2[2], G2[4], G3[0], G3[1], G3[2], G3[3] and G3[4]. Supplied with 1-bit input data $i_0$, the convolutional encoder makes a convolution of the input data $i_0$ and outputs the result of convolution as an output data of 4 bits $O_1$, $O_1$, $O_2$ and $O_3$.

Figure 23:
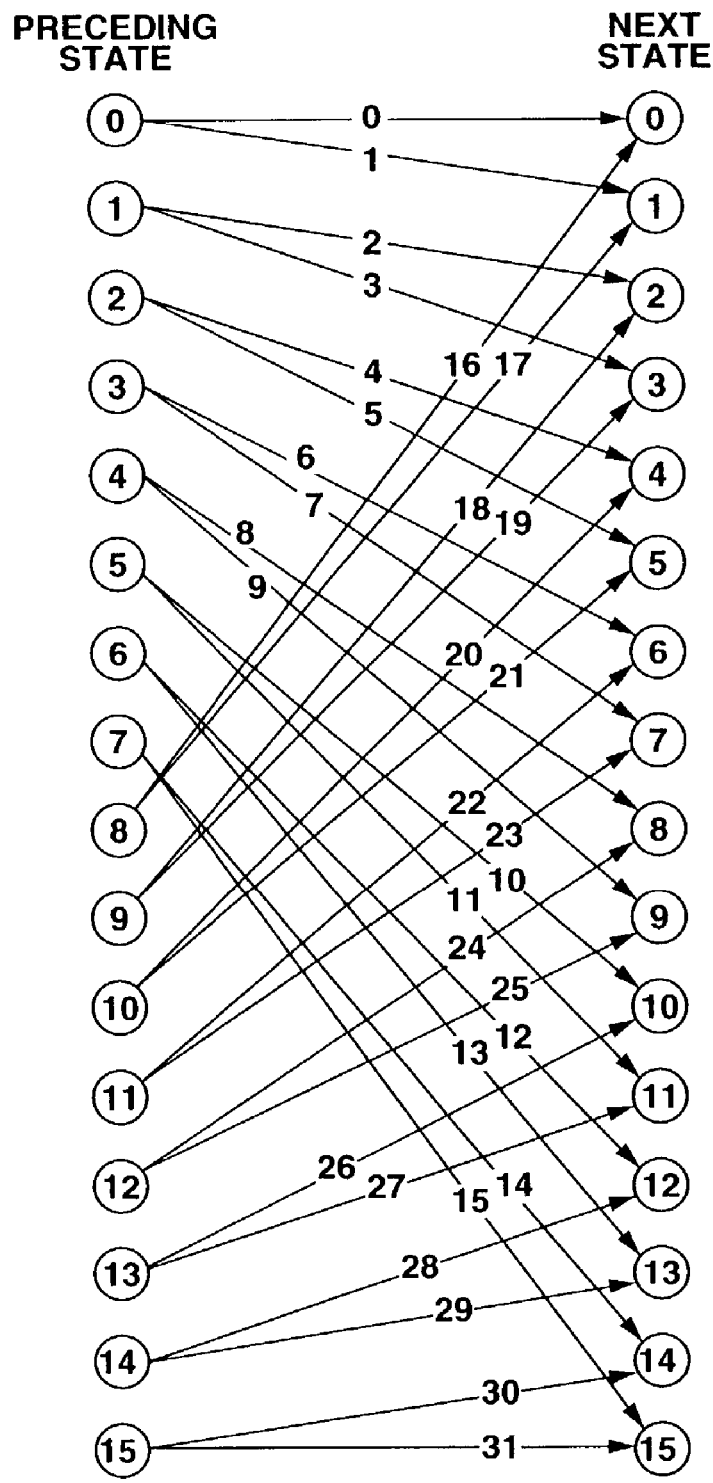
FIG. 23 explains the trellis in the convolutional encoder shown in FIG. 22.

The trellis of this convolutional encoder is depicted as shown in FIG. 23. As shown, the label on each branch indicates a number for the branch. The relation between states before and after a transition and input data/output data for the branch number is as shown in Table 1. In Table 1, the "states" columns sequentially list the contents of the shift registers $201_4$, $201_3$, $201_2$ and $201_1$, representing state numbers "0000", "0001", "0010", "0011", "0100", "0101", "0110", "0111", "1000", "1001", "1010", "1011", "1100", "1101", "1110" and "1111" by "0", "1", "2", "3", "4", "5", "6", "7", "8", "9", "10", "11", "12", "13", "14", "15", respectively. Also, the "input/output data" are $i_0/O_3$, $O_2$, $O_1$ and $O_0$.

TABLE 1

Various Kinds of Information for Branch Numbers

| Branch No. | Preceding state | Input data/output data | Next state |
|---|---|---|---|
| 0 | 0 | 0/0000 | 0 |
| 1 | 0 | 1/1111 | 1 |
| 2 | 1 | 0/1010 | 2 |
| 3 | 1 | 1/0101 | 3 |
| 4 | 2 | 0/1100 | 4 |
| 5 | 2 | 1/0011 | 5 |
| 6 | 3 | 0/0110 | 6 |
| 7 | 3 | 1/1001 | 7 |
| 8 | 4 | 1/1011 | 8 |
| 9 | 4 | 0/0100 | 9 |
| 10 | 5 | 1/0001 | 10 |
| 11 | 5 | 0/1110 | 11 |
| 12 | 6 | 1/0111 | 12 |
| 13 | 6 | 0/1000 | 13 |
| 14 | 7 | 1/1101 | 14 |
| 15 | 7 | 0/0010 | 15 |
| 16 | 8 | 1/1111 | 0 |
| 17 | 8 | 0/0000 | 1 |
| 18 | 9 | 1/0101 | 2 |
| 19 | 9 | 0/1010 | 3 |
| 20 | 10 | 1/0011 | 4 |
| 21 | 10 | 0/1100 | 5 |
| 22 | 11 | 1/1001 | 6 |
| 23 | 11 | 0/0110 | 7 |
| 24 | 12 | 0/0100 | 8 |
| 25 | 12 | 1/1011 | 9 |
| 26 | 13 | 0/1110 | 10 |
| 27 | 13 | 1/0001 | 11 |
| 28 | 14 | 0/1000 | 12 |
| 29 | 14 | 1/0111 | 13 |
| 30 | 15 | 0/0010 | 14 |
| 31 | 15 | 1/1101 | 15 |

Figure 22:
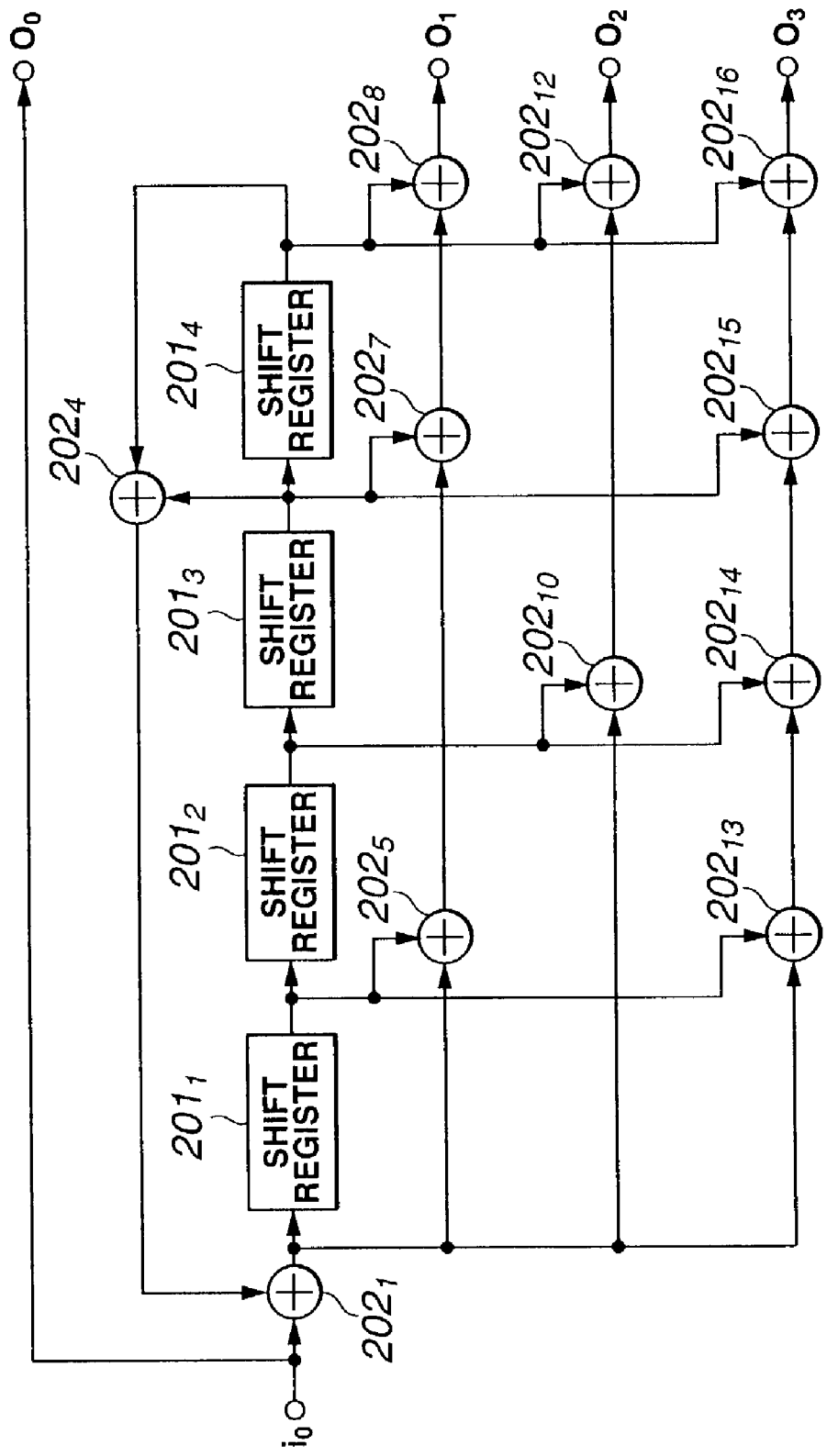
FIG. 22 is a detailed block diagram of the convolutional encoder shown in FIG. 18.

Thus, the states of the convolutional encoder shown in FIG. 22 count 16 in number. The trellis is structured such that two paths run from each state to states at a next time, and thus it has a total of 32 branches.

In this convolutional encoder, the code information generation circuit 151 generates "1 bit" for the number-of-input-bits information IN, "Wozencraft's" for the type information WM, "4" for the number-of-memories information MN, and an input/output pattern of each branch as shown in Table 1 for the branch input/output information BIO.

Also, as the Wozencraft's convolutional encoder shown in FIG. 19, there is provided a one including three shift registers $203_1$, $203_2$ and $203_3$ and six exclusive OR circuits $204_5$, $204_6$, $204_9$, $204_{10}$, $204_{11}$ and $204_{12}$ by connecting nine AND gates G1[2], G1[3], G2[2], G2[4], G3[0], G3[1], G3[2], G3[3] and G3[4]. Supplied with 2bit input data $i_0$ and $i_1$ the convolutional encoder makes convolution of the input data $i_0$ and $i_1$ outputs the result of convolution as a 3-bit output data $O_0$, $O_1$ and $O_2$.

Figure 25:
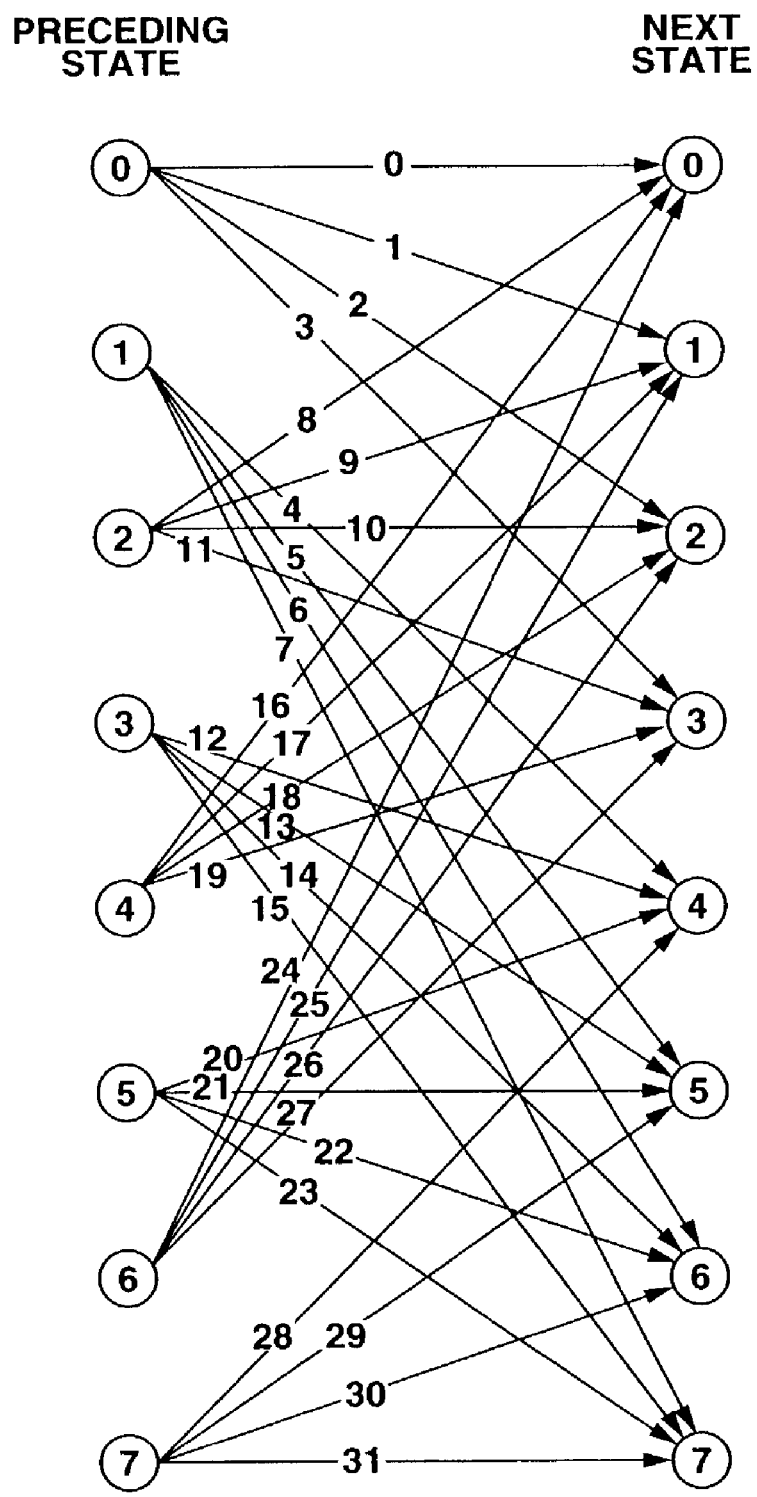
FIG. 25 explains the trellis in the convolutional encoder shown in FIG. 24.

The trellis of this convolutional encoder is depicted as shown in FIG. 25. As shown, the label on each branch indicates a number for the branch. The relation between states before and after a transition and input data/output data for the branch number is as shown in Table 2. In Table 2, the "states" columns sequentially list the contents of the shift registers $203_3$, $203_2$ and $203_1$, representing state numbers "000", "001", "010", "011", "100", "101", "110" and "111" by "0", "1", "2", "3", "4", "5", "6" and "7", respectively. Also, the "input/output data" are $i_1$, $i_0/O_2$, $O_1$ and $O_0$.

TABLE 2

Various Kinds of Information for Branch Numbers

| Branch No. | Preceding state | Input data/output data | Next state |
|---|---|---|---|
| 0 | 0 | 00/000 | 0 |
| 1 | 0 | 01/110 | 1 |
| 2 | 0 | 10/101 | 2 |
| 3 | 0 | 11/011 | 3 |
| 4 | 1 | 00/100 | 4 |
| 5 | 1 | 01/010 | 5 |
| 6 | 1 | 10/001 | 6 |
| 7 | 1 | 11/111 | 7 |
| 8 | 2 | 00/110 | 0 |
| 9 | 2 | 01/000 | 1 |
| 10 | 2 | 10/011 | 2 |
| 11 | 2 | 11/101 | 3 |
| 12 | 3 | 00/010 | 4 |
| 13 | 3 | 01/100 | 5 |
| 14 | 3 | 10/111 | 6 |
| 15 | 3 | 11/001 | 7 |
| 16 | 4 | 00/101 | 0 |
| 17 | 4 | 01/011 | 1 |
| 18 | 4 | 10/000 | 2 |
| 19 | 4 | 11/110 | 3 |
| 20 | 5 | 00/001 | 4 |
| 21 | 5 | 01/111 | 5 |
| 22 | 5 | 10/100 | 6 |
| 23 | 5 | 11/010 | 7 |
| 24 | 6 | 00/011 | 0 |
| 25 | 6 | 01/101 | 1 |
| 26 | 6 | 10/110 | 2 |
| 27 | 6 | 11/000 | 3 |
| 28 | 7 | 00/111 | 4 |
| 29 | 7 | 01/001 | 5 |
| 30 | 7 | 10/010 | 6 |
| 31 | 7 | 11/100 | 7 |

Figure 24:
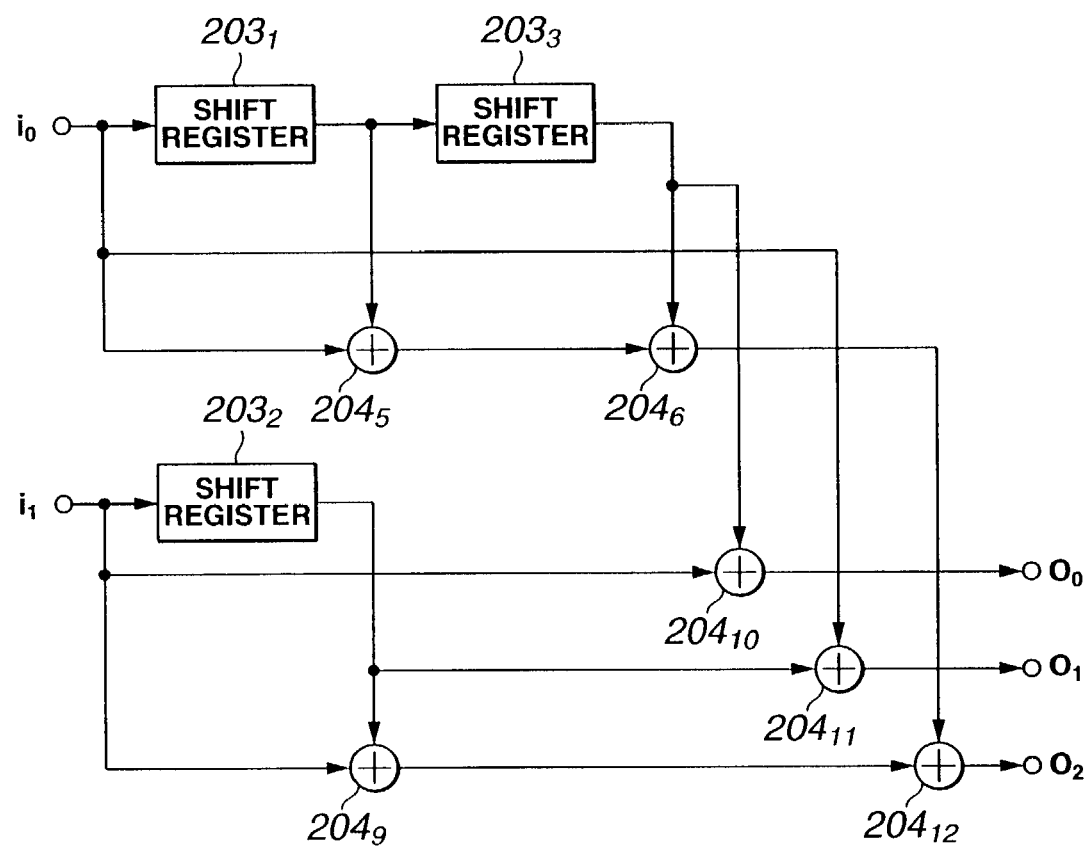
FIG. 24 is a detailed block diagram of the convolutional encoder shown in FIG. 19.

Thus, the states of the convolutional encoder shown in FIG. 24 count 8 in number. The trellis is structured such that four paths run from each state to states at a next time, and thus it has a total of 32 branches.

In this convolutional encoder, the code information generation circuit 151 generates "2 bits" for the number-of-input-bits information IN, "Wozencraft's" for the type information WM, "3" for the number-of-memories information MN, and an input/output pattern of each branch as shown in Table 2 for the branch input/output information BIO.

Figure 26:
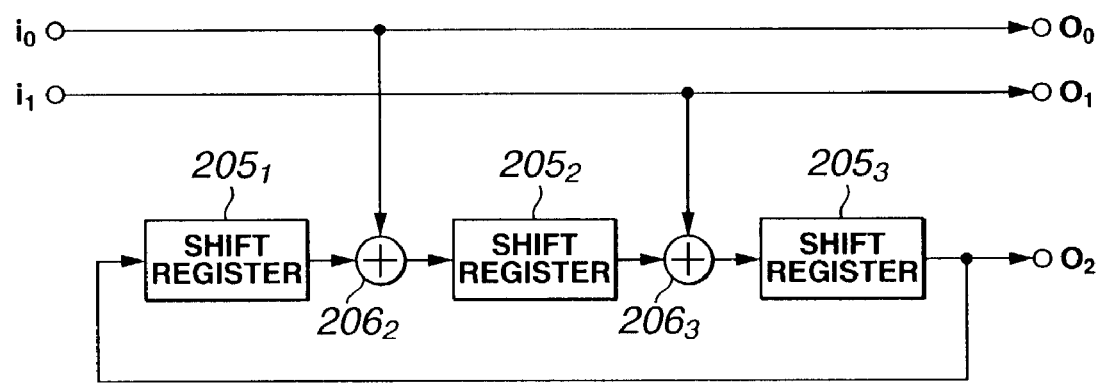
FIG. 26 is a detailed block diagram of the convolutional encoder shown in FIG. 20.

Also, as the Wozencraft's convolutional encoder shown in FIG. 20, there is available a one including three shift registers $205_1$, $205_2$, $205_3$ and two exclusive-OR circuits $206_2$ and $206_3$ as shown in FIG. 26 by connecting three AND gates GB[2], G1[2], G2[1]. Supplied with 2-bit input data $i_0$ and $i_1$, the convolutional encoder makes a convolution of the input data $i_0$ and $i_1$ and outputs the result of convolution as a 3-bit output data $O_0$, $O_1$ and $O_2$.

Figure 27:
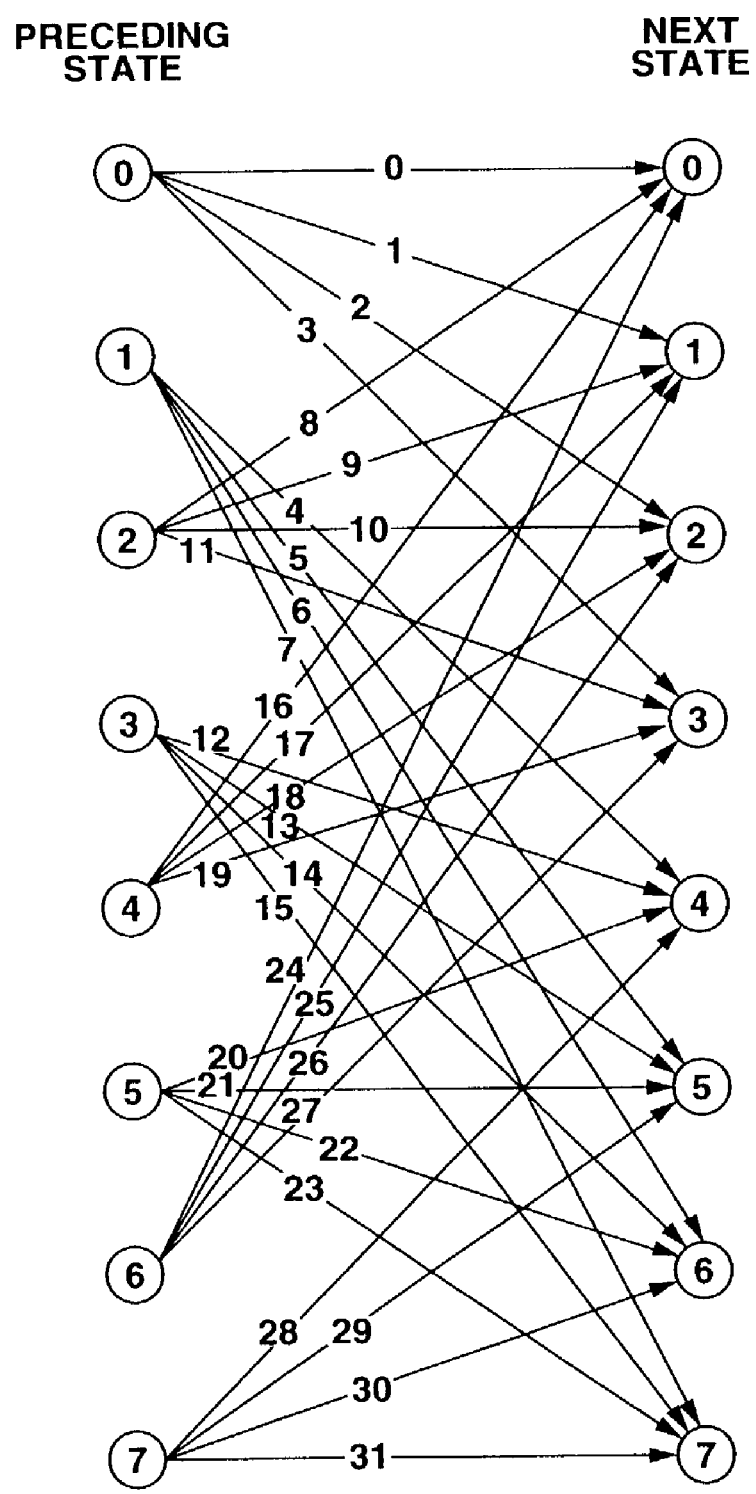
FIG. 27 explains the trellis in the convolutional encoder shown in FIG. 26.

The trellis of this convolutional encoder is depicted as shown in FIG. 27. As shown, the label on each branch indicates a number for the branch. The relation between states before and after a transition and input data/output data for the branch number is as shown in Table 3. In Table 3, the "states" columns sequentially list the contents of the shift registers $205_1$, $205_2$ and $205_3$, representing state numbers "000", "001", "010", "011", "100", "101", "110" and "111" by "0", "1", "2", "3", "4", "5", "6" and "7", respectively. Also, the "input/output data" are $i_1$, $i_0/O_2$, $O_1$ and $O_0$.

TABLE 3

Various Kinds of Information for Branch Numbers

| Branch No. | Preceding state | Input data/output data | Next state |
|---|---|---|---|
| 0 | 0 | 00/000 | 0 |
| 1 | 0 | 10/010 | 1 |
| 2 | 0 | 01/001 | 2 |
| 3 | 0 | 11/011 | 3 |
| 4 | 1 | 00/100 | 4 |
| 5 | 1 | 10/110 | 5 |
| 6 | 1 | 01/101 | 6 |
| 7 | 1 | 11/111 | 7 |
| 8 | 2 | 10/010 | 0 |
| 9 | 2 | 00/000 | 1 |
| 10 | 2 | 11/011 | 2 |
| 11 | 2 | 01/001 | 3 |
| 12 | 3 | 10/110 | 4 |
| 13 | 3 | 00/100 | 5 |
| 14 | 3 | 11/111 | 6 |
| 15 | 3 | 01/101 | 7 |
| 16 | 4 | 01/001 | 0 |
| 17 | 4 | 11/011 | 1 |
| 18 | 4 | 00/000 | 2 |
| 19 | 4 | 10/010 | 3 |
| 20 | 5 | 01/101 | 4 |
| 21 | 5 | 11/111 | 5 |
| 22 | 5 | 00/100 | 6 |
| 23 | 5 | 10/110 | 7 |
| 24 | 6 | 11/011 | 0 |
| 25 | 6 | 01/001 | 1 |
| 26 | 6 | 10/010 | 2 |
| 27 | 6 | 00/000 | 3 |
| 28 | 7 | 11/111 | 4 |
| 29 | 7 | 01/101 | 5 |
| 30 | 7 | 10/110 | 6 |
| 31 | 7 | 00/100 | 7 |

Thus, the states of the convolutional encoder shown in FIG. 26 count 8 in number. The trellis is structured such that four paths run from each state to states at a next time, and thus it has a total of 32 branches.

In this convolutional encoder, the code information generation circuit 151 generates "2 bits" for the number-of-input-bits information IN, "Massey" for the type information WM, "3" for the number-of-memories information MN, and an input/output pattern of each branch as shown in Table 3 for the branch input/output information BIO.

Also, as the Massey's convolutional encoder shown in FIG. 21, there is provided a one including two shift registers $207_1$ and $207_2$, and three exclusive OR circuits $208_1$, $208_2$ and $208_3$ by connecting six AND gates GB[1], G1[0], G1[1], G1[2], G2[0], and G3[0]. Supplied with 3-bit input data $i_0$, $i_1$ and $i_2$ the convolutional encoder makes a convolution of the input data $i_0$, $i_1$ and $i_2$ and outputs the result of convolution as a 3-bit output data $O_0$, $O_1$ and $O_2$.

Figure 29:
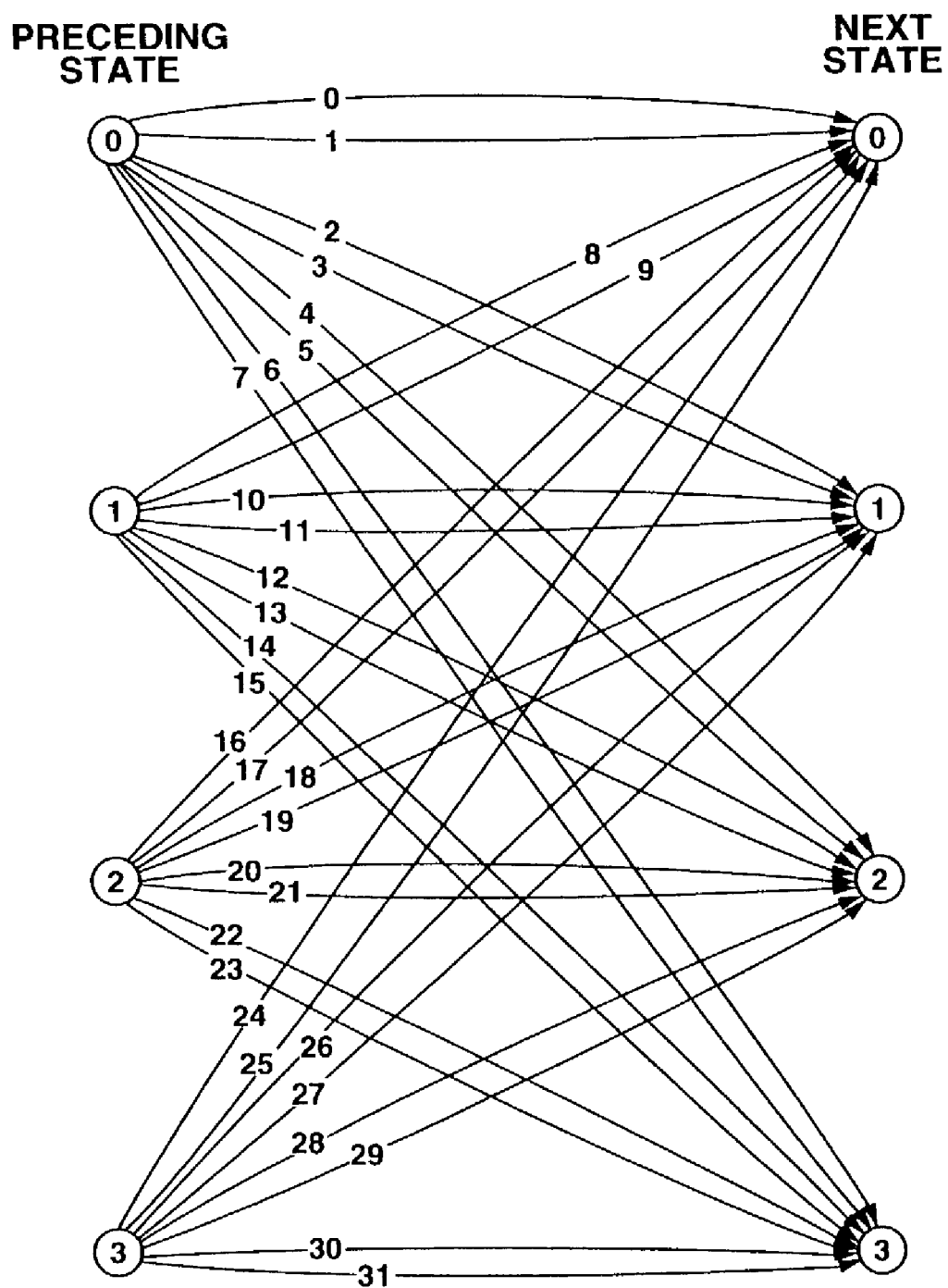
FIG. 29 explains the trellis in the convolutional encoder shown in FIG. 28.

The trellis of this convolutional encoder is depicted as shown in FIG. 29. As shown, the label on each branch indicates a number for the branch. The relation between states before and after a transition and input data/output data for the branch number is as shown in Table 4. In Table 4, the "states" columns sequentially list the contents of the shift registers $207_1$ and $207_2$, representing state numbers "00", "01", "10" and "11" by "0", "1", "2" and "3", respectively. Also, the "input/output data" are $i_2$, $i_1$, $i_0/O_2$, $O_1$ and $O_0$.

TABLE 4

Various Kinds of Information for Branch Numbers

| Branch No. | Preceding state | Input data/output data | Next state |
|---|---|---|---|
| 0 | 0 | 000/000 | 0 |
| 1 | 0 | 110/010 | 0 |
| 2 | 0 | 001/101 | 1 |
| 3 | 0 | 111/111 | 1 |
| 4 | 0 | 010/110 | 2 |
| 5 | 0 | 100/100 | 2 |
| 6 | 0 | 101/001 | 3 |
| 7 | 0 | 011/011 | 3 |
| 8 | 1 | 010/010 | 0 |
| 9 | 1 | 100/000 | 0 |
| 10 | 1 | 101/101 | 1 |
| 11 | 1 | 011/111 | 1 |
| 12 | 1 | 110/110 | 2 |
| 13 | 1 | 000/100 | 2 |
| 14 | 1 | 001/001 | 3 |
| 15 | 1 | 111/011 | 3 |
| 16 | 2 | 001/101 | 0 |
| 17 | 2 | 111/111 | 0 |
| 18 | 2 | 000/000 | 1 |
| 19 | 2 | 110/010 | 1 |
| 20 | 2 | 101/001 | 2 |
| 21 | 2 | 011/011 | 2 |
| 22 | 2 | 010/110 | 3 |
| 23 | 2 | 100/100 | 3 |
| 24 | 3 | 101/101 | 0 |
| 25 | 3 | 011/111 | 0 |
| 26 | 3 | 010/010 | 1 |
| 27 | 3 | 100/000 | 1 |
| 28 | 3 | 111/011 | 2 |
| 29 | 3 | 001/001 | 2 |
| 30 | 3 | 000/100 | 3 |
| 31 | 3 | 110/110 | 3 |

Figure 28:
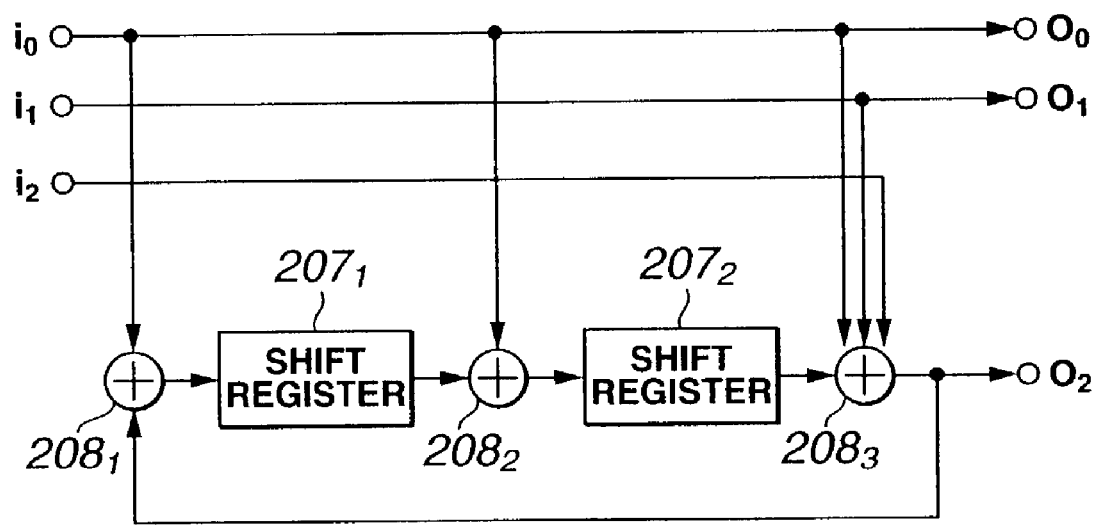
FIG. 28 is a detailed block diagram of the convolutional encoder shown in FIG. 21.

Thus, the states of the convolutional encoder shown in FIG. 28 count 4 in number. The trellis is structured such that four sets of parallel paths run from each state to states at a next time, and thus it has a total of 32 branches.

In this convolutional encoder, the code information generation circuit 151 generates "3 bits" for the number-of-input-bits information IN, "Massey" for the type information WM, "2" for the number-of-memories information MN, and an input/output pattern of each branch as shown in Table 4 for the branch input/output information BIO.

As above, the code information generation circuit 151 generates code information corresponding to the element encoder in the encoder 1. Especially, the code information generation circuit 151 computes input/output patterns for all the branches of the trellis, corresponding to a code to be decoded, to generate branch input/output information BIO which will be described in detail later. The code information generation circuit 151 supplies the generated number-of-input-bits information IN to the termination information generation circuit 153, received value and a priori probability information selection circuit 154, Iγ computation circuit 156, Iγ distribution circuit 157, Iα computation circuit 158, Iβ computation circuit 159, soft-output computation circuit 161, received value or a priori probability information separation circuit 162 and hard decision circuit 165. Further, the code information generation circuit 151 supplies the generated type information WM to the Iγ computation circuit 156, Iγ distribution circuit 157, Iα computation circuit 158 and Iβ computation circuit 159. Also, the code information generation circuit 151 supplies the generated number-of-memories information MN to the termination information generation circuit 153, Iγ distribution circuit 157, Iα computation circuit 158, Iβ computation circuit 159 and soft-output computation circuit 161. Furthermore, the code information generation circuit 151 supplies the thus generated branch input/output information BIO to the Iγ distribution circuit 157 and soft-output computation circuit 161. Also, the code information generation circuit 151 supplies the generated valid output position information PE to the inner erasure information generation circuit 152.

The inner erasure information generation circuit 152 is supplied with erasure information TERS from outside and valid output position information PE from the code information generation circuit 151 to generate, based on the supplied information, inner erasure position information IERS indicating a position where there does not exist any coded output which will be obtained via general consideration of the puncture pattern and valid output position.

Figure 30:
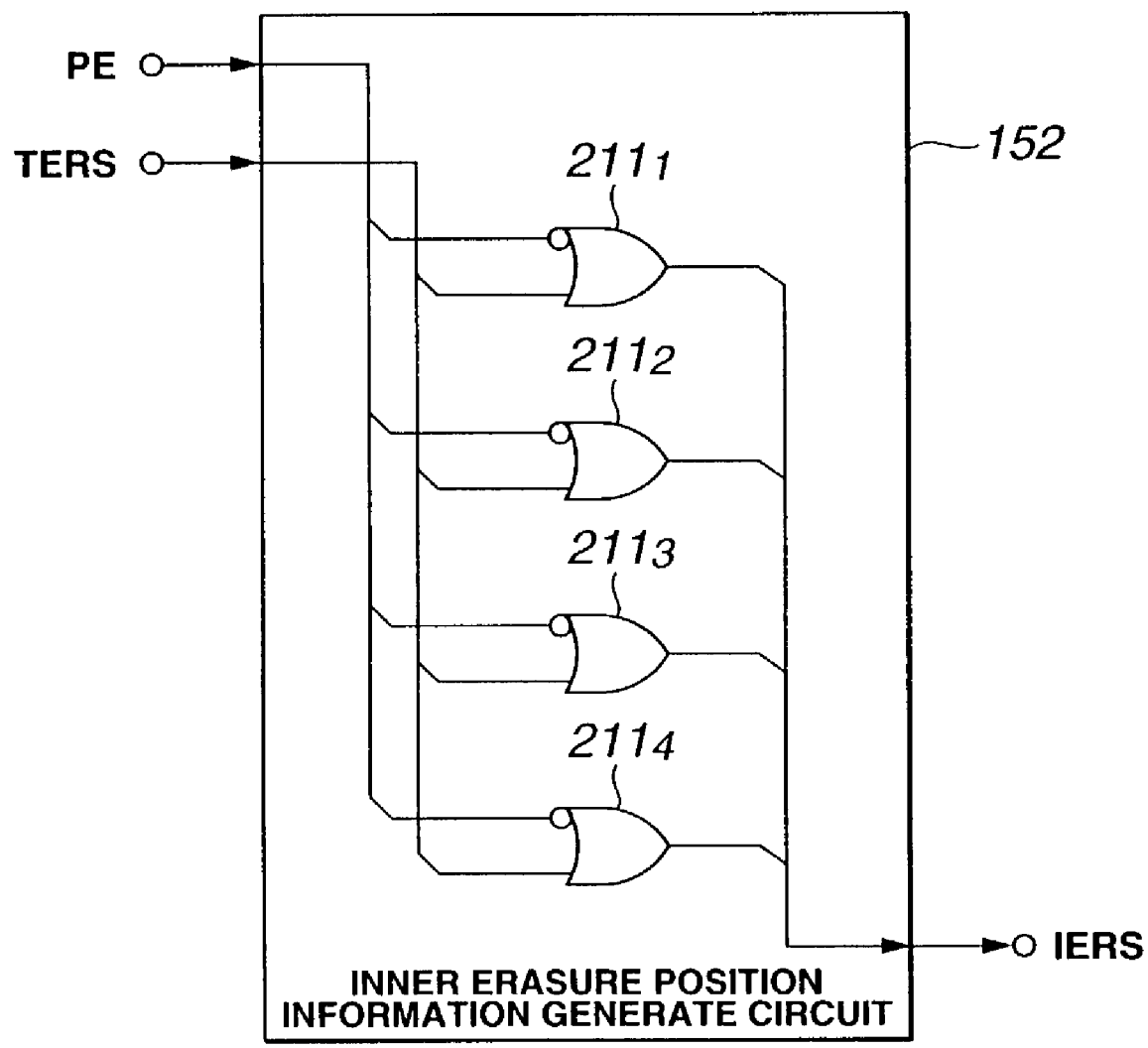
FIG. 30 is a block diagram of an inner erasure position information generation circuit included in the soft-output decoding circuit.

More specifically, the inner erasure information generation circuit 152 can be implemented as a one including four OR gates $211_1$, $211_2$, $211_3$ and $211_4$ as shown in FIG. 30 for example.

Each of the OR gates $211_1$, $211_2$, $211_3$ and $211_4$ carries output the logical OR between the erasure information TERS and data obtained by inverting the valid output position information PE supplied from the code information generation circuit 151. Each of the OR gates $211_1$, $211_2$, $211_3$ and $211_4$ supplies the thus obtained logical sum or OR as inner erasure position information IERS to the received value and a priori probability information selection circuit 154.

By making the OR operation by the OR gates $211_1$, $211_2$, $211_3$ and $211_4$ as above, the inner erasure information generation circuit 152 generates the inner erasure position information IERS indicating a position where no coded output exists.

The termination information generation circuit 153 is supplied with termination time information TTNP and termination state information TTNS from outside and number-of-input bits information IN and number-of-memories information MN from the code information generation circuit 151 to generate termination information in the encoder 1 based on these pieces of information. More particularly, the termination information generation circuit 153 generates, based on the termination time information TTNP, termination state information TTNS, number-of-input-bits information IN and number-of-memories information MN, termination time information TPM indicating a termination time, and termination state information TSM indicating a termination state, in the encoder 1.

Figure 31:
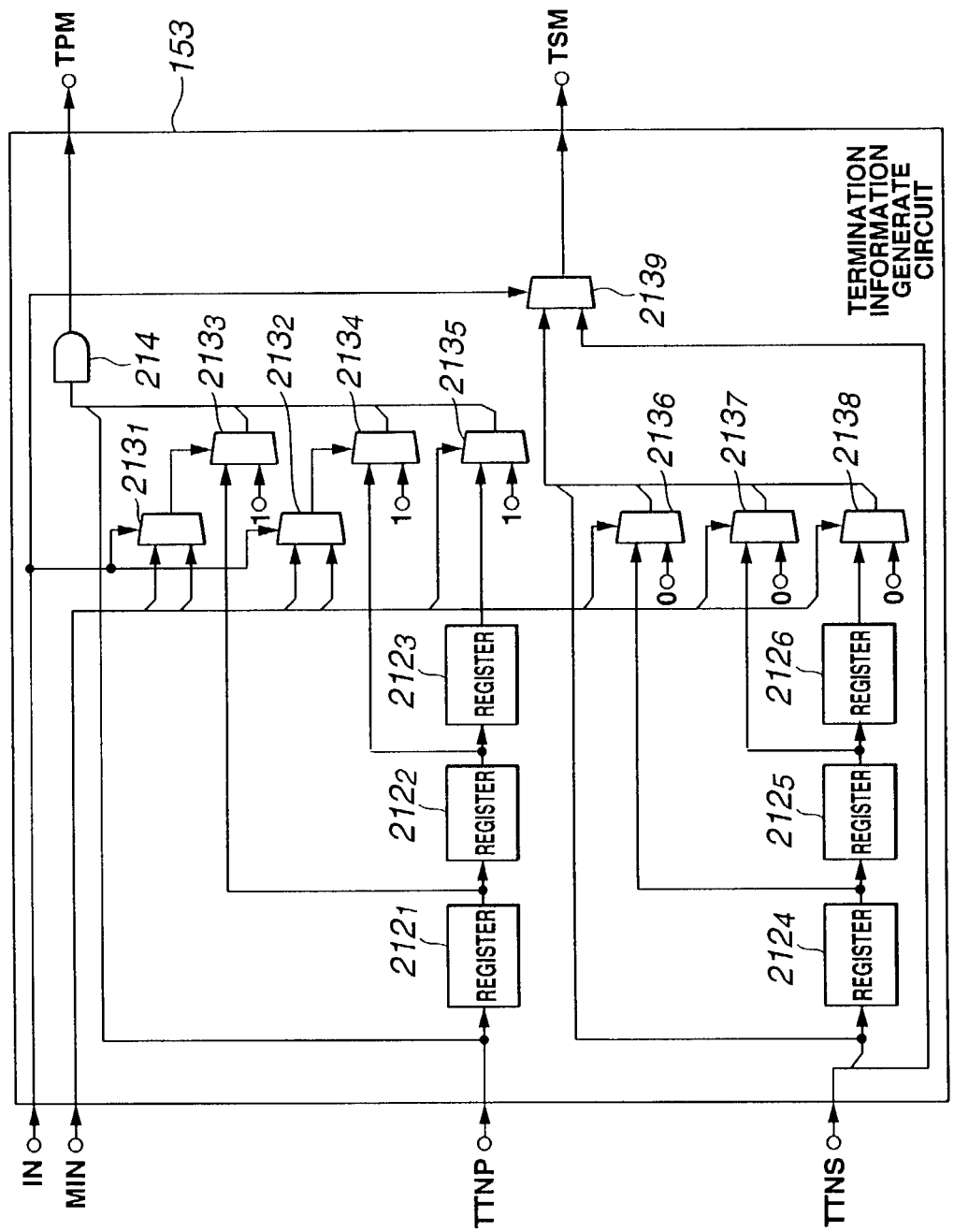
FIG. 31 is a block diagram of a termination information generation circuit included in the soft-output decoding circuit.

As shown in FIG. 31 for example, the termination information generation circuit 153 can be implemented as a one including a plurality of registers $212_1$, $212_2$, $212_3$, $212_4$, $212_5$ and $212_6$, a plurality of selectors $213_1$, $213_2$, $213_3$, $213_4$, $213_5$, $213_6$, $213_7$, $213_8$ and $213_9$, and an AND gate 214.

The register $212_1$ holds, for one clock, the termination time information TTNP supplied from outside, and supplies the thus held termination tine information TTNP to the registers $212_2$ and selector $213_3$.

The register $212_2$ holds, for one clock, the termination time information TTNP supplied from the register $212_1$, and supplies the thus held termination time information TTNP to the register $212_3$ and selector $213_4$.

The register $212_3$ holds, for one clock, the termination time information TTNP supplied from the register $212_2$, and supplies the thus held termination time information TTNP to the selector $213_5$.

The register $212_4$ holds, for one clock, the termination state information TTNS supplied from outside, and supplies the thus held termination state information TTNS to the register $212_5$ and selector $213_6$.

The register $212_5$ holds, for one clock, the termination state information TTNS supplied from the register $212_4$, and supplies the thus held termination state information TTNS to the register $212_6$ and selector $213_7$.

The register $212_6$ holds, for one clock, the termination state information TTNS supplied from the register $212_5$, and supplies the thus held termination state information TTNS to the selector $213_8$.

The selector $213_1$ selects, based on the number-of-input-bits information IN, either information that the number of memories in the element encoder in the encoder 1 is "1" or information that the number of memories is "2", of the number-of-memories information MN. Specifically, when the number of input bits to the encoder 1 is "1" for example, the selector $213_1$ selects the information that the number of memories is "1". The selector $213_1$ supplies the thus selected data as a selection control signal to the selector $213_3$.

The selector $213_2$ selects, based on the number-of-input-bits information IN, either information that the number of memories in the element encoder in the encoder 1 is "2" or information that the number of memories is "3", of the number-of-memories information MN. Specifically, when the number of input bits to the encoder 1 is "1" for example, the selector $213_2$ selects the information that the number of memories is "2". The selector $213_2$ supplies the thus selected data as a selection control signal to the selector $213_4$.

The selector $213_3$ selects, based on the data selected by the selector $213_1$, either the termination time information TTNP supplied from the register $212_1$ or data whose value is "1". Specifically, when the number of memories in the element encoder in the encoder 1 is "1", the selector $213_3$ selects the termination time information TTNP supplied from the register $212_1$. The selector $213_3$ supplies the thus selected data to the AND gate 214.

The selector $213_4$ selects, based on the data selected by the selector $213_2$, either the termination time information TTNP supplied from the register $212_2$ or data whose value is "1". Specifically, when the number of memories in the element encoder in the encoder 1 is "2", the selector $213_4$ selects the termination time information TTNP supplied from the register $212_2$. The selector $213_4$ supplies the thus selected data to the AND gate 214.

The selector $213_5$ selects, based on the number-of-memories information MN, either the termination time information TTNP supplied from the register $212_3$ or data whose value is "1". Specifically, when the number of memories in the element encoder in the encoder 1 is "3", the selector $213_5$ selects the termination time information TTNP supplied from the register $212_3$. The selector $213_5$ supplies the thus selected data to the AND gate 214.

The selector $213_6$ selects, based on the number-of-memories information MN, either the termination state information TTNS supplied from the register $212_4$ or data whose value is "0". Specifically, when the number of memories in the element encoder in the encoder 1 is "1", the selector $213_6$ selects the termination state information TTNS supplied from the register $212_4$. The selector $213_6$ supplies the thus selected data to the selector $213_8$.

The selector $213_7$ selects, based on the number-of-memories information MN, either the termination state information TTNS supplied from the register $212_5$ or data whose value is "0". Specifically, when the number of memories in the element encoder in the encoder 1 is "2", the selector $213_7$ selects the termination state information TTNS supplied from the register $212_5$. The selector $213_7$ supplies the thus selected data to the selector $213_8$.

The selector $213_8$ selects, based on the number-of-memories information MN, either the termination state information TTNS supplied from the register $212_6$ or data whose value is "0". Specifically, when the number of memories in the element encoder in the encoder 1 is "3", the selector $213_8$ selects the termination state information TTNS supplied from the register $212_6$. The selector $213_8$ supplies the thus selected data to the selector $213_9$.

The selector $213_9$ selects, based on the number-of-input-bits information IN, either the termination state information TTNS supplied from outside or data supplied from the selectors $213_6$, $213_7$ and $213_8$. The selector $213_9$ supplies the thus selected data as termination state information TSM to the received data and delaying-use data storage circuit 155.

The AND gate 214 carries out the logical AND between the termination time information TTNP supplied from outside and data supplied from the selectors $213_3$, $213_4$ and $213_5$. The AND gate 214 supplies the thus obtained logical product or AND as termination time information TPM to the received data and delaying-use data storage circuit 155.

The termination information generation circuit 153 can detect a termination period based on the number-of-memories information MN, and generate termination information for an arbitrary termination period by selecting data corresponding to the detected termination period by means of the selectors $215_3$, $215_4$, $215_5$, $215_6$, $215_7$ and $215_8$. Especially, as will be described in detail later, when the element encoder in the encoder 1 is a Wozencraft's convolutional encoder, the termination information generation circuit 153 generates, as termination information, number-of-input-bits information for the termination period to specify a termination state. On the other hand, when the element encoder in the encoder 1 is any convolutional encoder other than the Wozencraft's one, such as a Massey's convolutional encoder, the termination information generation circuit 153 generates, as termination information, information indicating a termination state in one time slot to specify the termination state for the one time slot.

The received value and a priori probability information selection circuit 154 is provided to decode an arbitrary code as will be described in detail later. This circuit 154 selects a to-be-decoded input received value TSR and extrinsic information or interleaved data TEXT, whichever is necessary for soft-output decoding, based on the received value type information CRTY supplied from the control circuit 60, number-of-input-bits information IN supplied from the code information generation circuit 151, a priori probability information erasure information TEAP supplied from outside, and the inner erasure position information IERS supplied from the inner erasure information generation circuit 152. Also, as will further be described later, the received value and a priori probability information selection circuit 154 substitutes, based on the inner erasure position information IERS supplied from the inner erasure information generation circuit 152, a symbol whose likelihood is "0" for a position where there exists no coded output. That is, the received value and a priori probability information selection circuit 154 outputs such information as assures a probability in which a bit corresponding to a position where there is no coded output is "0" or "1" to be "½".

Figure 32:
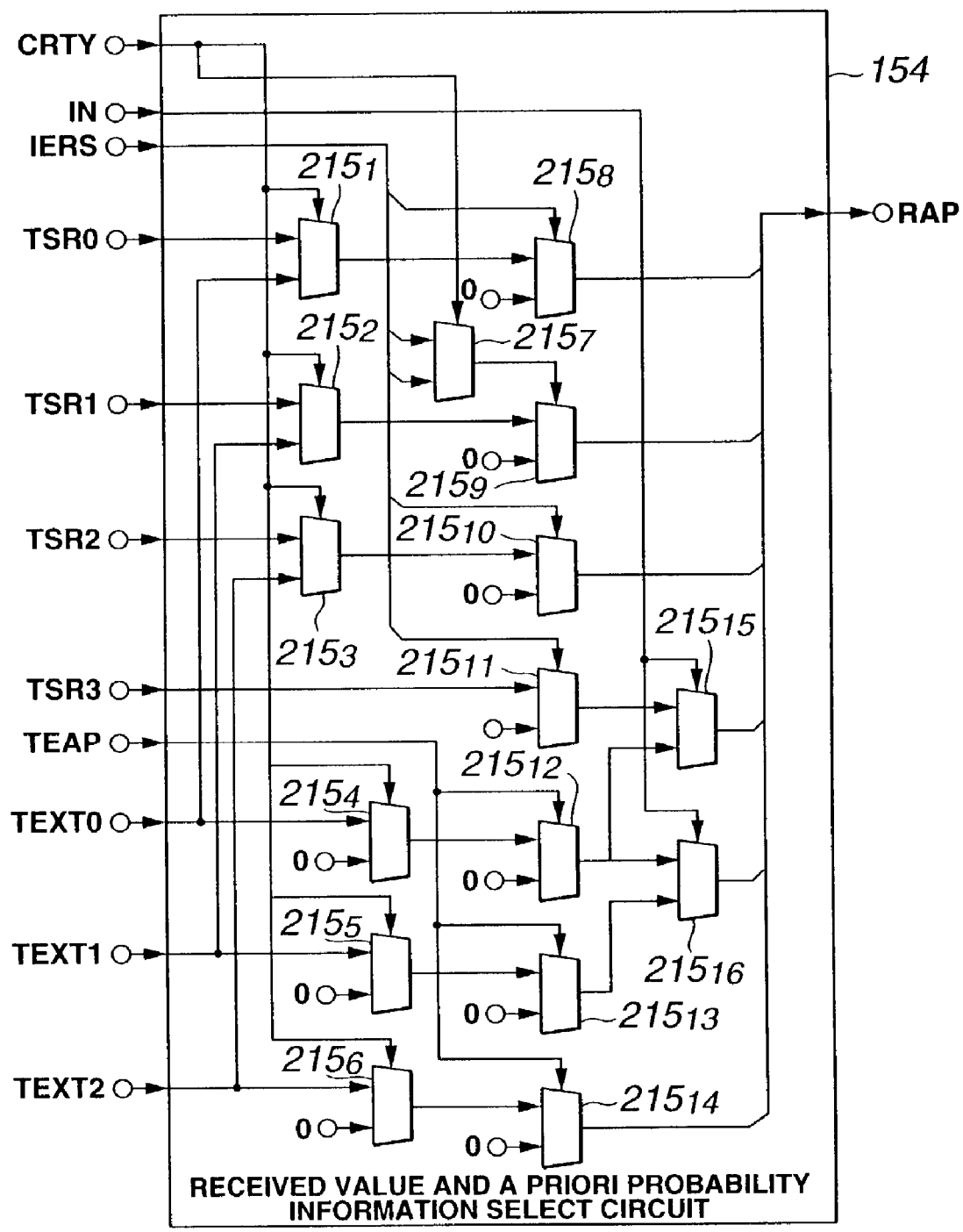
FIG. 32 is a block diagram of a received value and a priori probability information selection circuit included in the soft-output decoding circuit.

More specifically, on the assumption that the to-be-decoded received value TSR consists of four sequences of to-be-decoded received values TSR0, TSR1, TSR2 and TSR3 and the extrinsic information or interleaved data TEXT consists of three sequences of extrinsic information or interleaved data TEXT0, TEXT1 and TEXT2, for example, the received value and a priori probability information selection circuit 154 can be implemented as a one including sixteen selectors $215_1$, $215_2$, $215_3$, $215_4$, $215_5$, $215_6$, $215_7$, $215_8$, $215_9$, $215_{10}$, $215_{11}$, $215_{12}$, $215_{13}$, $215_{14}$, $215_{15}$, and $215_{16}$ as shown in FIG. 32 for example.

The selector $215_1$ selects, based on the received value type information CRTY, either the to-be-decoded received value TSR0 or extrinsic information or interleaved data TEXT0. More particularly, when the received value type information CRTY indicates extrinsic information, the selector $215_1$ selects the extrinsic information or interleaved data TEXT0. The selector $215_1$ supplies the thus selected data to the selector $215_8$.

The selector $215_2$ selects, based on the received value type information CRTY, either the to-be-decoded received value TSR1 or extrinsic information or interleaved data TEXT1. More particularly, when the received value type information CRTY indicates extrinsic information, the selector $215_2$ selects the extrinsic information or interleaved data TEXT1. The selector $215_2$ supplies the thus selected data to the selector $215_9$.

The selector $215_3$ selects, based on the received value type information CRTY, either the to-be-decoded received value TSR2 or extrinsic information or interleaved data TEXT2. More particularly, when the received value type information CRTY indicates extrinsic information, the selector $215_3$ selects the extrinsic information or interleaved data TEXT2. The selector $215_3$ supplies the thus selected data to the selector $215_{10}$.

The selector $215_4$ selects, based on the received value type information CRTY, either extrinsic information or interleaved data TEXT0 or a priori probability information whose value is "0". More particularly, when the received value type information CRTY indicates extrinsic information, the selector $215_4$ selects the a priori probability information whose value is "0". The selector $215_4$ supplies the thus selected data to the selector $215_{12}$.

The selector $215_5$ selects, based on the received value type information CRTY, either extrinsic information or interleaved data TEXT1 or a priori probability information whose value is "0". More particularly, when the received value type information CRTY indicates extrinsic information, the selector $215_5$ selects the a priori probability information whose value is "0". The selector $215_5$ supplies the thus selected data to the selector $215_{13}$.

The selector $215_6$ selects, based on the received value type information CRTY, either extrinsic information or interleaved data TEXT2 or a priori probability information whose value is "0". More particularly, when the received value type information CRTY indicates extrinsic information, the selector $215_6$ selects the a priori probability information whose value is "0". The selector $215_6$ supplies the thus selected data to the selector $215_{14}$.

Based on the received value type information CRTY, the selector $215_7$ selects, of the inner erasure position information IERS, either information that the first symbol does not exist in output bits from the element encoder in the encoder 1 or information that the second symbol does not. More particularly, when the received value type information CRTY indicates that the encoder 1 is not to code data with TTCM or SCTCM, the selector 215$_7$ selects the information that the second symbol does not exist, and supplies the selected data as selection control signal to the selector 215$_9$. Note that the selecting operation of the selector 215$_7$ is caused by the erasing operation made when the encoder 1 is to code TTCM or SCTCM code. That is, since the erasing operation to be done when the encoder 1 is to code data with TTCM or SCTCM leads to erasure of both symbols of common-phase and orthogonal components, the selector 215$_7$ will select the information indicating that the second symbol does not exist.

The selector 215$_8$ selects either the data supplied from the selector 215$_1$ or information whose value is "0" based on the inner erasure position information IERS. More specifically, when the inner erasure position information IERS indicates that of the output bits from the element encoder of the encoder 1, the first symbol does not exist, the selector 215$_8$ selects the information whose value is "0". The data selected by this selector 215$_8$ is tied together with the data supplied from the selectors 215$_9$, 215$_{10}$, 215$_{14}$, 215$_{15}$ and 215$_{16}$, and supplied as selected received value and a priori probability information RAP to the received data and delaying-use data storage circuit 155.

The selector 215$_9$ selects, based on the data supplied from the selector 215$_7$, either the data supplied from the selector 215$_2$ or information whose value is "0". More specifically, when the data supplied from the selector 215$_7$ indicates that of the output bits from the element encoder of the encoder 1, the second symbol does not exist, the selector 215$_9$ selects the information whose value is "0". The data selected by this selector 215$_9$ is tied together with the data supplied from the selectors 215$_8$, 215$_{10}$, 215$_{14}$, 215$_{15}$ and 215$_{16}$, and supplied as selected received value and a priori probability information RAP to the received data and delaying-use data storage circuit 155.

Based on the inner erasure position information IERS, the selector 215$_{10}$ selects either the data supplied from the selector 215$_3$ or information whose value is "0". More specifically, when the inner erasure position information IERS indicates that of the output bits from the element encoder of the encoder 1, the third symbol does not exist, the selector 215$_{10}$ selects the information whose value is "0". The data selected by this selector 215$_{10}$ is tied together with the data supplied from the selectors 215$_8$, 215$_9$, 215$_{14}$, 215$_{15}$ and 215$_{16}$, and supplied as selected received value and a priori probability information RAP to the received data and delaying-use data storage circuit 155.

The selector 215$_{11}$ selects, based on the inner erasure position information IERS, either the to-be-decoded received value TSR3 or information whose value is "0". More specifically, when the inner erasure position information IERS indicates that of the output bits from the element encoder of the encoder 1, the fourth symbol does not exist, the selector 215$_{11}$ selects the information whose value is "0". The data selected by this selector 215$_{11}$ is supplied to the selector 215$_{15}$.

The selector 215$_{12}$ selects, based on the a priori probability information erasure information TEAP, either the data supplied from the selector 215$_4$ or information whose value is "0". More specifically, when the a priori probability information erasure information TEAP indicates that the data has been punctured, the selector 215$_{12}$ selects the information whose value is "0" and supplies it to the selectors 215$_{15}$ and 215$_{16}$.

The selector 215$_{13}$ selects, based on the a priori probability information erasure information TEAP, either the data supplied from the selector 215$_5$ or information whose value is "0". More specifically, when the a priori probability information erasure information TEAP indicates that the data has been punctured, the selector 215$_{13}$ selects the information whose value is "0", and supplies the thus selected information to the selector 215$_{16}$.

The selector 215$_{14}$ selects, based on the a priori probability information erasure information TEAP, either the data supplied from the selector 215$_6$ or information whose value is "0". More specifically, when the a priori probability information erasure information TEAP indicates that the data has been punctured, the selector 215$_{14}$ selects the information whose value is "0". The data selected by the selector 215$_{14}$ is tied together with the data supplied from the selectors 215$_8$, 215$_9$, 215$_{10}$, 215$_{15}$ and 215$_{16}$, and supplied as selected received data and a priori probability information RAP to the received data and delaying-use data storage circuit 155.

The selector 215$_{15}$ selects, based on the number-of-input-bits information IN, either the data supplied from the selector 215$_{11}$ or the data supplied from the selector 215$_{12}$. More specifically, when the rate of the element encoder in the encoder 1 is denoted by "1/n" and the number-of-input-bits information IN indicates that the number of input bits is "1", the selector 215$_{15}$ selects the data supplied from the selector 215$_{11}$. The data selected by this selector 215$_{15}$ is tied together with the data supplied from the selectors 215$_8$, 215$_9$, 215$_{10}$, 215$_{14}$ and 215$_{16}$, and supplied as selected received data and a priori probability information RAP to the received data and delaying-use data storage circuit 155.

The selector 215$_{16}$ selects, based on the number-of-input-bits information IN, either the data supplied from the selector 215$_{12}$ or the data supplied from the selector 215$_{13}$. More specifically, when the rate of the element encoder in the encoder 1 is denoted by "1/n" and the number-of-input-bits information IN indicates that the number of input bits is "1", the selector 215$_{16}$ selects the data supplied from the selector 215$_{12}$. The data selected by this selector 215$_{16}$ is tied together with the data supplied from the selectors 215$_8$, 215$_9$, 215$_{10}$, 215$_{14}$ and 215$_{15}$, and supplied as selected received data and a priori probability information RAP to the received data and delaying-use data storage circuit 155.

The received value and a priori probability information selection circuit 154 can select the to-be-decoded received value TSR and extrinsic information or interleaved data TEXT by means of the selectors 215$_1$, 215$_2$, 215$_3$, 215$_4$, 215$_5$ and 215$_6$ to make a selection between the to-be-decoded received value TSR and extrinsic information or interleaved data TEXT as a code likelihood and appropriately select information which is to be entered for soft-output decoding. Also, with the selection by the selectors 215$_8$, 215$_9$, 215$_{10}$, 215$_{11}$, 215$_{12}$, 215$_{13}$ and 215$_{14}$, the received value and a priori probability information selection circuit 154 can substitute a symbol whose likelihood is "0" for a position where there exists no coded output.

The received data and delaying-use data storage circuit 155 includes a plurality of RAMs, control circuit and selection circuit (not shown). This received data and delaying-use data storage circuit 155 stores termination time information TPM and termination state information TSM supplied from the termination information generation circuit 153 and selected received value and a priori probability information RAP supplied from the received value and a priori probability information selection circuit 154.

Then, the received data and delaying-use data storage circuit 155 operates under the control of its the internal control circuit to select, by its selection circuit, predetermined information of the stored termination time information TPM and termination state information TSM, and outputs it as termination information TAL for use in the Iα computation circuit 158 and termination information TB0 and TB1 for use in the Iβ computation circuit 159. The termination information TAL is delayed a predetermined time, and supplied as termination information TALD to the Iα computation circuit 158. Also, the termination information TB0 and TB1 are delayed a predetermined time, and supplied as termination information TB0D and TB1D to the Iβ computation circuit 159.

Also, the received data and delaying-use data storage circuit 155 is controlled by its the internal control circuit to select, by its selection circuit, predetermined information of the stored selected received value and a priori probability information RAP, and outputs it as received data DA for use in the Iα computation circuit 158 and two sequences of received data DB0 and DB1 for use in the Iβ computation circuit 159. The received data DA is supplied to the Iγ computation circuit 156, while it is delayed a predetermined time, and supplied as delayed received data DAD to the received value or a priori probability information separation circuit 162. Also, the received data DB0 and DB1 are supplied to the Iγ computation circuit 156.

Note that the element decoder 50 makes so-called sliding windowing known as a means for processing sequential data. The present invention adopts the memory management method disclosed in the International Publication No. WO99/62183 of the Applicant's pending international patent application to manage the received data and delaying-use data storage circuit 155 and an Iβ storage circuit 160, which will be described in detail later, during the sliding windowing. The element decoder 50 will be described briefly herebelow. In the element decoder 50, received data punctuated at each predetermined length of discontinuation is read from the received data and delaying-use data storage circuit 155, a log likelihood Iβ is stored into the Iβ storage circuit 160, to thereby provide a memory management by which a log soft-output Iλ is eventually be obtained in due time sequence. However, the memory management is not done after computation of the log likelihood Iγ as set forth in the International Publication No. WO99/62183 but the received data is stored into the received data and delaying-use data storage circuit 155 and then the received data is read under an approximate memory management to compute the log likelihood Iγ.

Further the received data and delaying-use data storage circuit 155 can also store delaying data as will be described later. That is, this circuit 155 stores the received value TR and edge signal TEILS supplied from the edge detection circuit 80 to delay them the same time as taken by the soft-output decoding circuit 90 for its operation. The received data and delaying-use data storage circuit 155 supplies a delayed received value PDR resulted from the delaying of the received value TR as delayed received value SDR to the selectors 120$_3$ and 120$_6$. Also, this circuit 155 supplies a delayed edge signal PDIL resulted from the delaying of the edge signal TEILS as delayed edge signal SDILS to the selector 120$_5$.

The Iγ computation circuit 156 uses the received data DA, DB0 and DB1 supplied from the received data and delaying-use data storage circuit 155 to compute a log likelihood Iγ. More specifically, based on the notation set forth in the beginning of Section 2, the Iγ computation circuit 156 makes an operation as given by the following expression (48) for each received value $y_t$ to compute a log likelihood Iγ at each time t. Note that the "sgn" in the expression (48) is a constant indicating the sign for positive or negative, that is, either "+1" or "−1". In case the element decoder 50 is constructed as a system in which only negative values are handled as a log likelihood, the constant sgn takes "+1". On the other hand, in case the element decoder 50 is constructed as a system in which only positive values are handled as a log likelihood, the constant sgn takes "−1". That is, for each received value $y_t$, the Iγ computation circuit 156 computes a log likelihood Iγ logarithmically notated of a probability γ determined by the coded output pattern and received value or log likelihood Iγ whose positive/negative discriminate sign is reversed by logarithmically expressing the probability γ.

$$I\gamma_t(m',m) = sgn \cdot (\log(Pr\{i_t = i(m',m)\}) + \log(Pr\{y_t | x(m', m)\})) \quad (48)$$

Note that in the following, the element decoder 50 will be described as a system in which only negative or positive values is handled as a log likelihood as necessary. But unless otherwise specified, the constant sgn is "−1", that is, the element decoder 50 is constructed as a system in which only positive values is handled as a log likelihood, and a positive value whose probability is higher will be denoted by a smaller value.

In this case, the Iγ computation circuit 156 computes a log likelihood Iγ based on the received value type information CRTY and a priori probability information type information CAPP and signal point mapping information CSIG (when the encoder 1 is to code data with TTCM or SCTCM) supplied from the control circuit 60, and the number-of-input-bits information IN and type information WM supplied from the code information generation circuit 151. The Iγ computation circuit 156 supplies the computed a log likelihood Iγ to the Iγ distribution circuit 157. That is, the Iγ computation circuit 156 supplies the log likelihood Iγ for use in the Iα computation circuit 158 as a log likelihood GA to the Iγ distribution circuit 157, while supplying the log likelihood Iγ for use in the Iβ computation circuit 159 as log likelihood GB0 and GB1 to the Iγ distribution circuit 157.

Figure 33:
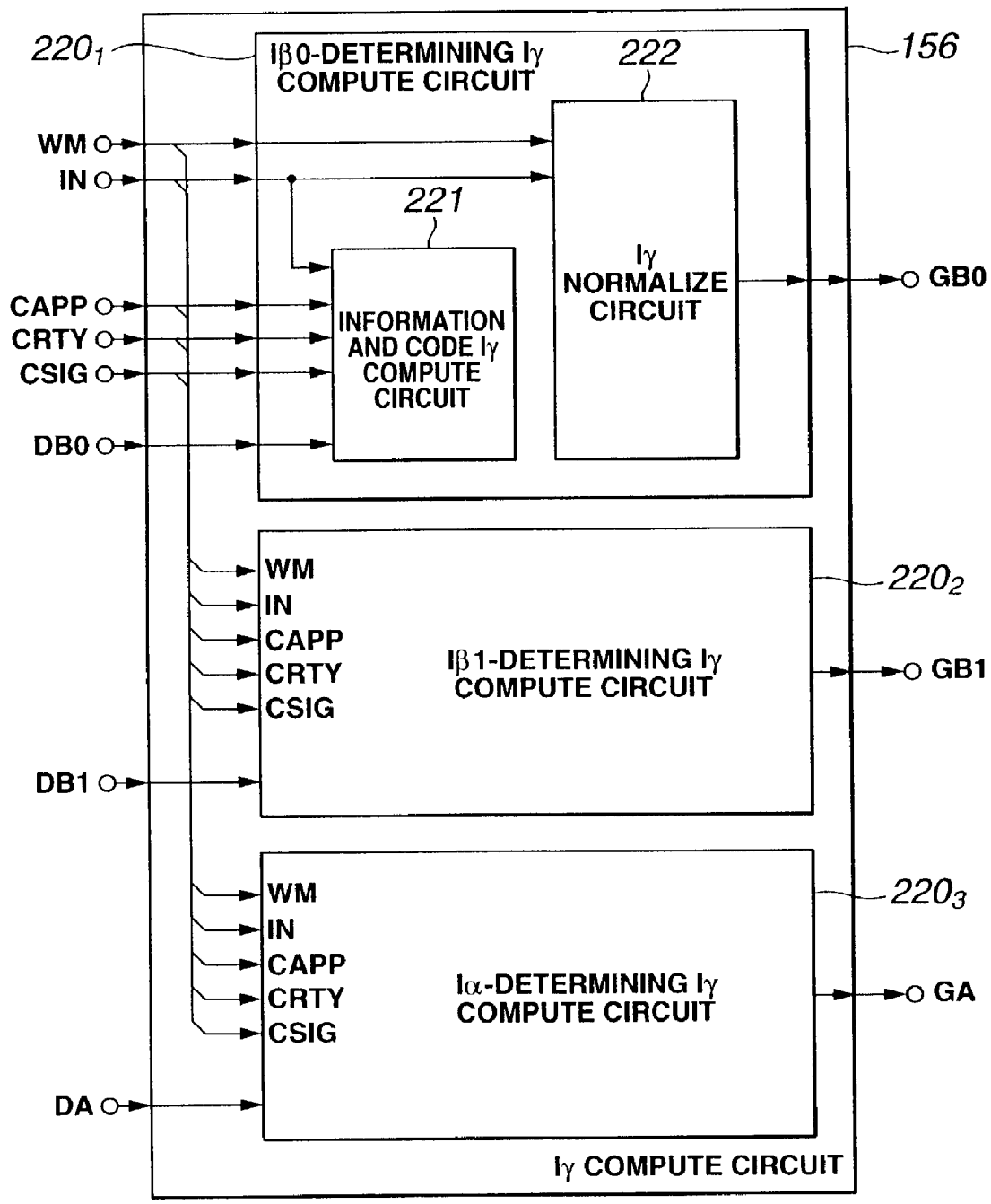
FIG. 33 is a block diagram of an Iγ computation circuit included in the soft-output decoding circuit.

The Iγ computation circuit 156 can be implemented as a one including an Iβ0-computing Iγ computation circuit 220$_1$ to compute a log likelihood Iγ for use to compute a log likelihood Iβ0 of two sequences of log likelihood Iβ0 and Iβ1, an Iβ1-computing Iγ computation circuit 220$_2$ to compute a log likelihood Iγ for use to compute the log likelihood Iβ1, and an Iα-computing Iγ computation circuit 220$_3$ to compute a log likelihood Iγ for use to compute a log likelihood Iα, as shown in FIG. 33 for example. Since these an Iβ0-computing Iγ computation circuit 220$_1$, Iβ1-computing Iγ computation circuit 220$_2$ and Iα-computing Iγ computation circuit 220$_3$ can be implemented as a one having the same construction provided that input data to them are different from each other, only the Iβ0-computing Iγ computation circuit 220$_1$ will be described in the following with omission of the illustration and description of the Iβ1-computing Iγ computation circuit 220$_2$ and Iα-computing Iγ computation circuit 220$_3$.

The Iβ0-computing Iγ computation circuit 220$_1$ includes an information and code Iγ computation circuit 221 and Iγ normalization circuit 222.

Supplied with received data DB0 including the received value and a priori probability information, the information and code Iγ computation circuit 221 computes a log likelihood Iγ for all possible input/output patterns or a log likelihood Iγ for at least a part of the input/output patterns based on the received value type information CRTY, a priori probability information type information CAPP, signal point mapping information CSIG and number-of-input-bits information IN, as will be described in detail later.

At this time, in case the encoder 1 is not to code data with TTCM or SCTCM, the information and code Iγ computation circuit 221 computes, from the input received data DB0, sum of a priori probability information and so-called channel value as a log likelihood Iγ.

Also, in case the encoder 1 is to code data with TTCM or SCTCM, the information and code Iγ computation circuit 221 computes a log likelihood Iγ by computing an inner product of the input received data DB0. The reason is that the Euclidean distance in the I/Q plane is the log likelihood Iγ but since the transmission amplitude of output from the encoder takes a constant value in the PSK modulation, the determination of the Euclidean distance is equal to determination of the inner product.

The information and code Iγ computation circuit 221 supplies the thus computed log likelihood Iγ to the Iγ normalization circuit 222.

The Iγ normalization circuit 222 makes normalization for correction of uneven mapping of results of operations by the information and code Iγ computation circuit 221 as will be described in detail later. More particularly, the Iγ normalization circuit 222 makes a predetermined operation of each log likelihood Iγ to match a one, corresponding to data whose probability is maximum, of a plurality of log likelihood Iγ computed by the information and code Iγ computation circuit 221 with a log likelihood corresponding to the possible maximum probability. That is, in case the element decoder 50 handles the log likelihood as a negative value, the Iγ normalization circuit 222 makes normalization by adding a predetermined value to each of the plurality of log likelihood Iγ to match a one, having a maximum value, of the plurality of log likelihood Iγ computed by the information and code Iγ computation circuit 221 with a maximum value which the element decoder 50 can express. Also, in case the element encoder 50 is to handle the log likelihood as a positive value, the Iγ normalization circuit 222 makes normalization by subtracting a predetermined value from each of the plurality of log likelihood Iγ to match a one, having a minimum value, of the plurality of log likelihood Iγ computed by the information and code Iγ computation circuit 221 with a minimum value which the element decoder 50 can express. The Iγ normalization circuit 222 clips the normalized log likelihood Iγ according to a necessary dynamic range, and supplies it as a log likelihood GB0 to the Iγ distribution circuit 157.

The Iβ0-computing Iγ computation circuit $220_1$ computes a log likelihood Iγ for use to compute the log likelihood Iβ0, and supplies it as likelihood GB0 to the Iγ distribution circuit 157.

Also, the Iβ1-orientded Iγ computation circuit $220_2$ is supplied with the received data DB1 instead of the received data DB0 supplied to the Iβ0-computing Iγ computation circuit $220_1$ to make a similar operation to that made by the Iβ0-computing Iγ computation circuit $220_1$. The Iβ1-computing Iγ computation circuit $220_2$ computes a log likelihood Iγ for use to compute a log likelihood Iβ1, and supplies it as a log likelihood GB1 to the Iγ distribution circuit 157.

Similarly, the Iα-computing Iγ computation circuit $220_3$ is supplied with the received data DA instead of the received data DB0 supplied to the Iβ0-computing Iγ computation circuit $220_1$ to make a similar operation to that made by the Iβ0-computing Iγ computation circuit $220_1$. The Iα-computing Iγ computation circuit $220_3$ computes a log likelihood Iα for use to compute log likelihood Iα, and supplies it as a log likelihood GA to the Iγ distribution circuit 157.

The Iγ computation circuit 156 uses the received data DA, DB0 and DB1 to generate log likelihood GA, GB0 and GB1 computed as a log likelihood Iγ, and supplies these likelihood GA, GB0 and GB1 to the Iγ distribution circuit 157.

As will be described in detail later, the Iγ distribution circuit 157 distributes each of the log likelihood GA, GB0 and GB1 supplied from the Iγ computation circuit 156 correspondingly to the configuration of a code. That is, the Iγ distribution circuit 157 distributes the log likelihood GA, GB0 and GB1 to correspond to the trellis branches corresponding to the configuration of the code. At this time, the Iγ distribution circuit 157 distributes the log likelihood GA, GB0 and GB1 on the basis of the generator matrix information CG supplied from the control circuit 60, and number-of-input-bits information IN, type information WM, number-of-memories information MN and branch input/output information BIO supplied from the code information generation circuit 151.

Also, the Iγ distribution circuit 157 has a function to tie parallel paths, if any, on the trellis when decoding a code whose parallel paths exist on the trellis.

The Iγ distribution circuit 157 supplies a log likelihood Iγ obtained via the distribution to the Iγ computation circuit 158 and Iγ computation circuit 159. Namely, the Iγ distribution circuit 157 supplies the log likelihood Iγ for use in the Iα computation circuit 158 and log likelihood DGA to the Iα computation circuit 158, while supplying the log likelihood Iγ for use in the Iβ computation circuit 159 as log likelihood DGB0 and DGB1 to the Iβ computation circuit 159. Also, the Iγ distribution circuit 157 supplies the log likelihood Iγ obtained with there parallel paths not being tied together as a log likelihood DGAB to the Iα computation circuit 158 as will further be described later.

Figure 34:
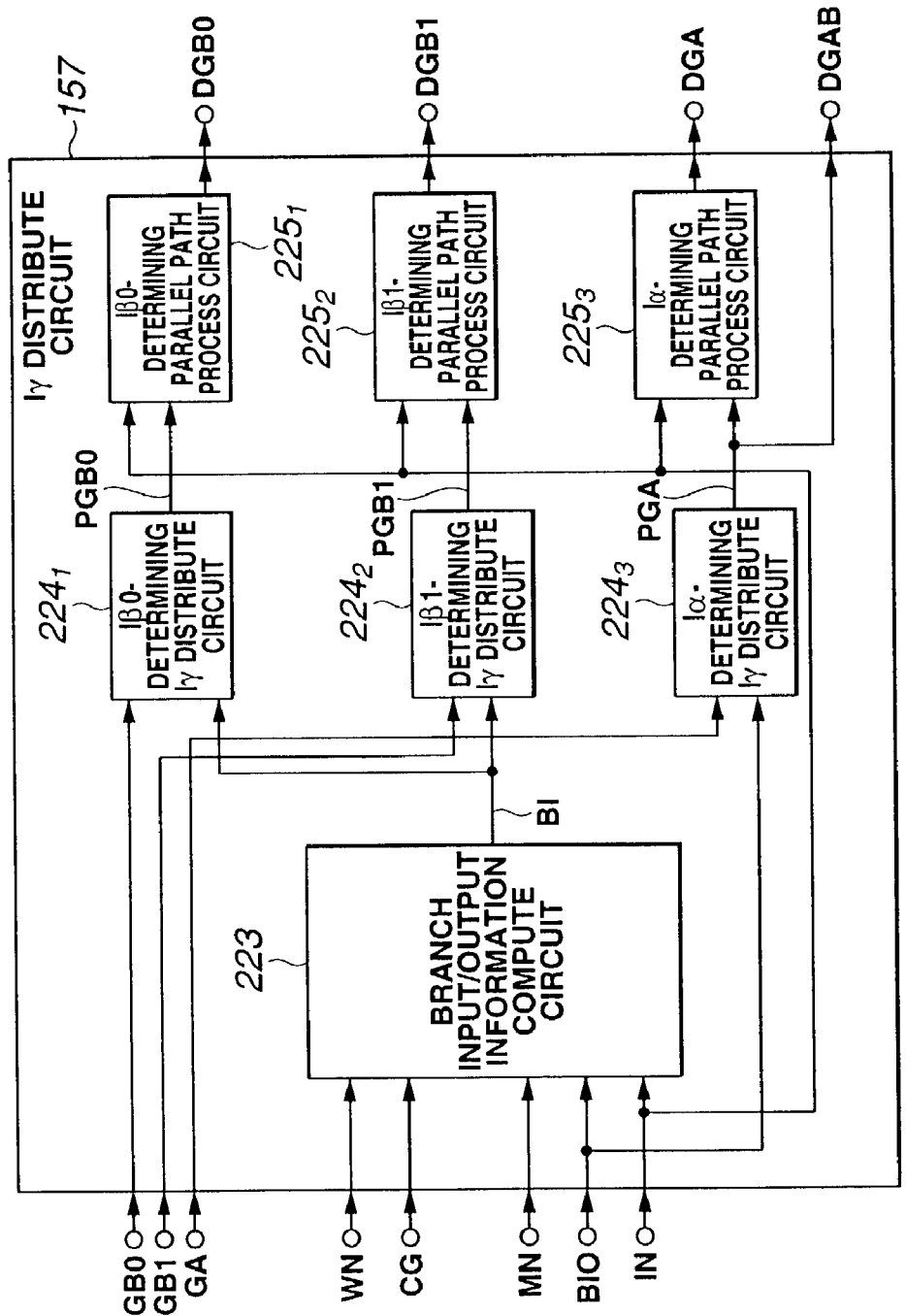
FIG. 34 is a block diagram of an Iγ distribution circuit included in the soft-output decoding circuit.

More particularly, as shown in FIG. 34 for example, the Iγ distribution circuit 157 can be implemented as a one including a branch input/output information computation circuit 223 to compute input/output information on the trellis branches corresponding to the configuration of a code to be decoded, an Iβ0-computing Iγ distribution circuit $224_1$ to distribute a log likelihood Iγ, for use to compute a log likelihood Iβ0, of two sequences of log likelihood Iβ0 and Iβ1, an Iβ1-computing Iγ distribution circuit $224_2$ to distribute a log likelihood Iγ for use to compute a log likelihood Iβ1, an Iα-computing Iγ distribution circuit $224_3$ to distribute a log likelihood Iγ for use to compute a log likelihood Iα, an Iβ0-computing parallel path processing circuit $225_1$ to process parallel paths for use to compute a log likelihood Iβ0 when parallel paths exist in the trellis, an Iβ1-computing parallel path processing circuit $225_2$ to process parallel paths for use to compute a log likelihood Iβ1 when parallel paths exist in the trellis, and an Iα-computing parallel path processing circuit $225_3$ to process parallel paths for use to compute a log likelihood Iα when parallel paths exist in the trellis.

Based on the generator matrix information CG, number-of-input-bits information IN, type information WM, number-of-memories information MN and branch input/output information BIO, the branch input/output information computation circuit 223 identifies the configuration of a code, and computes branch input/output information in a sequence opposite to the time base of the trellis branch corresponding to the configuration of the code. The branch input/output information computation circuit 223 supplies the thus computed branch input/output information BI to the Iβ0-computing Iγ distribution circuit $224_1$ and Iβ1-computing Iγ distribution circuit $224_2$.

Supplied with the log likelihood GB0, the Iβ0-computing Iγ distribution circuit $224_1$ makes a distribution corresponding to the configuration of the code on the basis of the branch input/output information BI, and supplies the log likelihood PGB0 obtained via the distribution to the Iβ0-computing parallel path processing circuit $225_1$.

Supplied with the log likelihood GB1, the Iβ1-computing Iγ distribution circuit $224_2$ makes a distribution corresponding to the configuration of the code on the basis of the branch input/output information BI, and supplies the log likelihood PGB1 obtained via the distribution to the Iβ1-computing parallel path processing circuit $225_2$.

Supplied with the log likelihood GA, the Iα-computing Iγ distribution circuit $224_3$ makes a distribution corresponding to the configuration of the code on the basis of the branch input/output information BIO, and supplies the log likelihood PGA obtained via the distribution to the Iα-computing parallel path processing circuit $225_3$. Also, it supplies the log likelihood PGA obtained via the distribution as a log likelihood DGAB to the Iα computation circuit 158.

As will be described in detail later, when supplied with the log likelihood PGB0 which correspond to the parallel paths, the Iβ0-computing parallel path processing circuit $225_1$ ties the log likelihood PGB0 and outputs the data as likelihood Iγ for use to compute the log likelihood DGB0, that is, log likelihood Iβ0. Also, the Iβ0-computing parallel path processing circuit $225_1$ outputs the input log likelihood PGB0 as it is as a log likelihood DGB0 when the log likelihood PGB0 does not correspond to the parallel paths. At this time, the Iβ0-computing parallel path processing circuit $225_1$ selects to-be-outputted log likelihood DGB0 based on the number-of-input-bits information IN.

Figure 35:
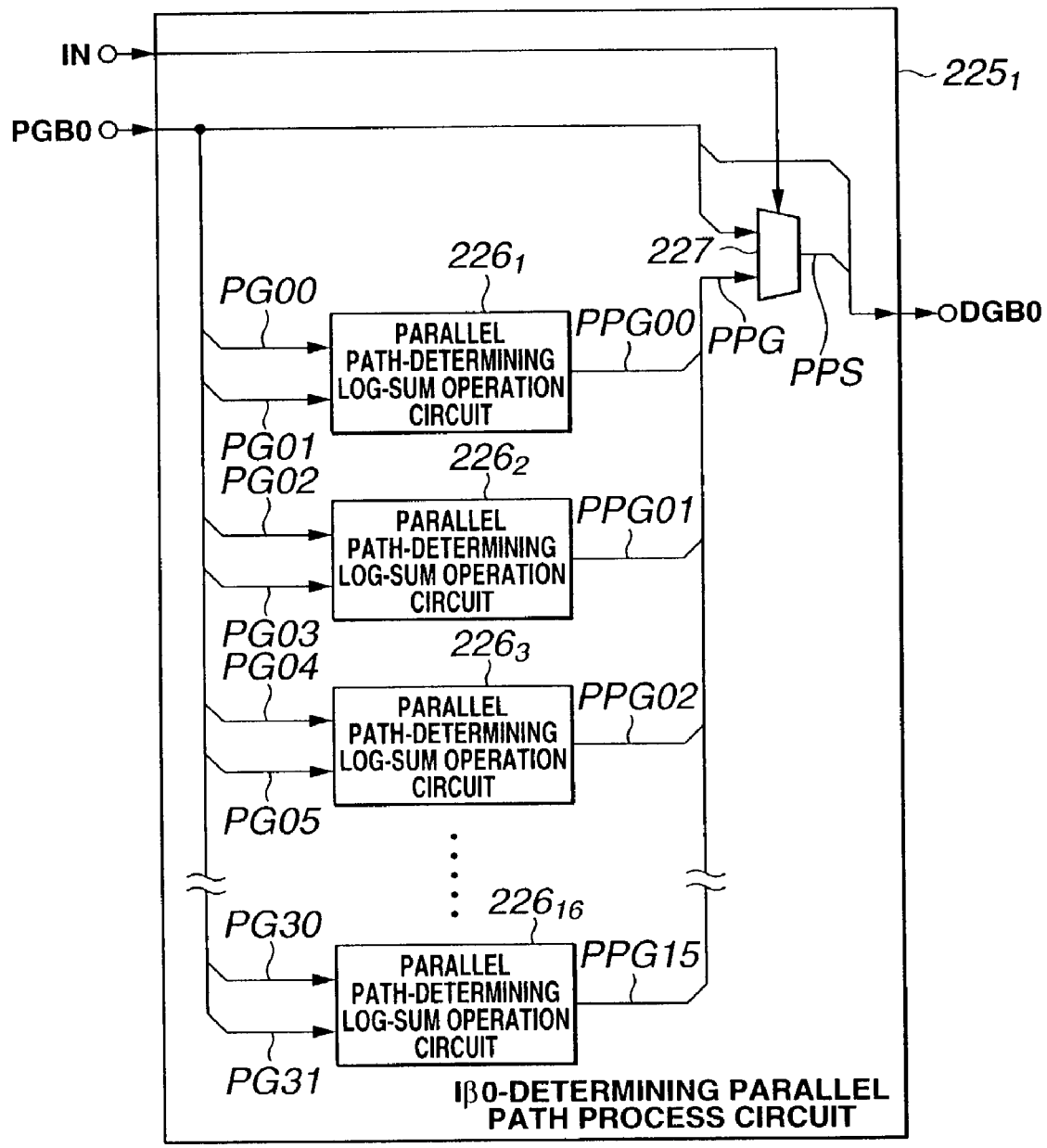
FIG. 35 is a block diagram of an Iβ0 parallel path processing circuit included in the Iγ distribution circuit.

More particularly, the Iβ0-computing parallel path processing circuit $225_1$ includes a maximum number of parallel path-computing log-sum operation circuits $226_n$, the maximum number corresponding to the number of states of a code to be decoded, and a selector 227 to make a 2-to-1 selection, as shown in FIG. 35. The Iβ0-computing parallel path processing circuit $225_1$ is defined herein as a one which decodes one of codes whose parallel paths exist in the trellis, denoted by a trellis having a maximum of 32 branches and which has a maximum of four states, more specifically, a code having parallel paths of which eight paths arriving at each of four states. The Iβ0-computing parallel path processing circuit $225_1$ includes 16 parallel path-computing log-sum operation circuits $226_1, 226_2, 226_3, \ldots, 226_{16}$ to transform the 32 branches to sixteen log likelihood Iγ.

Figure 36:
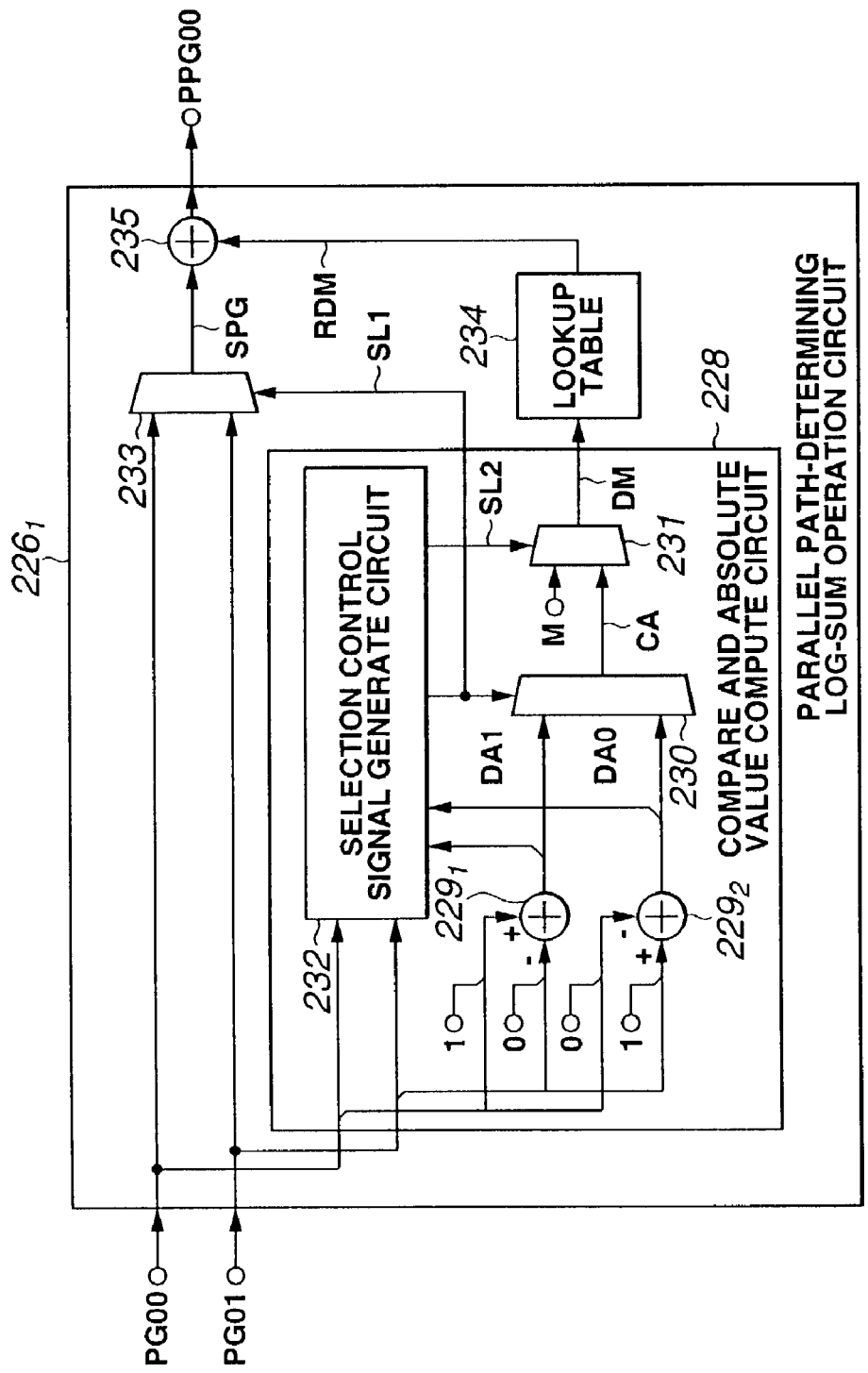
FIG. 36 is a block diagram of a parallel path log-sum operation circuit included in the Iβ0 parallel path processing circuit.

As will be seen from FIG. 36, the parallel path-computing log-sum operation circuit $226_1$ includes two differentiators $229_1$ and $229_2$, three selectors 230, 231 and 233, a selection control signal generation circuit 232 to generate a control signal for use to control the selecting operation of these selectors 230, 231 and 233, a lookup table 234 composed of ROM (read-only memory) to store, as a table, values of a correction term in the so-called log-sum correction, and an adder 235. Of these elements, the differentiators $229_1$ and $229_2$, selectors 230 and 231 and the selection control signal generation circuit 232 form together a comparison and absolute value computation circuit 228.

The comparison and absolute value computation circuit 228 is to compare two input data to see which of the data is larger or smaller and compute the absolute value of a difference between the two data.

The differentiator $229_1$ computes a difference between log likelihood PG00 and PG01 being two log likelihood Iγ of the log likelihood PGB0 of a set of 32 kinds of log likelihood Iγ. More strictly, on the assumption that the likelihood PG00 and PG01 are of 9 bits, respectively, for example, the differentiator $229_1$ computes a difference between the MSB of data of lower 6 bits of the likelihood PG00, to which "1" is added, and the MSB of data of lower 6 bits of the likelihood PG01, to which "0" is added. The differentiator $229_1$ supplies the thus computed difference DA1 to the selector 230 and selection control signal generation circuit 232.

The differentiator $229_2$ computes a difference between the log likelihood PG01 and PG00. More strictly, on the assumption that the likelihood PG00 and PG01 are of 9 bits, respectively, for example, the differentiator $229_2$ computes a difference between the MSB of data of lower 6 bits of the likelihood PG01, to which "1" is added, and the MSB of data of lower 6 bits of the likelihood PG00, to which "0" is added. The differentiator $229_2$ supplies the thus computed difference DA0 to the selector 230 and selection control signal generation circuit 232.

Based on a control signal SL1 supplied from the selection control signal generation circuit 232, the selector 230 selects a difference DA1 supplied from the differentiator $229_1$ or a difference DA0 supplied from the differentiator $229_2$, whichever is larger. The selector 230 supplies data CA obtained via the selection to the selector 231.

The selector 231 selects, based on a control signal SL2 supplied from the selection control signal generation circuit 232, the data CA supplied from the selector 230 or the data having a predetermined value, whichever is larger. More specifically, since the value of the correction terminal for the difference supplied as the data CA is asymptotic to a predetermined value M, the selector 231 selects data having a predetermined value M when the value of the data CA exceeds the predetermined value M. The selector 231 supplies data DM obtained via the selection to the lookup table 234.

The selection control signal generation circuit 232 generates, based on the log likelihood PG00 and PG01 and the differences DA1 and DA0, a control signal SL1 which is used to control the selecting operation of the selectors 230 and 233, and also a control signal SL2 under which the selecting operation of the selector 231 is controlled. At this time, the selection control signal generation circuit 232 separates upper and lower bits of a metric based on the log likelihood PG00 and PG01 to generate the control signals SL1 and SL2 which indicate a selection decision statement, which will further be described later.

The comparison and absolute value computation circuit 228 constructed as above computes an absolute value of a difference between the log likelihood PG00 and PG01. At this time, it is assumed in the comparison and absolute value computation circuit 228 that in case the log likelihood PG00 and PG01 include 9 bits, respectively, for example, the MSB of data of lower 6 bits of the log likelihood PG00, having "1" added thereto, and MSB of data of lower 6 bits of the log likelihood PG01, to which "0" is added, are supplied to the differentiator $229_1$, as will be described in detail later. Similarly, the differentiator $229_2$ in the comparison and absolute value computation circuit 228 is supplied with the MSB of data of lower 6 bits of the log likelihood PG00, having "0" added thereto, and MSB of data of lower 6 bits of the log likelihood PG01, to which "1" is added. That is, the differentiators $229_1$ and $229_2$ are supplied with the MSB of data of lower 6 bits of the log likelihood PG00 or PG01, having "1" or "0" added thereto, which is intended for a higher-speed comparison in size between the log likelihood PG00 and PG01 and involved in the generation of a selection decision statement by separating upper and lower bits of a metric by the selection control signal generation circuit 232. This will be described in detail later.

The selector 233 selects, based on the control signal SL1 supplied from the selection control signal generation circuit 232, the log likelihood PG00 or PG01, whichever is smaller in value. The selector 233 supplies data SPG obtained via the selection to the adder 235.

The lookup table 234 stores, as a table, values of the correction term in the log-sum correction. It reads, from the table, a value of the correction term corresponding to the data DM supplied from the selector 231, and supplies it as data RDM to the adder 235.

The adder 235 adds data SPG supplied from the selector 233 and data RDM supplied from the lookup table 234 to compute the log likelihood Iγ. The adder 235 supplies the thus computed log likelihood Iγ as a log likelihood PPG00 to the selector 227.

The parallel path-computing log-sum operation circuit 226$_1$ ties together the two log likelihood PG00 and PG01 corresponding to the parallel paths, and supplies the data as a log likelihood PPG00 to the selector 227.

The parallel path-computing log-sum operation circuit 226$_2$ is constructed similarly to the parallel path-computing log-sum operation circuit 226$_1$ to tie together two likelihood PG02 and PG03 corresponding to the parallel paths and supply the data as likelihood PPG01 to the selector 227.

Also, the parallel path-computing log-sum operation circuit 226$_3$ is constructed similarly to the parallel path-computing log-sum operation circuit 226$_1$ to tie together two likelihood PG04 and PG05 corresponding to the parallel paths and supply the data as likelihood PPG02 to the selector 227.

Also, the parallel path-computing log-sum operation circuit 226$_{16}$ is constructed similarly to the parallel path-computing log-sum operation circuit 226$_1$ to tie together two likelihood PG030 and PG031 corresponding to the parallel paths and supply the data as likelihood PPG15 to the selector 227.

Each of the plurality of parallel path-computing log-sum operation circuits 226$_n$ ties two likelihood corresponding to the parallel paths. The log likelihood PPG00, PPG01, PPG02, ..., PPG15 tied together by each of the parallel path-computing log-sum operation circuits 226$_n$ are supplied as likelihood PPG to the selector 227.

In the Iβ0-computing parallel path processing circuit 225$_1$, the selector 227 selects, based on the number-of-input bits information IN, either a one of the log likelihood PGB0 supplied from the Iβ0-computing Iγ distribution circuit 224$_1$ and which corresponds to a lower metric or a likelihood PPG supplied from each of the parallel path-computing log-sum operation circuits 226$_n$. More particularly, the selector 227 selects the log likelihood PPG in case the element encoder in the encoder 1 is destined to code a code whose parallel paths exist in the trellis. Note that the number-of-input-bits information IN is used herein as a control signal to control the selecting operation of the selector 227 but actually the selector 227 is supplied with a control signal which indicates whether there exists a code whose parallel paths exist in the trellis.

In the Iβ0-computing parallel path processing circuit 225$_1$, when the log likelihood PGB0 supplied thereto corresponds to parallel paths, the selector 227 selects tied log likelihood PPG to combine the log likelihood PPG and a one of the log likelihood PGB0 which corresponds to the upper metric, and supplies the data as a log likelihood DGB0 to the Iβ computation circuit 159. Also, when the input log likelihood PGB0 does not correspond to the parallel paths, the Iβ0-computing parallel path processing circuit 225$_1$ outputs the log likelihood PGB0 as it is as likelihood DGB0.

The Iβ1-computing parallel path processing circuit 225$_2$ is constructed similarly to the Iβ0-computing parallel path processing circuit 225$_1$. So, it will not be described in detail herein. In this Iβ1-computing parallel path processing circuit 225$_2$, when the log likelihood PGB1 supplied thereto corresponds to the parallel paths, the log likelihood PGB1 is tied and supplied as a log likelihood DGB1, that is, log likelihood Iγ for use to compute a log likelihood Iβ1, to the Iβ computation circuit 159. Also, when the input log likelihood PGB1 does not correspond to the parallel paths, the Iβ1-computing parallel path processing circuit 225$_2$ supplies the log likelihood PGB1 as it is as a log likelihood DGB1 to the Iβ computation circuit 159.

Also, the Iα-computing parallel path processing circuit 225$_3$ is constructed similarly to the Iβ0-computing parallel path processing circuit 225$_1$, and so it will not be described in detail herein. In this Iα-computing parallel path processing circuit 225$_3$, when the log likelihood PGA supplied thereto corresponds to the parallel paths, the log likelihood PGA is tied and supplied as a log likelihood DGA, that is, log likelihood Iγ for use to compute a log likelihood Iα, to the Iα computation circuit 158. Also, when the input log likelihood PGA does not correspond to the parallel paths, the Iα-computing parallel path processing circuit 225$_3$ supplies the log likelihood PGA as it is as a log likelihood DGA to the Iα computation circuit 158.

The Iγ distribution circuit 157 distributes the log likelihood GA, GB0 and GB1 each correspondingly to the configuration of a code. For decoding a code whose parallel paths exist in the trellis, the Iγ distribution circuit 157 ties the parallel paths and supplies the thus obtained log likelihood DGA and DGAB to the Iα computation circuit 158, while supplying the thus obtained log likelihood DGB0 and DGB1 to the Iβ computation circuit 159.

The Iα computation circuit 158 uses the log likelihood DGA and DGAB supplied from the Iγ distribution circuit 157 to compute a log likelihood Iα. Specifically, according to the notation set forth in the beginning of Section 2, the Iα computation circuit 158 uses a log likelihood Iγ to make an operation given by the following expression (49) for computation of a log likelihood Iα at each time t. Note that the operator "#" in the expression (49) indicates the so-called log-sum operation, namely, a log-sum operation for a log likelihood at a transition of an input "1" from the state m" to state m and log likelihood at a transition of an input "0" from the state m" to state m. More specifically, the Iα computation circuit 158 makes an operation given by the following expression (50) when the constant sgn is "+1", while making an operation given by the following expression (51) when the constant sgn is "−1", thereby computing the log likelihood Iα at each time t. That is, the Iα computation circuit 158 computes, based on the log likelihood Iγ, a log likelihood Iα logarithmically notated of a probability a in which for each received value y$_t$, paths run to each state from a coding start state in time sequence or log likelihood Iα whose positive/negative discriminate sign is inverted by logarithmically expressing the probability α.

$$I\alpha_t(m) = (I\alpha_{t-1}(m') + I\gamma_t(m', m)) \\ \#(I\alpha_{t-1}(m'') + I\gamma_t(m'', m)) \qquad (49)$$

-continued $$I\alpha_t(m) = \max(I\alpha_{t-1}(m') + I\gamma_t(m', m), \quad (50)$$
$$I\alpha_{t-1}(m'') + I\gamma_t(m'', m)) +$$
$$\log\left(1 + e^{-|(I\alpha_{t-1}(m')+I\gamma_t(m',m))-(I\alpha_{t-1}(m'')+I\gamma_t(m'',m))|}\right)$$

$$I\alpha_t(m) = \min(I\alpha_{t-1}(m') + I\gamma_t(m', m), \quad (51)$$
$$I\alpha_{t-1}(m'') + I\gamma_t(m'', m)) -$$
$$\log\left(1 + e^{-|(I\alpha_{t-1}(m')+I\gamma_t(m',m))-(I\alpha_{t-1}(m'')+I\gamma_t(m'',m))|}\right)$$

At this time, the Iα computation circuit 158 computes a log likelihood Iα on the basis of the generator matrix information CG supplied from the control circuit 60, number-of-input-bits information, type information WM and number-of-memories information MN supplied IN supplied from the code information generation circuit 151, and termination information TALD supplied from the received data and delaying-use data storage circuit 155. It supplies the sum of the thus computed log likelihood Iα and log likelihood Iγ to the soft-output computation circuit 161. That is, the Iα computation circuit 158 outputs, as data AG, the sum of the log likelihood Iα and Iγ for used to compute a log likelihood Iλ, not outputting the computed log likelihood Iα as it is, as will be described in detail later.

Figure 37:
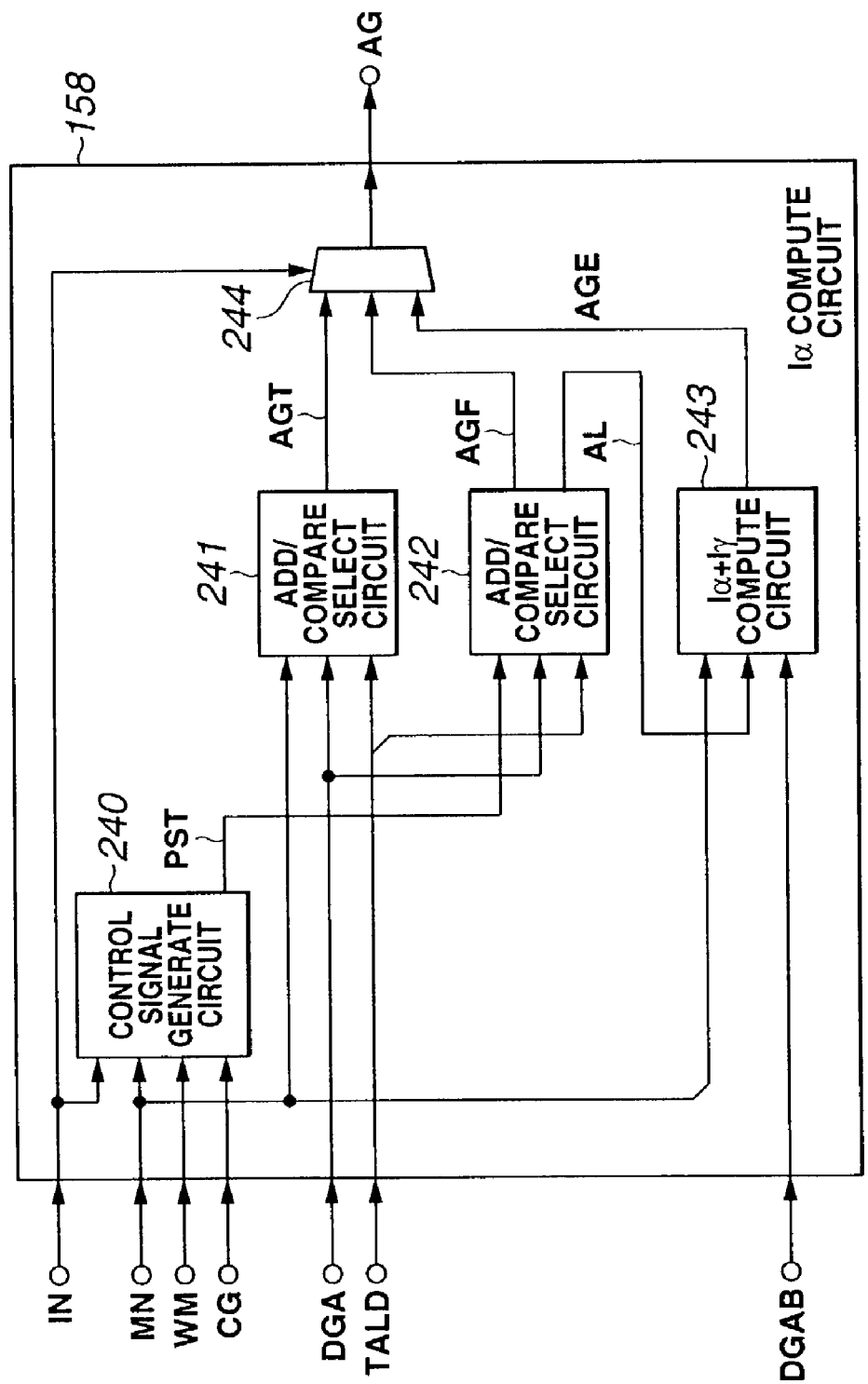
FIG. 37 is a block diagram of an Iα computation circuit included in the soft-output decoding circuit.

More particularly, the Iα computation circuit 158 can be implemented as a one including, as shown in FIG. 37, a control signal generation circuit 240 to generate a control signal, an add/compare selection circuit 241 to make an add/compare operation of a code whose two passes run from each state in the trellis to states at a next time and add a correction term by the log-sum correction, an add/compare selection circuit 242 to make an add/compare operation of a code whose four paths or eight paths (which depends upon a code to be decoded) run from each state in the trellis to states at a next time and add a correction term by the log-sum correction, an Iα+Iγ computation circuit 243 to compute the sum of the log likelihood Iα and Iγ, and a selector 244 to make a 3-to-1 selection.

The control signal generation circuit 240 uses the generator matrix information CG, number-of-input-bits information IN, type information WM and number-of-memories information MN to compute a transition-origin state of a code whose four paths run from each state in the trellis to states at a next time, and supplies the data as a control signal PST to the add/compare selection circuit 242.

The add/compare selection circuit 241 makes an add/compare operation of a code whose two paths run from a state in the trellis to states at a next time and adds a correction term by the log-sum correction to make a log-sum operation.

Figure 38:
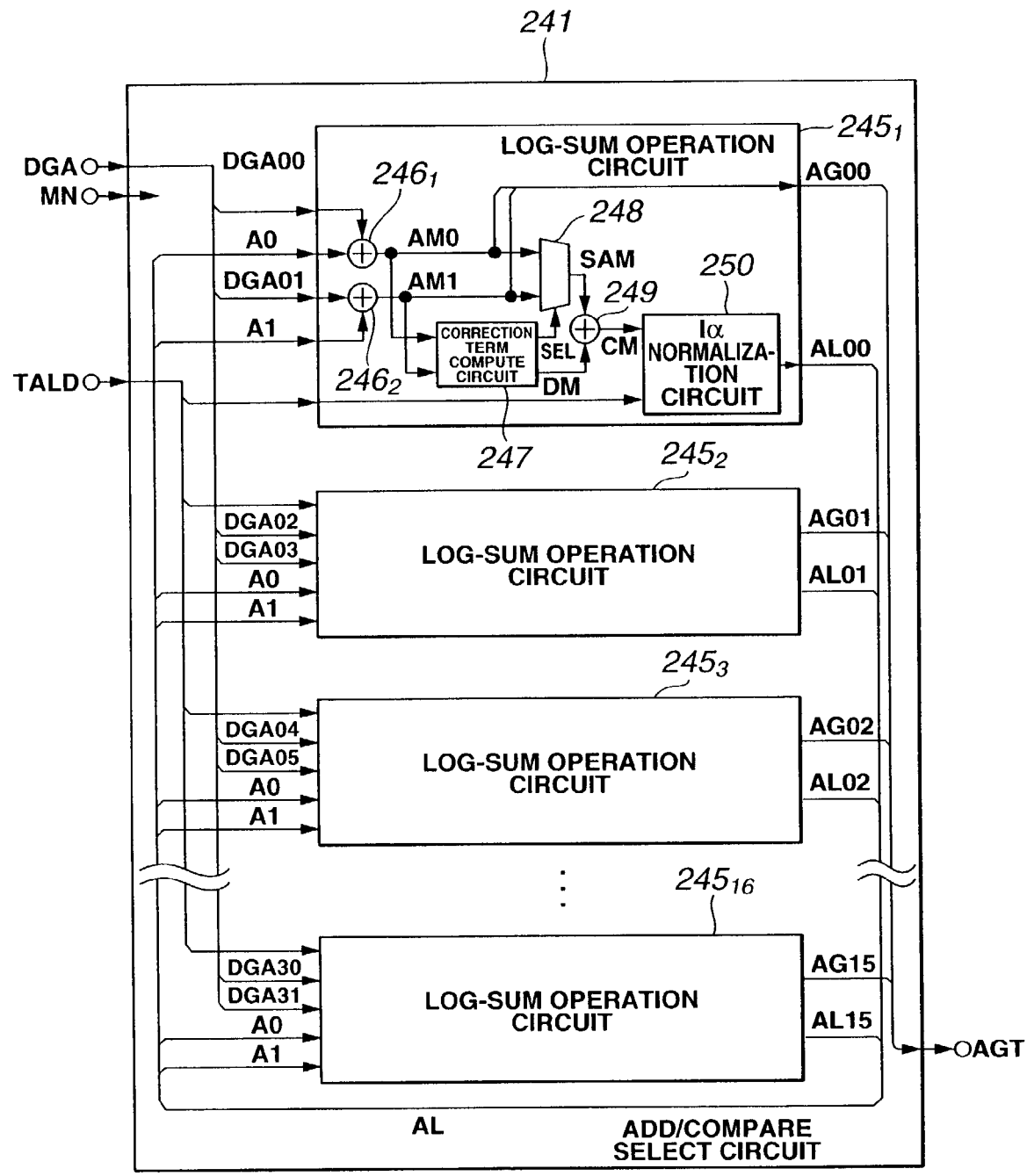
FIG. 38 is a block diagram of an add/compare selection circuit included in the Iα computation circuit, explaining how the add/compare selection circuit processes a code whose two paths run from each state in the trellis to states at a next time.

More particularly, the add/compare selection circuit 241 includes, as shown in FIG. 38, a maximum number of log-sum computation circuits 245$_n$, the maximum number corresponding to the number of states of a to-be-decoded one of codes whose two paths run from each state in the trellis to states at a next time. It is assumed herein that the add/compare selection circuit 241 is destined to decode a code having a maximum of 16 states and includes sixteen log-sum operation circuits 245$_1$, 245$_2$, 245$_3$, . . . , 245$_{16}$.

Each of these log-sum operation circuits 245$_1$, 245$_2$, 245$_3$, . . . , 245$_{16}$ is supplied, based on a transition in the trellis, with a log likelihood Iγ of a branch corresponding to an output pattern in the trellis and a log likelihood Iα having existed one time before in each state. That is, each of the log-sum operation circuits 245$_1$, 245$_2$, 245$_3$, . . . , 245$_{16}$ is supplied with a one of the log likelihood DGA, corresponding to the log likelihood Iγ of a branch corresponding to an output pattern in the trellis, and a one of the computed log likelihood AL having existed one time before, corresponding to the log likelihood Iα in each state. Then, each of the log-sum operation circuits 245$_1$, 245$_2$, 245$_3$, . . . , 245$_{16}$ determines, as the log likelihood AL, the log likelihood Iα in each state at a next time. The distribution of the log likelihood AL for each of the log-sum operation circuits 245$_1$, 245$_2$, 245$_3$, . . . , 245$_{16}$ depends upon the configuration of a code to be decoded. The log likelihood distribution is determined herein by a selector (not shown) or the like on the basis of the number-of-memories information MN. The distribution of the log likelihood AL will be described in detail later.

More specifically, the log-sum operation circuit 245$_1$ includes three adders 246$_1$, 246$_2$ and 249, a correction term computation circuit 247 to compute the value of a correction term in the log-sum operation, a selector 248, and an Iα normalization circuit 250.

The adder 246$_1$ is supplied with a log likelihood DGA00 of the log likelihood DGA and also with a one (taken as A0) of the log likelihood AL computed one time before, corresponding to a code to be decoded, to add these log likelihood DGA00 and A0. The adder 246$_1$ supplies data AM0 indicating the sum of the log likelihood Iα and Iγ obtained via the computation to the correction term computation circuit 247 and selector 248.

The adder 246$_2$ is supplied with a log likelihood DGA01 of the log likelihood DGA and also with a one (taken as A1) of the log likelihood AL computed one time before, corresponding to a code to be decoded to add these log likelihood DGA01 and A1. The adder 246$_2$ supplies data AM1 indicating Iα+Iγ obtained via the computation to the correction term computation circuit 247 and selector 248.

Figure 39:
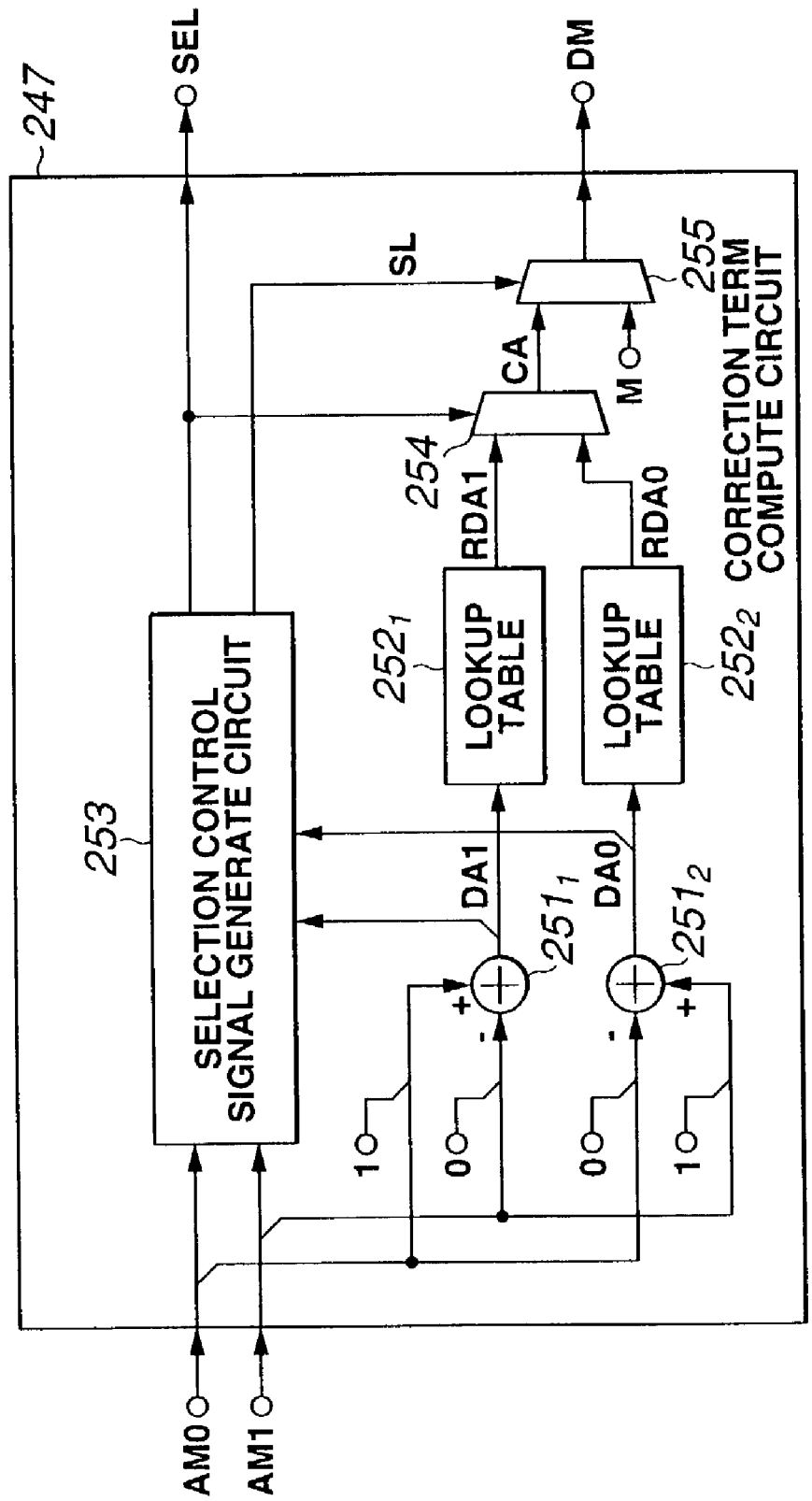
FIG. 39 is a block diagram of a correction term computation circuit included in the add/compare selection circuit.

The correction term computation circuit 247 is supplied with data MA0 from the adder 246$_1$ and data AM1 from the adder 246$_2$ to compute data DM indicating the value of the correction term. This correction term computation circuit 247 includes, as shown in FIG. 39, two differentiators 251$_1$ and 251$_2$, two lookup tables 252$_1$ and 252$_2$ to store, as a table, the values of correction term in the log-sum correction, a selection control signal generation circuit 253 to generate a control signal for use to control the selecting operation of the three selectors 248, 254 and 255, and two selectors 254 and 255.

The differentiator 251$_1$ computes a difference between the data AM0 supplied from the adder 246$_1$ and data AM1 supplied from the adder 246$_2$. Strictly, on the assumption that each of the data AM0 and AM1 is of 12 bits for example, the differentiator 251$_1$ computes a difference between the MSB of the data of lower 6 bits of the data AM0, having "1" added thereto, and MSB of the data of lower 6 bits of the data AM1, to which "0" is added. Thus, the differentiator 251$_1$ supplies the thus computed difference DA1 to the lookup table 252$_1$ and selection control signal generation circuit 253.

The differentiator 251$_2$ computes a difference between the data AM1 and data AM0. Strictly, on the assumption that each of the data AM0 and AM1 is of 12 bits for example, the differentiator 251$_2$ computes a difference between the MSB of the data of lower 6 bits of the data AM1, having "1" added thereto, and MSB of the data of lower 6 bits of the data AM0, to which "0" is added. Thus, the differentiator 251$_2$ supplies the thus computed difference DA0 to the lookup table 252$_2$ and selection control signal generation circuit 253.

Each of the lookup tables $252_1$ and $252_2$ stores, as a table, the values of correction term in the log-sum correction. The lookup table $252_1$ reads the value of correction term corresponding to the value of the difference DA1 supplied from the differentiator $251_1$, and supplies it as data RDA1 to the selector 254. On the other hand, the lookup table $252_2$ reads the value of correction term corresponding to the value of the difference DA0 supplied from the differentiator $251_2$, and supplies it as data RDA0 to the selector 254.

The selection control signal generation circuit 253 generates, based on the data AM0 and AM1 and differences DA1 and DA0, a control signal SEL to control the selecting operation of the selectors 248 and 254 and also a control signal SL to control the selecting operation of the selector 255. At this time, the selection control signal generation circuit 253 separates upper and lower bits of a metric from each other based on the data AM0 and AM1 similarly to the aforementioned selection control signal generation circuit 232 to generate the control signals SEL and SL indicating a selection decision statement, which will be described in detail later.

The selector 245 selects, based on the control signal SEL supplied from the selection control signal generation circuit 253, either RDA1 supplied from the lookup table $252_1$ or RDA0 supplied from the lookup table $252_2$. More particularly, the selector 254 selects the data RDA1 supplied from the lookup table $252_1$ when the value of the data AM0 is larger than that of the data AM1. That is, the selector 254 selects the value of a correction term corresponding to the absolute value of a difference between the data AM0 and AM1, and supplies data DA obtained via the selection to the selector 255.

Based on the control signal SL supplied from the selection control signal generation circuit 253, the selector 255 selects either data CA supplied from the selector 254 or data having a predetermined value M. More specifically, since the value of a correction term corresponding to the difference supplied as the data CA has a property asymptotic to a predetermined value, the selector 255 selects data having the predetermined value M when the value of the data CA exceeds the predetermined value M. The selector 255 supplies data DM obtained via the selection to the lookup table 249.

The correction term computation circuit 247 computes the value of a correction term in the log-sum correction. At this time, the correction term computation circuit 247 does not compute the absolute value of a difference between the two input data and then determine the value of the correction value but computes the values of a plurality of correction terms and then selects an appropriate one of them. Also, in the correction term computation circuit 247, on the assumption that each of the data AM0 supplied from the adder $246_1$ and AM1 supplied from the adder $246_2$ is of 12 bits for example, data supplied to the differentiator $251_1$ include MSB of the data of lower 6 bits of the data AM0, to which "1" is added, and MSB of the data of lower 6 bits of the data AM1, to which "0" is added. Also in the correction term computation circuit 247, data supplied to the differentiator $251_2$ include MSB of the data of lower 6 bits of the data AM0, having "0" added thereto, and MSB of the data of lower 6 bits of the data AM1, having "1" added thereto. That is, the differentiators $251_1$ and $251_2$ are supplied with the MSB of data of lower 6 bits of the data supplied from the adders $246_1$ and $246_2$, having "1" or "0" added thereto, which is intended for a higher-speed comparison in size between the data AM0 and AM1 and involved in the generation of a selection decision statement by separating upper and lower bits of a metric from each other by the selection control signal generation circuit 253. This will be described in detail later.

The selector 248 selects, based on the control signal SEL supplied from the selection control signal generation circuit 253, any of the data AM0 and AM1, whichever is smaller in value. The selector 248 supplies data SAM obtained via the selection to the adder 249.

The adder 249 adds together the data SAM supplied from the selector 248 and data DM supplied from the correction term computation circuit 247 to compute a log likelihood Iα, and supplies the thus computed log likelihood Iα as a log likelihood CM to the Iα normalization circuit 250.

The Iα normalization circuit 250 makes normalization for correction of uneven mapping of log likelihood CM supplied from the adder 249. This normalization can be done in some manners, which will be described in detail later. Also, the Iα normalization circuit 250 uses the termination information TALD to make a terminating operation as well. The Iα normalization circuit 250 clips normalized log likelihood Iα correspondingly to a necessary dynamic range, and supplies it as a log likelihood AL00 to predetermined log-sum operation circuits $245_1, 245_2, 245_3, \ldots, 245_{16}$. At this time, the log likelihood AL00 is delayed one time by a register (not shown) and then supplied to the predetermined log-sum operation circuits $245_1, 245_2, 245_3, \ldots, 245_{16}$.

The log-sum operation circuit $245_1$ determines and outputs the log likelihood AL00, while tying together the data AM0 and AM1 and outputting them as data AG00. That is, the log-sum operation circuit $245_1$ supplies the thus determined log likelihood AL00 to the predetermined log-sum operation circuits $245_1, 245_2, 245_3, \ldots, 245_{16}$ for use to compute a log likelihood Iα at a next time, while outputting data AG00 indicating the sum Iα+Iγ of the log Iα and Iγ determined in the process of the computation of the log likelihood Iα.

The log-sum operation circuit $245_2$ is constructed similarly to the log-sum operation circuit $245_1$ and so will not be described in detail. It is supplied with DGA02 and DGA03 of the log likelihood DGA and ones of the log likelihood AL computed one time before, corresponding to a code to be decoded, as log likelihood A0 and A1, and uses these likelihood DGA02, DGA03, A0 and A1 to compute the log likelihood Iα. It supplies the log likelihood Iα as a log likelihood AL01 to the predetermined log-sum operation circuits $245_1, 245_2, 245_3, \ldots, 245_{16}$, while outputting the data AG01 indicating the sum Iα+Iγ of the log Iα and Iγ.

The log-sum operation circuit $245_3$ is also constructed similarly to the log-sum operation circuit $245_1$ and so will not be described in detail. It is supplied with DGA04 and DGA05 of the log likelihood DGA and ones of the log likelihood AL computed one time before, corresponding to a code to be decoded, as log likelihood A0 and A1, and uses these likelihood DGA04, DGA05, A0 and A1 to compute the log likelihood Iα. It supplies the log likelihood Iα as a log likelihood AL02 to the predetermined log-sum operation circuits $245_1, 245_2, 245_3, \ldots, 245_{16}$, while outputting the data AG02 indicating the sum Iα+Iγ of the log Iα and Iγ.

Further, the log-sum operation circuit $245_{16}$ is also constructed similarly to the log-sum operation circuit $245_1$ and so will not be described in detail. It is supplied with DGA30 and DGA31 of the log likelihood DGA and ones of the log likelihood AL computed one time before, corresponding to a code to be decoded, as log likelihood A0 and A1, and uses these likelihood DGA30, DGA31, A0 and A1 to compute the log likelihood Iα. It supplies the log likelihood Iα as a log likelihood AL15 to the predetermined log-sum operation circuits $245_1$, $245_2$, $245_3$, ..., $245_{16}$, while outputting the data AG15 indicating the sum Iα+Iγ of the log Iα and Iγ.

The add/compare selection circuit 241 computes a log likelihood Iα of a code whose two paths run from each state in the trellis to states at a next time. The add/compare selection circuit 241 does not output the computed log likelihood Iα but the sum Iα+Iγ of the log likelihood Iα and Iγ, as will be described in detail later. That is, the add/compare selection circuit 241 ties together data AG00, AG01, AG02, ..., AG15 computed by the log-sum operation circuits $245_1$, $245_2$, $245_3$, ..., $245_{16}$, and supplies them as data AGT to the selector 244.

The add/compare selection circuit 242 makes an add/compare operation of a code whose four paths or eight paths (which depends on a code to be decoded) run from each state in the trellis to states at a next time and a log-sum correction to add a correction term, thereby making log-sum operation.

Figure 40:
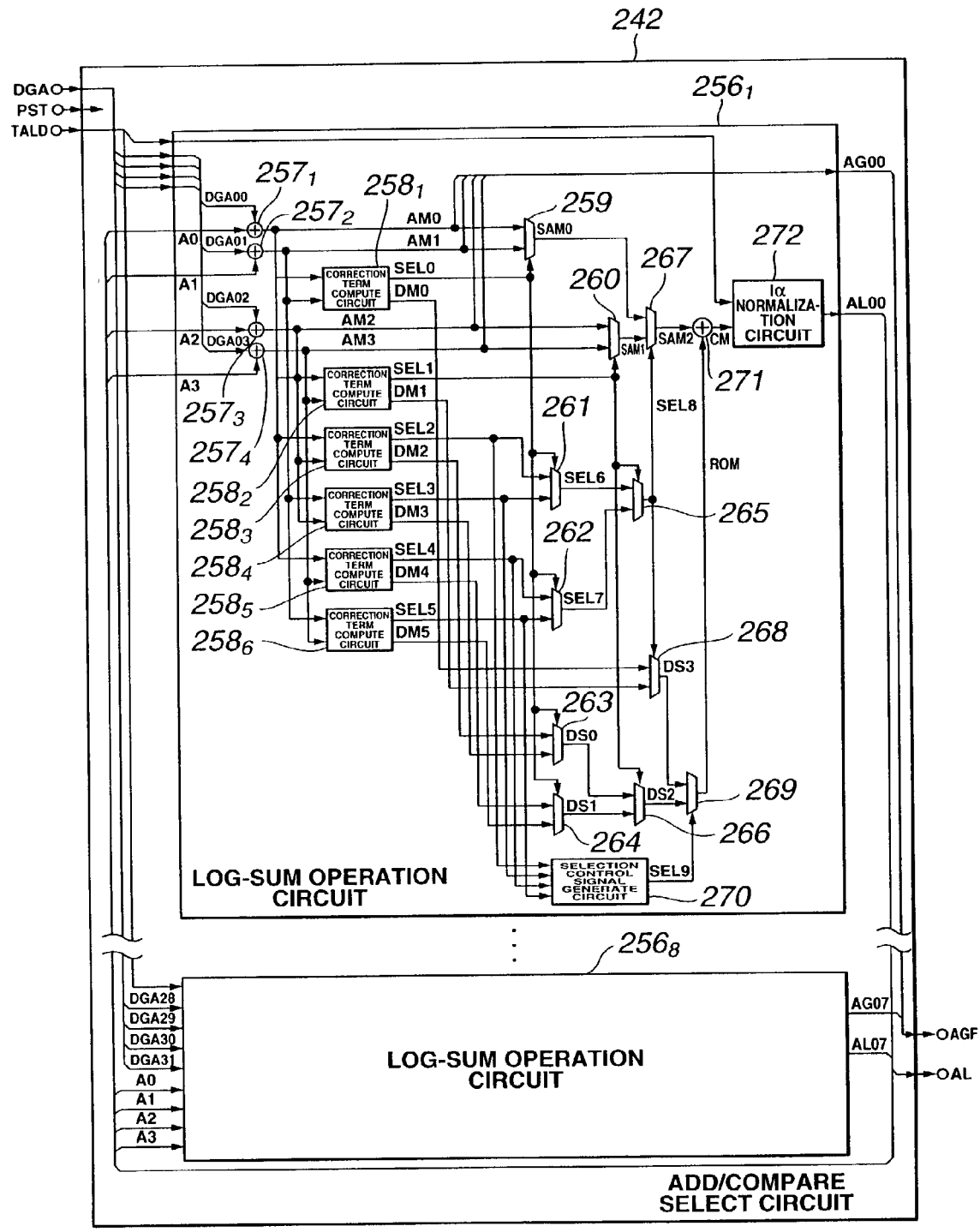
FIG. 40 is a block diagram of the add/compare selection circuit included in the Iα computation circuit, explaining how the add/compare circuit processes a code whose four paths run from each state in the trellis to states at a next time.

More particularly, the add/compare selection circuit 242 includes, as shown in FIG. 40, a maximum number of log-sum operation circuits $256_n$, the maximum number corresponding to the number of states of a to-be-decoded one of codes whose four paths or eight paths (which depends upon a code to be decoded) run from each state in the trellis to states at a next time. It is assumed herein that the add/compare selection circuit 242 decodes a code having a maximum of 8 states and thus includes eight log-sum operation circuits $256_1$, ..., $256_8$.

Each of these log-sum operation circuits $256_1$, ..., $256_8$ is supplied, similarly to the log-sum operation circuits $245_1$, $245_2$, $245_3$, ..., $245_{16}$ in the aforementioned add/compare selection circuit 241, with a log likelihood Iγ of a branch corresponding to the output pattern in the trellis and log likelihood Iα one time before in each state. That is, each of the log-sum operation circuits $256_1$, ..., $256_8$ is supplied with a one of the log likelihood DGA, corresponding to the log likelihood Iγ of a branch corresponding to the output pattern of the trellis, and a one of the log likelihood AL computed one time before, corresponding to the log likelihood Iα in each state. Then, each of the log-sum operation circuits $256_1$, ..., $256_8$ determines the likelihood Iα as a log likelihood AL in each state at a next time. The distribution of log likelihood AL for each of the log-sum operation circuits $256_1$, ..., $256_8$ varies depending upon the configuration of the code to be decoded. It is determined by a selector (not shown) or the like on the basis of the control signal PST. The distribution of the log likelihood AL will be described in detail later.

More particularly, the log-sum operation circuit $256_1$ includes five adders $257_1$, $257_2$, $257_3$, $257_4$ and 271, six correction term computation circuits $258_1$, $258_2$, $258_3$, $258_4$, $258_5$ and $258_6$ to compute the value of a correction term in the log-sum correction, eleven selectors 259, 260, 261, 262, 263, 264, 265, 266, 267, 268 and 269, a selection control signal generation circuit 270 to generate a control signal for controlling the selecting operation of the selector 269, and an Iα normalization circuit 272.

The adder $257_1$ is supplied with DGA00 of the log likelihood DGA and a one (taken as A0) of the log likelihood AL computed one time before, corresponding to a code to be decoded, to add the log likelihood DGA00 and A0. The adder $257_1$ supplies the correction term computation circuits $258_1$, $258_3$ and $258_5$ and the selector 259 with data AM0 indicating the sum of log likelihood Iα and Iγ obtained via the addition.

The adder $257_2$ is supplied with DGA01 of the log likelihood DGA and a one (taken as A1) of the log likelihood AL computed one time before, corresponding to a code to be decoded, to add the log likelihood DGA01 and A1. The adder $257_2$ supplies the correction term computation circuits $258_1$, $258_4$ and $258_6$ and the selector 259 with data AM1 indicating the sum of log likelihood Iα and Iγ (=Iα+Iγ) obtained via the addition.

The adder $257_3$ is supplied with DGA02 of the log likelihood DGA and a one (taken as A2) of the log likelihood AL computed one time before, corresponding to a code to be decoded, to add the log likelihood DGA02 and A2. The adder $257_3$ supplies the correction term computation circuits $258_2$, $258_3$ and $258_4$ and the selector 260 with data AM2 indicating the sum of log likelihood Iα and Iγ (=Iα+Iγ) obtained via the addition.

The adder $257_4$ is supplied with DGA03 of the log likelihood DGA and a one (taken as A3) of the log likelihood AL computed one time before, corresponding to a code to be decoded, to add the log likelihood DGA03 and A3. The adder $257_4$ supplies the correction term computation circuits $258_2$, $258_5$ and $258_6$ and the selector 260 with data AM3 indicating the sum of log likelihood Iα and Iγ (=Iα+Iγ) obtained via the addition.

The correction term computation circuit $258_1$ is constructed similarly to the correction term computation circuit 247 having been illuminated in FIG. 39 and so will not be described in detail. It is supplied with data AM0 from the adder $257_1$ and data AM1 from the adder $257_2$ to compute data DM0 indicating the value of a correction term. At this time, similarly to the correction term computation circuit 247, the correction term computation circuit $258_1$ does not compute the absolute value of a difference between the two input data and then determine the correction term value but computes values of a plurality of correction terms and select an appropriate one of them. Also, the correction term computation circuit $258_1$ computes a difference between MSBs of lower bits of the data AM0 and AM1 supplied from the adders $257_1$ and $257_2$, respectively, to which "1" or "0" is added, and compares the data AM0 and AM1 in size at a high speed. The correction term computation circuit $258_1$ supplies the thus computed data DM0 to the selector 268. Also, the correction term generation circuit $258_1$ generates a control signal SEL0 for controlling the selecting operation of the selectors 259, 261, 262, 263 and 264.

The correction term computation circuit $258_2$ is constructed similarly to the correction term computation circuit 247 having been illuminated in FIG. 39 and so will not be described in detail. It is supplied with data AM2 from the adder $257_3$ and data AM3 from the adder $257_4$ to compute data DM1 indicating the value of a correction term. At this time, similarly to the correction term computation circuit 247, the correction term computation circuit $258_2$ does not compute the absolute value of a difference between the two input data and then determine the correction term value but computes values of a plurality of correction terms and select an appropriate one of them. Also, the correction term computation circuit $258_2$ computes a difference between MSBs of lower bits of the data AM2 and AM3 supplied from the adders $257_3$ and $257_4$, respectively, to which "1" or "0" is added, and makes a comparison in size between the data AM2 and AM3 at a high speed. The correction term computation circuit $258_2$ supplies the thus computed data DM1 to the selector 268. Also, the correction term computation circuit $258_2$ generates a control signal SEL1 for controlling the selecting operation of the selectors 260, 265 and 266.

The correction term computation circuit $258_3$ is constructed similarly to the correction term computation circuit 247 having been illuminated in FIG. 39 and so will not be described in detail. It is supplied with data AM0 from the adder $257_1$ and data AM2 from the adder $257_3$ to compute data DM2 indicating the value of a correction term. At this time, similarly to the correction term computation circuit 247, the correction term computation circuit $258_3$ does not compute the absolute value of a difference between the two input data and then determine the correction term value but computes values of a plurality of correction terms and select an appropriate one of them. Also, the correction term computation circuit $258_3$ computes a difference between MSBs of lower bits of the data AM0 and AM2 supplied from the adders $257_1$ and $257_3$, respectively, to which "1" or "0" is added, and compares the data AM0 and AM2 in size at a high speed. The correction term computation circuit $258_3$ supplies the thus computed data DM2 to the selector 263. The correction term computation circuit $258_3$ generates a control signal SEL2 which is finally a control signal SEL8 for controlling the selecting operation of the selectors 267 and 268, and supplies the control signal SEL2 to the selector 261 and selection control signal generation circuit 270.

The correction term computation circuit $258_4$ is constructed similarly to the correction term computation circuit 247 having been illuminated in FIG. 39 and so will not be described in detail. It is supplied with data AM1 from the adder $257_2$ and data AM2 from the adder $257_3$ to compute data DM3 indicating the value of a correction term. At this time, similarly to the correction term computation circuit 247, the correction term computation circuit $258_4$ does not compute the absolute value of a difference between the two input data and then determine the correction term value but computes values of a plurality of correction terms and select an appropriate one of them. Also, the correction term computation circuit $258_4$ computes a difference between MSBs of lower bits of the data AM1 and AM2 supplied from the adders $257_2$ and $257_3$, respectively, to which "1" or "0" is added, and compares the data AM1 and AM2 in size at a high speed. The correction term computation circuit $258_4$ supplies the thus computed data DM3 to the selector 263. The correction term computation circuit $258_4$ generates a control signal SEL3 which is finally a control signal SEL8 for controlling the selecting operation of the selectors 267 and 268, and supplies the control signal SEL3 to the selector 261 and selection control signal generation circuit 270.

The correction term computation circuit $258_5$ is constructed similarly to the correction term computation circuit 247 having been illuminated in FIG. 39 and so will not be described in detail. It is supplied with data AM0 from the adder $257_1$ and data AM3 from the adder $257_4$ to compute data DM4 indicating the value of a correction term. At this time, similarly to the correction term computation circuit 247, the correction term computation circuit $258_5$ does not compute the absolute value of a difference between the two input data and then determine the correction term value but computes values of a plurality of correction terms and select an appropriate one of them. Also, the correction term computation circuit $258_5$ computes a difference between MSBs of lower bits of the data AM0 and AM3 supplied from the adders $257_1$ and $257_4$, respectively, to which "1" or "0" is added, and compares the data AM0 and AM3 in size at a high speed. The correction term computation circuit $258_5$ supplies the thus computed data DM4 to the selector 264. The correction term computation circuit $258_5$ generates a control signal SEL4 which is finally a control signal SEL8 for controlling the selecting operation of the selectors 267 and 268, and supplies the control signal SEL4 to the selector 262 and selection control signal generation circuit 270.

The correction term computation circuit $258_6$ is constructed similarly to the correction term computation circuit 247 having been illuminated in FIG. 39 and so will not be described in detail. It is supplied with data AM1 from the adder $257_2$ and data AM3 from the adder $257_4$ to compute data DM5 indicating the value of a correction term. At this time, similarly to the correction term computation circuit 247, the correction term computation circuit $258_6$ does not compute the absolute value of a difference between the two input data and then determine the correction term value but computes values of a plurality of correction terms and select an appropriate one of them. Also, the correction term computation circuit $258_6$ computes a difference between MSBs of lower bits of the data AM1 and AM3 supplied from the adders $257_2$ and $257_4$, respectively, to which "1" or "0" is added, and compares the data AM1 and AM3 in size at a high speed. The correction term computation circuit $258_6$ supplies the thus computed data DM5 to the selector 264. The correction term computation circuit $258_6$ generates a control signal SEL5 which is finally a control signal SEL8 for controlling the selecting operation of the selectors 267 and 268, and supplies the control signal SEL5 to the selector 262 and selection control signal generation circuit 270.

The selector 259 selects, based on the control signal SEL0 supplied from the correction term computation circuit $258_1$, the data AM0 or AM1, whichever is smaller in value. The selector 259 supplies data SAM0 obtained via the selection to the selector 267.

The selector 260 selects, based on the control signal SEL1 supplied from the correction term computation circuit $258_2$, the data AM2 or AM3, whichever is smaller in value. The selector 260 supplies data SAM1 obtained via the selection to the selector 267.

The selector 261 selects, based on the control signal SEL0 supplied from the correction term computation circuit $258_1$, either the control signal SEL2 or SEL3. More particularly, when the data AM0 has a larger value than the data AM1, the selector 261 selects the control signal SEL3, and supplies a control signal SEL6 obtained via the selection to the selector 265.

The selector 262 selects, based on the control signal SEL0 supplied from the correction term computation circuit $258_1$, either the control signal SEL4 or SEL5. More particularly, when the data AM0 has a larger value than the data AM1, the selector 262 selects the control signal SEL5, and supplies a control signal SEL7 obtained via the selection to the selector 265.

The selector 263 selects, based on the control signal SEL0 supplied from the correction term computation circuit $258_1$, either the data DM2 or DM3. More particularly, when the data AM0 has a larger value than the data AM1, the selector 263 selects the data DM3 and supplies data DS0 obtained via the selection to the selector 266.

Based on the control signal SEL0 supplied from the correction term computation circuit $258_1$, the selector 264 selects either the data DM4 or DM5. More particularly, when the data AM0 has a larger value than the data AM1, the selector 264 selects the data DM5 and supplies data obtained DS1 via the selection to the selector 266.

The selector 265 selects, based on the control signal SEL1 supplied from the correction term computation circuit $258_2$, either the control signals SEL6 or SEL7. More particularly, when the data AM2 has a larger value than the data AM3, the selector 265 selects the control signal SEL7 and supplies a control signal SEL8 obtained via the selection as a control signal for use in the selectors 267 and 268.

The selector 266 selects, based on the control signal SEL1 supplied from the correction term computation circuit $258_2$, either the data DS0 or DS1. More particularly, when the data AM2 has a larger value than the data AM3, the selector 266 selects the data DS1 and supplies data DS2 obtained via the selection to the selector 269.

Based on the control signal SEL8, the selector 267 selects either the data SAM0 or SAM1. More particularly, when the control signal SEL8 is the control signal SEL7, the selector 267 selects the data SAM1 and supplies data SAM2 obtained via the selection to the adder 271.

Based on the control signal SEL8, the selector 268 selects either the data DM0 or DM1. More particularly, when the control signal SEL8 is the control signal SEL7, the selector 268 selects the data DM1 and supplies data DS3 obtained via the selection to the selector 269.

The selector 269 selects, based on the control signal SEL9 supplied from the selection control signal generation circuit 270, either the data DS2 or DS3, and supplies data RDM obtained via the selection to the adder 271.

The selection control signal generation circuit 270 generates, based on the control signals SEL2, SEL3, SEL4 and SEL5, a control signal SEL9 for controlling the selecting operation of the selector 269. More specifically, the selection control signal generation circuit 270 carries out the logical OR between the logical product or AND of the control signals SEL2, SEL3, SEL4 and SEL5 and the negative AND or NAND of the control signals SEL2, SEL3, SEL4 and SEL5 to generate the control signal SEL9.

The adder 271 adds the data SAM2 supplied from the selector 267 and data RDM supplied from the selector 269 to compute a log likelihood $I\alpha$, and supplies the thus computed log likelihood $I\alpha$ as a log likelihood CM to the $I\alpha$ normalization circuit 272.

Similarly to the aforementioned $I\alpha$ normalization circuit 250, the $I\alpha$ normalization circuit 272 makes normalization for correction of uneven mapping of the log likelihood CM supplied from the adder 271. Also, the $I\alpha$ normalization circuit 272 uses the termination information TALD to make a terminating operation as well. The $I\alpha$ normalization circuit 272 clips the normalized log likelihood $I\alpha$ according to a necessary dynamic range, and supplies it as a log likelihood AL00 to the predetermined log-sum operation circuits $256_1, \ldots, 256_8$. At this time, after being delayed one time by a register (not shown), the log likelihood AL00 is supplied to the predetermined log-sum circuits $256_1, \ldots, 256_8$.

The above log-sum operation circuit $256_1$ determines and outputs the log likelihood AL00, and ties together the data AM0, AM1, AM2 and AM3 and outputs them as data AG00. That is, the log-sum operation circuit $256_1$ supplies the thus obtained log likelihood AG00 to predetermined log-sum circuits $256_1, \ldots, 256_8$ for computation of a log likelihood $I\alpha$ at a next time, while outputting data AG00 indicating the sum of likelihood $I\alpha$ and $I\gamma$ (=$I\alpha+I\gamma$) obtained in the process of computing the log likelihood $I\alpha$.

At this time, the log-sum operation circuit $256_1$ make comparison in likelihood size among all combinations of data corresponding to two paths selected from the data AM0, AM1, AM2 and AM3 indicating likelihood corresponding to four sets of paths obtained from tying of four paths or eight paths (depending upon a code to be decoded) arriving at each state to select, from these data AM0, AM1, AM2 and AM3, ones corresponding to more than at least two paths whose likelihood is high and select, from data corresponding to these paths, a one corresponding to a most likely path whose likelihood is the highest. More particularly, the log-sum operation circuit $256_1$ selects data corresponding to the maximum likelihood path by making comparison in value among the data AM0, AM1, AM2 and AM3 through a so-called tournament among these data.

The log-sum operation circuit $256_8$ is constructed similarly to the above log-sum operation circuit $256_1$, and so will not be described in detail. This log-sum operation circuit $256_8$ is supplied with DGA28, DGA29, DGA30 and DGA31 of the log likelihood DGA and a one of the log likelihood AL computed one time before, equivalent to a code to be decoded, as log likelihood A0, A1, A2 and A3. It uses these log likelihood DGA28, DGA29, DGA30 and DGA31, A0, A1, A2 and A3 to compute a log likelihood $I\alpha$, and supplies it as a log likelihood AL07 to the predetermined log-sum operation circuits $256_1, \ldots, 256_8$ while outputting data AG07 indicating the sum of the log likelihood $I\alpha$ and $I\gamma$ (=$I\alpha+I\gamma$).

The add/compare selection circuit 242 computes a log likelihood $I\alpha$ of a code whose four paths or eight paths (which depends upon a code to be decoded) run from each state in the trellis to states at a next time. Similarly to the add/compare selection circuit 241, the add/compare selection circuit 242 does not output the computed log likelihood $I\alpha$ but outputs the sum of the log likelihood $I\alpha$ and $I\gamma$ (=$I\alpha+I\gamma$). That is, the add/compare selection circuit 242 ties together data AG00, ..., AG07 determined by the log-sum operation circuits $256_1, \ldots, 256_8$, respectively, and supplies them as data AGF to the selector 244. Also, the add/compare selection circuit 242 ties together data AL00, ..., AL07 determined by the log-sum operation circuits $256_1, \ldots, 256_8$, respectively, and supplies them as a log likelihood AL to the $I\alpha+I\gamma$ computation circuit 243. Note that the add/compare selection circuit 242 is originally provided to determine a log likelihood $I\alpha$ of a code whose four paths run from each state in the trellis to states at a next time, but can be used to determine a log likelihood $I\alpha$ of a code whose eight paths run from each state in the trellis to states at a next time, depending upon a code to be decoded as mentioned above. This will further be described in Subsections 5.5.3 and 5.5.5.

Figure 41:
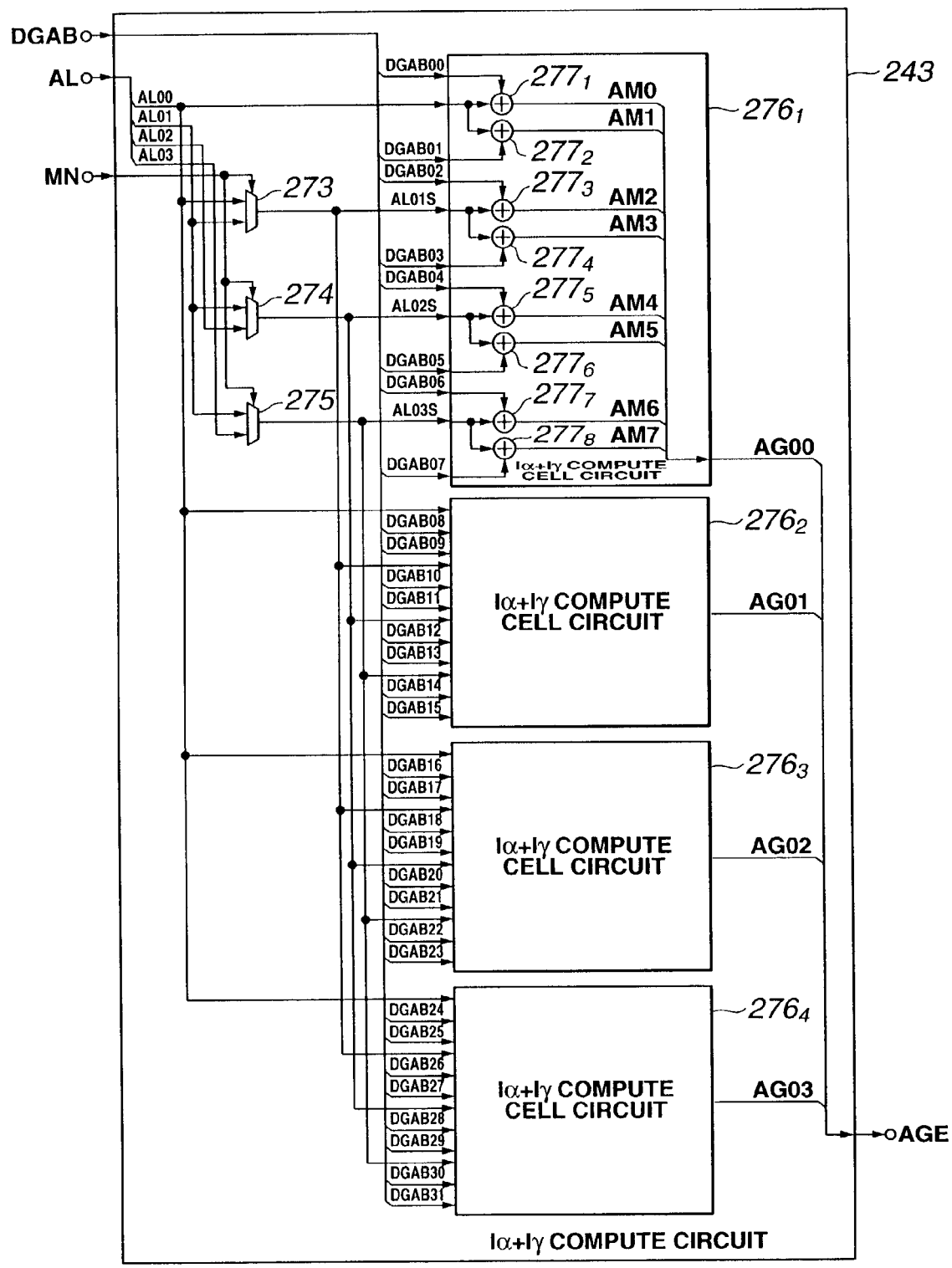
FIG. 41 is a block diagram of an Iα+Iγ computation circuit included in the Iα computation circuit.

As will further be described later, the $I\alpha+I\gamma$ computation circuit 243 is provided to decode a code whose parallel paths exist in the trellis such as a code coded by the convolutional encoder shown in FIG. 21 for example. It computes the sum of log likelihood $I\alpha$ and $I\gamma$. More particularly, the $I\alpha+I\gamma$ computation circuit 243 includes three selectors 273, 274 and 275 and four $I\alpha+I\gamma$ computation cell circuit $276_1, 276_2, 276_3$ and $276_4$ as shown in FIG. 41.

Of the above selectors, the selector 273 selects, based on the number-of-memories information MN, either the predetermined one AL00 or AL01, corresponding to a code to be decoded, of the log likelihood AL supplied from the add/compare selection circuit 242. The selector 273 supplies a log likelihood AL01S obtained via the selection to the four $I\alpha+I\gamma$ computation cell circuit $276_1, 276_2, 276_3$ and $276_4$.

The selector 274 selects, based on the number-of-memories information MN, either the predetermined one AL01 or AL02, corresponding to a code to be decoded, of the log likelihood AL supplied from the add/compare selection circuit 242. The selector 274 supplies a log likelihood AL02S obtained via the selection to the four $I\alpha+I\gamma$ computation cell circuit $276_1, 276_2, 276_3$ and $276_4$.

The selector 275 selects, based on the number-of-memories information MN, either the predetermined one AL01 or AL03, corresponding to a code to be decoded, of the log likelihood AL supplied from the add/compare selection circuit 242. The selector 275 supplies a log likelihood AL03S obtained via the selection to the four $I\alpha+I\gamma$ computation cell circuit $276_1, 276_2, 276_3$ and $276_4$.

The Iα+Iγ computation cell circuit 276₁ includes eight adders 277₁, 277₂, 277₃, 277₄, 277₅, 277₆, 286₇ and 277₈.

Of the above adders, the adder 277₁ adds the predetermined log likelihood DGAB00, corresponding to a code to be decoded, of the log likelihood DGAB supplied from the Iγ distribution circuit 157, and predetermined log likelihood AL00, corresponding to a code to be decoded, of the log likelihood AL supplied from the add/compare selection circuit 242, and outputs data obtained via the addition as data AM0.

The adder 277₂ adds the predetermined a log likelihood DGAB01, corresponding to a code to be decoded, of the log likelihood DGAB supplied from the Iγ distribution circuit 157, and predetermined log likelihood AL00, corresponding to a code to be decoded, of the log likelihood AL supplied from the add/compare selection circuit 242. It outputs data obtained via the addition as data AM1.

The adder 277₃ adds the predetermined log likelihood DGAB02, corresponding to a code to be decoded, of the log likelihood DGAB supplied from the Iγ distribution circuit 157, and log likelihood AL01S supplied from the selector 273, and outputs data obtained via the addition as data AM2.

The adder 277₄ adds the predetermined log likelihood DGAB03, corresponding to a code to be decoded, of the log likelihood DGAB supplied from the Iγ distribution circuit 157, and log likelihood AL01S supplied from the selector 273. It outputs data obtained via the addition as data AM3.

The adder 277₅ adds the predetermined log likelihood DGAB04, corresponding to a code to be decoded, of the log likelihood DGAB supplied from the Iγ distribution circuit 157, and log likelihood AL02S supplied from the selector 274, and outputs data obtained via the addition as data AM4.

The adder 277₆ adds the predetermined log likelihood DGAB05, corresponding to a code to be decoded, of the log likelihood DGAB supplied from the Iγ distribution circuit 157, and log likelihood AL02S supplied from the selector 274, and outputs data obtained via the addition as data AM5.

The adder 277₇ adds the predetermined log likelihood DGAB06, corresponding to a code to be decoded, of the log likelihood DGAB supplied from the Iγ distribution circuit 157, and log likelihood AL03S supplied from the selector 275, and outputs data obtained via the addition as data AM6.

The adder 277₈ adds the predetermined log likelihood DGAB07, corresponding to a code to be decoded, of the log likelihood DGAB supplied from the Iγ distribution circuit 157, and log likelihood AL03S supplied from the selector 275, and outputs data obtained via the addition as data AM7.

Of the above four Iα+Iγ computation cell circuits, the one 276₁ adds a log likelihood DGAB indicating the log likelihood Iγ obtained with the parallel paths not tied by the Iγ distribution circuit 157 and log likelihood AL computed by the add/compare selection circuit 242 to compute the sum of log likelihood Iα and Iγ for use to determine the log soft-output Iλ when the parallel paths are tied together. The Iα+Iγ computation cell circuit 276₁ outputs the thus computed data AM0, AM1, AM2, AM3, AM4, AM5, AM6 and AM7 as data AG00.

The Iα+Iγ computation cell circuit 276₂ is constructed similarly to the above the Iα+Iγ computation cell circuit 276₁, and so will not be described in detail. It uses predetermined ones DGAB08, DGAB09, DGAB10, DGAB11, DGAB12, DGAB13, DGAB14 and DGAB15, corresponding to a code to be decoded, of the log likelihood DGAB, and predetermined log likelihood AL00 corresponding to the code and likelihood AL01S, AL02S and AL03S of the log likelihood AL, to compute the sum of likelihood Iα and Iγ used for determination of the log soft-output Iλ when the parallel paths are tied together. This circuit 276₂ outputs the thus computed data as data AG01.

The Iα+Iγ computation cell circuit 276₃ is constructed similarly to the above the Iα+Iγ computation cell circuit 276₁, and so will not be described in detail. It uses predetermined ones DGAB16, DGAB17, DGAB18, DGAB19, DGAB20, DGAB21, DGAB22 and DGAB23, corresponding to a code to be decoded, of the log likelihood DGAB, predetermined log likelihood AL00 corresponding to the code and likelihood AL01S, AL02S and AL03S of the log likelihood AL, to compute the sum of likelihood Iα and Iγ used for determination of the log soft-output Iλ when the parallel paths are tied together. This Iα+Iγ computation cell circuit 276₃ outputs the thus computed data as data AG02.

The Iα+Iγ computation cell circuit 276₄ is constructed similarly to the above the Iα+Iγ computation cell circuit 276₁, and so will not be described in detail. It uses predetermined ones DGAB24, DGAB25, DGAB26, DGAB27, DGAB28, DGAB29, DGAB30 and DGAB31, corresponding to a code to be decoded, of the log likelihood DGAB, predetermined log likelihood AL00 corresponding to the code and likelihood AL01S, AL02S and AL03S of the likelihood AL, to compute the sum of likelihood Iα and Iγ used for determination of the log soft-output Iλ when the parallel paths are tied together. This Iα+Iγ computation cell circuit 276₄ outputs the thus computed data as data AG03.

The Iα+Iγ computation circuit 243 computes the sum of likelihood Iα and Iγ, ties the thus computed data AG00, AG01, AG02 and AG03, and supplies them as data AGE to the selector 244.

The selector 244 selects, based on the number-of-input-bits IN, any one of data AGT indicating the sum of likelihood Iα and Iγ supplied from the add/compare selection circuit 241, data AGF indicating the sum of likelihood Iα and Iγ supplied from the add/compare selection computation circuit 242, and data AGE indicating the sum of likelihood Iα and Iγ from the Iα+Iγ computation circuit 243. More specifically, the selector 244 selects the data AGT when a code from the element encoder in the encoder 1 is such that no parallel paths exist in the trellis and two paths run from each state in the trellis to a state at next time; the data AGF when a code from the element encoder in the encoder 1 is such that no parallel paths exist in the trellis and four paths run from each state in the trellis to stales at a next time; and the data AGE when a code from the element encoder in the encoder 1 is denoted by a trellis having a maximum of 32 branches and has a maximum of four states, more specifically, a code whose eight parallel paths go to each of four states exist in the trellis. The number-of-input-bits information IN is used herein as the control signal to control the selecting operation of the selector 244, but actually, a control signal defined by the configuration of a code to be decoded is supplied to the selector 244.

The Iα computation circuit 158 computes the log likelihood Iα, and does not output the thus computed log likelihood Iα as it is but outputs the sum of log likelihood Iα and Iγ for used to compute the log soft-output Iλ as data AG. The data AG is delayed a predetermined time and then supplied as data AGD to the soft-output computation circuit 161.

The Iβ computation circuit 159 uses log likelihood DGB0 and DGB1 supplied from the Iγ distribution circuit 157 to compute a log likelihood Iβ. Specifically, the Iβ computation circuit 159 computes two sequences of log likelihood Iβ at each time t by making computation as given by the following expression (52) with the log likelihood Iγ according to the notation set forth in the beginning of Section 2. Note that the operator "#" in the expression (52) indicates the log-sum operation as having previously been described, namely, a log-sum operation made between a log likelihood for a transition from a state m' to a state m with an input "0" and one for a transition from a state m" to the state m with an input "1". More specifically, when the constant sgn is "+1", the Iβ computation circuit 159 makes a computation as given by the following expression (53), while making an operation as given by the following expression (54) when the constant sgn is "−1", thereby computing likelihood Iβ at each time t. That is, the Iβ computation circuit 159 takes, as the basis, the log likelihood Iγ to compute, for each received value $y_t$, log likelihood Iβ logarithmically notated of a probability β in which a transition is made from a termination state to each state in opposite time sequence or log likelihood Iβ logarithmically notated of the probability β and whose positive/negative discriminate sign is inverted.

$$I\beta_t(m) = (I\beta_{t+1}(m') + I\gamma_{t+1}(m, m')) \quad (52)$$
$$\#(I\beta_{t+1}(m'') + I\gamma_{t+1}(m, m''))$$

$$I\beta_t(m) = \max(I\beta_{t+1}(m') + I\gamma_{t+1}(m, m'), \quad (53)$$
$$I\beta_{t+1}(m'') + I\gamma_{t+1}(m, m'')) + \log$$
$$\left(1 + e^{-|(I\beta_{t+1}(m')+I\gamma_{t+1}(m,m'))-(I\beta_{t+1}(m'')+I\gamma_{t+1}(m,m''))|}\right)$$

$$I\beta_t(m) = \min(I\beta_{t+1}(m') + I\gamma_{t+1}(m, m'), \quad (54)$$
$$I\beta_{t+1}(m'') + I\gamma_{t+1}(m, m'')) - \log$$
$$\left(1 + e^{-|(I\beta_{t+1}(m')+I\gamma_{t+1}(m,m'))-(I\beta_{t+1}(m'')+I\gamma_{t+1}(m,m''))|}\right)$$

At this time, 155 to compute a log likelihood Iβ, the Iβ computation circuit 159 takes, as the basis, the generator matrix information CG supplied from the control circuit 60, number-of-input-bits information IN, type information WM and number-of-memories information MN supplied from the code information generation circuit 151, and termination information TB0D and TB1D supplied from the received data and delaying-use data storage circuit. This circuit 159 supplies the thus computed two sequences of log likelihood Iβ as log likelihood B0 and B1 to the Iβ storage circuit 160.

Figure 42:
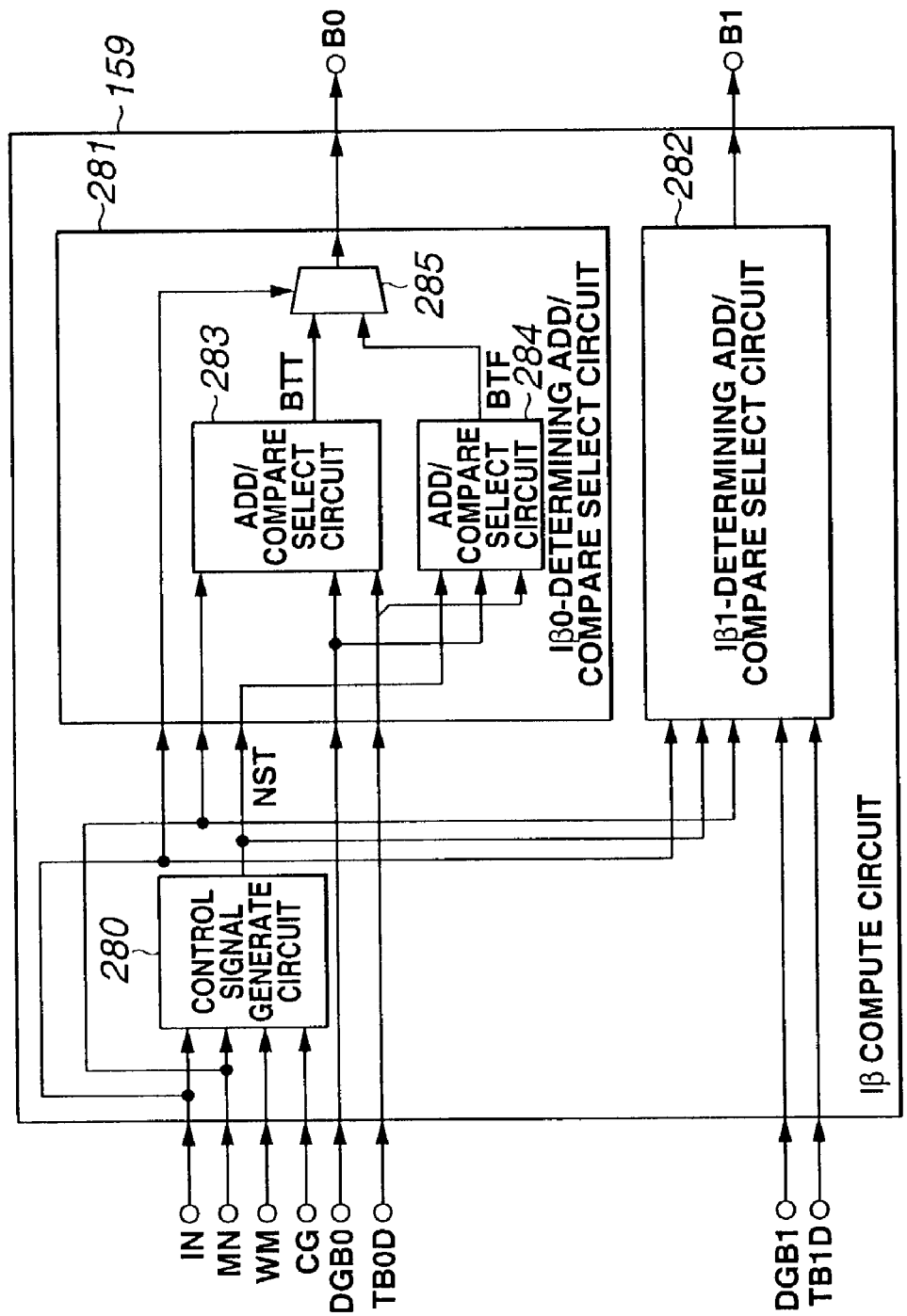
FIG. 42 is a block diagram of an Iβ computation circuit included in the soft-output decoding circuit.

In particular, the Iβ computation circuit 159 can be implemented as a one including, as shown in FIG. 42 for example, a control signal generation circuit 280 to generate a control signal, an Iβ0-computing add/compare selection circuit 281 to compute a log likelihood Iβ0 for one of two sequences of log likelihood Iβ1, and the Iβ1-computing add/compare selection circuit 282 to compute likelihood Iβ1.

The above control signal generation circuit 280 uses the generator matrix information CG, number-of-input-bits information IN, type information WM and number-of-memories information MN to compute a transition-destination state of a code whose four paths run from each state in the trellis to states at a next time, and supplies it as a control signal NST to the Iβ0-orientded add/compare selection circuit 281 and Iβ1-computing add/compare selection circuit 282.

The Iβ0-computing add/compare selection circuit 281 is provided to compute a log likelihood Iβ0. This circuit 281 includes an add/compare selection circuit 283 to make an add/compare selection of, and log-sum correction-based addition of a correction term to, a code whose two paths run from each state in the trellis to states at a next time, an add/compare selection circuit 284 to made an add/compare selection of, and log-sum correction-based addition of a correction term to, a code whose four or eight paths (depending upon the configuration of the code to be decoded) run from each state in the trellis to states at a next time, and a selector 285 to make a 2-to-1 selection.

The add/compare selection circuit 283 makes a log-sum operation of a code whose two paths run from each state in the trellis to states at a next time via an add/compare selection and log-sum correction-based addition of a correction term.

Figure 43:
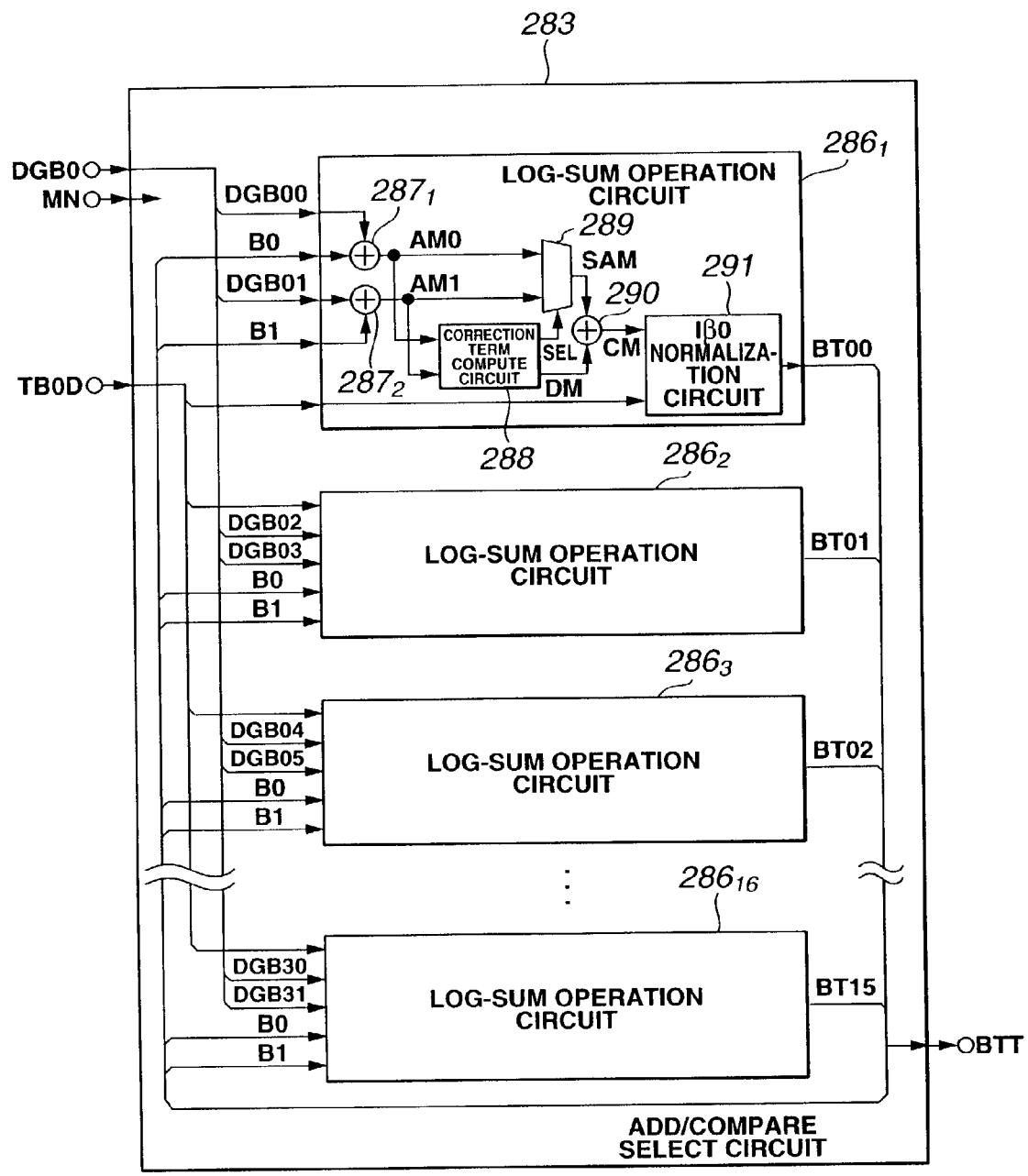
FIG. 43 is a block diagram of an add/compare selection circuit included in the Iβ computation circuit, explaining how the add/compare circuit processes a code whose two paths run from each state in the trellis to states at a next time.

More particularly, the add/compare selection circuit 283 is constructed similarly to the add/compare selection circuit 241 and includes, as shown in FIG. 43, a maximum number of log-sum operation circuits $286_n$, the maximum number corresponding to the number of states of a to-be-decoded one of codes whose two paths run from each state in the trellis to states at a next time. It is assumed herein that the add/compare selection circuit 283 decodes a code having a maximum of 16 states and thus includes sixteen log-sum operation circuits $286_1, 286_2, 286_3, \ldots, 286_{16}$.

Each of these log-sum operation circuits $286_1, 286_2, 286_3, \ldots, 286_{16}$ is supplied with a log likelihood Iγ of a branch corresponding to an output pattern in the trellis and a log likelihood Iβ0 one time before in each state. That is, each of the log-sum operation circuits $286_1, 286_2, 286_3, \ldots, 286_{16}$ is supplied with a one of the log likelihood DGB0, equivalent to the log likelihood Iγ of the branch corresponding to the output pattern in the trellis, and a one of the likelihood BTT one time before, equivalent to the log likelihood Iβ0 in each state. Then, the each of the log-sum operation circuits $286_1, 286_2, 286_3, \ldots, 286_{16}$ determines a log likelihood Iβ in each state at a next time as a log likelihood BTT. The distribution of the log likelihood BTT to each of the log-sum operation circuits $286_1, 286_2, 286_3, \ldots, 286_{16}$ varies depending upon the configuration of a code to be decoded. The distribution is determined based on the number-of-memories information MN by a selector (not shown) or the like. The distribution of the log likelihood BTT will further be described later.

More specifically, the log-sum operation circuit $286_1$ includes three adders $287_1$, $287_2$ and 290, a correction term computation circuit 288 to compute the value of a correction term in the log-sum correction, a selection 289 and an Iβ0 normalization circuit 291.

Of the above adders, the adder $287_1$ is supplied with a log likelihood DGB00 of the log likelihood DGB0 and a one of the log likelihood BTT computed one time before, corresponding to a code to be decoded, as a log likelihood B0, to add these log likelihood DGB00 and B0. The adder $287_1$ supplies data AM0 indicating the sum of log likelihood Iβ and Iγ obtained via the addition to the correction term computation circuit 288 and selector 289.

The adder $287_2$ is supplied with a log likelihood DGB01 of the log likelihood DGB0 and a one of the log likelihood BTT computed one time before, corresponding to a code to be decoded, as a log likelihood B1, to add these log likelihood DGB01 and B1. The adder $287_2$ supplies data AM1 indicating data indicating Iβ0+Iγ obtained via the addition to the correction term computation circuit 288 and selector 289.

The correction term computation circuit 288 is constructed similarly to the correction term computation circuit 247 having been illuminated in FIG. 39 and so will not be described in detail. It is supplied with data AM0 from the adder $287_1$ and data AM1 from the adder $287_2$ to compute data DM indicating the value of a correction term. At this time, similarly to the correction term computation circuit 247, the correction term computation circuit 288 does not compute the absolute value of a difference between the two input data and then determine the correction term value but computes values of a plurality of correction terms and select an appropriate one of them. Also, the correction term computation circuit 288 computes a difference between MSBs of lower bits of the data AM0 and AM1 supplied from the adders 287$_1$ and 287$_2$, respectively, to which "1" or "0" is added, and compares the data AM0 and AM1 in size at a high speed. The correction term computation circuit 288 supplies the thus computed data DM to the adder 290, and generates a control signal SEL for controlling the selecting operation of the selectors 289.

The selector 289 selects, based on the control signal SEL supplied from the correction term computation circuit 288, the data AM0 or AM1, whichever is smaller in value. The selector 289 supplies data SAM obtained via the selection to the adder 290.

The adder 290 adds the data SAM supplied from the selector 289 and data DM supplied from the correction term computation circuit 288 to compute a log likelihood Iβ0, and supplies the thus computed log likelihood Iβ0 as a log likelihood CM to the Iβ0 normalization circuit 291.

Similarly to the aforementioned Iα normalization circuit 250, the Iβ0 normalization circuit 291 makes normalization for correction of uneven mapping of the log likelihood CM supplied from the adder 290. Also, the Iβ0 normalization circuit 291 uses the termination information TB0D to make a terminating operation as well. The Iβ0 normalization circuit 291 clips the normalized log likelihood 110 according to a necessary dynamic range, and supplies it as a log likelihood BT00 to the predetermined log-sum operation circuits 286$_1$, 286$_2$, 286$_3$, ..., 286$_{16}$. At this time, after being delayed one time by a register (not shown), the log likelihood BT00 is supplied to the predetermined log-sum circuits 286$_1$, 286$_2$, 286$_3$, ..., 286$_{16}$.

The above log-sum operation circuit 286$_1$ determines and outputs the log likelihood BT00. That is, the log-sum operation circuit 286$_1$ supplies the thus obtained log likelihood BT00 to predetermined log-sum circuits 286$_1$, 286$_2$, 286$_3$, ..., 286$_{16}$ for computation of a log likelihood Iβ0 at a next time, while outputting data BT00 to outside.

The log-sum operation circuit 286$_2$ is constructed similarly to the above log-sum operation circuit 286$_1$, and so will not be described in detail. This log-sum operation circuit 286$_2$ is supplied with DGB02 and DGB03 of the log likelihood DGB0 and a one of the log likelihood BTT computed one time before, equivalent to a code to be decoded, as log likelihood B0 and B1. It uses these log likelihood DGB02, DGB03, B0 and B1 to compute a log likelihood Iβ0, and supplies it as a log likelihood BT01 to the predetermined log-sum operation circuits 286$_1$, 286$_2$, 286$_3$, ..., 286$_{16}$, while outputting it to outside.

The log-sum operation circuit 286$_3$ is also constructed similarly to the above log-sum operation circuit 286$_1$, and so will not be described in detail. This log-sum operation circuit 286$_3$ is supplied with DGB04 and DGB05 of the log likelihood DGB0 and a one of the log likelihood BTT computed one time before, equivalent to a code to be decoded, as log likelihood B0 and B1. It uses these log likelihood DGB04, DGB05, B0 and B1 to compute a log likelihood Iβ0, and supplies it as a log likelihood BT02 to the predetermined log-sum operation circuits 286$_1$, 286$_2$, 286$_3$, ..., 286$_{16}$ while outputting it to outside.

Further, the log-sum operation circuit 286$_{16}$ is also constructed similarly to the above log-sum operation circuit 286$_1$, and so will not be described in detail. This log-sum operation circuit 286$_{16}$ is supplied with DGB30 and DGB31 of the log likelihood DGB0 and a one of the log likelihood BTT computed one time before, equivalent to a code to be decoded, as log likelihood B0 and B1. It uses these log likelihood DGB30, DGB31, B0 and B1 to compute a log likelihood Iβ0, and supplies it as a log likelihood BT15 to the predetermined log-sum operation circuits 286$_1$, 286$_2$, 286$_3$, ..., 286$_{16}$ while outputting it to outside.

The above add/compare selection circuit 283 computes a log likelihood Iβ0 of a code whose two paths run from each state in the trellis to states at a next time. It ties together data BT00, BT01, BT02, ..., BT15 computed by the log-sum operation circuits 286$_1$, 286$_2$, 286$_3$, ..., 286$_{16}$, respectively, and supplies them as a log likelihood BTT to the selector 285.

The add/compare selection circuit 284 makes a log-sum operation by making add/compare operation of, and log-sum correction-based addition of a correction term to, a code whose four paths or eight paths (which depends upon a code to be decoded) run from each state in the trellis to states at a next time.

Figure 44:
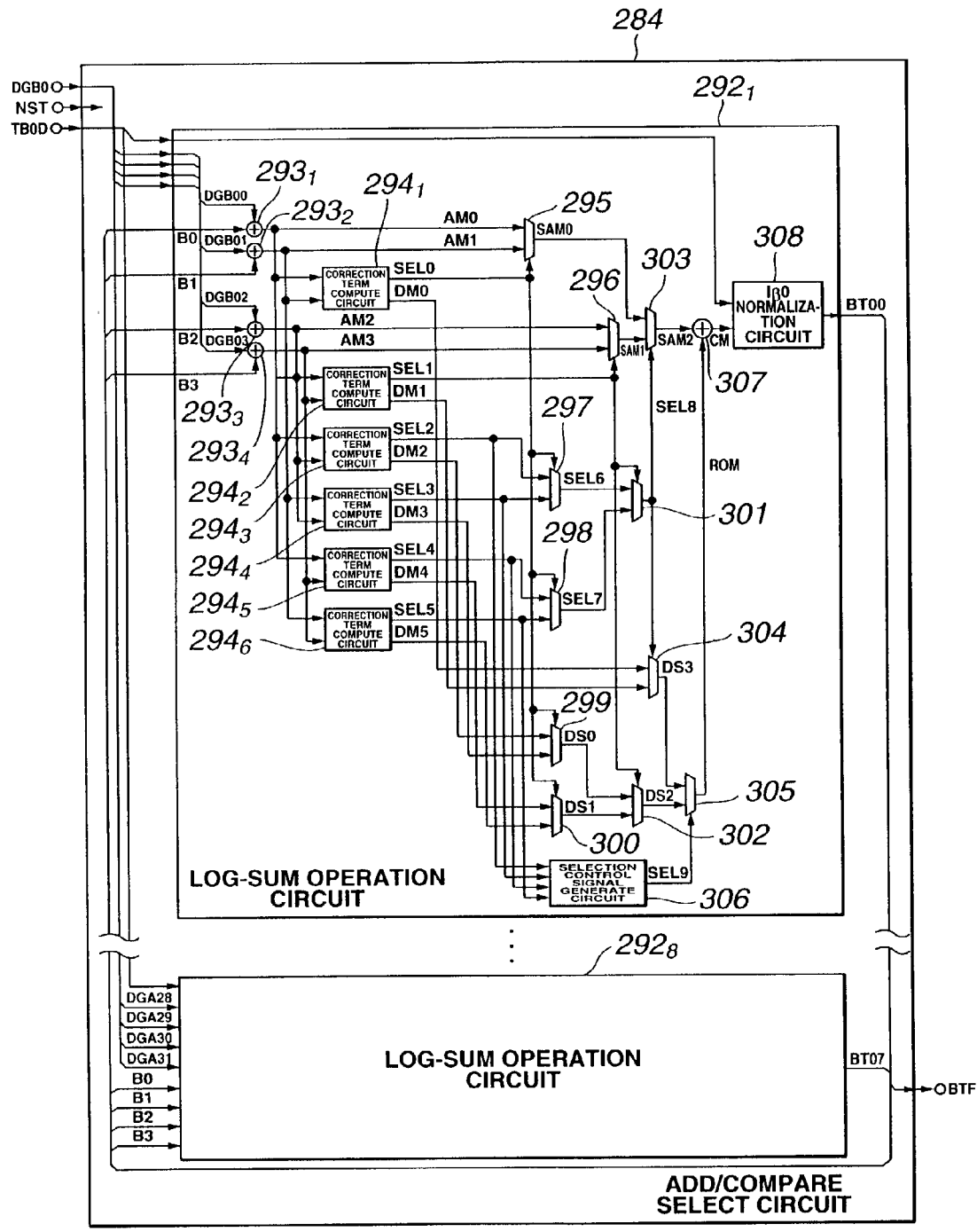
FIG. 44 is a block diagram of the add/compare selection circuit included in the Iβ computation circuit, explaining how the add/compare circuit processes a code whose four paths run from each state in the trellis to states at a next time.

More particularly, similarly to the aforementioned add/compare selection circuit 242, the add/compare selection circuit 284 includes, as shown in FIG. 44, a maximum number of log-sum computation circuits 292$_n$, the maximum number corresponding to the number of states of a to-be-decoded one of codes whose four paths or eight paths (which depends upon a code to be decoded) run from each state in the trellis to states at a next time. It is assumed herein that the add/compare selection circuit 284 is destined to decode a code having a maximum of eight states and includes eight log-sum operation circuits 292$_1$, ..., 292$_8$.

Similarly to the log-sum operation circuits 286$_1$, 286$_2$, 286$_3$, ..., 286$_{16}$ in the aforementioned add/compare selection circuit 283, each of these log-sum operation circuits 292$_1$, ..., 292$_8$ is supplied, based on a transition in the trellis, with a log likelihood Iγ of a branch corresponding to an output pattern in the trellis and a log likelihood Iβ0 having existed one time before in each state. That is, each of the log-sum operation circuits 292$_1$, ..., 292$_8$ is supplied with a one of the log likelihood DGB0, equivalent to the log likelihood Iγ of a branch corresponding to an output pattern in the trellis, and a one of the computed log likelihood BTF having existed one time before, equivalent to the log likelihood Iβ0 in each state. Then, each of the log-sum operation circuits 292$_1$, ..., 292$_8$ determines, as the log likelihood BTF, the log likelihood Iβ0 in each state at a next time. The distribution of the log likelihood BTF for each of the log-sum operation circuits 292$_1$, ..., 292$_8$ depends upon the configuration of a code to be decoded. The log likelihood distribution is determined herein by a selector (not shown) or the like on the basis of the control signal NST. The distribution of the log likelihood BTF will be described in detail later.

More specifically, the log-sum operation circuit 292$_1$ includes five adders 293$_1$, 293$_2$, 293$_3$ 293$_4$ and 307, six correction term computation circuits 294$_1$, 294$_2$, 294$_3$ 294$_4$, 294$_5$ and 294$_6$ to compute the value of a correction term in the log-sum operation, eleven selectors 295, 296, 297, 298, 299, 300, 301, 302, 303, 304 and 305, a selection control signal generation circuit 306 to generate a control signal for controlling the selecting operation of the selector 305, and an Iβ0 normalization circuit 308.

The above adder 293$_1$ is supplied with a log likelihood DGB00 of the log likelihood DGB0 and also with a one (taken as B0) of the log likelihood BTF computed one time before, corresponding to a code to be decoded, to add these log likelihood DGB00 and B0. The adder 293$_1$ supplies data AM0 indicating the sum of the log likelihood Iβ0 and Iγ obtained via the computation to the correction term computation circuits $294_1$, $294_3$ and $294_5$ and selector 295.

The adder $293_2$ is supplied with a log likelihood DGB01 of the log likelihood DGB0 and also with a one (taken as B1) of the log likelihood BTF computed one time before, corresponding to a code to be decoded, to add these log likelihood DGB01 and B1. The adder $293_2$ supplies data AM1 indicating the sum Iβ0+Iγ obtained via the computation to the correction term computation circuits $294_1$, $294_4$ and $294_6$ and selector 295.

The adder $293_3$ is supplied with a log likelihood DGB02 of the log likelihood DGB0 and also with a one (taken as B2) of the log likelihood BTF computed one time before, corresponding to a code to be decoded, to add these log likelihood DGB02 and B2. The adder $293_3$ supplies data AM2 indicating the sum Iβ0+Iγ obtained via the computation to the correction term computation circuits $294_2$, $294_3$ and $294_4$ and selector 296.

The adder $293_4$ is supplied with a log likelihood DGB03 of the log likelihood DGB0 and also with a one (taken as B3) of the log likelihood BTF computed one time before, corresponding to a code to be decoded, to add these log likelihood DGB03 and B3. The adder $293_4$ supplies data AM3 indicating the sum Iβ0+Iγ obtained via the computation to the correction term computation circuits $294_2$, $294_5$ and $294_6$ and selector 296.

The correction term computation circuit $294_1$ is constructed similarly to the aforementioned correction term computation circuit 247 shown in FIG. 39, and so it will not be described in detail. It is supplied with data AM0 from the adder $293_1$ and data AM1 from the adder $293_2$ to compute data DM0 indicating the value of a correction term. At this time, similarly to the correction term computation circuit 247, the correction term computation circuit $294_1$ does not compute the absolute value of a difference between the two input data and then determine the value of the correction term but computes values of a plurality of correction terms and then selects an appropriate one of them. Also, the correction term computation circuit $294_1$ computes a difference between MSB of lower bits of the data AM0 and AM1 supplied from the adder $293_1$ and $293_2$, respectively, to which "1" or "0" is added, and compares in size the data AM0 and AM1 at a high speed. The correction term computation circuit $294_1$ supplies data the thus computed data DM0 to the selector 304. Also, the correction term computation circuit $294_1$ generates a control signal SEL0 for controlling the selecting operation of the selectors 295, 297, 298, 299 and 300.

The correction term computation circuit $294_2$ is constructed similarly to the aforementioned correction term computation circuit 247 shown in FIG. 39, and so it will not be described in detail. It is supplied with data AM2 from the adder $293_3$ and data AM3 from the adder $293_4$ to compute data DM1 indicating the value of a correction term. At this time, similarly to the correction term computation circuit 247, the correction term computation circuit $294_2$ does not compute the absolute value of a difference between the two input data and then determine the value of the correction term but computes values of a plurality of correction terms and then selects an appropriate one of them. Also, the correction term computation circuit $294_2$ computes a difference between MSB of lower bits of the data AM2 and AM3 supplied from the adder $293_3$ and $293_4$, respectively, to which "1" or "0" is added, and compares in size the data AM2 and AM3 at a high speed. The correction term computation circuit $294_2$ supplies data the thus computed data DM1 to the selector 304. Also, the correction term computation circuit $294_2$ generates a control signal SEL1 for controlling the selecting operation of the selectors 296, 301 and 302.

The correction term computation circuit $294_3$ is constructed similarly to the aforementioned correction term computation circuit 247 shown in FIG. 39, and so it will not be described in detail. It is supplied with data AM0 from the adder $293_1$ and data AM2 from the adder $293_3$ to compute data DM2 indicating the value of a correction term. At this time, similarly to the correction term computation circuit 247, the correction term computation circuit $294_3$ does not compute the absolute value of a difference between the two input data and then determine the value of the correction term but computes values of a plurality of correction terms and then selects an appropriate one of them. Also, the correction term computation circuit $294_3$ computes a difference between MSB of lower bits of the data AM0 and AM2 supplied from the adder $293_1$ and $293_3$, respectively, to which "1" or "0" is added, and compares in size the data AM0 and AM2 at a high speed. The correction term computation circuit $294_3$ supplies data the thus computed data DM2 to the selector 299. Also, the correction term computation circuit $294_3$ generates a control signal SEL2 which is finally a control signal SEL8 for controlling the selecting operation of the selectors 303 and 304, and supplies the control signal SEL2 to the selector 297 and selection signal generation circuit 306.

The correction term computation circuit $294_4$ is constructed similarly to the aforementioned correction term computation circuit 247 shown in FIG. 39, and so it will not be described in detail. It is supplied with data AM1 from the adder $293_2$ and data AM2 from the adder $293_3$ to compute data DM3 indicating the value of a correction term. At this time, similarly to the correction term computation circuit 247, the correction term computation circuit $294_4$ does not compute the absolute value of a difference between the two input data and then determine the value of the correction term but computes values of a plurality of correction terms and then selects an appropriate one of them. Also, the correction term computation circuit $294_4$ computes a difference between MSB of lower bits of the data AM1 and AM2 supplied from the adder $293_2$ and $293_3$, respectively, to which "1" or "0" is added, and compares in size the data AM1 and AM2 at a high speed. The correction term computation circuit $294_4$ supplies data the thus computed data DM3 to the selector 299. Also, the correction term computation circuit $294_4$ generates a control signal SEL3 which is finally a control signal SEL8 for controlling the selecting operation of the selectors 303 and 304, and supplies the control signal SEL3 to the selector 297 and selection signal generation circuit 306.

The correction term computation circuit $294_5$ is constructed similarly to the aforementioned correction term computation circuit 247 shown in FIG. 39, and so it will not be described in detail. It is supplied with data AM0 from the adder $293_1$ and data AM3 from the adder $293_4$ to compute data DM4 indicating the value of a correction term. At this time, similarly to the correction term computation circuit 247, the correction term computation circuit $294_5$ does not compute the absolute value of a difference between the two input data and then determine the value of the correction term but computes values of a plurality of correction terms and then selects an appropriate one of them. Also, the correction term computation circuit $294_5$ computes a difference between MSB of lower bits of the data AM0 and AM3 supplied from the adder $293_1$ and $293_4$, respectively, to which "1" or "0" is added, and compares in size the data AM0 and AM3 at a high speed. The correction term computation circuit $294_5$ supplies data the thus computed data DM4 to the selector 300. Also, the correction term computation circuit $294_5$ generates a control signal SEL4 which is finally a control signal SEL8 for controlling the selecting operation of the selectors 303 and 304, and supplies the control signal SEL4 to the selector 298 and selection signal generation circuit 306.

The correction term computation circuit $294_6$ is constructed similarly to the aforementioned correction term computation circuit 247 shown in FIG. 39, and so it will not be described in detail. It is supplied with data AM1 from the adder $293_2$ and data AM3 from the adder $293_4$ to compute data DM5 indicating the value of a correction term. At this time, similarly to the correction term computation circuit 247, the correction term computation circuit $294_6$ does not compute the absolute value of a difference between the two input data and then determine the value of the correction term but computes values of a plurality of correction terms and then selects an appropriate one of them. Also, the correction term computation circuit $294_6$ computes a difference between MSB of lower bits of the data AM1 and AM3 supplied from the adder $293_2$ and $293_4$, respectively, to which "1" or "0" is added, and compares in size the data AM1 and AM3 at a high speed. The correction term computation circuit $294_6$ supplies data the thus computed data DM5 to the selector 300. Also, the correction term computation circuit $294_6$ generates a control signal SEL5 which is finally a control signal SEL8 for controlling the selecting operation of the selectors 303 and 304, and supplies the control signal SEL5 to the selector 298 and selection signal generation circuit 306.

The selector 295 selects, based on the control signal SEL0 supplied from the correction term computation circuit $294_1$, the data AM0 or AM1, whichever is smaller in value, and supplies data SAM0 obtained via the selection to the selector 303.

The selector 296 selects, based on the control signal SEL1 supplied from the correction term computation circuit $294_2$, the data AM2 or AM3, whichever is smaller in value, and supplies data SAM1 obtained via the selection to the selector 303.

Based on the control signal SEL0 supplied from the correction term computation circuit $294_1$, the selector 297 selects either control signal SEL2 or SEL3. More specifically, when the data AM0 is larger in value than the data AM1, the selector 297 selects the control signal SEL3, and supplies a control signal SEL6 obtained via the selection to the selector 301.

The selector 298 selects, based on the control signal SEL0 supplied from the correction term computation circuit $294_1$, either control signal SEL4 or SEL5. More specifically, when the data AM0 is larger in value than the data AM1, the selector 298 selects the control signal SEL5, and supplies a control signal SEL7 obtained via the selection to the selector 301.

The selector 299 selects either the data DM2 or DM3 based on the control signal SEL0 supplied from the correction term computation circuit $294_1$. More specifically, when the data AM0 is larger in value than the data AM1, the selector 299 selects the data DM3, and supplies data DS0 obtained via the selection to the selector 302.

The selector 300 selects either the data DM4 or DM5 based on the control signal SEL0 supplied from the correction term computation circuit $294_1$. More specifically, when the data AM0 is larger in value than the data AM1, the selector 300 selects the data DM5, and supplies data DS1 obtained via the selection to the selector 302.

The selector 301 selects either control signal SEL6 or SEL7 based on the control signal SEL1 supplied from the correction term computation circuit $294_2$. More specifically, when the data AM2 is larger in value than the data AM3, the selector 301 selects the control signal SEL7, and supplies a control signal SEL8 obtained via the selection as a control signal for controlling the selecting operation of the selectors 303 and 304.

The selector 302 selects either data DS0 and DS1 based on the control signal SEL1 supplied from the correction term computation circuit $294_2$. More specifically, when the data AM2 is larger in value than the data AM3, the selector 302 selects data DS1, and supplies data DS2 obtained via the selection to the selector 305.

The selector 303 selects, based on the control signal SEL8, either the data SAM0 or SAM1. More specifically, when the control signal SEL8 is the control signal SEL7, the selector 303 selects the data SAM1, and supplies data SAM2 obtained via the selection to the adder 307.

The selector 304 selects, based on the control signal SEL8, either the data DM0 or DM1. More specifically, when the control signal SEL8 is the control signal SEL7, the selector 304 selects the data DM1, and supplies data DS3 obtained via the selection to the selector 305.

The selector 305 selects either the data DS2 or DS3 based on a control signal SEL9 supplied from the selection control signal generation circuit 306, and supplies data RDM obtained via the selection to the adder 307.

The selection control signal generation circuit 306 generates, based on the control signals SEL2, SEL3, SEL4 and SEL5, the control signal SEL9 for controlling the selecting operation of the selector 305. More specifically, the selection control signal generation circuit 306 carries out the logical OR between the logical product or AND of the control signals SEL2, SEL3, SEL4 and SEL5 and NAND of the control signals SEL2, SEL3, SEL4 and SEL5 to generate the control signal SEL9.

The adder 307 adds the data SAM2 supplied from the selector 303 and data RDM supplied from the selector 305 to compute a log likelihood Iβ0, and supplies the thus computed log likelihood Iβ0 as a log likelihood CM to the Iβ0 normalization circuit 308.

Similarly to the aforementioned Iβ0 normalization circuit 291, the Iβ0 normalization circuit 308 makes normalization for correction of uneven mapping of the log likelihood CM supplied from the adder 307. Also, the Iβ0 normalization circuit 308 uses the termination information TB0D to make a terminating operation as well. The Iβ0 normalization circuit 308 clips the normalized log likelihood Iβ0 according to a necessary dynamic range, and supplies it as a log likelihood BT00 to the predetermined log-sum operation circuits $292_1, \ldots, 292_8$. At this time, after being delayed one time by a register (not shown), the log likelihood BT00 is supplied to the predetermined log-sum circuits $292_1, \ldots, 292_8$.

The above log-sum operation circuit $292_1$ determines and outputs the log likelihood BT00. That is, the log-sum operation circuit $292_1$ supplies the thus obtained log likelihood BT00 to predetermined log-sum circuits $292_1, \ldots, 292_8$ for computation of a log likelihood Iβ0 at a next time, while outputting data BT00 to outside.

At this time, the log-sum operation circuit $292_1$ make comparison in likelihood size among all combinations of data corresponding to two paths selected from the data AM0, AM1, AM2 and AM3 indicating likelihood corresponding to four sets of paths obtained from tying of four paths or eight paths (which depends upon a code to be decoded) arriving at each state to select, from these data AM0, AM1, AM2 and AM3, ones corresponding to more than at least two paths whose likelihood is high and select, from data corresponding to these paths, a one corresponding to a most likely path whose likelihood is the highest. More particularly, the log-sum operation circuit $292_1$ selects data corresponding to the most likely path by making comparison in value among the data AM0, AM1, AM2 and AM3 through a so-called tournament among the data.

The log-sum operation circuit $292_8$ is constructed similarly to the above log-sum operation circuit $292_1$, and so will not be described in detail. This log-sum operation circuit $256_8$ is supplied with DGB28, DGB29, DGB30 and DGB31 of the log likelihood DGB0 and a one of the log likelihood BTF computed one time before, equivalent to a code to be decoded, as log likelihood B0, B1, B2 and B3. It uses these log likelihood DGB28, DGB29, DGB30 and DGB31, B0, B1, B2 and B3 to compute a log likelihood Iβ0, and supplies it as a log likelihood BT07 to the predetermined log-sum operation circuits $292_1, \ldots, 292_8$, while outputting the data BT07.

The above add/compare selection circuit 284 computes a log likelihood Iβ0 of a code whose four paths or eight paths (which depends upon a code to be decoded) run from each state in the trellis to states at a next time. The add/compare selection circuit 284 ties data BT00, . . . , BT07 determined each of the log-sum operation circuits $292_1, \ldots, 292_8$, and supplies them as data BTF to the selector 285. Note that similarly to the aforementioned add/compare selection circuit 242, the add/compare selection circuit 284 is provided to determine a log likelihood Iβ0 of a code whose four paths run from each state in the trellis to states at a next time. However, this add/compare selection circuit 284 can also determine the log likelihood Iβ0 of a code whose eight paths run so as having previously been described. This will further be described in Subsections 5.5.3 and 5.5.5.

The selector 285 selects, based on the number-of-input-bits information IN, either the log likelihood BTT indicating the log likelihood Iβ0 supplied from the add/compare selection circuit 283 or the log likelihood BTF indicating the log likelihood Iβ0 supplied from the add/compare selection circuit 284. More specifically, the selector 285 selects the log likelihood BTT when a code from the element encoder in the encoder 1 is a one whose parallel paths do not exist in the trellis and two paths run from each state to states at a next time, and the log likelihood BTF when the code from the element encoder in the encoder 1 is a one whose parallel paths do not exist in the trellis and four paths run to states at a next time. Note that the number-of-input-bits information IN is used herein as a control signal to control the selecting operation of the selector 285 but actually the selector 285 is supplied with a control signal defined by the configuration of a code to be decoder.

The above Iβ0-computing add/compare selection circuit 281 computes the log likelihood Iβ0 and outputs it as log likelihood B0. The log likelihood B0 is supplied to the Iβ storage circuit 160.

On the other hand, the Iβ1-computing add/compare selection circuit 282 is provided to compute a log likelihood Iβ1. This Iβ1-computing add/compare selection circuit 282 is constructed similarly to the aforementioned Iβ0-computing add/compare selection circuit 281, and so it will not be described in detail. This selection circuit 282 is supplied with a log likelihood DGB1 and termination information TB1D instead of the log likelihood DGB0 and termination information TB0D to compute a log likelihood Iβ1 and outputs it as a log likelihood B1 to the Iβ storage circuit 160.

The above Iβ computation circuit 159 compute two sequences of log likelihood Iβ0 and Iβ1 in parallel with each other, and supplies the Iβ storage circuit 160 with the thus computed log likelihood Iβ0 and Iβ1 as likelihood B0 and B1, respectively.

The Iβ storage circuit 160 includes for example a plurality of RAMs, control circuit and a selection circuit (not shown). The Iβ storage circuit 160 stores the log likelihood B0 and B1 supplied from the Iβ computation circuit 159. And, the Iβ storage circuit 160 is controlled by the internal control circuit to select a predetermined one of the thus stored log likelihood B0 and B1 and supplies it as a log likelihood BT for use to compute log soft-output Iλ to the soft-output computation circuit 161. Note that as mentioned above, the element decoder 50 adopts the memory management method disclosed in the International Publication No. WO99/62183 for a memory management in the Iβ storage circuit 160 during the sliding windowing, to thereby making memory management of the aforementioned received data and delaying-use data storage circuit 155 as well as of the Iβ storage circuit 160. Thus, the log soft-output Iλ can finally be determined in the due time sequence.

The soft-output computation circuit 161 uses data AGD supplied from the Iα computation circuit 158 and log likelihood BT supplied from the Iβ storage circuit 160 to compute log soft-output Iλ. More particularly, according to the notation set forth in the beginning of Section 2, the soft-output computation circuit 161 uses the log likelihood Iγ, Iα and Iβ to make a computation as given by the following expression (55) to provide the log soft-output Iλ at each time t. Note that the operator "#Σ" in the expression (55) indicates a cumulative addition of the log-sum operation denoted by the aforementioned operator "#".

$$I\lambda_t = \#\sum_{\substack{m',m \\ i(m',m)=1}} (I\alpha_{t-1}(m') + I\gamma_t(m',m) + I\beta_t(m)) - \qquad (55)$$

$$\#\sum_{\substack{m',m \\ i(m',m)=0}} (I\alpha_{t-1}(m') + I\gamma_t(m',m) + I\beta_t(m))$$

The soft-output computation circuit 161 can also compute log soft-output Iλ symbol by symbol orbit by bit. Based on an output data selection control signal CITM supplied from outside, a priori probability information type information CAPP supplied from the control circuit 60, number-of-input-bits information IN, number-of-memories information MN and branch input/output information BIO supplied from the code information generation circuit 151, the soft-output computation circuit 161 computes log soft-output Iλ corresponding to a posteriori probability information for information symbols or information bits or log soft-output Iλ corresponding to a posteriori probability information for code symbols or code bits. The soft-output computation circuit 161 supplies the log soft-output Iλ computed symbol by symbol or bit by bit as log soft-output SLM or BLM to the extrinsic information computation circuit 163, amplitude adjusting/clipping circuit 164 and hard decision circuit 165.

Figure 45:
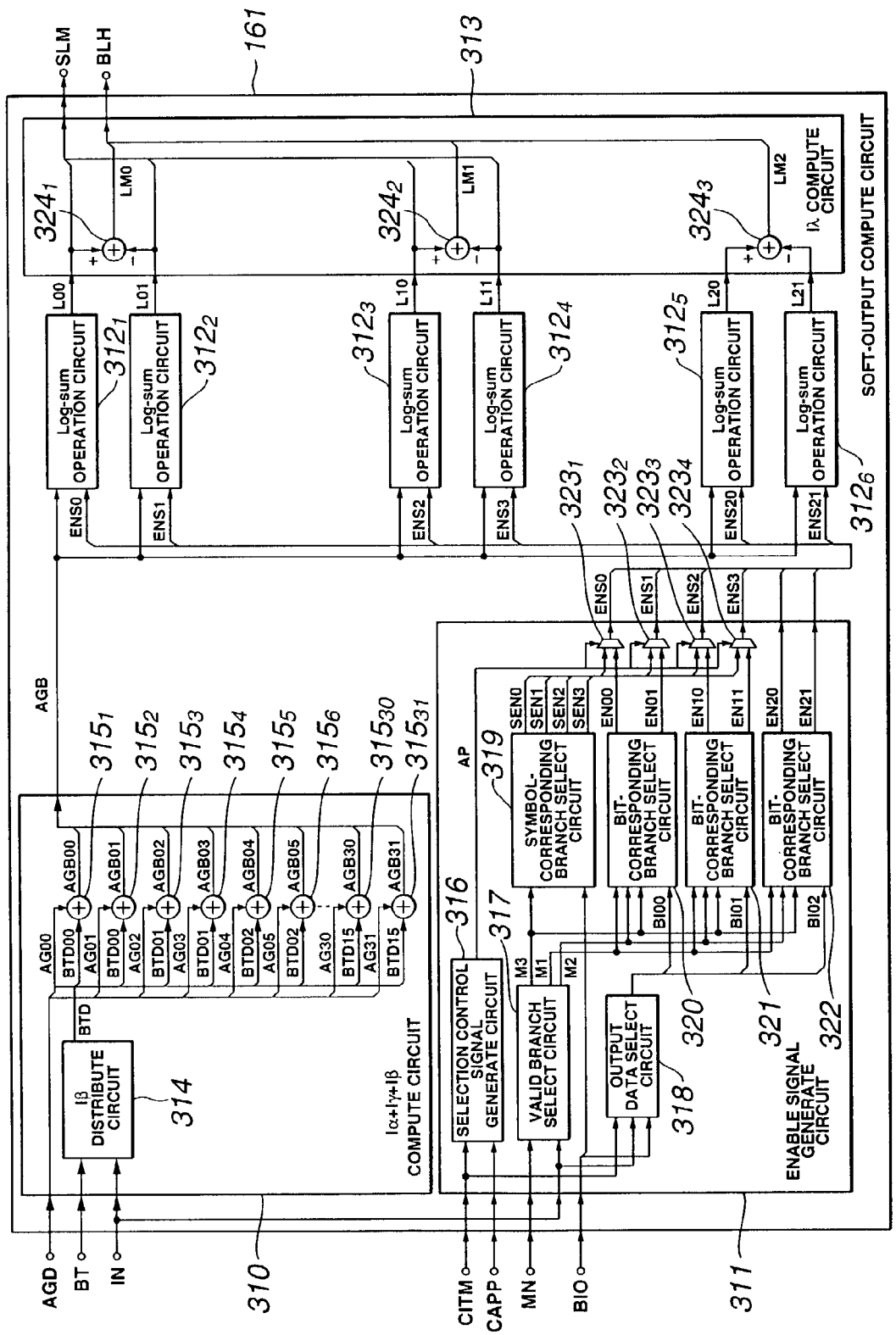
FIG. 45 is a block diagram of a soft-output computation circuit included in the soft-output decoding circuit.

More particularly, the soft-output computation circuit 161 can be implemented as a one including, as shown in FIG. 45 for example, an Iα+Iγ+Iβ computation circuit 310 to compute the sum of log likelihood Iα, Iγ and Iβ, an enable signal generation circuit 311 to generate an enable signal, six (as example herein) log-sum operation circuits $312_1$, $312_2$, $312_3$, $312_4$, $312_5$ and $312_6$ and an Iλ computation circuit 313 to compute log soft-output Iλ.

The Iα+Iγ+Iβ computation circuit 310 includes an Iβ distribution circuit 314 to distribute a log likelihood Iβ and 32 (an example herein) adders $315_1$, $315_2$, $315_3$ $315_4$, $315_5$, $315_6$, $315_{31}$, ..., $315_{32}$, the number "32" corresponding to a maximum one of the number of states of a code to be decoded.

The Iβ distribution circuit 314 distributes the log likelihood BT supplied from the Iβ storage circuit 160 correspondingly to the configuration of a code to be decoded. That is, the Iβ distribution circuit 314 distributes the log likelihood BT to correspond to the trellis corresponding to the code configuration. At this time, the Iβ distribution circuit 314 151 supplies the log likelihood BT based on the number-of-input-bits information IN supplied from the code information generation circuit. This circuit 314 supplies a log likelihood Iβ obtained via the distribution to the adders $315_1$, $315_2$, $315_3$ $315_4$, $315_5$, $315_6$, ..., $315_{31}$ and $315_{32}$. That is, Iβ distribution circuit 314 supplies the log likelihood Iβ for use to compute log soft-output Iλ as a log likelihood BTD to the adders $315_1$, $315_2$, $315_3$ $315_4$, $315_5$, $315_6$, ..., $315_{31}$ and $315_{32}$.

The adder $315_1$ adds together the AG00 of the data AGD indicating the sum of the log likelihood Iα and Iγ supplied from the Iα computation circuit 158 and BTD00 of the log likelihood BTD supplied from the Iβ distribution circuit 314. The adder $315_1$ outputs the sum of the likelihood Iα, Iγ and Iβ, obtained via the addition, as data AGB00.

The adder $315_2$ adds together AG01 of the data AGD supplied from the Iα computation circuit 158 and BTD00 of the log likelihood BTD supplied from the Iβ distribution circuit 314. The adder $315_2$ outputs the sum of the likelihood Iα, Iα and Iβ, obtained via the addition, as data AGB01.

The adder $315_3$ adds together AG02 of the data AGD supplied from the Iα computation circuit 158 and BTD01 of the log likelihood BTD supplied from the Iβ distribution circuit 314. The adder $315_3$ outputs the sum of the likelihood Iα, Iγ and Iβ, obtained via the addition, as data AGB02.

The adder $315_4$ adds together AG03 of the data AGD supplied from the Iα computation circuit 158 and BTD01 of the log likelihood BTD supplied from the Iβ distribution circuit 314. The adder $315_4$ outputs the sum of the likelihood Iα, Iγ and Iβ, obtained via the addition, as data AGB03.

The adder $315_5$ adds together AG04 of the data AGD supplied from the Iα computation circuit 158 and BTD02 of the log likelihood BTD supplied from the Iβ distribution circuit 314. The adder $315_5$ outputs the sum of the likelihood Iα, Iγ and Iβ, obtained via the addition, as data AGB04.

The adder $315_6$ adds together AG05 of the data AGD supplied from the Iα computation circuit 158 and BTD02 of the log likelihood BTD supplied from the Iβ distribution circuit 314. The adder $315_6$ outputs the sum of the likelihood Iα, Iγ and Iβ, obtained via the addition, as data AGB05.

The adder $315_{31}$ adds together AG30 of the data AGD supplied from the Iα computation circuit 158 and BTD15 of the log likelihood BTD supplied from the Iβ distribution circuit 314. The adder $315_{31}$ outputs the sum of the likelihood Iα, Iγ and Iβ, obtained via the addition, as data AGB30.

The adder $315_{32}$ adds together AG31 of the data AGD supplied from the Iα computation circuit 158 and BTD15 of the log likelihood BTD supplied from the Iβ distribution circuit 314. The adder $315_{32}$ outputs the sum of the likelihood Iα, Iγ and Iβ, obtained via the addition, as data AGB31.

The Iα+Iγ+Iβ computation circuit 310 computes the sum of the likelihood Iα, Iγ and Iβ and ties together the thus computed data AGB00, AGB01, AGB02, AGB03, AGB04, AGB05, ..., AGB30 and AGB31, and supplies them as data AGB to the log-sum operation circuits $312_1$, $312_2$, $312_3$, $312_4$, $312_5$, ..., $312_6$.

The enable signal generation circuit 311 includes a selection control signal generation circuit 316 to generate a control signal for controlling the selecting operation of the selectors $323_1$, $323_2$, $323_3$ and $323_4$, a valid branch selection circuit 317 to select a branch to be selected by the symbol-corresponding branch selection circuit 319 and bit-corresponding branch selection circuits 320, 321 and 322, an output data selection circuit 318 to select branch input/output information BIO to which reference should be made during computation of the log soft-output Iλ, a symbol-corresponding branch selection circuit 319 to select, during symbol-by-symbol computation of the log soft-output Iλ, branches corresponding to the symbols, the bit-corresponding branch selection circuits 320, 321 and 322 to select, during bit-by-bit computation of the log soft-output Iλ, branches corresponding to the bits, and selectors $323_1$, $323_2$, $323_3$ and $323_4$.

Based on the output data selection control signal CITM supplied from outside and a priori probability information type information CAPP supplied from the control circuit 60, the selection control signal generation circuit 316 generates a control signal AP for controlling the selecting operation of the selectors $323_1$, $323_2$, $323_3$ and $323_4$.

The valid branch selection circuit 317 generates, based on the number-of-input-bits information IN and number-of-memories information MN supplied from the code information generation circuit 151, generates control signals M1, M2 and M3 indicating whether the branch input/output information BIO supplied to the symbol-corresponding branch selection circuit 319 and bit-corresponding branch selection circuits 320, 321 and 322, respectively, are valid or not. That is, the valid branch selection circuit 317 generates the control signals M1, M2 and M3 for selecting branches to be selected by the symbol-corresponding branch selection circuit 319 and bit-corresponding branch selection circuits 320, 321 and 322, respectively. The valid branch selection circuit 317 supplies the thus generated control signals M1 and M2 to the bit-corresponding branch selection circuits 320, 321 and 322, and the control signal M3 to the symbol-corresponding branch selection circuit 319 and bit-corresponding branch selection circuits 320, 321 and 322.

Based on the output data selection control signal CITM supplied from outside and number-of-input-bits information IN supplied from the code information generation circuit 151, the output data selection circuit 318 selects ones of the branch input/output information BIO supplied from the code information generation circuit 151, corresponding to the configuration of a code to be decoded. The output data selection circuit 318 supplies the thus selected branch input/output information BIO0 to the bit-corresponding branch selection circuit 320, the selected branch input/output information BIO1 to the bit-corresponding branch selection circuit 321, and the selected branch input/output information BIO2 to the bit-corresponding branch selection circuit 322.

The symbol-corresponding branch selection circuit 319 is provided to compute the log soft-output Iλ symbol by symbol. The symbol-corresponding branch selection circuit 319 uses the branch input/output information BIO supplied from the code information generation circuit 151 to select branches corresponding to the branches. At this time, this circuit 319 selects a branch based on the control signal M3 supplied from the valid branch selection circuit 317. The symbol-corresponding branch selection circuit 319 generates enable signals SEN0, SEN1, SEN2 and SEN3 indicating whether the input corresponding to the selected branches is "0" or "1", and supplies the enable signals SEN0, SEN1, SEN2 and SEN3 to the selector $323_1$, $323_2$, $323_3$ and $323_4$, respectively.

The bit-corresponding branch selection circuit 320 is provided to compute the log soft-output Iλ bit by bit. The bit-corresponding branch selection circuit 320 uses the branch input/output information BIO0 supplied from the output data selection circuit 318 to select branches corresponding to the bits. At this time, this circuit 320 selects branches based on the control signals M1, M2 and M3 supplied from the valid branch selection circuit 317. The bit-corresponding branch selection circuit 320 generates enable signals EN00 and EN01 indicating whether the input corresponding to the selected branches is "0" or "1", and supplies the enable signals EN00 and EN01 to the selector $323_1$ and $323_2$, respectively.

Similarly to the above bit-corresponding branch selection circuit 320, the bit-corresponding branch selection circuit 321 is provided to compute the log soft-output Iλ bit by bit. The bit-corresponding branch selection circuit 321 uses the branch input/output information BIO1 supplied from the output data selection circuit 318 to select branches corresponding to the bits. At this time, this circuit 321 selects branches based on the control signals M1, M2 and M3 supplied from the valid branch selection circuit 317. The bit-corresponding branch selection circuit 321 generates enable signals EN10 and EN11 indicating whether the input corresponding to the selected branches is "0" or "1", and supplies the enable signals EN10 and EN11 to the selector $323_3$ and $323_4$, respectively.

Similarly to the above bit-corresponding branch selection circuit 320, the bit-corresponding branch selection circuit 322 is provided to compute the log soft-output Iλ bit by bit. The bit-corresponding branch selection circuit 322 uses the branch input/output information BIO2 supplied from the output data selection circuit 318 to select branches corresponding to the bits. At this time, this circuit 322 selects branches based on the control signals M1, M2 and M3 supplied from the valid branch selection circuit 317. The bit-corresponding branch selection circuit 322 generates enable signals EN20 and EN21 indicating whether the input corresponding to the selected branches is "0" or "1", and supplies the enable signals EN20 and EN21 to the log-sum operation circuits $312_5$ and $312_6$, respectively.

The above selector $323_1$ selects, based on the control signal AP supplied from the selection control signal generation circuit 316, either the enable signal SEN0 supplied from the symbol-corresponding branch selection circuit 319 or EN00 supplied from the bit-corresponding branch selection circuit 320. More particularly, when the output data selection control signal CITM indicates that the control signal AP is to output information for information symbols or information bits and the a priori probability information type information CAPP indicates that the control signal AP is in symbols, the selector $323_1$ selects the enable signal SEN0 supplied from the symbol-corresponding branch selection circuit 319. The selector $323_1$ supplies the thus selected enable signal SEN0 to the log-sum operation circuit $312_1$.

The above selector $323_2$ selects, based on the control signal AP supplied from the selection control signal generation circuit 316, either the enable signal SEN1 supplied from the symbol-corresponding branch selection circuit 319 or EN01 supplied from the bit-corresponding branch selection circuit 320. More particularly, when the output data selection control signal CITM indicates that the control signal AP is to output information for information symbols or information bits and the a priori probability information type information CAPP indicates that the control signal AP is in symbols, the selector $323_2$ selects the enable signal SEN1 supplied from the symbol-corresponding branch selection circuit 319. The selector $323_1$ supplies the thus selected enable signal SEN1 to the log-sum operation circuit $312_2$.

The above selector $323_3$ selects, based on the control signal AP supplied from the selection control signal generation circuit 316, either the enable signal SEN2 supplied from the symbol-corresponding branch selection circuit 319 or SEN10 supplied from the bit-corresponding branch selection circuit 321. More particularly, when the output data selection control signal CITM indicates that the control signal AP is to output information for information symbols or information bits and the a priori probability information type information CAPP indicates that the control signal AP is in symbols, the selector $323_3$ selects the enable signal SEN2 supplied from the symbol-corresponding branch selection circuit 319. The selector $323_3$ supplies the thus selected enable signal SEN2 to the log-sum operation circuit $312_3$.

The above selector $323_4$ selects, based on the control signal AP supplied from the selection control signal generation circuit 316, either the enable signal SEN3 supplied from the symbol-corresponding branch selection circuit 319 or EN11 supplied from the bit-corresponding branch selection circuit 321. More particularly, when the output data selection control signal CITM indicates that the control signal AP is to output information for information symbols or information bits and the a priori probability information type information CAPP indicates that the control signal AP is in symbols, the selector $323_4$ selects the enable signal SEN3 supplied from the symbol-corresponding branch selection circuit 319. The selector $323_4$ supplies the thus selected enable signal SEN3 to the log-sum operation circuit $312_4$.

The above enable signal generation circuit 311 uses the output data selection control signal CITM, a priori probability information type information CAPP, number-of-memories information MN and branch input/output information BIO to generate enable signals ENS0, ENS1, ENS2, ENS3, EN20 and EN21 corresponding to the selected branches, and supplies them to the log-sum operation circuits $312_1$, $312_2$, $312_3$, $312_4$, $312_5$ and $312_6$.

Figure 46:
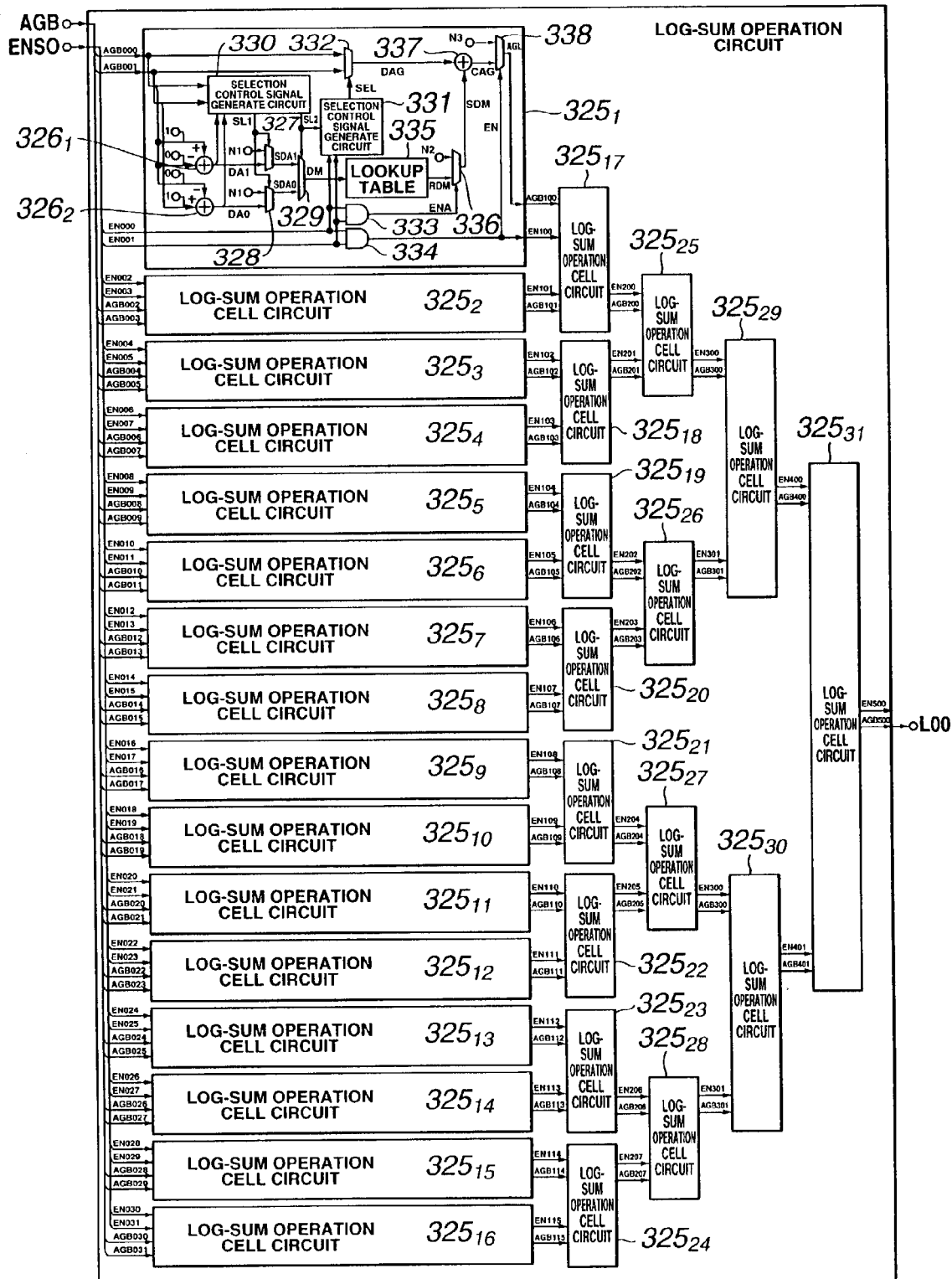
FIG. 46 is a block diagram of a log-sum operation circuit included in the soft-output computation circuit.

As shown in FIG. 46, the log-sum operation circuit $312_1$ includes the number M×2−1 (where M is a maximum number of states of a code to be decoded) of log-sum operation cell circuits $325_n$. The log-sum operation circuit $312_1$ is destined herein to decode a code having a maximum of 16 states and includes 31 log-sum operation cell circuits $325_1, \ldots, 325_{31}$.

The log-sum operation cell circuit $325_1$ includes two differentiators $326_1$ and $326_2$, six selectors 327, 328, 329, 332, 336 and 338, selection control signal generation circuit 330 to generate a control signal for controlling the selecting operation of the selectors 327, 328 and 329, selection control signal generation circuit 331 to generate a control signal for controlling the selecting operation of the selector 332, AND gate 333, OR gate 334, lookup table 335 to store values of a correction term in the log-sum operation as a table, and an adder 337.

The differentiator $326_1$ computes a difference between predetermined ones AGB000 and AGB001 of data AGB supplied from the Iα+Iγ+Iβ computation circuit 310 and corresponding to a code to be decoded. Strictly speaking, on the assumption that each of data AGB000 and AGB001 is of 13 bits for example, the differentiator $326_1$ computes a difference between data AGB000 having "1" added to the MSB of lower six bits thereof and data AGB001 having "0" added to the MSB of lower six bits thereof. The differentiator $326_1$ supplies the thus computed difference DA1 to the selector 327 and selection control signal generation circuit 330.

The differentiator $326_2$ computes a difference between predetermined ones AGB001 and AGB000 of data AGB supplied from the Iα+Iγ+Iβ computation circuit 310 and corresponding to a code to be decoded. Strictly speaking, on the assumption that each of data AGB000 and AGB000 is of 13 bits for example, the differentiator $326_2$ computes a difference between data AGB001 having "1" added to the MSB of lower six bits thereof and data AGB000 having "0" added to the MSB of lower six bits thereof. The differentiator $326_2$ supplies the thus computed difference DA0 to the selector 328 and selection control signal generation circuit 330.

Based on the control signal SL1 supplied from the selection control signal generation circuit 330, the selector 327 selects either the difference DA1 supplied from the differentiator $326_1$ or data having a predetermined value N1. More particularly, since the value of a correction term for the difference DA1 is asymptotic to a predetermined value, the selector 327 selects the data having the predetermined value N1 in case the value of the difference DA1 exceeds the predetermined value N1. The selector 327 supplies data SDA1 obtained via the selection to the selector 329.

The selector 328 selects, based on the control signal SL1 supplied from the selection control signal generation circuit 330, either the difference DA0 supplied from the differentiator $326_2$ or data having a predetermined value N1. More particularly, since the value of a correction term for the difference DA0 is asymptotic to a predetermined value, the selector 328 selects the data having the predetermined value N1 in case the value of the difference DA0 exceeds the predetermined value N1. The selector 328 supplies data SDA0 obtained via the selection to the selector 329.

The selector 329 selects, based on the control signal SL2 supplied from the selection control signal generation circuit 330, either data SDA1 supplied from the selector 327 or data SDA0 supplied from the selector 328. More particularly, the selector 329 selects the data SDA1 supplied from the selector 327 in case the value of the data SGB000 exceeds that of the data AGB001. The selector 329 supplies data DM obtained via the selection to the lookup table 335.

The selection control signal generation circuit 330 generates, based on the data AGB00 and AGB01 and differences DA1 and DA0, a control signal SL1 for controlling the selecting operation of the selectors 327 and 328, and generate a control signal SL2 for controlling the selecting operation of the selector 329. This selection control signal generation circuit 330 supplies the thus generated control signal AL2 to the selection control signal generation circuit 331 as well. At this time, the selection control signal generation circuit 330 generates the control signals SL1 and SL2 indicating a selection-decision statement by separating upper and lower bits of a metric from each other based on the data AGB00 and AGB01 similarly to the selection control signal generation circuit 232. This will further be described later.

Based on EN000 and EN001 of the enable signal ENS0 supplied from the enable signal generation circuit 311, the selection control signal generation circuit 331 generates a control signal SEL for controlling the selecting operation of the selector 332.

The selector 332 selects, based on the control signal SEL supplied from the selection control signal generation circuit 331, either the data AGB00 or AGB001, and supplies data DAG obtained via the selection to the adder 337.

The AND gate 333 carries out the logical AND between the enable signals EN000 and EN001 and supplies the thus computed logical product (AND) ENA as a selection control signal to the selector 336.

The OR gate 334 carries out the logical OR between the enable signals EN000 and EN001, and supplies the thus computed logical sum (OR) as a selection control signal to the selector 338 and as enable signal EN100 to the log-sum operation cell circuit $325_{17}$.

The lookup table 335 stores values of a correction term in the log-sum correction as a table. The lookup table 335 reads, from the table, a value of a correction term corresponding to the value of data DM supplied from the selector 329 and supplies it as data RDM to the selector 336.

The selector 336 selects, based on the logical product or AND ENA supplied from the AND gate 333, either the data RDM supplied from the lookup table 335 or data having a predetermined value N2. More specifically, the selector 336 selects the data RDM when the AND ENA is "1", and supplies data SDM obtained via the selection to the adder 337. Note that the predetermined value N2 is an offset value for addition to unify the positive/negative discriminate sign of data CAG which will be described in detail later. That is, the data DAG, one of the data AGB000 and AGB001, is considered as taking a value over the positive and negative domains, but representation of both positive and negative values will lead to an increased circuit scale. To avoid this, in the log-sum operation cell circuit $325_1$, there is introduced the predetermined value N2 for addition by an adder 337 which will be described in detail later to unify the positive/negative discriminate sign of the data DAG.

The adder 337 adds together the data DAG supplied from the selector 332 and SDM supplied from the selector 336, and supplies data CAG obtained via the computation to the selector 338.

The selector 338 selects, based on the logical sum or OR EN supplied from the OR gate 334, either the data CAG supplied from the adder 337 or data having a predetermined value N3. More specifically, the selector 338 selects the data CAG when the OR EN is "1". The selector 338 supplies data AGL obtained via the selection to the log-sum operation cell circuit $325_{17}$.

The above log-sum operation circuit $325_1$ uses the data AGB000 and AGB001 supplied from the Iα+Iγ+Iβ computation circuit 310 and enable signals EN000 and EN001 supplied from the enable signal generation circuit 311 to make an operation compared to the first contest in a so-called tournament, thereby making log-sum operation in a cumulative addition in a log-sum operation effected in computing a log soft-output Iλ as will be described in detail later. The log-sum operation circuit $325_1$ supplies the above computed data AGL as data AGB100 to the log-sum operation cell circuit $325_{17}$ which makes an operation compared to the second contest in the tournament, and also the enable signal EN100 to the log-sum operation cell circuit $325_{17}$.

The log-sum operation circuit $325_2$ is constructed similarly to the aforementioned log-sum operation circuit $325_1$, and so it will not be described in detail. The log-sum operation circuit $325_2$ uses the data AGB002 and AGB003 supplied from the Iα+Iγ+Iβ computation circuit 310 and enable signals EN002 and EN003 supplied from the enable signal generation circuit 311 to make an operation compared to the first contest in a tournament, thereby making log-sum operation in a cumulative addition in the log-sum operation.

The log-sum operation circuit $325_2$ supplies the above computed data AGL as data AGB101 to the log-sum operation cell circuit $325_{17}$, and also the enable signal EN101 to the log-sum operation cell circuit $325_{17}$.

The log-sum operation circuit $325_3$ is constructed similarly to the aforementioned log-sum operation circuit $325_1$, and so it will not be described in detail. The log-sum operation circuit $325_3$ uses the data AGB004 and AGB005 supplied from the Iα+Iγ+Iβ computation circuit 310 and enable signals EN004 and EN005 supplied from the enable signal generation circuit 311 to make an operation compared to the first contest in a tournament, thereby making log-sum operation in a cumulative addition in the log-sum operation. The log-sum operation circuit $325_3$ supplies the above computed data AGL as data AGB102 to the log-sum operation cell circuit $325_{18}$ which makes an operation compared to the second contest in the tournament, and also the enable signal EN102 to the log-sum operation cell circuit $325_{18}$.

The log-sum operation circuit $325_4$ is constructed similarly to the aforementioned log-sum operation circuit $325_1$, and so it will not be described in detail. The log-sum operation circuit $325_4$ uses the data AGB006 and AGB007 supplied from the Iα+Iγ+Iβ computation circuit 310 and enable signals EN006 and EN007 supplied from the enable signal generation circuit 311 to make an operation compared to the first contest in a tournament, thereby making log-sum operation in a cumulative addition in the log-sum operation. The log-sum operation circuit $325_4$ supplies the above computed data AGL as data AGB103 to the log-sum operation cell circuit $325_{18}$, and also the enable signal EN103 to the log-sum operation cell circuit $325_{18}$.

The log-sum operation circuit $325_5$ is constructed similarly to the aforementioned log-sum operation circuit $325_1$, and so it will not be described in detail. The log-sum operation circuit $325_5$ uses the data AGB008 and AGB009 supplied from the Iα+Iγ+Iβ computation circuit 310 and enable signals EN008 and EN009 supplied from the enable signal generation circuit 311 to make an operation compared to the first contest in a tournament, thereby making log-sum operation in a cumulative addition in the log-sum operation. The log-sum operation circuit $325_5$ supplies the above computed data AGL as data AGB104 to the log-sum operation cell circuit $325_{19}$ which makes an operation compared to the second contest in the tournament, and also the enable signal EN104 to the log-sum operation cell circuit $325_{19}$.

The log-sum operation circuit $325_6$ is constructed similarly to the aforementioned log-sum operation circuit $325_1$, and so it will not be described in detail. The log-sum operation circuit $325_6$ uses the data AGB010 and AGB011 supplied from the Iα+Iγ+Iβ computation circuit 310 and enable signals EN010 and EN011 supplied from the enable signal generation circuit 311 to make an operation compared to the first contest in a tournament, thereby making log-sum operation in a cumulative addition in the log-sum operation. The log-sum operation circuit $325_6$ supplies the above computed data AGL as data AGB105 to the log-sum operation cell circuit $325_{19}$, and also the enable signal EN105 to the log-sum operation cell circuit $325_{19}$.

The log-sum operation circuit $325_7$ is constructed similarly to the aforementioned log-sum operation circuit $325_1$, and so it will not be described in detail. The log-sum operation circuit $325_7$ uses the data AGB012 and AGB013 supplied from the Iα+Iγ+Iβ computation circuit 310 and enable signals EN012 and EN013 supplied from the enable signal generation circuit 311 to make an operation compared to the first contest in a tournament, thereby making log-sum operation in a cumulative addition in the log-sum operation. The log-sum operation circuit $325_7$ supplies the above computed data AGL as data AGB106 to the log-sum operation cell circuit $325_{20}$ which makes an operation compared to the second contest in the tournament, and also the enable signal EN106 to the log-sum operation cell circuit $325_{20}$.

The log-sum operation circuit $325_8$ is constructed similarly to the aforementioned log-sum operation circuit $325_1$, and so it will not be described in detail. The log-sum operation circuit $325_8$ uses the data AGB014 and AGB015 supplied from the Iα+Iγ+Iβ computation circuit 310 and enable signals EN014 and EN015 supplied from the enable signal generation circuit 311 to make an operation compared to the first contest in a tournament, thereby making log-sum operation in a cumulative addition in the log-sum operation. The log-sum operation circuit $325_8$ supplies the above computed data AGL as data AGB107 to the log-sum operation cell circuit $325_{20}$, and also the enable signal EN107 to the log-sum operation cell circuit $325_{20}$.

The log-sum operation circuit $325_9$ is constructed similarly to the aforementioned log-sum operation circuit $325_1$, and so it will not be described in detail. The log-sum operation circuit $325_9$ uses the data AGB016 and AGB017 supplied from the Iα+Iγ+Iβ computation circuit 310 and enable signals EN016 and EN017 supplied from the enable signal generation circuit 311 to make an operation compared to the first contest in a tournament, thereby making log-sum operation in a cumulative addition in the log-sum operation. The log-sum operation circuit $325_9$ supplies the above computed data AGL as data AGB108 to the log-sum operation cell circuit $325_{21}$ which makes an operation compared to the second contest in the tournament, and also the enable signal EN108 to the log-sum operation cell circuit $325_{21}$.

The log-sum operation circuit $325_{10}$ is constructed similarly to the aforementioned log-sum operation circuit $325_1$, and so it will not be described in detail. The log-sum operation circuit $325_{10}$ uses the data AGB018 and AGB019 supplied from the Iα+Iγ+Iβ computation circuit 310 and enable signals EN018 and EN019 supplied from the enable signal generation circuit 311 to make an operation compared to the first contest in a tournament, thereby making log-sum operation in a cumulative addition in the log-sum operation. The log-sum operation circuit $325_{10}$ supplies the above computed data AGL as data AGB109 to the log-sum operation cell circuit $325_{21}$, and also the enable signal EN109 to the log-sum operation cell circuit $325_{21}$.

The log-sum operation circuit $325_{10}$ is constructed similarly to the aforementioned log-sum operation circuit $325_1$, and so it will not be described in detail. The log-sum operation circuit $325_{11}$ uses the data AGB020 and AGB021 supplied from the Iα+Iγ+Iβ computation circuit 310 and enable signals EN020 and EN021 supplied from the enable signal generation circuit 311 to make an operation compared to the first contest in a tournament, thereby making log-sum operation in a cumulative addition in the log-sum operation. The log-sum operation circuit $325_{11}$ supplies the above computed data AGL as data AGB110 to the log-sum operation cell circuit $325_{22}$ which makes an operation compared to the second contest in the tournament, and also the enable signal EN110 to the log-sum operation cell circuit $325_{22}$.

The log-sum operation circuit $325_{12}$ is constructed similarly to the aforementioned log-sum operation circuit $325_1$, and so it will not be described in detail. The log-sum operation circuit $325_{12}$ uses the data AGB022 and AGB023 supplied from the Iα+Iγ+Iβ computation circuit 310 and enable signals EN022 and EN023 supplied from the enable signal generation circuit 311 to make an operation compared to the first contest in a tournament, thereby making log-sum operation in a cumulative addition in the log-sum operation. The log-sum operation circuit $325_{12}$ supplies the above computed data AGL as data AGB111 to the log-sum operation cell circuit $325_{22}$, and also the enable signal EN111 to the log-sum operation cell circuit $325_{22}$.

The log-sum operation circuit $325_{13}$ is constructed similarly to the aforementioned log-sum operation circuit $325_1$, and so it will not be described in detail. The log-sum operation circuit $325_{13}$ uses the data AGB024 and AGB025 supplied from the Iα+Iγ+Iβ computation circuit 310 and enable signals EN024 and EN025 supplied from the enable signal generation circuit 311 to make an operation compared to the first contest in a tournament, thereby making log-sum operation in a cumulative addition in the log-sum operation. The log-sum operation circuit $325_{13}$ supplies the above computed data AGL as data AGB112 to the log-sum operation cell circuit $325_{23}$ which makes an operation compared to the second contest in the tournament, and also the enable signal EN112 to the log-sum operation cell circuit $325_{23}$.

The log-sum operation circuit $325_{14}$ is constructed similarly to the aforementioned log-sum operation circuit $325_1$, and so it will not be described in detail. The log-sum operation circuit $325_{14}$ uses the data AGB026 and AGB027 supplied from the Iα+Iγ+Iβ computation circuit 310 and enable signals EN026 and EN027 supplied from the enable signal generation circuit 311 to make an operation compared to the first contest in a tournament, thereby making log-sum operation in a cumulative addition in the log-sum operation. The log-sum operation circuit $325_{14}$ supplies the above computed data AGL as data AGB113 to the log-sum operation cell circuit $325_{23}$, and also the enable signal EN113 to the log-sum operation cell circuit $325_{23}$.

The log-sum operation circuit $325_{15}$ is constructed similarly to the aforementioned log-sum operation circuit $325_1$, and so it will not be described in detail. The log-sum operation circuit $325_{15}$ uses the data AGB028 and AGB029 supplied from the Iα+Iγ+Iβ computation circuit 310 and enable signals EN028 and EN029 supplied from the enable signal generation circuit 311 to make an operation compared to the first contest in a tournament, thereby making log-sum operation in a cumulative addition in the log-sum operation. The log-sum operation circuit $325_{15}$ supplies the above computed data AGL as data AGB114 to the log-sum operation cell circuit $325_{24}$ which makes an operation compared to the second contest in the tournament, and also the enable signal EN114 to the log-sum operation cell circuit $325_{24}$.

The log-sum operation circuit $325_{16}$ is constructed similarly to the aforementioned log-sum operation circuit $325_1$, and so it will not be described in detail. The log-sum operation circuit $325_{16}$ uses the data AGB030 and AGB031 supplied from the Iα+Iγ+Iβ computation circuit 310 and enable signals EN030 and EN031 supplied from the enable signal generation circuit 311 to make an operation compared to the first contest in a tournament, thereby making log-sum operation in a cumulative addition in the log-sum operation. The log-sum operation circuit $325_{16}$ supplies the above computed data AGL as data AGB115 to the log-sum operation cell circuit $325_{24}$, and also the enable signal EN115 to the log-sum operation cell circuit $325_{24}$.

The log-sum operation circuit $325_{17}$ is constructed similarly to the aforementioned log-sum operation circuit $325_1$, and so it will not be described in detail. The log-sum operation circuit $325_{17}$ uses the data AGB100 and enable signal EN100 supplied from the log-sum operation cell circuit $325_1$ and data AGB101 and enable signal EN101 supplied from the log-sum operation cell circuit $325_2$ to make an operation compared to the second contest in a tournament, thereby making log-sum operation in a cumulative addition in the log-sum operation. The log-sum operation circuit $325_{17}$ supplies the computed data AGL as data AGB200 to the log-sum operation cell circuit $325_{25}$ which makes an operation compared to the third contest in the tournament, and also the enable signal EN200 to the log-sum operation cell circuit $325_{25}$.

The log-sum operation circuit $325_{18}$ is constructed similarly to the aforementioned log-sum operation circuit $325_1$, and so it will not be described in detail. The log-sum operation circuit $325_{18}$ uses the data AGB102 and enable signal EN102 supplied from the log-sum operation cell circuit $325_3$ and data AGB103 and enable signal EN103 supplied from the log-sum operation cell circuit $325_4$ to make an operation compared to the second contest in a tournament, thereby making log-sum operation in a cumulative addition in the log-sum operation. The log-sum operation circuit $325_{18}$ supplies the computed data AGL as data AGB201 to the log-sum operation cell circuit $325_{25}$, and also the enable signal EN201 to the log-sum operation cell circuit $325_{25}$.

The log-sum operation circuit $325_{19}$ is constructed similarly to the aforementioned log-sum operation circuit $325_1$, and so it will not be described in detail. The log-sum operation circuit $325_{19}$ uses the data AGB104 and enable signal EN104 supplied from the log-sum operation cell circuit $325_5$ and data AGB105 and enable signal EN105 supplied from the log-sum operation cell circuit $325_6$ to make an operation compared to the second contest in a tournament, thereby making log-sum operation in a cumulative addition in the log-sum operation. The log-sum operation circuit $325_{19}$ supplies the computed data AGL as data AGB202 to the log-sum operation cell circuit $325_{26}$ which makes an operation compared to the third contest in the tournament, and also the enable signal EN202 to the log-sum operation cell circuit $325_{26}$.

The log-sum operation circuit $325_{20}$ is constructed similarly to the aforementioned log-sum operation circuit $325_1$, and so it will not be described in detail. The log-sum operation circuit $325_{20}$ uses the data AGB106 and enable signal EN106 supplied from the log-sum operation cell circuit $325_7$ and data AGB107 and enable signal EN107 supplied from the log-sum operation cell circuit $325_8$ to make an operation compared to the second contest in a tournament, thereby making log-sum operation in a cumulative addition in the log-sum operation. The log-sum operation circuit $325_{20}$ supplies the computed data AGL as data AGB203 to the log-sum operation cell circuit $325_{26}$, and also the enable signal EN203 to the log-sum operation cell circuit $325_{26}$.

The log-sum operation circuit $325_{21}$ is constructed similarly to the aforementioned log-sum operation circuit $325_1$, and so it will not be described in detail. The log-sum operation circuit $325_{21}$ uses the data AGB108 and enable signal EN108 supplied from the log-sum operation cell circuit $325_9$ and data AGB109 and enable signal EN109 supplied from the log-sum operation cell circuit $325_{10}$ to make an operation compared to the second contest in a tournament, thereby making log-sum operation in a cumulative addition in the log-sum operation. The log-sum operation circuit $325_{21}$ supplies the computed data AGL as data AGB204 to the log-sum operation cell circuit $325_{27}$ which makes an operation compared to the third contest in the tournament, and also the enable signal EN204 to the log-sum operation cell circuit $325_{27}$.

The log-sum operation circuit $325_{22}$ is constructed similarly to the aforementioned log-sum operation circuit $325_1$, and so it will not be described in detail. The log-sum operation circuit $325_{22}$ uses the data AGB110 and enable signal EN110 supplied from the log-sum operation cell circuit $325_{11}$ and data AGB111 and enable signal EN111 supplied from the log-sum operation cell circuit $325_{12}$ to make an operation compared to the second contest in a tournament, thereby making log-sum operation in a cumulative addition in the log-sum operation. The log-sum operation circuit $325_{22}$ supplies the computed data AGL as data AGB205 to the log-sum operation cell circuit $325_{27}$, and also the enable signal EN205 to the log-sum operation cell circuit $325_{27}$.

The log-sum operation circuit $325_{23}$ is constructed similarly to the aforementioned log-sum operation circuit $325_1$, and so it will not be described in detail. The log-sum operation circuit $325_{23}$ uses the data AGB112 and enable signal EN112 supplied from the log-sum operation cell circuit $325_{13}$ and data AGB113 and enable signal EN113 supplied from the log-sum operation cell circuit $325_{14}$ to make an operation compared to the second contest in a tournament, thereby making log-sum operation in a cumulative addition in the log-sum operation. The log-sum operation circuit $325_{23}$ supplies the computed data AGL as data AGB206 to the log-sum operation cell circuit $325_{28}$ which makes an operation compared to the third contest in the tournament, and also the enable signal EN206 to the log-sum operation cell circuit $325_{28}$.

The log-sum operation circuit $325_{24}$ is constructed similarly to the aforementioned log-sum operation circuit $325_1$, and so it will not be described in detail. The log-sum operation circuit $325_{24}$ uses the data AGB114 and enable signal EN114 supplied from the log-sum operation cell circuit $325_{15}$ and data AGB115 and enable signal EN115 supplied from the log-sum operation cell circuit $325_{16}$ to make an operation compared to the second contest in a tournament, thereby making log-sum operation in a cumulative addition in the log-sum operation. The log-sum operation circuit $325_{24}$ supplies the computed data AGL as data AGB207 to the log-sum operation cell circuit $325_{28}$, and also the enable signal EN207 to the log-sum operation cell circuit $325_{28}$.

The log-sum operation circuit $325_{25}$ is constructed similarly to the aforementioned log-sum operation circuit $325_1$, and so it will not be described in detail. The log-sum operation circuit $325_{25}$ uses the data AGB200 and enable signal EN200 supplied from the log-sum operation cell circuit $325_{17}$ and data AGB201 and enable signal EN201 supplied from the log-sum operation cell circuit $325_{18}$ to make an operation compared to the third contest in a tournament, thereby making log-sum operation in a cumulative addition in the log-sum operation. The log-sum operation circuit $325_{25}$ supplies the computed data AGL as data AGB300 to the log-sum operation cell circuit $325_{29}$ which makes an operation compared to the fourth contest in the tournament, and also the enable signal EN300 to the log-sum operation cell circuit $325_{29}$.

The log-sum operation circuit $325_{26}$ is constructed similarly to the aforementioned log-sum operation circuit $325_1$, and so it will not be described in detail. The log-sum operation circuit $325_{26}$ uses the data AGB202 and enable signal EN202 supplied from the log-sum operation cell circuit $325_{19}$ and data AGB203 and enable signal EN203 supplied from the log-sum operation cell circuit $325_{20}$ to make an operation compared to the third contest in a tournament, thereby making log-sum operation in a cumulative addition in the log-sum operation. The log-sum operation circuit $325_{26}$ supplies the computed data AGL as data AGB301 to the log-sum operation cell circuit $325_{29}$, and also the enable signal EN301 to the log-sum operation cell circuit $325_{29}$.

The log-sum operation circuit $325_{27}$ is constructed similarly to the aforementioned log-sum operation circuit $325_1$, and so it will not be described in detail. The log-sum operation circuit $325_{27}$ uses the data AGB204 and enable signal EN204 supplied from the log-sum operation cell circuit $325_{21}$ and data AGB205 and enable signal EN205 supplied from the log-sum operation cell circuit $325_{22}$ to make an operation compared to the third contest in a tournament, thereby making log-sum operation in a cumulative addition in the log-sum operation. The log-sum operation circuit $325_{27}$ supplies the computed data AGL as data AGB302 to the log-sum operation cell circuit $325_{30}$ which makes an operation compared to the fourth contest in the tournament, and also the enable signal EN302 to the log-sum operation cell circuit $325_{30}$.

The log-sum operation circuit $325_{28}$ is constructed similarly to the aforementioned log-sum operation circuit $325_1$, and so it will not be described in detail. The log-sum operation circuit $325_{28}$ uses the data AGB206 and enable signal EN206 supplied from the log-sum operation cell circuit $325_{23}$ and data AGB207 and enable signal EN207 supplied from the log-sum operation cell circuit $325_{24}$ to make an operation compared to the third contest in a tournament, thereby making log-sum operation in a cumulative addition in the log-sum operation. The log-sum operation circuit $325_{28}$ supplies the computed data AGL as data AGB303 to the log-sum operation cell circuit $325_{30}$, and also the enable signal EN303 to the log-sum operation cell circuit $325_{30}$.

The log-sum operation circuit $325_{29}$ is constructed similarly to the aforementioned log-sum operation circuit $325_1$, and so it will not be described in detail. The log-sum operation circuit $325_{29}$ uses the data AGB300 and enable signal EN300 supplied from the log-sum operation cell circuit $325_{25}$ and data AGB301 and enable signal EN301 supplied from the log-sum operation cell circuit $325_{26}$ to make an operation compared to the fourth contest in a tournament, thereby making log-sum operation in a cumulative addition in the log-sum operation. The log-sum operation circuit $325_{29}$ supplies the computed data AGL as data AGB400 to the log-sum operation cell circuit $325_{31}$ which makes an operation compared to the fifth contest in the tournament, and also the enable signal EN400 to the log-sum operation cell circuit $325_{31}$.

The log-sum operation circuit $325_{30}$ is constructed similarly to the aforementioned log-sum operation circuit $325_1$, and so it will not be described in detail. The log-sum operation circuit $325_{30}$ uses the data AGB302 and enable signal EN302 supplied from the log-sum operation cell circuit $325_{27}$ and data AGB303 and enable signal EN303 supplied from the log-sum operation cell circuit $325_{28}$ to make an operation compared to the fourth contest in a tournament, thereby making log-sum operation in a cumulative addition in the log-sum operation. The log-sum operation circuit $325_{30}$ supplies the computed data AGL as data AGB401 to the log-sum operation cell circuit $325_{31}$, and also the enable signal EN401 to the log-sum operation cell circuit $325_{31}$.

The log-sum operation circuit $325_{31}$ is constructed similarly to the aforementioned log-sum operation circuit $325_1$, and so it will not be described in detail. The log-sum operation circuit $325_{31}$ uses the data AGB400 and enable signal EN400 supplied from the log-sum operation cell circuit $325_{29}$ and data AGB401 and enable signal EN401 supplied from the log-sum operation cell circuit $325_{30}$ to make an operation compared to the final contest in a tournament, thereby making log-sum operation in a cumulative addition in the log-sum operation. The log-sum operation circuit $325_{31}$ will not output the computed enable signal EN500 but outputs the computed data AGL as data AGB500. Note that the data AGB500 is supplied as data L00 to the Iλ computation circuit 313.

The above log-sum operation circuit $312_1$ uses the data AGB and enable signal ENS0 to make an operation compared to a tournament based on an enable signal corresponding to each branch of the trellis, thereby making cumulative addition in the log-sum operation in which the branch input in the trellis is "0" for example to compute the data L00.

The log-sum operation circuit $312_2$ is constructed similarly to the log-sum operation circuit $312_1$, and so it will not be described in detail. It uses the data AGB and enable signal ENS1 to make an operation compared to a tournament based on an enable signal corresponding to each branch of the trellis similarly to the log-sum operation circuit $312_1$, thereby making cumulative addition in the log-sum operation in which the branch input in the trellis is "1" for example to compute the data L01. The log-sum operation circuit $312_2$ supplies the computed data L01 to the Iλ computation circuit 313.

Also, the log-sum operation circuit $312_3$ is constructed similarly to the log-sum operation circuit $312_1$, and so it will not be described in detail. It uses the data AGB and enable signal ENS2 to make an operation compared to a tournament based on an enable signal corresponding to each branch of the trellis similarly to the log-sum operation circuit $312_1$, thereby making cumulative addition in the log-sum operation in which the branch input in the trellis is "0" for example to compute the data L10. The log-sum operation circuit $312_3$ supplies the computed data L10 to the Iλ computation circuit 313.

Also, the log-sum operation circuit $312_4$ is constructed similarly to the log-sum operation circuit $312_1$, and so it will not be described in detail. It uses the data AGB and enable signal ENS3 to make an operation compared to a tournament based on an enable signal corresponding to each branch of the trellis similarly to the log-sum operation circuit $312_1$, thereby making cumulative addition in the log-sum operation in which the branch input in the trellis is "1" for example to compute the data L11. The log-sum operation circuit $312_4$ supplies the computed data L11 to the Iλ computation circuit 313.

Also, the log-sum operation circuit $312_5$ is constructed similarly to the log-sum operation circuit $312_1$, and so it will not be described in detail. It uses the data AGB and enable signal ENS20 to make an operation compared to a tournament based on an enable signal corresponding to each branch of the trellis similarly to the log-sum operation circuit $312_1$, thereby making cumulative addition in the log-sum operation in which the branch input in the trellis is "0" for example to compute the data L20. The log-sum operation circuit $312_5$ supplies the computed data L20 to the Iλ computation circuit 313.

Also, the log-sum operation circuit $312_6$ is constructed similarly to the log-sum operation circuit $312_1$, and so it will not be described in detail. It uses the data AGB and enable signal ENS21 to make an operation compared to a tournament based on an enable signal corresponding to each branch of the trellis similarly to the log-sum operation circuit $312_1$, thereby making cumulative addition in the log-sum operation in which the branch input in the trellis is "1" for example to compute the data L01. The log-sum operation circuit $312_6$ supplies the computed data L21 to the Iλ computation circuit 313.

The above Iλ computation circuit 313 includes three differentiators $324_1$, $324_2$ and $324_3$. The differentiator $324_1$ computes a difference between the data L00 supplied from the log-sum operation circuit $312_1$ and data L01 supplied from the log-sum operation circuit $312_2$. Data LM0 computed by this differentiator $324_1$ is transformed for notation as a 2's complement for example.

The differentiator $324_2$ computes a difference between the data L10 supplied from the log-sum operation circuit $312_3$ and data L11 supplied from the log-sum operation circuit $312_4$. Data LM1 computed by the differentiator $324_2$ is transformed for notation as a 2's complement for example.

The differentiator $324_3$ computes a difference between the data L20 supplied from the log-sum operation circuit $312_4$ and data L21 supplied from the log-sum operation circuit $312_6$. Data LM2 computed by the differentiator $324_3$ is transformed for notation as a 2's complement for example.

The Iλ computation circuit 313 ties together the data L00, L01, L10 and L11 supplied from the log-sum operation circuits $312_1$, $312_2$, $312_3$ and $312_4$, respectively, and represented in the so-called straight binary notation, and outputs them as a log soft-output SLM computed symbols. Also, the Iλ computation circuit 313 ties together the 2's complement-notated data LM0, LM1 and LM2 computed by the differentiators $324_1$, $324_2$ and $324_3$, respectively, and outputs them as a log soft-output BLM computed symbol by symbol.

Making the operation compared to a tournament using enable signals, the soft-output computation circuit 161 constructed as above can implement the cumulative addition in the log-sum operation corresponding to an input at each branch of the trellis to compute a log soft-output Iλ symbol by symbol or bit by bit, and output the data as log soft-outputs SLM and BLM. These log soft-outputs SLM and BLM are supplied to the extrinsic information computation circuit 163, amplitude adjusting/clipping circuit 164 and hard decision circuit 165.

The received value or a priori probability information separation circuit 162 separates, for extraction, a received value or a priori probability information from delayed received data DAD provided from the received data and delaying-use data storage circuit 155 and delayed a predetermined time. Based on the received value type information CRTY supplied from the control circuit 60 and number-of-input-bits information IN supplied from the code information generation circuit 151, the received data or a priori probability information separation circuit 162 separate an input delayed received data DAD.

Figure 47:
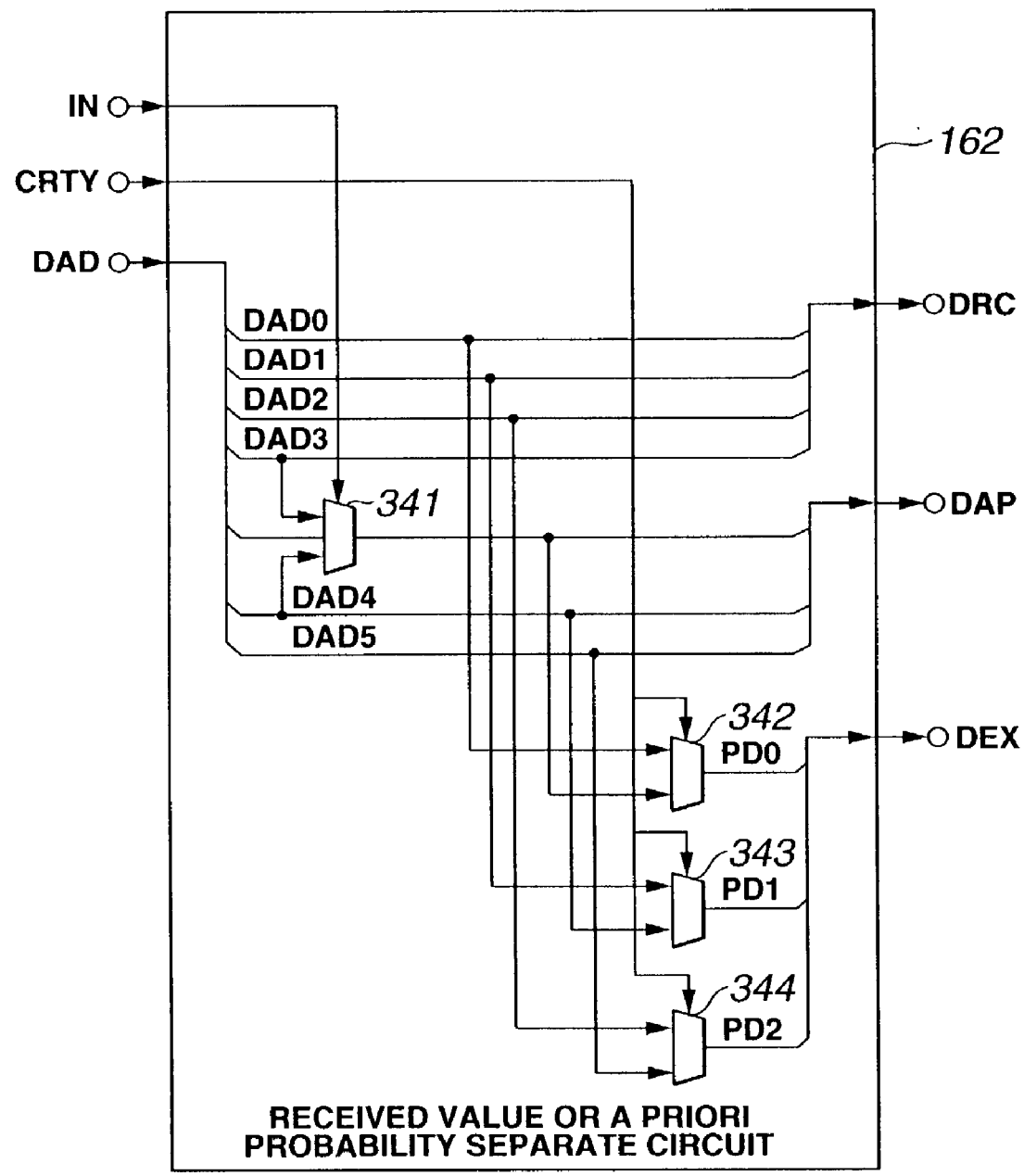
FIG. 47 is a block diagram of a received value or a priori probability information separation circuit included in the soft-output decoding circuit.

More specifically, the received value or a priori information separation circuit 162 can be implemented as a one including, as shown in FIG. 47 for example, four selectors 341, 342, 343 and 344.

The selector 341 selects, based on the number-of-input-bits information IN, either DAD3 or DAD4 of the delayed received data DAD. More specifically, the selector 341 selects the delayed received data DAD4 when the number of input bits to the element encoder is "1". The selector 341 outputs the thus selected data as delayed received data DAS.

The selector 342 selects, based on the received value type information CRTY, either DAD0 of the delayed received data DAD or delayed received data DAS supplied from the selector 341. More specifically, the selector 342 selects the delayed received data DAD0 when the received value type information CRTY indicates extrinsic information. The selector 342 outputs the thus selected data as delayed received data PD0.

The selector 343 selects, based on the received value type information CRTY, either DAD1 or DAD4 of the delayed received data DAD. More specifically, the selector 343 selects the delayed received data DAD1 when the received value type information CRTY indicates extrinsic information. The selector 343 outputs the thus selected data as delayed received data PD1.

Based on the received value type information CRTY, the selector 344 selects either DAD2 or DAD5 of the delayed received data DAD. More specifically, the selector 344 selects the delayed received data DAD2 when the received value type information CRTY indicates extrinsic information. The selector 344 outputs the thus selected data as delayed received data PD2.

The received value or a priori probability information separation circuit 162 ties together DAD0, DAD1, DAD2 and DAD3 of the input delayed received data DAD and outputs them as a delayed received value DRC represented in the so-called offset binary notation; ties together the delayed received data DAS, DAD4 and DAD5 and outputs them as delayed a priori probability information DAP; and ties together the delayed received data PD0, PD1 and PD2 and outputs them as delayed extrinsic information DEX. The delayed received value DRC is supplied to the extrinsic information computation circuit 163 and hard decision circuit 165, the delayed a priori probability information DAP is supplied to the extrinsic information computation circuit 163, and the delayed extrinsic information DEX is supplied as it is as delayed extrinsic information SDEX to the selector $120_2$.

The extrinsic information computation circuit 163 uses the log soft-output SLM or BLM supplied from the soft-output computation circuit 161 and the delayed received value DRC or delayed a priori probability information DAP supplied from the received value or a priori probability information separation circuit 162 to compute extrinsic information OE.

Figure 48:
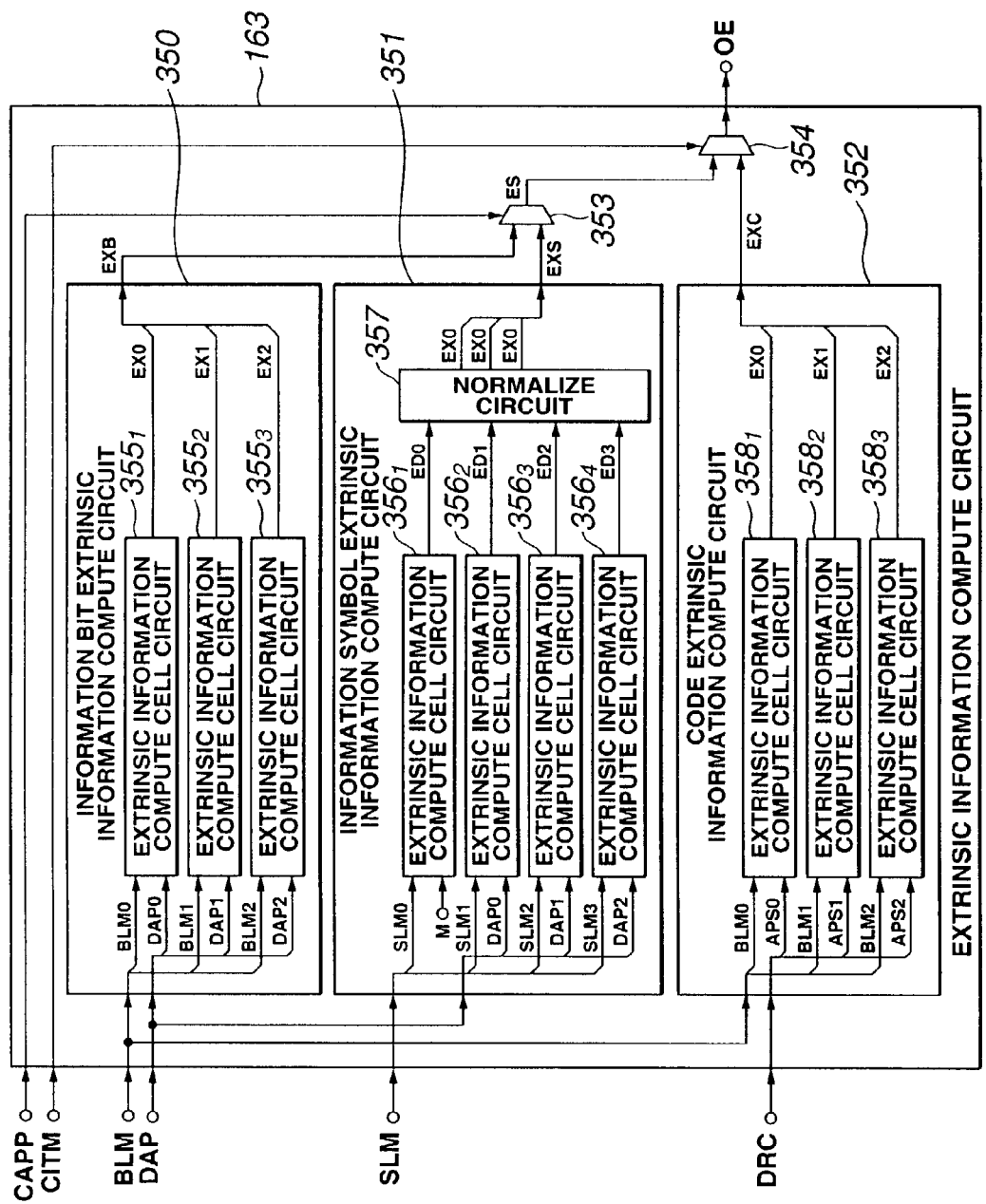
FIG. 48 is a block diagram of an extrinsic information computation circuit included in the soft-output decoding circuit.

More particularly, the extrinsic information computation circuit 163 can be implemented as a one including, as shown in FIG. 48 for example, an information bit extrinsic information computation circuit 350 to compute extrinsic information for information bits, an information symbol extrinsic information computation circuit 351 to compute extrinsic information for information symbols, a code extrinsic information computation circuit 352 to compute extrinsic information for a code, and two selectors 353 and 354.

The information bit extrinsic information computation circuit 350 includes three extrinsic information computation cell circuits $355_1$, $355_2$ and $355_3$. Each of these extrinsic information computation cell circuits $355_1$, $355_2$ and $355_3$ is substantially composed of a differentiator (not shown) to compute a difference between the log soft-output BLM and delayed a priori probability information DAP.

The extrinsic information computation cell circuit $355_1$ computes a difference between BLM0 of the log soft-output BLM and DAP0 of the delayed a priori probability information DAP, makes amplitude adjustment and clipping of the difference thus computed, transforms it for expression in the offset binary notation, and then outputs it as extrinsic information EX0.

The extrinsic information computation cell circuit $355_2$ computes a difference between BLM1 of the log soft-output BLM and DAP1 of the delayed a priori probability information DAP, makes amplitude adjustment and clipping of the difference thus computed, transforms it for expression in the offset binary notation, and then outputs it as extrinsic information EX1.

The extrinsic information computation cell circuit $355_3$ computes a difference between BLM2 of the log soft-output BLM and DAP2 of the delayed a priori probability information DAP, makes amplitude adjustment and clipping of the difference thus computed, transforms it for expression in the offset binary notation, and then outputs it as extrinsic information EX2.

The information bit extrinsic information computation circuit 350 computes three sequences of extrinsic information EX0, EX1 and EX2 for example bit by bit, ties these extrinsic information EX0, EX1 and EX2 together, and supplies them as extrinsic information EXB to the selector 353.

The information symbol extrinsic information computation circuit 351 includes four extrinsic information computation cell circuits $356_1$, $356_2$, $356_3$ and $356_4$ and a normalization circuit 357, for example. Each of these extrinsic information computation cell circuits $356_1$, $356_2$, $356_3$ and $356_4$ is substantially composed of a differentiator (not shown) to compute a difference between the log soft-output SLM and delayed a priori probability information DAP similarly to the extrinsic information computation cell circuits $355_1$, $355_2$ and $355_3$.

The extrinsic information computation cell circuits $356_1$ computes a difference between SLM0 of the log soft-output SLM and a predetermined value M, makes amplitude adjustment and clipping of the difference thus computed, and then supplies the data as extrinsic information ED0 to the normalization circuit 357.

The extrinsic information computation cell circuits $356_2$ computes a difference between SLM1 of the log soft-output SLM and DAP0 of the delayed a priori probability information DAP, makes amplitude adjustment and clipping of the difference thus computed, and then supplies the data as extrinsic information ED1 to the normalization circuit 357.

The extrinsic information computation cell circuits $356_3$ computes a difference between SLM2 of the log soft-output SLM and DAP1 of the delayed a priori probability information DAP, makes amplitude adjustment and clipping of the difference thus computed, and then supplies the data as extrinsic information ED2 to the normalization circuit 357.

The extrinsic information computation cell circuits $356_4$ computes a difference between SLM3 of the log soft-output SLM and DAP2 of the delayed a priori probability information DAP, makes amplitude adjustment and clipping of the difference thus computed, and then supplies the data as extrinsic information ED3 to the normalization circuit 357.

The normalization circuit 357 makes normalization to correct uneven mapping of the extrinsic information ED0, ED1, ED2 and ED3 computed by the extrinsic information computation cell circuits $356_1$, $356_2$, $356_3$ and $356_4$ and reduce the amount of information, as will further be described later. More specifically, the normalization circuit 357 adds a predetermined value to each of the extrinsic information ED0, ED1, ED2 and ED3 computed by the extrinsic information computation cell circuits $356_1$, $356_2$, $356_3$ and $356_4$ to fit a one, having a maximum value, of these extrinsic information ED0, ED1, ED2 and ED3 to a predetermined value "0" for example, then makes a clipping of the data according to a necessary dynamic range, and makes normalization of the data by subtracting the value of extrinsic information corresponding to a symbol from the value of extrinsic information corresponding to all the other symbols.

The normalization circuit 357 outputs the thus normalized extrinsic information as extrinsic information EX0, EX1 and EX2.

The information symbol extrinsic information computation circuit 351 computes three (this number is an example) sequences of extrinsic information EX0, EX1 and EX2 symbol by symbol, ties together these extrinsic information EX0, EX1 and EX2 and supplies them as extrinsic information EXS to the selector 353.

The code extrinsic information computation circuit 352 includes for example three extrinsic information computation cell circuits $358_1$, $358_2$ and $358_3$. Each of these circuits $358_1$, $358_2$ and $358_3$ is substantially composed of a differentiator (not shown) to compute a difference between the log soft-output BLM and delayed received value DRC similarly to the extrinsic information computation cell circuits $355_1$, $355_2$ and $355_3$.

The extrinsic information computation cell circuit $358_1$ computes a difference between BLM0 of the log soft-output BLM and APS0 of the delayed received value DRC, makes amplitude adjustment and clipping of the difference, transforms the data for expression in the offset binary notation, and then outputs it as extrinsic information EX0.

The extrinsic information computation cell circuit $358_2$ computes a difference between BLM1 of the log soft-output BLM and APS1 of the delayed received value DRC, makes amplitude adjustment and clipping of the difference, transforms the data for expression in the offset binary notation, and then outputs it as extrinsic information EX1.

The extrinsic information computation cell circuit $358_3$ computes a difference between BLM2 of the log soft-output BLM and APS2 of the delayed received value DRC, makes amplitude adjustment and clipping of the difference, transforms the data for expression in the offset binary notation, and then outputs it as extrinsic information EX2.

The code extrinsic information computation circuit 352 computes three (this number is an example) sequences of extrinsic information EX0, EX1 and EX2, ties together these extrinsic information EX0, EX1 and EX2, and supplies them as extrinsic information EXC to the selector 354.

The selector 353 selects, based on the a priori probability information type information CAPP, either the extrinsic information EXB supplied from the information bit extrinsic information computation circuit 350 or extrinsic information EXS supplied from the information symbol extrinsic information computation circuit 351. More particularly, the selector 353 selects the extrinsic information EXS when the a priori probability information type information CAPP is in symbols. The selector 353 supplies extrinsic information ES obtained via the selection to the selector 354.

The selector 354 selects, based on the output data selection control signal CITM, either extrinsic information ES supplied from the selector 353 or extrinsic information EXC supplied from the code extrinsic information computation circuit 352. In particular, the selector 354 selects the extrinsic information EXC when the output data selection control signal CITM indicates that information for a code to be decoded is to be outputted. The selector 354 outputs extrinsic information OE obtained via the selection to outside.

The extrinsic information computation circuit 163 uses the input log soft-output SLM or BLM and delayed received value DCR or delayed a priori probability information DAP to compute the extrinsic information OE, and supplies it as it is as extrinsic information SOE to the selector $120_1$.

The amplitude adjusting/clipping circuit 164 includes a circuit to adjust the amplitude of the log soft-output SLM symbol by symbol and clips the data to a predetermined dynamic range, and a circuit to adjust the amplitude of the log soft-output BLM in bits and clips the data to a predetermined dynamic range. Based on the output data selection control signal CITM supplied from outside and a priori probability information type information CAPP supplied from the control circuit 60, the amplitude adjusting/clipping circuit 164 outputs, as amplitude-adjusted log soft-output OL, either of the log soft-outputs SLM and BLM adjusted in amplitude and clipped to the predetermined dynamic range as above. The log soft-output OL is supplied as it is as soft-output SOL to the selector $120_1$.

The hard decision circuit 165 makes a hard decision of the log soft-outputs SLM and BLM to be decoded and also the delayed received value DRC. At this time, based on the output data selection control signal CITM supplied from outside, and received value type information CRTY, a priori probability information type information CAPP and signal point mapping information CSIG supplied from the control circuit 60, the hard decision circuit 165 makes a hard decision of the log soft-outputs SLM and BLM and delayed received value DRC. Note that in case the encoder 1 is to code TTCM and SCTCM, it makes an 8PSK modulation-based modulation of the data and the signal point mapping information CSIG is composed of eight sequences of signal point mapping information CSIG0, CSIG1, CSIG2, CSIG3, CSIG4, CSIG5, CSIG6 and CSIG7.

Figure 49:
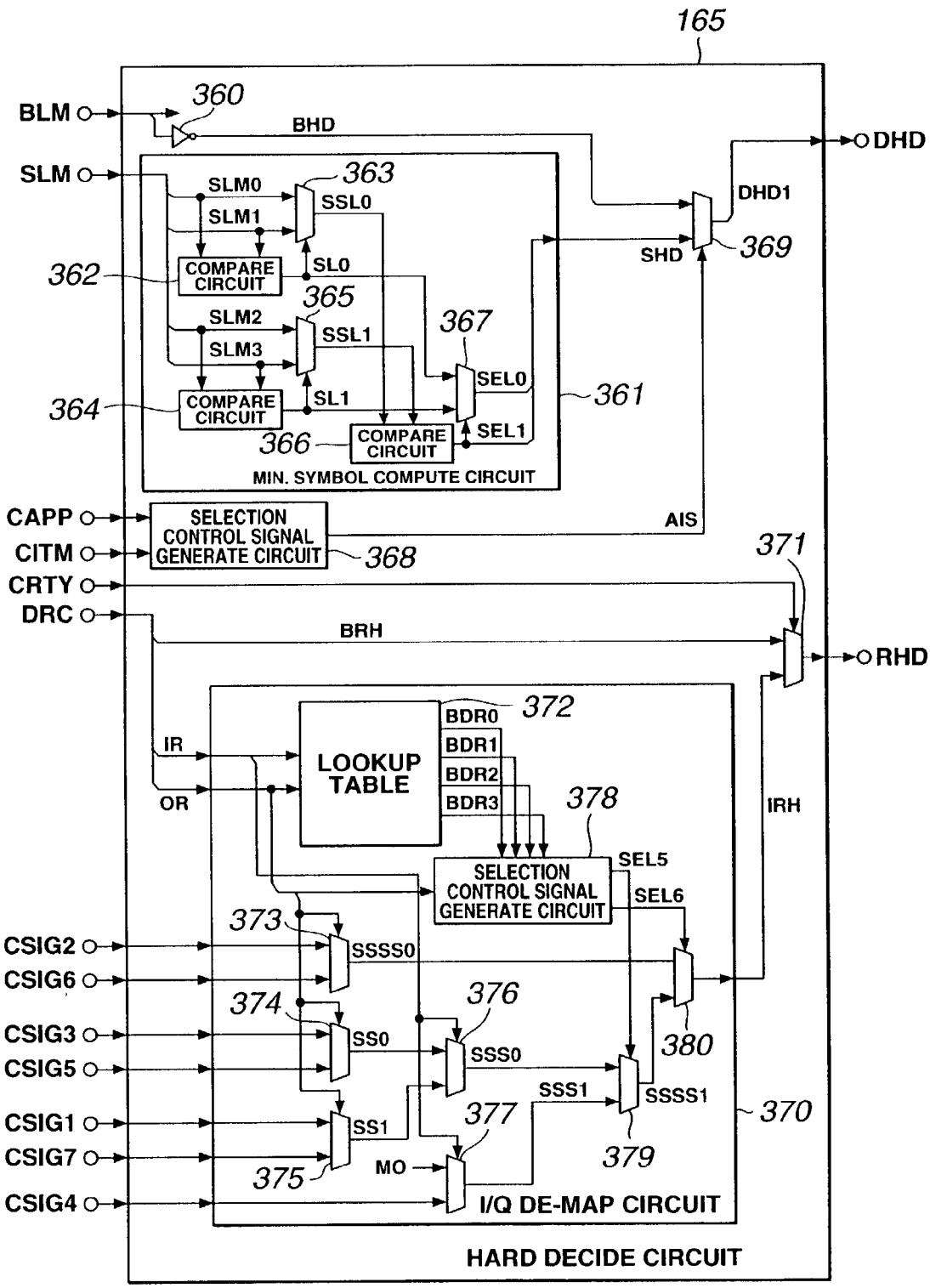
FIG. 49 is a block diagram of a hard decision circuit included in the soft-output decoding circuit.

More specifically, the hard decision circuit 165 can be implemented as a one including, as shown in FIG. 49 for example, an inverter 360, a minimum symbol computation circuit 361 to compute a symbol whose value is minimum, a selection control signal generation circuit 368 to generate a control signal for controlling the selecting operation of a selector 369 which will be described in detail later, selectors 369 and 371, and an I/Q demapping circuit 370 to demap the I/Q value when the encoder 1 is to code TTCM and SCTCM.

The inverter 360 inverts a predetermined group of bits of the log soft-output BLM supplied from the soft-output computation circuit 161 and notated in the 2's complement and outputs the data as decoded bit hard decision information BHD.

The minimum symbol computation circuit 361 can be implemented as a one including three comparison circuits 362, 364 and 366 and three selectors 363, 365 and 367, for example.

The comparison circuit 362 makes a comparison in size between SLM0 and SLM1 of the log soft-output SLM supplied from the soft-output computation circuit 161 and expressed in the straight binary notation. This comparison circuit 362 supplies a control signal SL0 thus obtained and indicating the relation in size to the selector 367, while supplying the data as a selection control signal to the selector 363.

The selector 363 selects, based on the control signal SL0 supplied from the comparison circuit 362, either log soft-output SLM0 or SLM1, whichever is smaller in value. The selector 363 supplies data SSL0 obtained via the selection to the comparison circuit 366.

The comparison circuit 364 makes a comparison in size between SLM2 and SLM3 of the log soft-output SLM supplied from the soft-output computation circuit 161. This comparison circuit 364 supplies a control signal SL1 indicating the relation in size to the selector 367, while supplying the data as a selection control signal to the selector 365.

The selector 365 selects, based on the control signal SL1 supplied from the comparison circuit 364, either log soft-output SLM2 or SLM3, whichever is smaller in value. The selector 365 supplies data SSL1 obtained via the selection to the comparison circuit 366.

The comparison circuit 366 makes a comparison in size between SSL0 supplied from the selector 363 and SSL1 supplied from the selector 365. The computation circuit 366 supplies a control signal SEL1 indicating the relation in size as a selection control signal to the selector 367.

The selector 367 selects, based on the control signal SEL1 supplied from the comparison circuit 366, either the control signal SL0 supplied from the comparison circuit 362 or SL1 supplied from the comparison circuit 364. More specifically, the selector 367 selects the control signal SL1 when the data SSL0 is larger in value than the data SSL1. The selector 367 outputs data obtained via the selection as a control signal SEL0.

The minimum symbols computation circuit 361 computes a one having a minimum value of the log soft-output SLM symbol by symbol and supplies it as a decoded symbol hard decision information SHD of the control signals SEL0 and SEL1 to the selector 369.

Based on the output data selection control signal CITM supplied from outside and a priori probability information type information CAPP supplied from the control circuit 60, the selection control signal generation circuit 368 generates a control signal AIS to control the selecting operation of the selector 369.

The selector 369 selects, based on the control signal AIS supplied from the selection control signal generation circuit 368, either decoded bit hard decision information BHD supplied from the inverter 360 or decoded symbol hard decision information SHD supplied from the minimum symbol computation circuit 361. More particularly, when the output data selection control signal CITM indicates that the control signal AIS is to output information for information symbols or information bits and the a priori probability information type information CAPP indicates that the control signal AIS is in symbols, the selector 369 selects the decoded symbol hard decision information SHD. The selector 369 outputs the thus selected data as decoded value hard decision information DHD1.

The hard decision circuit 165 determines, by means of these components, the decoded bit hard decision information BHD and decoded symbol hard decision information SHD, and outputs decoded value hard decision information DHD1 selected by the selector 369 as decoded value hard decision information DHD. This decoded value hard decision information DHD is outputted as decoded value hard decision information SDH to outside.

Note that the hard decision circuit 165 uses the inverter 360 to determine the decoded bit hard decision information BHD because of the data notation. That is, the decoded bit hard decision information BHD is determined based on the log soft-output BLM notated in the 2's complement as having been described in the foregoing. Thus, the hard decision circuit 165 can make, by the interleaver 360, a hard decision of the log soft-output BLM computed bit by bit via the judgment based on inverted bits obtained by inverting a predetermined group of bits, more specifically, the MSB, of the log soft-output BLM.

Also, in the hard decision circuit 165, the I/Q demapping circuit 370 can be implemented as a one including for example a lookup table 372 to store a data demapping table, seven selectors 373, 374, 375, 376, 377, 379 and 380, and a selection control signal generation circuit 378 to generate a control signal for controlling the selecting operation of the selectors 379 and 380.

The lookup table 372 stores a received value demapping table. More specifically, the lookup table 372 stores boundary values along an I axis of an I/Q plane as will be described in detail later. The lookup table 372 reads, from the table, a boundary value corresponding a combination of a value of the delayed received value IR, of the delayed received value DRC expressed in the offset binary notation, corresponding to a common-phase component, and a value of the delayed received value QR corresponding to an orthogonal component, and supplies it as four sequences of boundary data BDR0, BDR1, BDR2 and BDR3 for example to the selection control signal generation circuit 378.

The selector 373 selects, based on the delayed received value QR, either signal point mapping information CSIG2 or CSIG6. More specifically, when the delayed received value QR is positive in value, the selector 373 selects the signal point mapping information CSIG2. This selector 373 supplies the selected data as signal point mapping information SSSS0 to the selector 380.

The selector 374 selects, based on the delayed received value QR, either signal point mapping information CSIG3 or CSIG5. More specifically, when the delayed received value QR is positive in value, the selector 374 selects the signal point mapping information CSIG3. This selector 374 supplies the selected data as signal point mapping information SS0 to the selector 376.

The selector 375 selects, based on the delayed received value QR, either signal point mapping information CSIG1 or CSIG7. More specifically, when the delayed received value QR is positive in value, the selector 375 selects the signal point mapping information CSIG1. This selector 375 supplies the selected data as signal point mapping information SS1 to the selector 376.

The selector 376 selects, based on the delayed received value IR, either signal point mapping information SS0 supplied from the selector 374 or SS1 supplied from the selector 375. More specifically, when the delayed received value IR is positive in value, the selector 376 selects the signal point mapping information SS1. This selector 376 supplies the selected data as signal point mapping information SSS0 to the selector 379.

The selector 377 selects, based on the delayed received value IR, either data having a predetermined value M or signal point mapping information CSIG4. More specifically, when the delayed received value IR is positive in value, the selector 377 selects the data having the predetermined value M. This selector 377 supplies the selected data as signal point mapping information SSS1 to the selector 379.

Based on the delayed received value QR and boundary value data BDR0, BDR1, BDR2 and BDR3 supplied from the lookup table 372, the selection control signal generation circuit 378 generates a control signal SEL5 for controlling the selecting operation of the selector 379 and also a control signal SEL6 for controlling the selecting operation of the selector 380.

Based on the control signal SEL5 supplied from the selection control signal generation circuit 378, the selector 379 selects signal point mapping information SSS0 or SSS1. This selector 379 supplies the selected data as signal point mapping information SSSS1 to the selector 380.

Based on the control signal SEL6 supplied from the selection control signal generation circuit 378, the selector 380 selects signal point mapping information SSSS0 or SSSS1. This selector 380 supplies the selected data as received value hard decision information IRH to the selector 371.

The above I/Q demapping circuit 370 determines the received value hard decision information IRH when the encoder 1 is to code TTCM or SCTCM.

Further in the hard decision circuit 165, the selector 371 selects either received value hard decision information BRH composed of a predetermined group of bits, of the delayed received value DCR, and indicating the result of hard decision of the offset binary notation, or received value hard decision information IRH supplied from the I/Q demapping circuit 370. More specifically, when the received value type information CRTY indicates that the encoder 1 is to code TTCM or SCTCM, the selector 371 selects the received value hard decision information IRH. The selector 371 outputs the selected data as received value hard decision information RHD which will be outputted as it is as received value hard decision information SRH to outside.

Note that in order to determine the received value hard decision information BRH, the hard decision circuit 165 will not make any bit inversion as in the determination of the aforementioned decoded bit hard decision information BHD because of the data notation. That is, the received value hard decision information BRH is determined based on the delayed received value DRC expressed in the offset binary notation as having previously been described. Thus, the hard decision circuit 165 can make a hard decision of the delayed received value DRC via a judgment based on the predetermined bit group, more specifically, MSB, of the delayed received value DRC.

The above hard decision circuit 165 determines a decoded value hard decision information SDH by hard decision of the log soft-outputs SLM and BLM being decoded values, and also the received value bard decision information SRH by hard decision of the delayed received value DRC. These pieces of decoded value hard decision information SDH and received value hard decision information SRH are outputted as decoded value hard decision information DHD and received value hard decision information RHD, and monitored as necessary.

Supplied with a decoded received value TSR of a soft-input, the soft-output decoding circuit 90 having been described in the foregoing computes the log likelihood Iγ by the Iγ computation circuit 156 and Iγ distribution circuit 157 each time it receives a received value, the log likelihood Iα by the Iα computation circuit 158, and then the log likelihood Iβ for each state at all times by the Iβ computation circuit 159 when it receives all received values. The element decoder 50 computes the log soft-output Iλ at each time using the computed log likelihood Iα, Iβ and Iγ by the soft-output computation circuit 161, and outputs the log soft-output Iλ to outside or to the extrinsic information computation circuit 163. Also, the element decoder 50 computes extrinsic information at each time by the extrinsic information computation circuit 163. Thus, the element decoder 50 uses decoded received value TSR and extrinsic information or interleaved data TEXT to make soft-output decoding to which the Log-BCJR algorithm is applied. In particular, the soft-output decoding circuit 90 can make soft-output decoding of any arbitrary code independently of the configuration of a PCCC, SCCC, TTCM or SCTCM code in the element encoder.

Note that various features of the soft-output decoding circuit 90 will further be described in Section 5.

2.3 Detailed Description of the Interleaver

Next, the interleaver 100 will be described in detail. Prior to beginning the detailed description, the basic design concept of the interleaver 100 will be explained herebelow.

As will be described later, the interleaver 100 can make both interleaving and de-interleaving operations, and also delay an input received value. So, the interleaver 100 is assumed herein to include a RAM to delay an input received value and a RAM to interleave input data. Note that these RAMs are actually shared as will be described later and switched for use correspondingly to a mode indicating the configuration of a code including the kind of an interleaving operation to be done.

Figure 50:
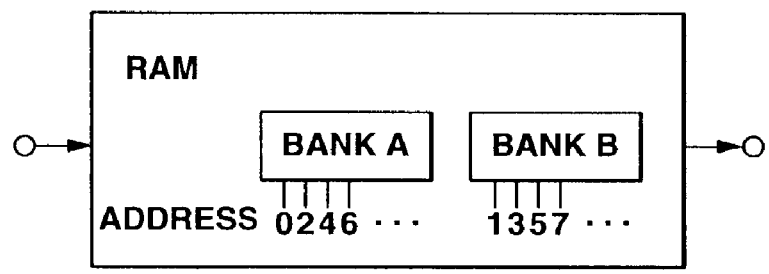
FIG. 50 is a block diagram of a delay-use RAM included in an interleaver included in the element decoder, explaining the concept of the delay-use RAM.
Figure 51:
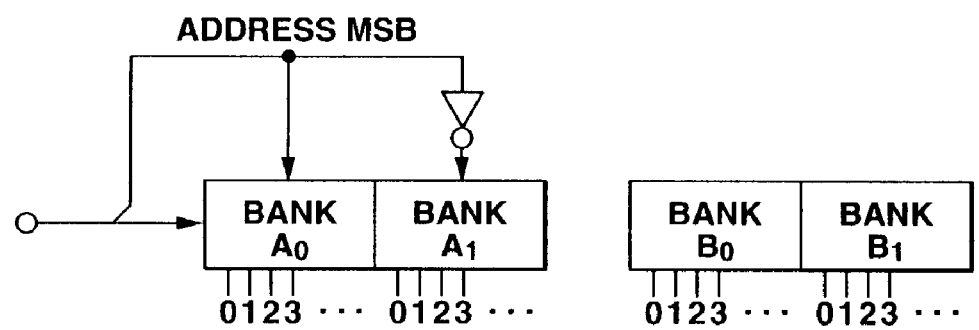
FIG. 51 is a block diagram of a delay-use RAM consisting of a plurality of RAMs, explaining the concept of the delay-use RAM.
Figure 52:
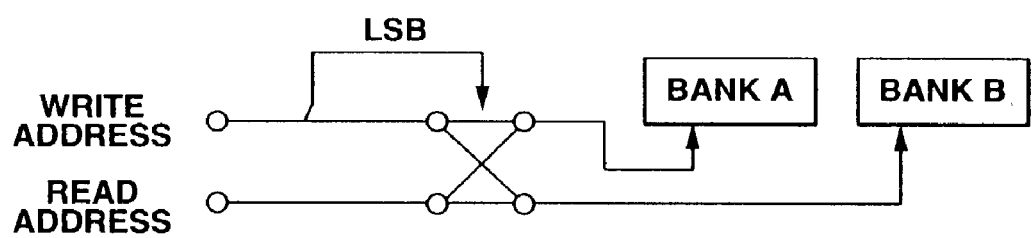
FIG. 52 is a block diagram of the delay-use RAM, explaining how an address generated by a control circuit included in the interleaver is appropriately transformed, and supplied to each of the RAMs.

The delay-use RAM is constructed like one RAM having dual ports including banks A and B as shown in FIG. 50 for example, when viewed from a control circuit, included in the interleaves 100, which will be described in detail later. The control circuit cannot simultaneously access both even and odd addresses by the write address for use to write data to the RAM and read address for use to read data from the RAM. To provide a delay for an even length by the delaying-use in the interleaver 100, data is stored at each address in the RAM on the basis of write addresses such as 0, 1, 2, 3, 4, . . . , DL-2, DL-1, 0, 1, 2, . . . for example. Also, in the interleaver 100, data is read from each of addresses in the RAM on the basis of read addresses such as 1, 2, 3, 4, 5, . . . , DL-1, 0, 1, 2, 3, . . . . Also, in the interleaver 100, a delay for an odd length can be attained by causing a register or the like to hold an output delayed for an even length. Actually, the delaying-use is composed of a plurality of RAMs for upper and lower addresses of each of the banks A and B as shown in FIG. 51 for example. Thus, in the interleaver 100, it is necessary to appropriately transform addresses generated by the control circuit for allocation to each of the RAMs as shown in FIG. 52. Note that inversion of the MSB of the address as in FIG. 51 is intended for a simple addressing during input/output of a plurality of symbols.

Figure 53:
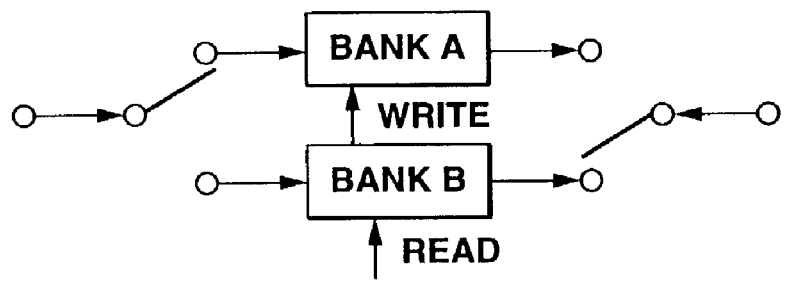
FIG. 53 is a block diagram of an interleaving RAM in the interleaver, explaining the concept of the RAM.
Figure 54:
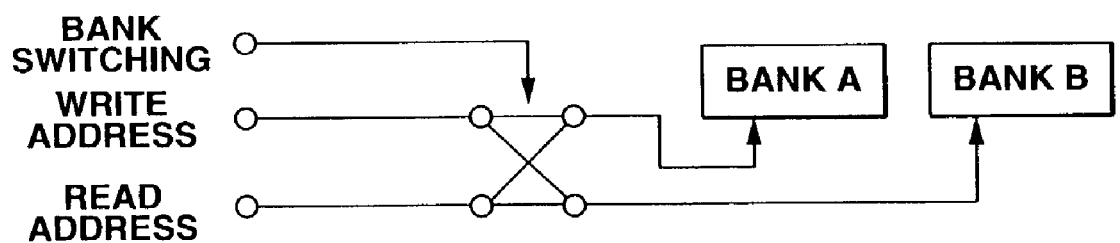
FIG. 54 is a block diagram of the interleaving RAM, explaining how addresses are transformed to ones for use with banks A and B, respectively, on the basis of sequential write addresses and random read address, and supplied to each RAM.

On the other hand, the interleaving RAM is constructed as a one having two RAMs each including the banks A and B as viewed from the control circuit as shown in FIG. 53. As mentioned above, the interleaver 100 can be switched between interleaving and de-interleaving operations. To this end, data is stored at each address in the RAM as a write bank A based on sequential write addresses normally generated in an ascending order like 0, 1, 2, 3, . . . or descending order . . . , 3, 2, 1, 0, for example, for the purpose of interleaving. In the interleaver 100, data is read from each address in the RAM as a read bank B on the basis of random read addresses. Contrary to the interleaving operation, for de-interleaving operation of the interleaver 100, data is stored at each address in the RAM as the write bank A on the basis of random write addresses, and data is read from each address in the RAM as the read bank B on the basis of sequential addresses. In the interleaver 100, addresses are transformed for use in each of the banks A and B and thus allocated to each RAM on the basis of the sequential write addresses and random read addresses as shown in FIG. 54 for example.

Next, the input to, and output from, the address storage circuit 110 as viewed from the interleaver 100 will be described.

The address storage circuit 110 is basically based on a sequential address data IAA supplied from the interleaver 100 to output read address data ADA0, ADA1 and ADA2 (three sequences of random address data), for example. Thus, supplied with the plurality of sequences of read address data ADA from the address storage circuit 110, the interleaver 100 can make plural interleaving operations for a data of three-symbols at maximum.

Figure 55A:
FIG. 55A explains a random interleaving of one-symbol input data, effected by the interleaver.

For example, to interleave one-symbol input data as shown in FIG. 55A at random, the interleaver 100 uses ADA0 of three sequences of read address data ADA0, ADA1 and ADA2 from the address storage circuit 110. Note that in the following description, the interleaving made at random will be referred to as "random interleaving".

Figure 55B:
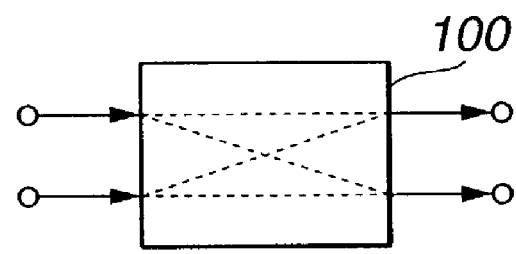
FIG. 55B explains a random interleaving of two-symbol input data, effected by the interleaver.

Also, to make random interleaving of two-symbol input data as shown in FIG. 55B, the interleaver 100 uses ADA0 and ADA1 of the three sequences of read address data ADA0, ADA1 and ADA2 from the address storage circuit 110.

Figure 55C:
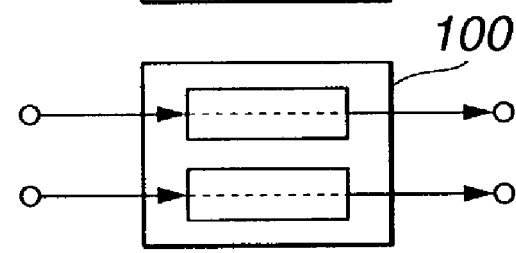
FIG. 55C explains an in-line interleaving of two-symbol input data, effected by the interleaver.

Further, to interleave two-symbol input data as shown in FIG. 55C individually based on different addresses, the interleaver 100 uses ADA0 and ADA1 of the three sequences of read address data ADA0, ADA1 and ADA2 from the address storage circuit 110. Note that in the following description, such an interleaving will be referred to as "inline interleaving".

Figure 55D:
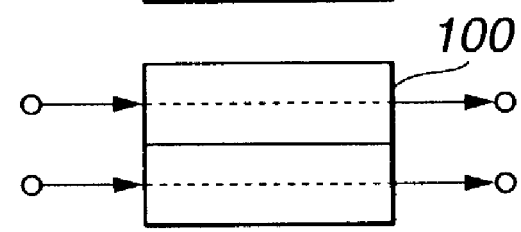
FIG. 55D explains an pair-wise interleaving of two-symbol input data, effected by the interleaver.

Furthermore, to interleave two-symbol input data as shown in FIG. 55D to hold a combination of bits, namely, to interleave each symbol of the input data on the basis of the same address, the interleaver 100 uses ADA0 and ADA1 of the three sequences of read address data ADA0, ADA1 and ADA2 from the address storage circuit 110. Note that in the following description, such an interleaving will be referred to as "pair-wise interleaving".

Figure 55E:
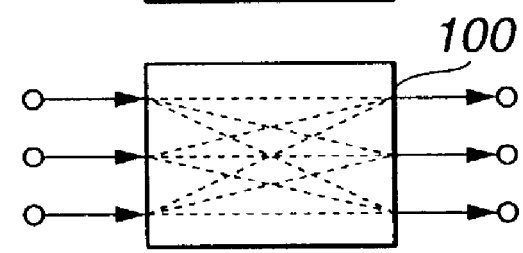
FIG. 55E explains a random interleaving of three-symbol input data, effected by the interleaver.

Also, to make random interleaving of three-symbol input data as shown in FIG. 55E, the interleaver 100 uses all the three sequences of read address data ADA0, ADA1 and ADA2 from the address storage circuit 110.

Figure 55F:
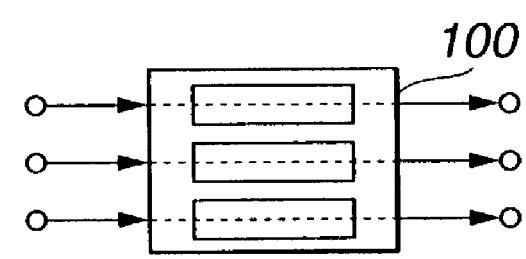
FIG. 55F explains an in-line interleaving of three-symbol input data, effected by the interleaver.

Also, to make inline interleaving of three-symbol input data as shown in FIG. 55F, the interleaver 100 uses all the three sequences of read address data ADA0, ADA1 and ADA2 from the address storage circuit 110.

Figure 55G:
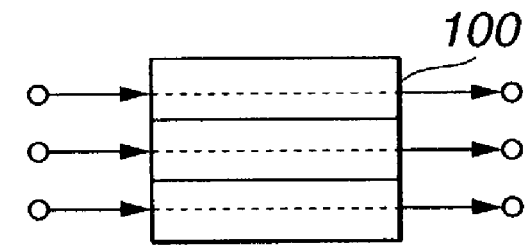
FIG. 55G explains a pair-wise interleaving of three-symbol input data, effected by the interleaver.

Also, to make pair-wise interleaving of three-symbol input data as shown in FIG. 55G, the interleaver 100 uses all the three sequences of read address data ADA0, ADA1 and ADA2 from the address storage circuit 110.

As above, the interleaves 100 can make plural kinds of interleaving with plural sequences of read address data ADA supplied from the address storage circuit 110. Note that of course, the plural kinds of interleaving includes plural kinds of de-interleaving in which the above interleaving is done reversely. To implement the plural kinds of interleaving, the interleaver 100 includes a plurality of RAMs and selects an appropriate RAM for use from among them according to an intended kind of interleaving.

Note that how to use the plural RAMs will be described in detail later.

Figure 56:
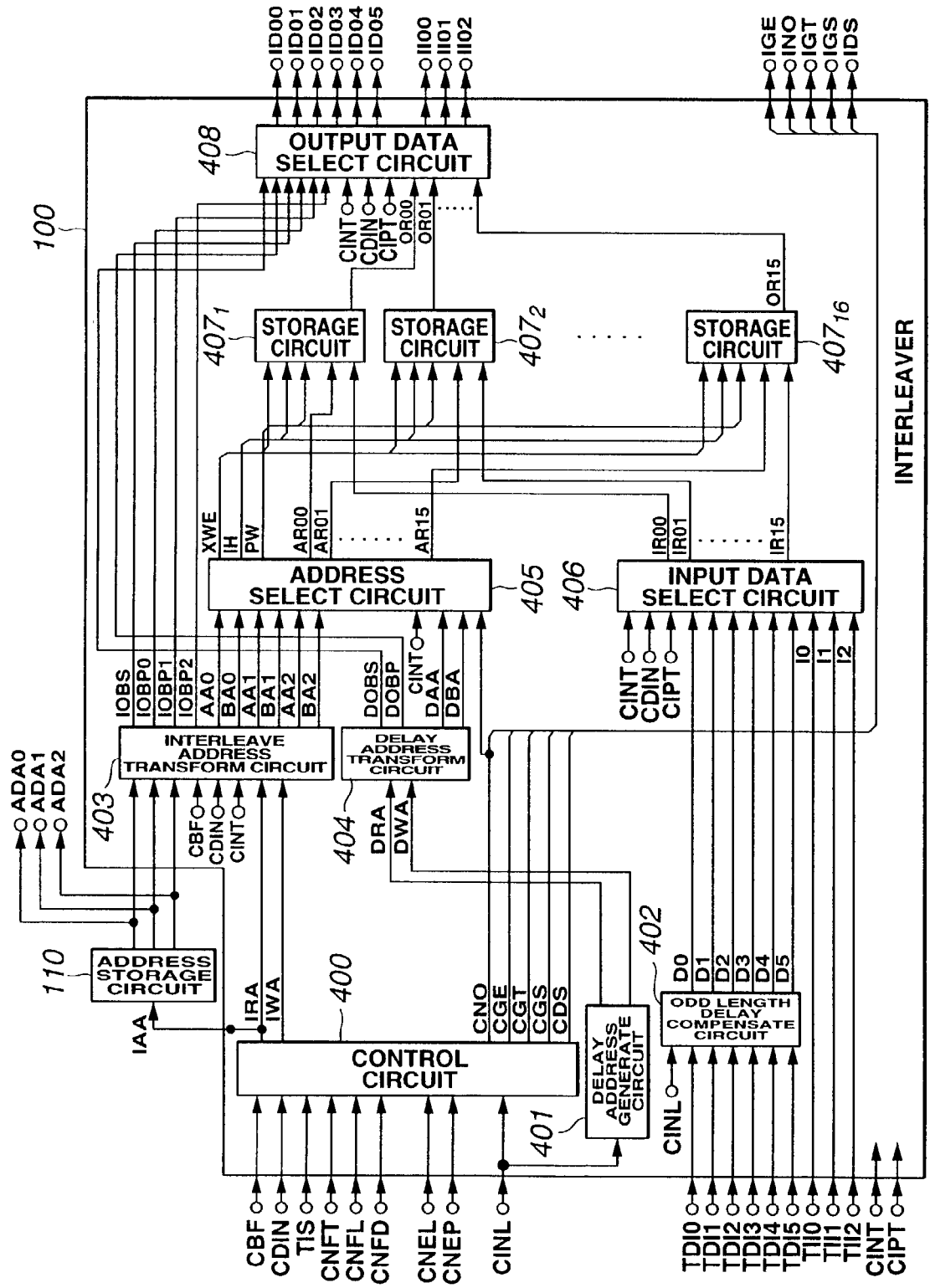
FIG. 56 is a block diagram of the interleaver.

The interleaver 100 capable of such interleaving or de-interleaving is constructed as shown in FIG. 56. As shown, the interleaver 100 includes a control circuit 400 to make a variety of processes such as address generation etc., a delay address generation circuit 401 to generate a delay address, an odd length delay compensation circuit 402 to compensate for an odd length delay, an interleave address transforming circuit 403 to transform an input address to interleave address data, a delay address transforming circuit 404 to transform input address data to delayed added data, an address selection circuit 405 to select address data for distribution to storage circuits $407_1$, $407_2$, ..., $407_{16}$ which will further be described later, an input data selection circuit 406 to select data for distribution to the sixteen storage circuits $407_1$, $407_2$, ..., $407_{16}$ and an output data selection circuit 408 to select output data, for example.

The above control circuit 400 controls data write to, and/or data read from, the storage circuits $407_1$, $407_2$, ..., $407_{16}$. When supplied with an interleave start position signal TIS from the selector $120_5$, the control circuit 400 generates write and read addresses for use in interleaving or de-interleaving. At this time, the control circuit 400 generates write and read addresses based on an interleaving mode signal SDIN supplied from outside, and interleaved length information CINL and operation mode information CBF indicating that data should be delayed an interleaving length, supplied from the control circuit 60. The control circuit 400 supplies write address data IWA which is the thus generated sequential address data to the interleave address transforming circuit 403. Also, the control circuit 400 supplies the thus generated address data IAA to the address storage circuit 110, while supplying the data as interleaved length delay read address data IRA to the interleave address transforming circuit 403.

Further, when supplied with end position information CNFT, termination period information CNFL, termination state information CNFD, puncture period information ENEL and puncture pattern information CNEP from the control circuit 60, the control circuit 400 generates, based on the interleaving length CINL, interleaver no-output position information CNO and delayed interleave start position signal CDS, and also termination time information CGT, termination state information CGS and erase position information CGE. In a time of the interleaving length, the control circuit 400 supplies these pieces of information as interleaver no-output position information INO, delayed interleave start position signal IDS, termination time information IGT, termination state information IGS and erase position information IGE, respectively, and as synchronized with the frame top to the selector $120_{10}$. Also, the control circuit 400 supplies the thus generated interleaver no-output position information CNO to the address selection circuit 405 as well.

As will further be described later, write address data IWA which is the sequential address data generated by the control circuit 400 will be taken as address data for use to write data to the storage circuits $407_1$, $407_2$, ..., $407_{16}$ when the interleaving mode CDIN indicates that the interleaver 100 makes an interleaving, while it will be taken as address data for use to read data from the storage circuits $407_1$, $407_2$, ..., $407_{16}$ when the interleaving mode signal CDIN indicates that the interleaver 100 makes a de-interleaving. Similarly, sequential address data IAA generated by the control circuit 400 will be used to read, from the address storage circuit 110, random address data for use to read data from the storage circuits $407_1$, $407_2$, ..., $407_{16}$ when the interleaving mode signal CDIN indicates that the interleaver 100 makes an interleaving, while it will be used to read, from the address storage circuit 110, random address data for use to write data to the storage circuits $407_1$, $407_2$, ..., $407_{16}$ when the interleaving mode signal CDIN indicates that the interleaver 100 makes a de-interleaving.

Also, to generate write and read addresses, the control circuit 400 generates sequential address data by counting up by a counter (not shown). Note that a write address counter and read address counter are provided separately as will be described in detail later.

The delay address generation circuit 401 generates delay address data, based on the interleaving length information CINL supplied from the control circuit 60. This delay address generation circuit 401 supplies the delay address transforming circuit 404 with delayed write address data DWA which is the thus generated write address data and delayed read address data DRA which is the thus generated read address data.

The odd length delay compensation circuit 402 is provided to compensate from an odd length delay. That is, to delay data as in the above, the interleaver 100 is composed of two banks of RAMs. Since either data write or read is selected between the banks at each time slot as will be described in detail later, the interleaver 100 can delay data by using two banks of RAMs for the number of words for a time slot equivalent to a delay, that is, a half of the interleaving length. In this case, however, the delaying length is limited to an even length in the interleaver 100. Thus, the odd length delay compensation circuit 402 is provided to deal with the odd length delay. Based on the interleaving length information CINL supplied from the control circuit 60, the odd length delay compensation circuit 402 selects a delayed data TDI so as to provide a delay of the data TDI for a time of a delay by the RAM for the even length or provide a delay of the data TDI for the sum of a delay (delay by the RAM−1) and a delay for one time slot by the register for the odd length delay.

Figure 57:
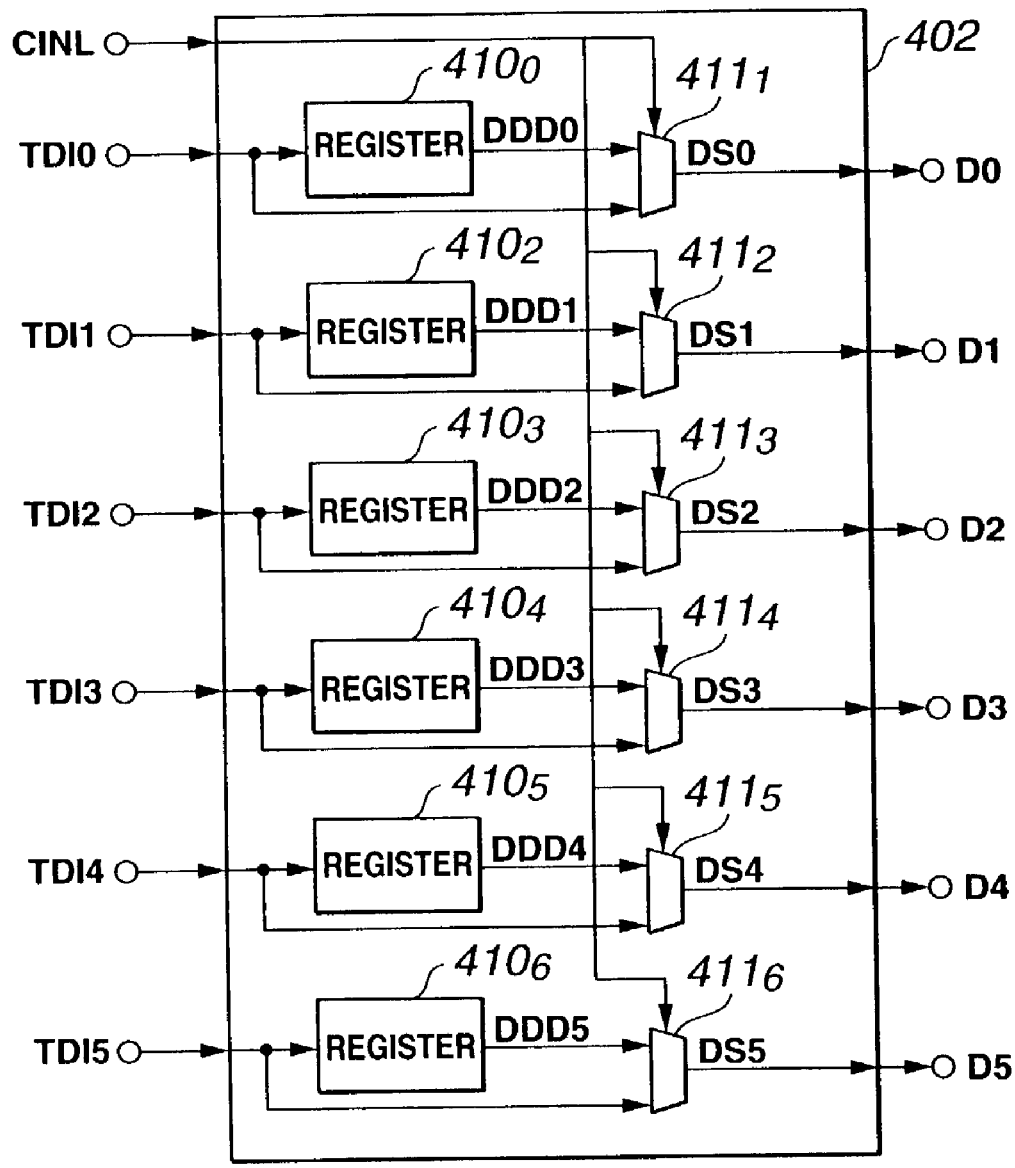
FIG. 57 is a block diagram of an odd-length delay compensation circuit included in the interleaver.

More specifically, on the assumption that the data TDI is composed of six sequences of data TDI0, TDI1, TDI2, TDI3, TDI4 and TDI5, the odd length delay compensation circuit 402 can be implemented as a one including, as shown in FIG. 57 for example, six registers $410_1$, $410_2$, $410_3$ $410_4$, $410_5$ and $410_6$ and six selectors $411_1$, $411_2$, $411_3$ $411_4$, $411_5$ and $411_6$.

Supplied with input data TDI0, the register $410_1$ holds it for one time slot, and supplies the thus held data as data DDD0 to the selector $411_1$.

Supplied with input data TDI1, the register $410_2$ holds it for one time slot, and supplies the thus held data as DDD1 to the selector $411_2$.

Supplied with input data TDI2, the register $410_3$ holds it for one time slot, and supplies the thus held data as DDD2 to the selector $411_3$.

Supplied with input data TDI3, the register $410_4$ holds it for one time slot, and supplies the thus held data as DDD3 to the selector $411_4$.

Supplied with input data TDI4, the register $410_5$ holds it for one time slot, and supplies the thus held data as DDD4 to the selector $411_5$.

Supplied with input data TDI5, the register $410_6$ holds it for one time slot, and supplies the thus held data as DDD5 to the selector $411_6$.

The selector $411_1$ selects, based on the interleaving length information CINL, either the data DDD0 or TDI0 supplied from the register $410_1$. More specifically, the selector $411_1$ selects the data TDI0 when the interleaving length is an even length. The selector $411_1$ supplies the selected data DS0 as data D0 to the input data selection circuit 406. Note that needless to say, the interleaving length information CINL supplied to the selector $411_1$ may actually be the LSB of a bit string indicating the interleaving length information CINL.

The selector $411_2$ selects, based on the interleaving length information CINL, either the data DDD1 or TDI1 supplied from the register $410_2$. More specifically, the selector $411_2$ selects the data TDI1 when the interleaving length is an even length. The selector $411_2$ supplies the selected data DS1 as data D1 to the input data selection circuit 406. Note that needless to say, the interleaving length information CINL supplied to the selector $411_2$ may actually be the LSB of a bit string indicating the interleaving length information CINL.

The selector $411_3$ selects, based on the interleaving length information CINL. either the data DDD2 or TDI2 supplied from the register $410_3$. More specifically, the selector $411_3$ selects the data TDI2 when the interleaving length is an even length. The selector $411_3$ supplies the selected data DS2 as data D2 to the input data selection circuit 406. Note that needless to say, the interleaving length information CINL supplied to the selector $411_3$ may actually be the LSB of a bit string indicating the interleaving length information CINL.

Based on the interleaving length information CINL, the selector $411_4$ selects either the data DDD3 or TDI3 supplied from the register $410_4$. More specifically, the selector $411_4$ selects the data TDI3 when the interleaving length is an even length. The selector $411_4$ supplies the selected data DS3 as data D3 to the input data selection circuit 406. Note that needless to say, the interleaving length information CINL supplied to the selector $411_4$ may actually be the LSB of a bit string indicating the interleaving length information CINL.

The selector $411_5$ selects, based on the interleaving length information CINL, either the data DDD4 or TDI4 supplied from the register $410_5$. More specifically, the selector $411_5$ selects the data TDI4 when the interleaving length is an even length. The selector $411_5$ supplies the selected data DS4 as data D4 to the input data selection circuit 406. Note that needless to say, the interleaving length information CINL supplied to the selector $411_5$ may actually be the LSB of a bit string indicating the interleaving length information CINL.

The selector $411_6$ selects, based on the interleaving length information CINL, either the data DDD5 or TDI5 supplied from the register $410_6$. More specifically, the selector $411_6$ selects the data TDI5 when the interleaving length is an even length. The selector $411_6$ supplies the selected data DS5 as data D5 to the input data selection circuit 406. Note that needless to say, the interleaving length information CINL supplied to the selector $411_6$ may actually be the LSB of a bit string indicating the interleaving length information CINL.

Supplied with data TDI, the odd length delay compensation circuit 402 outputs it not via any register in the case of an even length delay, while holding the data TDI for one time slot by a register in the case of an odd length delay and then outputting it.

Based on the interleaving mode signal CDIN supplied from outside, interleaver type information CINT supplied from the control circuit 60 and operation mode information CBF indicating that the data is delayed for the interleaving length, the interleaving address transforming circuit 403 selects a desired one of the write address data IWA and interleaving length delay read address data IRA, which are sequential address data supplied from the control circuit 400, and the read address data ADA which is random address data supplied from the address storage circuit 110, and transforms it to an interleaving address data. The interleaving address transforming circuit 403 supplies the address selection circuit 405 with six sequences of address data AA0, BA0, AA1, BA1, AA2 and BA2, for example, obtained via the conversion. Also, the interleaving address transforming circuit 403 generates, based in input information, four sequences of control signals IOBS, IOBP0, IOBP1 and IOBP2 for example to designate a selecting operation of the output data selection circuit 408, and supplies these control signals to the output data selection circuit 408.

The delay address transforming circuit 404 selects a desired one of the delaying-use write address data DWA and delaying-use read address data DRA supplied from the delaying-use address generation circuit 401, and transforms it to delaying-use address data. The delay address transforming circuit 404 supplies the address selection circuit 405 with two sequences of address data DAA and DBA for example thus obtained via the conversion. Also, the delay address transforming circuit 404 generates, based on input information, two sequences of control signals DOBS and DOBP for example to designate a selecting operation of the output data selection circuit 408, and supplies these control signals to the output data selection circuit 408.

Based on the interleaver type information CINT supplied from the control circuit 60 and interleaver no-output position information CNO supplied from the control circuit 400, the address selection circuit 405 selects either address data AA0, AB0, AA1, BA1, AA2 and BA2 supplied from the interleave address transforming circuit 403 or address data DAA and DBA supplied from the delay address transforming circuit 404, whichever is to be distributed to the storage circuits $407_1, 407_2, \ldots, 407_{16}$. The address selection circuit 405 supplies the thus selected address data as AR01, AR02, ..., AR15 to the storage circuits $407_1, 407_2, \ldots, 407_{16}$.

Also, the address selection circuit 405 is supplied with the interleaver type information CINT and interleaver no-output position information CNO, and in addition, control signals (not shown) generated by the control circuit 400, and supplied via the interleaving address transforming circuit 405, which are a write enable signals for enabling data write to the storage circuits $407_1, 407_2, \ldots, 407_{16}$ when making interleaving or de-interleaving and a signal indicating a write bank, and control signals generated by the delay address transforming circuit 404, which are a write enable signal for enabling data write to the storage circuits $407_1, 407_2, \ldots, 407_{16}$ when providing a delay and a signal indicating a write bank. The address selection circuit 405 generates, based on these pieces of information, a write enable signal XWE for the storage circuits $407_1, 407_2, \ldots, 407_{16}$, clock inhibit signal IH for inhibiting clock signals to the storage circuits $407_1, 407_2, \ldots, 407_{16}$ and a partial-write control signal PW for allowing a so-called partial write of data to the storage circuits $407_1, 407_2, \ldots, 407_{16}$. The address selection circuit 405 supplies these write enable signal XWE, clock inhibit signal IH and partial-write control signal PW to the storage circuits $407_1, 407_2, \ldots, 407_{16}$.

The input data selection circuit 406 is supplied with three sequences of data TII0, TII1 and TII2, for example, from the selector $120_4$ as data I0, I1 and I2, and also with data D0, D1, D2, D3, D4 and D5 from the odd length delay compensation circuit 402. Based on the interleaving mode signal CDIN supplied from outside, interleaver type information CINT and interleaver input/output replacement information CIPT supplied from the control circuit 60, the input data selection circuit 406 selects a one of the data I0, I1, I2, D0, D1, D2, D3, D4 and D5, which is to be distributed to the storage circuits $407_1, 407_2, \ldots, 407_{16}$. In particular, when interleaving or de-interleaving input data, the input data selection circuit 406 is supplied with data I0, I1 and I2 and selects a one of these data I0, I1 and I2, which is to be distributed to the storage circuits $407_1, 407_2, \ldots, 407_{16}$. Also, when delaying input data, the input data selection circuit 406 is supplied with delaying-use data D0, D1, D2, D3, D4 and D5 and selects a one of these data D0, D1, D2, D3, D4 and D5, which is to be distributed to the storage circuits $407_1, 407_2, \ldots, 407_{16}$. The input data selection circuit 406 supplies the selected data as IR00, IR01, . . ., IR15 to the storage circuits $407_1, 407_2, \ldots, 407_{16}$, respectively.

Note that when interleaving a plurality of symbols, the above input data selection circuit 406 can make a mutual replacement between the symbols as will further be described later. That is, the input data selection circuit 406 has a function to change the sequence of the symbols of the input data I0, I1 and I2 on the basis of the interleaver input/output replacement information CIPT.

Each of the storage circuits $407_1, 407_2, \ldots, 407_{16}$ includes, in addition to a RAM having a partial-write function, a plurality of selectors. The storage circuits $407_1, 407_2, \ldots, 407_{16}$ write and store data IR00, IR01, . . ., IR15, respectively, supplied from the input data selection circuit 406 to addresses designated by address data AR00, AR01, . . ., AR15, respectively, supplied from the address selection circuit 405. Then, the storage circuits $407_1, 407_2, \ldots, 407_{16}$ read data from the addresses designated by the address data AR00, AR01, . . ., AR15, respectively, supplied from the address selection circuit 405, and supply them as data OR00, OR01, . . ., OR15 to the output data selection circuit 408. At this time, each of the storage circuits $407_1, 407_2, \ldots, 407_{16}$ starts data write based on the write enable signal XWE supplied from the address selection circuit 405. Also, each of the storage circuits $407_1, 407_2, \ldots, 407_{16}$ can stop all operations including the data write and/or read on the basis of the clock inhibit signal IH.

Further, each of the storage circuits $407_1, 407_2, \ldots, 407_{16}$ can write data by the partial-write function on the basis of the partial-write control signal PW. That is to say, data write to an ordinary RAM is such that when an address is designated, memory cells at the number of bits corresponding to the address are selected and information is written to all these selected memory cells at a time. On the other hand, data write to a partial-write type RAM is such that information is not written to all the selected memory cells at a time but it is written to only a one, at an arbitrary bit, of the memory cells selected according to the address. Each of the storage circuits $407_1, 407_2, \ldots, 407_{16}$ includes such a partial-write type RAM, and thus can write information to a part of designated addresses on the basis of the partial-write control signal PW.

The interleaver 100 can interleave or de-interleave data, and delay a received value by controlling data write from, and/or data read to, these storage circuits $407_1, 407_2, \ldots, 407_{16}$.

Figure 58:
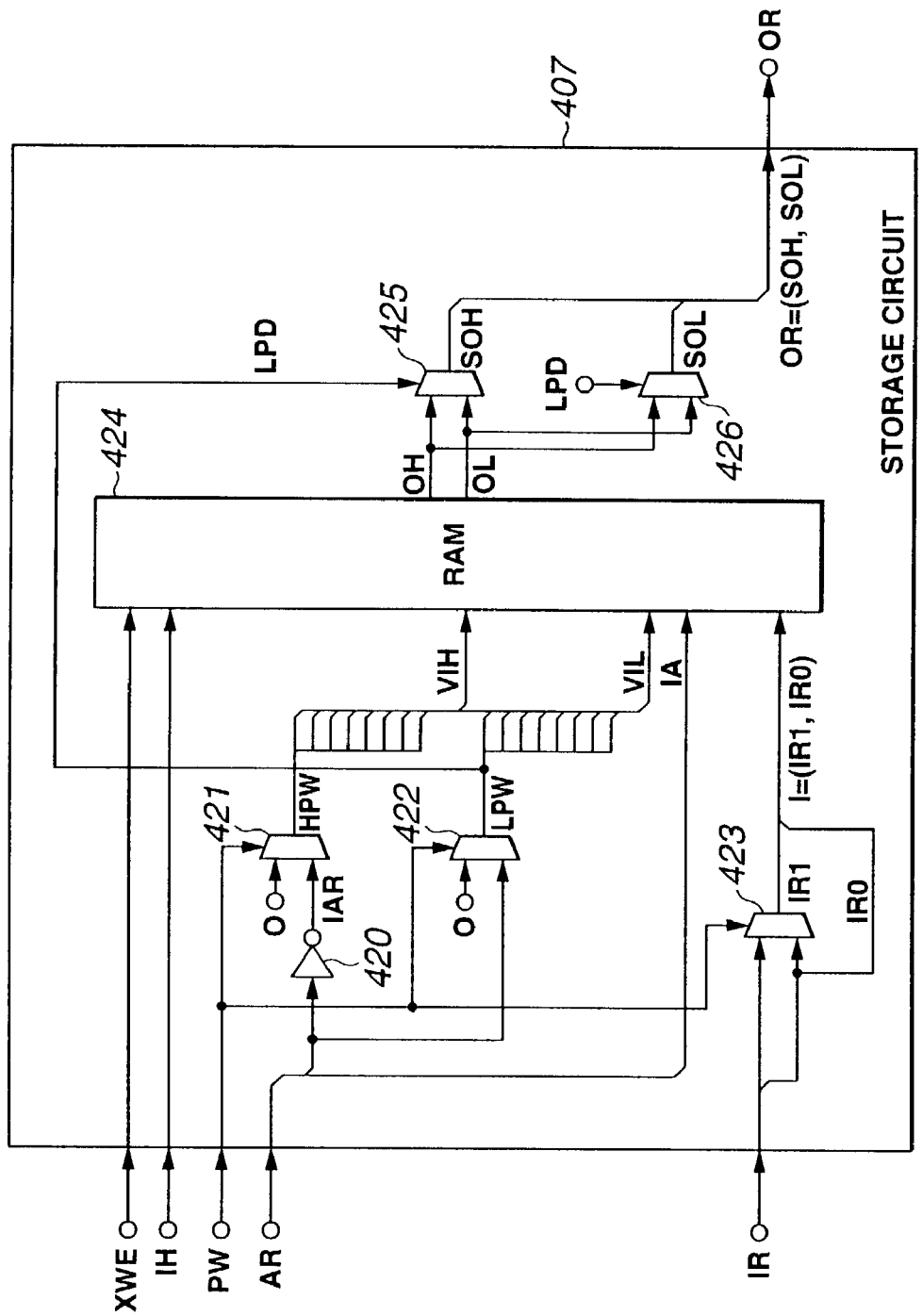
FIG. 58 is a block diagram of a storage circuit included in the interleaver.

More particularly, each of the storage circuits $407_1, 407_2, \ldots, 407_{16}$ can be implemented as a one including, as shown in FIG. 58 for example, an inverter 420, five selectors 421, 422, 423, 425, 426, and a RAM 424 having the partial-write function. Note that in FIG. 58, the storage circuits are shown as generically denoted by a single one indicated with a reference 407, address data AR00, AR01, . . ., AR15 supplied from the address selection circuit 405 are shown as generically denoted by a single one indicated with a reference AR, data IR00, IR01, . . ., IR15 supplied from the input data selection circuit 406 are shown as generically denoted by data indicated with a reference IR, and the data OR00, OR01, . . ., OR15 supplied from the output data selection circuit 408 are shown as generically denoted by data indicated with a reference OR.

The inverter 420 is supplied with MSB of the address data AR and inverts it. This inverter 420 supplies data obtained via the inversion as IAR to the selector 421.

The selector 421 selects, based on the partial-write control signal PW supplied from the address selection circuit 405, either inverted bit IAR supplied from the inverter 420 or a bit whose value is "0", and outputs it as one-bit data HPW. More specifically, the selector 421 selects the inverted bit IAR when the partial-write control signal PW designates data write by the partial-write function. The data HPW selected by the selector 421 is parallel transformed to eight bits for example and supplied as data VIH to the RAM 424.

The selector 422 selects, based on the partial-write control signal PW supplied from the address selection circuit 405, either MSB of the address data AR or a bit whose value is "0", and outputs it as one-bit data LPW. More specifically, the selector 422 selects the MSB of the address data AR when the partial-write control signal PW designates data write by the partial-write function. The data LPW selected by the selector 422 is parallel transformed to eight bits for example and supplied as data VIL to the RAM 424.

The selector 423 is supplied with the data IR divided in upper and lower bits. For example, when the data IR is of 16 bits, the selector 423 is supplied with data IR (15:8) of upper eight bits and data IR [7:0] of lower eight bits. The selector 423 selects, based on the partial-write control signal PW supplied from the address selection circuit 405, either the upper bits or lower bits of the data IR. More particularly, when the partial-write control signal PW designates the data write by the partial-write function, the selector 423 selects the lower bits of the data IR. The data IR1 selected by the selector 423 is tied with data IR0 of the lower bits of the data IR, and supplied as data I (={IR1, IR0}) to the RAM 424.

Briefly, the RAM 424 writes the data IR or read data OR based on the address data AR. However, since it has the partial-write function as mentioned above, it is not so constructed that it will simply be supplied with the address data AR and data IR and output the data OR.

The RAM 424 is supplied with the write enable signal XWE and clock inhibit signal IH from the address selection circuit 405. Supplied with the enable signal XWE, the RAM 424 is enabled to store data. There is written to the RAM 424 the data I (={IR1, IR0}) on the basis of the address data IA resulted from elimination of the MSB from the address data AR, and the data VIH and VIL. Also, based on the address data IA, data VIH and VIL, data OH and OL are read from the RAM 424. These data OH and OL are both supplied to the selectors 425 and 426. Also, when supplied with the clock inhibit signal IH, the RAM 424 stops all operations including the data write and/or data read.

Note that each data written to, and read from, the RAM 424 will be described in detail later.

The selector 425 selects, based on the data LPD resulted from a predetermined delay of the data LPW supplied from the selector 422, either the data OH or OL supplied from the RAM 424, and outputs it as data SOH. More specifically, the selector 425 selects the data OH when the data LPD is "0", and the data OL when the data LPD is "1". That is, the selector 425 is provided, taking in the data write and read by the partial-write function, to determine which is to be outputted, the data of upper bits or data of lower bits, depending upon the direction of addressing.

The selector 426 selects, based on the data LPD resulted from a predetermined delay of the data LPW supplied from the selector 422, either the data OH or OL supplied from the RAM 424, and outputs it as data SOL. More specifically, the selector 426 selects the data OL when the data LPD is "0", and the data OH when the data LPD is "1". That is, the selector 426 is provided, taking in consideration the data write and read by the partial-write function, similarly to the selector 425, to determine which is to be outputted, the data of upper bits or data of lower bits, depending upon the direction of addressing.

Note that the data SOH selected by the selector 425 and data SOL selected by the selector 426 are supplied as data OR (={SOH, SOL}) to the output data selection circuit 408.

The above storage circuits $407_1, 407_2, \ldots, 407_{16}$ are based on the address data AR00, AR01, . . ., AR15, respectively, to write data IR00, IR01, . . ., IR15 and read data OR00, OR01, . . ., OR15.

Note that each of the storage circuits $407_1, 407_2, \ldots, 407_{16}$ can store data by the partial-write function, which will be described in detail later.

Based on the interleaving mode signal CDIN supplied from outside, interleaver type information CINT and interleaver input/output replacement information CIPT supplied from the control circuit 60, control signals IOBS, IOBP0, IOBP1 and IOBP2 supplied from the interleaving address transforming circuit 403 and control signals DOBS and SOBP supplied from the delay address transforming circuit 404, the output data selection circuit 408 selects a one to be outputted, of the data IR00, IR01, . . ., IR15 supplied from the storage circuits $407_1, 407_2, \ldots, 407_{16}$. When the input data has been interleaved or de-interleaved, the output data selection circuit 408 supplies the selected data as three sequences of interleaver output data IIO0, IIO1 and IIO2 for example to the selector $120_7$. Also, when the input data has been delayed, the output data selection circuit 408 supplies the selected data as six sequences of interleaving length delayed received values IDO0, IDO1, IDO2, IDO3, ID04 and IDO5 to the selector $120_6$.

Note that when de-interleaving a plurality of symbols, the output data selection circuit 408 can make a mutual replacement between symbols as will be described in detail later. That is, the output data selection circuit 408 has a function to reshuffle the symbols for to-be-outputted interleaver output data IIO0, IIO1 and IIO2 based on the interleaves input/output replacement information CIPT.

When interleaving data, the interleaver 100 having been described in the foregoing uses the write address data IWA generated by the control circuit 400 and which is the sequential address data to distribute addresses to appropriate storage circuits $407_1, 407_2, \ldots, 407_{16}$ by the address selection circuit 405, and to appropriate storage circuits $407_1, 407_2, \ldots, 407_{16}$ by the input data selection circuit 406 and write the data I0, I1 and I2 to these storage circuits $407_1, 407_2, \ldots, 407_{16}$. On the other hand, the interleaver 100 uses the read address data ADA read from the address storage circuit 110 on the basis of the sequential address data IAA generated by the control circuit 400 and which is random address data to distribute addresses to appropriate storage circuits $407_1, 407_2, \ldots, 407_{16}$ by the address selection circuit 405 and read data from the storage circuits $407_1, 407_2, \ldots, 407_{16}$. Then the interleaver 100 selects data output from appropriate storage circuits $407_1, 407_2, \ldots, 407_{16}$ by the output data selection circuit 408, and outputs the data as interleaver output data IIO0, IIO1 and IIO2. Thus, the interleaver 100 can interleave the data.

Also, when de-interleaving data, the interleaver 100 uses the read address data ADA, being a random address data, read from the address storage circuit 110 based on the sequential address data IAA generated by the control circuit 400 to distribute addresses to appropriates storage circuits $407_1, 407_2, \ldots, 407_{16}$ by the address selection circuit 405, and to appropriate storage circuits $407_1, 407_2, \ldots, 407_{16}$ by the input data selection circuit 406 and write the data I0, I1 and I2 to these storage circuits $407_1, 407_2, \ldots, 407_{16}$. On the other hand, the interleaver 100 uses the write address data IWA generated by the control circuit 400 and which is sequential address data to distribute addresses to appropriate storage circuits $407_1, 407_2, \ldots, 407_{16}$ by the address selection circuit 405 and read data from the storage circuits $407_1, 407_2, \ldots, 407_{16}$. Then the interleaver 100 selects data output from appropriate storage circuits $407_1$, $407_2$, ..., $407_{16}$ by the output data selection circuit 408, and outputs the data as interleaver output data IIO0, IIO1 and IIO2. Thus, the interleaver 100 can de-interleave the data.

Also, when delaying input, the interleaver 100 uses the write address data IWA generated by the control circuit 400 to distribute addresses to appropriate storage circuits $407_1$, $407_2$, ..., $407_{16}$ by the address selection circuit 405, and to appropriate storage circuits $407_1$, $407_2$, ..., $407_{16}$ by the input data selection circuit 406 and write the data D0, D1, D2, D3, D4 and D5 to these storage circuits $407_1$, $407_2$, ..., $407_{16}$. On the other hand, the interleaver 100 uses the interleaving length delay read address data IRA generated by the control circuit 400 and which is sequential address data to distribute addresses to appropriate storage circuits $407_1$, $407_2$, ..., $407_{16}$ by the address selection circuit 405 and read data from the storage circuits $407_1$, $407_2$, ..., $407_{16}$. Then the interleaver 100 selects data output from appropriate storage circuits $407_1$, $407_2$, ..., $407_{16}$ by the output data selection circuit 408, and outputs the data as interleaver output data IDO0, IDO1, IDO2, IDO3, IDO4 and IDO5. Thus, the interleaver 100 can delay the input data.

Next, how to use the RAM in the interleaver 100 will be described concerning possible examples.

The element decoder 50 includes sixteen RAMs included in the storage circuits $407_1$, $407_2$, ..., $407_{16}$, respectively, in the interleaver 100, as data RAMs, and a plurality of RAMs included in the address storage circuit 110, as address RAMs. It is assumed herein that the sixteen RAMs included in the storage circuits $407_1$, $407_2$, ..., $407_{16}$, respectively, have a storage capacity of 16 bits by 4096 words and the address storage circuit 110 includes six RAMs having a storage capacity of 14 bits by 4096 words. The RAMs in the storage circuits $407_1$, $407_2$, ..., $407_{16}$, respectively, will be referred to as D01, D02, ..., D16, respectively, and the RAMs in the address storage circuit 110 will be referred to as RAMA.

First, an example of random interleaving of one-symbol input data will be described. It is assumed herein that the encoder 1 is to make the PCCC at a rate of "more than ⅙" and input data has a size of "less than 16 kilowords".

In this case, the interleaver 100 has to interleave one-symbol data and delay 6-symbol data. To this end, the interleaver 100 uses twelve RAMs D01, D02, D03, D04, D05, D06, D07, D08, D09, D10, D11 and D12 of the sixteen RAMs D01, D02, ..., D16 for the delaying operation as shown in FIG. 59A and the remaining four RAMs D13, D14, D15 and D16 for the interleaving operation as shown in FIG. 59B. Also, arbitrary four of the six RAMs RAMA may be used as address RAMs as shown in FIG. 59C. Therefore, the interleaver 100 and address storage circuit 110 will not use two of the RAMs RAMA as shown in FIG. 59D.

More specifically, the interleaver 100 uses the RAMs D01, D02, D05, D06, D09, D10, D13 and D14 as the aforementioned bank A ($A_0$, $A_1$) and the RAMs D03, D04, D07, D08, D11, D12, D15 and D16 as the bank B ($B_0$, $B_1$), as shown in FIGS. 59A and 59B. That is, the interleaver 100 reads data from the RAMs D03, D04, D07, D08, D11, D12, D15 and D16 when the data has been written to the RAMs D01, D02, DO5, D06, D09, D10, D13 and D14, and from the RAMs D01, D02, D05, D06, D09, D10, D13 and D14 when the data has been written to the RAMs D03, D04, D07, D08, D11, D12, D15 and D16.

Based on the address data AR00 and AR01 supplied from the address selection circuit 405, delaying-use data D0 and D1 are supplied and written as data IR00 and IR01 to the RAMs D01 and D02, respectively, from the input data selection circuit 406. At this time, 0 to 4 kilowords of data of the data D0 and D1 are written to the RAM D01, while four to eight kilowords of data are written to the RAM D02. Also, based on the address data AR04 and AR05 supplied from the address selection circuit 405, delaying-use data D2 and D3 are supplied and written as data IR04 and IR05 to the RAMs D05 and D06 from the input data selection circuit 406. At this time, 0 to 4 kilowords of data of the data D2 and D3 are written to the RAM DOS, while four to eight kilowords of data are written to the RAM D06. Further, based on the address data AR08 and AR09 supplied from the address selection circuit 405, delaying-use data D4 and D5 are supplied and written as data IR08 and IR09 to the RAMs D09 and D10 from the input data selection circuit 406. At this time, 0 to 4 kilowords of data of the data D4 and D5 are written to the RAM D09, while four to eight kilowords of data are written to the RAM D10.

At the same time, data are read from the RAMs D03, D04, D07, D08, D11 and D12, and supplied as data OR02, OR03, OR06, OR07, OR10 and OR11 to the output data selection circuit 408. Note that the data read is effected based on the address data supplied from the address selection circuit 405 similarly to the data write.

Similarly, based on the address data AR02 and AR03 supplied from the address selection circuit 405, delaying-use data D0 and D1 are supplied and written as data IR02 and IR03 to the RAMs D03 and D04, respectively, from the input data selection circuit 406. At this time, 0 to 4 kilowords of data of the data D0 and D1 are written to the RAM D03, while four to eight kilowords of data are written to the RAM D04. Also, based on the address data AR06 and AR07 supplied from the address selection circuit 405, delaying-use data D2 and D3 are supplied and written as data IR06 and IR07 to the RAMs D07 and D08 from the input data selection circuit 406. At this time, 0 to 4 kilowords of data of the data D2 and D3 are written to the RAM D07, while four to eight kilowords of data are written to the RAM D08. Further, based on the address data AR10 and AR11 supplied from the address selection circuit 405, delaying-use data D4 and D5 are supplied and written as data IR10 and IR11 to the RAMs D11 and D12 from the input data selection circuit 406. At this time, 0 to 4 kilowords of data of the data D4 and D5 are written to the RAM D11, while four to eight kilowords of data are written to the RAM D12.

At the same time, data are read from the RAMs D01, D02, D05, D06, D09 and D10, and supplied as data OR00, OR01, OR04, OR05, OR08 and OR09 to the output data selection circuit 408. Note that the data read is effected based on the address data supplied from the address selection circuit 405 similarly to the data write.

Also, based on the partial-write control signal PW, each of the RAMs D13, D14, D15 and D16 works as a RAM having the partial-write function and a storage capacity of 8 bits by 8192 words.

Based on the address data AR12 and AR13 supplied from the address selection circuit 405, interleaving data I0 is supplied and written as data IR12 and IR13 to the RAMs D13 and D14 from the input data selection circuit 406. At this time, 0 to 8 kilowords of data of the data I0 are written to the RAM D13, while 8 to 16 kilowords of data are written to the RAM D14.

At the same time, data are read as data OR14 and OR15 from the RAMs D15 and D16, and supplied to the output data selection circuit 408. Note that the data read is effected based on the address data supplied from the address selection circuit 405 similarly to the data write.

Similarly, based on the address data AR14 and AR15 supplied from the address selection circuit 405, interleaving data I0 is supplied and written as data IR15 and IR16 to the RAMs D15 and D16 from the input data selection circuit 406. At this time, 0 to 8 kilowords of data of the data I0 are written to the RAM D15, while 8 to 16 kilowords of data of the data I0 are written to the RAM D16.

At the same time, data are read as data OR12 and OR13 from the RAMs D13 and D14, and supplied to the output data selection circuit 408. Note that the data read is effected based on the address data supplied from the address selection circuit 405 similarly to the data write.

Thus, the interleaver 100 can make a random interleaving and delaying of one-symbol input data having been subjected to the PCCC by the encoder 1 at a rate of "more than $\frac{1}{6}$" and whose size is "less than 16 kilowords".

Next, an example of random interleaving of two-symbol input data will be described. It is assumed herein that the encoder 1 is to make SCCC at a rate of "more than $\frac{1}{3}$" and input data has a size of "less than 8 kilowords".

Figure 60A:
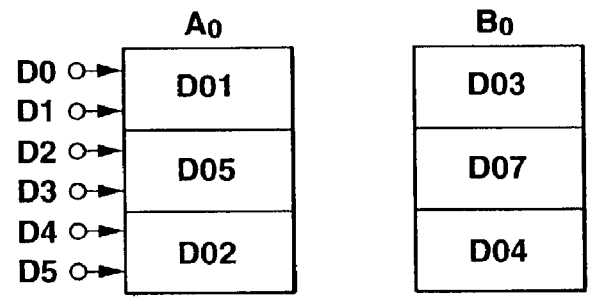
Figure 60B:
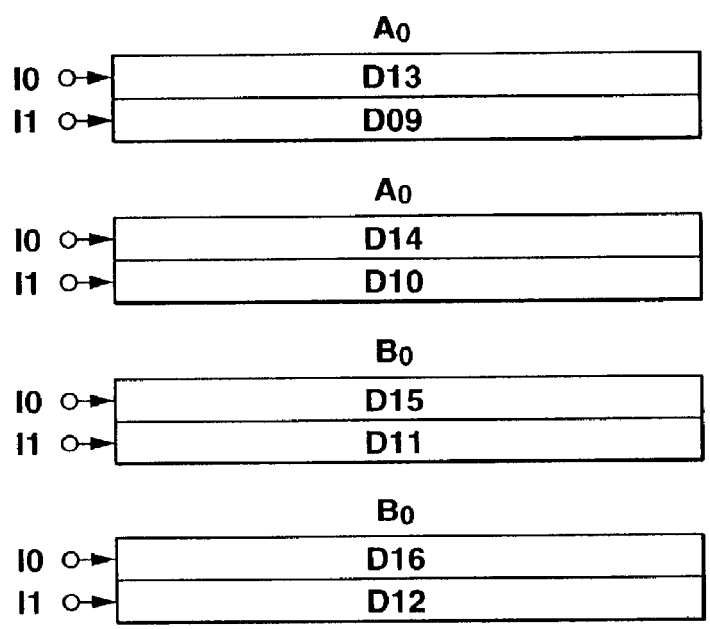
Figure 60C:
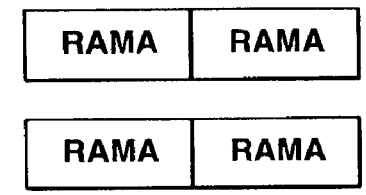
Figure 60D:
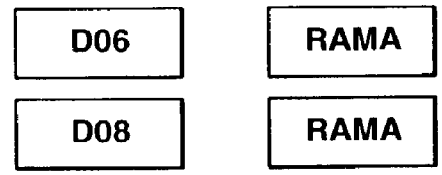

In this case, the interleaver 100 has to interleave two-symbol data and delay 6-symbol data. To this end, the interleaver 100 uses six RAMs D01, D02, D03, D04, D05 and D07 of the sixteen RAMs D01, D02, . . ., D16 for the delaying operation as shown in FIG. 60A and the remaining eight RAMs D09, D10, D11, D12, D13, D14, D15 and D16 for the interleaving operation as shown in FIG. 60B. Also, arbitrary four of the six RAMs RAMA may be used as address RAMs as shown in FIG. 60C. Therefore, the interleaver 100 and address storage circuit 110 will not use two RAMs D06 and D08 and two of the RAMs RAMA as shown in FIG. 60D.

More specifically, the interleaver 100 uses the RAMs D01, D02, D05, D09, D10, D13 and D14 as the aforementioned bank A ($A_0$) and the RAMs D03, D04, D07, D11, D12, D15 and D16 as the bank B ($B_0$), as shown in FIGS. 60A and 60B. That is, the interleaver 100 reads data from the RAMs D03, D04, D07, D11, D12, D15 and D16 when the data has been written to the RAMs D01, D02, D05, D09, D10, D13 and D14, and from the RAMs D01, D02, D05, D09, D10, D13 and D14 when the data has been written to the RAMs D03, D04, D07, D11, D12, D15 and D16.

Based on the address data AR00 supplied from the address selection circuit 405, delaying-use data D0 and D1 are supplied and written as data IR00 to the RAM D01 from the input data selection circuit 406. At this time, 0 to 4 kilowords of data of the data D0 and D1 are written to the RAM D01. Also, based on the address data AR04 supplied from the address selection circuit 405, delaying-use data D2 and D3 are supplied and written as data IR04 to the RAM D05 from the input data selection circuit 406. At this time, 0 to 4 kilowords of data of the data D2 and D3 are written to the RAM D05. Further, based on the address data AR01 supplied from the address selection circuit 405, delaying-use data D4 and D5 are supplied and written as data IR01 to the RAM D02 from the input data selection circuit 406. At this time, 0 to 4 kilowords of data of the data D4 and D5 are written to the RAM D02.

At the same time, data are read from the RAMs D03, D04 and D07, and supplied as data OR02, OR03 and OR06 to the output data selection circuit 408. Note that the data read is effected based on the address data supplied from the address selection circuit 405 similarly to the data write.

Similarly, based on the address data AR02 supplied from the address selection circuit 405, delaying-use data D0 and D1 are supplied and written as data IR02 to the RAM D03 from the input data selection circuit 406. At this time, 0 to 4 kilowords of data of the data D0 and D1 are written to the RAM D03. Also, based on the address data AR06 supplied from the address selection circuit 405, delaying-use data D2 and D3 are supplied and written as data IR06 to the RAM D07 from the input data selection circuit 406. At this time, 0 to 4 kilowords of data of the data D2 and D3 are written to the RAM D07. Further, based on the address data AR03 supplied from the address selection circuit 405, delaying-use data D4 and D5 are supplied and written as data IR03 to the RAM D04 from the input data selection circuit 406. At this time, 0 to 4 kilowords of data of the data D4 and D5 are written to the RAM D04.

At the same time, data are read from the RAMs D01, D02 and D05, and supplied as data OR00, OR01 and OR04 to the output data selection circuit 408. Note that the data read is effected based on the address data supplied from the address selection circuit 405 similarly to the data write.

Also, each of the RAMs D09, D10, D11, D12, D13, D14, D15 and D16 takes the partial-write control signal PW as the basis to work as a RAM having the partial-write function and a pseudo storage capacity of 8 bits by 8192 words.

Based on the address data AR12 supplied from the address selection circuit 405, interleaving data I0 is supplied and written as data IR12 to the RAM D13 from the input data selection circuit 406. At this time, 0 to 8 kilowords of data of the interleaving data I0 are written to the RAM D13. Similarly to the RAM D13, based on the address data AR13 supplied from the address selection circuit 405, interleaving data I0 is supplied and written as data IR13 to the RAM D14 from the input data selection circuit 406. At this time, 0 to 8 kilowords of data of the interleaving data I0 are written to the RAM D14. Also, based on the address data AR08 supplied from the address selection circuit 405, interleaving data I1 is supplied and written as data IR08 to the RAM D09 from the input data selection circuit 406. At this time, 0 to 8 kilowords of data of the interleaving data I1 is written to the RAM D09. Further, based on the address data AR09 supplied from the address selection circuit 405, interleaving data I1 is supplied and written as data IR09 to the RAM D10 from the input data selection circuit 406, similarly to the RAM D09. At this time, 0 to 8 kilowords of data of the interleaving data I1 is written to the RAM D10.

At the same time, data are read as data OR10 and OR14 from the RAMs D11 and D15, and supplied as one sequences of symbol data of two-symbol data to the output data selection circuit 408. Also, data are read as data OR11 and OR15 from the RAMs D12 and D16, and supplied as the other sequences of symbol data of the two-symbol data to the output data selection circuit 408. Note that the data read is effected based on the address data supplied from the address selection circuit 405 similarly to the data write.

Similarly, based on the address data AR14 supplied from the address selection circuit 405, interleaving data I0 is supplied and written as data IR14 to the RAM D15 from the input data selection circuit 406. At this time, 0 to 8 kilowords of data of the data I0 are written to the RAM D15. Also, similarly to the RAM D15, based on the address data AR15 supplied from the address selection circuit 405, interleaving data I0 is supplied and written as data IR15 to the RAM D16 as well from the input data selection circuit 406. At this time, 0 to 8 kilowords of data of the data I0 are written to the RAM D16. Further, based on the address data AR10 supplied from the address selection circuit 405, interleaving data I1 is supplied and written as data IR10 to the RAM D11 from the input data selection circuit 406. At this time, 0 to 8 kilowords of data of the data I1 are written to the RAM D11. Furthermore, similarly to the RAM D11, based on the address data AR11 supplied from the address selection circuit 405, interleaving data I1 is supplied and written as data IR11 to the RAM D12 as well from the input data selection circuit 406. At this time, 0 to 8 kilowords of data of the data I1 are written to the RAM D12.

At the same time, data are read as data OR08 and OR12 from the RAMs D09 and D13, and supplied as one sequences of symbol data of the two-symbol data to the output data selection circuit 408. Also, data are read as data OR09 and OR13 from the RAMs D10 and D14, and supplied as the other sequences of symbol data of the two-symbol data to the output data selection circuit 408. Note that the data read is effected based on the address data supplied from the address selection circuit 405 similarly to the data write.

Thus, the interleaver 100 can make a random interleaving and delaying of two-symbol input data having been subjected to SCCC by the encoder 1 at a rate of "more than 1/3" and whose size is "less than 8 kilowords".

Next, an example of inline interleaving of two-symbol input data will be described. It is assumed herein that the encoder 1 is to make a punctured SCCC and input data has a size of "less than 12 kilowords".

Figure 61A:
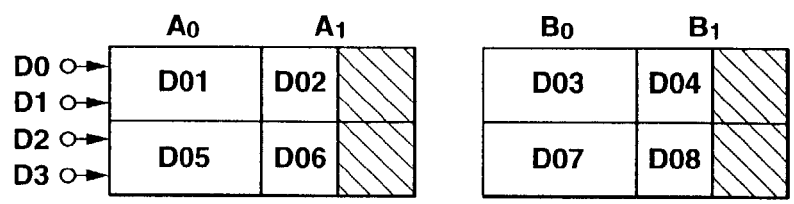
Figure 61B:
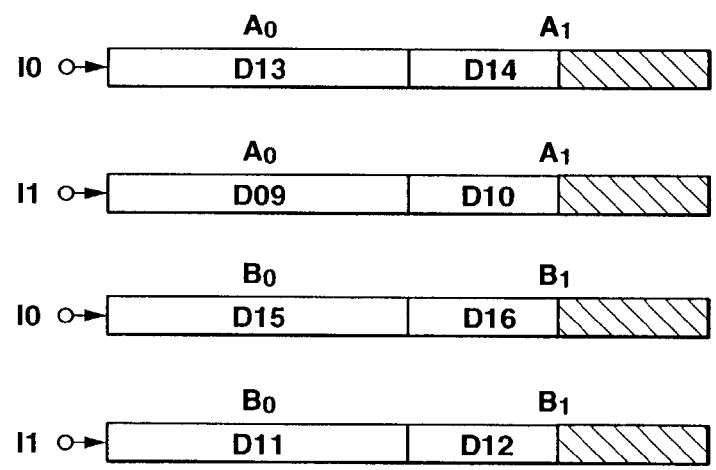
Figure 61C:
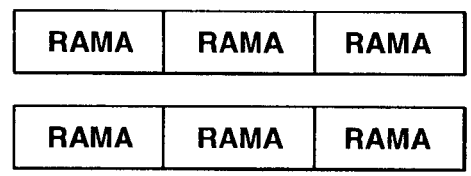

In this case, the interleaver 100 has to interleave two-symbol data and delay four-symbol data. To this end, the interleaver 100 uses eight RAMs D01, D02, D03, D04, D05, D06, D07 and D08 of the sixteen RAMs D01, D02, ..., D16 for the delaying operation as shown in FIG. 61A and the eight RAMs D09, D10, D11, D12, D13, D14, D15 and D16 for the interleaving operation as shown in FIG. 61B. Also, all the six RAMs RAMA will be used as address RAMs as shown in FIG. 61C.

More specifically, the interleaver 100 uses the RAMs D01, D02, D05, D06, D09, D10, D13 and D14 as the aforementioned bank A ($A_0$, $A_1$) and the RAMs D03, D04, D07, D08, D11, D12, D15 and D16 as the bank B ($B_0$, $B_1$), as shown in FIGS. 61A and 61B. That is, the interleaver 100 reads data from the RAMs D03, D04, D07, D08, D11, D12, D15 and D16 when the data has been written to the RAMs D01, D02, D05, D06, D09, D10, D13 and D14, and from the RAMs D01, D02, D05, D06, D09, D10, D13 and D14 when the data has been written to the RAMs D03, D04, D07, D08, D11, D12, D15 and D16.

Based on the address data AR00 and AR01 supplied from the address selection circuit 405, delaying-use data D0 and D1 are supplied and written as data IR00 and IR01 to the RAMs D01 and D02, respectively, from the input data selection circuit 406. At this time, the RAM D02 will store data D0 and D1 in only a half of the storage area in the word direction as shown hatched in FIG. 61A, not in the rest of the storage area. That is, 0 to 4 kilowords of data of the data D0 and D1 are written to the RAM D01, while 4 to 6 kilowords of data are written to the RAM D02. Also, based on the address data AR04 and AR05 supplied from the address selection circuit 405, delaying-use data D2 and D3 are supplied and written as data IR04 and IR05 to the RAMs D05 and D06 from the input data selection circuit 406. At this time, similarly to the RAM D02, the RAM D06 will store the data D2 and D3 in only the half of the storage area in the word direction as shown hatched in FIG. 61A, not in the rest of the storage area. That is, 0 to 4 kilowords of data of the data D2 and D3 are written to the RAM D05, while 4 to 6 kilowords of data are written to the RAM D06.

At the same time, data are read from the RAMs D03, D04, D07 and D08, and supplied as data OR02, OR03, OR06 and OR07, respectively, to the output data selection circuit 408. At this time, the RAM D04 and D08 will store data in only a half of the storage area in the word direction as shown hatched in FIG. 61A, but not in the rest of the storage area. Note that the data read is effected based on the address data supplied from the address selection circuit 405 similarly to the data write.

Similarly, based on the address data AR02 and AR03 supplied from the address selection circuit 405, delaying-use data D0 and D1 are supplied and written as data IR02 and IR03 to the RAMs D03 and D04, respectively, from the input data selection circuit 406. At this time, the RAM D04 will store the data D0 and D1 in only a half of the storage area in the word direction, but not in the rest of the storage area, as shown hatched in FIG. 61A. That is, 0 to 4 kilowords of data of the data D0 and D1 are written to the RAM D03, while 4 to 6 kilowords of data are written to the RAM D04. Also, based on the address data AR06 and AR07 supplied from the address selection circuit 405, delaying-use data D2 and D3 are supplied and written as data IR06 and IR07 to the RAMs D07 and D08 from the input data selection circuit 406. At this time, similarly to the RAM D04, the RAM D08 will store the data D2 and D3 in only the half of the storage area, but not in the rest of the storage area, as shown hatched in FIG. 61A. That is, 0 to 4 kilowords of data of the data D2 and D3 are written to the RAM D07, while 4 to 6 kilowords of data are written to the RAM D08.

At the same time, data are read from the RAMs D01, D02, D05 and D06, and supplied as data OR00, OR01, OR04 and OR05 to the output data selection circuit 408. At this time, the RAMs D02 and D06 store the data in only a half of the storage area as shown hatched in FIG. 61A, but not in the rest of the storage area. Note that the data read is effected based on the address data supplied from the address selection circuit 405 similarly to the data write.

Also, based on the partial-write control signal PW, each of the RAMs D09, D10, D11, D12, D13, D14, D15 and D16 works as a RAM having the partial-write function and a pseudo storage capacity of 8 bits by 8192 words.

Based on the address data AR12 and AR13 supplied from the address selection circuit 405, interleaving data I0 is supplied and written as data IR12 and IR13 to the RAMs D13 and D14 from the input data selection circuit 406. At this time, the RAM D14 will store the data in only a half of the storage area, but not in the rest of the storage area as shown hatched in FIG. 61B. That is, 0 to 8 kilowords of data of the data I0 are written to the RAM D13, while 8 to 12 kilowords of data are written to the RAM D14. Also, based on the address data AR08 and AR09 supplied from the address selection circuit 405, interleaving data I1 is supplied and written as data IR08 and IR09 to the RAMs D9 and D10 from the input data selection circuit 406, similarly to the RAM D14. At this time, the RAM D10 will store the data I1 in only the half of the storage area, but not in the rest of the storage area as shown hatched in FIG. 61B. That is, 0 to 8 kilowords of data of the data I1 are written to the RAM D09, while 8 to 12 kilowords of data are written to the RAM D10.

At the same time, data are read as data OR14 and OR15 from the RAMs D15 and D16, and supplied as one sequences of symbol data of the two-symbol data to the output data selection circuit 408. At this time, the RAM D16 will store the data in only the half of the storage area, but not in the rest of the storage area as shown hatched in FIG. 61B. Also, data are read as data OR10 and OR11 from the RAMs D11 and D12, and supplied as the other sequences of symbol data of the two-symbol data to the output data selection circuit 408. At this time, similarly to the RAM D16, the RAM D12 will store the data in only the half of the storage area, but not in the rest of the storage area as shown hatched in FIG. 61B. Note that the data read is effected based on the address data supplied from the address selection circuit 405 similarly to the data write.

Similarly, based on the address data AR14 and AR15 supplied from the address selection circuit 405, interleaving data I0 is supplied and written as data IR14 and IR15 to the RAMs D15 and D16 from the input data selection circuit 406. At this time, the RAM D16 will store the data I0 in only the half of the storage area, but not in the rest of the storage area as shown hatched in FIG. 61B. That is, 0 to 8 kilowords of data of the data I0 are written to the RAM D15, while 8 to 12 kilowords of data of the data I0 are written to the RAM D16. Also, based on the address data AR10 and AR11 supplied from the address selection circuit 405, interleaving data I1 is supplied and written as data IR10 and IR11 to the RAMs D11 and D12 from the input data selection circuit 406. At this time, similarly to the RAM D16, the RAM D12 will store the data I1 in only the half of the storage area, but not in the rest of the storage area as shown hatched in FIG. 61B. That is, 0 to 8 kilowords of data of the data I1 are written to the RAM D11, while 8 to 12 kilowords of data of the data I0 are written to the RAM D12.

At the same time, data are read as data OR12 and OR13 from the RAMs D13 and D14, and supplied as one sequences of symbol data of the two-symbol data to the output data selection circuit 408. At this time, the RAM D14 will store the data in only the half of the storage area, but not in the rest of the storage area as shown hatched in FIG. 61B. Also, data are read as data OR08 and OR09 from the RAMs D09 and D10, and supplied as the other sequences of symbol data of the two-symbol data to the output data selection circuit 408. At this time, similarly to the RAM D14, the RAM D10 stores the data in only the half of the storage area, but not in the rest of the storage area as shown hatched in FIG. 61B. Note that the data read is effected based on the address data supplied from the address selection circuit 405 similarly to the data write.

Thus, the interleaver 100 can make an inline interleaving and delaying of two-symbol input data having been subjected to punctured SCCC by the encoder 1 and whose size is "less than 12 kilowords".

Next, an example of pair-wise interleaving of two-symbol input data will be described. It is assumed herein that the encoder 1 is to make SCCC.

Figure 62A:
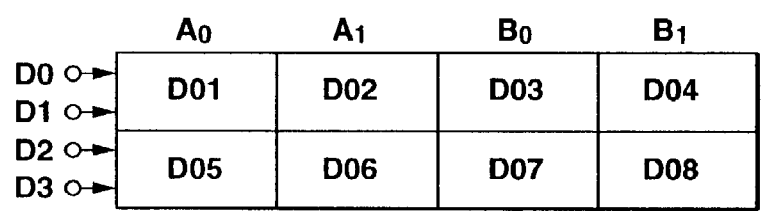
Figure 62B:
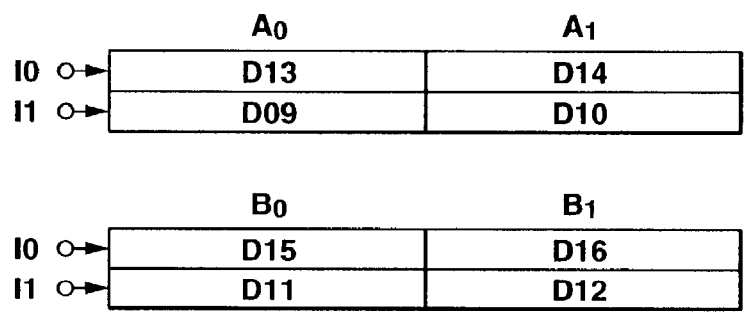
Figure 62C:
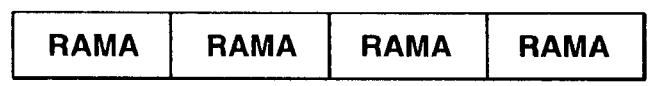
Figure 62D:
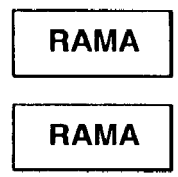

In this case, the interleaver 100 has to interleave two-symbol data and delay four-symbol data. To this end, the interleaver 100 uses eight RAMs D01, D02, D03, D04, D05, D06, D07 and D08 of the sixteen RAMs D01, D02, . . ., D16 for the delaying operation as shown in FIG. 62A and the remaining eight RAMs D09, D10, D11, D12, D13, D14, D15 and D16 for the interleaving operation as shown in FIG. 62B. Also, arbitrary four of the six RAMs RAMA may be used as address RAMs as shown in FIG. 62C. Therefore, the interleaver 100 and address storage circuit 110 will not use two of the RAMs RAMA as shown in FIG. 62D.

More specifically, the interleaver 100 uses the RAMs D01, D02, D05, D06, D09, D10, D13 and D14 as the aforementioned bank A ($A_0$, $A_1$) and the RAMs D03, D04, D07, D08, D11, D12, D15 and D16 as the bank B ($B_0$, $B_1$), as shown in FIGS. 62A and 62B. That is, the interleaver 100 reads data from the RAMs D03, D04, D07, D08, D11, D12, D15 and D16 when the data has been written to the RAMs D01, D02, D05, D06, D09, D10, D13 and D14, and from the RAMs D01, D02, D05, D06, D09, D10, D13 and D14 when the data has been written to the RAMs D03, D04, D07, D08, D11, D12, D15 and D16. At this time, the RAMs D13 and D14, and the RAMs D09 and D10, operate based the same address, and the RAMs D15 and D16, and the RAMs D11 and D12, operate based on the same address.

Based on the address data AR00 and AR01 supplied from the address selection circuit 405, delaying-use data D0 and D1 are supplied and written as data IR00 and IR01 to the RAMs D01 and D02, respectively, from the input data selection circuit 406. At this time, 0 to 4 kilowords of data of the data D0 and D1 are written to the RAM D01, while 4 to 8 kilowords of data are written to the RAM D02. Also, based on the address data AR04 and AR05 supplied from the address selection circuit 405, delaying-use data D2 and D3 are supplied and written as data IR04 and IR05 to the RAMs D05 and D06 from the input data selection circuit 406. At this time, similarly to the RAM D02, 0 to 4 kilowords of data of the data D2 and D3 are written to the RAM D05, while 4 to 8 kilowords of data are written to the RAM D06.

At the same time, data are read from the RAMs D03, D04, D07 and D08, and supplied as data OR02, OR03, OR06 and OR07, respectively, to the output data selection circuit 408. Note that the data read is effected based on the address data supplied from the address selection circuit 405 similarly to the data write.

Similarly, based on the address data AR02 and AR03 supplied from the address selection circuit 405, delaying-use data D0 and D1 are supplied and written as data IR02 and IR03 to the RAMs D03 and D04, respectively, from the input data selection circuit 406. At this time, 0 to 4 kilowords of data of the data D0 and D1 are written to the RAM D03, while 4 to 8 kilowords of data are written to the RAM D04. Also, based on the address data AR06 and AR07 supplied from the address selection circuit 405, delaying-use data D2 and D3 are supplied and written as data IR06 and IR07 to the RAMs D07 and D08 from the input data selection circuit 406. At this time, 0 to 4 kilowords of data of the data D2 and D3 are written to the RAM D07, while 4 to 8 kilowords of data are written to the RAM D08.

At the same time, data are read as data OR00, OR01, OR04 and OR05 from the RAMs D01, D02, D05 and D06, and supplied to the output data selection circuit 408. Note that the data read is effected based on the address data supplied from the address selection circuit 405 similarly to the data write.

Also, each of the RAMs D09, D10, D11, D12, D13, D14, D15 and D16 takes the partial-write control signal PW as the basis to work as a RAM having the partial-write function and a pseudo storage capacity of 8 bits by 8192 words.

Based on the address data AR12 and AR13 supplied from the address selection circuit 405, interleaving data I0 is supplied and written as data IR12 and IR13 to the RAMs D13 and D14 from the input data selection circuit 406. At this time, 0 to 8 kilowords of data of the data I0 are written to the RAM D13, while 8 to 16 kilowords of data are written to the RAM D14. Also, based on the address data AR08 and AR09 supplied from the address selection circuit 405, interleaving data I1 is supplied and written as data IR08 and IR09 to the RAMs D9 and D10 from the input data selection circuit 406. At this time, 0 to 8 kilowords of data of the data I1 are written to the RAM D09, while 8 to 16 kilowords of data are written to the RAM D10.

At the same time, data are read as data OR14 and OR15 from the RAMs D15 and D16, and supplied as one sequences of symbol data of the two-symbol data to the output data selection circuit 408. Also, data are read as data OR10 and OR11 from the RAMs D11 and D12, and supplied as the other sequences of symbol data of the two-symbol data to the output data selection circuit 408. Note that the data read is effected based on the address data supplied from the address selection circuit 405 similarly to the data write.

Similarly, based on the address data AR14 and AR15 supplied from the address selection circuit 405, interleaving data I0 is supplied and written as data IR14 and IR15 to the RAMs D15 and D16 from the input data selection circuit 406. At this time, 0 to 8 kilowords of data of the data I0 are written to the RAM D15, while 8 to 16 kilowords of data of the data I0 are written to the RAM D16. Also, based on the address data AR10 and AR11 supplied from the address selection circuit 405, interleaving data I1 is supplied and written as data IR10 and IR11 to the RAMs D1 and D12 from the input data selection circuit 406. At this time, 0 to 8 kilowords of data of the data I1 are written to the RAM D11, while 8 to 16 kilowords of the data I1 are written to the RAM D12.

At the same time, data are read as data OR12 and OR13 from the RAMs D13 and D14, and supplied as one sequences of symbol data of the two-symbol data to the output data selection circuit 408. Also, data are read as data OR08 and OR09 from the RAMs D09 and D10, and supplied as the other sequences of symbol data of the two-symbol data to the output data selection circuit 408. Note that the data read is effected based on the address data supplied from the address selection circuit 405 similarly to the data write.

Thus, the interleaver 100 can make a pair-wise interleaving and delaying of two-symbol input data having been subjected to punctured SCCC by the encoder 1.

Next, an example of random interleaving of three-symbol input data will be described. It is assumed herein that the encoder 1 is to make SCCC at a rate of "more than ⅓" and input data has a size of "less than 4 kilowords".

In this case, the interleaver 100 has to interleave three-symbol data and delay four-symbol data. To this end, the interleaver 100 uses four RAMs D01, D03, D05 and D07 of the sixteen RAMs D01, D02, . . . , D16 for the delaying operation as shown in FIG. 63A and the remaining twelve RAMs D02, D04, D06, D08, D09, D10, D11, D12, D13, D14, D15 and D16 for the interleaving operation as shown in FIG. 63B. Also, arbitrary three of the six RAMs RAMA may be used as address RAMs as shown in FIG. 63C. Therefore, the interleaver 100 and address storage circuit 110 will not use three of the RAMs RAMA as shown in FIG. 63D.

More specifically, the interleaver 100 uses the RAMs D01, D02, D05, D06, D09, D10, D13 and D14 as the aforementioned bank A (A$_0$), and the RAMs D03, D04, D07, D08, D11, D12, D15 and D16 as the bank B (B$_0$), as shown in FIGS. 63A and 63B. That is, the interleaver 100 reads data from the RAMs D03, D04, D07, D08, D11, D12, D15 and D16 when the data has been written to the RAMs D01, D02, D05, D06, D09, D10, D13 and D14, and from the RAMs D01, D02, D05, D06, D09, D10, D13 and D14 when the data has been written to the RAMs D03, D04, D07, D08, D11, D12, D15 and D16.

Based on the address data AR00 supplied from the address selection circuit 405, delaying-use data D0 and D1 are supplied and written as data IR00 to the RAM D01 from the input data selection circuit 406. At this time, the RAM D01 will store data D0 and D1 in only a half of the storage area in the word direction as shown hatched in FIG. 63A, not in the rest of the storage area. That is, 0 to 2 kilowords of data of the data D0 and D1 are written to the RAM D01. Also, based on the address data AR04 supplied from the address selection circuit 405, delaying-use data D2 and D3 are supplied and written as data IR04 to the RAM D05 from the input data selection circuit 406. At this time, similarly to the RAM D01, the RAM D05 will store data D2 and D3 in only a half of the storage area in the word direction as shown hatched in FIG. 63A, not in the rest of the storage area. At this time, 0 to 2 kilowords of data of the data D2 and D3 are written to the RAM D05.

At the same time, data are read from the RAMs D03 and D07, and supplied as data OR02 and OR06 to the output data selection circuit 408. At this time, the RAMs D03 and D07 will store data in only a half of the storage area in the word direction as shown hatched in FIG. 63A, not in the rest of the storage area. Note that the data read is effected based on the address data supplied from the address selection circuit 405 similarly to the data write.

Similarly, based on the address data AR02 supplied from the address selection circuit 405, delaying-use data D0 and D1 are supplied and written as data IR02 to the RAM D03 from the input data selection circuit 406. At this time, the RAM D03 will store data D2 and D3 in only a half of the storage area in the word direction as shown hatched in FIG. 63A, not in the rest of the storage area. That is, 0 to 2 kilowords of data of the data D0 and D1 are written to the RAM D03. Also, based on the address data AR06 supplied from the address selection circuit 405, delaying-use data D2 and D3 are supplied and written as data IR06 to the RAM D07 from the input data selection circuit 406. At this time, similarly to the RAM D03, the RAM D07 will store data D2 and D3 in only a half of the storage area in the word direction as shown hatched in FIG. 63A, not in the rest of the storage area. That is, 0 to 2 kilowords of data of the data D2 and D3 are written to the RAM D07.

At the same time, data are read from the RAMs D01 and D05, and supplied as data OR00 and OR04 to the output data selection circuit 408. At this time, the RAMs D01 and D05 will store data in only a half of the storage area in the word direction as shown hatched in FIG. 63A, not in the rest of the storage area. Note that the data read is effected based on the address data supplied from the address selection circuit 405 similarly to the data write.

Also, each of the RAMs D02, D04, D06, D08, D09, D10, D11, D12, D13, D14, D15 and D16 does not function as a partial-write RAM but functions as a RAM having an ordinary storage capacity.

Based on the address data AR12 supplied from the address selection circuit 405, interleaving data I0 is supplied and written as data IR12 to the RAM D13 from the input data selection circuit 406. At this time, the RAM D13 will store data I0 in only a half of the storage area in the bit direction as shown hatched in FIG. 63B, not in the rest of the storage area or it will store the same data I0 in the rest of the storage area. Also, based on the address data AR08 supplied from the address selection circuit 405, interleaving data I1 and I2 are supplied and written as data IR08 to the RAM D09 from the input data selection circuit 406. Further, based on the address data AR13 supplied from the address selection circuit 405, interleaving data I0 is supplied as written as data IR13 to the RAM D14 from the input data selection circuit 406. At this time, similarly to the RAM D13, the RAM D14 will store data I0 in only a half of the storage area in the bit direction as shown hatched in FIG. 63B, not in the rest of the storage area or it will store the same data I0 in the rest of the storage area. Also, based on the address data AR09 supplied from the address selection circuit 405, interleaving data I1 and I2 are supplied and written as data IR09 to the RAM D10 from the input data selection circuit 406. Further, based on the address data AR05 supplied from the address selection circuit 405, interleaving data I0 is supplied as written as data IR05 to the RAM D06 from the input data selection circuit 406. At this time, similarly to the RAM D13, the RAM D06 will store data I0 in only a half of the storage area in the bit direction as shown hatched in FIG. 63B, not in the rest of the storage area or it will store the same data I0 in the rest of the storage area. Also, based on the address data AR01 supplied from the address selection circuit 405, interleaving data I1 and I2 are supplied from the input data selection circuit 406 as data IR01 and written to the RAM D02.

At the same time, data are read from the RAMs D11 and D15, and supplied as data OR10 and OR14, and as one sequences of symbol data of the three-symbol data to the output data selection circuit 408. At this time, the RAM D15 will store data in only a half of the storage area in the bit direction as shown hatched in FIG. 63B, not in the rest of the storage area or it will store the same data in the rest of the storage area. Also, two sequences of data are outputted from the RAM D11, and one of them is selected by a selector (not shown), and supplied to the output data selection circuit 408. Also, data are read as data OR11 and OR15 from the RAMs D12 and D16, and supplied as another sequences of the data of the three-symbol data to the output data selection circuit 408. At this time, similarly to the RAM D15, the RAM D16 stores data in only a half of the storage area in the bit direction as shown hatched in FIG. 63B, not in the rest of the storage area or it stores the same data in the rest of the storage area. Also, two sequences of data are outputted from the RAM D12, and one of them is selected by a selector (not shown), and supplied to the output data selection circuit 408. Further, data are read as data OR03 and OR07 from the RAMs D04 and D08, and supplied as still another sequences of the data of the three-symbol data to the output data selection circuit 408. At this time, similarly to the RAM D15, the RAM D08 stores data in only a half of the storage area in the bit direction as shown hatched in FIG. 63B, not in the rest of the storage area or it stores the same data in the rest of the storage area. Also, two sequences of data are outputted from the RAM D04, and one of them is selected by a selector (not shown), and supplied to the output data selection circuit 408. Note that the data read is effected based on the address data supplied from the address selection circuit 405 similarly to the data write.

Similarly, based on the address data AR14 supplied from the address selection circuit 405, interleaving data I0 is supplied and written as data IR14 to the RAM D15 from the input data selection circuit 406. At this time, the RAM D15 will store data I0 in only a half of the storage area in the bit direction as shown hatched in FIG. 63B, not in the rest of the storage area or it will store the same data I0 in the rest of the storage area. Also, based on the address data AR10 supplied from the address selection circuit 405, interleaving data I1 and I2 are supplied and written as data IR10 to the RAM D11 from the input data selection circuit 406. Further, based on the address data AR15 supplied from the address selection circuit 405, interleaving data I0 is supplied as written as data IR15 to the RAM D16 from the input data selection circuit 406. At this time, similarly to the RAM D15, the RAM D16 will store the data I0 in only a half of the storage area in the bit direction as shown hatched in FIG. 63B, not in the rest of the storage area or it will store the same data I0 in the rest of the storage area. Also, based on the address data AR11 supplied from the address selection circuit 405, interleaving data I1 and I2 are supplied and written as data IR11 to the RAM D12 from the input data selection circuit 406. Further, based on the address data AR07 supplied from the address selection circuit 405, interleaving data I0 is supplied as written as data IR07 to the RAM D08 from the input data selection circuit 406. At this time, similarly to the RAM D15, the RAM D08 will store the data I0 in only a half of the storage area in the bit direction as shown hatched in FIG. 63B, not in the rest of the storage area or it will store the same data I0 in the rest of the storage area. Also, based on the address data AR03 supplied from the address selection circuit 405, interleaving data I1 and I2 are supplied and written as data IR03 to the RAM D04.

At the same time, data are read as data OR10 and OR14 from the RAMs D11 and D15, and supplied as one sequences of symbol data of the three-symbol data to the output data selection circuit 408. At this time, the RAM D15 stores data in only a half of the storage area in the bit direction as shown hatched in FIG. 63B, not in the rest of the storage area or it will store the same data in the rest of the storage area. Also, two sequences of data are outputted from the RAM D11 and one of them is selected by a selector (not shown), and supplied to the output data selection circuit 408. Also, data are read as data OR11 and OR15 from the RAMs D12 and D16, and supplied as another sequences of the data of the three-symbol data to the output data selection circuit 408. At this time, similarly to the RAM D15, the RAM D16 stores data in only a half of the storage area in the bit direction as shown hatched in FIG. 63B, not in the rest of the storage area or it stores the same data in the rest of the storage area. Also, two sequences of data are outputted from the RAM D12, and one of them is selected by a selector (not shown), and supplied to the output data selection circuit 408. Further, data are read as data OR03 and OR07 from the RAMs D04 and D08, and supplied as still another sequences of the data of the three-symbol data to the output data selection circuit 408. At this time, similarly to the RAM D15, the RAM D08 stores data in only a half of the storage area in the bit direction as shown hatched in FIG. 63B, not in the rest of the storage area or it stores the same data in the rest of the storage area. Also, two sequences of data are outputted from the RAM D04, and one of them is selected by a selector (not shown), and supplied to the output data selection circuit 408. Note that the data read is effected based on the address data supplied from the address selection circuit 405 similarly to the data write.

Thus, the interleaver 100 can make a random interleaving and delaying of three-symbol input data having been subjected to SCCC by the encoder 1 at a rate of "more than $\frac{1}{3}$" and whose size is "less than 4 kilowords".

Next, an example of inline interleaving of three-symbol input data will be described. It is assumed herein that the encoder 1 is to make SCTCM at a rate of "more than $\frac{2}{3}$" and input data has a size of "less than 16 kilowords".

Figure 64A:
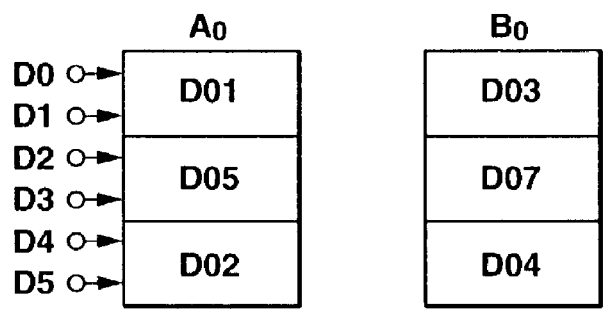
Figure 64B:
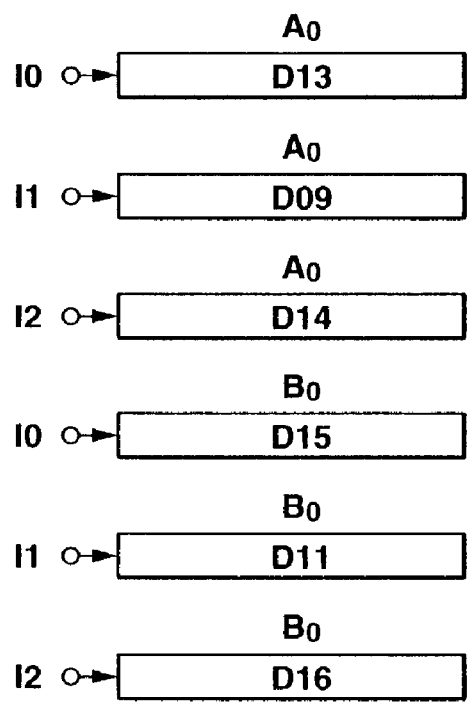
Figure 64C:
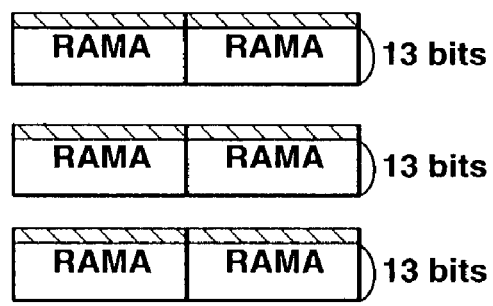
Figure 64D:
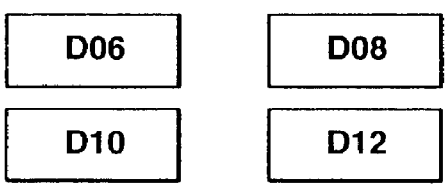

In this case, the interleaver 100 has to interleave three-symbol data and delay 6-symbol data. To this end, the interleaves 100 uses six RAMs D01, D02, D03, D04, D05 and D07 of the sixteen RAMs D01, D02, . . . , D16 for the delaying operation as shown in FIG. 64A and six RAMs D09, D11, D13, D14, D15 and D16 for the interleaving operation as shown in FIG. 64B. Also, all the six RAMs RAMA will be used as address RAMs as shown in FIG. 64C. However, each of these six RAM RAMA has a storage area of 14 bits in the bit direction as shown in FIG. 64C, and the storage area of 13 bits is used as the address RAM. Therefore, the interleaver 100 and address storage circuit 110 will not use four RAMs D06, D08, D10 and D12 of the RAMs RAMA as shown in FIG. 64D.

More specifically, the interleaver 100 uses the RAMs D01, D02, D05, D09, D13 and D14 as the aforementioned bank A ($A_0$) and the RAMs D03, D04, D07, D11, D15 and D16 as the bank B (B₀), as shown in FIGS. 64A and 64B. That is, the interleaver 100 reads data from the RAMs D03, D04, D07, D11, D15 and D16 when the data has been written to the RAMs D01, D02, D05, D09, D13 and D14, and from the RAMs D01, D02, D05, D09, D13 and D14 when the data has been written to the RAMs D03, D04, D07, D11, D15 and D16.

Based on the address data AR00 supplied from the address selection circuit 405, delaying-use data D0 and D1 are supplied and written as data IR00 to the RAM D01 from the input data selection circuit 406. At this time, 0 to 4 kilowords of data of the data D0 and D1 are written to the RAM D01. Also, based on the address data AR04 supplied from the address selection circuit 405, delaying-use data D2 and D3 are supplied and written as data IR04 to the RAM D05 from the input data selection circuit 406. At this time, 0 to 4 kilowords of data of the data D2 and D3 are written to the RAM D05. Further, based on the address data AR01 supplied from the address selection circuit 405, delaying-use data D4 and D5 are supplied and written as data IR01 to the RAM D02 from the input data selection circuit 406. At this time, 0 to 4 kilowords of data of the data D4 and D5 are written to the RAM D02.

At the same time, data are read from the RAMs D03, D04 and D07, and supplied as data OR02, OR03 and OR06 to the output data selection circuit 408. Note that the data read is effected based on the address data supplied from the address selection circuit 405 similarly to the data write.

Based on the address data AR02 supplied from the address selection circuit 405, delaying-use data D0 and D1 are supplied and written as data IR02 to the RAM D03 from the input data selection circuit 406. At this time, 0 to 4 kilowords of data of the data D0 and D1 are written to the RAM D03. Also, based on the address data AR06 supplied from the address selection circuit 405, delaying-use data D2 and D3 are supplied and written as data IR06 to the RAM D07 from the input data selection circuit 406. At this time, 0 to 4 kilowords of data of the data D2 and D3 are written to the RAM D07. Further, based on the address data AR03 supplied from the address selection circuit 405, delaying-use data D4 and D5 are supplied and written as data IR03 to the RAM D04 from the input data selection circuit 406. At this time, 0 to 4 kilowords of data of the data D4 and D5 are written to the RAM D04.

At the same time, data are read from the RAMs D01, D02 and D05, and supplied as data OR00, OR01 and OR04 to the output data selection circuit 408. Note that the data read is effected based on the address data supplied from the address selection circuit 405 similarly to the data write.

Also, based on the partial-write control signal PW, each of the RAMs D09, D11, D13, D14, D15 and D16 works as a RAM having the partial-write function and a pseudo storage capacity of 8 bits by 8192 words.

Based on the address data AR12 supplied from the address selection circuit 405, interleaving data I0 is supplied and written as data IR12 to the RAM D13 from the input data selection circuit 406. At this time, 0 to 8 kilowords of data are written to the RAM D13. Also, based on the address data AR08 supplied from the address selection circuit 405, interleaving data I1 is supplied and written as data IR08 to the RAM D09 from the input data selection circuit 406. At this time, 0 to 8 kilowords of data are written to the RAM D09. Further, based on the address data AR13 supplied from the address selection circuit 405, interleaving data I2 is supplied and written as data IR13 to the RAM D14 from the input data selection circuit 406. At this time, 0 to 8 kilowords of data of the data I2 are written to the RAM D14.

At the same time, data are read as data OR14 from the RAM D15, and supplied as one sequences of symbol data of three-symbol data to the output data selection circuit 408. Also, data are read as data OR10 from the RAM D11, and supplied as another sequences of symbol data of the three-symbol data to the output data selection circuit 408. Further, data are read as data OR15 from the RAM D16, and supplied as still another sequences of symbol data of the three-symbol data to the output data selection circuit 408. Note that the data read is effected based on the address data supplied from the address selection circuit 405 similarly to the data write.

Similarly, based on the address data AR14 supplied from the address selection circuit 405, interleaving data I0 is supplied and written as data IR14 to the RAM D15 from the input data selection circuit 406. At this time, 0 to 8 kilowords of data of the data I0 are written to the RAM D15. Also, based on the address data AR10 supplied from the address selection circuit 405, interleaving data I1 is supplied and written as data IR10 to the RAM D11 as well from the input data selection circuit 406. At this time, 0 to 8 kilowords of data of the data I1 are written to the RAM D11. Further, based on the address data AR15 supplied from the address selection circuit 405, interleaving data I2 is supplied and written as data IR15 to the RAM D16 from the input data selection circuit 406. At this time, 0 to 8 kilowords of data of the data I2 are written to the RAM D16.

At the same time, data are read as data OR12 from the RAM D13, and supplied as one sequences of symbol data of the three-symbol data to the output data selection circuit 408. Also, data are read as data OR08 from the RAM D09, and supplied as another sequences of symbol data of the three-symbol data to the output data selection circuit 408. Further, data are read as data OR13 from the RAM D14, and supplied as still another sequences of symbol data of the three-symbol data to the output data selection circuit 408. Note that the data read is effected based on the address data supplied from the address selection circuit 405 similarly to the data write.

Thus, the interleaver 100 can make an inline interleaving and delaying of three-symbol input data having been subjected to SCTCM by the encoder 1 at a rate of "more than ⅔" and whose size is "less than 16 kilowords".

Next, an example of pair-wise interleaving of three-symbol input data will be described. It is assumed herein that the encoder 1 is to make TTCM and input data has a size of "less than 32 kilowords".

Figure 65A:
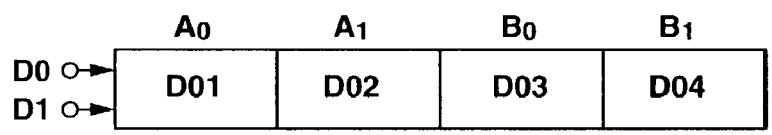
Figure 65B:
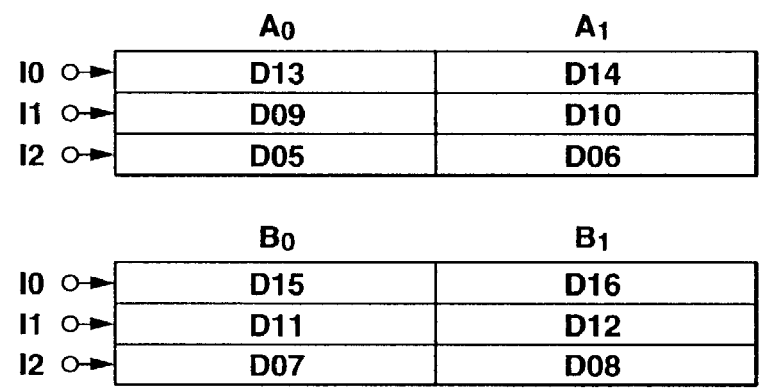
Figure 65C:
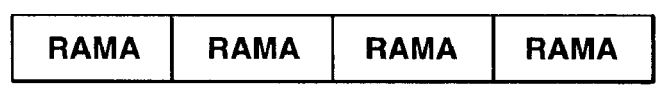
Figure 65D:
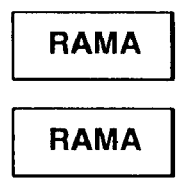

In this case, the interleaver 100 has to interleave three-symbol data and delay two-symbol data. To this end, the interleaver 100 uses four RAMs D01, D02, D03 and D04 of the sixteen RAMs D01, D02, . . . , D16 for the delaying operation as shown in FIG. 65A and the remaining twelve RAMs D05, D06, D07, D08, D09, D10, D11, D12, D13, D14, D15 and D16 for the interleaving operation as shown in FIG. 65B. Also, arbitrary four of the six RAMs RAMA may be used as address RAMs as shown in FIG. 65C. Therefore, the interleaver 100 and address storage circuit 110 will not use two of the RAMs RAMA as shown in FIG. 65D.

More specifically, the interleaver 100 uses the RAMs D01, D02, D05, D06, D09, D10, D13 and D14 as the aforementioned bank A (A₀, A₁) and the RAMs D03, D04, D07, D08, D11, D12, D15 and D16 as the bank B (B₀, B₁), as shown in FIGS. 65A and 65B. That is, the interleaver 100 reads data from the RAMs D03, D04, D07, D08, D11, D12, D15 and D16 when the data has been written to the RAMs D01, D02, D05, D06, D09, D10, D13 and D14, and from the RAMs D01, D02, D05, D06, D09, D10, D13 and D14 when the data has been written to the RAMs D03, D04, D07, D08, D11, D12, D15 and D16. At this time, the RAMs D13 and D14, RAMs D09 and D10, and RAMs D05 and D06, operate based the same address, and the RAMs D15 and D16, RAMs D11 and D12, and RAMs D07 and D08, operate based on the same address.

Based on the address data AR00 and AR01 supplied from the address selection circuit 405, delaying-use data D0 and D1 are supplied and written as data IR00 and IR01 to the RAMs D01 and D02, respectively, from the input data selection circuit 406. At this time, 0 to 4 kilowords of data of the data D0 and D1 are written to the RAM D01, while 4 to 8 kilowords of data are written to the RAM D02.

At the same time, data are read as data OR02 and OR03, respectively, from the RAMs D03 and D04, and supplied to the output data selection circuit 408. Note that the data read is effected based on the address data supplied from the address selection circuit 405 similarly to the data write.

Similarly, based on the address data AR02 and AR03 supplied from the address selection circuit 405, delaying-use data D0 and D1 are supplied and written as data IR02 and IR03 to the RAMs D03 and D04, respectively, from the input data selection circuit 406. At this time, 0 to 4 kilowords of data of the data D0 and D1 are written to the RAM D03, while 4 to 8 kilowords of data are written to the RAM D04.

At the same time, data are read as data OR00 and OR01 from the RAMs D01 and D02, and supplied to the output data selection circuit 408. Note that the data read is effected based on the address data supplied from the address selection circuit 405 similarly to the data write.

Also, each of the RAMs D05, D06, D07, D08, D09, D10, D11, D12, D13, D14, D15 and D16 takes the partial-write control signal PW as the basis to work as a RAM having the partial-write function and a pseudo storage capacity of 8 bits by 8192 words.

Based on the address data AR12 and AR13 supplied from the address selection circuit 405, interleaving data I0 is supplied and written as data IR12 and IR13 to the RAMs D13 and D14 from the input data selection circuit 406. At this time, 0 to 8 kilowords of data of the data I0 are written to the RAM D13, while 8 to 16 kilowords of data are written to the RAM D14. Also, based on the address data AR08 and AR09 supplied from the address selection circuit 405, interleaving data I1 is supplied and written as data IR08 and IR09 to the RAMs D9 and D10 from the input data selection circuit 406. At this time, 0 to 8 kilowords of data of the data I1 are written to the RAM D09, while 8 to 16 kilowords of data are written to the RAM D10. Further, based on the address data AR04 and AR05 supplied from the address selection circuit 405, interleaving data I2 is supplied and written as data IR04 and IR05 to the RAMs D05 and D06 from the input data selection circuit 406. At this time, 0 to 8 kilowords of data of the data I2 are written to the RAM D05, while 8 to 16 kilowords of data are written to the RAM D06.

At the same time, data are read as data OR14 and OR15 from the RAMs D15 and D16, and supplied as one sequences of symbol data of the three-symbol data to the output data selection circuit 408. Also, data are read as data OR10 and OR11 from the RAMs D11 and D12, and supplied as another sequences of symbol data of the three-symbol data to the output data selection circuit 408. Further, data are read as data OR06 and OR07 from the RAMs D07 and D08, and supplied as still another sequences of symbol data of the three-symbol data to the output data selection circuit 408.

Note that the data read is effected based on the address data supplied from the address selection circuit 405 similarly to the data write.

Similarly, based on the address data AR14 and AR15 supplied from the address selection circuit 405, interleaving data I0 is supplied and written as data IR14 and IR15 to the RAMs D15 and D16 from the input data selection circuit 406. At this time, 0 to 8 kilowords of data of the data I0 are written to the RAM D15, while 8 to 16 kilowords of data are written to the RAM D16. Also, based on the address data AR10 and AR11 supplied from the address selection circuit 405, interleaving data I1 is supplied and written as data IR10 and IR11 to the RAMs D11 and D12 from the input data selection circuit 406. At this time, 0 to 8 kilowords of data of the data I1 are written to the RAM D11, while 8 to 16 kilowords of data are written to the RAM D12. Further, based on the address data AR06 and AR07 supplied from the address selection circuit 405, interleaving data I2 is supplied and written as data IR06 and IR07 to the RAMs D07 and D08 from the input data selection circuit 406. At this time, 0 to 8 kilowords of data of the data I2 are written to the RAM D07, while 8 to 16 kilowords of data are written to the RAM D08.

At the same time, data are read as data OR12 and OR13 from the RAMs D13 and D14, and supplied as one sequences of symbol data of the three-symbol data to the output data selection circuit 408. Also, data are read as data OR08 and OR09 from the RAMs D09 and D10, and supplied as another sequences of symbol data of the three-symbol data to the output data selection circuit 408. Further, data are read as data OR04 and OR05 from the RAMs D05 and D06, and supplied as still another sequences of symbol data of the three-symbol data to the output data selection circuit 408.

Note that the data read is effected based on the address data supplied from the address selection circuit 405 similarly to the data write.

Thus, the interleaver 100 can make a pair-wise interleaving and delaying of three-symbol input data having been subjected to TTCM by the encoder 1 having a size of "less than 32 kilowords".

As having been described in the foregoing, the interleaver 100 can make plural kinds of interleaving and delaying operations by using delaying uses and interleaving RAMs, selecting an appropriate one of them for use according to a mode indicating a code configuration, including a type of an interleaving and writing data and/or reading data to and/or from the selected appropriate RAM. So, the interleaver 100 can be utilized in decoding a variety of codes.

Note that various features of the interleaver 100 will further be described in Section 6.

3. Decoder Formed from the Concatenated Element Decoders

Next, there will be described the decoder 3 capable of repetitive decoding by the aforementioned concatenated element decoders 50.

As having been described in the foregoing, the decoder 3 is constructed from a plurality of concatenated element decoders 50 and can make repetitive decoding of a PCCC, SCCC, TTCM or SCTCM code from the encoder 1.

Figure 66:
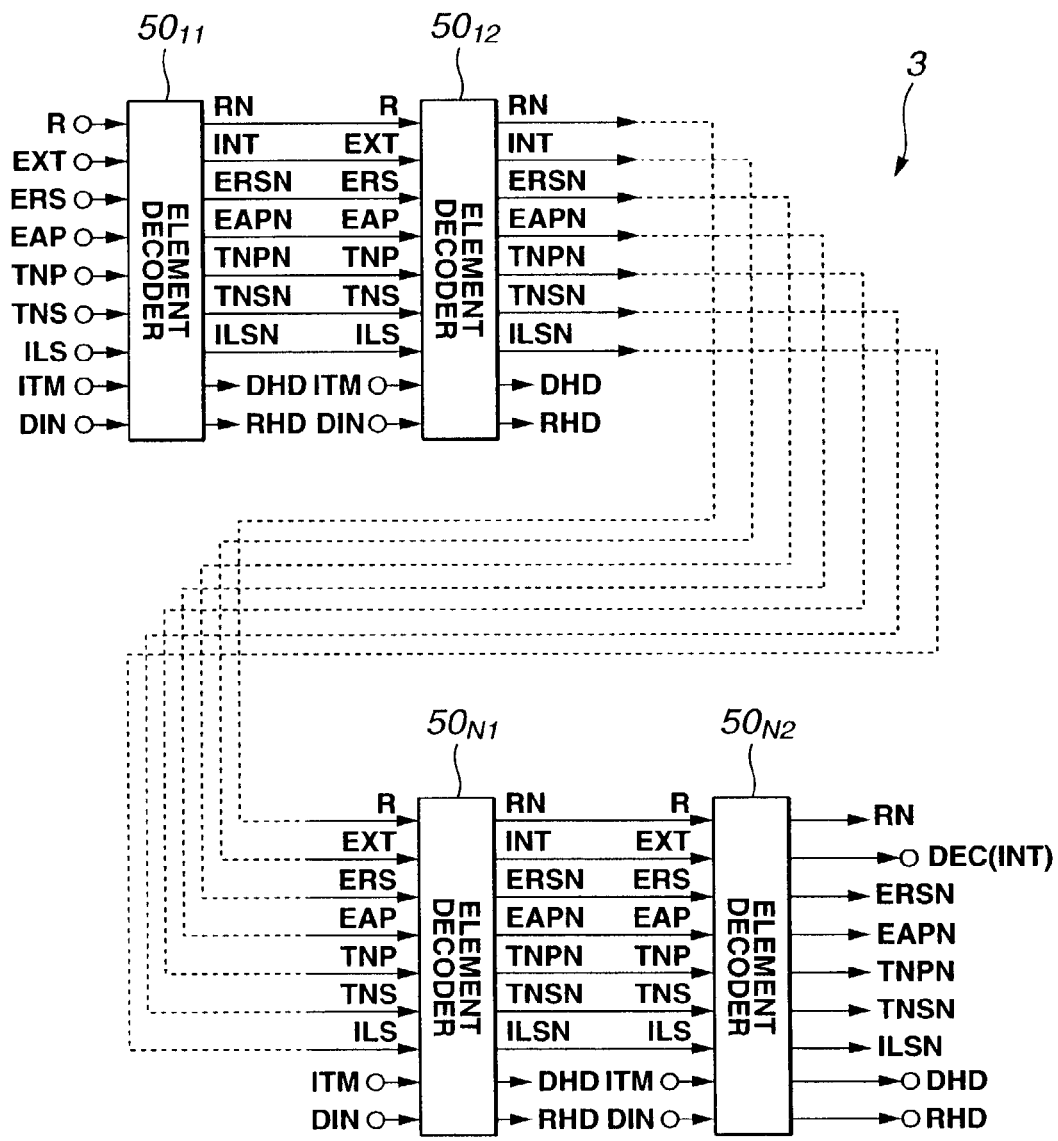
FIG. 66 is a block diagram of a decoder formed from the element decoders concatenated to each other.

As shown in FIG. 66, the decoder 3 includes a product of the number of element codes by at least a number N of times of repetitive decoding, for example, a number 2×N of element decoders $50_{11}, 50_{12}, \ldots, 50_{N1}, 50_{N2}$. The decoder 3 is destined to determine decoded data DEC from a received value made a soft-input under the influence of a noise taking place on the non-storage channel 2, to thereby estimate an input data to the encoder 1. In case the decoder 3 forms the decoders 3' and 3" having been described with reference to FIG. 7 or 9, two successive element decoders $50_{11}$ and $50_{12}$ or two successive element decoders $50_{N1}$ and $50_{N2}$ in the decoder 3 make one repetitive decoding. That is, when the encoder 1 is the encoder 1' illustrated in FIG. 6, a one, indicated with $50_{i1}$, of the element decoders $50_{11}$, $50_{12}$, ..., $50_{M1}$ and $50_{M2}$ is provided correspondingly to the convolutional encoder 12 makes the i-th one of the repetitive decoding operations, and a one indicated with $50_{i2}$ is provided correspondingly to the convolutional encoder 14 and makes the i-th one of the repetitive decoding operations. Also, when the encoder 1 is the encoder 1" shown in FIG. 8, a one, indicated with $50_{i1}$, of the element decoders $50_{11}$, $50_{12}$, ..., $50_{M1}$ and $50_{M2}$ is provided correspondingly to the convolutional encoder 33 which codes an inner code and makes the i-th one of the repetitive decoding operations, and a one indicated with $50_{i2}$ is provided correspondingly to the convolutional encoder 31 which codes an outer code and makes the i-th one of the repetitive decoding operations.

More particularly, the element decoder $50_{11}$ is supplied with a received value R and extrinsic information or interleaved data EXT as a priori probability information, as well as with erasure information ERS, a priori probability information erasure information EAP, termination time information TNP, termination state information TNS and an interleave start position signal ILS. Also, the element decoder $50_{11}$ is supplied with an output data selection control signal ITM and interleaving mode signal DIN.

The element decoder $50_{11}$ outputs a delayed received value RN and soft-output INT obtained with the above operations, and also next-stage erasure position information ERSN, next-stage a priori probability information erasure information EAPN, next-stage termination time information TNPN, next-stage termination state information TNSN and next-stage interleave start position signal ILSN. At this time, in case the decoder 3 is the decoder 3' shown in FIG. 7, the element decoder $50_{11}$ uses the interleaver 100 to make an interleaving operation based on the interleaving mode signal DIN. Also, when the decoder 3 is the decoder 3" shown in FIG. 9, the decoder $50_{11}$ uses the interleaver 100 to make a de-interleaving operation based on the interleaving mode signal DIN. Further, the element decoder $50_{11}$ can determine a data to be outputted finally as a soft-output INT by selecting either a soft-output SOL or extrinsic information SOE, being a log soft-output Iλ outputted from the soft-output decoding circuit 90 on the basis of the output data selection control signal ITM. It is assumed herein that the soft-output INT is extrinsic information. Furthermore, the element decoder $50_{11}$ can also output decided value hard decision information DHD and received value hard decision information RHD as necessary.

Also, the element decoder $50_{12}$ is supplied with a delayed received value RN, soft-output INT, next-stage erasure position information ERSN, next-stage a priori probability information erasure information EAPN, next-stage termination time information TNPN, next-stage termination state information YNSN and next-stage interleave start position information ILSN from the upstream element decoder $50_{11}$ as a received value R, extrinsic information or interleaved data EXT, erasure information ERS, a priori probability information erasure information EAP, termination time information TNP, termination state information TNS and an interleave start position signal ILS, respectively. Also, the element decoder $50_{12}$ is supplied with an output data selection control signal ITM and interleaving mode signal DIN.

Similarly to the element decoder $50_{11}$, the element decoder $50_{12}$ outputs a delayed received value RN and soft-output INT obtained with the above operations, and also next-stage erasure position information ERSN, next-stage a priori probability information erasure information EAPN, next-stage termination time information TNPN, next-stage termination state information TNSN and next-stage interleave start position signal ILSN. At this time, in case the decoder 3 is the decoder 3' shown in FIG. 7, the element decoder $50_{12}$ uses the interleaver 100 to make a de-interleaving operation based on the interleaving mode signal DIN. Also, when the decoder 3 is the decoder 3" shown in FIG. 9, the decoder $50_{12}$ uses the interleaver 100 to make an interleaving operation based on the interleaving mode signal DIN. Further, the element decoder $50_{12}$ can determine a data to be outputted finally as a soft-output INT by selecting either a soft-output SOL or extrinsic information SOE, being a log soft-output Iλ outputted from the soft-output decoding circuit 90 on the basis of the output data selection control signal ITM. It is assumed herein that the soft-output INT is extrinsic information. Furthermore, the element decoder $50_{12}$ can also output decided value hard decision information DHD and received value hard decision information RHD as necessary.

The above element decoder $50_{12}$ outputs the delayed received value RN, soft-output INT, next-stage erasure position information ERSN, next-stage a priori probability information erasure information EAPN, next-stage termination time information TNPN, next-stage termination state information TNSN and next-stage interleave start position signal ILSN to a next-stage element decoder $50_{21}$ (not shown).

Further, the element decoder $50_{N1}$ is supplied with a delayed received value RN, soft-output INT, next-stage erasure position information ERSN, next-stage a priori probability information erasure information EAPN, next-stage termination time information TNPN, next-stage termination state information YNSN and next-stage interleave start position information ILSN from the upstream element decoder $50_{N-12}$ as a received value R, extrinsic information or interleaved data EXT, erasure information ERS, a priori probability information erasure information EAP, termination time information TNP, termination state information TNS and an interleave start position signal ILS, respectively. Also, the element decoder $50_{N1}$ is supplied with an output data selection control signal ITM and interleaving mode signal DIN.

Similarly to the element decoder $50_{11}$, the element decoder $50_{N1}$ outputs a delayed received value RN and soft-output INT obtained with the above operations, and also next-stage erasure position information ERSN, next-stage a priori probability information erasure information EAPN, next-stage termination time information TNPN, next-stage termination state information TNSN and next-stage interleave start position signal ILSN. At this time, in case the decoder 3 is the decoder 3' shown in FIG. 7, the element decoder $50_{N1}$ uses the interleaver 100 to make an interleaving operation based on the interleaving mode signal DIN. Also, when the decoder 3 is the decoder 3" shown in FIG. 9, the decoder $50_{N1}$ uses the interleaver 100 to make a de-interleaving operation based on the interleaving mode signal DIN. Further, the element decoder $50_{N1}$ can determine a data to be outputted finally as a soft-output INT by selecting either a soft-output SOL or extrinsic information SOE, being a log soft-output Iλ outputted from the soft-output decoding circuit 90 on the basis of the output data selection control signal ITM. It is assumed herein that the soft-output INT is extrinsic information. Furthermore, the element decoder $50_{N1}$ can also output decided value hard decision information DHD and received value hard decision information RHD as necessary.

The last-stage element decoder $50_{N2}$ is supplied with a delayed received value RN, soft-output INT, next-stage erasure position information ERSN, next-stage a priori probability information erasure information EAPN, next-stage termination time information TNPN, next-stage termination state information YNSN and next-stage interleave start position information ILSN from the preceding element decoder $50_{N1}$ as a received value R, extrinsic information or interleaved data EXT, erasure information ERS, a priori probability information erasure information EAP, termination time information TNP, termination state information TNS and an interleave start position signal ILS, respectively. Also, the element decoder $50_{N2}$ is supplied with an output data selection control signal ITM and interleaving mode signal DIN.

The element decoder $50_{N2}$ outputs the soft-output INT obtained with the above operations, and also decoded value hard decision information DHD and received value hard decision information RHD as necessary. At this time, in case the decoder 3 is the decoder 3' shown in FIG. 7, the element decoder $50_{N2}$ uses the interleaver 100 to make a de-interleaving operation based on the interleaving mode signal DIN. Also, when the decoder 3 is the decoder 3" shown in FIG. 9, the decoder $50_{N2}$ uses the interleaver 100 to make an interleaving operation based on the interleaving mode signal DIN. Further, based on the output data selection control signal ITM, the element decoder $50_{N2}$ selects a soft-output INT and a log soft-output Iλ as data to be outputted, and output this log soft-output Iλ as a decoded data DEC being the final result. Note that the element decoder $50_{N2}$ can output a delayed received value RN and soft-output INT, next-state erasure position information ERSN, next-stage a priori probability information erasure information EAPN, next-stage termination time information ENPN, next-stage termination state information TNSN and a next-stage interleave start position information ILSN as necessary.

Provided with the element decoders $50_{i1}$ and $50_{i2}$ corresponding to the element encoders in the encoder 1, the above decoder 3 can decompose a code whose decoding complexity is high into elements whose complexity is low to improve the characteristic sequentially by the mutual action between the element decoders $50_{i1}$ and $50_{i2}$. Supplied with a received value, the decoder 3 makes a repetitive decoding whose number of repetitions is N at maximum by a number 2×N of element decoders $50_{11}$, $50_{12}$, ..., $50_{N1}$ and $50_{N2}$ to output a decoded data DEC.

Note that the decoder 3 can make a repetitive decoding whose number of times of repetition is N at maximum by means of a number 2×N of concatenated element decoders $50_{11}$, $50_{12}$, ..., $50_{N1}$ and $50_{N2}$. Also, using the delaying function of each of the element decoders $50_{11}$, $50_{12}$, ..., $50_{M1}$ and $50_{N2}$, the decoder 3 can make a decoding repeatedly N or less times.

Also, a decoder which makes a decoding based on the TTCM and SCTCM can be constructed similarly to the aforementioned decoder 3. This decoder will be supplied directly with symbols of common-phase and orthogonal components.

4. Functions of All the Element Decoders

Next, each of the features of the element decoder 50 will be described. The following features are included as functions in the element decoder 50. To make clear the concept of each feature, it will be described with reference to an appropriately simplified drawing.

4.1 Switching Code Likelihood

This is the feature of the aforementioned received value and a priori probability information selection circuit 154. This circuit 154 is provided to decode an arbitrary code as having been described above.

For example, when the encoder is to code a data by the PCCC or TTCM, information to be supplied for the soft-output decoding includes a received value and extrinsic information supplied from the upstream interleaver or de-interleaver, as shown in FIG. 7. Also, when the encoder 1 is to code a data by the SCCC or SCTCM, information to be supplied for the soft-output decoding of an inner code includes a received value and extrinsic information supplied from the upstream interleaver, and information to be supplied for the soft-output decoding of an outer code includes extrinsic information supplied from the de-interleaver and a priori probability information whose value is "0", as shown in FIG. 9. Further, when the encoder 1 is to puncture a code, it is necessary to input, as a priori probability information, information indicating that the encoder 1 is to puncture a code. Thus, to decode an arbitrary code, the element decoder 50 has to select necessary information for the soft-output decoding correspondingly to each arbitrary code.

To this end, the element decoder 50 is provided with the received value and a priori probability information selection circuit 154 to appropriately select an input received value or a priori probability information, whichever should be inputted for the soft-output decoding, correspondingly to a code to be decoded. Thus, the element decoder 50 can have a versatile structure capable of decoding an arbitrary code such as PCCC, SCCC, TTCM or SCTCM.

That is, the decoder 3 can be formed from a plurality of concatenated element decoders 50 which are LSIs identical in wiring to each other to make a repetitive decoding of the arbitrary code such as PCCC, SCCC, TTCM or SCTCM. Thus, the decoder 3 is highly convenient to the user even when used in an experiment for example.

Note that the element decoder 50 should not always be provided with the received value and a priori probability information selection circuit 154 inside or upstream of the soft-output decoding circuit 90. Namely, the element decoder 50 may not be constructed to select one, necessary for the soft-output decoding, of information from any upstream element decoder. For example, the element decoder 50 may be provided with the received value and a priori probability information selection circuit 154 downstream of the selectors $120_8$, $120_9$ and $120_{10}$ to select necessary information for a soft-output decoding to be done at a next-stage element decoder by making selection between the delayed received value TRN and soft-output TINT as a code likelihood.

Figure 67:
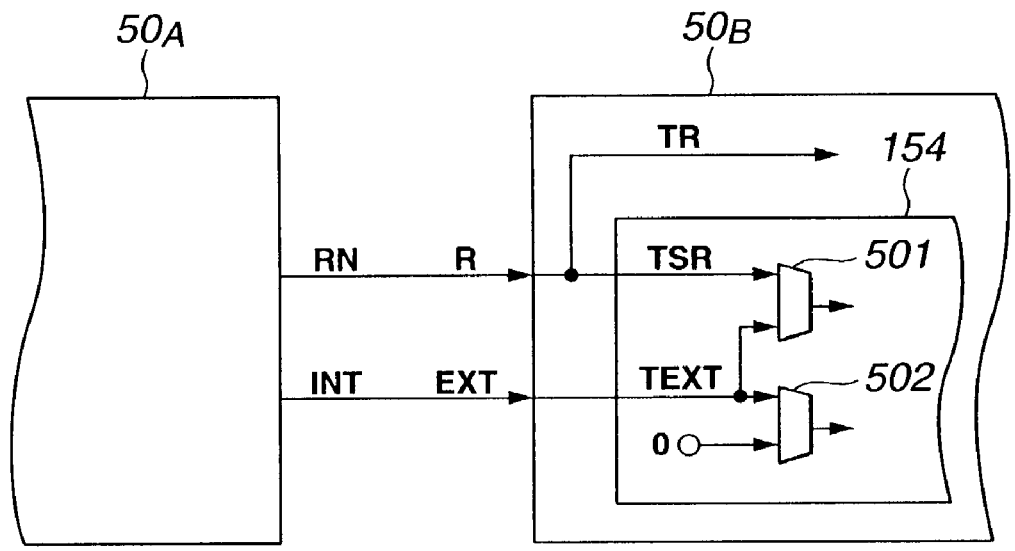
FIG. 67 is a block diagram of the decoder, constructed simply of two element decoders juxtaposed with each other, explaining how necessary information for soft-output decoding is selected from information in the first one of the element decoders.

In the case of the received value and a priori probability information selection circuit 154 having previously been described with reference to FIG. 32, the two neighboring element decoders $50_A$ and $50_B$ forming together the decoder 3 can be simply constructed as shown in FIG. 67 for example. That is, the element decoder $50_B$ is shown as a one supplied with a delayed received value RN from the preceding element decoder $50_A$ as a received value R and soft-output INT as extrinsic information or interleaved data EXT, and provided with a signal line for delaying the received value TR and a signal line for making the received value TR as a decoded received value TSR. In this case, the received value and a priori probability information selection circuit 154 provided in the element decoder $50_B$ is shown as a one substantially including a selector 501 to selectively output a decoded received value TSR and extrinsic information or interleaved data TEXT and a selector 502 to selectively output extrinsic information or interleaved data TEXT and a priori probability information whose value is "0".

Figure 68:
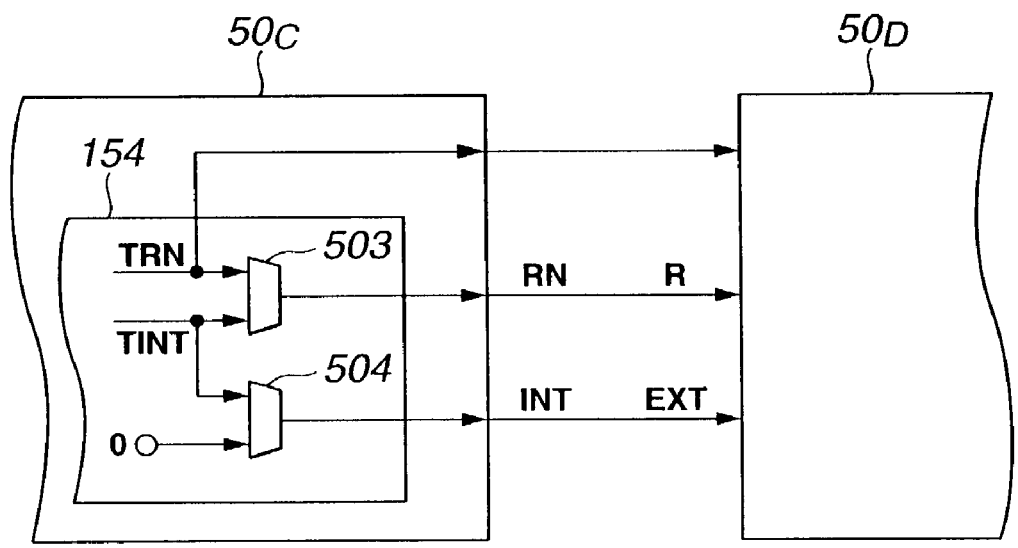
FIG. 68 is a block diagram of the decoder, constructed simply of two element decoders juxtaposed with each other, explaining how the first one of the element decoders selects necessary information for soft-output decoding in the next element decoder.

On the contrary, in case the received value and a priori probability information selection circuit 154 is provided downstream of the selectors $120_8$, $120_9$ and $120_{10}$, the two neighboring element decoders $50_C$ and $50_D$ forming together the decoder 3 can be simply constructed as shown in FIG. 68 for example. That is, the received value and a priori probability information selection circuit 154 provided in the element decoder $50_C$ is shown as a one substantially including a selector 503 to selectively output a delayed received value TRN and soft-output TINT and a selector 504 to selectively output the soft-output TINT and a priori probability information whose value is "0". In this case, the element decoder $50_D$ will be supplied with a delayed received value RN from the selector 503 in the upstream element decoder $50_C$ as a received value R, a soft-output INT from the selector 504 as extrinsic information or interleaved data EXT, and also a delayed received value TRN. In this case, the received value and a priori probability information selection circuit 154 may be provided along with the selectors 503 and 504 inside the interleaver 100.

As above, the element decoder 50 is not limited by any location where the received value and a priori probability information selection circuit 154 is provided. As shown in FIG. 68, however, since a construction for selection of necessary information for the soft-output decoding in a downstream element decoder by an upstream element decoder makes it necessary to separately input and output a received value delayed between two element decoders, it needs a larger number of pins.

4.2 Delaying Received Value

This is a feature of the aforementioned received data and delaying-use data storage circuit 155 and interleaver 100.

For example, in case the encoder 1 is destined to make PCCC or TTCM coding, it is necessary that a received value should be inputted as necessary information for the soft-output decoding as having previously been described with reference to FIG. 7. Also, in case the encoder 1 is to make SCCC or SCTCM coding, a received value has to be inputted as necessary information for the soft-output decoding of an inner code as having previously been described with reference to FIG. 9.

To this end, the decoder 50 is provided with the received value and delayed data storage circuit 155 as above to store all received values TR including ones other than received value TSR to be decoded, delay them the same time as taken by at least the soft-output decoding circuit 90 for its operation, and delay data TDI being one of the received value TR or delayed received value SDR by the interleaver 100 the same time as taken by at least by the interleaver 100 for its operation, that is, an interleaving time.

Thus, since the decoder 3 has not to be provided with any external delay circuit such as RAM or FIFO (First In First Out), the circuit can be reduced in scale and the decoder 3 can make repetitive decoding of an arbitrary code such as PCCC, SCCC, TTCM or SCTCM just by concatenating a plurality of element decoders 50 which are LSIs identical in wiring to each other.

Note that the element decoder 50 has not to use the received value and delayed data storage circuit 155 for delaying a received value the same time as taken by the soft-output decoding circuit 90 for its operation, but it may be provided with a separate delay circuit. In this case, the element decoder 50 has not to have the delay circuit inside the soft-output decoding circuit 90.

Figure 69:
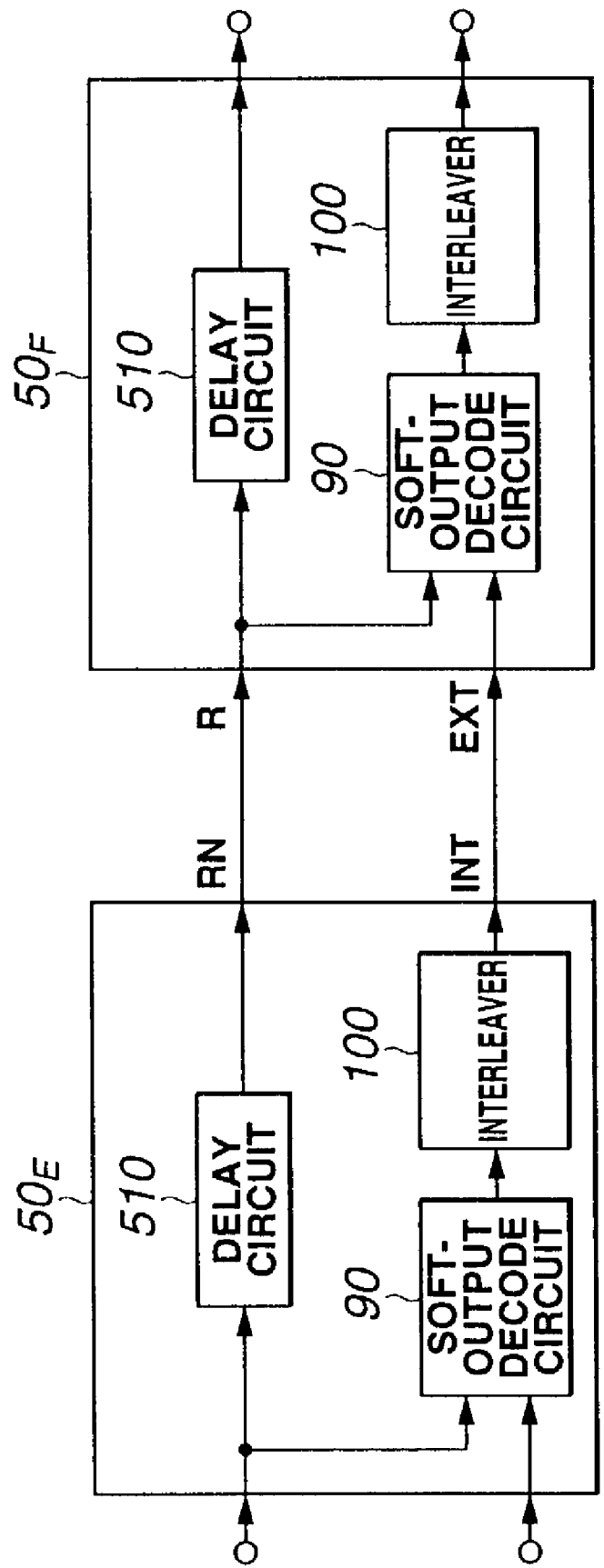
FIG. 69 is a block diagram of the decoder, constructed simply of two element decoders concatenated with each and provided with a delay circuit to delay a received value.

That is, each of the two neighboring element decoders $50_E$ and $50_F$ forming together the decoder 3 is provided with the soft-output decoding circuit 90, interleaver 100, and in addition a delay circuit 510 to delay a received value, as schematically illustrated in FIG. 69 for example. Of course, the delay circuit 510 may include a storage circuit to delay the received value the same time as taken by the soft-output decoding circuit 90 for its operation and a storage circuit to delay the received value the same time as taken by the interleaver 100 for its operation. Namely, the element decoder 50 may be a one provided with a delay line for delaying all received values.

Of course, the element decoder 50 uses the interleaver 100 in a manner as will be described later to provide a delay for the same time as taken by the interleaver 100 for its operation. This will further be described later.

4.3 Selecting Received Value to be Decoded

This is a feature of the aforementioned to-be-decoded received value selection circuit 70. The to-be-decoded received value selection circuit 70 is provided to decode an arbitrary code as mentioned above.

Figure 70:
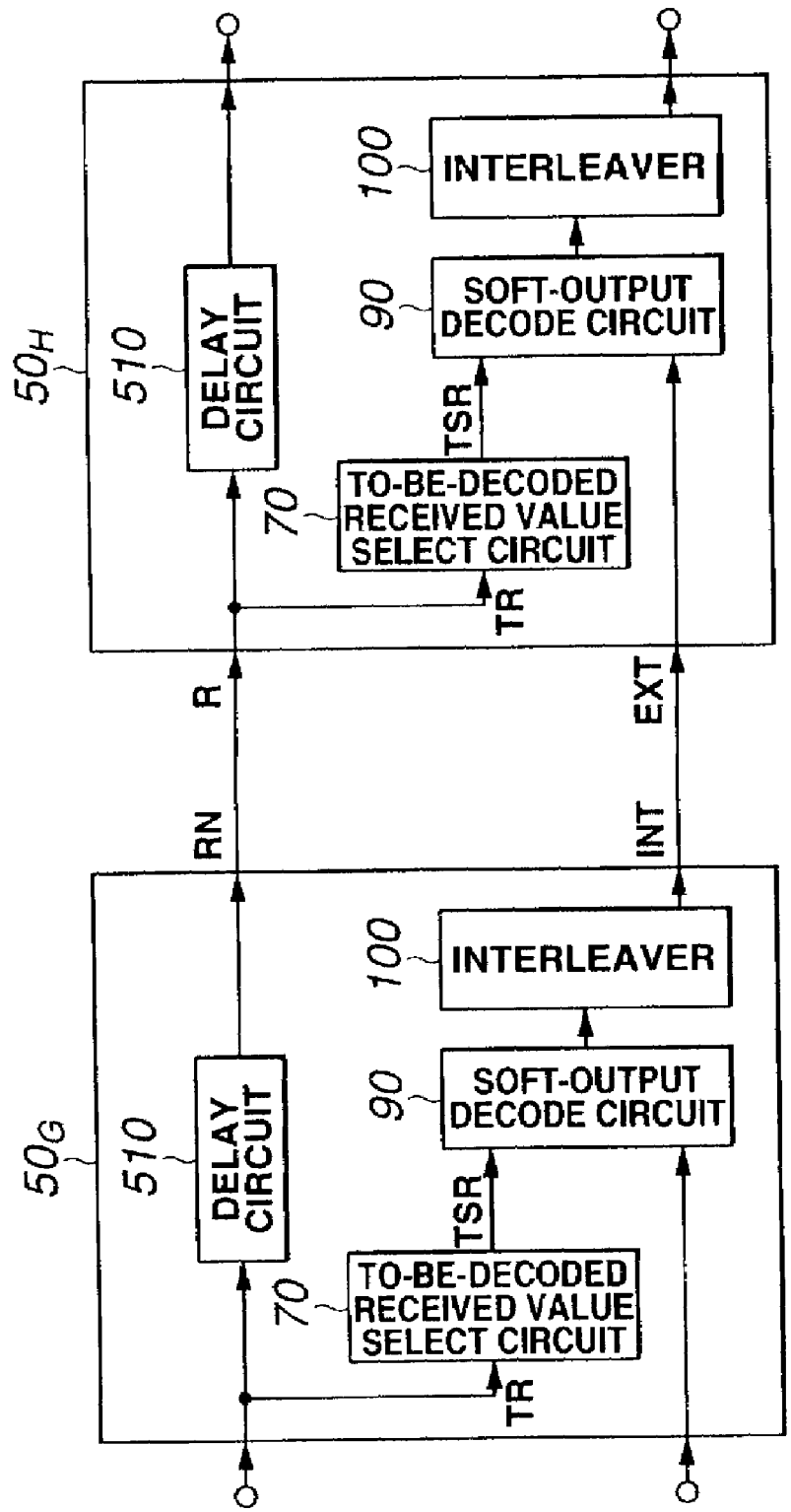
FIG. 70 is a block diagram of the decoder, constructed simply of two element decoders concatenated with each other and provided with a to-be-decoded received value selection circuit to select a received value to be decoded.
Figure 72A:
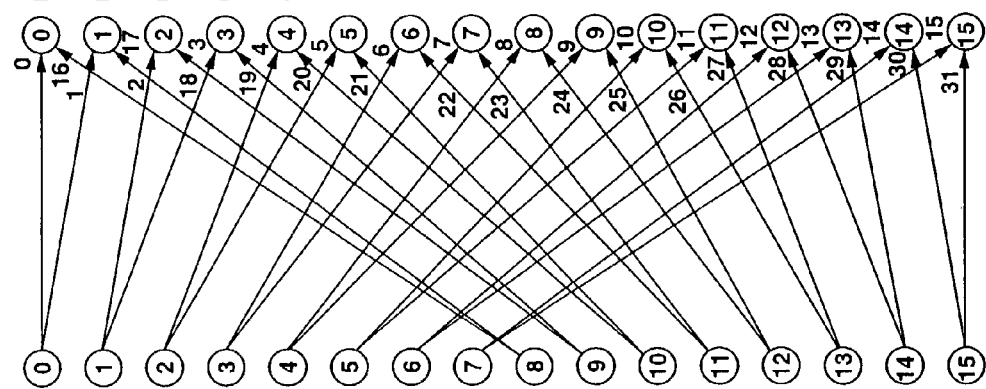
Figure 72B:
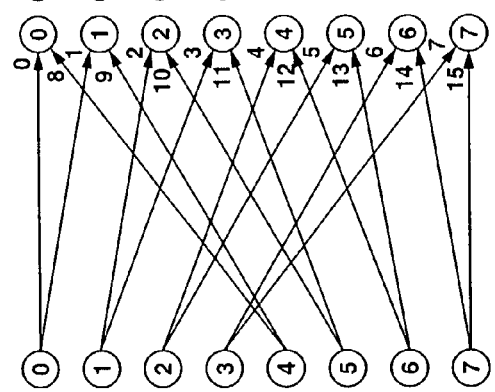
Figure 72C:
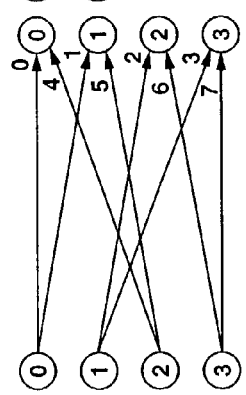
Figure 72D:
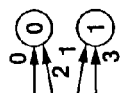

A received value necessary for the soft-output decoding varies depending upon a code to be decoded. For this reason, the element decoder 50 is provided with the to-be-decoded received value selection circuit 70 to appropriately select a to-be-decoded received value TSR from all received values TR according to a code to be decoded. In other words, each of two neighboring element decoders $50_G$ and $50_H$ forming together the decoder 3 is constructed as a one including the soft-output decoding circuit 90, interleaver 100, delay circuit 510 to delay a received value, and in addition a to-be-decoded received value selection circuit 70 to extract a predetermined signal from a delay line to delay all received values, as shown in FIG. 70.

By selecting a predetermined one of received values supplied to the delay circuit 510, the decoder 3 can make repetitive decoding of an arbitrary code such as PCCC, SCCC, TTCM or SCTCM just by concatenating a plurality of element decoders 50 which are LSIs identical in wiring to each other.

4.4 Using Decoding-Use Data Circuit and Delaying-Use Data Storage Circuits in Common This is a feature of the aforementioned received value and delayed data storage circuit 155.

The received data and delaying-use data storage circuit 155 is provided to store both the selected received value and a priori probability information RAP, being a received data used for decoding, and a received value TR being a delaying data, as having previously been described. That is, the received data and delaying-use data storage circuit 155 has a RAM capable of storing both selected received data and a priori probability information RAP and a received value TR, and selective write and/or read each information to and/or from the RAM under the control of a controller (not shown). At this time, the received data and delaying-use data storage circuit 155 writes received data DA used in the Iα computation circuit 158 and received value TR in the same ward, and outputs the stored received value TR as a delayed received value PDR at a time when the received data DA is read.

Thus, using the storage circuits to store any of different data in common, the decoder 3 can be constructed to have a smaller-scale circuit and can make repetitive decoding of an arbitrary code such as PCCC, SCCC, TTCM or SCTCM just by concatenating a plurality of element decoders 50 which are LSIs identical in wiring to each other.

4.5 Delaying Frame-Top Information

This is another feature of the aforementioned received data and delaying-use data storage circuit 155.

The edge signal TEILS indicating the top of a frame detected by the edge detection circuit 80 indicates an interleave start position. For this reason, the interleaver 100 has to be supplied with a signal equivalent to the edge signal TEILS synchronously with the entry of information resulted from the soft-output decoding by the soft-output decoding circuit 90. Thus, the edge signal TEILS has to be delayed the same time as taken by the soft-output decoding circuit 90 for its operation.

To this end, the element decoder 50 is provided with the received data and delaying-use data storage circuit 155 as above to supply the soft-output decoding circuit 90 with the edge signal TEILS synchronously with the frame top of information to be decoded and delay the signal the same time as taken by the soft-output decoding circuit 90 for its operation. At this time, the received data and delaying-use data storage circuit 155 writes received data DA used in the Iα computation circuit 158 and edge signal TEILS in the same ward, and outputs the stored edges signal TEILS as a delayed edge signal PDIL at a time when the received data DA is read.

Thus, since the decoder 3 has not to be provided with any external delay circuit to delay an edge signal and can use the delay circuit and received data storage circuit in common, the decoder 3 can be constructed to have a scale-downed circuit and can make repetitive decoding of an arbitrary code such as PCCC, SCCC, TTCM or SCTCM just by concatenating a plurality of element decoders 50 which are LSIs identical in wiring to each other.

Note that the element decoder 50 has not to be provided with the received data and delaying-use data storage circuit 155 for delaying the edge signal but may be provided with a separate delay circuit inside the soft-output decoding circuit 90. That is, the element decoder 50 may be a one with a delay line to delay the edge signal.

Also, in case the frame length of information to be decoded is larger than the time taken by the soft-output decoding circuit 90, the element decoder 50 may be adapted to delay or generate an edge signal, based on a counter (not shown) to count decoding delay, and output it to the interleaver 100.

4.6 Operation of Soft-Output Decoding Circuit or Interleaver as Unit

This is a feature of the aforementioned selectors $120_4$ and $120_7$ and also of the selectors $120_3$, $120_5$ and $120_6$.

The element decoder 50 corresponds to an element decoder for making repetitive decoding of a code in the encoder 1 as having previously been described. In addition, the element decoder 50 has a function to switch the mode of operation for only the function of the soft-output decoding circuit 90 or interleaver 100. That is, as having been described in the foregoing, the element decoder 50 takes operation mode information CBF generated by the control circuit 60 as the basis to cause the selectors $120_3$, $120_4$, $120_5$, $120_6$ and $120_7$ to make such a selection that the soft-output decoding circuit 90 and interleaver 100 operate in a mode in which both of them make normal soft-output decoding and interleaving operations, a mode in which only the soft-output decoding circuit 90 makes the normal soft-output decoding operation, or a mode in which only the interleaver 100 makes the normal soft-output decoding operation.

More particularly, based on the operation mode information CBF, the selector $120_3$ selects either the received value TR or delayed received value SDR supplied from the soft-output decoding circuit 90, as having previously been described. That is, the element decoder 50 can decide, by this selector $120_3$, whether the recieved value to be supplied to the interleaver 100 should be a one delayed the same time as taken by the soft-output decoding circuit 90 for its soft-output decoding operation or for its operation.

Also, the selector $120_4$ takes the operation mode information CBF as the basis to select either the extrinsic information or interleaved data TEXT or data TDLX supplied from the selector $120_2$. as mentioned above. That is, the element decoder 50 can decide, by this selector $120_4$, whether the extrinsic information or interleaved data or soft-output to be supplied to the interleaver 100 should be a one delayed the same time as taken by the soft-output decoding circuit 90 for its soft-output decoding operation or for its operation.

Also, based on the operation mode information CBF, the selector $120_5$ selects either the edge signal TEILS supplied from the edge detection circuit 80 or delayed edge signal SDILS supplied from the soft-output deciding circuit 90, as having previously been described. That is, the element decoder 50 can decide, by this selector $120_5$, whether the edge signal to be supplied to the interleaver 100 should be a one delayed the same time as taken by the soft-output decoding circuit 90 for its soft-output decoding operation or for its operation.

Also, the selector $120_6$ selects, based on the operation mode information CBF, either the delayed received value SDR supplied from the soft-output decoding circuit 90 or interleaving length-delayed received value IDO supplied from the interleaver 100, as having previously been described. That is, the element decoder 50 can decide, by this selector $120_6$, whether the received value to be outputted should be a one delayed the same time as taken by the interleaver 100 for its soft-output decoding operation or for its operation.

Also, based on the operation mode information CBF, the selector $120_7$ selects either the interleaver output data IIO supplied from the interleaver 100 or data TDLX supplied from the selector $120_2$, as having previously been described. That is, the element decoder 50 can decide, by this selector $120_7$, whether the extrinsic information or soft-output to be outputted should be a one delayed the same time as taken by the interleaver 100 for its soft-output decoding operation or for its operation.

Thus, the element decoder 50 can cause only the soft-output decoding circuit 90 to operate when in the mode in which for example only the soft-output decoding operation is required, while causing only the interleaver 100 to operate when in the mode in which only the interleaving operation is necessary.

Also, when in the mode in which only the interleaver 100 makes the normal interleaving operation, the element decoder 50 can also be used as an encoder for the reason that the element encoder in the encoder is normally formed from delay elements and a combinatorial circuit and can easily be built from a so-called FPGA or the like. Therefore, to form the encoder 1' having previously been described with reference to FIG. 6, the convolutional encoders 12 and 14 can be implemented from the control circuit 60 etc., for example, in the element decoder 50. Also, since the interleaver 100 in the element decoder 50 has the function of a delay circuit as mentioned above, the functions of the interleaver 13 and delayer 11 in the encoder 1' can be implemented by the interleaver 100. Similarly, the element decoder 50 can easily implement an encoder which makes SCCC coding as in the encoder 1″ having previously been described with reference to FIG. 8.

As above, the element decoder 50 can make a selection between the modes of operation and thus be conveniently usable in many applications in addition to the aforementioned repetitive decoding.

Note that the element decoder 50 may be adapted not to select a mode of operation by the selectors $120_3$, $120_4$, $120_5$, $120_6$ and $120_7$ but to operate in various modes selected by other selectors.

4.7 Switching Delay Mode

This is a feature of the aforementioned selector $120_2$ and interleaver 100.

The number of times of decoding in the repetitive decoding is reduced to one by combining together the same number of element decoders as that of the element encoders in the encoder 1 as shown in FIG. 7 or 9. More specifically, at least two or more element decoders are combined to be one set for one decoding, and a final result of decoding is attained by repeating the decoding more than once.

To decide an optimum number of times decoding should be repeated for each code, it is usually necessary to conduct an experiment with the number of times of repetitive decoding. In this case, the experiment can be conducted by organizing a plurality of decoders by concatenating a number, corresponding to the number of times of repetitive decoding, of element decoders. Also, an experiment can be conducted by concatenating such a number of element decoders as enables an arbitrary number of times of repetitive decoding to form one decoder and leading out taps from the element decoders corresponding in number to a desired number of times of decoding less than the number of arbitrary number of times of repetitive decoding.

To conduct the above experiments, however, it will be necessary to organize a vast number of decoders and thus a great deal of labor be required. Also, in the latter one of the above experiments, the circuit scale of the decoder will be increased and delay of the decoding operation varies depending upon the number of times of decoding. So the experiment is not desirable for comparison of results of the decoding effected with such a variation in number of times of decoding.

To avoid the above, according to the present invention, the element decoder 50 takes the operation mode information CBF generated by the control circuit 60 as the basis to cause the selector $120_2$ to make a selection and the interleaver 100 to make an address control, thereby implementing a plurality of delaying modes in which an input data is delayed the same time as taken by at least the soft-output decoding circuit 90 for its operation, the same time as taken by at least the interleaver 100 for its operation, and the same time as taken by at least the soft-output decoding circuit 90 and interleaver 100 for their operation, respectively.

More specifically, as described above, when the operation mode information CBF indicates a delay mode in which an input data should be delayed the same time as taken by at least the soft-output decoding circuit 90 for its operation, the same time as taken by at least the interleaver 100 for its operation or the same time as taken by at least the soft-output decoding circuit 90 and interleaver 100 for their operation, the selector $120_2$ selects and outputs delayed extrinsic information SDEX, and when the operation mode information CBF indicates a delay mode in which an input data should not be delayed by at least the soft-output decoding circuit 90 and/or interleaver 100 but processed by at least the soft-output decoding circuit 90 and/or interleaver 100, the selector $120_2$ selects and outputs data TLX, that is, the result of decoding by the soft-output decoding circuit 90. In other words, the element decoder 50 can decide whether extrinsic information or soft-output should be delayed the same time as taken by at least the soft-output decoding circuit 90 and/or interleaver 100 for its and/or their operation.

Also, when supplied with operation mode information CBF indicative of a delay mode, the interleaver 100 can work as an apparent delay circuit by controlling the address as having been described above. This will be described in detail later.

Thus, the decoder 3 can make repetitive decoding an arbitrary number of times by concatenating such a number of element decoders as enables the repetitive decoding a possible number of times. For example, in case the encoder 1 is the encoder 1′ or 1″ having been described with reference to FIG. 6 or 8 and two hundred element decoders are concatenated to organize the decoder 3, this decoder 3 can make repetitive decoding a maximum of 100 times. To make repetitive decoding 20 times, the leading forty element decoder should make normal soft-output decoding and interleaving while the remaining hundred sixty element decoders should operate in the delay mode in which an input data is delayed the same time as taken by at least the soft-output decoding circuit 90 and interleaver 100 for their operation.

As above, the decoder 3 has a plurality of delay modes. By selectively using these delay modes, just concatenating a plurality of element decoders 50 which are LSIs identical in wiring to each other permits to make a repetitive decoding various numbers of times without any change of the total delay of decoding and make repetitive decoding of an arbitrary code such as PCCC, SCCC, TTCM or SCTCM a desired number of times.

Note that the element decoder 50 may be adapted to implement a variety of delay modes by utilizing the selectors $120_4$ and $120_7$ which makes selecting operations under the operation mode information CBF and also the selectors $120_3$, $120_5$ and $120_6$ in order to allow the soft-output decoding circuit 90 or interleaver 100 to work as a unit as having been described in Subsection 4.6 for example, not by switching the delay mode from one to another by the selector $120_2$ alone.

4.8 Generating Next-Stage Information

This is a feature of the aforementioned control circuit 60 and control circuit 400 of the interleaver 100.

In case the decoder 3 is constructed by concatenating plurality of element decoders, various kinds of information about a code to be decoded have to be supplied to each of the element decoders. The various kinds of information include termination time information and termination state information as termination information, puncture pattern as erasure information, and frame-top information. To supply these kinds of information to each element decoder, necessary information may be generated by an external control circuit or the like, which however will cause an increase in number of parts and an increase in area of the circuit board.

To avoid the above, the element decoder 50 generates and outputs necessary information for a downstream element decoder by utilizing the interleaver 100 capable of detecting information such as frame-top information and interleaving length. That is, the element decoder 50 generates, by the control circuit 60, termination position information CNFT, termination period information CNFL, termination state information CNFD, puncture period information CNEL and puncture pattern information CNEP, which are static information, as mentioned above. When these termination position information CNFT, termination period information CNFL, termination state information CNFD, puncture period information CNEL and puncture pattern information CNEP, generated by the control circuit 60, the element decoder 50 generates, by the control circuit 400 in the interleaver 100, termination time information IGT, termination state information IGS, erasure position information IGE and interleaver no-output position information INO on the basis of the supplied information. Then, the interleaver 100 is controlled by the control circuit 400 to output the generated termination time information IGT, termination state information IGS, erasure position information IGE and interleaver no-output position information INO in a time equivalent to an interleaving length after the information is supplied from the control circuit 60. Also, the interleaver 100 delays the interleave start position signal TIS supplied from the selector 120$_5$ the interleaving time, that is, the same time as taken by the interleaver 100 for its operation to generate and output a delayed interleave start position signal IDS.

Thus, the element decoder 50 can easily output the generated termination time information IGT, termination state information IGS, erasure position information IGE, interleaver no-output position information INO and delayed interleave start position signal IDS synchronously with the frame top.

Since any external control circuit to generate various kinds of information has not to be provided as above, the decoder 3 constructed from a reduced number of parts can decode an arbitrary code such as PCCC, SCCC, TTCM or SCTCM just by concatenating a plurality of element decoders 50 which are LSIs identical in wiring to each other.

Note that the element decoder 50 may not be adapted to generate various kinds of information by the control circuit 400 in the interleaver 100 and outputting them synchronously with the frame stop of the information but may be adapted to generate such information synchronously with the interleave start position signal TILS. That is, each element decoder of the decoder 3 may not be adapted to generate, at an upstream element decoder, necessary information for a downstream element decoder, but may be provided with a control circuit to generate various kinds of information such as termination information and erasure information synchronously with the frame top of an input data.

4.9 System Check

This is a feature of the aforementioned selectors 120$_8$, 120$_9$ and 120$_{10}$ and signal line 130.

The element decoder 50 is provided with an extremely large number, hundreds, for example, of pins. Thus, in case a plurality of element decoders 50 is concatenated to build the decoder 3, a faulty electrical continuity is likely to take place due to a poor soldering or the like.

To avoid the above, the element decoder 50 is provided with the signal line led to outside and formed from a tie of signal lines through which there are transmitted an external received value TR, extrinsic information or interleaved data TEXT, erasure information TERS, a priori probability information erasure information TEAP, termination time information TTNP, termination state information TTNS and interleave start position information TILS, respectively, and a system check such as a continuity test is effected by transmitting a through signal through the signal line 130.

At this time, the element decoder 50 generates check mode information CTHR by the control circuit 60, and uses, based on the check mode information CTHR, the selectors 120$_8$, 120$_9$ and 120$_{10}$ to make selecting operations, thereby selecting a check mode for the system check.

More specifically, when the check mode information CTHR indicates the check mode, the selector 120$_8$ selects the through signal transmitted through the signal line 130, and outputs it as a delayed received signal RN to a terminal of a downstream element decoder, to which a received value R is supplied.

When the check mode information CTHR indicates the check mode, the selector 120$_9$ selects the through signal transmitted through the signal line 130, and outputs it as a soft-output INT to a terminal of a downstream element decoder, to which there is supplied extrinsic information or interleaved data EXT.

When the check mode information CTHR indicates the check mode, the selector 120$_{10}$ selects the through signal transmitted through the signal line 130, and outputs it as next-stage termination information TNPN, next-stage termination state information TNSN, next-stage erasure position information ERSN, next-stage a priori probability information erasure information EAPN and a next-stage interleave start position signal ILSN to terminals of a downstream element decoder, to which there are supplied next-stage termination information TNP, next-stage termination state information TNS, next-stage erasure position information ERS, next-stage a priori probability information erasure information EAP and a next-stage interleave start position signal ILS, respectively.

Thus, the decoder 3 has a function to output an external input signal as it is to outside, and inputs and outputs the through signal at the time of a system check, to thereby permitting to easily locate a point incurring a faulty electrical continuity. Even in case a plurality of element decoders each having many pins is concatenated, it is possible to easily make a system check. Namely, the decoder 3 is usable with high convenience.

5. Functions of the Soft-Output Decoding Circuit

Next, the soft-output decoding circuit 90 will be described concerning each of its features. The following features are incorporated as functions in the soft-output decoding circuit 90. To make clear the concept of the features, they will be described with reference to appropriately schematic drawings.

5.1 Supplying Code Information

The feature of the aforementioned code generation circuit 151 will be described. The element decoder 50 can make soft-output decoding of a code supplied from an arbitrary element encoder such as the convolutional encoder having been described with reference to FIGS. 18 to 21 for example, not depending upon a code to be decoded but without any variation of the decoder configuration. To attain this object, the element decoder 50 has the following four features.

5.1.1 Computing Input/Output Patterns for All Branches of Trellis

For example, the trellis, one example of which is shown in FIG. 23, of the convolutional encoder having previously been described with reference to FIG. 18 has a structure in which two paths run from each state to states at a next time and which has 32 branches in total. Also, the trellis, one example of which is shown in FIG. 25, of the convolutional encoder having previously been described with reference to FIG. 19 has a structure in which 4 paths run from each state to a next state at a next time and which has a total of 32 branches. Further, the trellis, one example of which is shown in FIG. 27, of the convolutional encoder having previously been described with reference to FIG. 20 has a structure in which 4 paths run from each state to states at a next time and which has a total of 32 branches. Moreover, the trellis, one example of which is shown in FIG. 29, of the convolutional encoder having previously been described with reference to FIG. 21 has a structure in which 4 sets of parallel paths run from each state to states at a next time and which has 32 branches in total. Also, each of these convolutional encoders has a variable number of memories depending upon the way of connection but the number of branches in the trellis of the convolutional encoder will be less than 32.

Since the number of branches in the trellis is less than the predetermined value as above in the soft-output decoding circuit 90, input/output patterns of all the branches are computed in view of mainly the branches of the trellis, not the code, and the computed input/output pattern information is used in computing the log likelihood Iγ and log soft-output Iλ. More particularly, the soft-output decoding circuit 90 computes the input/output patterns of all the branches of the trellis by means of the code information generation circuit 151, and the computed input/output patterns are supplied as branch input/output information BIO to the Iγ distribution circuit 157 and soft-output computation circuit 161.

Note that the branch input/output information BIO is computed along the time base from a transition-origin state to a transition-destination state to compute a log likelihood Iα. That is, the branch input/output information BIO is based on a branch at which data is inputted as viewed from a transition-origin state. On the other hand, in the soft-output decoding circuit 90, branch input/output information has to be computed in a sequence opposite to the time base from a transition-destination state to a transition-origin state to compute a log likelihood Iβ. This is computed as branch input/output information BI by the branch input/output information computation circuit 223 in the Iγ distribution circuit 157. That is, the branch input/output information BI is based on a branch where data is outputted as viewed from the transition-origin state.

Thus, the element decoder 50 can decode an arbitrary trellis code having a smaller number of branches than a predetermined one in the same code configuration. That is, it is normally necessary to decode a code based on a unique trellis corresponding to each code configuration, but the element encoder 50 can decode an arbitrary code independently of the configuration of the code by taking the branches of the trellis in consideration. At this time, the element decoder 50 can decode a code also when the element encoder is a non-linear one.

The decoding of a code having a trellis structure having less than 32 branches has been described in the above, but note that it is of course that the element decoder 50 is not limited to this number of branches.

Three examples of numbering the trellis branches in the decoding referred to herein will be described herebelow.

5.1.2 Numbering between Transition-Origin and -Destination States

In the Wozencraft's convolutional encoder, since data are held in time sequence in relation to delay elements, the transition-destination state is limited. More specifically, in the convolutional encoder having been described with reference to FIG. 22, since the contents of the shift registers $201_3$, $201_2$ and $201_1$ shift as they are to the contents of the shift registers $201_4$, $201_3$ and $201_2$, respectively, when the transition-origin state is "0000", the transition-destination states are limited to "0000" and "0001". As above, in the Wozencraft's convolutional encoder, the transition-destination states are determined when the number of memories is determined. Thus, in the Wozencraft's convolutional encoder, it is possible to easily determine independently of the configuration of a code to be decoded whether there exist branches connecting arbitrary states to each other.

To this end, the soft-output decoding circuit 90 assigns, by the code information generation circuit 151, a unique number to each of the branches, providing a connection between a transition-origin state and transition-destination state. That is, to decode a Wozencraft's convolutional decoding, the soft-output decoding circuit 90 will make a branch numbering using the uniqueness of the trellis. Then the soft-output decoding circuit 90 computes an input/output pattern of each of the thus numbered branches, and supplies the Iγ distribution circuit 157 and soft-output computation circuit 161 with the information as branch input/output information BIO which can be determined along the time base. Also, the soft-output decoding circuit 90 uses the branch input/output information computation circuit 223 in the Iγ distribution circuit 157 to compute, based on at least number-of-memories information MN and branch input/output information BIO, branch input/output information BI which can be determined in a sequence opposite to the time base, and supplies the information to the Iβ0-computing Iγ distribution circuit $224_{1,5}$ and Iβ1-computing Iγ distribution circuit $224_2$.

More specifically, to make a Wozencraft's convolutional decoding having been described with reference to FIG. 18 and whose rate is "1/n", the soft-output decoding circuit 90 uses the code information generation circuit 151 to uniquely number each of the branches according to the number of memories as shown in FIG. 71 for example, and compute branch input/output information BIO extending along the time base. That is, to decode a code from a convolutional encoder whose memories count "4" in number, the soft-output decoding circuit 90 uses the code information generation circuit 151 to uniquely number each of the trellis branches as shown in FIG. 71A; to decode a code from a convolutional encoder whose memories count "3" in number, the soft-output decoding circuit 90 uses the code information generation circuit 151 to uniquely number each of the trellis branches as shown in FIG. 71B; to decode a code from a convolutional encoder whose memories count "2" in number, the soft-output decoding circuit 90 uses the code information generation circuit 151 to uniquely number each of the trellis branches as shown in FIG. 71C; to decode a code from a convolutional encoder whose memories count "1" in number, the soft-output decoding circuit 90 uses the code information generation circuit 151 to uniquely number each of the trellis branches as shown in FIG. 71D; and to decode a code from a convolutional encoder whose memories count "3" in number, the soft-output decoding circuit 90 uses the code information generation circuit 151 to uniquely number each of the trellis branches as shown in FIG. 71D. As shown in FIG. 71, two branches running to a state whose number is "0" are numbered "0" and "1", respectively, and two branches running to a state numbered "1" are numbered "2" and "3", respectively.

On the other hand, the soft-output decoding circuit 90 uses the branch input/output information computation circuit 223 to uniquely number each of the branches according to the number of memories as shown in FIG. 72 for example, and compute branch input/output information BI extending in a sequence opposite to the time base. That is, to decode a code from a convolutional encoder whose memories count "4" in number, the soft-output decoding circuit 90 uses the branch input/output information computation circuit 223 to uniquely number each of the trellis branches as shown in FIG. 72A; to decode a code from a convolutional encoder whose memories count "3" in number, the soft-output decoding circuit 90 uses the branch input/output information computation circuit 223 to uniquely number each of the trellis branches as shown in FIG. 72B; to decode a code from a convolutional encoder whose memories count "2" in number, the soft-output decoding circuit 90 uses the branch input/output information computation circuit 223 to uniquely number each of the trellis branches as shown in FIG. 72C; to decode a code from a convolutional encoder whose memories count "1" in number, the soft-output decoding circuit 90 uses the branch input/output information computation circuit 223 to uniquely number each of the trellis branches as shown in FIG. 72D; and to decode a code from a convolutional encoder whose memories count "3" in number, the soft-output decoding circuit 90 uses the branch input/output information computation circuit 223 to uniquely number each of the trellis branches as shown in FIG. 72D. As shown in FIG. 72, two branches running from a state whose number is "0" are numbered "0" and "1", respectively, and two branches running from a state numbered "1" are numbered "2" and "3", respectively.

Figure 73B:
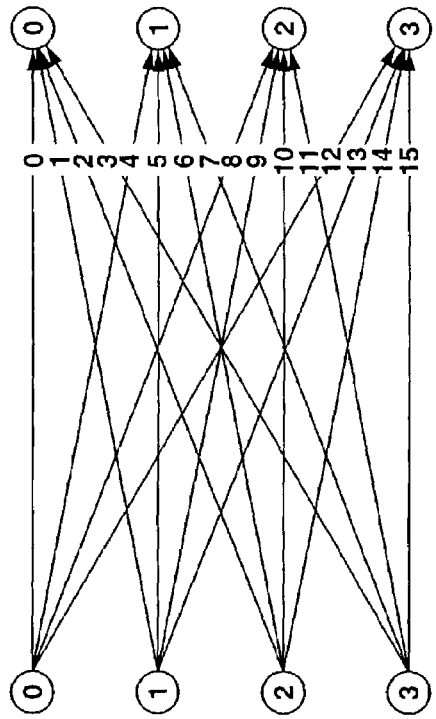
Figure 73A:
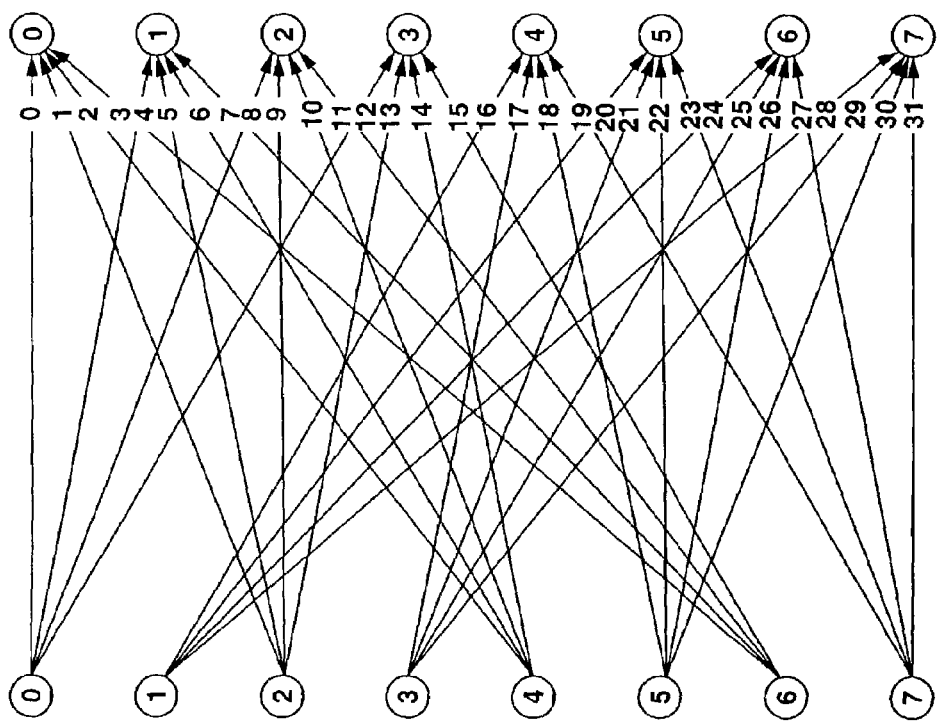

Also, to decode a code from the Wozencraft's convolutional encoder having been described with reference to FIG. 19 and whose rate is "⅔", the soft-output decoding circuit 90 uses the code information generation circuit 151 to uniquely number each of the trellis branches according to the number of memories as shown in FIG. 73, and computes branch input/output information BIO extending along the time base. That is, to decode a code from a convolutional encoder whose memories count "3" in number, the soft-output decoding circuit 90 uses the code information generation circuit 151 to number each of the trellis branches as shown in FIG. 73A. To decode a code from a convolutional encoder whose memories count "2" in number, the soft-output decoding circuit 90 uses the code information generation circuit 151 to number each of the trellis branches as shown in FIG. 73B. As shown in FIG. 73, four branches running to a state whose number is "0" are numbered "0", "1", "2" and "3", respectively, and four branches running to a state numbered "1" are numbered "4", "5", "6" and "7", respectively.

Figure 74B:
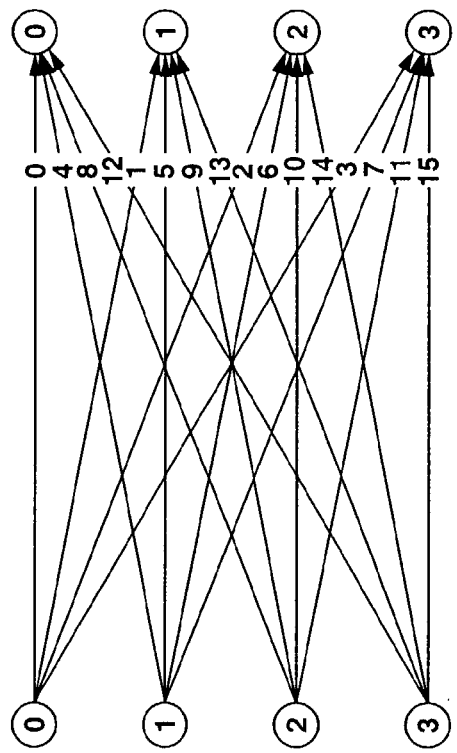
Figure 74A:
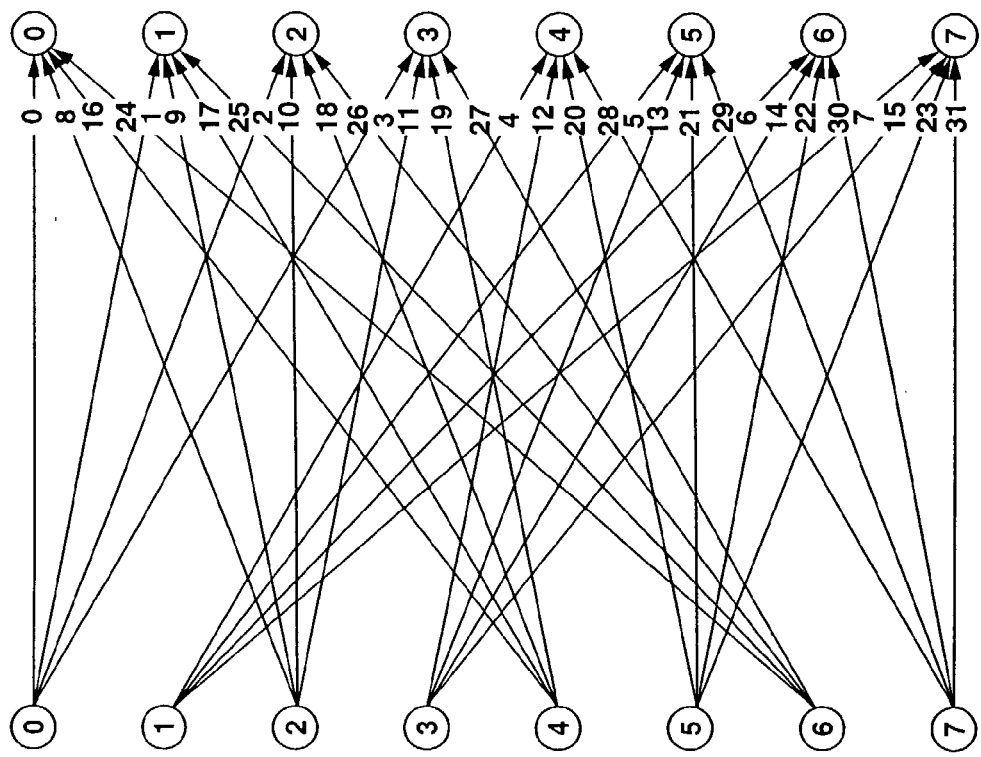

On the other hand, the soft-output decoding circuit 90 uses the branch input/output information computation circuit 223 to uniquely number each of the trellis branches according to the number of memories as shown in FIG. 74 and compute a branch input/output information BI. That is, to decode a code from a convolutional encoder whose memories count "3" in number, the soft-output decoding circuit 90 uses the branch input/output information computation circuit 223 to number each of the trellis branches as shown in FIG. 74A. To decode a code from a convolutional encoder whose memories count "2" in number, the soft-output decoding circuit 90 uses the branch input/output information computation circuit 223 to number each of the trellis branches as shown in FIG. 74B. As shown in FIG. 74, four branches running from a state whose number is "0" are numbered "0", "1", "2" and "3", respectively, and four branches running from a state numbered "1" are numbered "4", "5", "6" and "7", respectively.

As above, the soft-output decoding circuit 90 can uniquely detect the transition-origin state and transition-destination state from the branch numbers, independently of the configuration of a code to be decoded. Therefore, when trellis branches have been numbered depending upon a code to be decoded as in numbering of a branch to which a code is entered at a time, the transition-origin state and transition-destination state are not always determined uniquely but the soft-output decoding circuit 90 can easily decode the code under a simple control since the relation between the branch numbers and input/output patterns is uniquely determined via a state-dependent numbering of the branches using the trellis uniqueness.

Note that the trellis branch numbering for decoding a code from a Wozencraft's convolutional encoder is done as having been described above with reference to FIGS. 71 to 74 but branch numbers are not limited those shown in FIGS. 71 to 74 so long as branches each providing a connection between a transition-destination state and a transition-destination state are uniquely numbered.

5.1.3 Numbering Along the Time Base, and Numbering in Sequence Opposite to the Time Base Since in any convolutional encoder other than the Wozencraft's convolutional encoder, such as a Massey's convolutional encoder, data is not held in time sequence in relation to the delay elements as in the Wozencraft's convolutional encoder. More specifically, in the convolutional encoder having been described with reference to FIG. 26, when the transition-origin state is "000", the content of the shift register $205_3$ at a next time is not exactly that of the shift register $205_2$ at the preceding time, and also the content of the shift register $205_2$ at a next time is not exactly that of the shift register $205_1$ at the preceding time. Thus, the transition-destination state is not limited to each number of memories but will vary correspondingly to the configuration of a code to be decoded.

For this reason, the soft-output decoding circuit 90 uses the code information generation circuit 151 to number trellis branches with reference to a branch running in as viewed from the transition-destination state, while computing an input/output pattern of each of the thus numbered branches and supplying the information as branch input/output information BIO, which is determined along the time base, to the Iγ distribution circuit 157 and soft-output computation circuit 161. Then, the soft-output decoding circuit 90 uses the control signal generation circuit 240 in the Iα computation circuit 158 to separately compute a transition-origin state based on the configuration of a code to be decoder and supplies the information as a control signal PST to the add/compare selection circuit 242. Also, the soft-output decoding circuit 90 uses the branch input/output information computation circuit 223 in the Iγ distribution circuit 157 to number branches with reference to a branch running out as viewed from the transition-origin state according to the generator matrix information CG which influences at least the output at each time, while computing an input/output pattern of each of the thus numbered branches and supplying the information as branch input/output information BI which is determined in a sequence opposite to the time base to the Iβ0-computing Iγ distribution circuit $224_1$ and Iβ1-computing Iγ distribution circuit $224_2$. Then, the soft-output decoding circuit 90 uses the control signal generation circuit 280 in the Iβ computation circuit 159 to separately compute the transition-destination state according to the configuration of a code to be decoded an supplies the information as a control signal NST to the Iβ0-computing add/compare selection circuit 281 and Iβ1-orineded add/compare circuit 282.

More particularly, to decode a code from the Massey's convolutional encoder having been described with reference to FIG. 20 and whose rate is "⅔", the soft-output decoding circuit 90 uses the code information generation circuit 151 to number each of trellis branches correspondingly to the number of memories as shown in FIG. 75, and compute branch input/output information BIO extending along the time base. That is, to decode a code from the convolutional encoder whose memories count "3" in number, the soft-output decoding circuit 90 uses the code information generation circuit 151 to number trellis branches as shown in FIG. 75A, and to decode a code from the convolutional encoder whose memories count "2" in number, the soft-output decoding circuit 90 uses the code information generation circuit 151 to number trellis branches as shown in FIG. 75B. As shown in FIG. 75, four branches running to a state whose number is "0" are numbered "0", "1", "2" and "3", respectively, and branches running to a state numbered "1" are numbered "4", "5", "6" and "7", respectively. Note that no possible examples of numbering four branches running to each state will not be described in detail herein but the soft-output decoding circuit 90 can uniquely number each branch using input pattern information, and transition-origin state information as necessary, for example.

Figure 76A:
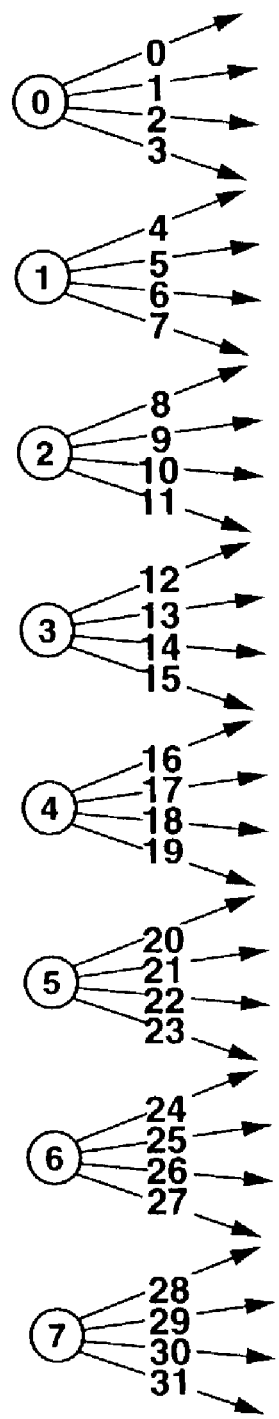
Figure 76B:
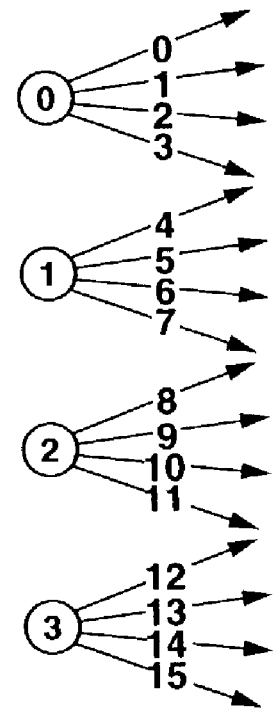

On the other hand, the input/output decoding circuit 90 uses the branch input/output information computation circuit 223 to number each of trellis branches correspondingly to the number of memories as shown in FIG. 76, and compute branch input/output information BI extending in a sequence opposite to the time base. That is, to decode a code from the convolutional encoder whose memories count "3" in number, the soft-output decoding circuit 90 uses the branch input/output information computation circuit 223 to number trellis branches as shown in FIG. 76A, and to decode a code from the convolutional encoder whose memories count "2" in number, the soft-output decoding circuit 90 uses the branch input/output information computation circuit 223 to number trellis branches as shown in FIG. 76B. As shown in FIG. 76, four branches running from a state whose number is "0" are numbered "0", "1", "2" and "3", respectively, and branches running from a state numbered "1" are numbered "4", "5", "6" and "7", respectively. Note that no possible examples of numbering four branches running to each state will not be described in detail herein but the soft-output decoding circuit 90 can uniquely number each branch using only input pattern information, for example.

As above, the soft-output decoding circuit 90 numbers trellis branches along the time base as well as in a sequence opposite to the time base, for each state, to compute an input/output pattern, while computing transition-origin and -destination states on the basis of the configuration of a code to be decoded. Thus, the soft-output decoding circuit 90 can decode even a code from a Massey's convolutional encoder whose trellis shape varies depending upon parameters of an element code.

Note that the trellis branch numbering for decoding a code from a Massey's convolutional encoder is done as having been described above with reference to FIGS. 75 and 76 but branch numbers are not limited those shown in FIGS. 75 and 76. In the forerunning, decoding of a code from a Massey's convolutional encoder has been described but this decoding technique is also applicable to an arbitrary code including nonlinear code other than a code from the Massey's convolutional encoder. Of course, this technique is also applicable from a code from a Wozencraft's convolutional encoder.

5.1.4 Numbering Based on Uniqueness of the Entire Trellis

In case a code to be decoded includes a smaller number of input bits than the number of memories, the trellis will have a structure in which a path runs from each state in the trellis to all states at a next time. In this case, it is possible to uniquely detect the transition-origin state number and transition-destination state number independently of the configuration of the code.

For this reason, the soft-output decoding circuit 90 uses the code information generation circuit 151 to number all branches of the entire trellis based on the uniqueness of the entire trellis structure. Then, the soft-output decoding circuit 90 computes an input/output pattern of each of the numbered branches, and supplies the information as branch input/output information BIO which is determined along the time base to the $I\gamma$ distribution circuit 157 and soft-output computation circuit 161. Also, the soft-output decoding circuit 90 uses the branch input/output information computation circuit 223 in the $I\gamma$ distribution circuit 157 to compute branch input/output information BI which is determined in a sequence opposite to the time base on the basis of at least the number-of-memories information MN and branch input/output information BIO, and supplies the information to the $I\beta0$-computing $I\gamma$ distribution circuit $\mathbf{224}_1$ and $I\beta1$-oriendted $I\gamma$ distribution circuit $\mathbf{224}_2$.

More specifically, to decode a code from the Massey's convolutional encoder having been described with reference to FIG. 21 and whose rate is "2/3", the soft-output decoding circuit 90 uses the code information generation circuit 151 to number each of trellis branches correspondingly to the number of memories as shown in FIG. 77, and compute branch input/output information BIO extending along the time base. That is, to decode a code from the convolutional encoder whose memories count "2" in number, the soft-output decoding circuit 90 uses the code information generation circuit 151 to number trellis branches as shown in FIG. 77A, and to decode a code from the convolutional encoder whose memories count "1" in number, the soft-output decoding circuit 90 uses the code information generation circuit 151 to number trellis branches as shown in FIG. 77B. As shown in FIG. 77A, four sets of branches obtained by tying together every successive two of eight branches running to a state whose number is "0" are numbered "0, 1", "2, 3", "4, 5" and "6, 7", respectively, and four sets of branches obtained by tying together every successive two of eight branches running to a state numbered "1" are numbered "8, 9", "10, 11", "12, 13" and "14, 15", respectively. Note that no possible examples of numbering plural sets of branches running to each state, and numbering each parallel path in one set of branches, will not be described in detail herein but the soft-output decoding circuit 90 can classify possible cases of branch numbering according to generator matrix information CG and uniquely number each branch using input pattern information, and transition-origin state information for example in each case.

On the other hand, the input/output decoding circuit 90 uses the branch input/output information computation circuit 223 to uniquely number each of trellis branches correspondingly to the number of memories as shown in FIG. 78, and compute branch input/output information BI extending in a sequence opposite to the time base. That is, to decode a code from the convolutional encoder whose memories count "2" in number, the soft-output decoding circuit 90 uses the branch input/output information computation circuit 223 to number trellis branches as shown in FIG. 78A, and to decode a code from the convolutional encoder whose memories count "1" in number, the soft-output decoding circuit 90 uses the branch input/output information computation circuit 223 to number trellis branches as shown in FIG. 78B. As shown in FIG. 78A, four sets of branches obtained by tying together every successive two of eight branches running from a state whose number is "0" are numbered "0, 1", "2, 3", "4, 5" and "6, 7", respectively, and four sets of branches obtained by tying every successive two of eight branches running from a state numbered "1" are numbered "8, 9", "10, 11", "12, 13" and "14, 15", respectively. Note that no possible examples of numbering four branches running to each state will not be described in detail herein but the soft-output decoding circuit 90 can classify possible cases of branch numbering according to the generator matrix information CG and uniquely number each branch using input pattern information, and transition-origin state information for example in each case.

As above, in case the trellis has a structure in which a path runs from each state to all states at a next time, the soft-output decoding circuit 90 numbers all trellis branches based on the uniqueness of the structure of the entire trellis, so that it is possible to uniquely detect a transition-origin state and transition-destination state from a branch number, but not depending upon the code configuration. Therefore, the soft-output decoding circuit 90 can uniquely decode the transition-origin state and transition-destination state under a simple control.

Note that the trellis branch numbering for decoding a code is done as having been described above with reference to FIGS. 77 and 78 but branch numbers are not limited those shown in FIGS. 77 and 78 so long as branches each providing a connection between a transition-origin state and transition-destination state are uniquely numbered.

5.2 Entering Termination Information

This is a feature of the aforementioned termination information generation circuit 153. To repetitively decode a code such as PCCC, SCCC, TTCM or SCTCM, a terminating operation is required. To this end, the element decoder 50 generates termination information by any of the following two techniques.

5.2.1 Entering Information for Input Bits for Termination Period

As mentioned above, in the Wozencraft's convolutional encoder, the transition-destination state is limited. For this reason, to terminate the Wozencraft the convolutional decoding, the soft-output decoding circuit 90 is supplied with the number of input bits of information to the convolutional encoder, as termination information, for a termination period to specify a termination state.

Figure 79:
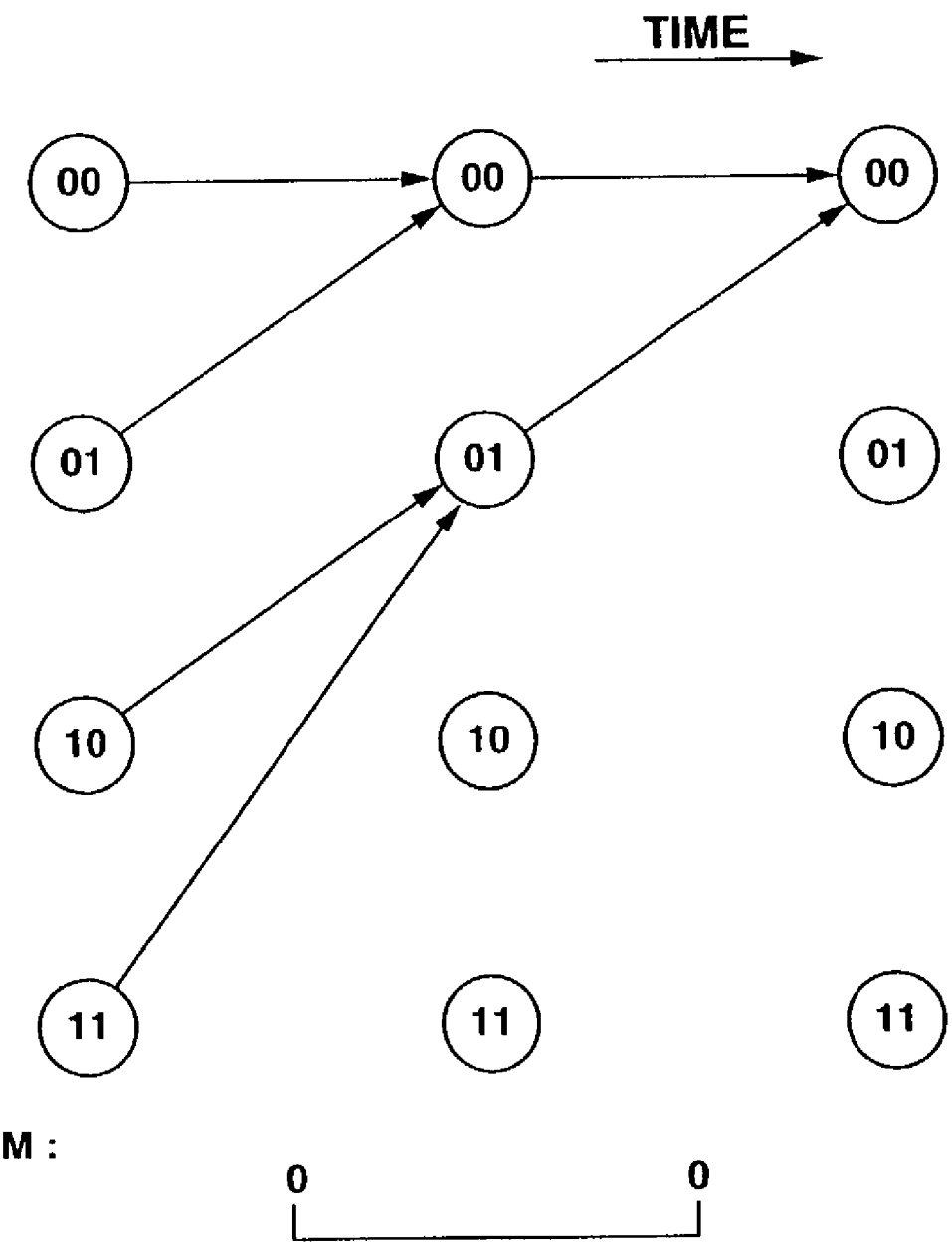
FIG. 79 shows a trellis for explaining entry of termination information for input bits for a termination period in the termination information generating procedure.

More particularly, in case the number of input bits is "1" and a code from the Wozencraft's convolutional encoder whose memories count "2" in number is terminated by a state denoted by "00", the soft-output decoding circuit 90 can cause the termination information generation circuit 153 to generate one bit "0" for the number of input bits as termination state information TSM in one time slot and the termination state information TSM for two time slots corresponding to the number of memories, to thereby specify the state denoted by "00", as shown in FIG. 79.

Thus, the element decoder 50 can terminate an arbitrary Wozencraft's convolutional code whose coding rate is denoted by "k/n". The element decoder 50 can be designed to have a minimum number of pints for entry of termination information, and can appropriately generate termination information also when for example the termination pattern is longer and thus a continuous terminating operation is required, to thereby permitting to avoid mismatching of termination information input.

5.2.2 Entering Information Indicative of Termination State in One Time Slot

As above, in any element encoder other than the Wozencraft's convolutional encoder, such as a such as a Massey's convolutional encoder, the transition-destination state is not limited as in the Wozencraft's convolutional encoder. Thus, to terminate a code other than a Wozencraft's convolutional code, it is not possible to enter information for the number of input bits as termination information for the termination period.

To avoid the above, the soft-output decoding circuit 90 supplies information indicating a termination state as termination information in one time slot to specify the termination state.

Figure 80:
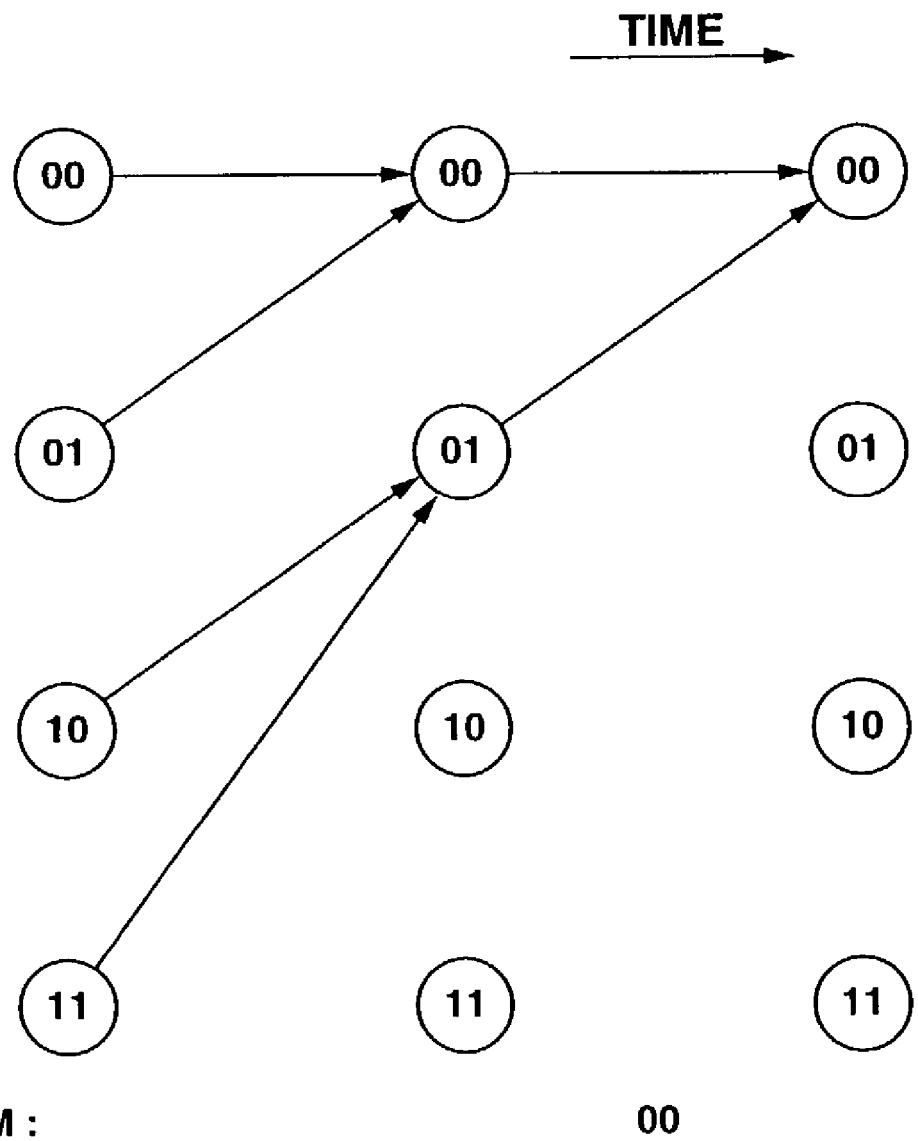
FIG. 80 shows a trellis for explaining entry of termination information in one time slot in the termination information generating procedure.

More particularly, to terminate a Massey's convolutional code whose number of input bits is "1" and whose memories count "2" in number to a state denoted by "00", the soft-output decoding circuit 90 can cause the termination information generation circuit 153 to generate two bits "00" indicating a termination state as termination state information TSM in one time slot, as shown in FIG. 80*b* for example, thereby specifying a termination state "00".

Thus, the element decoder 50 can terminate any trellis code including a Massey's convolutional code whose configuration varies depending upon its configuration. Of course, the element decoder 50 can also terminate a Wozencraft's convolutional code by the use of the above technique. Also, this technique is applicable to any decoding other than the soft-out decoding, such as the so-called Viterbi decoding for example.

5.3 Processing Erasure Position

This is a feature of the aforementioned received value and a priori probability information selection circuit 154.

In the soft-output decoding, it is normally necessary to separately hold information indicative of a position where there exists no coded output due to puncture or the like until at least the log likelihood Iγ is computed, and the received value and a priori probability information selection circuit 154 has to be provided with a storage circuit to hold the information, for example.

To this end, the soft-output decoding circuit 90 places a symbol whose likelihood is "0" in a position where no coded output exists, based on inner erasure position information IERS supplied from the inner erasure information generation circuit 152, as having previously been described. That is, on the assumption that the probability of whether a bit corresponding to a position where there is no coded output is "0" or "1" is "½", the sot-output decoding circuit 90 creates a state equivalent to that a due coded output has been erased, without any influence on the decoding operation.

Thus, since the element decoder 50 has not to be provided with any storage circuit to hold information indicative of a position where there exists no coded output, the element decoder can be designed in a reduced circuit scale.

5.4 Computing and Distributing Log Likelihood Iγ

This is a feature of the aforementioned Iγ computation circuit 156 and Iγ distribution circuit 157. As has previously been described, the element decoder 50 can make a soft-output decoding, without changing the circuit construction and independently of the code type, of a code from an arbitrary element encoder such as the convolutional encoders having been described with reference to FIGS. 18 to 21. To this end, the element decoder 50 has the following four features as to the computation and distribution the of log likelihood Iγ.

5.4.1 Computing and Distributing Log Likelihood Iγ for All Input/Output Patterns To decode an arbitrary code, the soft-output decoding circuit 90 uses the Iγ computation circuit 156 to compute a log likelihood Iγ for all possible input/output patterns and the Iγ distribution circuit 157 to distribute them correspondingly to an input/output pattern determined according to the configuration of the code.

Figure 81:
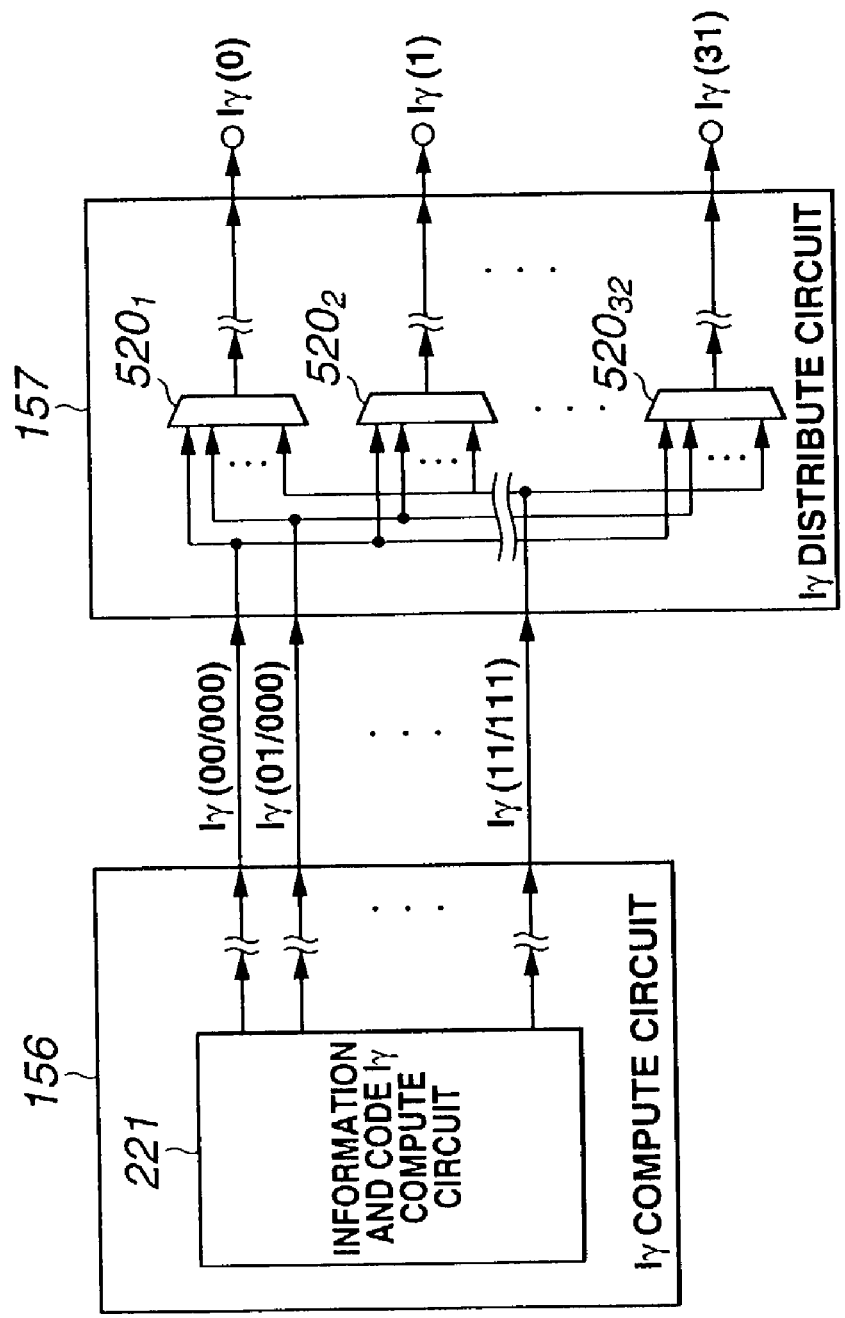
FIG. 81 is a schematic block diagram of the Iγ computation circuit and Iγ distribution circuit, explaining how a log likelihood Iγ is computed for an entire input/output pattern and distributed correspondingly to an input/output pattern determined according to a configuration of the code.

Decoding codes from the convolutional encoders having been described with reference to FIGS. 18 to 21 will further be discussed herebelow. The trellis in each of these convolutional encoders has less than 32 branches and has at most 32 types of input/output patterns. As schematically illustrated in FIG. 81, the soft-output decoding circuit 90 computes all the 32 types of input/output patterns by the information and code I$\gamma$ computation circuit 221 in the I$\gamma$ computation circuit 156. Note that "I$\gamma$ (00/000)" in FIG. 81 indicates a log likelihood I$\gamma$ corresponding to a trellis of the element decoder in which the input data/output data is "00/000". The soft-output decoding circuit 90 selects, correspondingly to an input/output pattern determined correspondingly to the configuration of a code to be decoded, one of 32 types of log likelihood I$\gamma$ (00/000), I$\gamma$ (01/000), . . . , I$\gamma$ (11/111) by means of the selectors $520_1$, $520_2$, . . . , $520_{32}$, respectively, corresponding to the I$\alpha$-computing I$\gamma$ distribution circuit $224_3$, I$\beta$0-computing I$\gamma$ distribution circuit $224_1$ or I$\beta$1-oriended I$\gamma$ distribution circuit $224_2$ in the aforementioned I$\gamma$ distribution circuit 157, respectively, processes the 32 types of log likelihood I$\gamma$ obtained via the selection in a predetermined manner, and then distributes and outputs them as log likelihood I$\gamma$ (0), I$\gamma$ (1), . . . , I$\gamma$ (31) corresponding to branch numbers 0, 1, . . . , 31.

With these operations, the element decoder 50 can decode an arbitrary trellis code having a smaller number of branches than a predetermined one without changing the circuit construction. In particular, this technique is effective in case there are a small number of input/output patterns, while there are a large number of trellis branches.

5.4.2 Computing and Distributing Log Likelihood I$\gamma$ for at Least a Part of the Input/Output Patterns In the case of the technique having been described in Subsection 5.4.1, the I$\alpha$-computing I$\gamma$ distribution circuit $224_3$, I$\beta$0-computing I$\gamma$ distribution circuit $224_1$ or I$\beta$1-computing I$\gamma$ distribution circuit $224_2$ in the I$\gamma$ distribution circuit 157 selects one of 32 types of signals. That is, it has at least 32 selections for making a 32-to-1 selection and will possible be larger in circuit scale.

To avoid the above, the soft-output decoding circuit 90 uses the I$\gamma$ computation circuit 156 to compute a log likelihood I$\gamma$ for at least a part of the input/output patterns, not the log likelihood I$\gamma$ for all the 32 types of input/output patterns, and uses the I$\gamma$ distribution circuit 157 to select a desired log likelihood I$\gamma$, and then add the thus selected log likelihood I$\gamma$.

Figure 82:
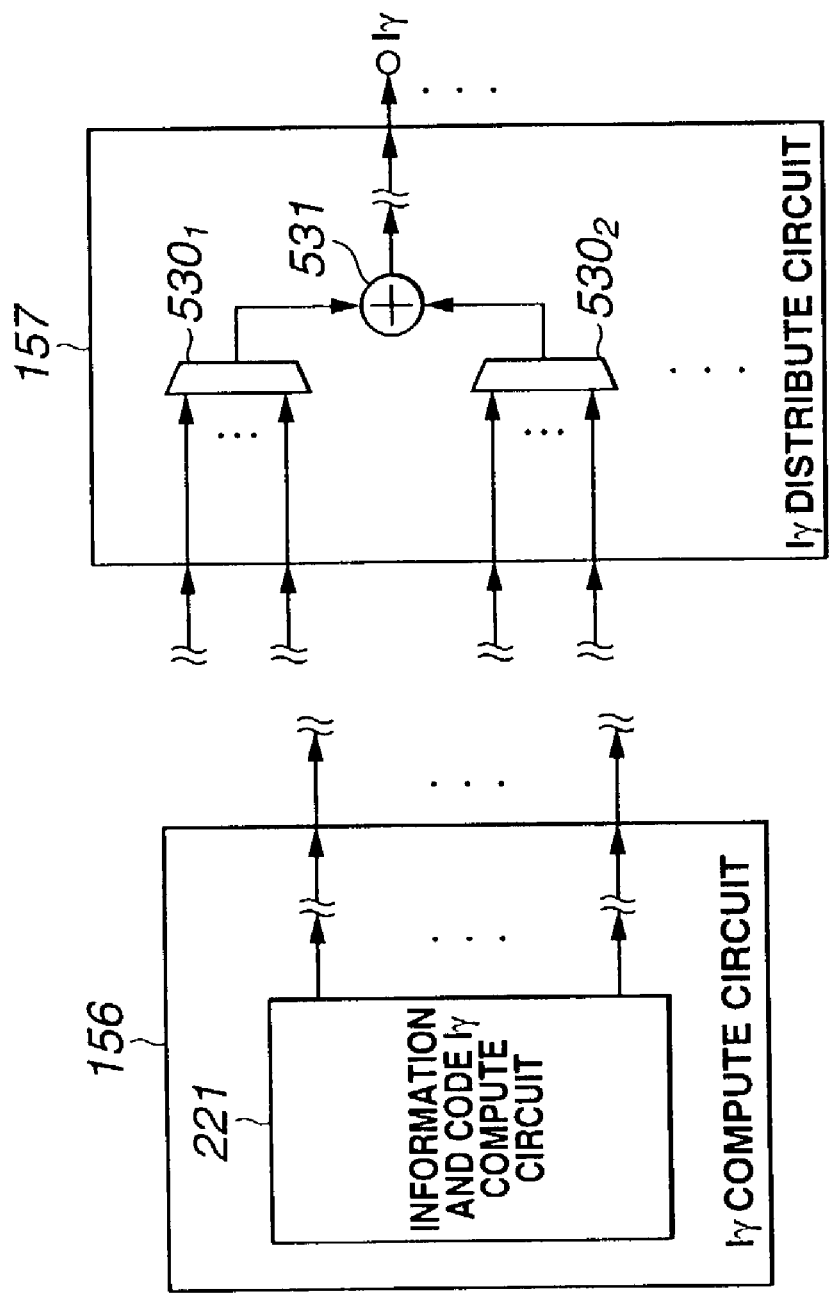
FIG. 82 is a schematic block diagram of the Iγ computation circuit and Iγ distribution circuit, explaining how a log likelihood Iγ is computed for at least a part of the input/output pattern, and a desired log likelihood Iγ is selected and added.

For further understanding of the present invention, decoding a code from each of the convolutional encoders having been once described with reference to FIGS. 18 to 21 will be discussed in detail herebelow. The convolutional encoder shown n FIG. 18 has at most 16 types of input/output patterns; that in FIG. 19 has at most 32 types of input/output patterns; that in FIG. 20 has at 8 types of input/output patterns; and that in FIG. 21 has at most 16 types of input/output patterns. The convolutional encoder having the largest number of input/output patterns as shown in FIG. 19 has at most 4 types of input/output patterns and at most 8 types of input/output patterns. As schematically illustrated in FIG. 82, the soft-output decoding circuit 90 uses the information and code I$\gamma$ computation circuit 221 in the I$\gamma$ computation circuit 156 to compute a log likelihood I$\gamma$ corresponding to the 4 types and eight types of input/output patterns. Then, according to an input/output pattern determined correspondingly to the code configuration, the soft-output decoding circuit 90 uses the selector $530_1$ in the I$\gamma$ computation circuit 157 to select one of 4 log likelihood I$\gamma$ corresponding to the 4 types of input patterns, while using the selector $530_2$ in the I$\gamma$ distribution circuit 157 to select one of the eight log likelihood I$\gamma$ corresponding to the 8 types of input patterns, and then uses the adder 531 in the I$\gamma$ distribution circuit 157 to add together the two log likelihood I$\gamma$ obtained via the selection, processes the information in a predetermined manner, and then distributes and outputs the information as a log likelihood I$\gamma$ corresponding to a branch number. In the I$\gamma$ distribution circuit 157, at most 2 circuits including such 2 selectors $530_1$ and $530_2$ and adder 531 are provided to form each of the above-mentioned I$\alpha$-computing I$\gamma$ distribution circuits $224_3$ and I$\beta$0-computing I$\gamma$ distribution circuit $224_1$ or I$\beta$1-computing I$\gamma$ distribution circuit $224_2$.

Thus, the element decoder 50 has not to be provided with any great number of selectors having a large circuit scale for the 32-to-1 selection but should be provided with selectors having a small circuit scale for 4-to-1 selection and 8-to-1 selection and an adder. The element decoder 50 designed as in the latter case to have the small circuit scale can decode an arbitrary trellis code having a smaller number of branches than predetermined without changing the circuit construction. In particular, this technique is effective in case there are more input/output patterns than the trellis branches. Also, this technique is extremely effective in case input and output bits cannot be separated bit by bit, for example, in case the encoder 1 is to code a code such as TTCM or SCTCM or in case input data to and output data from the encoder 1 are to be decoded symbol by symbol.

5.4.3 Normalizing Log Likelihood I$\gamma$ for All the Input/Output Patterns at Each Time Generally, in the Log-BCJR algorithm, a result of coding or decoding is influenced only by a difference between log likelihood and a log likelihood having a larger value is more important.

However, it is possible in some cases the log likelihood I$\gamma$ will be uneven in value mapping as the time elapses in the process of computation and will exceed, after elapse of a predetermined time, a range in which the system for computing the log likelihood I$\gamma$ can express it.

For example, in case the log likelihood I$\gamma$ is computed by a system in which only positive values such as a hardware are handled, the log likelihood I$\gamma$ will gradually be larger and exceed, after elapse of a predetermined time, the range in which the hardware can express it. Also, in case a log likelihood I$\gamma$ is computed by a system which handles only negative values, such as a system to make floating-point operation, the value of the log likelihood I$\gamma$ will gradually be smaller and exceed, after elapse of the predetermined time, the range in which the software can express it. Thus, the log likelihood I$\gamma$ exceeds the range in which it can be expressed, and the log likelihood I$\gamma$ exceeding that range will be clipped exceed.

To avoid that the log likelihood I$\gamma$ is clipped and it is difficult to express a difference between appropriate log likelihood, the soft-output decoding circuit 90 makes a normalization to correct the uneven mapping of the log likelihood I$\gamma$.

More particularly, to compute a log likelihood I$\gamma$ for all possible input/output patterns by the technique having been described in Subsection 5.4.1, the soft-output decoding circuit 90 makes normalization as follows. That is, the soft-output decoding circuit 90 uses the I$\gamma$ normalization circuit 222 in the I$\gamma$ computation circuit 156 to make a predetermined computation of each of a plurality of log likelihood I$\gamma$ (00/000), I$\gamma$ (01/000), . . . , I$\gamma$ (11/111) computed by the information and code I$\gamma$ computation circuit 221 so that a log likelihood I$\gamma$ corresponding to one, whose probability y has a maximum value, of the log likelihood I$\gamma$ (00/000), I$\gamma$ (01/000), . . . , I$\gamma$ (11/111) will fit to a log likelihood corresponding to the maximum value of a possible probability.

Figure 83:
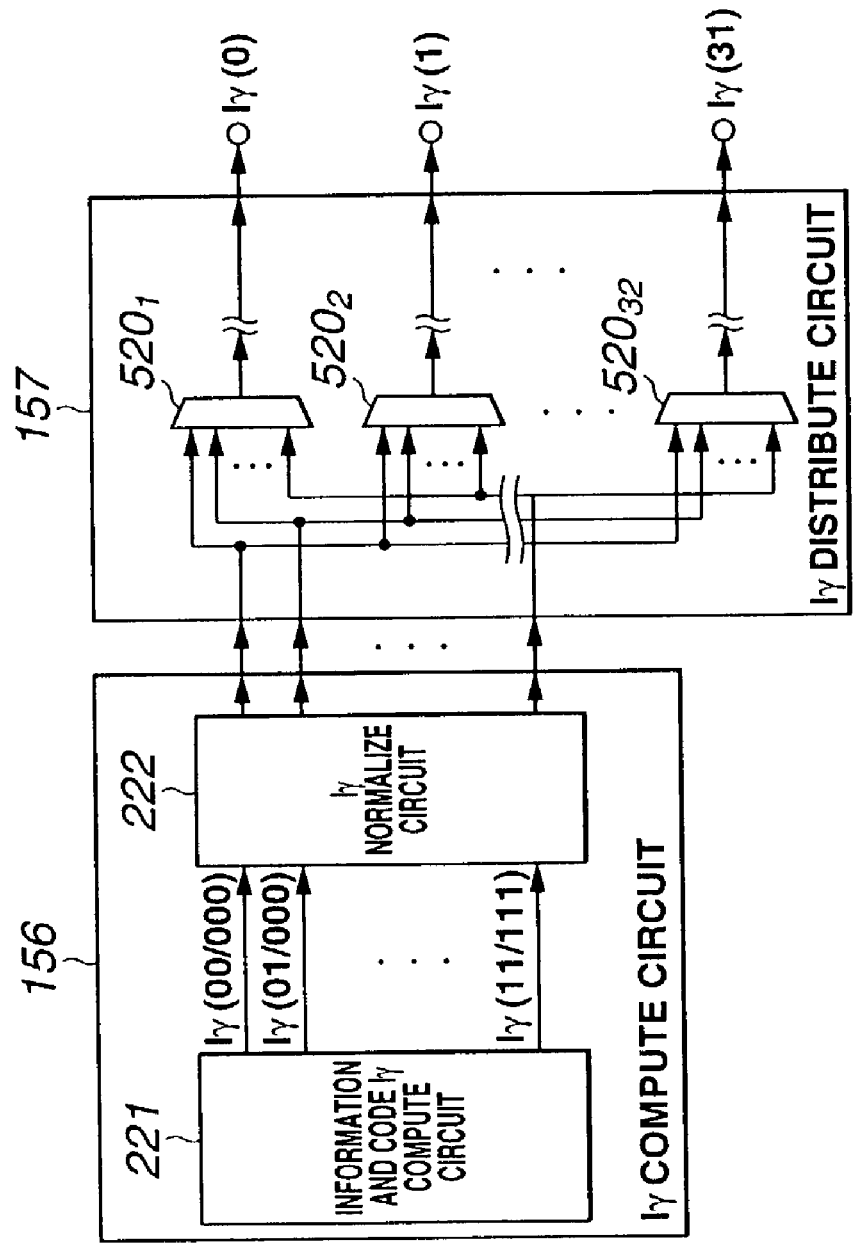
FIG. 83 is a schematic block diagram of the Iγ computation circuit and Iγ distribution circuit, explaining how the log likelihood Iγ is normalized at each time in the computation of the likelihood Iγ for the entire input/output pattern.

More specifically, when the element decoder 50 handles the log likelihood as a negative value, that is, when the aforementioned constant sgn is "+1", the soft-output decoding circuit 90 uses the Iγ normalization circuit 222 in the Iγ computation circuit 156 to add a predetermined value to each of the plurality of log likelihood Iγ (00/000), Iγ (01/000), . . . , Iγ (11/111) computed by the information and code Iγ computation circuit 221 so that a log likelihood corresponding to one, whose probability has the maximum value, of the log likelihood Iγ (00/000), Iγ (01/000), . . . , Iγ (11/111) will fit to a maximum value the element decoder 50 can express, as schematically be illustrated in FIG. 83.

Figure 84A:
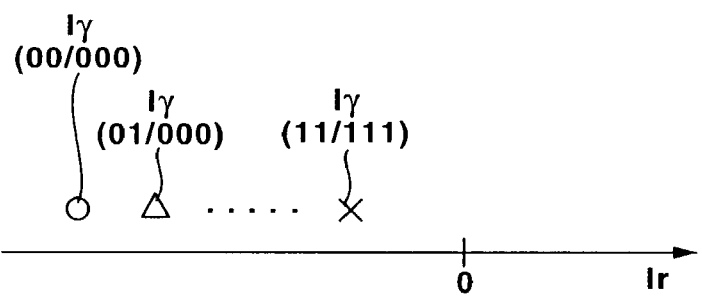
Figure 84B:
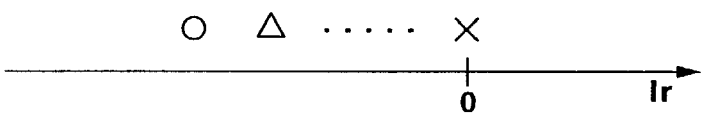

For example, on the assumption that each of the plurality of log likelihood Iγ (00/000), Iγ (01/000), . . . , Iγ (11/111) computed at a time shows a mapping as shown in FIG. 84A, the Iγ normalization circuit 222 adds a predetermined value to each of the plurality of likelihood Iγ (00/000), Iγ (01/000), . . . , Iγ (11/111) so that the log likelihood Iγ (11/111), having the maximum value and indicated with a plot "x", of the plurality of likelihood Iγ (00/000), Iγ (01/000), . . . , Iγ (11/111) will be "0" as shown in FIG. 84B.

Also, when the element decoder 50 handles the log likelihood as a positive value, that is, when the aforementioned constant sgn is "−1", the soft-output decoding circuit 90 uses the Iγ normalization circuit 222 in the Iγ computation circuit 156 to subtract a predetermined value from each of the plurality of log likelihood Iγ (00/000), Iγ (01/000), . . . , Iγ (11/111) computed by the information and code Iγ computation circuit 221 so that a log likelihood corresponding to one, whose probability has a minimum value, of the log likelihood Iγ (00/000), Iγ (01/000), . . . , Iγ (11/111) will fit to a minimum value the element decoder 50 can express.

Figure 85A:
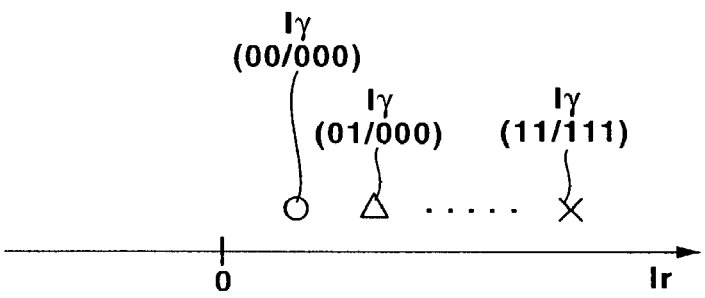
Figure 85B:
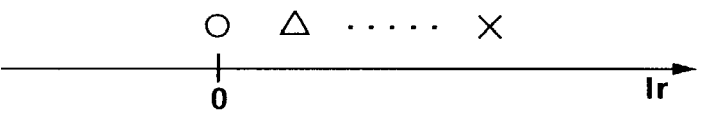

For example, on the assumption that each of the plurality of log likelihood Iγ (00/000), Iγ (01/000), . . . , Iγ (11/111) computed at a time shows a mapping as shown in FIG. 85A, the Iγ normalization circuit 222 subtracts a predetermined value from each of the plurality of likelihood Iγ (00/000), Iγ (01/000), . . . , Iγ (11/111) so that the log likelihood Iγ (00/000), having the minimum value and indicated with a plot "○", of the plurality of likelihood Iγ (00/000), Iγ (01/000), . . . , Iγ (11/111) will be "0" as shown in FIG. 85B.

After making the above normalization by the Iγ normalization circuit 222, the soft-output decoding circuit 90 makes a clipping correspondingly to a necessary dynamic range and supplies the information as log likelihood GA, GB0 and GB1 to the Iγ distribution circuit 157.

The element decoder 50 can reduce the number of bits of the log likelihood GA, GB0 and GB1 supplied from the Iγ computation circuit 156 to the Iγ distribution circuit 157 by making the above normalization at each time by means of the Iγ normalization circuit 222. Also, the element decoder 50 can express a difference between appropriate log likelihood and make a highly accurate decoding without clipping any great-value, important log likelihood.

Note that the element decoder 50 may not always have the Iγ normalization circuit 222 provided in the Iγ computation circuit 156. For example, the element decoder 50 may have the Iγ normalization circuit 222 provided downstream of the Iγ distribution circuit 157. Of course, this is effective in decoding an arbitrary code as well as in decoding a fixed arbitrary.

5.4.4 Normalizing Log Likelihood Iγ for at Least a Part of Input/Output Patterns To compute log likelihood Iγ for at least a part of the input/output patterns by the technique having been described in Subsection 5.4.2, the soft-output decoding circuit 90 normalizes as will be described below. That is, the soft-output decoding circuit 90 uses the Iγ normalization circuit 222 in the Iγ computation circuit 156 to make a predetermined computation of each of the plurality of log likelihood Iγ corresponding to an input pattern computed by the information and code Iγ computation circuit 221 so that a one, of the plurality of log likelihood Iγ, which corresponds in probability γ to a likelihood having the maximum value will fit to a log likelihood Iγ corresponding to the maximum value of a possible probability.

Figure 86:
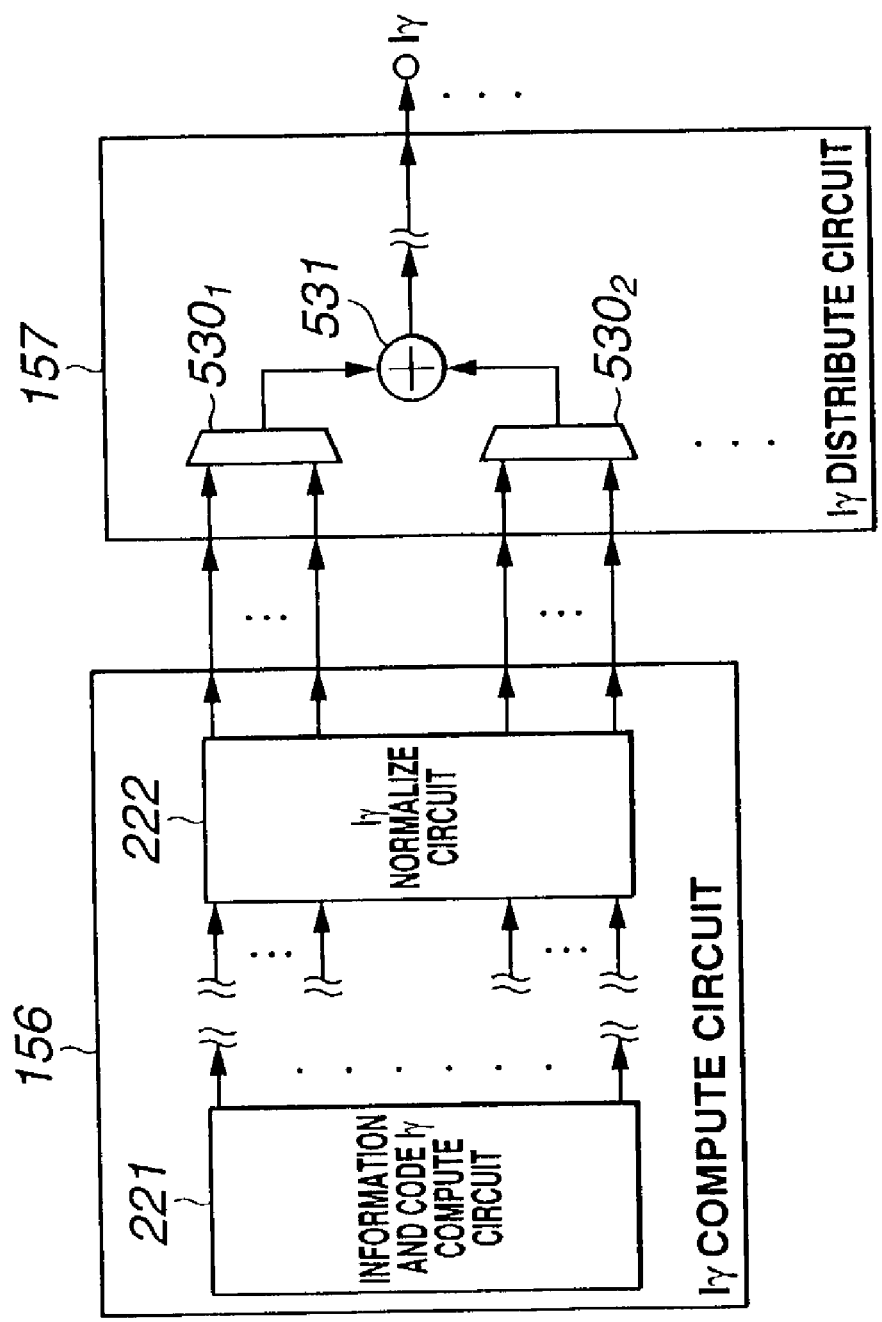
FIG. 86 is a schematic block diagram of the Iγ computation circuit and Iγ distribution circuit, explaining how a log likelihood Iγ for at least a part of the input/output pattern is normalized at each time for computation of the log likelihood Iγ.

More specifically, when the element decoder 50 handles a log likelihood as a positive value, namely, when the aforementioned constant sgn is "+1", the soft-output decoding circuit 90 makes a normalization by adding, by the Iγ normalization circuit 222 in the Iγ computation circuit 156, a predetermined value to each of the plurality of likelihood Iγ so that a one, having the maximum value, of the plurality of log likelihood Iγ corresponding to an input pattern computed by the information and code Iγ computation circuit 221 will fit to a maximum value the element detector 50 can express, while adding a predetermined value to each of a plurality of log likelihood Iγ so that a one, having the maximum value, of the plurality of log likelihood Iγ corresponding to an output pattern computed by the information and code Iγ computation circuit 221 will fit to a maximum value the element decoder 50 can express, as schematically shown in FIG. 86.

Also, when the element decoder 50 handles a log likelihood as a negative value, namely, when the aforementioned constant sgn is "−1", the soft-output decoding circuit 90 makes a normalization by adding, by the Iγ normalization circuit 222 in the Iγ computation circuit 156, a predetermined value to each of the plurality of likelihood Iγ so that a one, having the minimum value, of the plurality of log likelihood Iγ corresponding to an input pattern computed by the information and code Iγ computation circuit 221 will fit to a minimum value the element detector 50 can express, while adding a predetermined value to each of a plurality of log likelihood Iγ so that a one, having the minimum value, of the plurality of log likelihood Iγ corresponding to an output pattern computed by the information and code Iγ computation circuit 221 will fit to a minimum value the element decoder 50 can express.

That is, the soft-output decoding circuit 90 normalizes a log likelihood Iγ corresponding to an input pattern and a log likelihood Iγ corresponding to an output pattern.

The soft-output decoding circuit 90 uses the Iγ normalization circuit 222 to make the above normalization and then a clipping correspondingly to a necessary dynamic range, and supplies the information as log likelihood GA, GB0 and GB1 to the Iγ distribution circuit 157.

By making such a normalization at each time by the Iγ normalization circuit 222, the element decoder 50 can reduce the scale of searching for a log likelihood Iγ having a maximum or minimum value and thus can be designed to operate at a higher speed and have a reduced circuit scale. Also, the element decoder 50 can reduce the number of bits of the log likelihood GA, GB0 and GB1 supplied from the Iγ computation circuit 156 to the Iγ distribution circuit 157, express a difference between appropriate log likelihood and make a highly accurate decoding without clipping any great-value, important log likelihood.

In this case, depending upon the configuration of a code to be decoded, the maximum or minimum value of the final log likelihood Iγ does always coincide with a maximum or minimum value the element decoder 50 can express. In case all input/output patterns appear, however, the normalization having just been described above is equivalent to that described in Subsection 5.4.3, the decoding performance will not be lower.

Note that also in this case, the element decoder 50 may not always have the $I\gamma$ normalization circuit 222 in the $I\gamma$ computation circuit 156.

5.5 Computing Log Likelihood $I\alpha$ and $I\beta$

This is a feature of the aforementioned $I\alpha$ computation circuit 158 and $I\beta$ computation circuit 159. It is also a feature of the $I\gamma$ distribution circuit 157 as the case may be. The element decoder 50 performs the following nine functions in computation of log likelihood $I\alpha$ and $I\beta$.

5.5.1 Computing Sum of Log Likelihood $I\alpha$ and $I\gamma$

To compute a log soft-output $I\lambda$ in the soft-output decoding, it is necessary to predetermine a sum of the log likelihood $I\alpha$ and $I\gamma$ as given by the expression (55). That is, normally in the soft-output decoding, a circuit to compute the sum of the log likelihood $I\alpha$ and $I\gamma$ has to be provided separately in order to compute the log soft-output $I\lambda$. However, it will possibly cause the log soft-output $I\lambda$ computation circuit to be increased in scale.

To this end, the soft-output decoding circuit 90 uses the sum $I\alpha+I\gamma$ of log likelihood $I\alpha$ and $I\gamma$ determined in the process of computing the log likelihood $I\alpha$ in order to compute the log soft-output $I\lambda$ as well. More particularly, the soft-output decoding circuit 90 does not output a log likelihood $I\alpha$ computed by the $I\alpha$ computation circuit 158 as above as it is but outputs the sum of computed log likelihood $I\alpha$ and $I\gamma$. That is, the $I\alpha$ computation circuit 158 will output the sum $I\alpha+I\gamma$ of log likelihood $I\alpha$ and $I\gamma$ computed in the process of computing the log likelihood $I\alpha$ by the add/compare selection circuits 241 and 242.

Thus, the element decoder 50 has not to include any circuit to compute a sum of log likelihood $I\alpha$ and $I\gamma$, which is necessary to compute the log soft-output $I\lambda$, which will lead to a reduction of the circuit scale.

5.5.2 Pre-Processing Parallel Paths

As in the coding by the convolutional encoder having been described with reference to FIG. 21 for example, it is desired in some cases to decode a code whose parallel paths exist in a trellis. In the convolutional encoder shown in FIG. 29, for example, the trellis has a structure in which four parallel path sets each including two parallel paths run from each state to states at a next time. Namely, this trellis has a structure in which eight paths go to each state at a next time.

It should be reminded here that eight parallel paths run from one transition-origin state and eight parallel paths run to one transition-destination state at the next time. That is, the parallel paths may be regarded as one path. With this factor taken in consideration, the soft-output decoding circuit 90 is designed to make a log-sum operation of log likelihood $I\gamma$ corresponding to parallel paths in advance before computing log likelihood $I\alpha$ and $I\beta$ in order to decode a code whose parallel paths exist in the trellis. More specifically, the soft-output decoding circuit 90 includes the aforementioned $I\beta0$-computing parallel path processing circuit 225₁, $I\beta1$-computing parallel path processing circuit 225₂ and $I\alpha$-computing parallel path processing circuit 225₃ in the $I\gamma$ distribution circuit 157 to make a log-sum operation of log likelihood $I\gamma$ corresponding to the parallel paths.

Thus, the element decoder 50 can reduce the processing burden of the $I\alpha$ computation circuit 158 and $I\beta$ computation circuit 159 to improve the operating speed without any degradation of the performance.

Note that the element decoder 50 causes the $I\gamma$ distribution circuit 157 to tie together the parallel paths but the present invention may not be limited to this feature. That is, it is satisfactory for the element decoder 50 to tie together log likelihood $I\gamma$ corresponding to parallel paths before the computation of the log likelihood $I\alpha$ and $I\beta$. Also, the tying of two parallel paths as one set has been described herein as an example, but an arbitrary number (four, for example) of parallel paths may be tied together as one set.

5.5.3 Sharing Add/Compare Selection Circuit for Different Codes

The element decoder 50 can decode an arbitrary code, but to decode each code whose number of input bits to the element encoder is k, there should be provided for each of the element decoders 50 an add/compare selection circuit intended for selection of either addition or comparison as well as for addition of a correction term by a log-sum correction, for computation of log likelihood $I\alpha$ and $I\beta$, and supports a trellis in which a number $2^k$ of paths run to each state. Generally, such an add/compare selection circuit for a code from the element, encoder whose number k of input bits will be larger in scale and the processing burden to the circuit be also increased.

There will be described herebelow the decoding a code from four types of convolutional encoders having been described with reference to FIGS. 18 to 21, respectively, by way of example. In this case, the add/comparison selection circuit to support a code from the convolutional encoder shown in FIG. 18 should be a one which can support a trellis structured so that a number $2^1$ ($=2$) of paths run from each state to states at a next time. Also, the add/comparison selection circuit intended to support a code from the convolutional encoders shown in FIGS. 19 and 20 should be a one which can support a trellis structured so that a number $2^2$ ($=4$) of paths run from each state to states at a next time. Further, an add/comparison selection circuit to support a code from the convolutional encoder shown in FIG. 21 should be a one capable of supporting a trellis structured so that a number $2^3$ ($=8$) of paths run from each state to states at a next time.

It should be reminded that a code from the convolutional encoder shown in FIG. 21 is a one in which parallel paths exist in the trellis. When the parallel paths are tied together as in Subsection 5.5.2, the trellis of this code may be simulated with a number ($v=2$) of memories in the convolutional encoder to be a one having a structure in which a number $2v$ ($=2^2=4$) of paths run from each state to states at a next time.

To this end, the soft-output decoding circuit 90 is not provided with any add/compare selection circuit which supports a code from an element encoder, whose number k of input bits is k=3 but with an add/compare selection circuit which supports a code whose number of input bits to the element encoder is k=2=v, and it uses this add/compare selection circuit to process a code from the element decoder whose number of input bits is k=3, as well.

More particularly, the soft-output decoding circuit 90 has only the add/compare selection circuits 241 and 242 provided in the $I\alpha$ computation circuit 158 to process a code whose number of input bits to the element encoder is k=1, 2, and only the add/compare selection circuits 283 and 284 provided in the $I\beta$ computation circuit 159 to process a code from the element decoder, whose number of input bits is k=1, 2, and uses the add/compare selection circuits 242 and 284 to process a code whose number of input bits to the element encoder is k=3. Namely, the soft-output decoding circuit 90 uses an add/compare selection circuit which supports a code whose number of input bits to the element encoder is k=2=v, instead of an add/compare selection circuit which supports a code whose parallel paths exist in the trellis and whose number of input bits to the element encoder is k=3 and number of memories is v=2<k.

Thus, the element decoder 50 has not to include any add/compare selection circuit which supports a code whose number of input bits to the element encoder is k=3, which contributes to a reduction of the circuit scale.

Note that here is described the sharing of the add/compare selection circuit which supports a code whose number of input bits to the element encoder is k=3, also for processing a code whose number of input bits to the element encoder is k=2, but the element decoder 50 can use, depending upon the configuration of a code to be decoded, an add/compare selection circuit which supports a code whose number of input bits to the element encoder is small. For example, the element decoder 50 can use the add/compare selection circuit which supports a code whose number of input bits to the element encoder is k=2 to process a code whose number of input bits to the element encoder is k=1. For example, a code whose number of input bits to the element encoder is k=3 and in which two sets each of four parallel paths run from each state to arbitrary states can be processed by an add/compare selection circuit which supports a code whose number of input bits to the element encoder is k=1, if the four parallel paths are tied together as one set. That is, the element decoder 50 can use an add/compare selection circuit which supports a code whose number of input bits to the element encoder is $k_1$ and number of memories is $v<k_1$, also for processing a code whose number of input bits to the element encoder is $k_2<k_1$ and number of memories is v.

5.5.4 Outputting Log Likelihood Iγ for Computation of Log Soft-Output Iλ

By tying together the parallel paths by the technique having been described in Subsection 5.5.2, the operations of the add/compare selection circuits in the Iα computation circuit 158 and Iβ computation circuit 159 can be made easier and the operating speed can effectively be made higher, as having been described above. To compute a log soft-output Iλ being a necessary final result, however, a metric is required for each of the parallel paths. That is, to compute a log soft-output Iλ in the soft-output decoding, a log likelihood Iγ with the parallel paths being tied together cannot be used as it is.

For this reason, in case a code whose parallel paths exist in the trellis is to be decoded and the parallel paths are to be tied together, the soft-output decoding circuit 90 separately outputs a log likelihood Iγ for use to compute a log soft-output Iλ. More specifically, the soft-output decoding circuit 90 supplies a log likelihood PGA obtained via the distribution by the Iα-computing Iγ distribution circuit $224_3$ in the Iγ distribution circuit 157 to the Iα-computing parallel path processing circuit $225_3$ and also separately outputted as a log likelihood DGAB.

Thus, the element decoder 50 can tie together the parallel paths without any influence on the result of decoding, with the result that the processing burden to the Iα computation circuit 158 and Iβ computation circuit 159 can be lessened and operations can be made at a higher speed without the performance being degraded. Namely, when the parallel paths are tied together, the element decoder 50 will of necessity output a log likelihood Iγ separately for use to compute a log soft-output Iλ.

5.5.5 Computing Sum of Log Likelihood Iα and Iγ for Parallel Paths

It is effective in view of the circuit scale reduction to output the sum Iα+Iγ of log likelihood Iα and Iγ obtained in the process of computing the log likelihood Iα in order to compute a log soft-output Iλ, as having been described in Subsection 5.5.1. To decode a code whose parallel paths exist in the trellis, however, the sum Iα+Iγ of log likelihood Iα and Iγ obtained by the technique having been described in Subsection 5.5.1 cannot be outputted as it is.

For this reason, to decode a code whose parallel paths exist in the trellis with the parallel paths being tied together, the soft-output decoding circuit 90 includes, in addition to an add/compare selection circuit to compute a log likelihood Iα, a circuit which computes the sum Iα+Iγ of log likelihood Iα and Iγ and to compute a log soft-output Iλ from the result of. More specifically, the soft-output decoding circuit 90 includes the Iα+Iγ computation circuit 243 provided in the Iα computation circuit 158, and uses this Iα+Iγ computation circuit 243 to add together a log likelihood Iα computed by the add/compare selection circuit 242 and a log likelihood Iγ computed by the Iγ distribution circuit 157 with the parallel paths not being tied, and compute a log soft-output Iλ the from the sum of log likelihood.

Thus, the element decoder 50 can tie together the parallel paths without any influence on the result of decoding, with the result that the processing burden to the Iα computation circuit 158 and Iβ computation circuit 159 can be lessened and operations can be made at a higher speed without the performance being degraded. Namely, when the parallel paths are tied together, the element decoder 50 will of necessity output the sum of the log likelihood Iα and Iγ separately for use to compute a log soft-output Iλ.

5.5.6 Selecting Log Likelihood Corresponding to Code Configuration

As having previously been described in Subsection 5.1.2, the Wozencraft's convolutional encoder holds data in time sequence in relation to delay elements, so the data is passed to limited transition-destination states and thus the trellis uniqueness is assured.

For this reason, to decode a code from a Wozencraft's convolutional encoder, the soft-output decoding circuit 90 is provided with a function to decode the code easily by using the trellis uniqueness even when the number of memories included in the convolutional encoder is variable. More specifically, the soft-output decoding circuit 90 includes the add/compare selection circuit 241 and 242 provided in the Iα computation circuit 158, and selectors provided in the add/compare selection circuits 283 and 284 in the Iβ computation circuit 159 to select log likelihood Iα and Iβ to be processed. These elements are not shown in FIGS. 38, 40, 43 and 44.

Figure 87A:
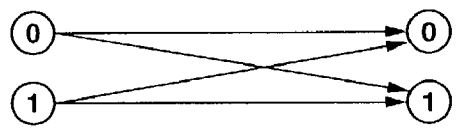
Figure 87B:
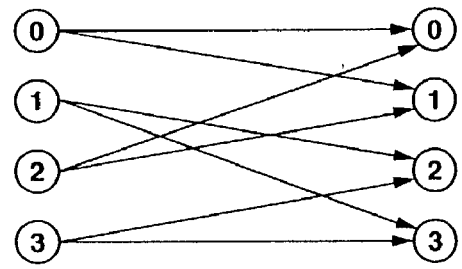
Figure 87C:
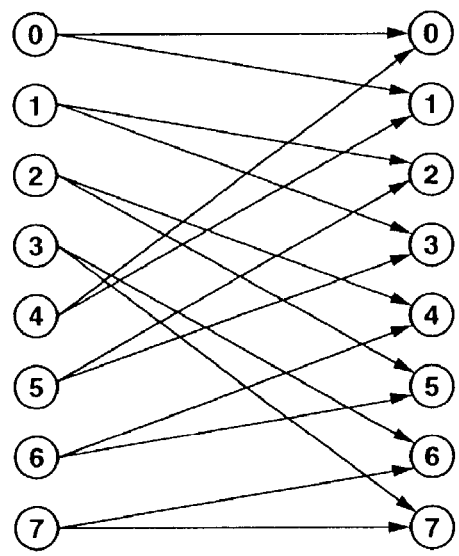
Figure 87D:
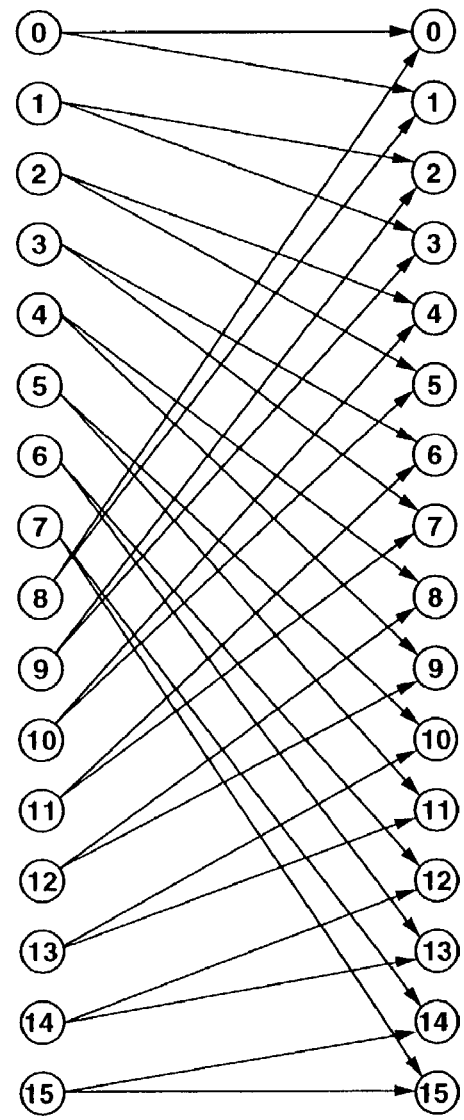

FIGS. 87A, 87B, 87C and 87D show trellises in the convolutional encoder in which the number of memories is variable to "1", "2", "3" or "4" as in the convolutional encoder having been described with reference to FIG. 18 for example. FIG. 87A shows a trellis in the convolutional encoder in which the number of memories is "1", FIG. 87B shows a trellis in the convolutional encoder in which the number of memories is "2", FIG. 87C shows a trellis in which the convolutional encoder in which the number of memories is "3", and FIG. 87D shows a trellis in the convolutional encoder in which the number of memories is "4".

Figure 88:
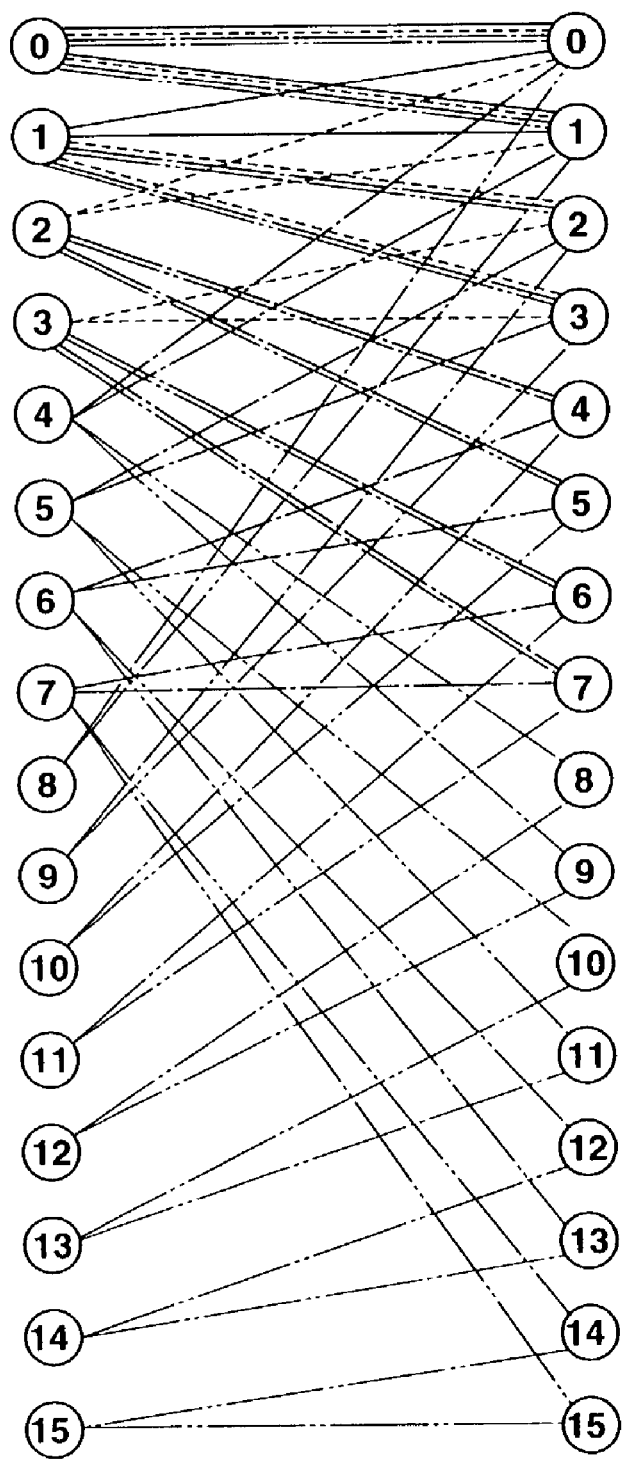
FIG. 88 explains a superposition of four pieces of the trellis shown in FIG. 87.

FIG. 88 shows these four trellises superposed together with the states numbered "0" placed together as their origins. In FIG. 88, the solid lines indicate the trellis branches shown in FIG. 87A, broken lines indicate the trellis branches shown in FIG. 87B, chain liens indicate the trellis branches shown in FIG. 87C and the 2-dot chain lines indicate the trellis branches shown in FIG. 87D.

As will be seen from FIG. 88, the branches running to the states numbered "0" and "1" include four branches superposed together, and four branches running from different states, respectively. Therefore, when the number of memories in the convolutional encoder is variable, one should be selected from the four branches running from different states, respectively.

Also, the branches running to the states numbered "2" and "3" include three branches superposed together, and three branches running from different states, respectively. Therefore, when the number of memories in the convolutional encoder is variable, one should be selected from the three branches running from different states, respectively.

Further, the branches running to the states numbered "4", "5", "6" and "7" include two branches superposed together, and two branches running from different states, respectively. Therefore, when the number of memories in the convolutional encoder is variable, one branch should be selected from two branches running from different states, respectively.

Since the branches running to a state numbered "8" and subsequent states are for data from the convolutional encoder shown in FIG. 87D, it is not necessary to select any branches.

Figure 89:
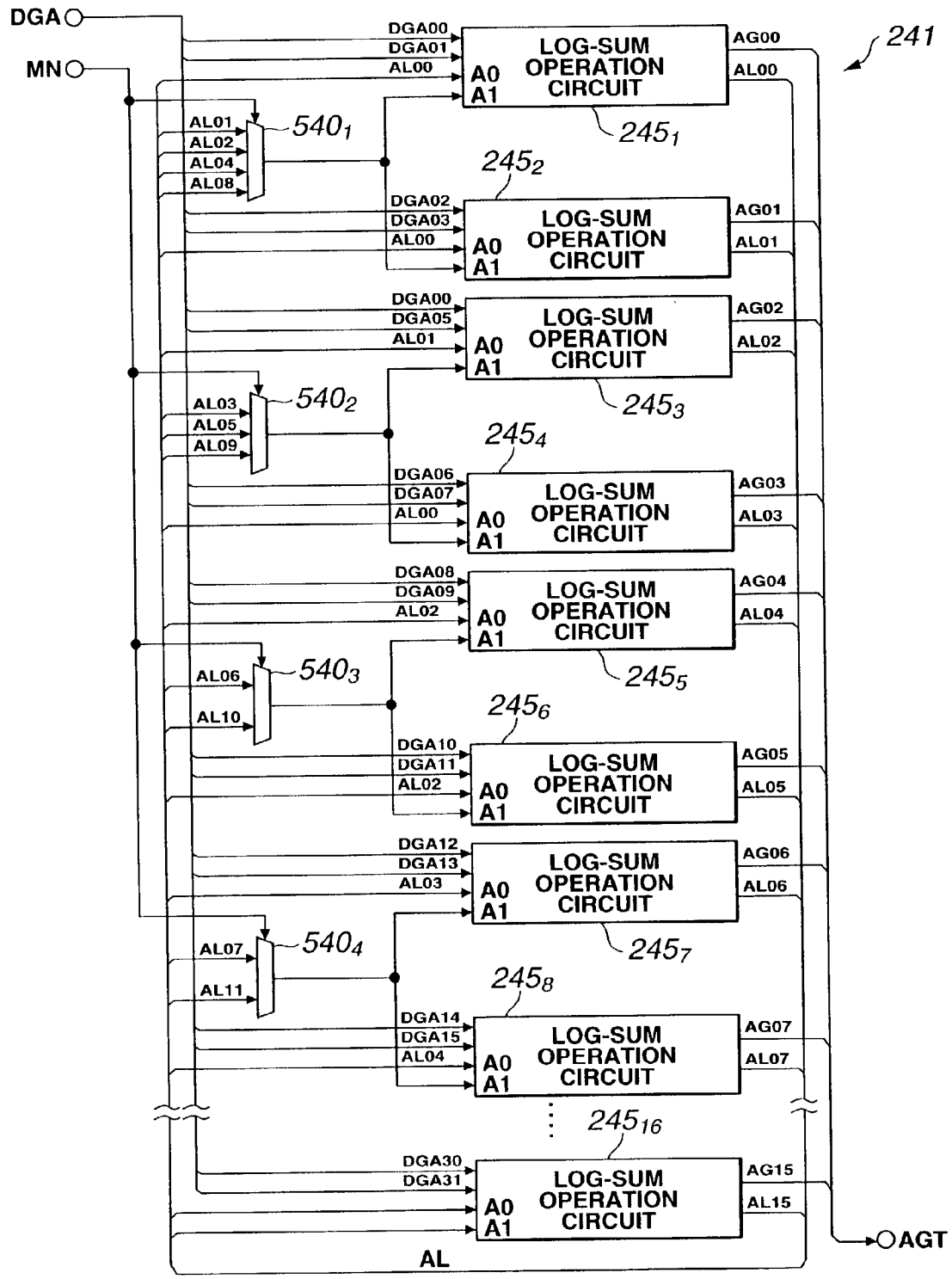
FIG. 89 is a block diagram of the add/compare selection circuit provided in the Iα computation circuit to process a code whose two paths run from each state in the trellis to states at a next time and provided with a selector for the log likelihood Iα.

Taking the above in consideration, the add/compare selection circuit 241 including the aforementioned sixteen log-sum operation circuits $245_n$ may include four selectors $540_1$, $540_2$, $540_3$ and $540_4$ as schematically illustrated in FIG. 89 for example to select a log likelihood AL computed at a preceding time when computing a log likelihood AL at a next time.

That is, the add/compare selection circuit 241 uses the selector $540_1$ to select, based on the number-of-memories information MN, from log likelihood AL having been computed at a preceding time, any one of log likelihood AL01 corresponding to a state whose transition-origin state number is "1", AL02 corresponding to a state whose transition-origin state number is "2", AL04 corresponding to a state whose transition-origin state number is "4", and AL08 corresponding to a state whose transition-origin state number is "8". For example, the selector $540_1$ selects AL01 when the number of memories in the element encoder is "1"; AL02 when the number of memories is "2"; AL04 when the number of memories in the element encoder is "3"; and AL08 when the number of memories in the element encoder is "4". The log-sum operation circuits $245_1$ and $245_2$ are supplied with AL00 as a log likelihood A0 and also with a log likelihood selected by the selector $540_1$ as a log likelihood A1.

Also, the add/compare selection circuit 241 uses the selector $540_2$ to select, based on the number-of-memories information MN, from log likelihood AL having been computed at a preceding time, any one of log likelihood AL03 corresponding to a state whose transition-origin state number is "3", AL05 corresponding to a state whose transition-origin state number is "5", and AL09 corresponding to a state whose transition-origin state number is "9". For example, the selector $540_2$ selects AL03 when the number of memories in the element encoder is "2"; AL05 when the number of memories is "3"; and AL09 when the number of memories in the element encoder is "4". The log-sum operation circuits $245_3$ and $245_4$ are supplied with AL01 as a log likelihood A0 and also with a log likelihood selected by the selector $540_2$ as a log likelihood A1.

Further, the add/compare selection circuit 241 uses the selector $540_3$ to select, based on the number-of-memories information MN, from log likelihood AL having been computed at a preceding time, any one of log likelihood AL06 corresponding to a state whose transition-origin state number is "6", and AL10 corresponding to a state whose transition-origin state number is "10". For example, the selector $540_3$ selects AL06 when the number of memories in the element encoder is "3", and AL10 when the number of memories in the element encoder is "4". The log-sum operation circuits $245_5$ and $245_6$ are supplied with AL02 as a log likelihood A0 and also with a log likelihood selected by the selector $540_3$ as a log likelihood A1.

Further, the add/compare selection circuit 241 uses the selector $540_4$ to select, based on the number-of-memories information MN, from log likelihood AL having been computed at a preceding time, any one of log likelihood AL07 corresponding to a state whose transition-origin state number is "7", and AL11 corresponding to a state whose transition-origin state number is "11". For example, the selector $540_4$ selects AL07 when the number of memories in the element encoder is "3", and AL11 when the number of memories in the element encoder is "4". The log-sum operation circuits $245_7$ and $245_8$ are supplied with AL03 as a log likelihood A0 and also with a log likelihood selected by the selector $540_2$ as a log likelihood A1.

Owing to the selectors provided in the add/compare selection circuit as above, the soft-output decoding circuit 90 can decode a code from the Wozencraft's convolutional encoder, whose number of memories is variable. That is, since the soft-output decoding circuit 90 can efficiently superpose the code trellises corresponding to a number of memories by utilizing the uniqueness of the trellis of the code from the Wozencraft's convolutional encoder, it is possible to easily implement the element decoder 50 capable of decoding a code whose number of memories is variable.

Note that in the foregoing, the add/compare selection circuit 241 in the Iα computation circuit 158 has been described by way of example but the element decoder 50 can perform the same function also in the add/compare selection circuit 242, and add/compare selection circuits 283 and 284 provided in the Iβ computation circuit 159.

Also in the aforementioned example, the add/compare selection circuit has the selection which make a selection of 4-to-1 at maximum, but the trellises may be superposed arbitrarily and the selector scale can be reduced by selecting an appropriate superposition technique.

5.5.7 Normalizing Log Likelihood Iα and Iβ

Similarly to the aforementioned log likelihood Iγ, the log likelihood Iα and Iβ will unevenly be mapped in value as the time passes, while they are being computed and exceed in value a range the system for computing the log likelihood Iα and Iβ can express, in some cases.

To avoid the avoid the above, the soft-output decoding circuit 90 normalizes the log likelihood Iα and Iβ to correct the uneven mapping.

The first method of normalization is such that when the element decoder 50 handles a log likelihood as a negative value as in the normalization of the log likelihood Iγ in Subsection 5.4.3, namely, when the aforementioned constant sgn is "+1", the Iα normalization circuits 250 and 272 in the Iα computation circuit 158 and the Iβ0 normalization circuits 291 and 308 in the Iβ computation circuit 159, etc. are used to add a predetermined value to each of a plurality of log likelihood Iα and Iβ so that one, having the maximum value, of the plurality of log likelihood Iα and Iβ will fit, at each time, to a maximum value which the element decoder 50 can express. Also, the first normalizing method may be such that when the element decoder 50 handles a log likelihood as a positive value, namely, when the aforementioned constant sgn is "−1", the Iα normalization circuits 250 and 272 in the Iα computation circuit 158 and the Iβ0 normalization circuits 291 and 308 in the Iβ computation circuit 159, etc. are used to subtract a predetermined value from each of a plurality of log likelihood Iα and Iβ so that one, having the minimum value, of the plurality of log likelihood Iα and Iβ will fit, at each time, to a minimum value which the element decoder 50 can express.

Figure 90:
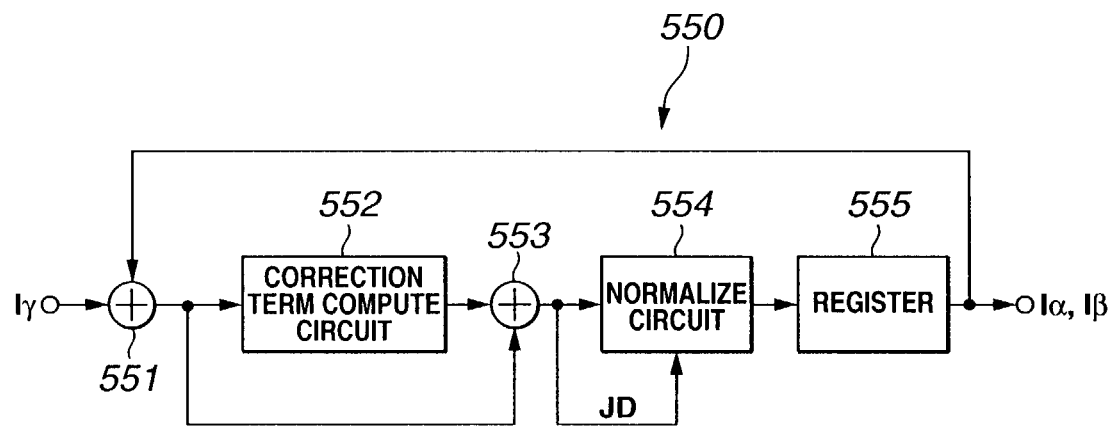
FIG. 90 is a schematic block diagram the log-sum operation circuit included in the Iα computation circuit and Iβ computation circuit, explaining a first mode in which the log-sum operation circuit makes a normalization.

The log-sum operation circuits 245$_n$ and 256$_n$ in the Iα computation circuit 158 which makes a normalization by the first normalizing method, and log-sum operation circuits 286$_n$ and 292$_n$ in the Iβ computation circuit 159 which also makes the normalization method, can be given like a log-sum operation circuit 550 as schematically shown in FIG. 90. That is, the log-sum operation circuit 550 adds, by an adder 551, log likelihood Iγ and those Iα and Iβ computed at a preceding time, and computes, by a correction term computation circuit 552, the value of a correction term from the data thus obtained. Then the log-sum operation circuit 550 adds, by an adder 533, data from the adder 551 and data from the correction term computation circuit 552, and makes, by a normalization circuit 554, the aforementioned normalization based on decision information JD which is based on data from the adder 553. The thus normalized data is delayed one time by a register 555, and supplied as log likelihood Iα and Iβ to the adder 551, while being outputted to outside.

Figure 91:
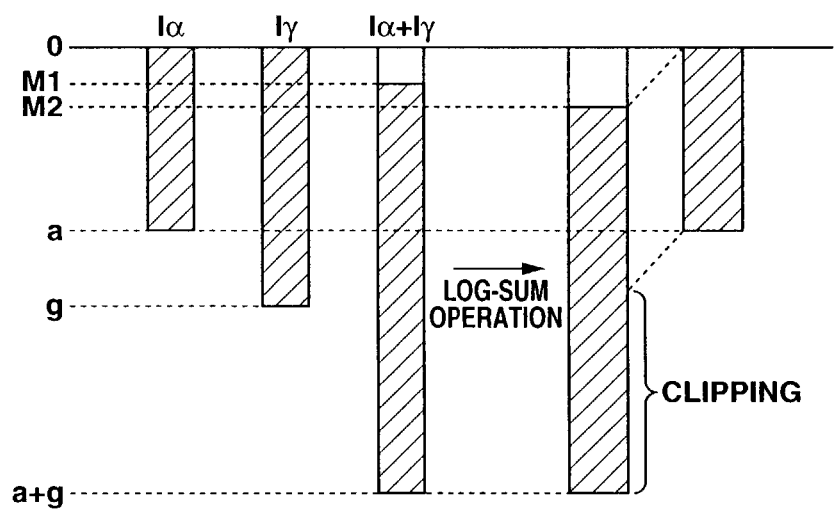
FIG. 91 shows an example of the dynamic range before and after the normalization, explaining how the log-sum operation circuit makes the normalization in the first mode.

To explain the normalization of the log likelihood Iα, it is assumed herein that the dynamic ranges of the log likelihood Iα and Iγ computed one time before are denoted by a and g, respectively. The normalization circuit 554 will make a normalization as shown in FIG. 91. Note that the maximum or minimum value the element decoder 50 can express is "0".

As shown in FIG. 91, the dynamic range of the Iα+Iγ of the log likelihood Iα and Iγ computed by the adder 551 is represented as a+g. The maximum or minimum value of the sum Iα+Iγ of the log likelihood Iα and Iγ is represented as M1. The dynamic range of data having been subjected to the log-sum operation, obtained through the processing by the correction term computation circuit 552 and adder 553 is represented as a+g since it will not be increased by the log-sum operation. The maximum or minimum value of the data is represented as M2.

The normalization circuit 554 normalizes the maximum or minimum value of the data having been subjected to the log-sum operation to "0" and clips a value whose dynamic range is larger than the dynamic range a. At this time, the normalization circuit 554 determines, based on the decision information JD, a value which is to be added to or subtracted from the data having been subjected to the log-sum operation, and normalizes the maximum or minimum value. The normalization circuit 554 makes a similar normalization of the log likelihood Iβ as well.

With the above normalization at each time, the soft-output decoding circuit 90 can express a difference between appropriate log likelihood and thus make a highly accurate decoding without clipping any great-value, important log likelihood. In particular, since when a log likelihood whose value is maximum or minimum is normalized to "0", it will take only a negative or positive value, no positive or negative-directional expression is required and the necessary dynamic range can be minimized. Thus, the soft-output decoding circuit 90 can be designed in a reduced circuit scale.

Also, the soft-output decoding circuit 90 may adopt another normalizing method. That is, the second method of normalization the soft-output decoding circuit 90 may adopt is such that the Iα normalization circuits 250 and 272 in the Iα computation circuit 158, and the Iβ0 normalization circuits 291 and 308 in the Iβ computation circuit 159, etc. are used to compute, with a predetermined value, each of plurality of computed log likelihood Iα and Iβ when ones of the log likelihood Iα and Iβ, whose probability corresponds to a maximum metric, take values exceeding the predetermined value.

More particularly, when the element decoder 50 handles a log likelihood as a negative value, namely, when the aforementioned constant sgn is "+1", the soft-output decoding circuit 90 uses the Iα normalization circuits 250 and 272 in the Iα computation circuit 158, and the Iβ0 normalization circuits 291 and 308 in the Iβ computation circuit 159, etc. to add a predetermined value to each of a plurality of computed log likelihood Iα and Iβ when ones of the log likelihood Iα and Iβ, having a maximum value, take values exceeding the predetermined value, and when the element decoder 50 handles a log likelihood as a positive value, namely, when the aforementioned constant sgn is "−1", the soft-output decoding circuit 90 uses the Iα normalization circuits 250 and 272 in the Iα computation circuit 158, and the Iβ0 normalization circuits 291 and 308 in the Iβ computation circuit 159, etc. to subtract a predetermined value from each of a plurality of computed log likelihood Iα and Iβ when ones of the log likelihood Iα and Iβ, having a minimum value, take values exceeding the predetermined value.

In particular, the soft-output decoding circuit 90 can make the normalization more easily by adopting a half (½) of the dynamic range as the above predetermined value.

Figure 92:
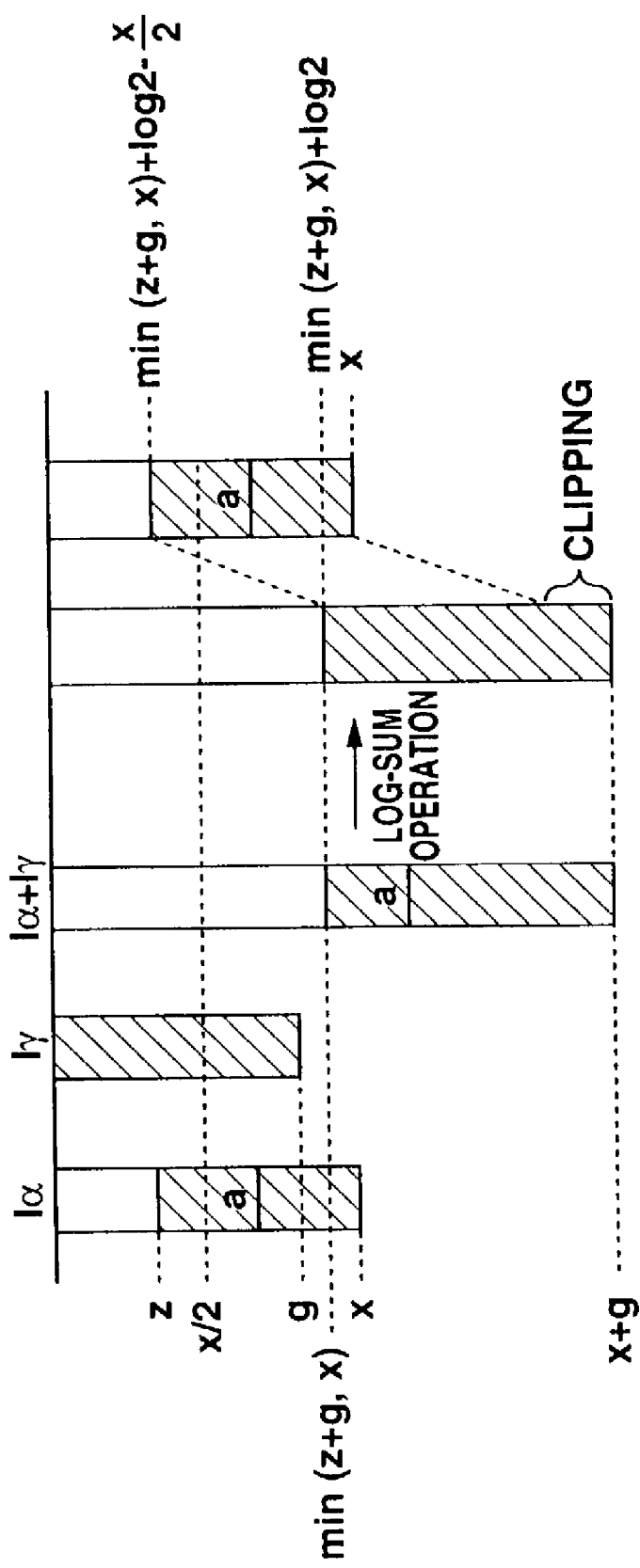
FIG. 92 shows an example of the dynamic range before and after the normalization, explaining a second mode in which the log-sum operation circuit makes a normalization.

The above will further be explained concerning the log-sum operation circuit 550 shown in FIG. 90. On the assumption that the dynamic range of the log likelihood Iγ is g, the dynamic range of a log likelihood Iα computed one time before is a, the dynamic range of the likelihood Iα of x>a is secured and the value of the log likelihood Iα, whose probability has a maximum or minimum value corresponding to the maximum metric, is z<x/2, the normalization circuit 554 can make a normalization as shown in FIG. 92.

At this time, the dynamic range of the sum Iα+Iγ of the likelihood Iα and Iγ computed by the adder 551 is denoted by x+g as above. Also, the maximum or minimum value of the sum Iα+Iγ of the likelihood Iα and Iγ is denoted by min(z+g, x) of z+g or x whichever is smaller. Also, the dynamic range of data obtained through the operations by the correction term computation circuit 552 and adder 553 and then subjected to the log-sum operation is denoted by x+g since the dynamic range will not be increased by the log-sum operation. At this time, the maximum or minimum value of the data is denoted by min(z+g, x)+log 2 because it varies by log 2 (natural logarithm of 2) which is a maximum value of the correction term at most.

When the value of min(z+g, x)+log 2 is judged to exceed x/2 which is a half (½) of the dynamic range x of the log likelihood Iα, the normalization circuit 554 makes a normalization by subtracting x/2 from data having been subjected to the log-sum operation, and clips a value whose dynamic range exceeds x. At this time, the maximum or minimum value is denoted by min(z+g, x)+log 2−x/2. The normalization circuit 554 makes a similar normalization of the log likelihood Iβ as well.

The subtraction of ½ of the dynamic range of the log likelihood Iα from the data having been subjected to the log-sum operation is just to invert MSB of the data having been subjected to the log-sum operation. That is, the normalization circuit 554 can normalize data having been subjected to the log-sum operation and whose MSB is "1" by inverting the MSB of the data "0".

When it is judged that ones of a plurality of computed log likelihood Iα and Iβ, which correspond to a metric whose probability is maximum, have exceeded a predetermined value, the soft-output decoding circuit 90 can also normalize each of the plurality of log likelihood Iα and Iβ by making an operation of them with the predetermined value. In this case, using a half (½) of the dynamic range of the log likelihood Iα and Iβ as the predetermined value, the soft-output decoding circuit 90 can normalize, with a simplified designed configuration of the normalization circuits, the log likelihood Iα and Iβ just by inverting the MSB.

Further, the soft-output decoding circuit 90 may employ a still another method of normalization. That is, the third normalizing method is such that the the Iα normalization circuits 250 and 272 in the Iα computation circuit 158, and the Iβ0 normalization circuits 291 and 308 in the Iβ computation circuit 159, etc. are used to add a predetermined value to, or subtract the predetermined value from, each of plurality of computed log likelihood Iα and Iβ in a next time slot, as in the aforementioned second normalizing method, when ones of the log likelihood Iα and Iβ, whose probability corresponds to a maximum metric, take values exceeding the predetermined value.

Figure 93:
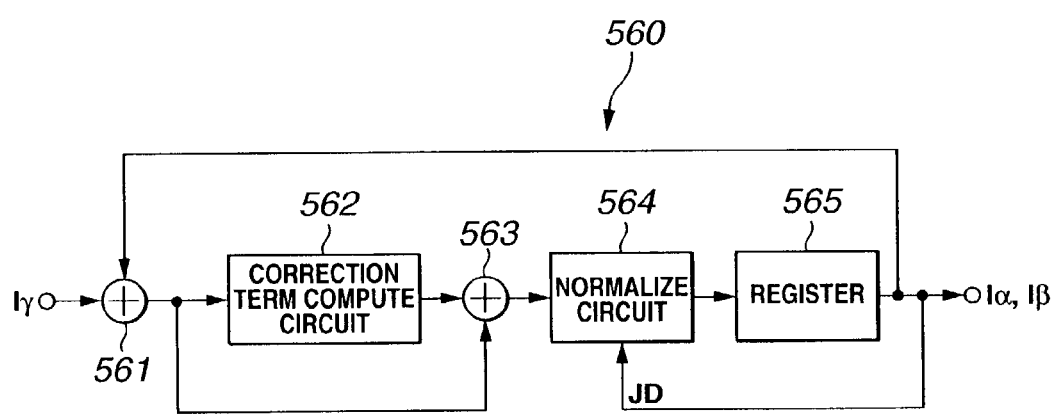
FIG. 93 is a schematic block diagram the log-sum operation circuit included in the Iα computation circuit and Iβ computation circuit, explaining a third mode in which the log-sum operation circuit makes a normalization.

The log-sum operation circuits $245_n$ and $256_n$ in the Iα computation circuit 158 and log-sum operation circuits $286_n$ and $292_n$ in the Iβ computation circuit 159, destined for the third normalizing method, can be given like a log-sum operation circuit 560 as schematically illustrated in FIG. 93. That is to say, the log-sum operation circuit 560 adds the log likelihood Iγ and log likelihood Iα and Iβ computed one time before by an adder 561, computes the value of a correction term from the thus obtained data by a correction term computation circuit 562, and adds the data from the adder 561 and data from the correction term computation circuit 562 by an adder 563. Then the log-sum operation circuit 560 uses a normalization circuit 564 to make the aforementioned normalization based on the decision information JD which is based on data from a register 565. The normalized data is delayed for one time by the register 565, and supplied as log likelihood Iα and Iβ to the adder 561 while being outputted to outside. That is, the log-sum operation circuit 560 uses the normalization circuit 564 to make a normalization in a next time slot when the data read from the register 565 exceeds a predetermined value.

Figure 94:
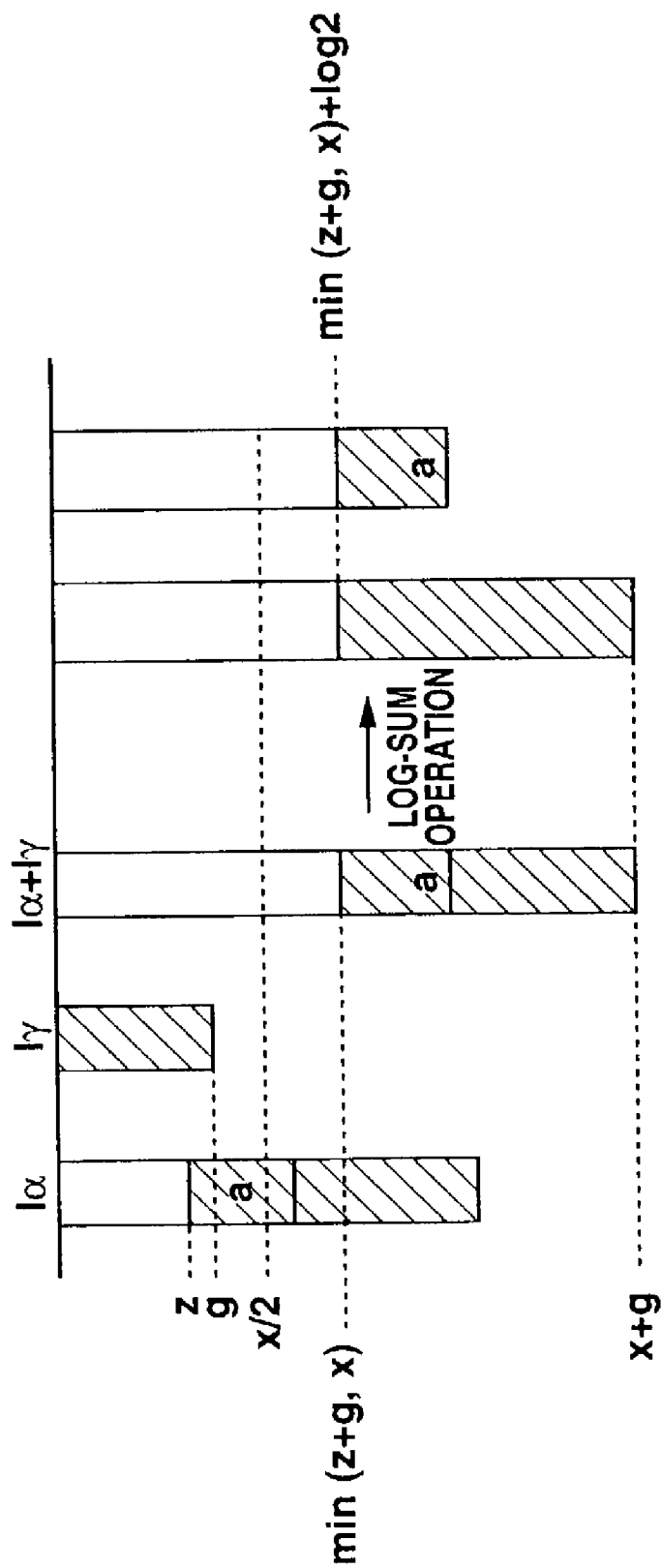
FIG. 94 shows an example of the dynamic range before and after the normalization, explaining how the log-sum operation circuit makes normalization in the third mode.

On the assumption that the dynamic range of the log likelihood Iγ is g, the dynamic range of a log likelihood Iα computed one time before is a, the dynamic range of the likelihood Iα of x>a is secured and the value of the log likelihood Iα, whose probability has a maximum or minimum value corresponding to the maximum metric, is z<x/2, the normalization circuit 564 can make a normalization as shown in FIG. 94.

At this time, the dynamic range of the sum Iα+Iγ of the likelihood Iα and Iγ computed by the adder 561 is denoted by x+g as above. Also, the maximum or minimum value of the sum Iα+Iγ of the likelihood Iα and Iγ is also denoted by min(z+g, x) as above. Also, the dynamic range of data obtained through the operations by the correction term computation circuit 562 and adder 563 and then subjected to the log-sum operation is denoted by x+g since the dynamic range will not be increased by the log-sum operation. At this time, the maximum or minimum value of the data is denoted by min(z+g, x)+log 2 because it varies by log 2 which is a maximum value of the correction term at most.

When the value of min(z+g, x)+log 2 is judged to have exceeded a predetermined value, or x/2 which is ½ of the dynamic range x of the log likelihood Iα for example, the normalization circuit 564 makes a normalization by subtracting x/2 from the data having been subjected to the log-sum operation in a next time slot. At this time, the maximum or minimum value of the data is denoted by min (z+g, x)+log 2. The normalization circuit 564 makes a similar normalization of the log likelihood Iβ as well.

With the above normalization, the soft-output decoding circuit 90 has not to judge, just after completion of the log-sum operation, whether normalization should be done. Thus, the normalization can be done at a higher speed.

5.5.8 Computing Correction Term in Log-Sum Correction

Figure 95:
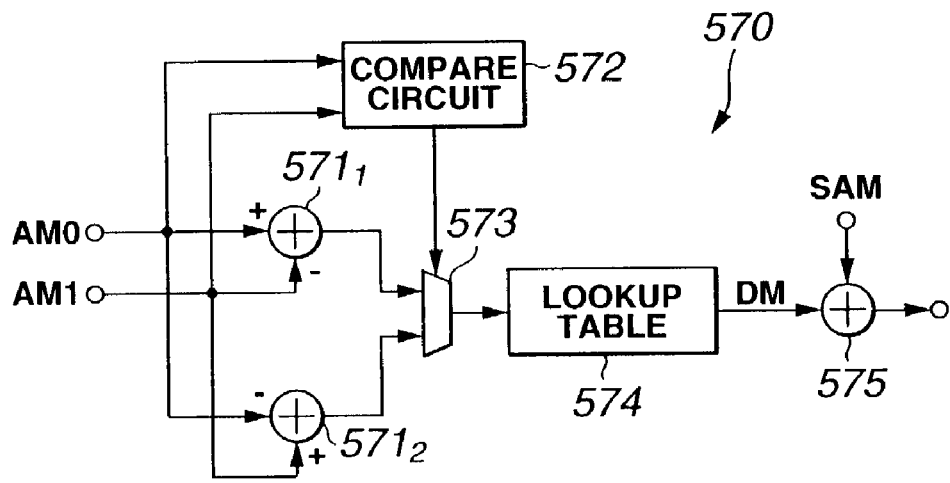
FIG. 95 is a block diagram of the log-sum operation circuit, explaining bow the log-sum operation circuit makes a normal log-sum operation.

Normally, to compute a correction term in the log-sum operation, the absolution value of a difference between two input data is computed by comparing, in size, such differences, and the value of a correction value corresponding to the absolute value is computed. These operations are made by a log-sum operation circuit 570 schematically illustrated in FIG. 95. As shown, the log-sum operation circuit 570 computes a difference between input data AM0 and AM1 by a differentiator $571_1$, and computes a difference between the data AM1 and AM0 by a differentiator $571_2$, while comparing, in size, these data AM0 and AM1 by a comparison circuit 572, selects any one of the two data from the differentiators $571_1$ and $571_2$ by a selector 573, and reads the value of a correction term corresponding to the selected data from a lookup table 574. Then, the log-sum operation circuit 570 causes the adder 575 to add together data DM indicating the value of the correction term and data SAM which is any one of the data AM0 and AM1.

In the log-sum operation circuit 570, since the comparison in size between the data AM0 and AM1 by the comparison circuit 572 normally takes a longer time than for the operations by other elements, a longer time is required for determination of the data DM than for the data SAM, which will possibly cause a large delay in some cases.

To avoid the above, the soft-output decoding circuit 90 does not determine the value of a correction term after computing the absolute value of the differences between two input data as shown in FIG. 39, but computes the values of a plurality of correction terms corresponding to two differences and then selects an appropriate one of the values,. Namely, the soft-output decoding circuit 90 makes a comparison in size between the differences between two input data while computing the value of a correction term.

Figure 96:
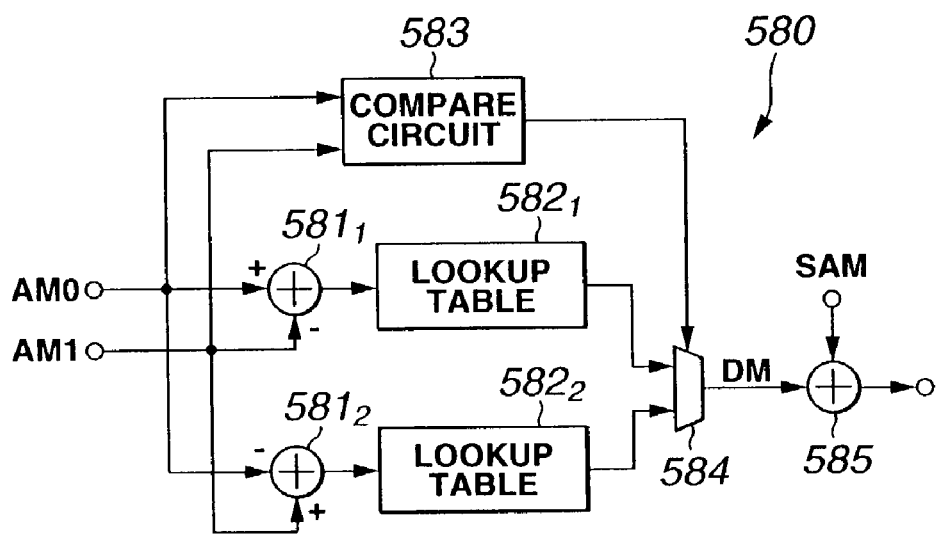
FIG. 96 is a block diagram of the log-sum operation circuit, explaining how the log-sum operation circuit computes a plurality of correction terms corresponding to difference values and makes a log-sum operation to select an appropriate one of the correction terms.

FIG. 96 shows a log-sum operation circuit 580 which makes the above log-sum operation. As shown, the log-sum operation circuit 580 computes a difference between input data AM0 and AM1 by a differentiator $581_1$, computes a difference between the data AM1 and AM0 by a differentiator $581_2$, reads the data of a correction term corresponding to data from the differentiator $581_1$ from a lookup table $582_1$, and reads the value of a correction term corresponding to data from the differentiator $581_2$ from a lookup table $582_2$. At the same time, the log-sum operation circuit 580 makes a comparison in size between the data AM0 and AM1 by a comparison circuit 583 corresponding to the selection control signal generation circuit 253 in the aforementioned Iα computation circuit 158, selects, by a selector 584, any one of two data from the lookup tables $582_1$ and $582_2$, respectively, based on the result of comparison, and adds, by an adder 585, the thus selected data DM and data SAM which is any one of the data AM0 and AM1.

The soft-output decoding circuit 90 can determine log likelihood Iα and Iβ by computing the values of a plurality of correction terms corresponding to the two differences and selecting an appropriate one of the values as above.

5.5.9 Generating Selection Control Signal in Log-Sum Operation

To compute a correction term in the log-sum operation, it is necessary to generate a selection control signal by preparing a decision statement used for comparison in size between two data as in the selection control signal generation circuit 253 in the aforementioned Iα computation circuit 158. More specifically, the decision statement for a control signal SEL generated by the selection control signal generation circuit 253 shows the relation in size between the data AM0 and AM1 as given by the following expression (56):

$$SEL = (AM1 \leq AM0) \quad (56)$$

Also, since the correction term in the log-sum operation is asymptotic to a predetermined value as having previously been described, the absolute value of a difference between two data, which is a variable, should be clipped to the predetermined value. More specifically, the decision statement for the control signal SL generated by the selection control signal generation circuit 253 shows the relation in size between the absolute value of the difference between the data AM0 and AM1, and the predetermined value, as given by the following expression (57):

$$SL = |AM1 - AM0| < 64 \quad (57)$$

It should be reminded here that when each of the data AM0 and AM1 is of 12 bits in size, the selection control signal generation circuit 253 will have to include a comparison circuit of at least 12 bits, which will lead to an increase in circuit scale and delay of the operations.

To avoid the above, the selection control signal generation circuit 253 divides, based on at least the data AM0 and AM1, a data into upper and lower bits of a metric to prepare a selection decision statement, to thereby generate control signals SEL and SL. That is, the selection control signal generation circuit 253 divides each of the data AM0 and AM1 into upper and lower bits to prepare a decision statement for comparison in size between the data AM0 and AM1.

First, a control signal SEL consisting of the decision statement as given by the expression (56) is generated.

When each of the data AM0 and AM1 are of 12 bits for example, the correction term computation circuit 247 computes a difference between MSB of lower 6 bits of the data AM0, to which "1" is added, and MSB of lower 6 bits of the data AM1, to which "0" is added, while computing a difference between MSB of lower 6 bits of the data AM0, to which "0" is added, and MSB of lower 6 bits of the data AM1, to which "1" is added. The selection control signal generation circuit 253 uses these differences DA1 and DA0 in addition to the data AM0 and AM1 to prepare a decision statement as given by the following expression (58) and generate and a control signal SEL.

$$SEL = (AM0[11:6] > AM1[11:6]) | \quad (58)$$
$$((AM0[11:6] == AM1[11:6]) \& DA1[6] == 1)$$

First, the correction term computation circuit 247 makes, by the selection control signal generation circuit 253, a comparison in size between the upper 6 bits AM0[11:6] and AM1[11:6] of the data AM0 and AM1, respectively, to judge the relation in size between the data AM0 and AM1. That is, the relation in size between the upper 6 bits AM0[11:6] and AM1[11:6] of the data AM0 and AM1, respectively, indicates directly the relation in size between the data AM0 and AM1. Thus, the selection control signal generation circuit 253 prepares a decision statement (AM0[11:6]>AM1[11:6]).

Also, by computing the difference DA1, the correction term computation circuit 247 can determine the relation in size between the lower 6 bits of the data AM0 and AM1, respectively. That is, when the MSB of the difference DA1 is "1", it means that that the lower 6 bits of the data AM0 are larger than those of the data AM1. Namely, when AM1≦AM0 under these conditions, the upper 6 bits of the data AM0 are larger than those of the data AM1 or equal to those of the data AM1. Thus, the selection control signal generation circuit 253 prepares a decision statement ((AM0[11:6]==AM1[11:6]) & DA1[6]==1).

Therefore, by preparing the decision statement as given by the above expression (58), the selection control signal generation circuit 253 can implement the decision statement as given by the aforementioned expression (56). Namely, the selection control signal generation circuit 253 can implement the decision statement only with a 6-bit comparison circuit and equal (=) decision circuit, which leads to a reduction of the circuit scale and a higher operation speed.

Next, the generation of the control signal SL consisting of the decision statement as given by the above expression (57) will be described.

When each of the data AM0 and AM1 are of 12 bits for example, the correction term computation circuit 247 computes a difference between MSB of lower 6 bits of the data AM0, to which "1" is added, and MSB of lower 6 bits of the data AM1, to which "0" is added, while computing a difference between MSB of lower 6 bits of the data AM0, to which "0" is added, and MSB of lower 6 bits of the data AM1, to which "1" is added, as described above. The selection control signal generation circuit 253 uses these differences DA1 and DA0 in addition to the data AM0 and AM1 to prepare a decision statement as given by the following expression (59) and generate and a control signal SL.

$$SL = (AM0[11:6] == AM1[11:6]) | \quad (59)$$
$$(( \{1'b0, AM0[11:6]\} == \{1'b0, AM1[11:6]\}) + 7'd1 \&$$
$$DA1[6] == 0) |$$
$$(( \{1'b0, AM1[11:6]\} == \{1'b0, AM0[11:6]\} \&$$
$$DA0[6] == 0)$$

First, the correction term computation circuit 247 judges, by the selection control signal generation circuit 253, whether the upper 6 bits AM0[11:6] of the data AM0 equal the upper 6 bits AM1[11:6] of the data AM1. That is, when the upper 6 bits AM0[11:6] of the data AM0 equal to those AM1[11:6] of the data AM1, the absolute value of the difference between the data AM0 and AM1 is less than a predetermined value or less than 64 herein. Thus, the selection control signal generation circuit 253 prepares a decision statement (AM0[11:61==AM1[11:6]).

Also, when the upper 6 bits AM0[11:6] of the data AM0 are larger by "1" than the upper 6 bits AM1[11:6] of the data AM1 and the lower 6 bits AM0[5:0] of the data AM0 are smaller than the lower 6 bits AM1[5:0] of the data AM1, the absolute value of the difference between the data AM0 and AM1 is less than a predetermined value or less than 64 herein. When the lower 6 bits AM0[5:0] of the data AM0 are smaller than the lower 6 bits AM1[5:1] of the data AM1, it means that the MSB DA1[6] of the difference DA1 is "0" with the above factor taken in consideration. Thus, the selection control signal generation circuit 253 prepares a decision statement ((({1'b0, AM0[11:6]}=={1'b0, AM1[11:6]}+7'd1) &DA1[6]==0).

Similarly, when the upper 6 bits AM1[11:6] of the data AM1 are larger by "1" than the upper 6 bits AM0[11:6] of the data AM0 and the lower 6 bits AM1[5:0] of the data AM1 are smaller than the lower 6 bits AM0[5:0] of the data AM0, the absolute value of the difference between the data AM0 and AM1 is less than a predetermined value or less than 64 herein. Thus, the selection control signal generation circuit 253 prepares a decision statement ((({1'b0, AM1[11:6]} =={1',b0, AM0[11:6]+7'd1} &DA0[6]==0).

Therefore, by preparing the decision statement as given by the above expression (59), the selection control signal generation circuit 253 can implement the decision statement as given by the aforementioned expression (57). Namely, the selection control signal generation circuit 253 can implement the decision statement only with an equal (=) decision circuit, which leads to a reduced circuit scale and a higher operation speed.

As above, it is possible in the soft-output decoding circuit 90 to reduce the circuit scale of the selection control signal generation circuit which generates a selection control signal for use to make a comparison in size between two data and clip the absolute value of a difference, which is a variable, between the two data in order to compute a correction term in the log-sum operation. Thus, the soft-output decoding circuit 90 can operate at a higher speed.

Note that the selection control signal generation circuit 253 has been described by way of example in the foregoing but the above description is also applicable the selection control signal generation circuit 232 in the Iγ distribution circuit 157 and selection control signal generation circuit 330 in the soft-output computation circuit 161 to generate such a control signal.

5.6 Computing Log Soft-Output Iλ

This is a feature of the aforementioned soft-output computation circuit 161. The element decoder 50 has the following two features for computation of the log soft-output Iλ.

5.6.1 Cumulative Add Operation in Log-Sum Operation with Enable Signal

To compute the log soft-output Iλ, it is necessary to make a cumulative add operation in the log-sum operation correspondingly to an input at each branch of the trellis for computation of a difference between a result of the cumulative add operation in the log-sum operation, corresponding to a branch at which the input is "0", and a result of the cumulative add operation in the log-sum operation, corresponding to a branch at which the input is "1".

In the soft-output decoding circuit 90, to enable the decoding of an arbitrary code, a log soft-output Iλ is computed by computing the sum of log likelihood Iα, Iγ and Iβ corresponding to branches of the trellis, generating an enable signal indicating each branch input and making an operation compared to a so-called tournament based on the enable signal.

It is assumed herein that the log-sum operation circuit $312_1$ in the aforementioned soft-output operation circuit 161 makes a cumulative add operation in the log-sum operation, corresponding to a branch at which the input is "0". Each of the log-sum operation cell circuits $325_1, \ldots, 325_{31}$ in the log-sum operation circuit $312_1$ is supplied with two of 32-sequences input data AGB and 2-sequences enable signal EN corresponding to the 2-sequences data AGB.

For example, when both 2-sequences enable signals EN000 and EN001 supplied to the log-sum operation cell circuit $325_1$ indicate that the input is "0", the log-sum operation cell circuit $325_1$ makes a log-sum operation with 2-sequences data AGB000 and AGB001, and outputs the result of operation as data AGB100. Also, when only the enable signal EN000 of 2-sequences enable signals EN000 and EN001 supplied to the log-sum operation cell circuit $325_1$ indicate that the input is "0", the log-sum operation cell circuit $325_1$ adds a predetermined offset value N2 to the data AGB000 of the 2-sequences data AGB000 and AGB001, and output the result as the data AGB100. Similarly, when only the enable signal EN001 of the 2-sequences enable signals EN000 and EN001 supplied to the log-sum operation cell circuit $325_1$ indicates that the input is "0", the log-sum operation cell circuit $325_1$ adds a predetermined offset value N2 to the data AGB001, and outputs the result as the data AGB100. Further, when both the 2-sequences enable signals EN000 and EN001 supplied to the log-sum operation cell circuit $325_1$ indicate that the input is "1", the log-sum operation cell circuit $325_1$ outputs a data having a predetermined value as the data AGB100 without outputting a result of log-sum operation with the 2-sequences data AGB000 and AGB001 or data AGB000 and AGB001 themselves. Also, the log-sum operation cell circuits $325_2, \ldots, 325_{31}$ also makes similar operations to those by the circuit $325_1$ to selectively output data AGB.

With the above operations, the log-sum operation circuit $312_1$ can make a cumulative add operation of the log-sum operation with only the data AGB corresponding to a branch at which the input is "0".

Similarly, each of the log-sum operation circuits $312_1, \ldots, 312_6$ makes a cumulative add operation in the log-sum operation with only the data AGB corresponding to a branch at which the input is "0" or "1".

With the above operations, the soft-output decoding circuit 90 can compute a log soft-output Iλ for an arbitrary trellis code having a smaller number of branches than predetermined.

Note that the decoding of a trellis-structure code having less than 32 branches has been described but the present invention is not of course limited to any soft-output decoding circuit 90 for this number of branches.

5.6.2 Cumulative Add Operation in Log-Sum Operation without Enable Signal

It should be reminded herein that with the technique having been described in Subsection 5.6.1, each of the log-sum operation circuits $312_1, \ldots, 312_6$ selects 16-sequences data AGB, whose input is "0" or "1", of the 32-sequences data AGB and make a cumulative add operation in the log-sum operation with these 16-sequences data AGB. Thus, in each of the log-sum operation circuits $312_1, \ldots, 312_6$, only about a half of the thirty one log-sum operation cell circuits operates, which leads to a reduced efficiency of operation.

For this reason, the soft-output decoding circuit 90 can also adopt any technique other than described in Subsection 5.6.1 and uses the following technique to compute a log soft-output Iλ.

Figure 97:
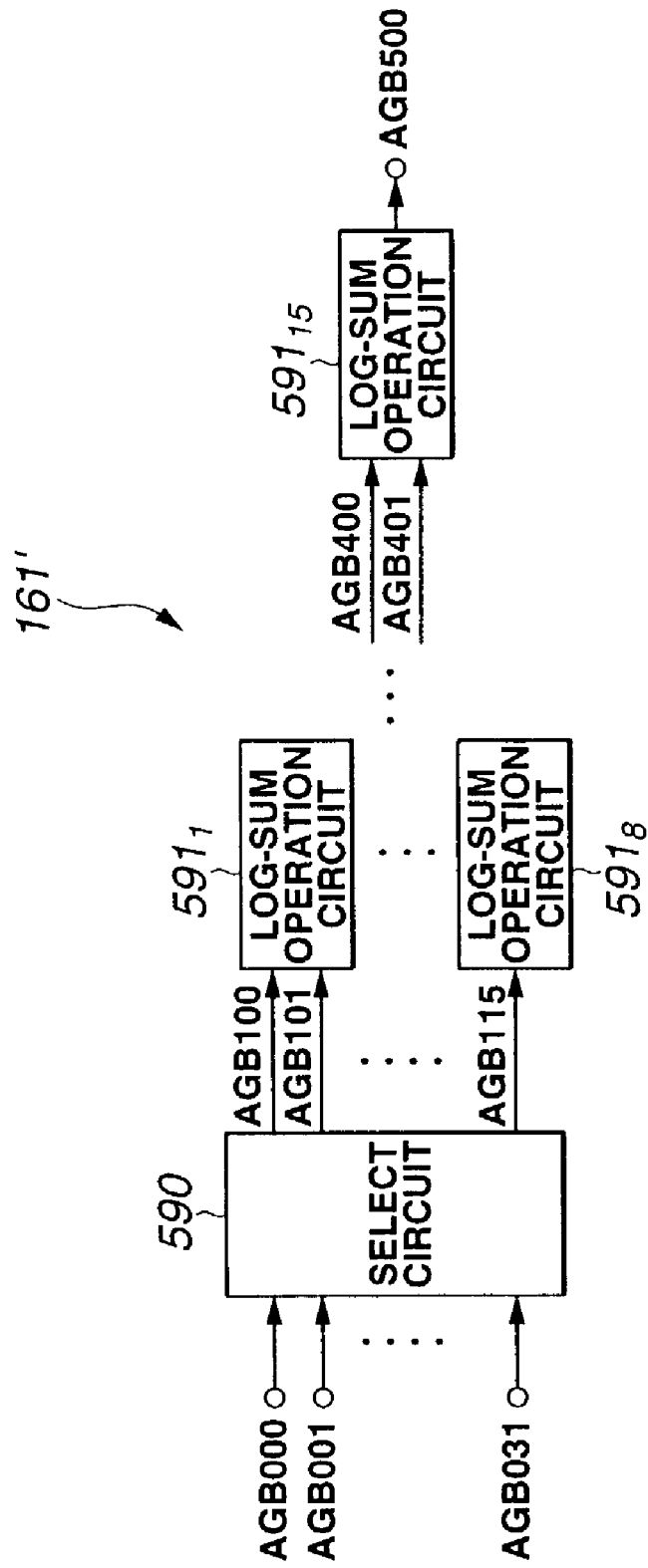
FIG. 97 is a block diagram of a soft-output computation circuit which make cumulative add operation in the log-sum operation with no enable signal.

That is, FIG. 97 schematically illustrates a soft-output decoding circuit 161'. This soft-output decoding circuit 161' pre-selects, by a selection circuit 590, branches corresponding to input/output patterns of trellis branches from the 32-sequences data AGB, and makes, by eight log-sum operation circuits $591_1, \ldots, 591_8$, log-sum operations with selected 16-sequences data AGB. Also, the soft-output decoding circuit 161' makes, by each of four log-sum operation circuits (not shown), log-sum operations with 8-sequences data AGB outputted from eight log-sum operation circuits $591_1, \ldots, 591_8$, and further makes, by each of two log-sum operation circuits, log-sum operations with 4-sequences data AGB outputted from four log-sum operation circuits. Then, the soft-output decoding circuit 161' makes, by a log-sum operation circuit $591_{15}$, log-sum operations with 2-sequences data AGB outputted from two log-sum operation circuits, respectively.

The soft-output decoding circuit 161' makes the above operations with each of inputs which are "0" and "1", respectively.

Thus, the soft-output decoding circuit 161' pre-selects, by a selection circuit 590, branches corresponding to input/output patterns of trellis branches from the 32-sequences data AGB, and makes, by fifteen log-sum operation circuits $591_1, \ldots, 591_{15}$, operations compared to the so-called tournament to make a cumulative add operation in the log-sum operation.

With the above operations, the soft-output decoding circuit 90 can compute a log soft-output Iλ for an arbitrary trellis code having a smaller number of branches than predetermined.

Note that the decoding of a trellis-structure code having less than 32 branches has been described but the present invention is not of course limited to any soft-output decoding circuit 90 for this number of branches.

5.7 Normalizing Extrinsic Information

This is a feature of the aforementioned extrinsic information computation circuit 163.

The soft-output decoding circuit 90 can compute, by the extrinsic information computation circuit 163, extrinsic information in symbols and one in bits, as having previously been described. When two bits are taken as one symbol for example for computation of extrinsic information in symbols, four pieces of extrinsic information will be computed.

For this reason, the soft-output decoding circuit-90 corrects the uneven mapping of extrinsic information in symbols and normalizes the data to reduce the amount of information, to thereby output a number "number of symbols—1" of extrinsic information without outputting extrinsic information for all symbols as a priori probability information.

Figure 98A:
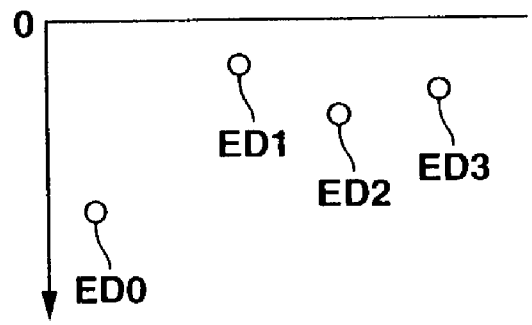
Figure 98B:
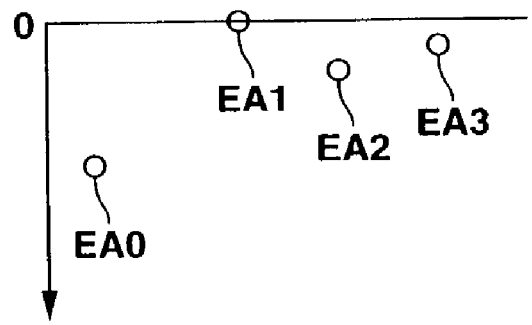

More particularly, when extrinsic information ED0, ED1, ED2 and ED3 have been computed correspondingly to four symbols "00", "01", "10" and "11" for example, respectively, as shown in FIG. 98A, the soft-output decoding circuit 90 adds, by the normalization circuit 357 in the extrinsic information computation circuit 163, a predetermined value to each of four pieces of extrinsic information ED0, ED1, ED2 and ED3 so that ED1, having a maximum value, of the four pieces of extrinsic information ED0, ED1, ED2 and ED3 will fit to a predetermined value "0", for example, to determine extrinsic information EA0, EA1, EA2 and EA3, as shown in FIG. 98B. The soft-output decoding circuit 90 can correct the uneven mapping of the extrinsic information by making such as normalization.

Figure 98C:
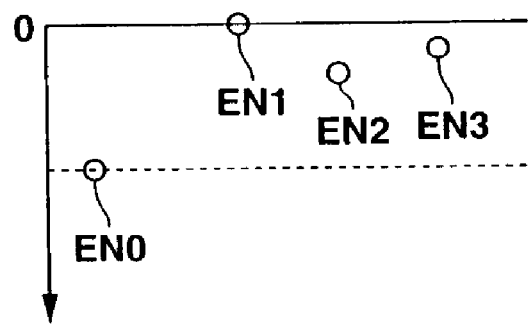

Next, as shown in FIG. 98C, the soft-output decoding circuit 90 clips, by the normalization circuit 357, the four normalized extrinsic information EA0, EA1, EA2 and EA3 according to a necessary dynamic range to determine extrinsic information EN0, EN1, EN2 and EN3. The soft-output decoding circuit 90 can hold a difference in value between large-value, important extrinsic information by making such a clipping.

Figure 98D:
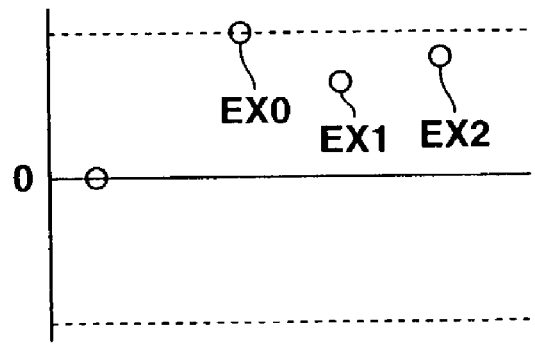

Then, the soft-output decoding circuit 90 subtracts, by the normalization circuit 357, EN0, corresponding to the symbol "00", of the four clipped pieces of extrinsic information EN0, EN1, EN2 and EN3, for example, from the extrinsic information EN1, EN2 and EN3 corresponding to all the other symbols "01", "10" and "11", respectively, as shown in FIG. 98D. By making such as normalization, the soft-output decoding circuit 90 can output a ratio among the three pieces of extrinsic information as extrinsic information EX0, EX1 and EX2 without outputting the four pieces of extrinsic information.

With these operations, the soft-output decoding circuit 90 can reduce the number of external input/output pins without having to output extrinsic information for one symbol. Also, by clipping the information as shown in FIG. 98C before making the normalization as shown in FIG. 98D, the soft-output decoding circuit 90 can hold a difference among extrinsic information for symbols whose likelihood is high and thus can provide a high-accuracy decoding.

Note that the normalization by computation of extrinsic information for four symbols has been described above but the soft-output decoding circuit 90 can normalize extrinsic information for any number of symbols other than the above "4".

5.8 Hard Decision of Received Value

This is a feature of the aforementioned hard decision circuit 165.

Normally for hard decision of a received value, a tangent of the received value in an I/Q plane is determined. With this technique, however, when each of the common-phase and orthogonal components is of 8 bits, it is necessary to make a division between data each of 8 bits, which will cause the circuit scale to increase and processing operations delayed.

As an alternative to this technique, on the assumption that each of the common-phase and orthogonal components is of 8 bits for example, these components are classified into 65536 cases (=16 bits in total) and hard decision values in these cases are tabulated into a table. However, this technique is not practical since the above operations take a vast time.

As another alternative solution to the above technique, a division is made between received values for comparison of angles of received values in the I/Q plane with the boundary of the hard decision area to compare a result of the division with a tangent at the angle to the boundary. Also, with this technique, however, since it is necessary to make a division between data each of 8 bits and the area boundary is generally given as an irrational number. Namely, this solution has to be further considered as to its accuracy.

Thus, the soft-output decoding circuit 90 is designed to determine a boundary value corresponding to any one of the common-phase and orthogonal components of a received value by tabulating, and determine a hard decision value correspondingly to the value of any other component.

Figure 99:
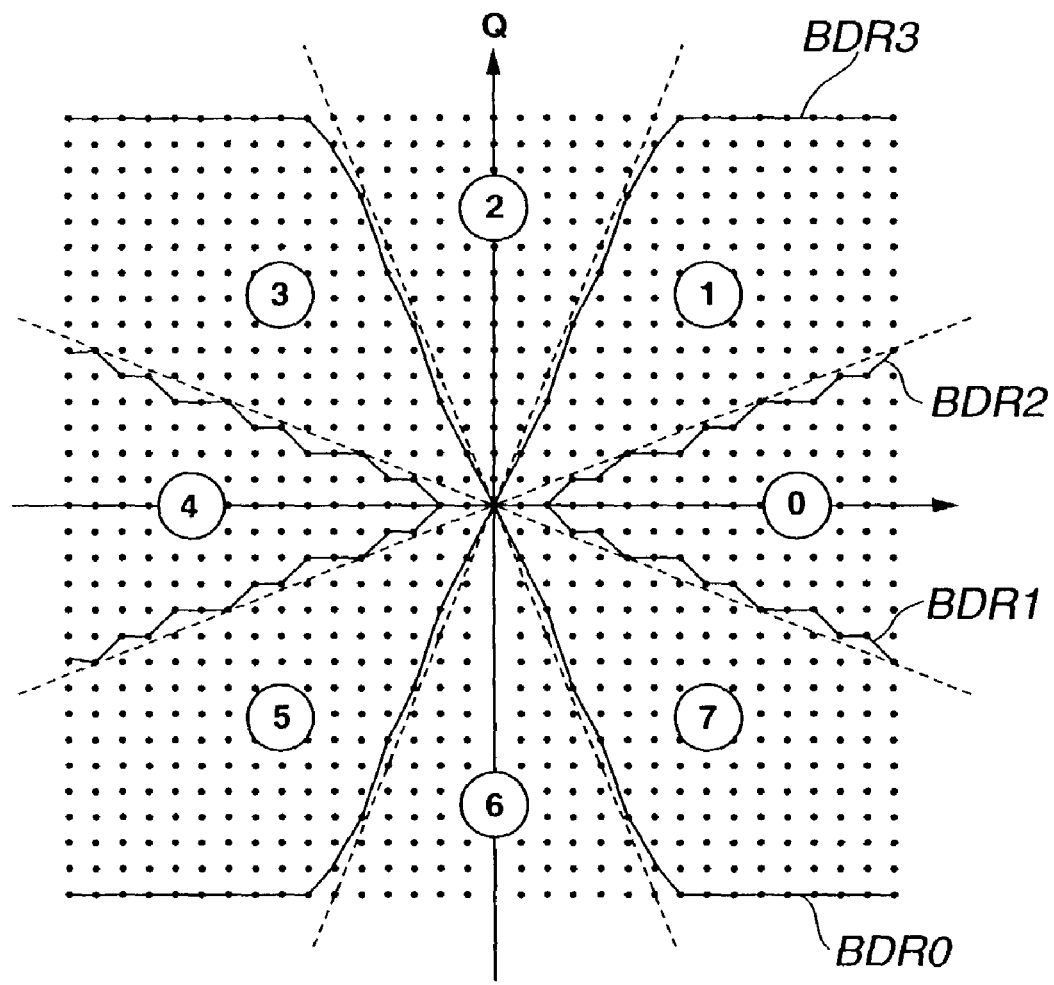
FIG. 99 explains the signal point mapping by the 8PSK modulation, showing boundary lines defined in an I/Q plane.

More specifically, when the encoder 1 is to make an 8PSK modulation, the soft-output decoding circuit 90 defines four boarder lines (boundary value data) BDR0, BDR1, BDR2 and BDR3 along an I or Q axis to divide the I/Q plane into eight areas corresponding to eight signal points, as shown in FIG. 99, and stores these four boarder lines BDR0, BDR1, BDR2 and BDR3 as a table into the lookup table 372 in the aforementioned hard decision circuit 165. Note that in FIG. 99, it is assumed that the common-phase and orthogonal components are represented each by 5 bits and each dot represents each bit. Also, the values of the signal points mapped in areas 0, 1, 2, 3, 4, 5, 6 and 7, respectively, are denoted by the aforementioned signal point mapping information CSIG0, CSIG2, CSIG3, CSIG4, CDIG5, CSIG6 and CSIG7, respectively.

As above, the soft-output decoding circuit 90 compares, by the hard decision circuit 165, the four boundary value data BDR0, BDR1, BDR2 and BDR3 along either the I or Q axis with values of other components, and judges which areas the signal points of the received values belong, to thereby determine a hard decision value.

With the above operations, since the table stored in the lookup table 372 may have a smaller capacity and no high accuracy is required, the soft-output decoding circuit 90 can be designed in a reduced circuit scale and can operate at a higher speed.

Note that the demapping of the signal points by the 8PSK modulation has been described above but this technique can be applied to a demapping of signal points by any PSK modulation.

6. Functions of Interleaver

Next, each of the features of the interleaver 100 will be described. The following features are included as functions in the interleaver 100. To make clear the concept of each feature, it will be described with reference to an appropriately simplified drawing.

6.1 Plural Kinds of Interleaving Functions

These features concern the control of data write to, and read from, the aforementioned storage circuits $407_1$, $407_2$, ..., $407_{16}$.

As having previously been described, the interleaver 100 selects an appropriate one the storage circuits $407_1$, $407_2$, ..., $407_{16}$, which is appropriate for data write or read according to a mode of operation indicating the configuration of a code to be decoded, including the types of interleaving to be made, selects a to-be-used one of the storage circuits and implements plural kinds of interleaving.

More specifically, when write and read addresses are generated by the control circuit 400, the interleaver 100 selects, by the address selection circuit 405, one, to be distributed to the storage circuits $407_1$, $407_2$, ..., $407_{16}$, of address data AA0, BA0, AA1, BA1, AA2 and BA2 based on the interleaver type information CINT and interleaver no-output position information CNO. Also, the interleaver 100 selects, by the input data selection circuit 406, one, to be distributed to the storage circuits $407_1$, $407_2$, ..., $407_{16}$, of interleaved data I0, I1 and I2 and delaying-use data D0, D1, D2, D3, D4 and D5 based on the interleaving mode signal CDIN, interleaver type information CINT and interleaver input/output replacement information CIPT.

Possible examples of the plural kinds of interleaving are illustrated in detail in FIGS. 59 to 65. That is, the interleaver 100 generates, by the control circuit 400, an address independently of the type of an interleaving to be done, then distributes, by the address selection circuit 405 and input data selection circuit 406, the address and data to the storage circuits selects, by the address selection circuit 405, address data, to be distributed to the storage circuits $407_1$, $407_2$, ..., $407_{16}$ according to a mode of operation indicating the configuration of a code to be decoded, including the types of interleaving to be made, and stores the data into the storage circuits $407_1$, $407_2$, ..., $407_{16}$.

Then, the interleaver 100 supplies data read from the storage circuits $407_1$, $407_2$, ..., $407_{16}$ to the output data selection circuit 408, and selects, by the output data selection circuit 408, one, to be outputted, of data OR00, OR01, ..., OR15 based on the interleaving mode signal CDIN, interleaver type information CINT, interleaver input/output replacement information CIPT, and control signals IOBS, IOBP0, IOBP1, IOBP2, DOBS and DOBP, and outputs the selected data as interleaver output data 110 and interleaving length delayed received value IDO.

The interleaver 100 is versatile to implement plural kinds of interleaving by selecting a storage circuit to be used according to a mode of operation indicating the configuration of a code to be decoded, including the types of interleaving to be made, as above and distributing the address and data. Thus, the element decoder 50 can make kinds of decoding adaptively corresponding to various kinds of codes.

6.2 Using Interleaving-Use and Delaying-Use Data Storage Circuits in Common

This is feature of the function having been described in Subsection 6.1. It concerns the control of data write to and/or read from the storage circuits $407_1$, $407_2$, ..., $407_{16}$.

In the repetitive decoding, a received value has to be delayed the same time as taken by the interleaves for its operation, namely, a time equivalent to an interleaving length. When plural kinds of codes are to be decoded, the number of symbols to be delayed varies and also the number of storage circuits (RAM) required for the interleaving operation varies, depending upon the configuration of a code to be decoded.

Thus, the interleaver 100 uses the interleaving-use data storage circuits and delaying-use data storage circuits in common as having previously been described. Namely, the interleaver 100 selects a storage circuit to be used from the plurality of storage circuits $407_1$, $407_2$, ..., $407_{16}$ according to the configuration of code. More particularly, the interleaver 100 uses an unused interleaving-use data storage circuit for delaying operation, while using an unused delaying-use data storage circuit for interleaving operation.

Possible examples of this common use of the storage circuits are shown in FIGS. 59 to 65. That is, with both the interleaving and delaying corresponding to the configuration of a code to be decoded, the interleaver 100 distributes address data and data to the storage circuits $407_1$, $407_2$, ..., $407_{16}$ by the address selection circuit 405 and input data selection circuit 406, and outputs a desired data by the output data selection circuit 408.

Owing to the above operations, the interleaver 100 has not to include any interleaving-use data storage circuit and delaying-use data storage circuit but has only to include a minimum number of storage circuits, which will much contribute to a reduction of the circuit scale.

6.3 Controlling Operation of Storage Circuit with Clock Inhibit Signal

As above, the interleaver 100 is provided with the plurality of storage circuits $407_1$, $407_2$, ..., $407_{16}$ including at least RAMs, and interleaves and delays the data by these storage circuits $407_1$, $407_2$, ..., $407_{16}$. Normally in this case, each time a clock signal is supplied the storage circuits $407_1$, $407_2$, ..., $407_{16}$, data is written to and/or read from them.

Actually, however, the above interleaver 100 includes unused storage circuits in some cases. More specifically, in the interleaver having been described with reference to FIG. 60, the RAMs D06 and D08 in the storage circuits $407_6$ and $407_8$ exist as such unused RAMs, respectively, and also in the interleaver having been described with reference to FIG. 64, the RAMs D06, D08, D10 and D12 in the storage circuits $407_6$, $407_8$, $407_{10}$ and $407_{12}$ exist as such unused RAMs.

So, the interleaver 100 generates, by the address selection circuit 405, a clock inhibit signal IH for inhibiting any input clock signal and supplies the clock inhibit signal to the unused storage circuits to cause the unused storage circuits to stop their data write and/or read operations including data write to and/or read from them.

More specifically, the interleaver 100 classifies the plurality of storage circuits $407_1$, $407_2$, ..., $407_{16}$ in the direction of addresses to select a storage circuit to be used. Then, the interleaver 100 generates, by the address selection circuit 405, a clock inhibit signal IH for storage circuits not having any address to which data is to be written and/or from which data is to be read, and supplies the clock inhibit signal IH to such storage circuits.

Provided with a mechanism to classify the storage circuits in the direction of addresses to select a storage circuit to be used and activate the clock inhibit signal IH as above, the interleaver 100 can cause the unused storage circuits to stop their operation. Therefore, the element decoder 50 has not to operate all the storage circuits $407_1$, $407_2$, ..., $407_{16}$ in response to every clock signal, which contributes to a reduction of the usage rate of the storage circuits and thus to a lower power consumption.

6.4 De-Interleaving

The interleaver 100 can make both the interleaving and de-interleaving as above.

It should be reminded here that generally for interleaving, sequential address data are used to write data to the storage circuit, while random address data are used to read data from the storage circuit. On the other hand, for de-interleaving, address data used in interleaving have to be inverse-transformed to generate read address data. To this end, it is necessary for repetitive decoding to hold separately two kinds of address data, namely, address data for transformation of address data used in de-interleaving for use in interleaving and address data for inverse transformation of address data used in interleaving for use in de-interleaving, which will possibly increase the circuit scale.

To avoid the above, the interleaver 100 uses read address data for use in interleaving as write address data, reads sequential address data and thus uses the same address data in common for both interleaving and de-interleaving.

More particularly, for the above interleaving, the interleaver 100 generates, by the control circuit 400, write address data IWA which is the sequential address data, and uses the write address data IWA to write data to the storage circuits $407_1$, $407_2$, ..., $407_{16}$, while generating, by the control circuit 400, sequential address data IAA, reads, based on the address data IAA, read address data ADA which are random address data, from the address storage circuit 110, and uses the read address data ADA to read data from the storage circuits $407_1$, $407_2$, ..., $407_{16}$.

On the other hand, for the de-interleaving as above, the interleaver 100 generates, by the control circuit 400, sequential address data IAA, reads, based on the address data IAA, read address data ADA which are random address, from the address storage circuit 110, and uses the read address data ADA to write data to the storage circuits $407_1$, $407_2$, ..., $407_{16}$, while generating, by the control circuit 400, write address data IWA which are sequential address data, and uses the write address data IWA to read data from the storage circuits $407_1$, $407_2$, ..., $407_{16}$.

As above, the interleaver 100 uses the same address data in common for both interleaving and de-interleaving, and switches the address data depending upon which is intended, interleaving or de-interleaving. In other words, the interleaver 100 switches, by the control circuit 400, read address data for use in interleaving to write address data for use in de-interleaving, and read address data for use in de-interleaving to write address data for use in interleaving.

Figure 100:
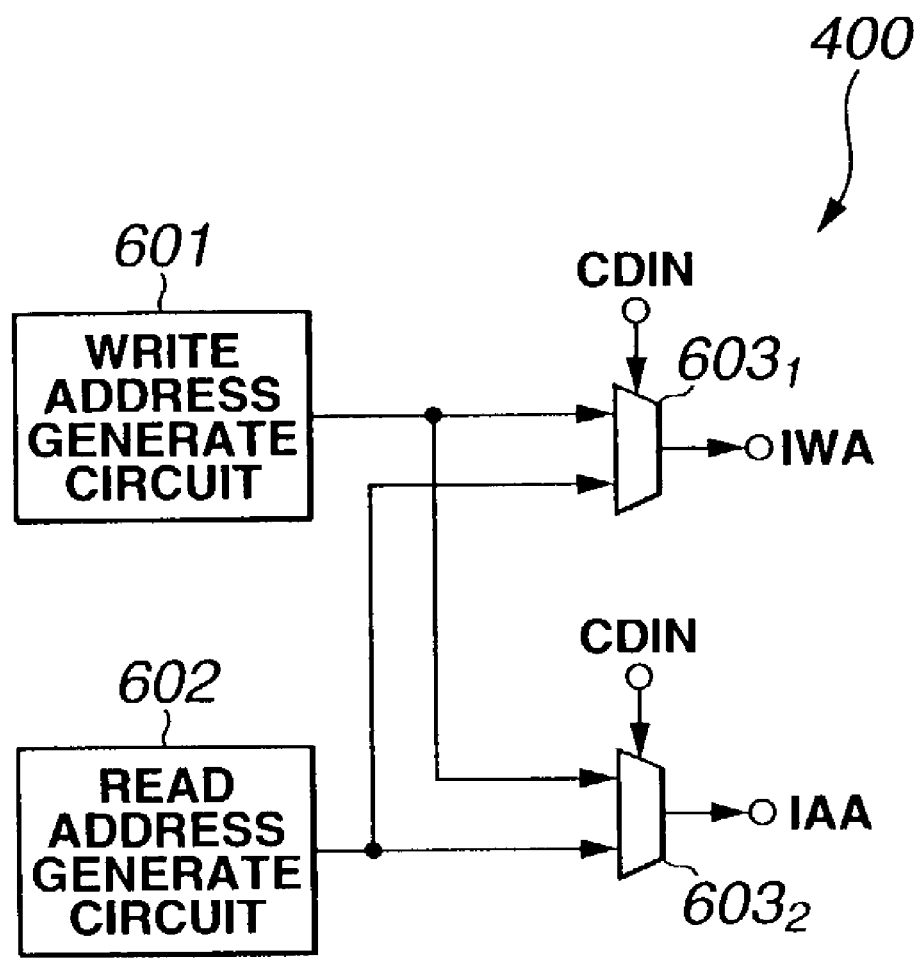
FIG. 100 is a diagram of a simplified control circuit included in the interleaver.

The control circuit 400 for such an address data switching can be constructed as schematically illustrated in FIG. 100 for example. As shown, the control circuit 400 includes a write address generation circuit 601, read address generation circuit 602 and two selectors $603_1$ and $603_2$.

The control circuit 400 generates, by the write address generation circuit 601, write address data which are sequential address data and supplies the data to the selectors $603_1$ and $603_2$, while generating, by the read address data generation circuit 602 to generate address data which are sequential address data and supplying the data to the selectors $603_1$ and $603_2$. The selectors $603_1$ and $603_2$ selects, based on the interleaving mode signal CDIN, either address data supplied from the write address data generation circuit 601 or address data supplied from the read address data generation circuit 602.

More specifically, when the interleaving mode signal CDIN instructs that the interleaver 100 should make an interleaving, the selector $603_1$ selects the address data supplied from the write address data generation circuit 601, and supplies it as the write address data IWA to the interleave address transforming circuit 403. Also, when the interleaving mode signal CDIN instructs that the interleaver 100 should make an interleaving, the selector $603_2$ selects the address data supplied from the write address data generation circuit 602, and supplies it as the write address data IAA to the address storage circuit 110 and interleave address transforming circuit 403.

When the interleaving mode signal CDIN instructs that the interleaver 100 should make a de-interleaving, the selector $603_1$ selects the address data supplied from the write address data generation circuit 602, and supplies it as the write address data IWA to the interleave address transforming circuit 403. Also, when the interleaving mode signal CDIN instructs that the interleaver 100 should make a de-interleaving, the selector $603_2$ selects the address data supplied from the write address data generation circuit 601, and supplies it as the write address data IAA to the address storage circuit 110 and interleave address transforming circuit 403.

As above, the interleaver 100 changes, by the control circuit 400, address data for use in interleaving or de-interleaving, whereby the circuit can be designed simple and in a reduced scale.

6.5 Generating Write and Read Addresses

Generally for generation of write and read addresses, sequential address data are generated with count-up by a counter. When the write address counter and read address counter are used in common, data read from the storage circuit cannot be started until write of a next frame to the storage circuit is started.

Figure 101:
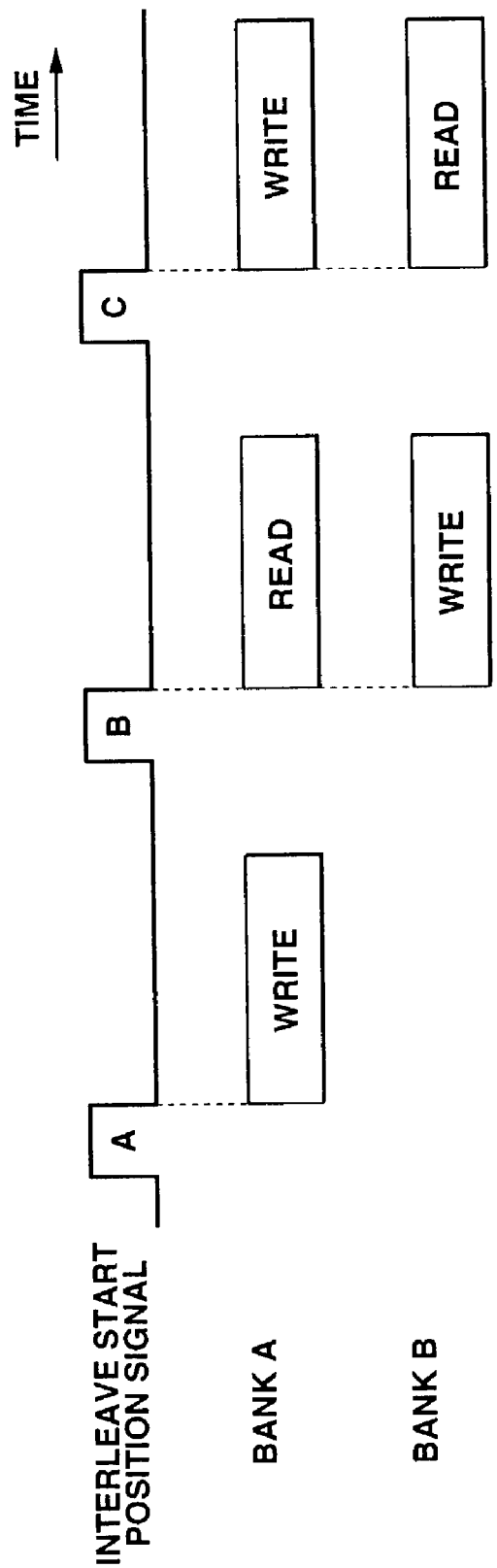
FIG. 101 explains timing of writing and reading data in case an address counter is used in common for both data write and read.

That is, in case the write address counter and read address counter are used in common, when an interleave start position signal indicated with a reference A in FIG. 101 is supplied as an input to the interleaver, data is written to a storage circuit in the bank A. Next, when a next interleave start position signal indicated with a reference B is supplied as an input to the interleaver, data is read from a storage circuit in the bank A, while data is written to a storage circuit in the bank B. Similarly, when a further interleave start position signal indicated with a reference C is supplied as an input to the interleaver, data is read from a storage circuit in the bank B, while data is written to the storage circuit in the bank A.

As above, when the interleaver uses the write address counter and read address counter in common, data read from the storage circuit is started simultaneously with the start of write a next frame to the storage circuit.

Generally, the input timing of an external input frame varies and the frame is not always be supplied as an input to the interleaves at regular intervals. That is, the interleaver has to normally operate without any detection of a time when a next frame is supplied as an input.

When consideration is given to the repetitive decoding in the above conditions, it is necessary to interleave extrinsic information to delay a received value. However, since the input timing of the received value varies from one frame to another, a difference will take place between delayed amounts in some cases. Namely, in the interleaver, delayed amounts of a received value are different from each other because the time between two interleave start position signals indicated with references A and B, respectively, is different from that between two interleave start position signals indicated with references B and C, respectively, as shown in FIG. 101. In this case, since it is difficult to input delayed received values at the same time, the interleaver has to make complicated operations for implementation of the repetitive decoding.

To this end, the interleaver 100 is provided with separate write address counter and read address counter so that a data write to the storage circuit is complete will immediately be followed by a data read.

Figure 102:
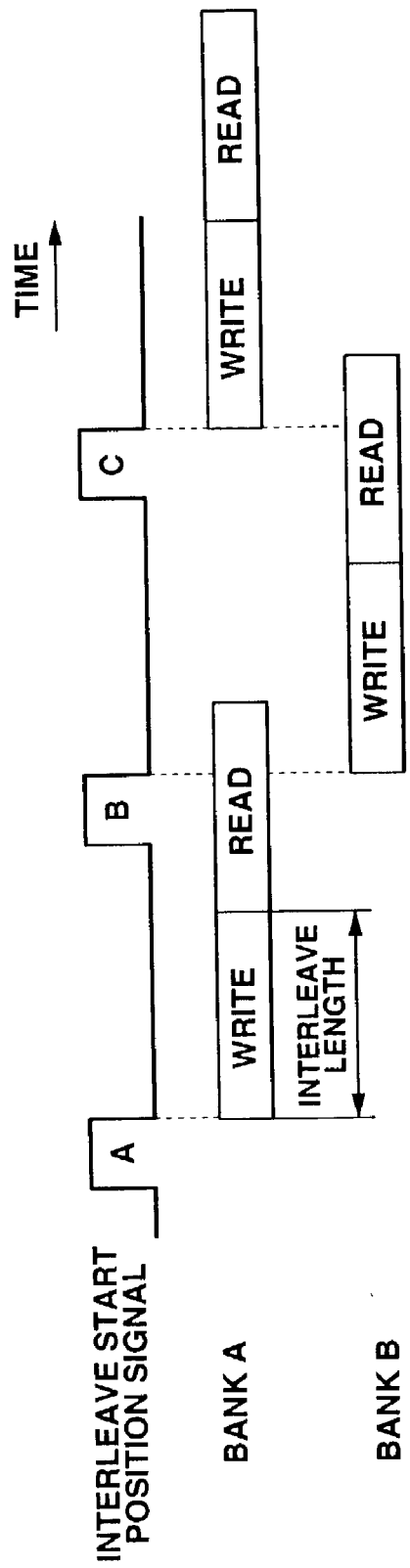
FIG. 102 explains timing of writing and reading data when a write address counter and read address counter are separately provided.

More specifically, the interleaver 100 allows, by the control signal 400, the write address counter to count up when it is supplied with an interleave start position signal TIS indicated with a reference A, and the read address counter to count up immediately after data is written to the storage circuit in the bank A, to read the stored data, as shown in FIG. 102. Next, the interleaves 100 causes, by the control circuit 400, the write address counter to count up when it is supplied with a next interleave start position signal TIS indicated with a reference B, and the read address counter to count up immediately after data is written to the storage circuit in the bank A, to read the stored data. Similarly, the interleaver 100 causes the write address counter to count up when it is supplied with a next interleave start position signal TIS indicated with a reference C, and the read address counter to count up immediately after data is written to the storage circuit in the bank A, to read the stored data.

Provided with the separate write address counter and read address counter as above, the interleaver 100 can start reading data immediately after data write to the storage circuit is complete. Namely, even in case the time between two interleave start signals TIS indicated with references A and B, respectively, is different from that between two interleave start signals TIS indicated with references B and C, respectively, the interleaver 100 can always delay data the interleaving length and thus easily input delayed received values at the same time.

6.6 Delaying for Interleaving Length

In case the write address counter and read address counter provided separately as described in Subsection 6.5, the interleaver 100 reads data from the storage circuit in the same sequence as it writes data to the storage circuit in order to delay a received value. That is, to delay the received value, the interleaver 100 reads data from the same address as the write address.

With the above operations, the interleaver 100 can delay the data an interleaving length. In particular, the interleaver 100 causes both the read address counter and write address counter to count up and generate sequential address data, and thus can easily delay the data an interleaving length.

Adopting the above-mentioned technique, the interleaver 100 can make repetitive decoding various numbers of times without varying the entire decoding delay just by concatenating a plurality of element decoders in case experimental decoding is done various numbers of times.

6.7 Utilizing Address Space

This is a feature of the address representation effected in interleaving for inputting a plurality of symbols and outputting a plurality of symbols.

Normally, successive addresses are assigned to RAMs in the storage circuits and data is written using the space of these successive addresses. For an interleaving with inputting a plurality of symbols and outputting a plurality of symbols, it is assumed here that successive addresses are assigned to RAMs in a plurality of storage circuits.

Figure 103:
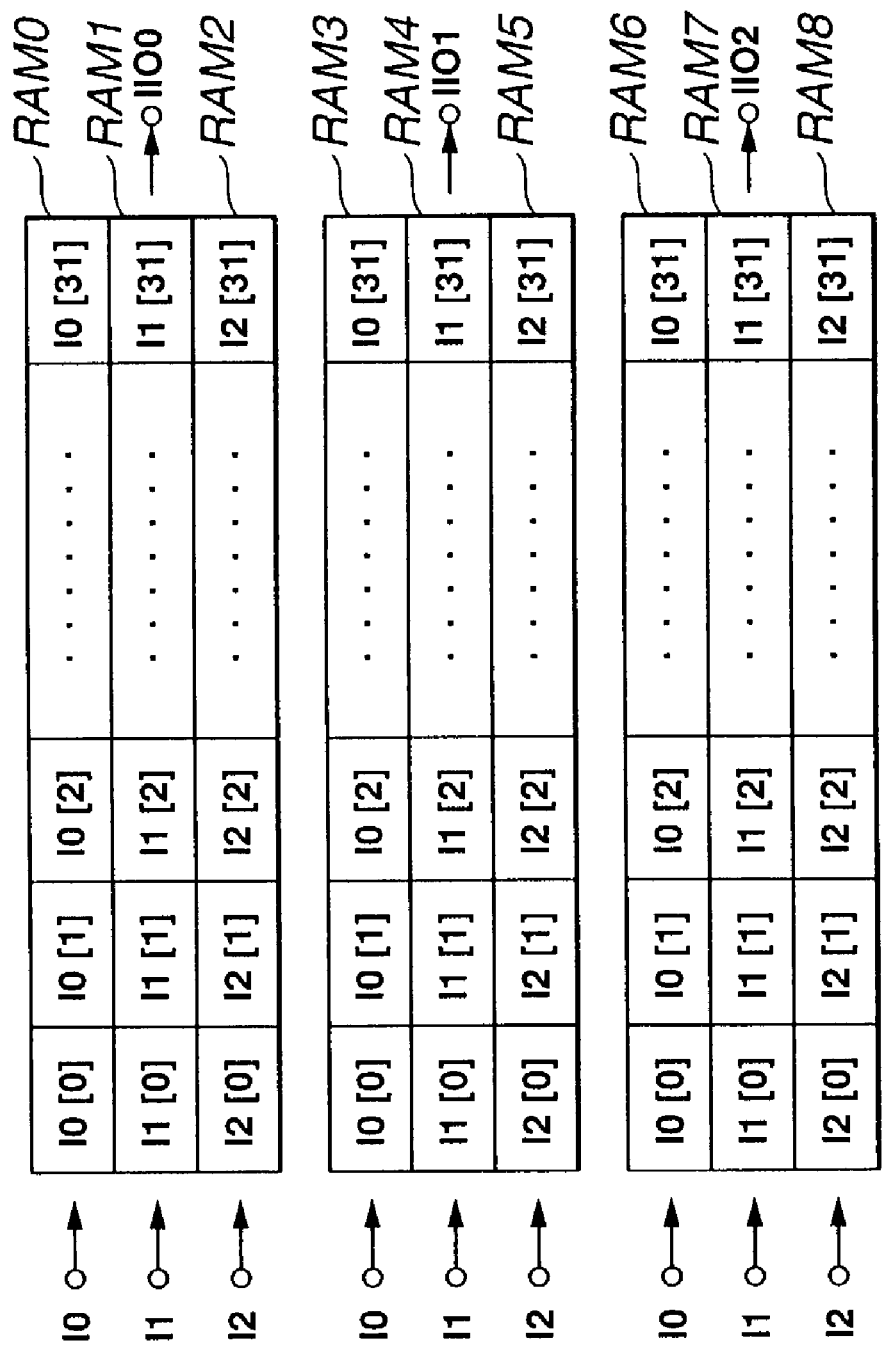
FIG. 103 explains how data is written to, and read from, the RAMs in the interleaver.

For example, in case RAM0, RAM1, RAM2, RAM3, RAM4, RAM5, RAM6, RAM7 and RAM8 in nine storage circuits are used to make an interleaving to input three-symbol data as an input symbol and output three-symbol data as an output symbol, data at the 0-th symbol data I0 (=I0 [0], I0[1], I0 [2], . . . , I0 [31]) is sequentially written to the RAM0, RAM3 and RAM6 in the direction of word at each time slot, first-symbol data I1 (=I1 [0], I1 [1], I1 [2], . . . , I1 [31]) is sequentially written to the RAM1, RAM4 and RAM7 in the direction of word at each time slot, and second-symbol data I2 (=I2 [0], I2 [1], I2 [2], . . . , I2 [31]) is sequentially written RAM2, RAM5 and RAM8 in the direction of word at each time slot, as shown in FIG. 103. Then, 1-sequences interleaver output data IIO0 is read from the RAM0, RAM1 and RAM2, and another 1-sequences interleaver output data IIO1 is read from the RAM3, RAM4, and RAM5, and still another 1-sequences interleaver output data IIO2 is read from the RAM6, RAM7, and RAM8.

Figure 104:
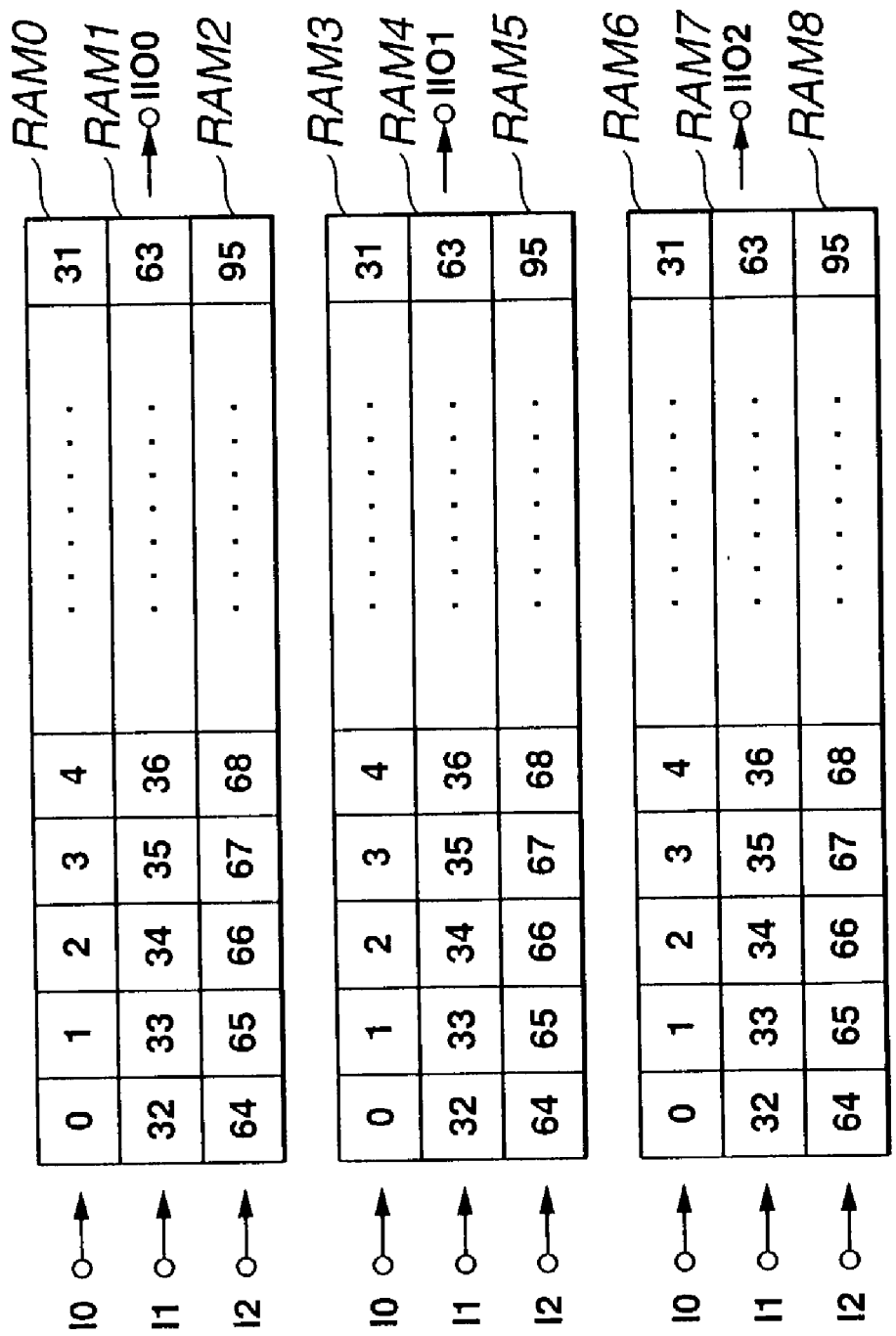
FIG. 104 explains how sequential addresses are allotted to the RAMs in the interleaver.

On the assumption that to write data, successive address 0 to 31 for example are assigned to each of the RAM0, RAM3 and RAM6, as shown in FIG. 104, successive addresses 32 to 63 are assigned to each of the RAM1, RAM4 and RAM7, and successive addresses 64 to 95 are assigned to each of the RAM2, RAM5 and RAM8.

This is also true when data is not stored into all storage areas of each RAM in interleaving over various lengths or the like.

Figure 105:
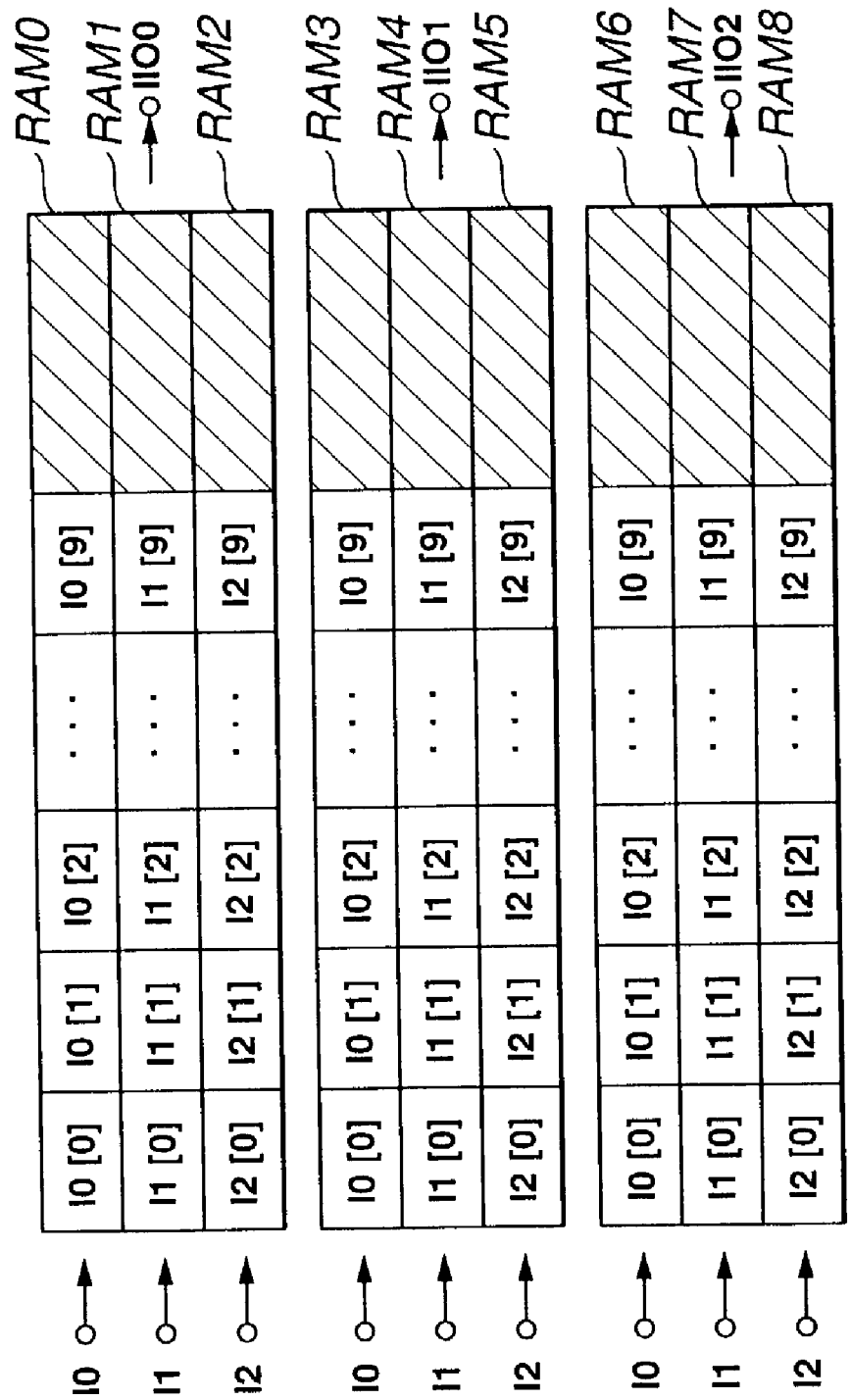
FIG. 105 explains how data is written to, and read from, the RAMs in the interleaver in case data is not stored over the storage area of each RAM.

For example, each of the RAM0, RAM1, RAM2, RAM3, RAM4, RAM5, RAM6, RAM7 and RAM8 can make an interleaving over a length equivalent to 32 time slots in the example shown in FIG. 104. In case the interleaving length is of 10 time slots, 0-th symbol data I0 (=I0 [0], I0 [1], I0 [2], . . . , I0 [9] in all storage areas for 32 time slots are sequentially written to the RAM0, RAM3 and RAM6 in the direction of word at each time slot, but not to the remaining storage areas, as shown in FIG. 105 for example. Also, first-symbol data I1 (=I1 [0], I1 [1], I1 [2], . . . , I1 [9]) in all storage areas for 32 time slots are sequentially written to the RAM1, RAM4 and RAM7 in the direction of word at each time slot, but not to the remaining storage areas. Further, second-symbol data I2 (=I2 [0], I2 [1], I2 [2], . . . , I2 [31]) in all storage areas for 32 time slots are sequentially written to the RAM2, RAM5 and RAM8 in the direction of word at each time slot, but not to the remaining storage areas.

Figure 106:
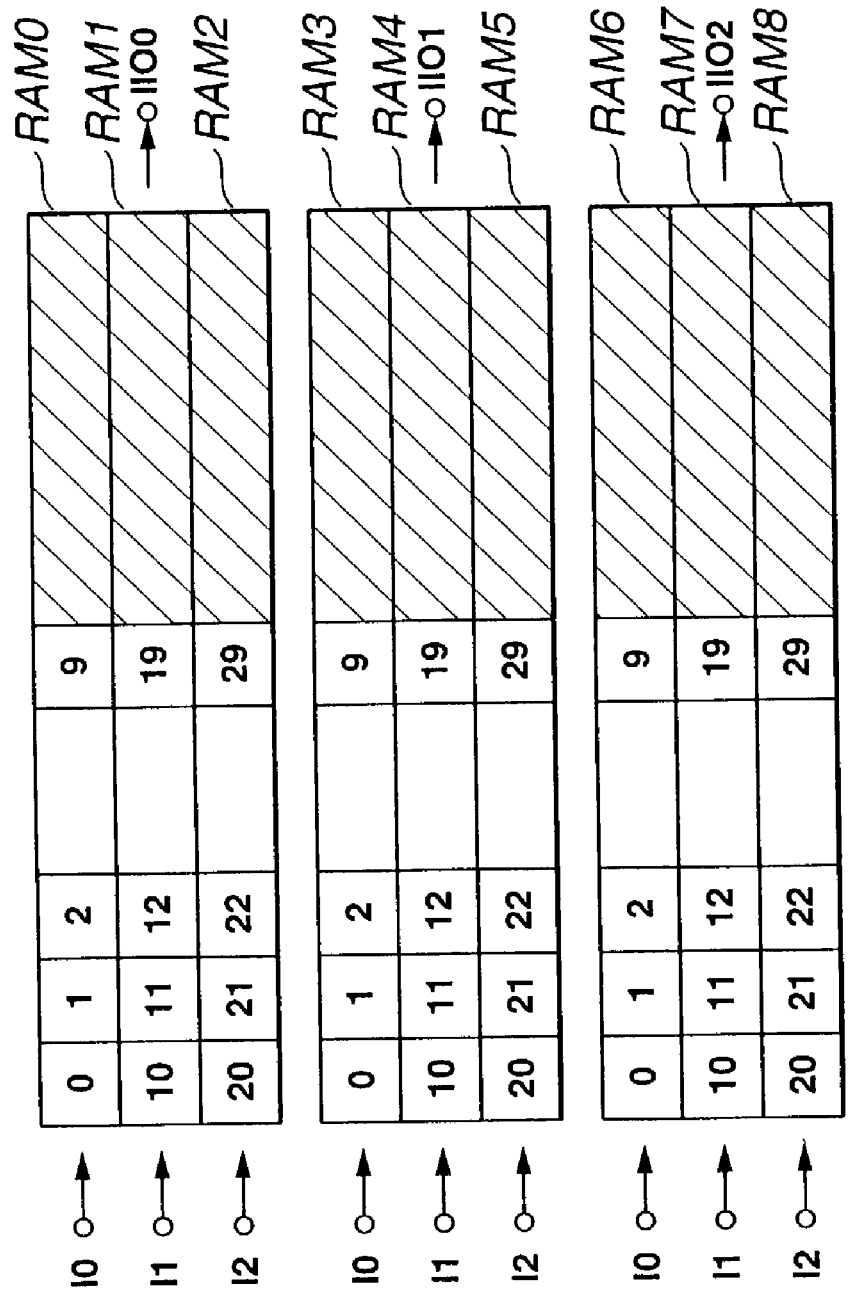
FIG. 106 explains how sequential addresses area allotted to the RAMs in the interleaver in case sequential addresses area to be allotted to a plurality of RAMs physically different from each other.

At this time, for data write, successive addresses are assigned to a plurality of RAMs physically different from each other. For example, successive addresses 0 to 9 are assigned to each of the RAM0, RAM3 and RAM6, successive addresses 10 to 19 are assigned to each of the RAM1, RAM4 and RAM7, and successive addresses 20 to 29 are assigned to each of the RAM2, RAM5 and RAM8, as shown in FIG. 106.

However, when reading data have been written to the RAMs using the above address spaces, it is necessary to transform each address to a one indicating a combination of a time slot and input symbol. For example, when reading data having been stored in an address space "12" from the RAM0, RAM1 and RAM2 shown in FIG. 106, it is necessary to transform information indicative of an address "12" to information "two time slots at first symbol".

Thus, for writing data with successive addresses assigned to each RAM, there should be provided a transforming circuit to transform addresses when reading the data. In particularly, in case the number of symbols is not any power of 2, the address transformation will be complicated.

For this reason, the interleaver 100 provides a transformation-destination address data as a combination of information about an input symbol and information about a time slot for each symbol.

Figure 107:
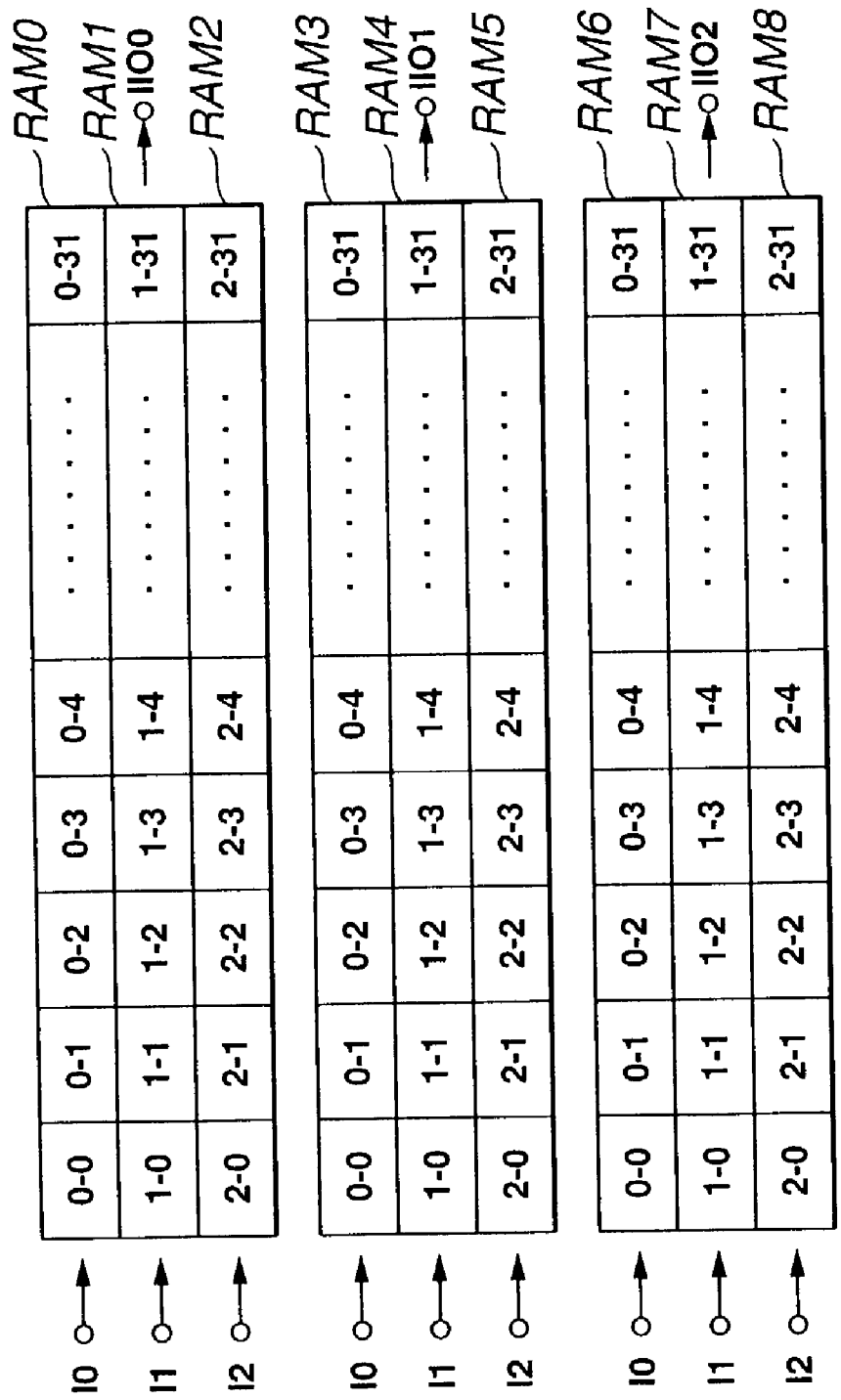
FIG. 107 explains how addresses are allotted to the RAMs in the interleaver in case replacement-destination address data are given each as a combination of a time slot and input symbol.

More particularly, assume here that the interleaver 100 makes such an interleaving over a 32 time-slot length using nine the RAM0, RAM1, RAM2, RAM3, RAM4, RAM5, RAM6, RAM7 and RAM8 in nine storage circuits that it is supplied with three-symbol data as an input symbol and outputs three-symbol data as an output symbol, for example, as having previously been described. In this case, to wrote data, the interleaver 100 supplies, by the control circuit 400, supplies each of the RAM0, RAM3 and RAM6 with a combination of information indicative of each time slot and information indicating a 0-th symbol, like 0-0, 0-1, 0-2, ..., 0-31, as an address, as shown in FIG. 107. Also, the interleaver 100 supplies, by the control circuit 400, each of the RAM1, RAM4 and RAM7 with a combination of information indicative of each time slot and information indicating a first symbol, like 1-0, 1-1, 1-2, ..., 1-31, as an address. Further, the interleaver 100 supplies, by the control circuit 400, each of the RAM2, RAM5, and RAM8 with a combination of information indicating each time slot and information indicative of a second symbol, like 2-0, 2-1, 2-2, ..., 2-31, as an address.

Actually, the address assignment shown in FIG. 107 is equivalent to the address assignment shown in FIG. 104. It is assumed here that data is read from an address space "34" in the RAM0, RAM1 and RAM2 shown in FIG. 107 for example. In this case, the information indicating the address "34" is expressed as "0100010" in seven digits in the binary notation. The upper 2 bits "01" indicate the first symbol, and lower 5 bits "00010" indicate the second time slot. That is, the address assignment shown in FIG. 107 is substantially equivalent to that shown in FIG. 104 and no address transformation is required for data reading.

Figure 108:
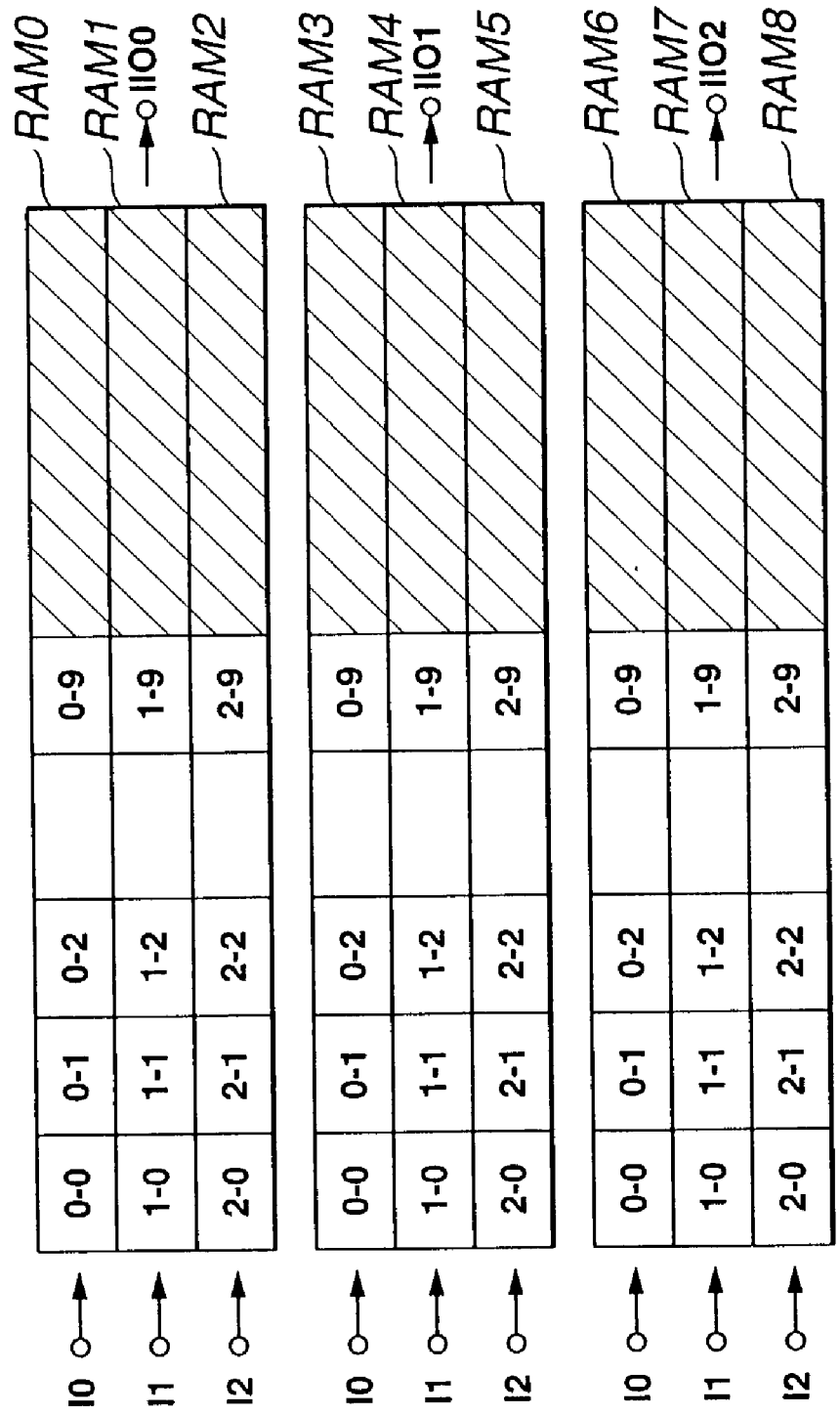
FIG. 108 explains addresses are allotted to the RAMs in the interleaver in case replacement-destination address data are given each as a combination of a time slot and input symbol when data is not stored over the storage area of each RAM.

Also, when the interleaver 100 makes an interleaving over an length of 10 time slots for example, it supplies each of the RAM0, RAM3 and RAM6 with a combination of information indicating each time slot and information a 0-th symbol, like 0-0, 0-1, 0-2, ..., 0-9, as an address when writing data, as shown in FIG. 108 for example. Also, the interleaver 100 supplies each of the RAM1, RAM4, and RAM7 with a combination of information indicative of each time slot and information indicative a first symbol, like 1-0, 1-1, 1-2, ..., 1-9, as an address. Further, the interleaver 100 supplies each of the RAM2, RAM5, and RAM8 with a combination of information indicative each time slot and information indicating a second symbol, like 2-0, 2-1, 2-2, ..., 2-9, as an address.

The address assignment shown in FIG. 108 is substantially equivalent to that shown in FIG. 107. Thus, even when no data is stored into all the storage areas of each RAM in case the interleaving length is variable or in a similar case, the interleaver 100 needs no address transformation for data reading.

As above, even in case such an interleaving in which a plurality of symbols is inputted and a plurality of symbols is outputted is effected over a variable length by always giving a replacement-destination address data as a combination of information about each symbol and information about a time slot for each symbol, the interleaver 100 needs no address transformation for data reading. Therefore, no special address transformation circuit has to be provided, which contributes to a circuit scale reduction.

Note that for the interleaver 100, the address assignment is not limited to those shown in FIGS. 107 and 108 and may be any one which could be made with a discriminable combination of a time slot and input symbol.

6.8 Writing and Reading Data by Partial-Write Function

This is a feature of the aforementioned storage circuits $407_1, 407_2, \ldots, 407_{16}$.

Figure 109A:
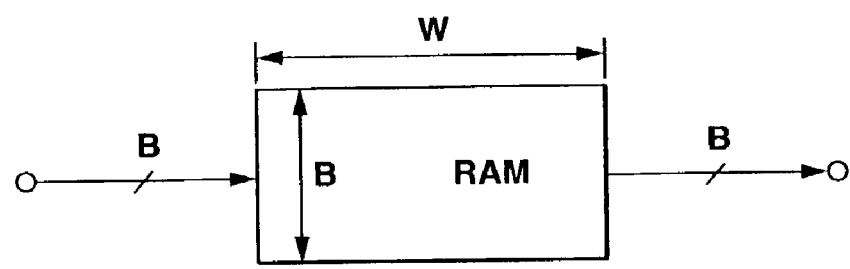
Figure 109B:
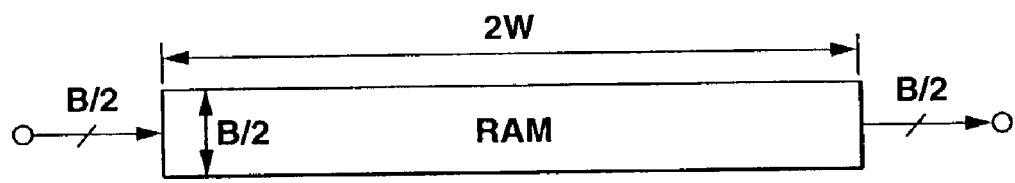

As above, the storage circuit 407 has a function to make a partial-write based on a partial-write control signal PW. For example, the storage circuit 407 is normally supplied with or outputs data of B bits from or to the RAM 424 having a capacity of B bits by W words as shown in FIG. 109A. When the storage circuit 407 is used as a partial-write RAM, it can be falsely constructed to be supplied with or outputs data of B/2 bits from or to the RAM 424 having a capacity of B/2 bits by 2W words as shown in FIG. 109B.

Normally, when a RAM limited in both the numbers of bits and words is used as an interleaver, the interleaving length is limited correspondingly to the number of words in the RAM. In other words, the interleaver 100 can use the RAM 424 in the storage circuit 407 as a partial-write RAM to make an interleaving over a larger length than a normal number of words in the RAM 424.

At this time, since the interleaver 100 is supplied with a data having a number of bits which is when in the normal operation, namely, when a RAM of 16 bits for example is not used as any partial-write one, it is necessary when the RAM is used as a partial-write one to selectively supply a desired data of 8 bits of an input 16-bit data to the RAM 424.

To this end, in the interleaver 100, a data input to the storage circuit 407 is divided into upper and lower bit groups to provide a two-symbol data. For the partial-write operation, the data selection is made such that the same data of these two-symbol data will always be selected and a data, corresponding to an address, of the read data will always take the same position in an output data.

More specifically, when in the partial-write operation, the storage circuit 407 write and read data as will be described below.

That is, the storage circuit 407 selects, by each of the selectors 421 and 422, an inverted bit IAR of the MSB of address data AR and the MSB of the address data AR. Thus, when the MSB of the address data AR is "0" for example, data VIH will be an 8-bit data "11111111", while data VIL will be an 8-bit data "00000000". Similarly, when the MSB of the address data AR is "1", the data VIH will be an 8-bit data "00000000", while the data VIL will be an 8-bit data "11111111".

The data VIH indicates whether or not data is written to an upper address in the direction of bits in the storage area of the RAM 424, and VIL indicates whether or not data is written to a lower address in the direction of bits in the RAM

424. The storage circuit 407 writes data to an address for which each bit of the data VIH and VIL is "0".

At the same time, the storage circuit 407 always selects, by the selector 423, data IR[7:0] at the lower 8 bits of the data IR. Thus, data I will be a repetition of the data IR[7:0], that is, I={IR1, IR0}={IR [7:0], IR [7:0]}.

The storage circuit 407 writes the data IR[7:0] to either an upper address or lower address of a predetermined word in the RAM 424 based on address data IA being a data not including the MSB of the address data AR, and data VIH and VIL. That is, when the MSB of the address data AR is "0", the storage circuit 407 the data IR[7:0] to an lower address of the predetermined word in the RAM 424. When the MSB of the address data AR is "1", the storage circuit 407 writes the data IR[7:0] to an upper address of the predetermined word in the RAM 424.

Thus, the storage circuit 407 writes only the data IR[7:01]at lower 8 bits of the data IR to the RAM 424 when in the partial-write operation.

Based on the address data IA being a data not including the MSB of the address data AR, and data VIH and VIL, the storage circuit 407 reads, as data OH, the data stored at an upper address in the RAM 424, and also, as data OL, the data stored at an lower address, and outputs data OR, selected by the selectors 425 and 426.

At this time, the data OR is always configured so that one, corresponding to an address, of the data OH and OL read from the RAM 424 will take the same position in an output data. That is, since an address corresponding to data LPD is an lower address in the RAM 424 when the data LPD is "0", the data OR will be OR={SOH, SOL}={OH, OL} taking, as lower bits, the data OL read from the lower address, while taking, as upper bits, the data OH read from the upper address. Similarly, since an address corresponding to data LPD is an upper address in the RAM 424 when the data LPD is "1", the data OR will be OR={SOH, SOL}={OL, OH} taking, as lower bits, the data OH read from the upper address, while taking, as upper bits, the data OL read from the lower address.

Thus, when in the partial-write operation, the storage circuit 407 will always write, to the RAM 424, lower-bit data IR0 obtained via the division of the input data IR into upper and lower bit groups, and always take, as lower bits of an output data, one, corresponding to an address, of the data read from the RAM 424.

On the other hand, normally or when not in the partial-write operation, the storage circuit 407 writes and reads data as will be described below.

That is, the storage circuit 407 selects bits whose values are "0" by each of the selectors 421 and 422. Thus, the data VIH and VIL for example will always be an 8-bit data "00000000".

At the same time, the storage circuit 407 always selects data IR[15:8]at upper eight bits of the data IR by the selector 423. Thus, the data I will be I={IR1, IR0}={IR[15:8], IR[7:0]}, namely, the data IR itself.

Then, since both the data VIH and VIL are "00000000" as above, the storage circuit 407 writes the data I to both upper and lower addresses of the predetermined word in the RAM 424 based on the address data IA being a data not including the MSB of the address data AR, and data VIH and VIL. That is, the storage circuit 407 writes data IR[15:8] to an upper address of the predetermined word in the RAM 424 and IR[7:0] to a lower address.

As above, the storage circuit 407 normally writes data IR itself to the RAM 424.

Then, based on the address data IA being a data not including the MSB of the address data AR, and data VIH and VIL, the storage circuit 407 reads data stored at an upper address in the RAM 424 as the data OH, while reading data stored at a lower address as the data OL, and outputs data OR, selected by the selectors 425 and 426. At this time, since the data LPD is "0", the data OR will always be OR={SOH, SOL}={OH, OL} taking, as lower bits, the data OL read from a lower address in the RAM 424 and, as upper bits, the data OH read from an upper address. That is, the data OR will be a data itself read from the predetermined word in the RAM 424.

Thus, the storage circuit 407 normally writes the data IR to the RAM 424 and outputs it as the data OR.

With the above operations, the interleaver 100 has only to detect data at an upper or lower address of data at a plurality of input or output bits but has not to detect at which bits the data are contributed to write and read. Thus, when in the normal operation, the interleaver 100 uses, as a partial-write RAM, a RAM having a storage capacity of B bits by W words, and thus can easily use the RAM as a RAM having a storage capacity of a half number of bits by a double-length word.

Note that the interleaver 100 has been described concerning the RAM 424 whose storage capacity for a partial-write operation is a number of bits which a half of that for the normal operation by a word length which is a double of that for the normal operation but the present invention is not limited to this storage capacity of the RAM 424. This technique is also applicable for an arbitrary storage capacity such as a number of bits, ⅓ of that for the normal operation, by a word length, triple of that for the normal operation, a number of bits, ¼ of that for the normal operation, by a word length; quadruple of that for the normal operation; or a number of bits, same as that for the normal operation, by a word whose length is several times of that for the normal operation.

That is to say, the interleaver should divide an input data to the storage circuit into at least upper and lower bit groups to provide data of at least two symbols, and always select, when in the partial-write operation, the same one of these data of at least two symbols such that one, corresponding to an address, of the read data will always take the same position in an output data.

6.9 Providing Both Even-Length Delay and Odd-Length Delay

This is a feature of the aforementioned odd-length delay compensation circuit 402 and storage circuits 407$_1$, 407$_2$, ..., 407$_{16}$.

For repetitive decoding a variable-length code, it is necessary to make a variable-length delay. The interleaver 100 uses two banks of RAMs to select data write or read in one time slot to implement an interleaving-length delay by a RAM having a number of words for a time slot being a half of a delay length or interleaving length.

Figure 110:
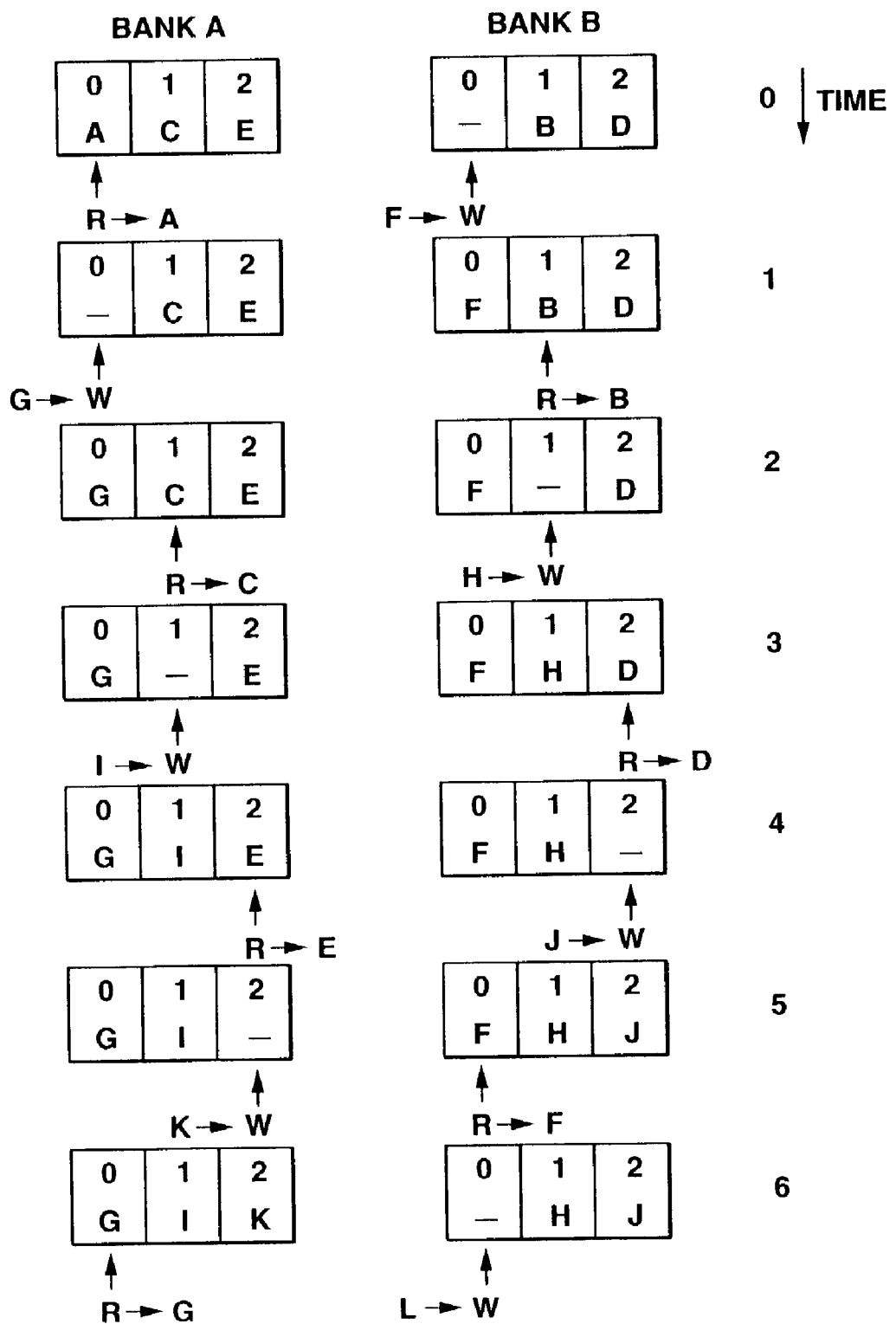
FIG. 110 explains how data is written to, and read from, the RAMs in the interleaver in which a delay of interleave length of six time slots is attained using two banks of RAMs each intended for storage of the number of words corresponding to three time slots.

For the simplicity of explanation and illustration, delaying by two banks of RAMs having a number of words for three time slots for an interleaving length of six time slots will be described hereunder with reference to FIG. 110. It is assumed herein for the convenience of the description that addresses 0, 1 and 2 are assigned to each of the RAMs in banks A and B. Also, it is assumed that data A, C and E have been pre-stored in each of storage areas at the addresses 0, 1 and 2 in the RAM in the bank A, data B and D have been pre-stored in each of storage areas at the addresses 1 and 2 in the RAM in the bank B and no data has been stored in the storage area at the address 0. Further, data write is indicated with a reference "W" and data read is with a reference "R" in FIG. 110.

First in the 0-th time slot, the interleaver 100 reads the data A from the storage area at the address 0 in the RAM in the bank A, and writes data F to the storage area at the address 0 in the RAM in the bank B.

Next, in the first time slot, the interleaver 100 writes data G to the storage area at the address 0 in the RAM in the bank A, that is, to the storage area from which the data A has been read in the 0-th time slot, and reads the data B from the storage area at the address 1 in the RAM in the bank B.

Then, in the second time slot, the interleaver 100 reads the data C from the storage area at the address 1 in the RAM in the bank A, and writes data H to the storage area at the address 1 in the RAM in the bank B, that is, to the storage area from which data F has been read in the first time slot.

Next, in the third time slot, the interleaver 100 writes data I to the storage area at the address 1 in the RAM in the bank A, that is, to the storage area from which the data C has been read in the second time slot, and reads the data D from the storage area at the address 2 in the RAM in the bank B.

Then, in the fourth time slot, the interleaver 100 reads data E from the storage area at the address 2 in the RAM in the bank A, and writes data J to the storage area at the address 2 in the RAM in the bank B, that is, to the storage area from which the data D has been read in the third time slot.

Next, in the fifth time slot, the interleaver 100 writes data K to the storage area at the address 2 in the RAM in the bank A, that is, to the storage area from which the data E has been read in the fourth time slot, and reads the data F from the storage area at the address 0 in the RAM in the bank B.

Then, in the sixth time slot, the interleaver 100 reads data G from the storage area at the address 0 in the RAM in the bank A, and writes data L to the storage area at the address 0 in the RAM in the bank B, that is, to the storage area from which the data F has been read in the fifth time slot.

Figure 111:
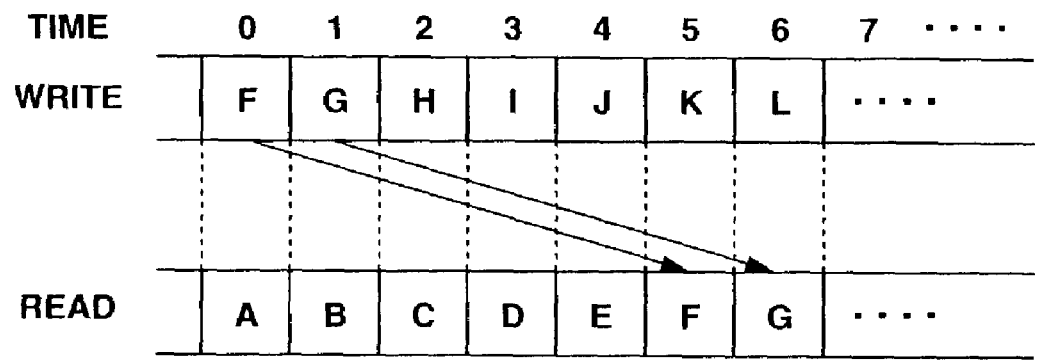
FIG. 111 is a chart explaining the timing of writing and read data with the operations shown in FIG. 110.

The interleaver 100 uses the two banks of RAMs as above to select data write or data read in one time slot. A timing chart of the data write and read thus selectively made is as shown in FIG. 111. That is, the data F having been written to the bank B is read after elapse of a time equivalent to an interleaving length, and similarly, the data G having been written to the bank A is also read after elapse of the time equivalent to the interleaving length.

Thus, when writing data to one of the banks A and B, the interleaver 100 selects the data read from the other bank at each time slot, thereby implementing a delay for the interleaving length by the use of two banks of RAMs for a number of words for a time slot which is a half of the interleaving length.

It should be reminded here that since the delaying by this technique can be done with a RAM having a smaller storage capacity, the circuit scale can be reduced but the delaying length is limited to an even one.

For this reason, the interleaver 100 makes the above operations to provide a delay for a delay length only by the RAMs for an even-length delay, and also makes the above operations to provide a delay of the delay length minus one for an odd-length delay. Further, the interleaver 100 functions to make a selection for a delay for one time slot by the use of the register, whereby it provides both even-length delay and odd-length delay.

More specifically, for an even-length delay, the interleaver 100 delays, by the odd-length delay compensation circuit 402, data TDI by the RAMs based on the interleaving length information CINL supplied from the control circuit 60. For an odd-length delay, the interleaver 100 selects the data TDI to be delayed such that the data TDI is delayed a delay length by the RAMs minus one and one time slot by the registers.

Thus, the interleaver 100 can provide, even if reduced in circuit scale, both the even-length delay and odd-length delay.

6.10 Altering Input/Output Sequence

This is a feature of the aforementioned input data selection circuit 406 and output data selection circuit 408.

The soft-output decoding circuit 90 can decode an arbitrary code as having previously been described, but has to predetermine an input/output pattern corresponding to a code to be decoded in order to decode an arbitrary code. For this reason, it is actually very hard for the soft-output decoding circuit 90 to decode all codes by a single circuit. It is practical to decode an arbitrarily supposed code.

Generally, when making soft-output decoding of an arbitrary code in which a plurality of symbols is inputted and a plurality of symbols is outputted, the soft-output decoding circuit 90 as well as any soft-output decoding circuit destined for decoding of limited kinds of codes cannot decode any arbitrary code different only in the sequence of input symbols and/or that of output symbols from other than the limited kinds of codes.

For example, for decoding a code from an SCCC-based encoder by the decoder 3 composed of concatenated element decoders 50, it is assumed that the encoder includes an arbitrary convolutional encoder which supplies a code the soft-output decoding circuit 90 can decode, as a convolutional encoder to encode an outer code, an inline interleaver as an interleaver, and a convolutional encoder having previously been described with reference to FIG. 28 and which supplies a code the soft-output decoding circuit 90 can decoder, as a convolutional encoder to code an inner code. In this case, the decoder 3 is of course capable of decoding a code from the encoder.

Figure 112:
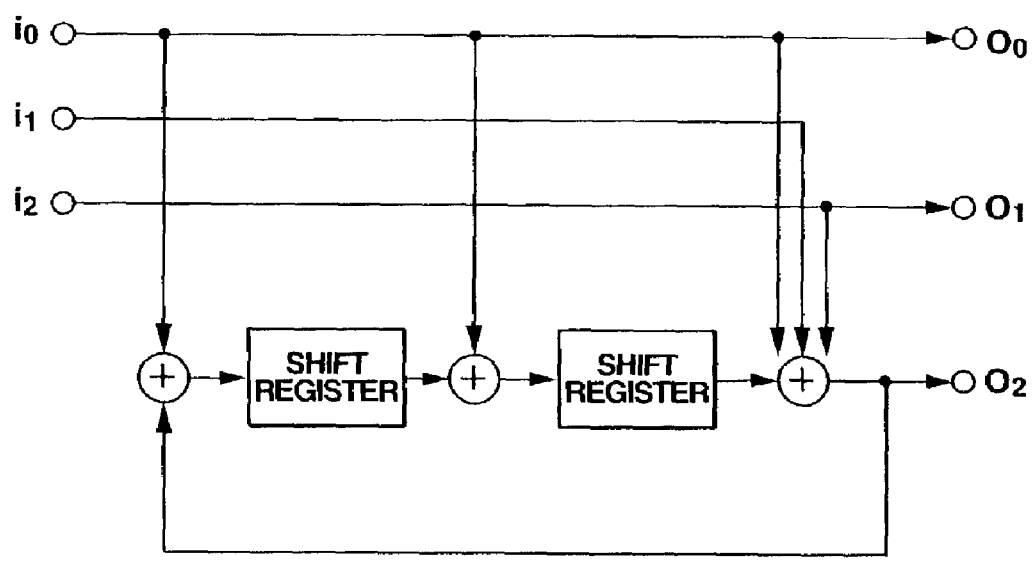
FIG. 112 is a block diagram of an example of the convolutional encoder.

In case the convolutional encoder to code an inner code in the encoder is as shown in FIG. 112 and the soft-output decoding circuit 90 is not destined to decode the convolutional code, the decoder 3 cannot decode a code from the encoder.

Figure 113:
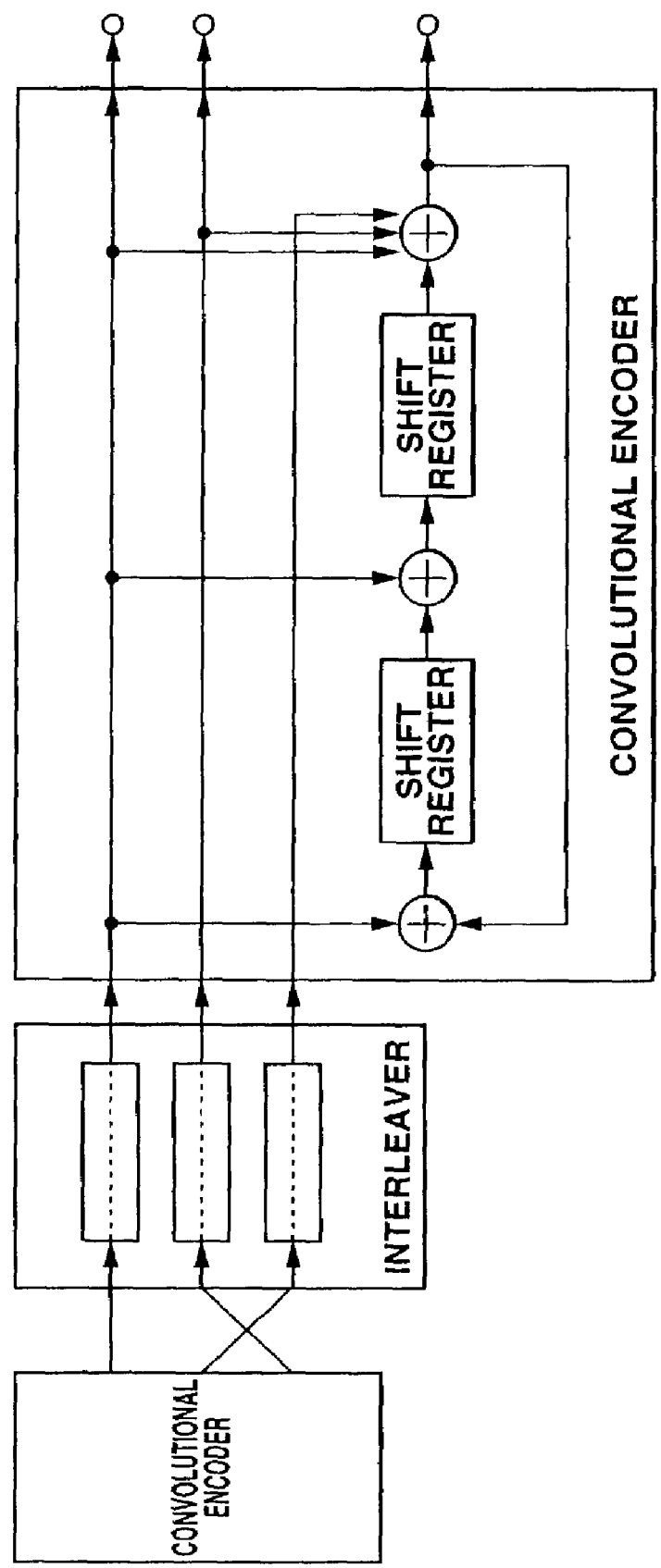
FIG. 113 is a block diagram of an example of the encoder, explaining how input symbols to the interleaver are reshuffled in sequence.

It will be seen that on the assumption that input data $i_0$, $i_1$, and $i_2$ are 0-th, first and second symbols, the convolutional encoder shown in FIG. 112 is different from the convolutional encoder shown in FIG. 28 in that the input data $i_1$ of the first symbol is replaced with the input data $i_2$ of the second symbol. That is, it will be seen that in the encoder provided with the convolutional encoder shown in FIG. 112, when 3-bit coded data output from the convolutional encoder to code an outer code is supplied to the interleaver, the coded data of the first symbol is replaced with the coded data of the second symbol to code an inner code as shown in FIG. 113. Namely, the encoder shown in FIG. 112 is equivalent to the convolutional encoder shown in FIG. 28, as the convolutional encoder to code an inner code.

Thus, the decoder 3 cannot decode any element code from an encoder in which a code the soft-output decoding circuit 90 is not destined to decode is taken as the element code, even if the element code is different only in the sequence of input symbols and/or that of output symbols.

In other words, for an discrete interleaving at each symbol such as inline interleaving or pair-wise interleaving at the coding side, the input/output symbol position is uniquely determined but it is required to make a wide coding with the input/output symbol position being changed. In particular, with an encoder using a Massey's code as an element code, a variety of coding can be made with the output position of the systematic components being changed. Thus, the decoder has to be designed for decoding such a code.

When making an interleaving in which a plurality of symbols is inputted and a plurality of symbols is outputted, the interleaver 100 makes sequence reshuffle of input symbols and/or output symbols to implement plural kinds of interleaving based on the same address.

More particularly, for an interleaving, the interleaver 100 changes, by the input data selection circuit 406, the input sequence of symbols based on the interleaver input/output replacement information CIPT to make mutual replacement between symbol input and output positions.

For a de-interleaving, the interleaver 100 changes, by the output data selection circuit 408, the output sequence of symbols based on the interleaver input/output replacement information CIPT to reshuffle symbol input and output positions.

Figure 114:
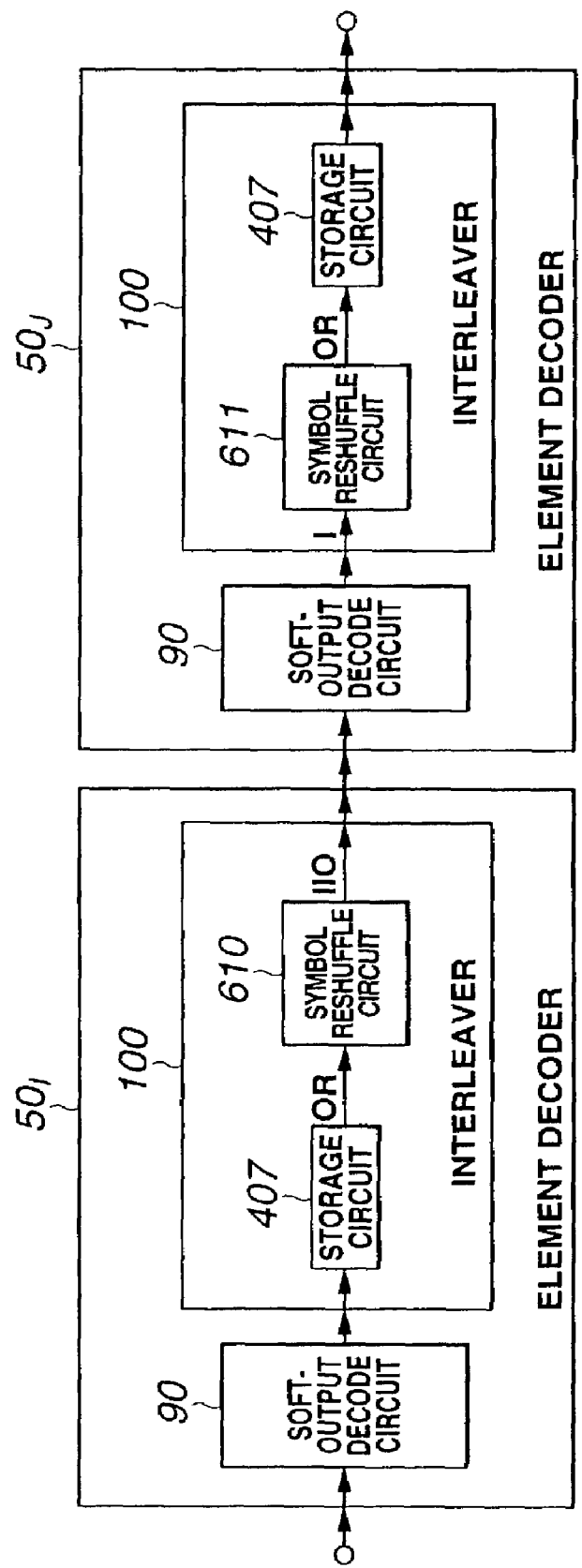

In other words, on the assumption that the decoder 3 is to decode an SCCC code, the two element decoders $50_I$ and $50_J$ adjacent to each other and forming together the decoder 3 can be constructed as shown in FIG. 114 for example. The circuit to reshuffle input symbols and/or output symbols will be referred herein to as "symbol reshuffle circuit".

That is, when the interleaver 100 is supplied with data output from the soft-output decoding circuit 90, the element decoder $50_I$ makes de-interleaving by the interleaver 100. At this time, when a data OR consisting of a plurality of symbols de-interleaved when passed through the storage circuit 407 in the interleaver 100 is supplied to a symbol reshuffle circuit 610 in the element decoder $50_I$ corresponding to the output data selection circuit 408, an interleaver output data 110 to be outputted is selected by the symbol reshuffle circuit 610, and then these interleaver output data 110 consisting of a plurality of symbols are subjected to mutual replacement between input sequence of symbols, namely, reshuffling of the symbols, and supplied to the downstream element decoder $50_J$.

On the other hand, when data supplied from the element decoder $50_I$ and subjected to the soft-output decoding by the soft-output decoding circuit 90 is supplied to the interleaver 100, the element decoder $50_J$ makes interleaving of the data by the interleaver 100. At this time, the element decoder $50_J$ reshuffles, by the symbol reshuffle circuit 611 corresponding to the input data selection circuit 406 in the interleaver 100, symbols of the data I consisting of a plurality of symbols supplied from the soft-output decoding circuit 90 and subjected to various kinds of processing according to the code configuration, and supplies the data as data IR to the storage circuit 407. The data thus interleaved is supplied to a downstream element decoder (not shown).

With the above operations, the interleaver 100 can change the sequence of input symbols and/or that of output symbols and implement plural kinds of interleaving based on the same address. In particular, when making an interleaving in which the number of input symbols is the same as that of output symbols and the input position is in a 1-to-1 relation with the output position such as normal inline interleaving and pair-wire interleaving operations, the interleaver 100 can select a connection between the input symbol position and output symbol position.

To this end, even in case the element decoder 50 includes a general-purpose soft-output decoding circuit destined for decoding limited kinds of codes, the element decoder 50 can decode codes different only in sequence of input symbols and/or that of output symbols from codes the soft-output decoding circuit can decode. Also, the element decoder 50 can limit the number of codes to be decoded by the soft-output decoding circuit 90, which contributes to a circuit simplification and circuit scale reduction.

Note that in the foregoing, the interleaver 100 including the function to reshuffle symbols has been described but the present invention is applicable to an interleaves 100 having no such function. The function may be provided in the soft-output decoding circuit 90, for example.

Figure 115:
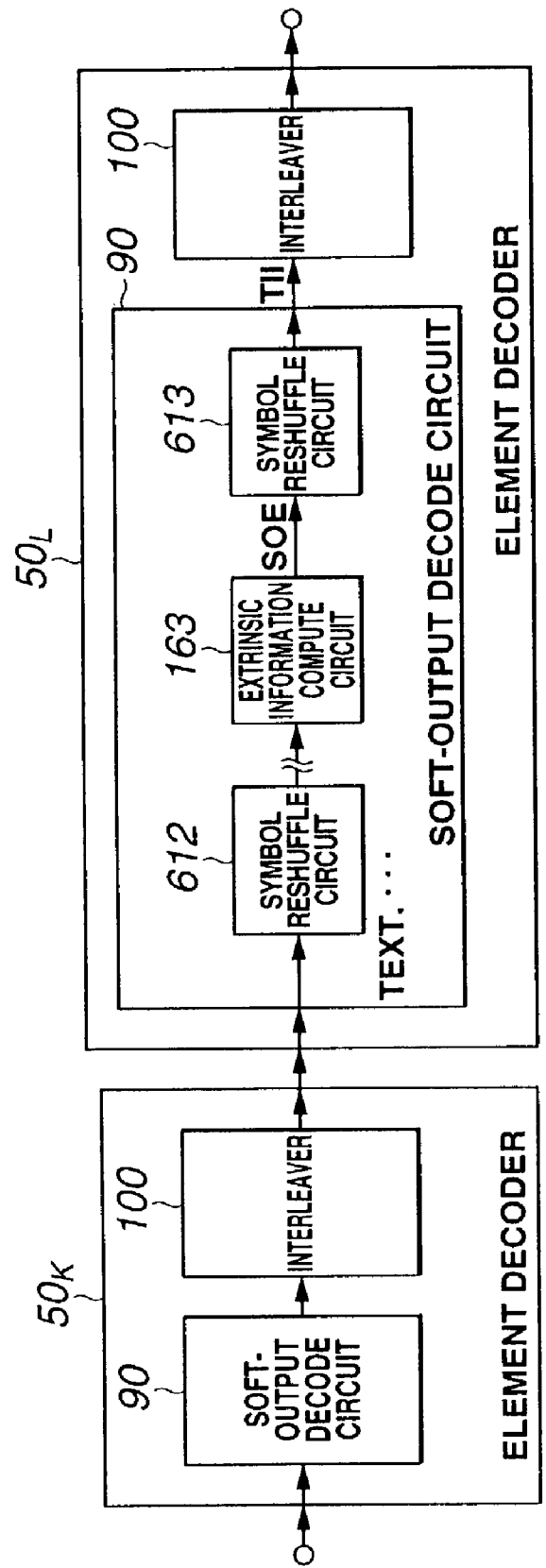

In case the function to reshuffle symbols is provided in the soft-output decoding circuit 90, two element decoders $50_K$ and $50_L$ adjacent to each other and forming together the decoder 3 can be designed as schematically illustrated in FIG. 115 on the assumption that the decoder 3 is to decoded an SCCC code.

That is, the element decoder $50_K$ makes, by the soft-output decoding circuit 90 and interleaving 100, normal soft-output decoding and de-interleaving and supplies data thus obtained to the downstream element decoder $50_L$.

On the other hand, when a data supplied from the element decoder $50_K$ and consisting of a plurality of symbols, namely, information required to make soft-output decoding such as extrinsic information, interleaved data TEXT, etc. is supplied to the soft-output decoding circuit 90, the element decoder $50_L$ reshuffles, by the symbol reshuffle circuit 612, symbols in such information according to the code configuration. Further, the element decoder $50_L$ reshuffles, by the symbol reshuffle circuit 613, symbols in extrinsic information SOE consisting of a plurality of symbols computed by the extrinsic information computation circuit 163 after having been subjected to various kinds of processing as in the soft-output decoding circuit 90, according to the code configuration, then makes various kinds of processing of the data, and supplies the data as data TII to the interleaver 100. Then, the element decoder $50_L$ interleaves the input data TII, and supplies it to a downstream element decoder (not shown).

With the above operations, the soft-output decoding circuit 90 can decode a code different only in sequence of input symbols and/or that of output symbols. Thus, the element decoder 50 can decode a limited number of codes the soft-output decoding circuit 90 decodes, whereby the circuit can be simplified and circuit scale can be reduced. More particularly, when making repetitive decoding of a Massey's code, the element decoder 50 can decode the code having the output position of systematic component thereof changed.

Note that the element decoder $50_L$ shown in FIG. 115 has been described as a one in which the symbol reshuffle circuit 613 includes the soft-output decoding circuit 90 but the interleaver 100 may include the symbol reshuffle circuit 613. That is, the element decoder 50 may be a one including a symbol reshuffle circuit corresponding to a code configuration downstream of the interleaver 100 for de-interleaving operation and upstream of the interleaves 100 for interleaving operation. Of course, even if the decoder 3 is to decode a PCCC code, the element decoder 50 may be a one including a symbol reshuffle circuit corresponding to a code configuration downstream of the interleaver 100 for de-interleaving operation and upstream of the interleaver 100 for interleaving operation.

7. Conclusion

As having been described in the foregoing, in the data transmission/reception system including the encoder 1 and decoder 3, the element decoders 50 forming together the decoder 3 can generate a situation equivalent to a data erasure, without no influence on the decoding operation by substituting, by the received value and a priori probability information selection circuit 154, a position where no coded output exists for a symbol whose likelihood is "0", and making soft-output decoding with the substituted information. Thus, the element decoder 50 can make it unnecessary to provide a separate storage circuit which holds information indicating a position where no coded output exists, and contribute to a circuit scale reduction.

That is, the data transmission/reception system formed using these encoder 1 and decoder 3 can be designed to have a smaller circuit scale and simple construction and represent a position of core erasure. It can provide a great convenience to the user.

Also, in the data transmission/reception system constructed using the encoder 1 and decoder 3, when decoding a code whose parallel paths exists in a trellis, the element decoders 50 forming together the decoder 3 makes, by the soft-output decoding circuit 90, log-sum operation of a log likelihood Iγ corresponding to the parallel paths in advance between computing log likelihood Iα and Iβ to tie together the parallel paths, and thus reduces the processing burden to the Iα computation circuit 158 and Iβ computation circuit 159, whereby the latter can operate at a higher speed with no degradation of its performance.

That is, the data transmission/reception system constructed using these encoder 1 and decoder 3 can decode a code at a high speed owing to the tying of the parallel paths, and thus provide a great convenience to the user.

Also, in the data transmission/reception system constructed using the encoder 1 and decoder 3, the element decoders 50 forming together the decoder 3 makes, by the Iα computation circuit 158 in the soft-output decoding circuit 90, outputs the sum of the computed log likelihood Iα and Iγ, not the computed log likelihood Iα as it is. Thus, it is not necessary to provide a circuit which computes the sum of log likelihood Iα and Iγ necessary to compute the log soft-output Iλ, which contributes to a reduction of the circuit scale.

That is, the data transmission/reception system constructed using these encoder 1 and decoder 3 can decode a code at a high speed by a smaller-scale, simply-constructed circuit, which thus assures a great convenience to the user.

Note that the present invention is not limited to the aforementioned embodiments in which the element decoder 50 is formed from an LSI in which the soft-output decoding circuit 90, interleaver 100, etc. are integrated, by way of example. However, only the soft-output decoding circuit 90 may be formed as a single module such as an LSI, and the decoder 3 may be constructed by concatenating a plurality of such soft-output decoding circuits 90 and providing other elements including the interleaver 100 as an external device. Similarly, according to the present invention, only the interleaver 100 may be constructed as a single module such as an LSI, and the decoder 3 may be constructed by concatenating a plurality of such interleavers 100 and providing other elements including the soft-output decoding circuit 90 as an external device. That is, the present invention is applicable to a repetitive decoding so long as at least the soft-output decoding circuit 90 or interleaver 100 is constructed as a single module such as an LSI.

Also, in the embodiments having been described in the foregoing, when a correction term is computed by the soft-output decoding circuit 90, the value of the correction term is read from the lookup table formed from the ROMs etc. However, according to the present invention, the ROMs may be various media such as RAMs and a so-called linear approximation circuit or the like may be provided to compute the correction term value, for example.

Further, in the aforementioned embodiments, a maximum of 3 symbols is inputted to or outputted from the interleaver 100. According to the present invention, however, an arbitrary number of symbols, or more than 3 symbols, for example, may be inputted to or outputted from the interleaver 100.

Furthermore, in the aforementioned embodiments, the interleaver 100 includes sixteen storage circuits $407_1$, $407_2$, . . . , $407_{16}$. According to the present invention, however, the interleaver 100 may include an arbitrary number of storage circuits corresponding to the configuration of a code to be decoded.

Also, in the aforementioned embodiments, the interleaver 100 makes the random interleaving, inline interleaving and pair-wise interleaving. However, the present invention is not limited to these kinds of interleaving but it is also applicable to other kinds of interleaving.

Moreover, in the aforementioned embodiments, the decoder makes a MAP decoding based on the Log-BCJR algorithm. According to the present invention, however, the decoder may be a one for a MAP decoding based on the Max-Log-BCJR algorithm.

Also, in the embodiments having been described in the foregoing, the encoder and decoder are applied to the transmitter and receiver included in the data transmission/reception system. However, the encoder and decoder according to the present invention may be applied to a recorder and/or player which records and/or reproduces data to and/or from a magnetic, optical or magneto-optical recording medium such as floppy disc, CD-ROM or MO (magneto-optical) disc. In this case, data coded by the encoder is recorded to a recording medium regarded as equivalent to the non-storage channel and decoded by the decoder for reproduction.

As above, the present invention can of course be implemented through various appropriate modifications without departing from the scope and spirit thereof.

The invention claimed is:

1. A soft-output decoder which determines, based on a received value taken as a soft-input, a log likelihood logarithmically notated of a probability of passing through arbitrary states, and decodes the received value based on the log likelihood, the apparatus comprising:
   a zero-symbol replacing means for replacing a position where no coded output exists with a symbol whose likelihood is "0", based on erasure position information indicative of an erasure position of the coded output; and
   a soft-output decoding means for performing soft-output decoding by receiving the received value and a priori probability information, and for generating a log soft-output logarithmically notated of a soft-output at each time and/or extrinsic information.

2. The apparatus according to claim 1, wherein the soft-output decoding means comprises:
   a first probability computing means for computing, for each received value, a first log likelihood logarithmically notated of a first probability determined based on the output pattern of a code and the received value;
   a second probability computing means for computing, for each received value, a second log likelihood logarithmically notated of a second probability of transition from a coding start state to each state in time sequence on the basis of the first log likelihood;
   a third probability computing means for computing, for each received value, a third log likelihood logarithmically notated of a third probability of transition from a coding termination state to each state in reverse time sequence on the basis of the first log likelihood; and a soft-output computing means for computing a log soft-output logarithmically notated of a soft-output at each time on the basis of the first to third log likelihood.

3. The apparatus according to claim 2, wherein the soft-output decoding means further comprises an extrinsic information computing means for computing extrinsic information based on the log soft-output and a priori probability information supplied from the soft-output computing means.

4. The apparatus according to claim 2, wherein the soft-output decoding means further comprises a first probability distributing means for distributing the first log likelihood to correspond to each branch of a trellis corresponding to the configuration of the code.

5. The apparatus according to claim 1, formed integrated on a semiconductor substrate.

6. The apparatus according to claim 1, designed to decode a convolutional code.

7. The apparatus according to claim 1, designed to make a maximum a posteriori probability decoding on the basis of the Log-BCJR algorithm.

8. A soft-output decoding method of computing, based on a received value taken as a soft-input, a log likelihood logarithmically notated of a probability of passing through arbitrary states, and decoding the received value based on the log likelihood, the method comprising steps of:

replacing a position where no coded output exists with a symbol whose likelihood is "0", based on erasure position information indicative of an erasure position of the coded output; and performing soft-output decoding by receiving the received value and a priori probability information, and generating a log soft-output logarithmically notated of a soft-output at each time and/or extrinsic information.

9. A decoder which determines, based on a received value taken as a soft-input, a log likelihood logarithmically notated of a probability of passing through arbitrary states, and makes, based on the log likelihood, repetitive decoding of a code generated by concatenating a plurality of element codes via an interleaver, the apparatus comprising a single element decoder or a plurality of element decoders to decode the element codes and each of the element decoders comprising:

a zero-symbol replacing means for replacing a position where no coded output exists with a symbol whose likelihood is "0", based on erasure position information indicative of an erasure position of the coded output;

a soft-output decoding means for performing soft-output decoding by receiving the received value and a priori probability information, and for generating a log soft-output logarithmically notated of a soft-output at each time and/or extrinsic information; and an interleaving means, supplied with the extrinsic information generated by the soft-output decoding means, for arranging the order of the extrinsic information in a different sequence or for rearranging the order of the extrinsic information to restore the information sequence changed by the interleaver to an initial one, based on the same replacement position information as that for the interleaver.

10. The apparatus according to claim 9, formed integrated on a semiconductor substrate.

11. The apparatus according to claim 9, designed to make repetitive decoding of a parallel concatenated convolutional code, serially concatenated convolutional code, parallel concatenated trellis-coding modulated code or serial concatenated trellis-coding modulated code.

12. The apparatus according to claim 11, wherein the element code is a convolutional code.

13. The apparatus according to claim 9, wherein the soft-output decoding means makes a maximum a posteriori probability decoding on the basis of the Log-BCJR algorithm.

14. A decoding method of computing, based on a received value taken as a soft-input, a log likelihood logarithmically notated of a probability of passing through arbitrary states, and making, based on the likelihood, repetitive decoding of a code generated by concatenating a plurality of element codes via a first interleaving step, the method comprising:

a zero-symbol replacing step for replacing a position where no coded output exists with a symbol whose likelihood is "0", based on erasure position information indicative of an erasure position of the coded output;

a soft-output decoding step for soft-output decoding by receiving the received value and a priori probability information, and generating a log soft-output logarithmically notated of a soft-output at each time and/or extrinsic information; and a second interleaving step for receiving the extrinsic information generated in the soft-output decoding step, and arranging the order of the extrinsic information in a different sequence or rearranging the order of the extrinsic information to restore the information sequence changed in the first interleaving step to an initial one, based on the same replacement position information as that in the first interleaving.

15. A soft-output decoder which determines, based on a received value taken as a soft-input, a log likelihood logarithmically notated of a probability of passing through arbitrary states, and makes decoding of the received data based on the log likelihood, the apparatus comprising:

a first probability computing means for computing, for each received value, a first log likelihood logarithmically notated of a first probability determined based on an output pattern of a code and received value;

a first probability distributing means for distributing the first log likelihood so as to correspond to each branch of a trellis corresponding to the configuration of the code; and a parallel path processing means for tying together the first log likelihood corresponding to the first parallel paths when the code to be decoded includes parallel paths whose transition origins are same in state and transition destinations are same in state.

16. The apparatus according to claim 15, further comprising:

a second probability computing means for computing, for each received value, a second log likelihood logarithmically notated of a second probability of transition from a coding start state to each state in time sequence on the basis of the first log likelihood; and a third probability computing means for computing, for each received value, a third log likelihood logarithmically notated of a third probability of transition from a coding termination state to each state in reverse time sequence on the basis of the first log likelihood, the parallel path processing means tying together the first log likelihood corresponding to the parallel paths before computing the second and third log likelihood by the second and third probability computing means.

17. The apparatus according to claim 15, wherein the first probability distributing means comprises the parallel path processing means.

18. The apparatus according to claim 15, wherein the second and third probability computing means corresponding to codes whose number of input bits is $k_1$ and number of memories is $v<k_1$ and whose parallel paths exist on the trellis are ones corresponding to codes whose number of input bits is $k_2<k_1$ and number of memories is $v$.

19. The apparatus according to claim 15, further comprising a soft-output computing means to compute a log soft-output logarithmically notated of a soft-output at each time based on the first to third log likelihood.

20. The apparatus according to claim 19, wherein the first probability computing means separately outputs the first log likelihood for use to compute the log soft-output when decoding codes whose parallel paths exist on the trellis, the parallel paths being tied together.

21. The apparatus according to claim 20, further comprising an adding means for adding the first log likelihood used to compute the log soft-output outputted from the first probability computing means and the second log likelihood, the adding means supplying the result of add operation to the soft-output computing means.

22. The apparatus according to claim 19, further comprising an extrinsic information computing means to compute extrinsic information based on the log soft-output supplied from the soft-output computing means and a priori probability information.

23. The apparatus according to claim 15, formed integrated on a semiconductor substrate.

24. The apparatus according to claim 15, designed to decode convolutional codes.

25. The apparatus according to claim 15, designed to make a maximum a posteriori probability decoding on the basis of the Log-BCJR algorithm.

26. A soft-output decoding method of computing, based on a received value taken as a soft-input, a log likelihood logarithmically notated of a probability of passing through arbitrary states, and decoding the received value based on the log likelihood, the method comprising steps of:
computing, for each received value, a first log likelihood logarithmically notated of a first probability determined based on the output pattern of a code and the received value;
distributing the first log likelihood to correspond to each branch of a trellis corresponding to the configuration of the code; and
tying together the first log likelihood corresponding to the first parallel paths when the code to be decoded includes parallel paths whose transition origins are same in state and transition destinations are same in state.

27. A decoder which determines, based on a received value taken as a soft-input, a log likelihood logarithmically notated of a probability of passing through arbitrary states, and makes, based on the log likelihood, repetitive decoding of a code generated by concatenating a plurality of element codes via an interleaver, the apparatus comprising a single element decoder or a plurality of element decoders to decode the element codes and each of the element decoders comprising:
a soft-output decoding means for performing soft-output decoding by receiving the received value and a priori probability information, and for generating a log soft-output logarithmically notated of a soft-output at each time and/or extrinsic information; and
an interleaving means, supplied with the extrinsic information generated by the soft-output decoding means, for arranging the order of the extrinsic information in a different sequence or for rearranging the order of the extrinsic information to restore the information sequence changed by the interleaver to an initial one, based on the same replacement position information as that for the interleaver, wherein the soft-output decoding means includes:
a first probability computing means for computing, for each received value, a first log likelihood logarithmically notated of a first probability determined based on an output pattern of a code and received value;
a first probability distributing means for distributing the first log likelihood to correspond to each branch of a trellis corresponding to the configuration of the code; and
a parallel path processing means for tying together the first log likelihood corresponding to the parallel paths when the code to be decoded includes parallel paths whose transition origins are same in state and transition destinations are same in state.

28. The apparatus according to claim 27, further comprising:
a second probability computing means for computing, for each received value, a second log likelihood logarithmically notated of a second probability of transition from a coding start state to each state in time sequence on the basis of the first log likelihood; and
a third probability computing means for computing, for each received value, a third log likelihood logarithmically notated of a third probability of transition from a coding termination state to each state in reverse time sequence on the basis of the first log likelihood,
the parallel path processing means tying together the first log likelihood corresponding to the parallel paths before computing the second and third log likelihood by the second and third probability computing means.

29. The apparatus according to claim 27, wherein the first probability distributing means comprises the parallel path processing means.

30. The apparatus according to claim 27, wherein the second and third probability computing means corresponding to codes whose number of input bits is $k_1$ and number of memories is $v<k_1$ and whose parallel paths exist on the trellis are ones corresponding to codes whose number of input bits is $k_2<k_1$ and number of memories is $v$.

31. The apparatus according to claim 27, further comprising a soft-output computing means to compute a log soft-output logarithmically notated of a soft-output at each time based on the first to third log likelihood.

32. The apparatus according to claim 31, wherein the first probability computing means separately outputs the first log likelihood for use to compute the log soft-output when decoding a code whose parallel paths exist on the trellis with the parallel paths being tied together.

33. The apparatus according to claim 32, further comprising an adding means for adding the first log likelihood used to compute the log soft-output outputted from the first probability computing means and the second log likelihood, wherein the adding means supplying the result of add operation to the soft-output computing means.

34. The apparatus according to claim 31, further comprising an extrinsic information computing means to compute extrinsic information based on the log soft-output supplied from the soft-output computing means and a priori probability information.

35. The apparatus according to claim 27, wherein the element decoders are formed integrated on a semiconductor substrate.

36. The apparatus according to claim 27, designed to make repetitive decoding of a parallel concatenated convolutional code, serially concatenated convolutional code, parallel concatenated trellis-coding modulated code or serial concatenated trellis-coding modulated code.

37. The apparatus according to claim 36, wherein the element code is a convolutional code.

38. The apparatus according to claim 27, wherein the soft-output decoding means makes a maximum a posteriori probability decoding on the basis of the Log-BCJR algorithm.

39. A decoding method of computing, based on a received value taken as a soft-input, a log likelihood logarithmically notated of a probability of passing through arbitrary states, and making, based on the log likelihood, repetitive decoding of a code generated by concatenating a plurality of element codes via a first interleaving step, the method comprising:
  a soft-output decoding step for receiving the received value and a priori probability information, and making soft-output decoding of the data to generate a log soft-output logarithmically notated of a soft-output at each time and/or extrinsic information; and
  a second interleaving step for receiving the extrinsic information generated in the soft-output decoding step, and arranging the order of the extrinsic information in a different sequence or rearranging the order of the extrinsic information to restore the information sequence changed in the first interleaving step to an initial one, based on the same replacement position information as that in the first interleaving, wherein the soft-output decoding step comprises:
  a first probability computing step for computing, for each received value, a first log likelihood logarithmically notated of a first probability determined based on an output pattern of a code and received value;
  a first probability distributing step for distributing the first log likelihood to correspond to each branch of a trellis corresponding to the configuration of the code; and
  a parallel path processing step for tying together the first log likelihood corresponding to the parallel paths when the code to be decoded includes parallel paths whose transition origins are same in state and transition destinations are same in state.

40. A soft-output decoder which determines, based on a received value taken as a soft-input, a log likelihood logarithmically notated of a probability of passing through arbitrary states, and decodes the received data based on the log likelihood, the apparatus comprising:
  a first probability computing means for computing, for each received value, a first log likelihood logarithmically notated of a first probability determined based on the output pattern of a code and the received value;
  a second probability computing means for computing, for each received value, a second log likelihood logarithmically notated of a second probability of transition from a coding start state to each state in time sequence on the basis of the first log likelihood;
  a third probability computing means for computing, for each received value, a third log likelihood logarithmically notated of a third probability of transition from a coding termination state to each state in reverse time sequence on the basis of the first log likelihood; and
  a soft-output computing means for computing a log soft-output logarithmically notated of a soft-output at each time on the basis of the first to third log likelihood,
  the second probability computing means supplying the soft-output computing means with the sum of the second log likelihood and the first log likelihood determined in the process of computing the second log likelihood.

41. The apparatus according to claim 40, wherein the soft-output decoding means further comprises an extrinsic information computing means for computing extrinsic information based on the log soft-output and a priori probability information supplied from the soft-output computing means.

42. The apparatus according to claim 40, further comprising a first probability distributing means for distributing the first log likelihood to correspond to each branch of a trellis corresponding to the configuration of the code.

43. The apparatus according to claim 40, formed integrated on a semiconductor substrate.

44. The apparatus according to claim 40, designed to decode a convolutional code.

45. The apparatus according to claim 40, designed to make a maximum a posteriori probability decoding on the basis of the Log-BCJR algorithm.

46. A soft-output decoding method of computing, based on a received value taken as a soft-input, a log likelihood logarithmically notated of a probability of passing through arbitrary states, and decoding the received data based on the log likelihood, the method including:
  a first probability computing step for computing, for each received value, a first log likelihood logarithmically notated of a first probability determined based on the output pattern of a code and the received value;
  a second probability computing step for computing, for each received value, a second log likelihood logarithmically notated of a second probability of transition from a coding start state to each state in time sequence on the basis of the first log likelihood;
  a third probability computing step for computing, for each received value, a third log likelihood logarithmically notated of a third probability of transition from a coding termination state to each state in reverse time sequence on the basis of the first log likelihood; and
  a soft-output computing step for computing a log soft-output logarithmically notated of a soft-output at each time on the basis of the first to third log likelihood,
  the sum of the second log likelihood and the first log likelihood determined in the process of computing the second log likelihood being supplied in the second probability computing step for use in the soft-output computing step.

47. A decoder which determines, based on a received value taken as a soft-input, a log likelihood logarithmically notated of a probability of passing through arbitrary states, and makes, based on the log likelihood, repetitive decoding of a code generated by concatenating a plurality of element codes via an interleaver, the apparatus comprising a single element decoder or a plurality of element decoders to decode the element codes and each of the element decoders comprising:
  a soft-output decoding means for performing soft-output decoding by receiving the received value and a priori probability information, and for generating a log soft-output logarithmically notated of a soft-output at each time and/or extrinsic information; and
  an interleaving means, supplied with the extrinsic information generated by the soft-output decoding means, for arranging the order of the extrinsic information in a different sequence or for rearranging the order of the extrinsic information to restore the information sequence changed by the interleaver to an initial one, based on the same replacement position information as that for the interleaver; and wherein the soft-output decoding means comprises:

a first probability computing means for computing, for each received value, a first log likelihood logarithmically notated of a first probability determined based on the output pattern of a code and the received value;

a second probability computing means for computing, for each received value, a second log likelihood logarithmically notated of a second probability of transition from a coding start state to each state in time sequence on the basis of the first log likelihood;

a third probability computing means for computing, for each received value, a third log likelihood logarithmically notated of a third probability of transition from a coding termination state to each state in reverse time sequence on the basis of the first log likelihood; and a soft-output computing means for computing a log soft-output logarithmically notated of a soft-output at each time on the basis of the first to third log likelihood; the second probability computing means supplying the soft-output computing means with the sum of the second log likelihood and the first log likelihood determined in the process of computing the second log likelihood.

48. The apparatus according to claim 47, wherein the soft-output decoding means further comprises an extrinsic information computing means to compute extrinsic information based on the log soft-output supplied from the soft-output computing means and a priori probability information.

49. The apparatus according to claim 47, wherein the soft-output decoding means further comprises a first probability distributing means for distributing the first log likelihood to correspond to each branch of a trellis corresponding to the configuration of the code.

50. The apparatus according to claim 47, wherein the element decoders are formed integrated on a semiconductor substrate.

51. The apparatus according to claim 47, designed to make repetitive decoding of a parallel concatenated convolutional code, serially concatenated convolutional code, parallel concatenated trellis-coding modulated code or serial concatenated trellis-coding modulated code.

52. The apparatus according to claim 51, wherein the element code is a convolutional code.

53. The apparatus according to claim 47, wherein the soft-output decoding means makes a maximum a posteriori probability decoding on the basis of the Log-BCJR algorithm.

54. A decoding method of computing, based on a received value taken as a soft-input, a log likelihood logarithmically notated of a probability of passing through arbitrary states, and making, based on the log likelihood, repetitive decoding of a code generated by concatenating a plurality of element codes via a first interleaving step, the method comprising:

a soft-output decoding step for soft-output decoding by receiving the received value and a priori probability information, and generating a log soft-output logarithmically notated of a soft-output at each time and/or extrinsic information; and a second interleaving step for receiving the extrinsic information generated in the soft-output decoding step, and arranging the order of the extrinsic information in a different sequence or rearranging the order of the extrinsic information to restore the information sequence changed in the first interleaving step to an initial one, based on the same replacement position information as the in the first interleaving; and wherein the soft-output decoding step further comprises:

a first probability computing step for computing, for each received value, a first log likelihood logarithmically notated of a first probability determined based on the output pattern of a code and the received value;

a second probability computing step for computing, for each received value, a second log likelihood logarithmically notated of a second probability of transition from a coding start state to each state in time sequence on the basis of the first log likelihood;

a third probability computing step for computing, for each received value, a third log likelihood logarithmically notated of a third probability of transition from a coding termination state to each state in reverse time sequence on the basis of the first log likelihood; and a soft-output computing step for computing a log soft-output logarithmically notated of a soft-output at each time on the basis of the first to third log likelihood; the sum of the second log likelihood and the first log likelihood determined in the process of computing the second log likelihood being supplied in the second probability computing step for use in the soft-output computing step.

* * * * *